US011605707B2

(12) United States Patent
Nakagawa et al.

(10) Patent No.: US 11,605,707 B2
(45) **Date of Patent: *Mar. 14, 2023**

(54) SEMICONDUCTOR DEVICE

(71) Applicant: ROHM CO., LTD., Kyoto (JP)

(72) Inventors: Minoru Nakagawa, Kyoto (JP); Yuki Nakano, Kyoto (JP); Masatoshi Aketa, Kyoto (JP); Masaya Ueno, Kyoto (JP); Seigo Mori, Kyoto (JP); Kenji Yamamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 1 day.

This patent is subject to a terminal disclaimer.

(21) Appl. No.: 17/349,256

(22) Filed: Jun. 16, 2021

(65) Prior Publication Data

US 2021/0305363 A1 Sep. 30, 2021

Related U.S. Application Data

(63) Continuation of application No. 16/613,549, filed as application No. PCT/JP2018/019137 on May 17, 2018, now Pat. No. 11,069,771.

(30) Foreign Application Priority Data

May 17, 2017 (JP) ................................ 2017-098423
Mar. 8, 2018 (JP) ................................ 2018-042133
(Continued)

(51) Int. Cl.
*H01L 29/06* (2006.01)
*H01L 29/10* (2006.01)
(Continued)

(52) U.S. Cl.
CPC ...... *H01L 29/0619* (2013.01); *H01L 29/0657* (2013.01); *H01L 29/0692* (2013.01);
(Continued)

(58) Field of Classification Search
CPC ............ H01L 29/0619; H01L 29/0657; H01L 29/0692; H01L 29/1095; H01L 29/404;
(Continued)

(56) References Cited

U.S. PATENT DOCUMENTS 9,525,045 B1 * 12/2016 Lee .................. H01L 29/66734
2008/0073707 A1 3/2008 Darwish
(Continued)

FOREIGN PATENT DOCUMENTS

CN 101536164 A 9/2009
JP 2000269499 A 9/2000
(Continued)

OTHER PUBLICATIONS

PCT: International Preliminary Report on Patentability of PCT/JP2018/019137; dated Nov. 28, 2019; 14 pages.
PCT: International Search Report and Written Opinion of PCT/JP2018/019137; dated Jul. 31, 2018; 9 pages.
(Continued)

*Primary Examiner* — David C Spalla
(74) *Attorney, Agent, or Firm* — Gregory M. Howison

(57) ABSTRACT

A semiconductor device includes a semiconductor layer of a first conductivity type having a first main surface at one side and a second main surface at another side, a trench gate structure including a gate trench formed in the first main surface of the semiconductor layer, and a gate electrode embedded in the gate trench via a gate insulating layer, a trench source structure including a source trench formed deeper than the gate trench and across an interval from the gate trench in the first main surface of the semiconductor layer, a source electrode embedded in the source trench, and a deep well region of a second conductivity type formed in a region of the semiconductor layer along the source trench, a ratio of a depth of the trench source structure with respect to a depth of the trench gate structure being not less than 1.5
(Continued)

and not more than 4.0, a body region of the second conductivity type formed in a region of a surface layer portion of the first main surface of the semiconductor layer between the gate trench and the source trench, a source region of the first conductivity type formed in a surface layer portion of the body region, and a drain electrode connected to the second main surface of the semiconductor layer.

16 Claims, 237 Drawing Sheets

(30) Foreign Application Priority Data

May 16, 2018 (JP) ................................ 2018-094956
May 16, 2018 (JP) ................................ 2018-094957

(51) Int. Cl.
*H01L 29/423* (2006.01)
*H01L 29/16* (2006.01)
*H01L 29/40* (2006.01)

(52) U.S. Cl.
CPC .... *H01L 29/1095* (2013.01); *H01L 29/42376* (2013.01); *H01L 29/1608* (2013.01); *H01L 29/404* (2013.01)

(58) Field of Classification Search
CPC ............... H01L 29/407; H01L 29/4236; H01L 29/42376; H01L 29/66696; H01L 29/66704; H01L 29/7396; H01L 29/7397; H01L 29/7813
See application file for complete search history.

(56) References Cited

U.S. PATENT DOCUMENTS

2011/0039384 A1 2/2011 Darwish
2015/0214355 A1* 7/2015 Nakano ............... H01L 29/7813 257/330
2017/0077299 A1* 3/2017 Shimizu ............ H01L 29/41766
2018/0025910 A1* 1/2018 Ohashi .............. H01L 29/66068 257/77
2019/0035883 A1* 1/2019 Takeuchi .............. H01L 21/046

FOREIGN PATENT DOCUMENTS

| | | | |
|---|---|---|---|
| JP | 2007150082 | A | 6/2007 |
| JP | 2008004686 | A | 1/2008 |
| JP | 2008294210 | A | 12/2008 |
| JP | 2010505270 | A | 2/2010 |
| JP | 2014038966 | A | 2/2014 |
| JP | 2015079894 | A | 4/2015 |
| JP | 2017055003 | A | 3/2017 |
| JP | 2017055005 | A | 3/2017 |
| KR | 1020090057976 | A | 6/2009 |
| WO | 2008039459 | A1 | 4/2008 |
| WO | 2014030589 | A1 | 2/2014 |

OTHER PUBLICATIONS

Japanese Patent Office; Notice of Reasons for Refusal for Japanese Patent Application 2018-094956 (related application); Iwamoto, Tsutomu; dated Jun. 30, 2022; 6 pages.
Japanese Patent Office; Notice of Reasons for Refusal for Japanese Patent Application 2018-094957 (related application); Iwamoto, Tsutomu; dated Jun. 30, 2022; 8 pages.
Japanese Patent Office; Notice of Reasons for Refusal for Japanese Patent Application 2018-094957 (related application); Iwamoto, Tsutomu; dated Dec. 22, 2022; 9 pages.

* cited by examiner

661

671

SEMICONDUCTOR DEVICE

CROSS-REFERENCE TO RELATED APPLICATIONS

This is a continuation of U.S. application Ser. No. 16/613,549, filed on Nov. 14, 2019, entitled SEMICONDUCTOR DEVICE, which is a U.S. National Phase application submitted under 35 U.S.C. § 371 of Patent Cooperation Treaty application serial no. PCT/JP2018/019137, filed on May 17, 2018, entitled SEMICONDUCTOR DEVICE. The prior US application and the present continuation application claim the benefit of priority of Japanese application Nos. 2018-094957, filed on May 16, 2018, 2018-094956, filed May 16, 2018, 2018-042133, filed Mar. 8, 2018 and 2017-098423, filed on May 17, 2017. The disclosures of these prior US and foreign applications are incorporated herein by reference.

TECHNICAL FIELD

The present invention relates to a semiconductor device.

BACKGROUND ART

A semiconductor device that includes a gate trench and a source trench is disclosed in Patent Document 1. The gate trench and the source trench are formed to substantially equal depths in a front surface of an n-type semiconductor layer. A p-type body region is formed in a region of a surface layer portion of the front surface of the semiconductor layer between the gate trench and the source trench.

An $n^+$-type source region is formed in a surface layer portion of the p-type body region. A p-type withstand voltage holding region (deep well region) is formed in a region of the semiconductor layer along the source trench.

A gate electrode is embedded in the gate trench via a gate insulating layer. A source electrode is embedded in the source trench. A drain electrode is connected to a rear surface of the semiconductor layer.

CITATION LIST

Patent Literature

Patent Literature: WO 2014/030589 A1

SUMMARY OF INVENTION

Technical Problem

Short circuit withstand capability and feedback capacitance are known as electrical characteristics of a semiconductor device having a MISFET structure that includes a gate, a source, and a drain. The short circuit withstand capability is a duration capable of withstanding a short circuit current. The short-circuit current is a current that flows between the source and the drain when switching from an on state to an off state. The feedback capacitance is a static capacitance between the gate and the drain.

The higher the short circuit withstand capability, the higher a reliability of the semiconductor device. Also, the lower the feedback capacitance, the higher a switching speed of the semiconductor device. Therefore, a semiconductor device capable of being used in diverse situations can be provided by realizing excellent short circuit withstand capability and excellent feedback capacitance.

However, according to a semiconductor device having a structure in which a gate trench and a source trench are formed in substantially equal depths, a p-type deep well region can be formed only in a comparatively shallow region of an n-type semiconductor layer.

With such a structure, a depletion layer cannot be spread sufficiently from a boundary region between the semiconductor layer and the deep well region. A constriction of a current path of the short-circuit current by the depletion layer is thus insufficient and the short circuit withstand capability thus cannot be improved appropriately. Also, the depletion layer is small in width and the feedback capacity thus cannot be reduced appropriately.

One preferred embodiment of the present invention provides a semiconductor device capable of improving the short circuit withstand capability and reducing the feedback capacitance.

Solution to Problem

One preferred embodiment of the present invention provides a semiconductor device including a semiconductor layer of a first conductivity type having a first main surface at one side and a second main surface at another side, a trench gate structure including a gate trench formed in the first main surface of the semiconductor layer, and a gate electrode embedded in the gate trench via a gate insulating layer, a trench source structure including a source trench formed deeper than the gate trench and formed across an interval from the gate trench in the first main surface of the semiconductor layer, a source electrode embedded in the source trench, and a well region of a second conductivity type formed in a region of the semiconductor layer along the source trench, a ratio of a depth of the trench source structure with respect to a depth of the trench gate structure being not less than 1.5 and not more than 4.0, a body region of the second conductivity type formed in a region of a surface layer portion of the first main surface of the semiconductor layer between the gate trench and the source trench, a source region of the first conductivity type formed in a surface layer portion of the body region, and a drain electrode connected to the second main surface of the semiconductor layer.

With the semiconductor device, the ratio of the depth of the trench source structure with respect to the depth of the trench gate structure is not less than 1.5 and not more than 4.0. A depletion layer can thereby be spread from a boundary region between the semiconductor layer and the well region toward a region further to the second main surface side than a bottom wall of the gate trench.

Consequently, a current path of a short-circuit current flowing between the source electrode and the drain electrode can be narrowed. Also, feedback capacitance can be reduced inverse-proportionately by the depletion layer spreading from the boundary region between the semiconductor layer and the well region. It is therefore possible to provide a semiconductor device capable of improving the short circuit withstand capability and reducing the feedback capacitance.

A preferred embodiment of the present invention provides a semiconductor device including a semiconductor layer of a first conductivity type having a first main surface at one side and a second main surface at another side, a trench gate structure including a gate trench having a first side wall and a first bottom wall and formed in the first main surface of the semiconductor layer, and a gate electrode embedded in the gate trench via a gate insulating layer, a trench source structure including a source trench having a second side wall and a second bottom wall and formed across an interval from the gate trench in the first main surface of the semiconductor layer, a source electrode embedded in the source trench, and a well region of a second conductivity type formed in a region of the semiconductor layer along the source trench, a body region of the second conductivity type formed in a region of a surface layer portion of the first main surface of the semiconductor layer between the gate trench and the source trench, a source region of the first conductivity type formed in a surface layer portion of the body region, and a drain electrode connected to the second main surface of the semiconductor layer, wherein the second side wall of the source trench includes a first wall portion positioned at the first main surface side of the semiconductor layer with respect to the first bottom wall of the gate trench, and a second wall portion positioned at the second main surface side of the semiconductor layer with respect to the first bottom wall of the gate trench, and the well region includes a first region formed along the first wall portion of the second side wall of the source trench, and a second region formed along the second wall portion of the second side wall of the source trench and having a length greater than a length of the first region in regard to a thickness direction of the semiconductor layer.

With the semiconductor device, the well region includes the first region formed along the first wall portion of the second side wall of the source trench, and the second region formed along the second wall portion of the second side wall of the source trench.

The length of the second region of the well region is greater than the length of the first region of the well region in regard to the thickness direction of the semiconductor layer. A depletion layer can thereby be spread from a boundary region between the semiconductor layer and the well region toward a region to the second main surface side than the first bottom wall of the gate trench.

Consequently, a current path of a short-circuit current flowing between the source electrode and the drain electrode can be narrowed. Also, feedback capacitance can be reduced inverse-proportionately by the depletion layer spreading from the boundary region between the semiconductor layer and the well region. It is therefore possible to provide a semiconductor device capable of improving the short circuit withstand capability and reducing the feedback capacitance.

The aforementioned as well as other objects, features, and effects of the present invention will be made clear by the following description of the preferred embodiments, with reference to the accompanying drawings.

BRIEF DESCRIPTION OF DRAWINGS

FIG. 63B is a sectional view of a region corresponding to FIG. 55 and is an enlarged view of a third configuration example of the field limit structure.

FIG. 63C is a sectional view of a region corresponding to FIG. 55 and is an enlarged view of a fourth configuration example of the field limit structure.

FIG. 63D is a sectional view of a region corresponding to FIG. 55 and is an enlarged view of a fifth configuration example of the field limit structure.

FIG. 64A is a sectional view of a region corresponding to FIG. 55 and is an enlarged view of a second configuration example of the anchor hole.

FIG. 64B is a sectional view of a region corresponding to FIG. 55 and is an enlarged view of a third configuration example of the anchor hole.

FIG. 64C is a sectional view of a region corresponding to FIG. 55 and is an enlarged view of a fourth configuration example of the anchor hole.

FIG. 64D is a plan view of a region corresponding to FIG. 50 and is a plan view of a fifth configuration example of the anchor hole.

FIG. 65A is an enlarged view of a region corresponding to FIG. 54 and is an enlarged view of an example of a method for manufacturing the semiconductor device shown in FIG. 49.

FIG. 65B is an enlarged view of a step subsequent to that of FIG. 65A.

FIG. 65C is an enlarged view of a step subsequent to that of FIG. 65B.

FIG. 65D is an enlarged view of a step subsequent to that of FIG. 65C.

FIG. 65E is an enlarged view of a step subsequent to that of FIG. 65D.

Figure 65A:
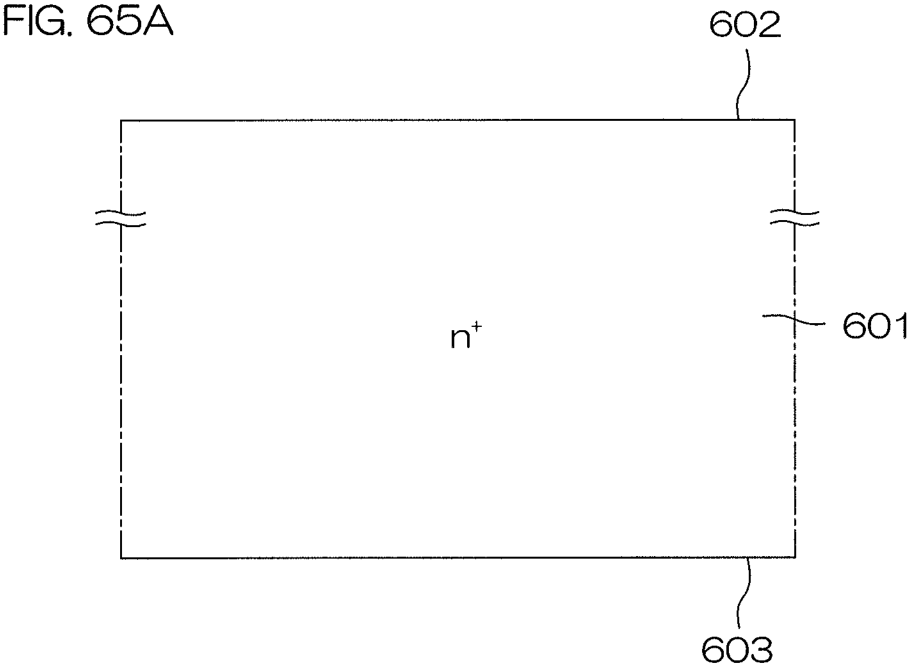
Figure 65B:
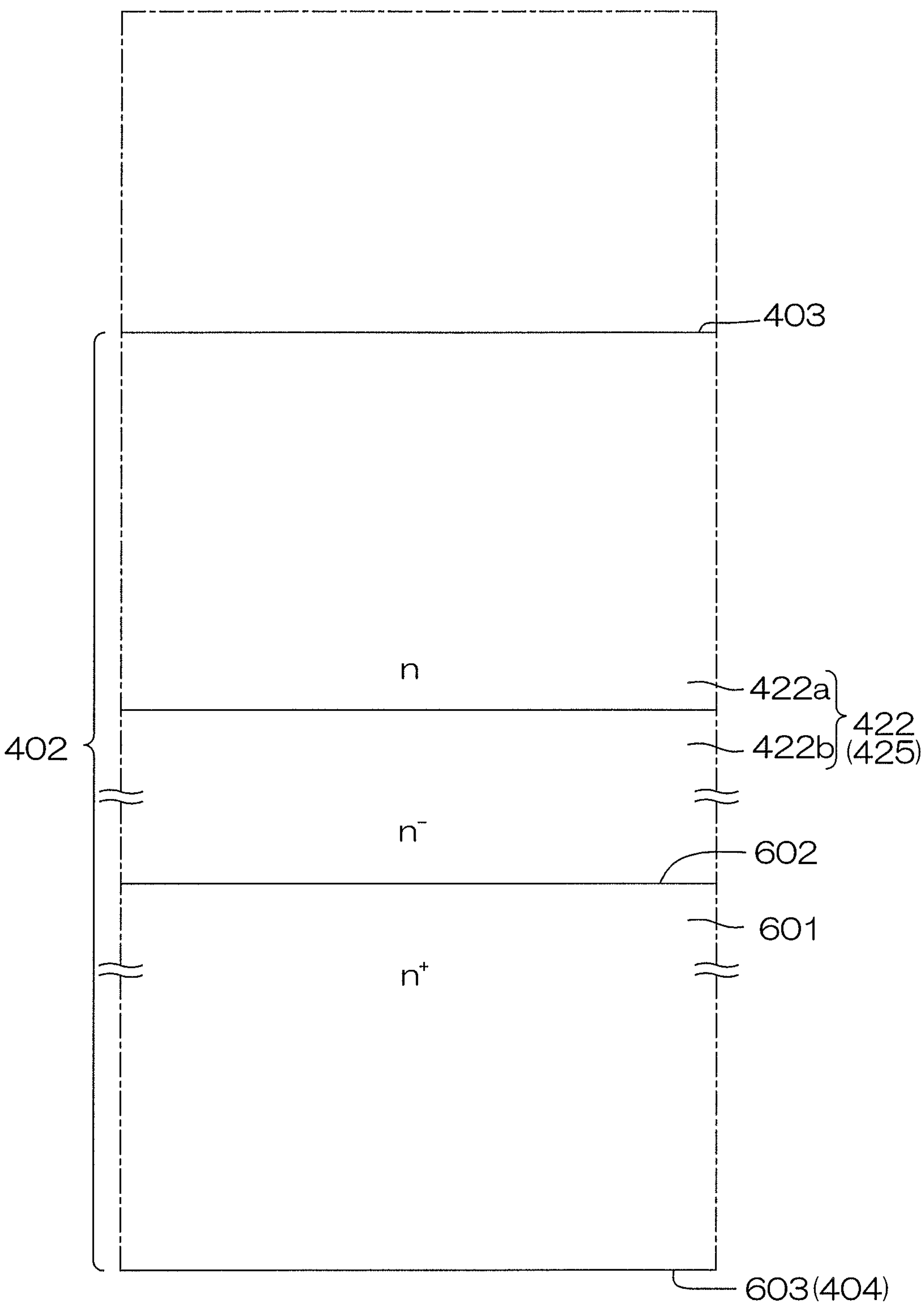
Figure 65C:
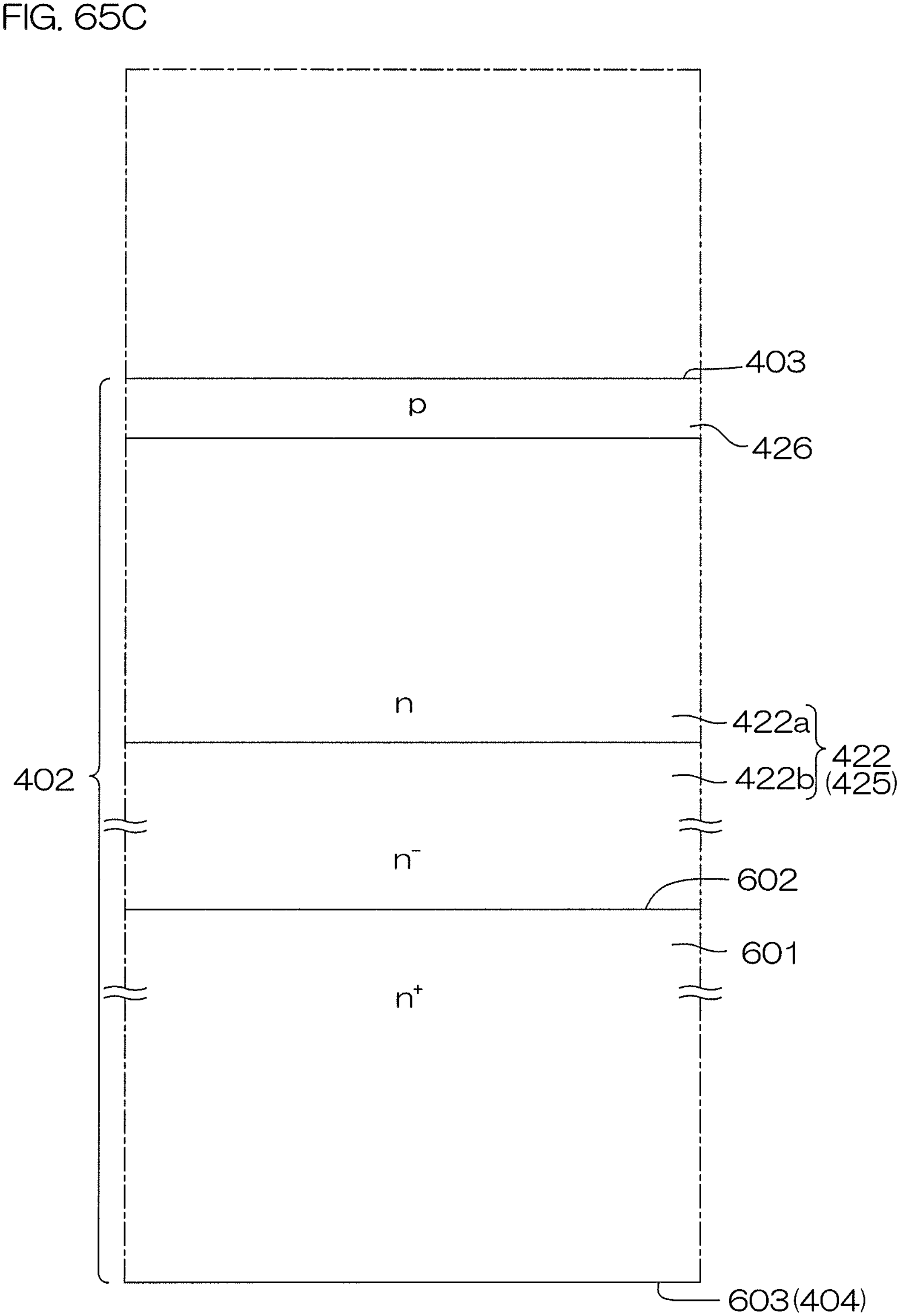
Figure 65D:
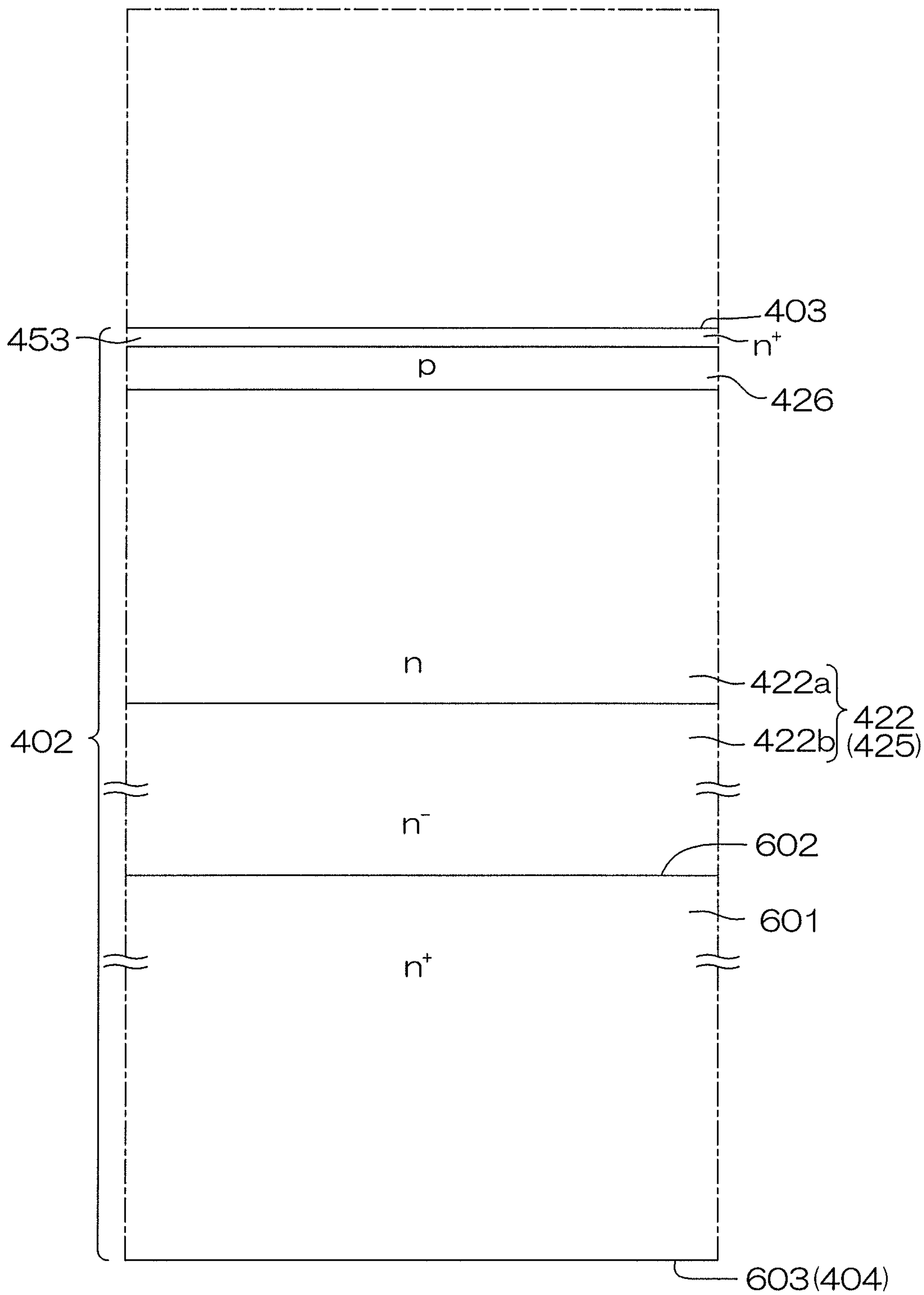
Figure 65E:
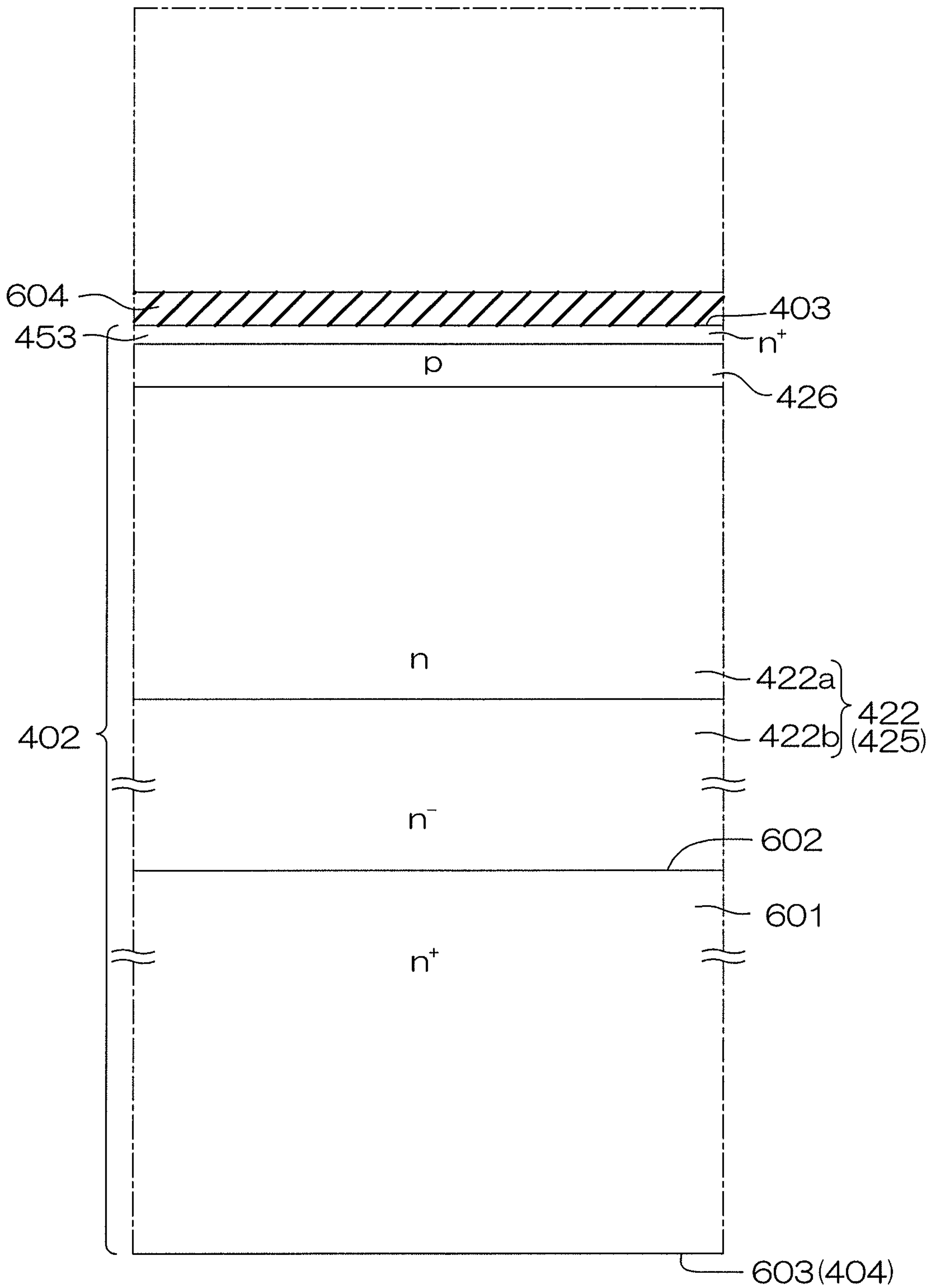
Figure 65F:
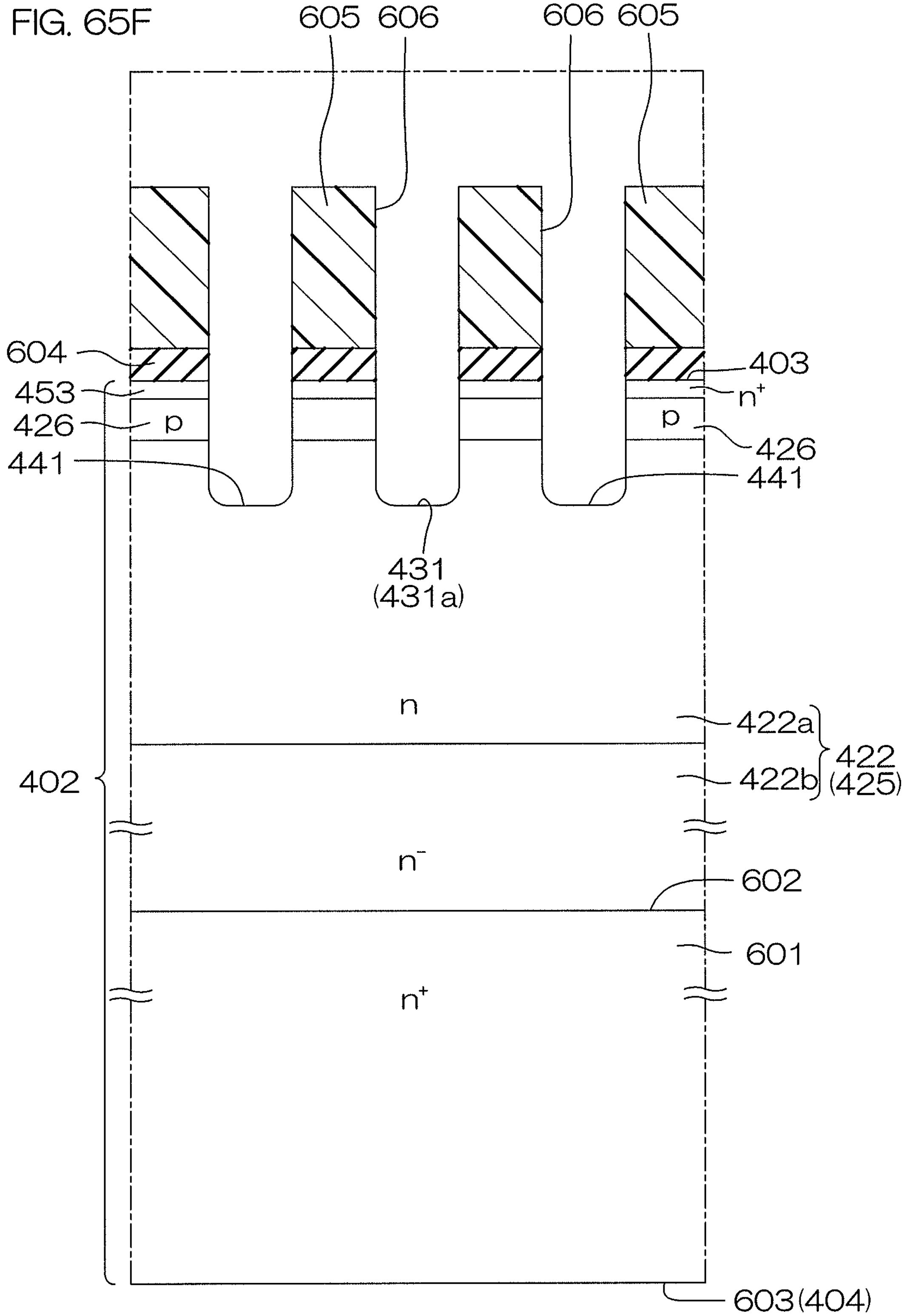

FIG. 65F is an enlarged view of a step subsequent to that of FIG. 65E.

Figure 65G:
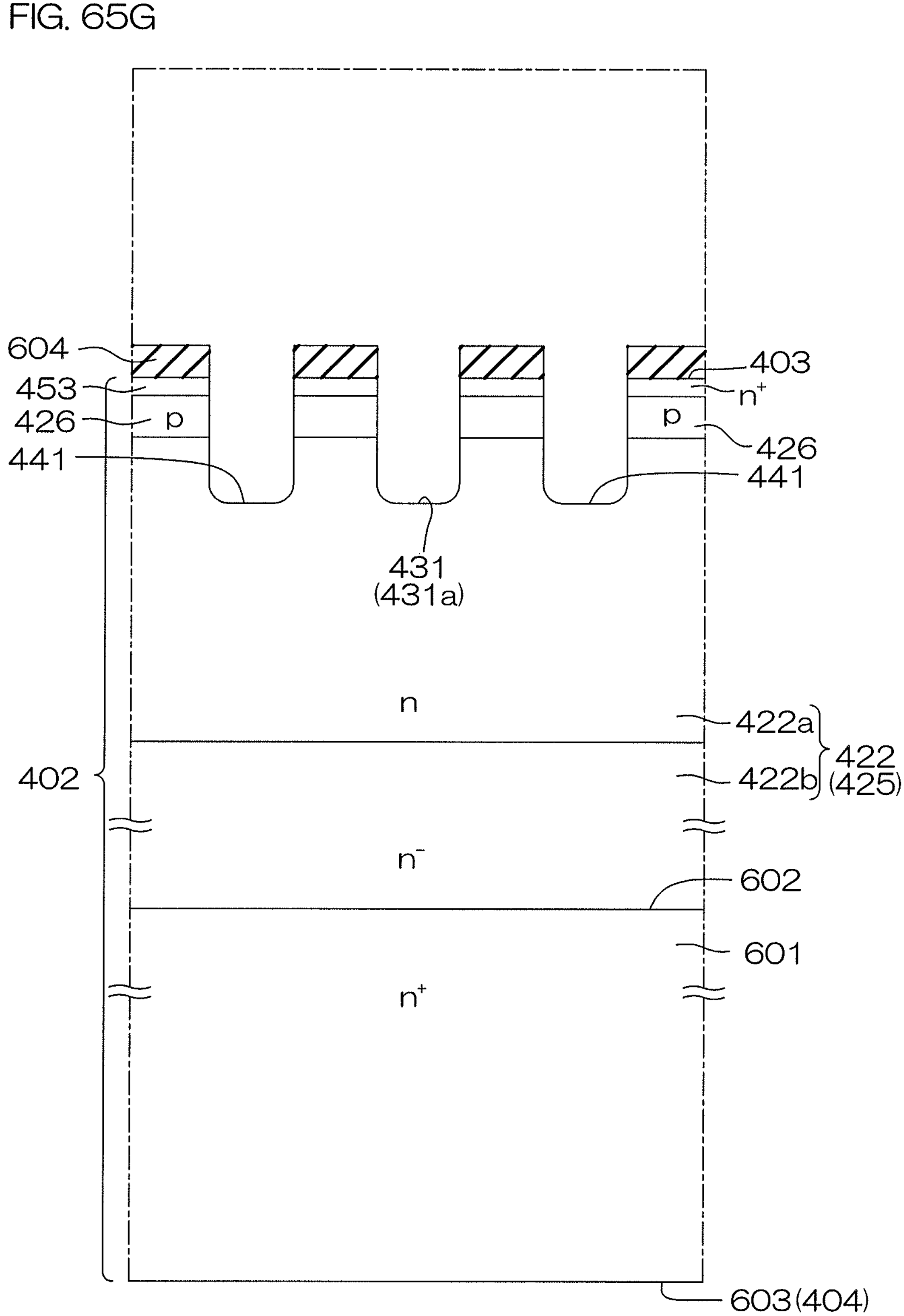

FIG. 65G is an enlarged view of a step subsequent to that of FIG. 65F.

Figure 65H:
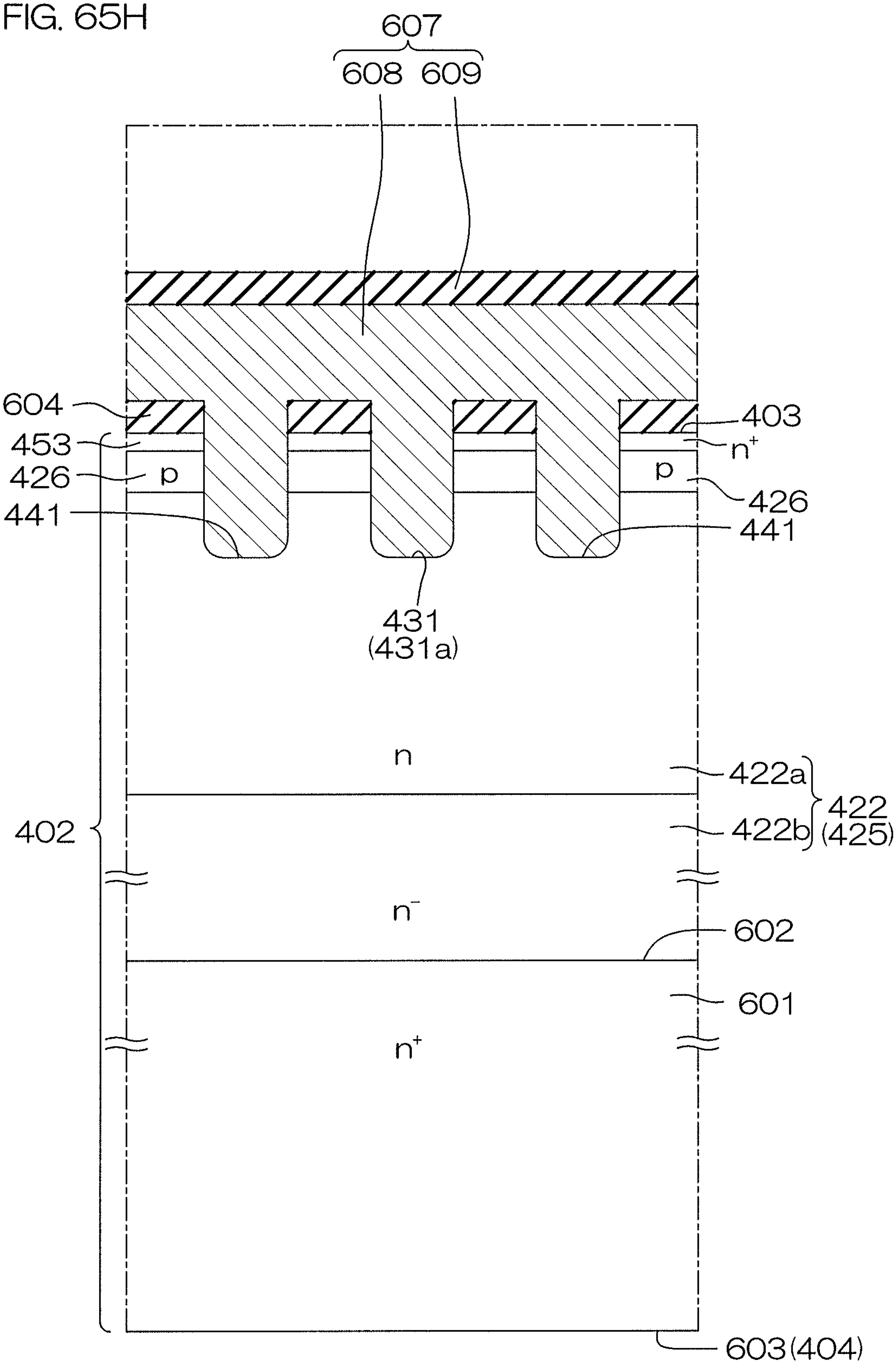
Figure 65:
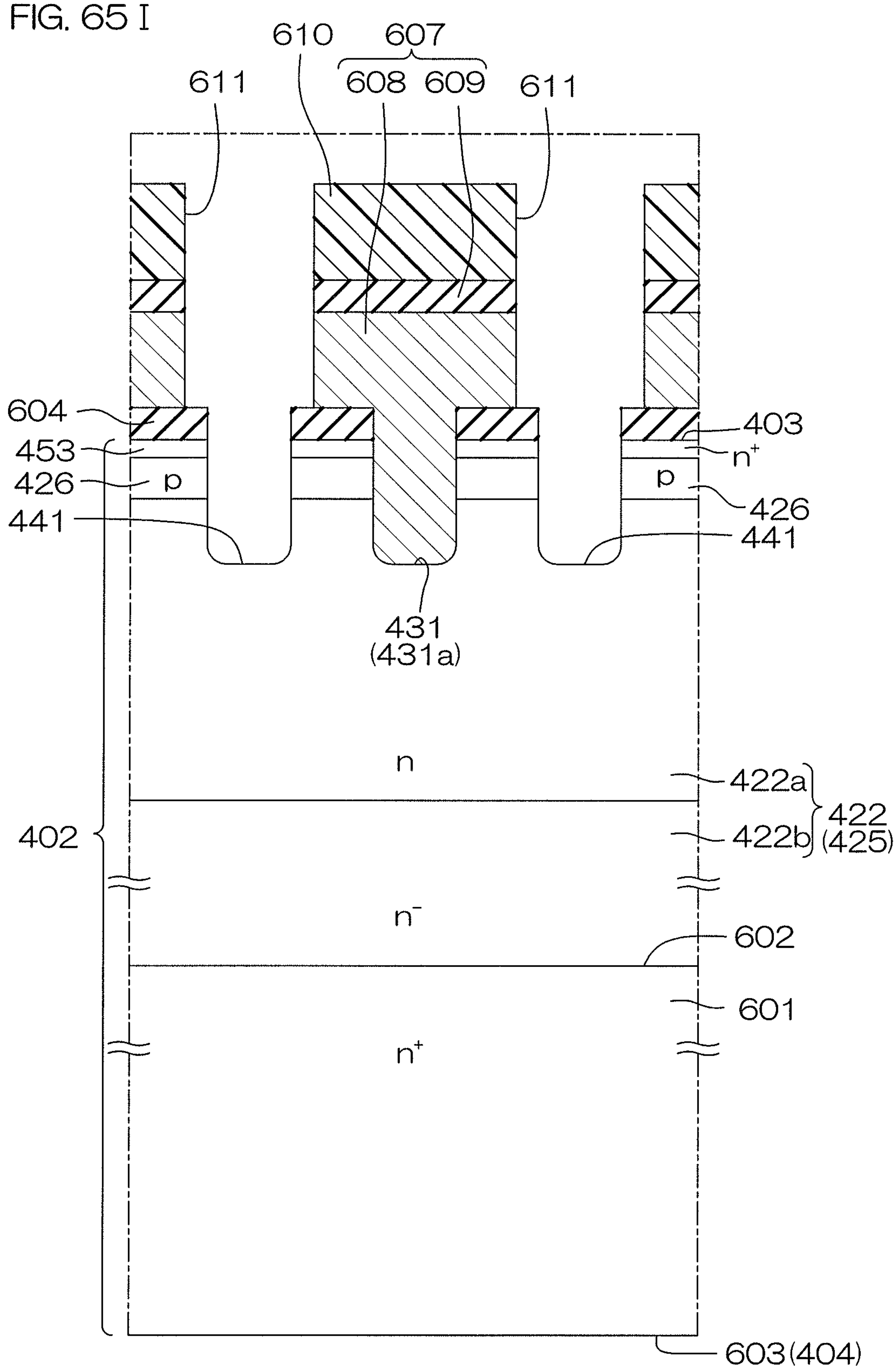

FIG. 65H is an enlarged view of a step subsequent to that of FIG. 65G.

FIG. 65I is an enlarged view of a step subsequent to that of FIG. 65H.

Figure 65J:
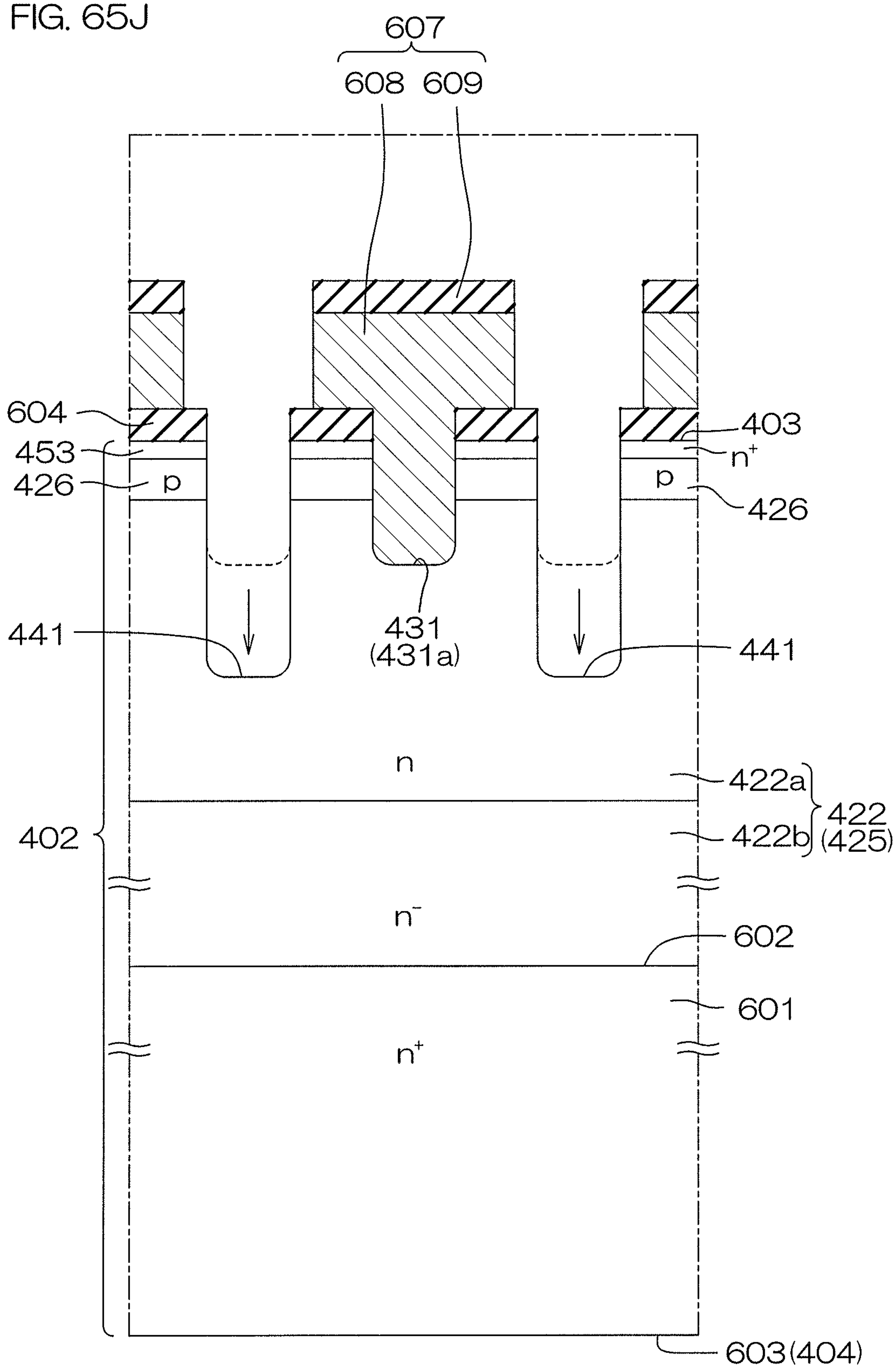

FIG. 65J is an enlarged view of a step subsequent to that of FIG. 65I.

Figure 65K:
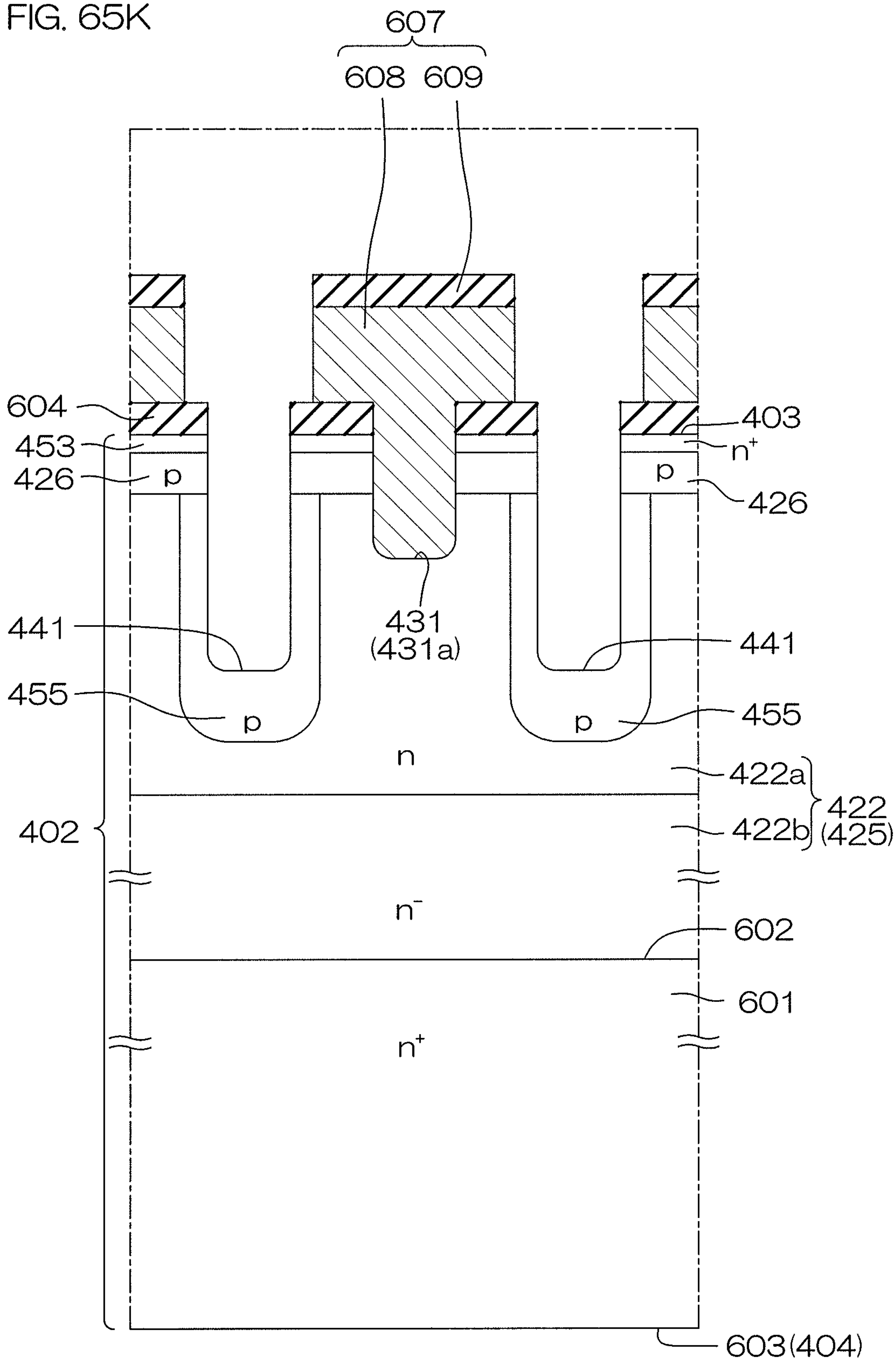

FIG. 65K is an enlarged view of a step subsequent to that of FIG. 65J.

Figure 65L:
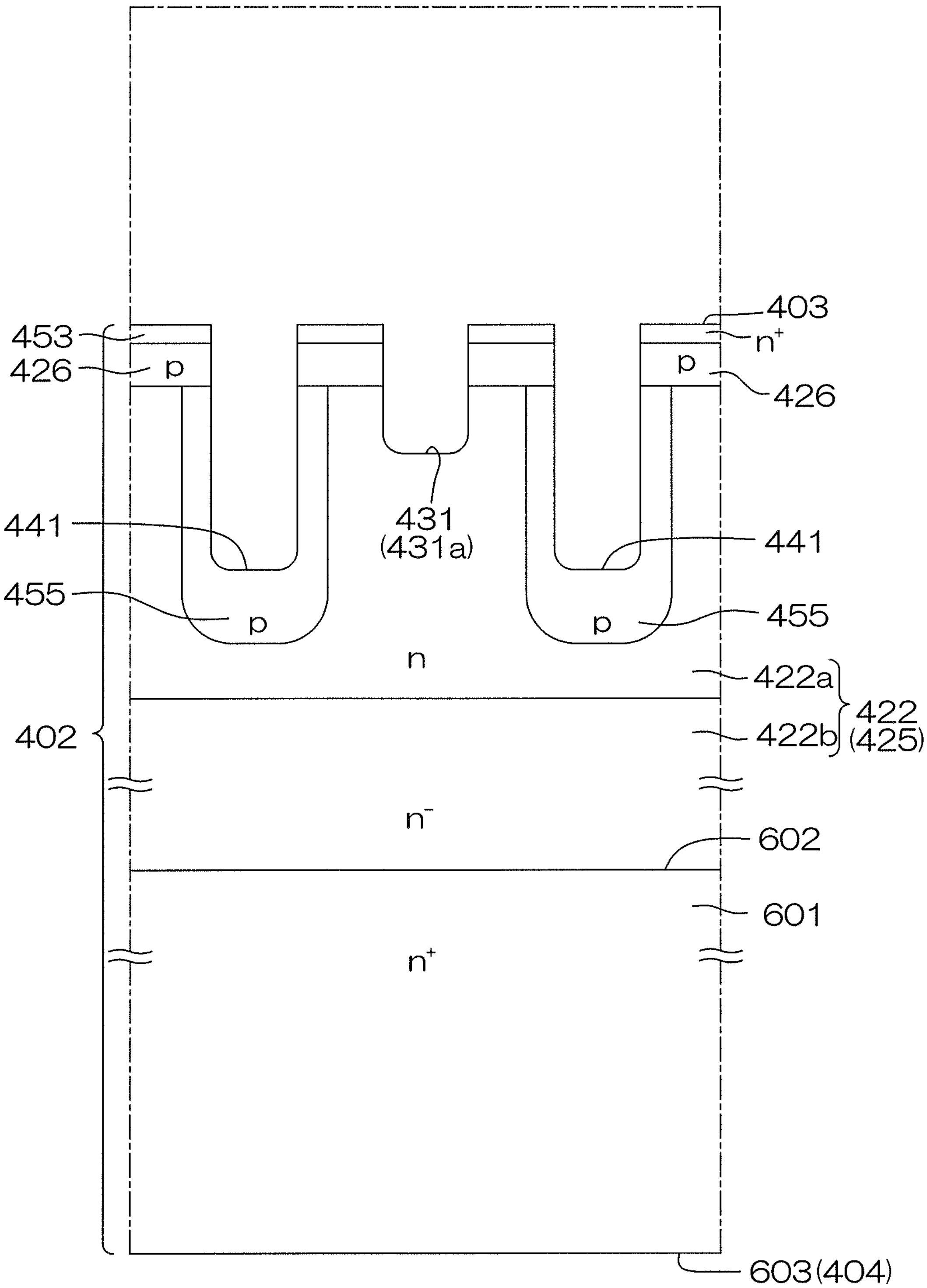

FIG. 65L is an enlarged view of a step subsequent to that of FIG. 65K.

Figure 65M:
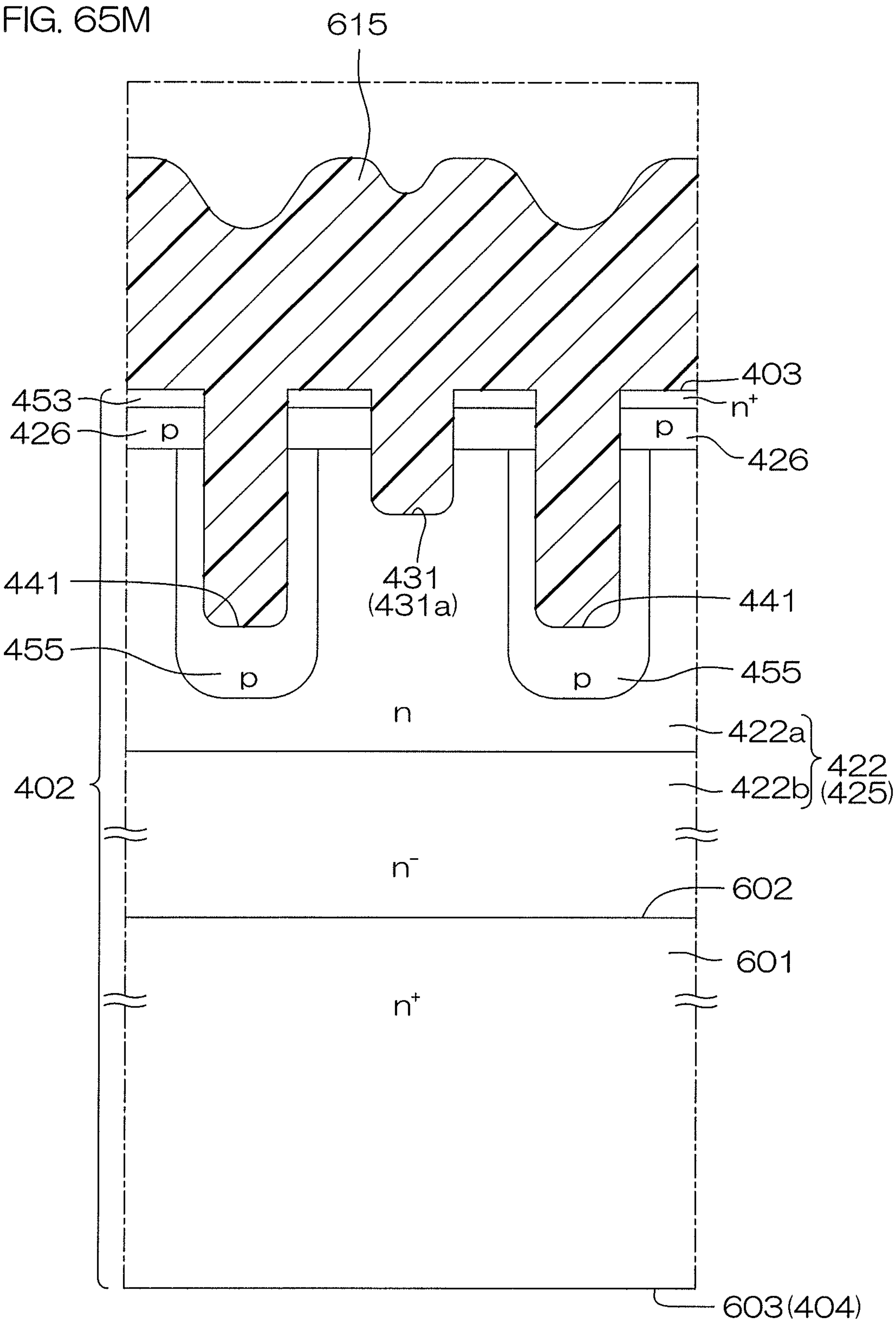

FIG. 65M is an enlarged view of a step subsequent to that of FIG. 65L.

Figure 65N:
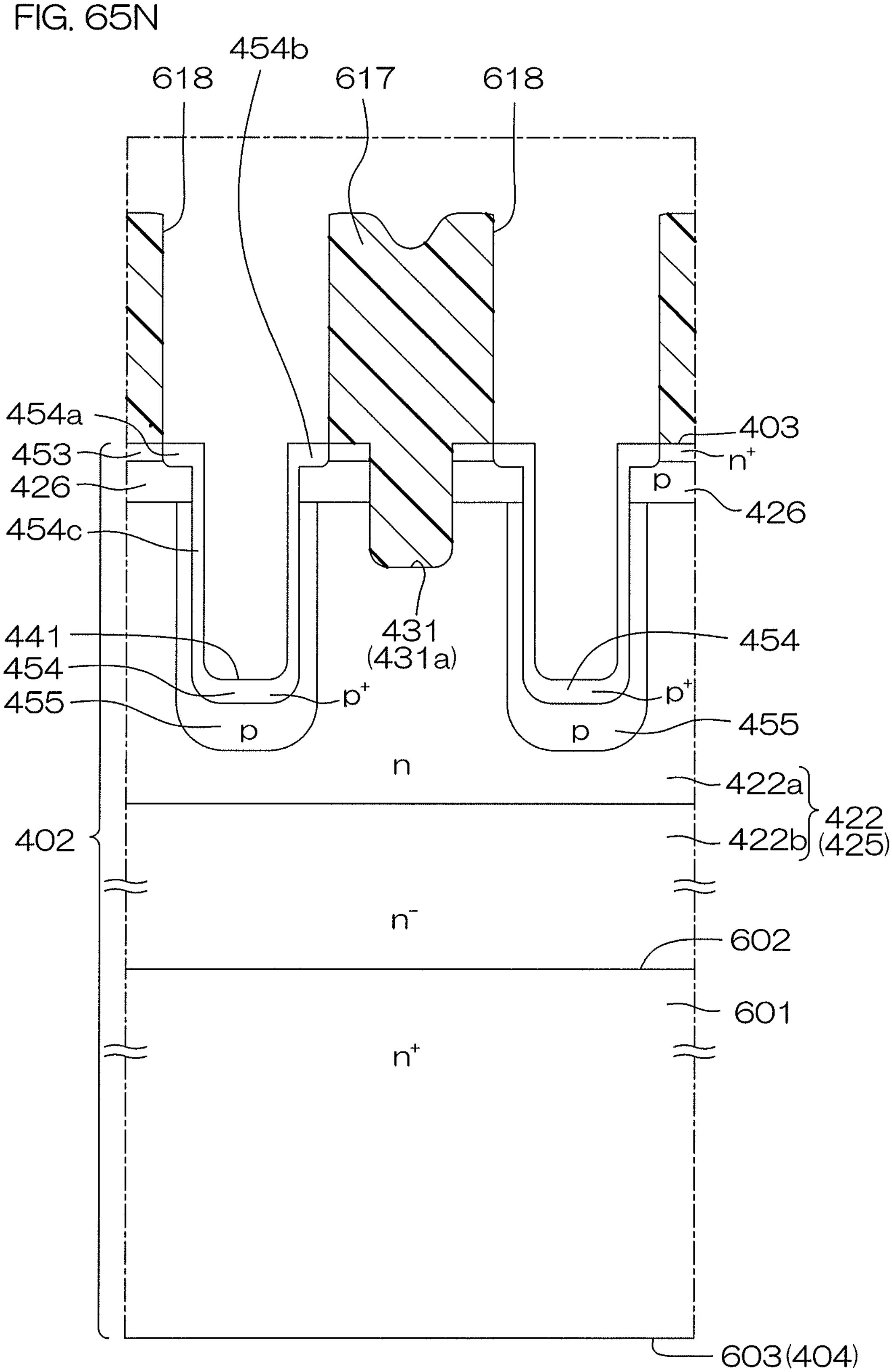
Figure 650:
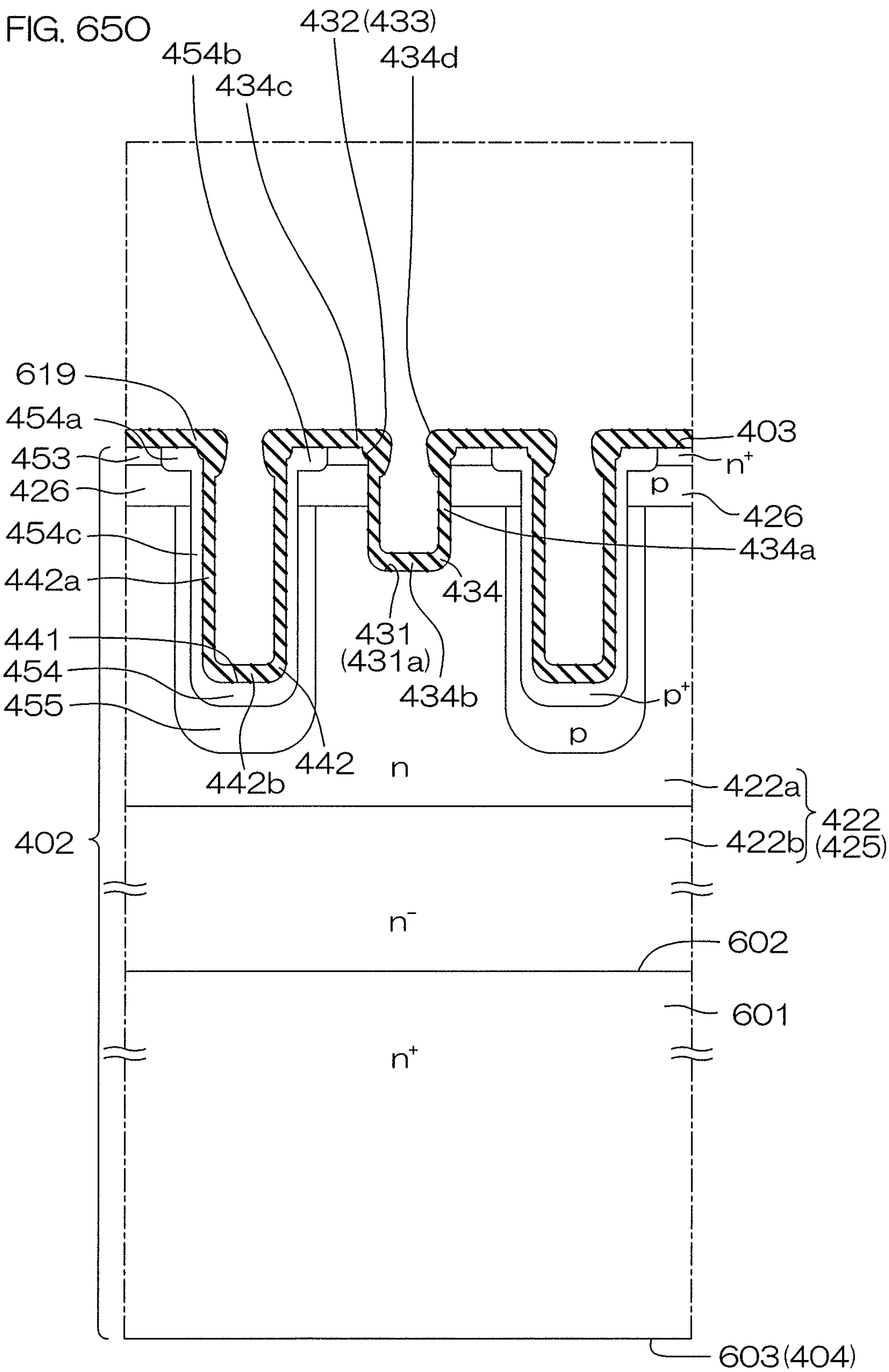

FIG. 65N is an enlarged view of a step subsequent to that of FIG. 65M.

FIG. 65O is an enlarged view of a step subsequent to that of FIG. 65N.

Figure 65P:
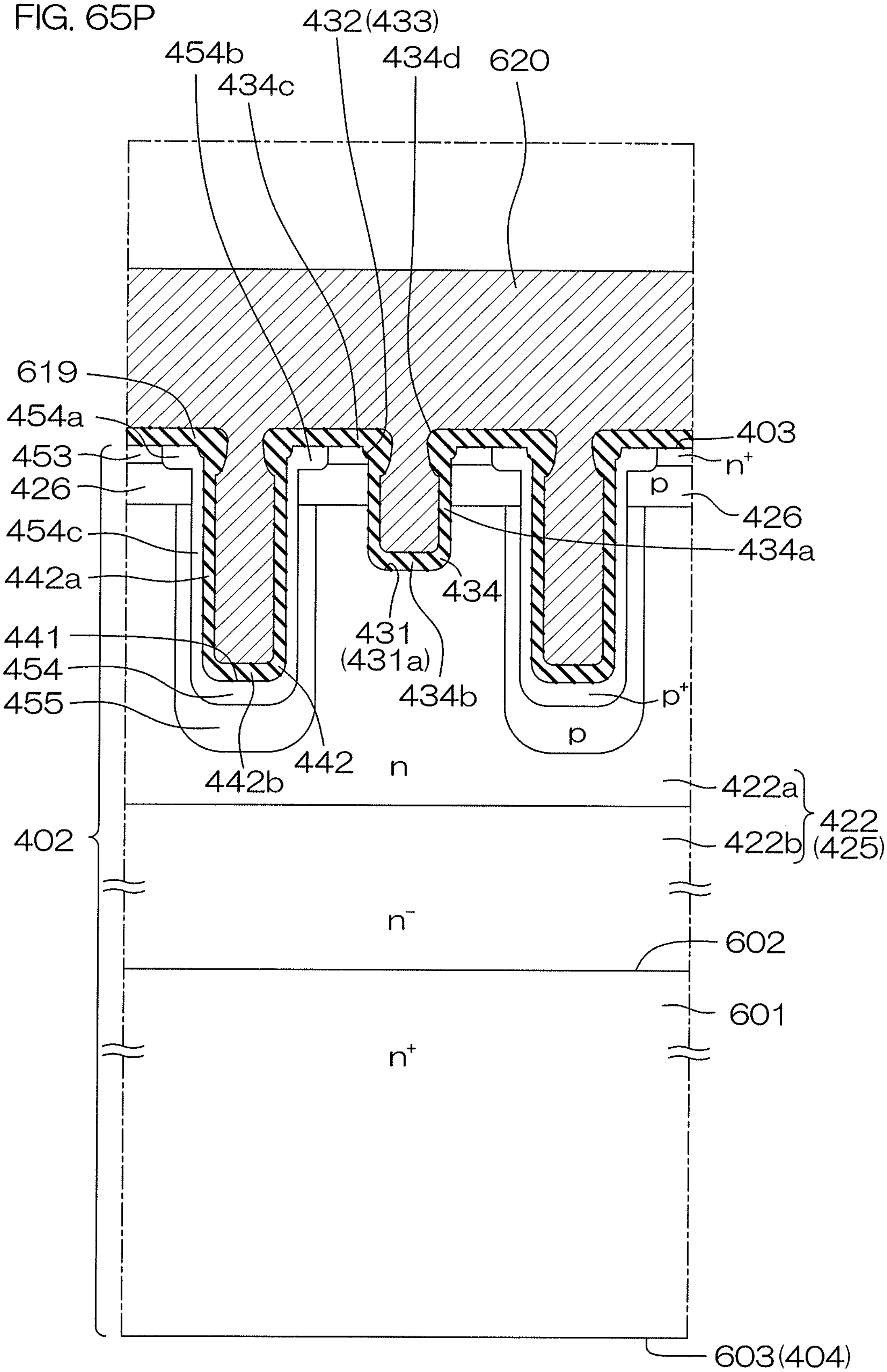

FIG. 65P is an enlarged view of a step subsequent to that of FIG. 65O.

Figure 65Q:
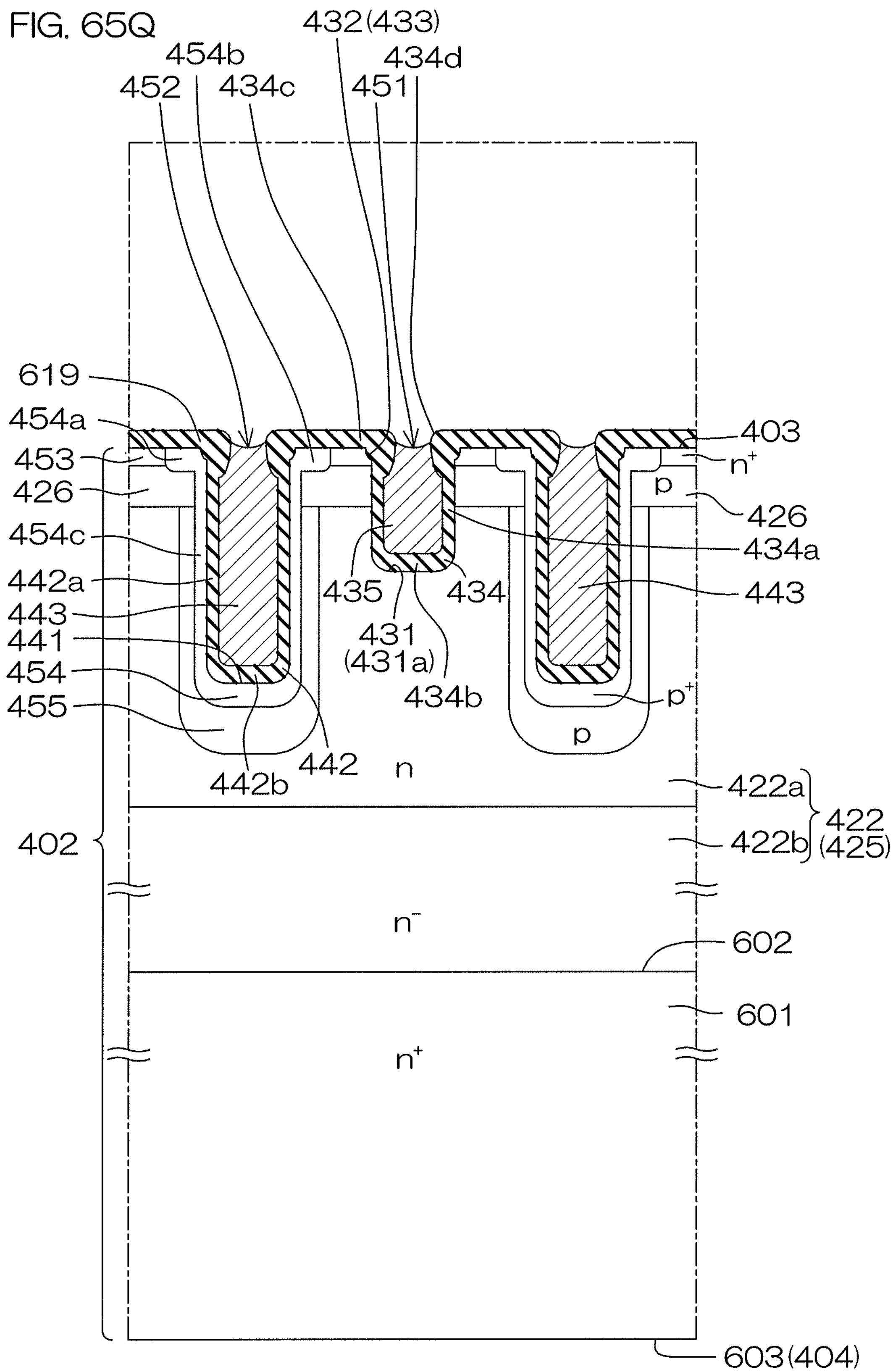

FIG. 65Q is an enlarged view of a step subsequent to that of FIG. 65P.

Figure 65R:
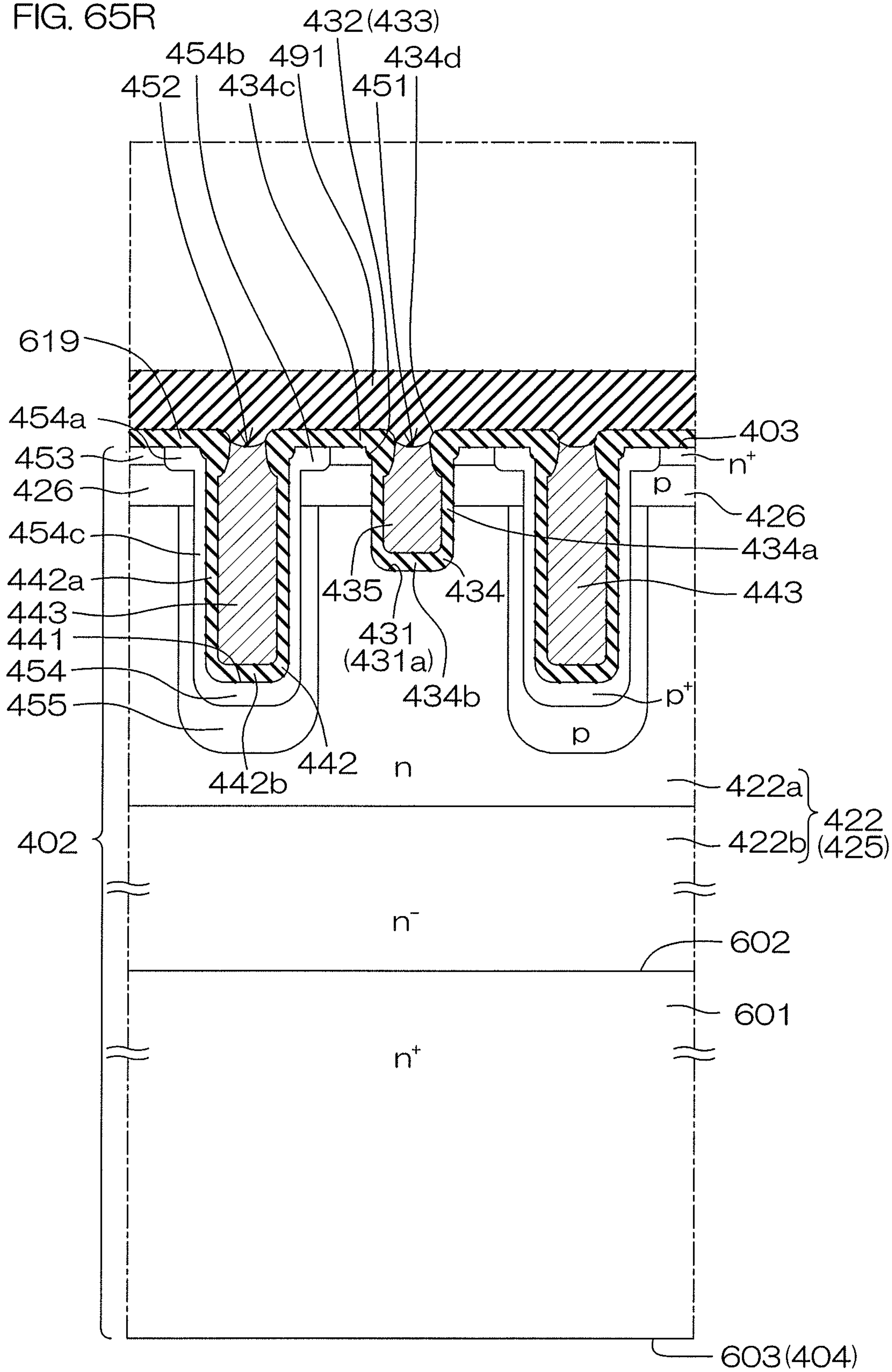

FIG. 65R is an enlarged view of a step subsequent to that of FIG. 65Q.

Figure 65S:
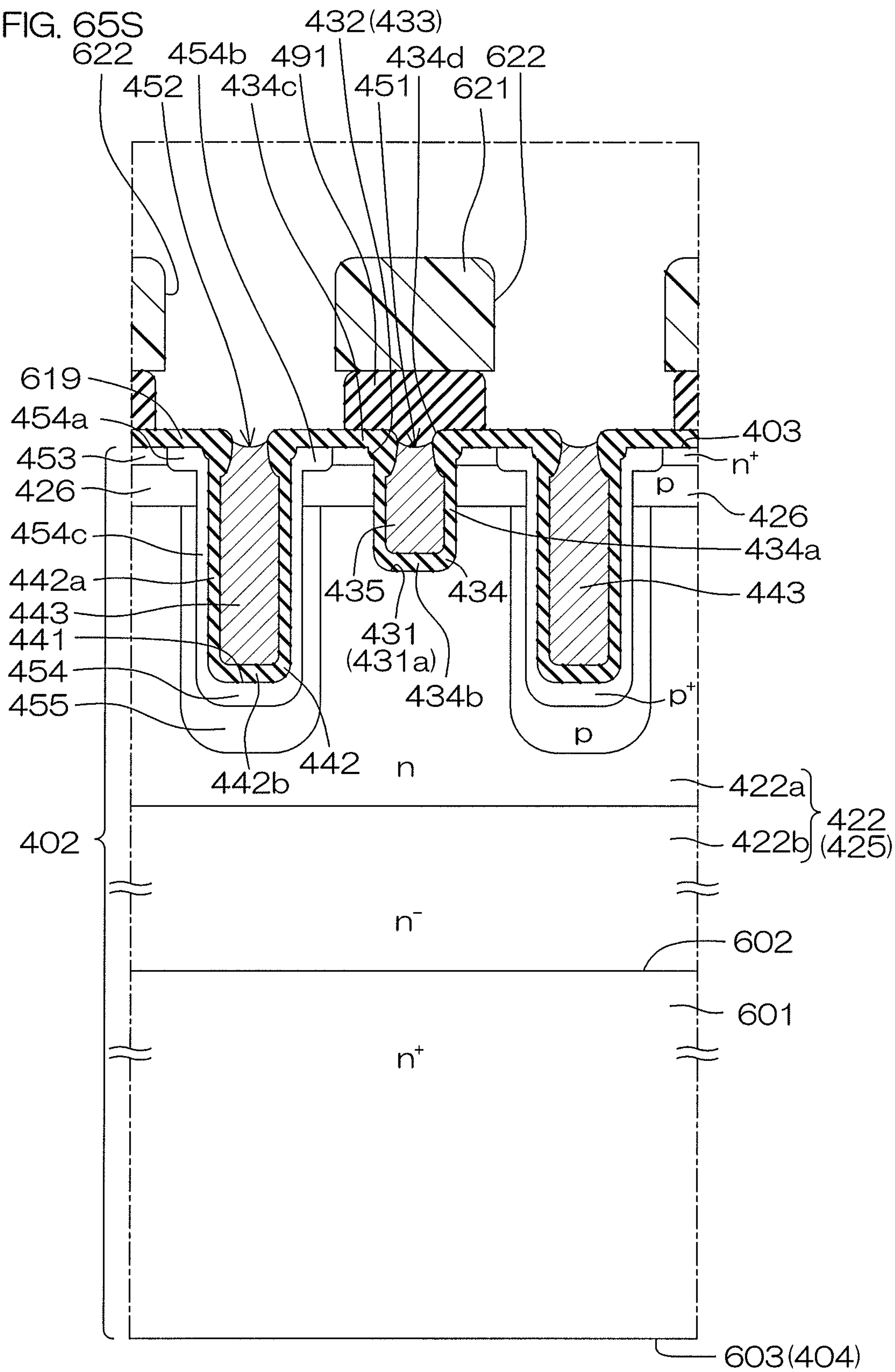

FIG. 65S is an enlarged view of a step subsequent to that of FIG. 65R.

Figure 65T:
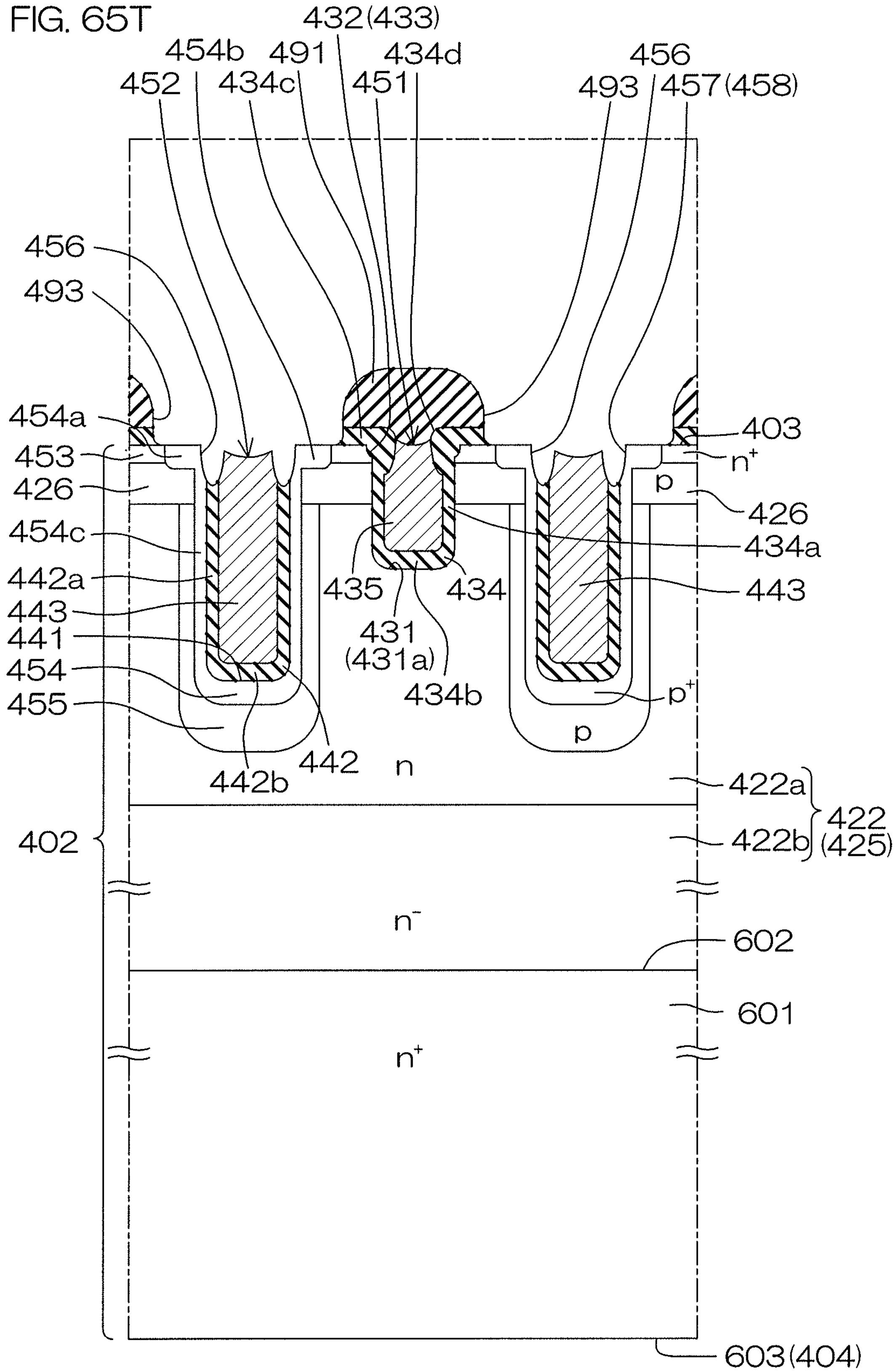

FIG. 65T is an enlarged view of a step subsequent to that of FIG. 65S.

Figure 65U:
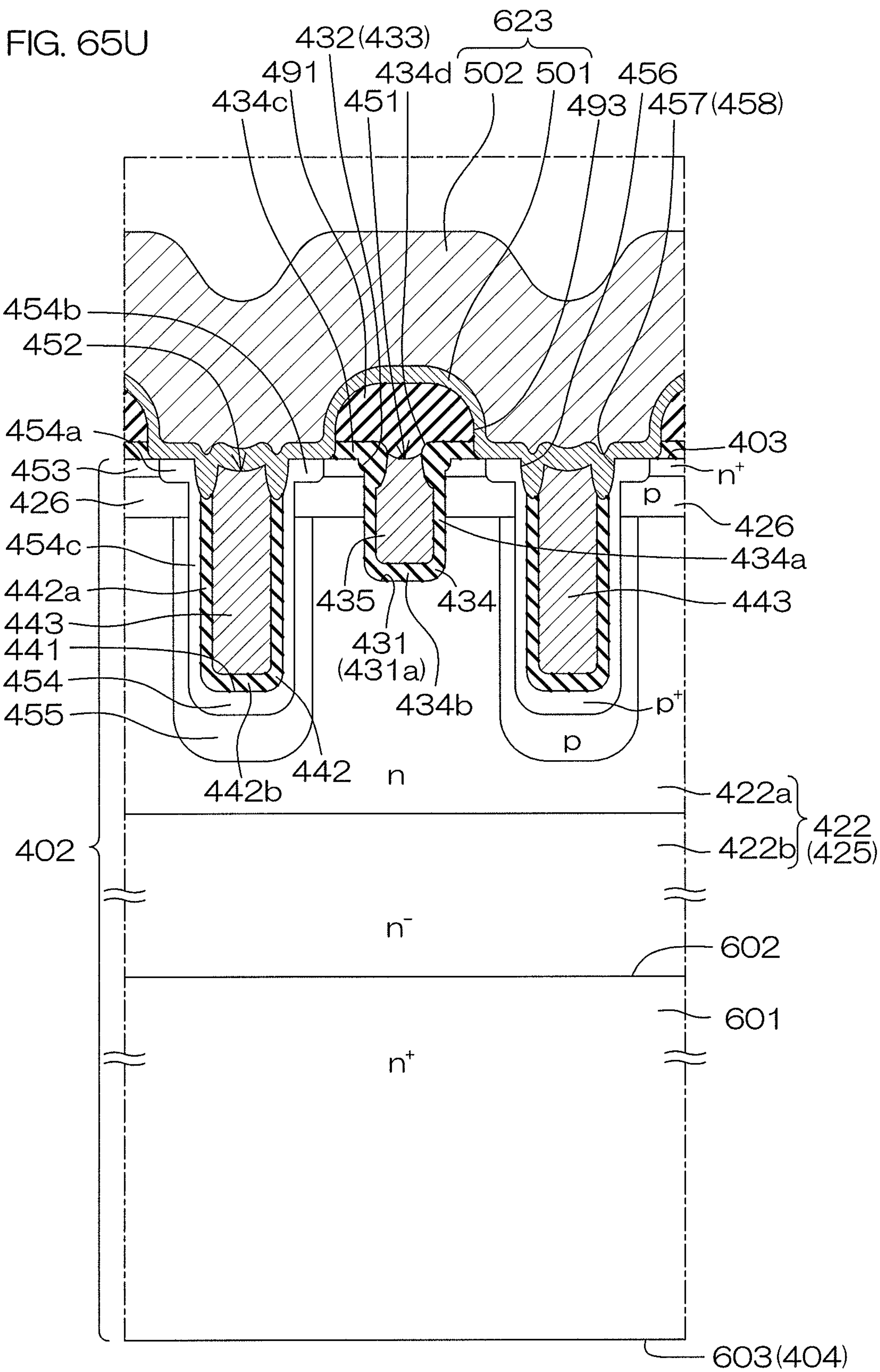

FIG. 65U is an enlarged view of a step subsequent to that of FIG. 65T.

Figure 65V:
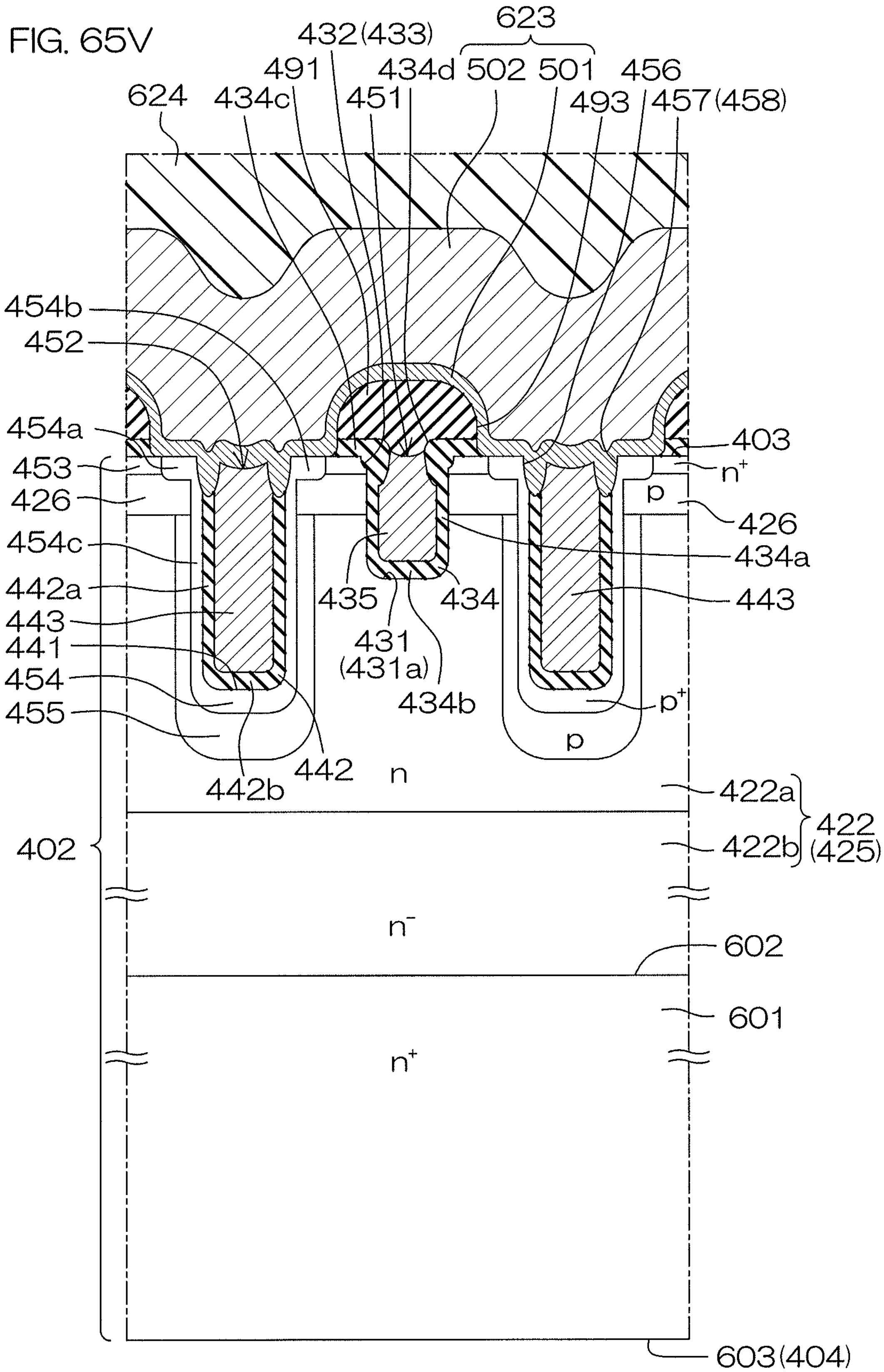

FIG. 65V is an enlarged view of a step subsequent to that of FIG. 65U.

Figure 65W:
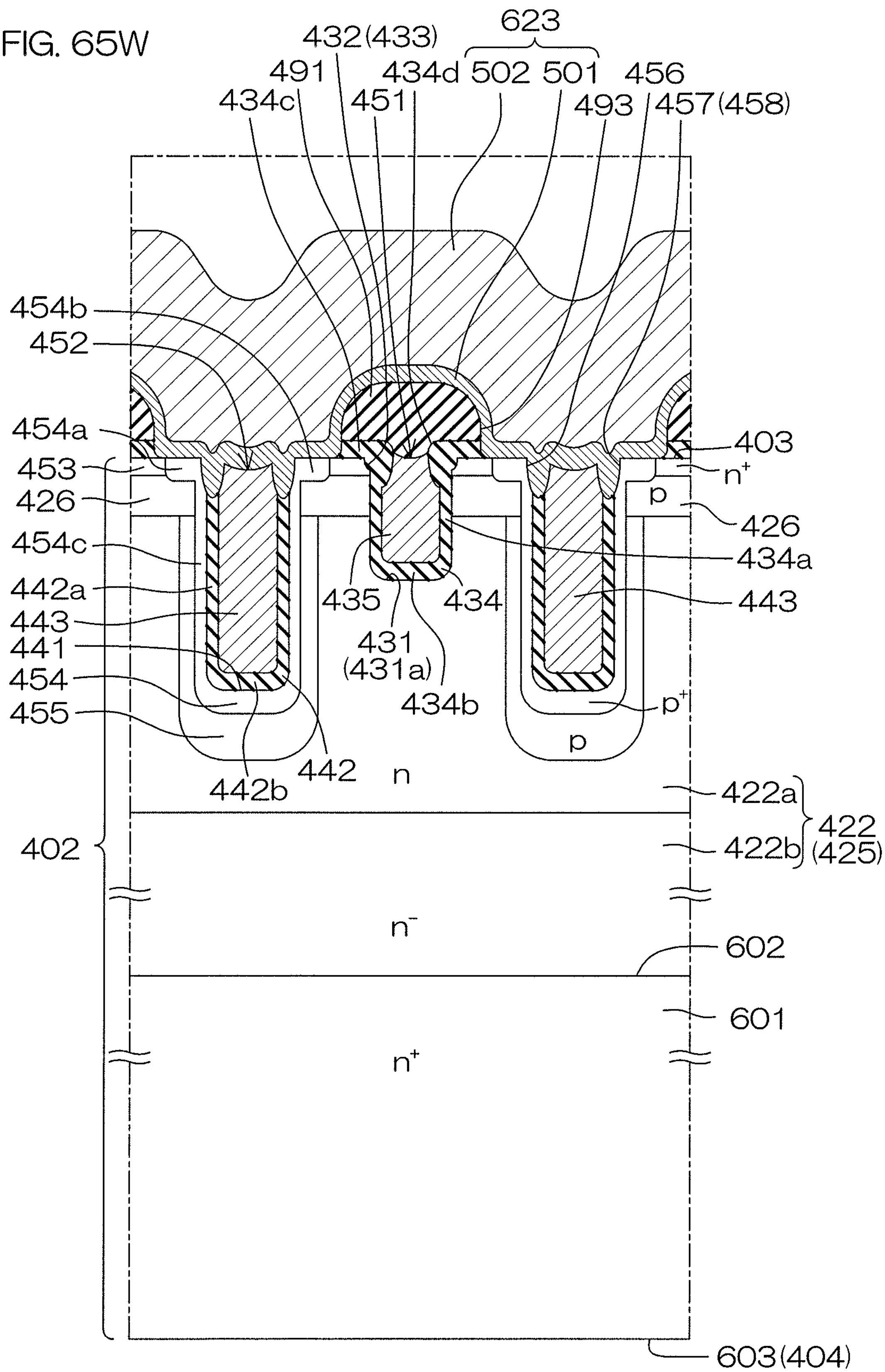

FIG. 65W is an enlarged view of a step subsequent to that of FIG. 65V.

Figure 65X:
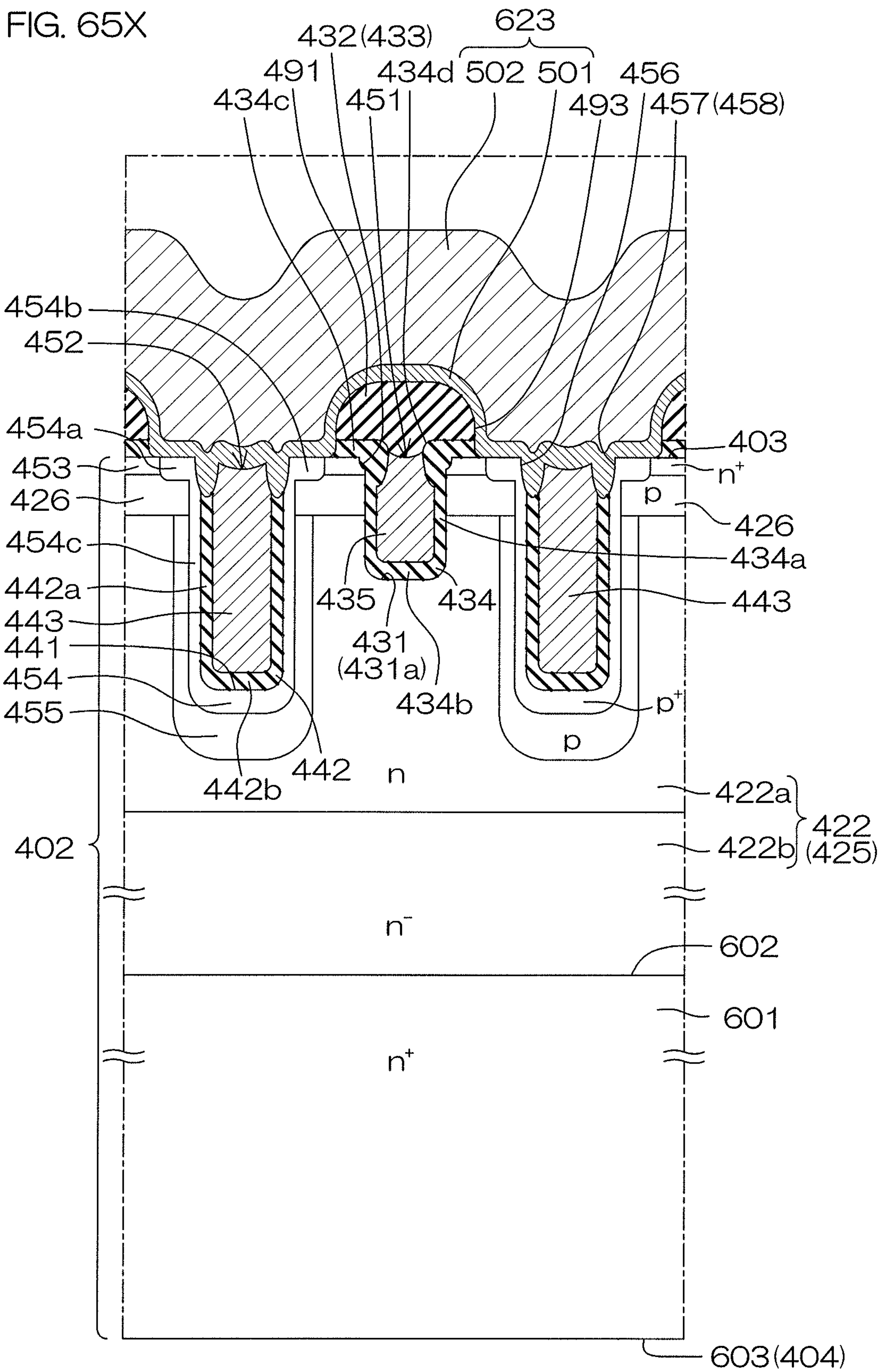

FIG. 65X is an enlarged view of a step subsequent to that of FIG. 65W.

Figure 65Y:
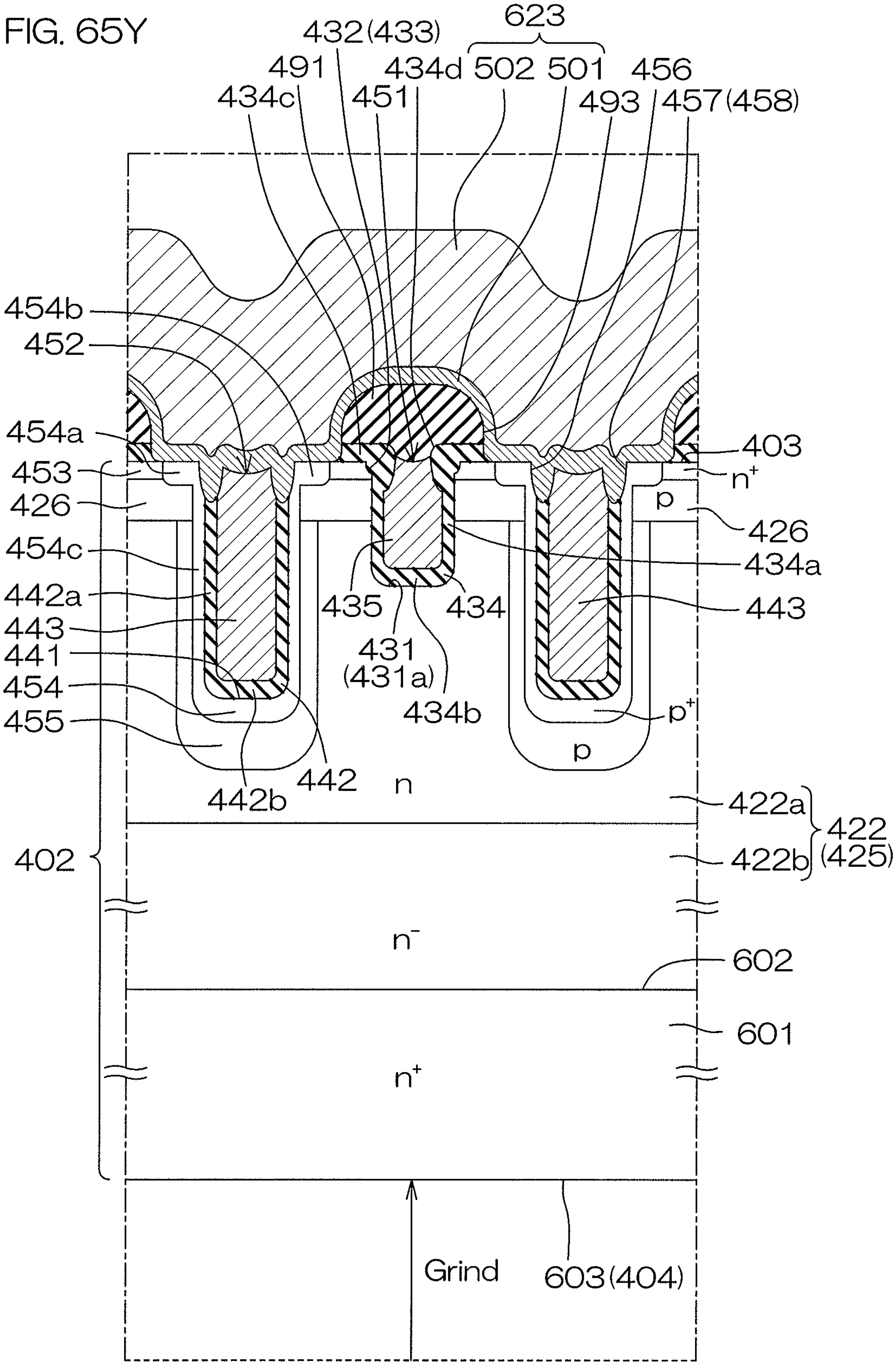

FIG. 65Y is an enlarged view of a step subsequent to that of FIG. 65X.

Figure 65Z:
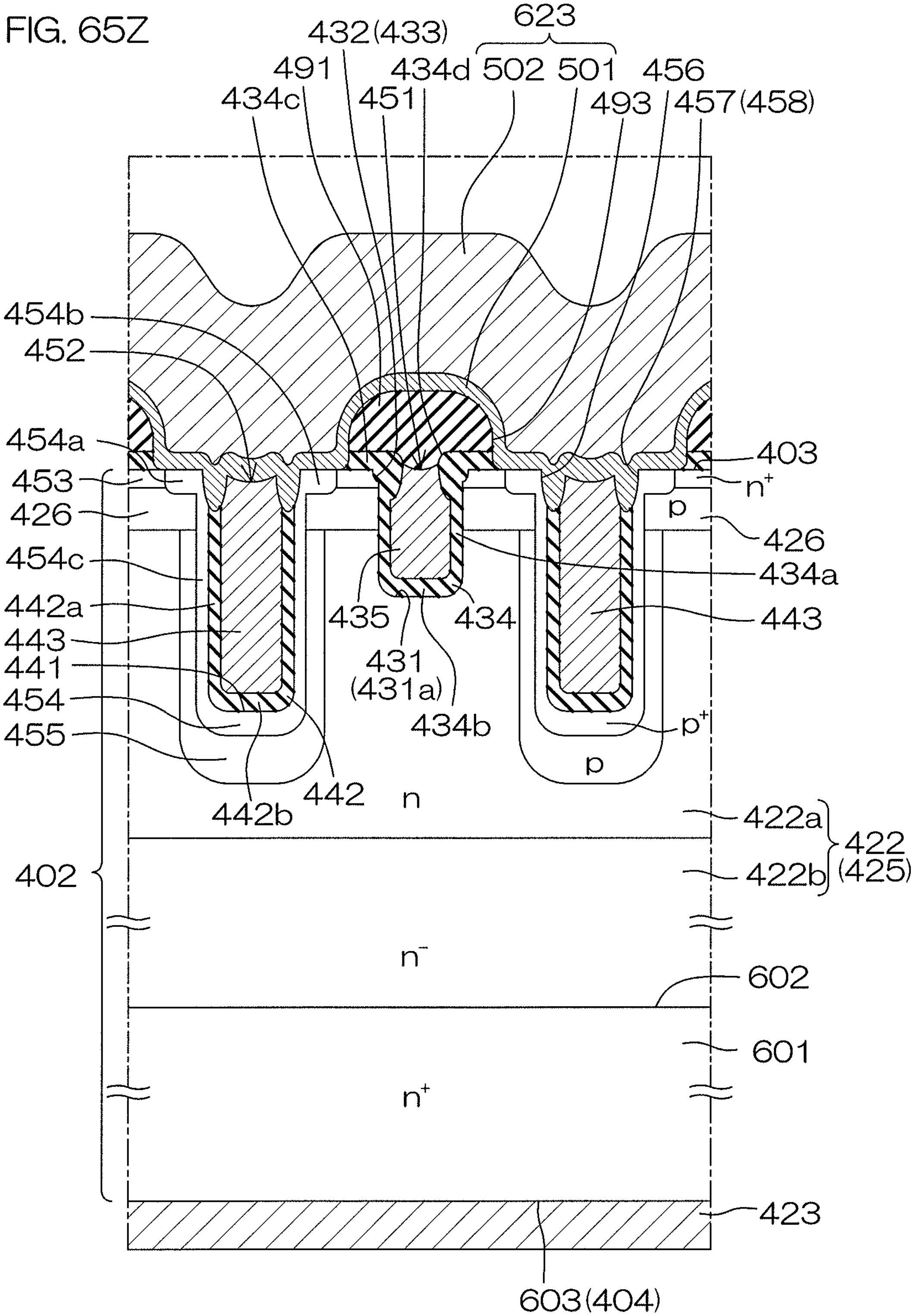

FIG. 65Z is an enlarged view of a step subsequent to that of FIG. 65Y.

Figure 49:
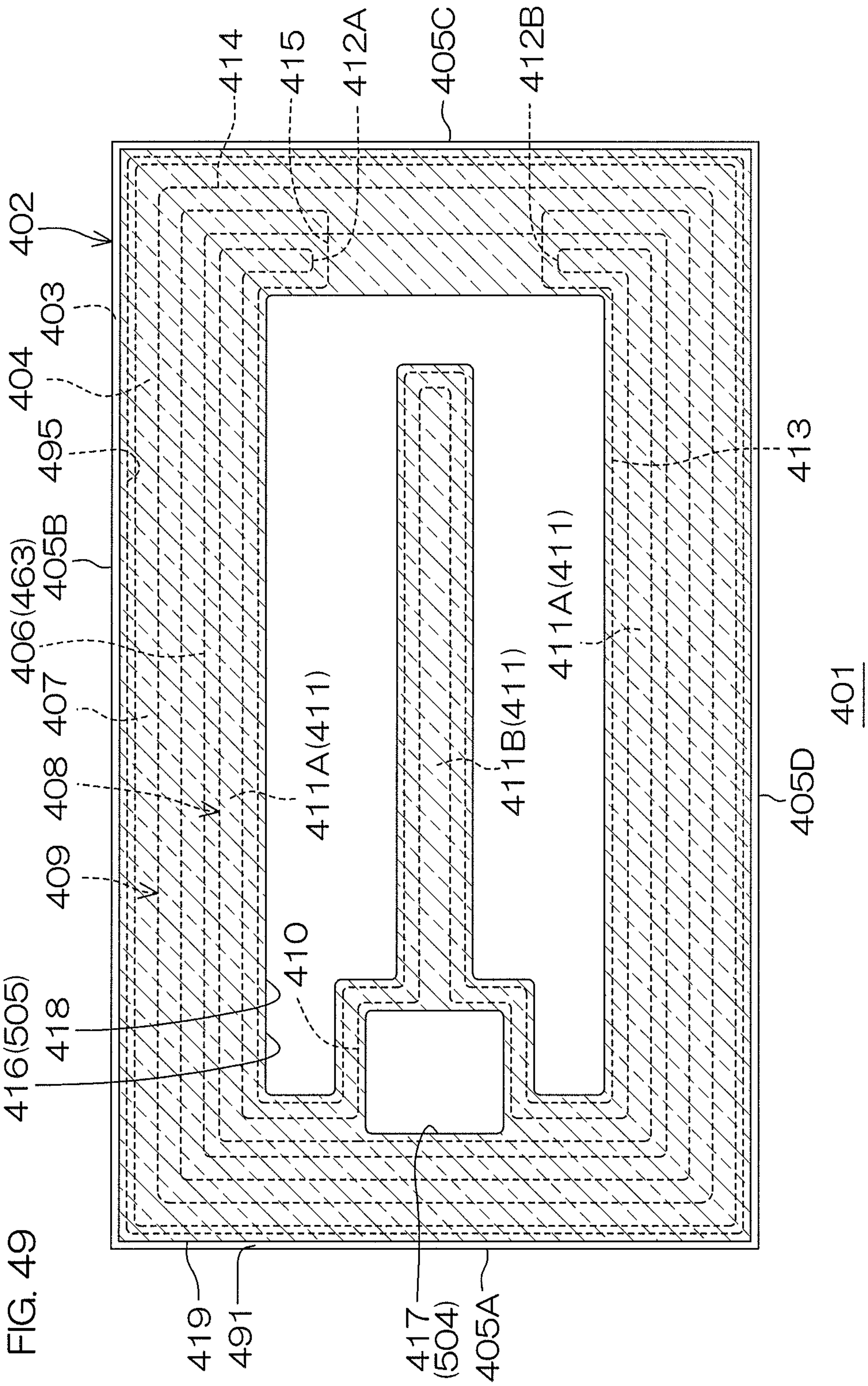
FIG. 49 is a top view of a semiconductor device according to a twenty-sixth preferred embodiment of the present invention.
Figure 55:
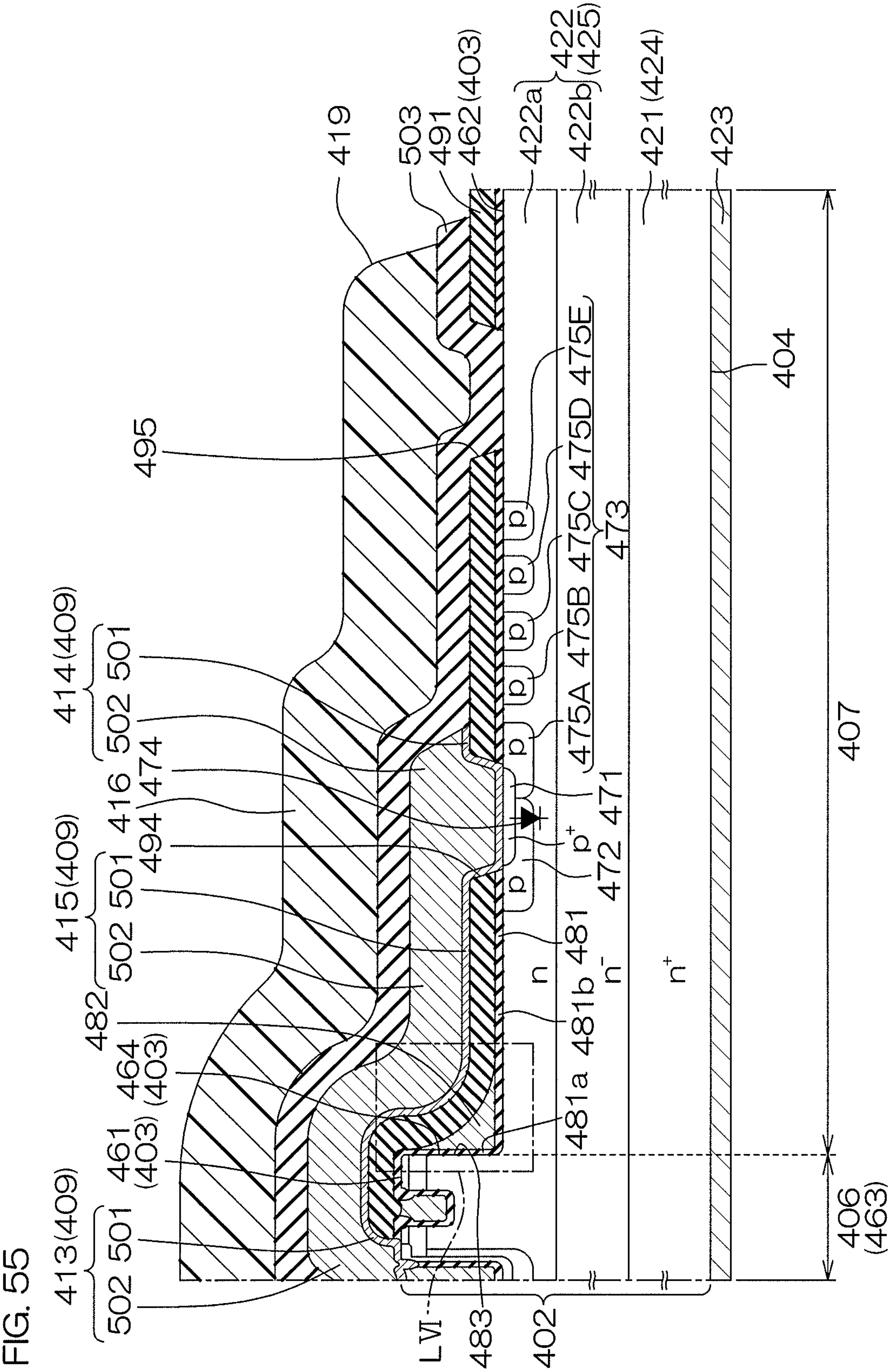
FIG. 55 is a sectional view taken along line LV-LV shown in FIG. 50 and is a sectional view of a first configuration example of an active side wall, a first configuration example of an outer main surface, a first configuration example of a side wall, a first configuration example of a diode region, a first configuration example of an outer deep well region, a first configuration example of a field limit structure, and a first configuration example of an anchor hole.
Figure 66A:
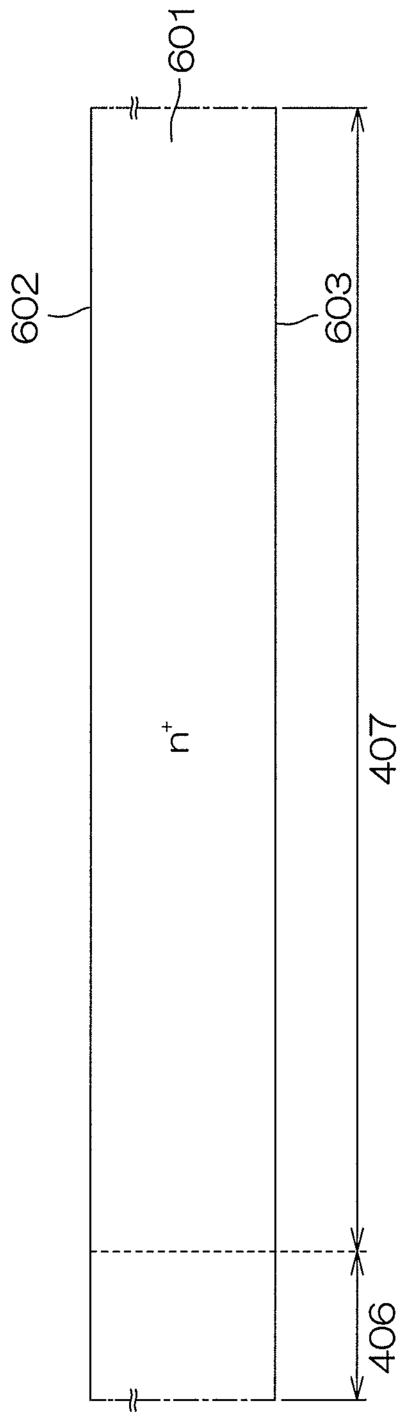

FIG. 66A is a sectional view of a region corresponding to FIG. 55 and is a sectional view of an example of a method for manufacturing the semiconductor device shown in FIG. 49.

Figure 66B:
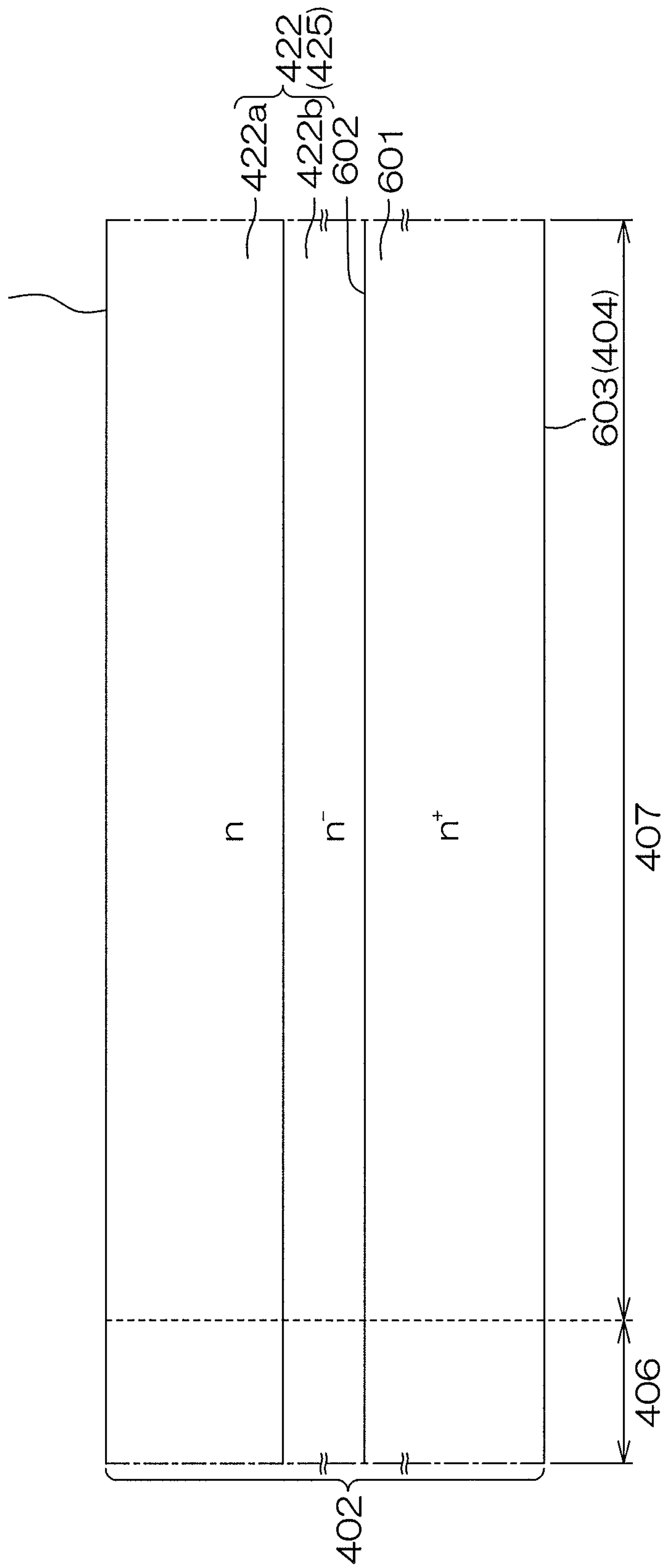

FIG. 66B is a sectional view of a step subsequent to that of FIG. 66A.

Figure 66C:
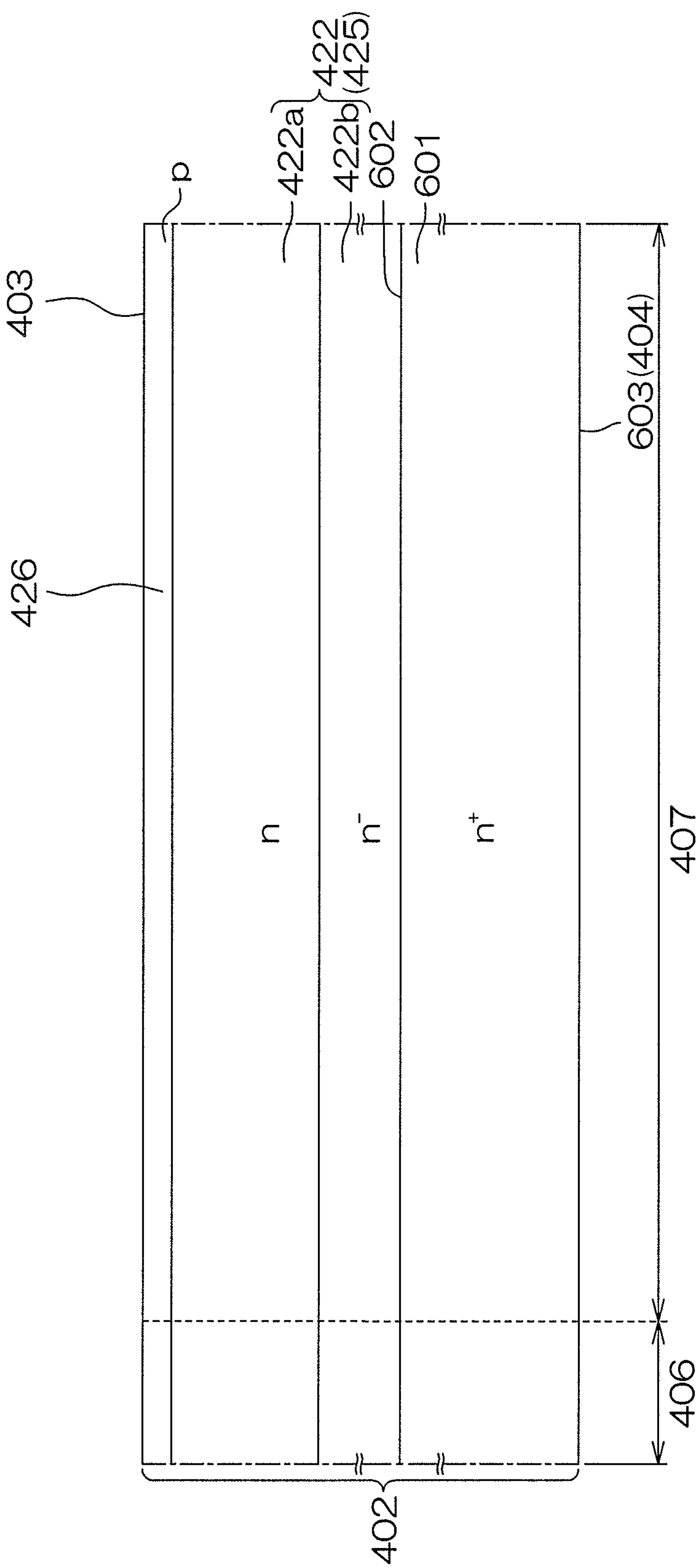

FIG. 66C is a sectional view of a step subsequent to that of FIG. 66B.

Figure 66D:
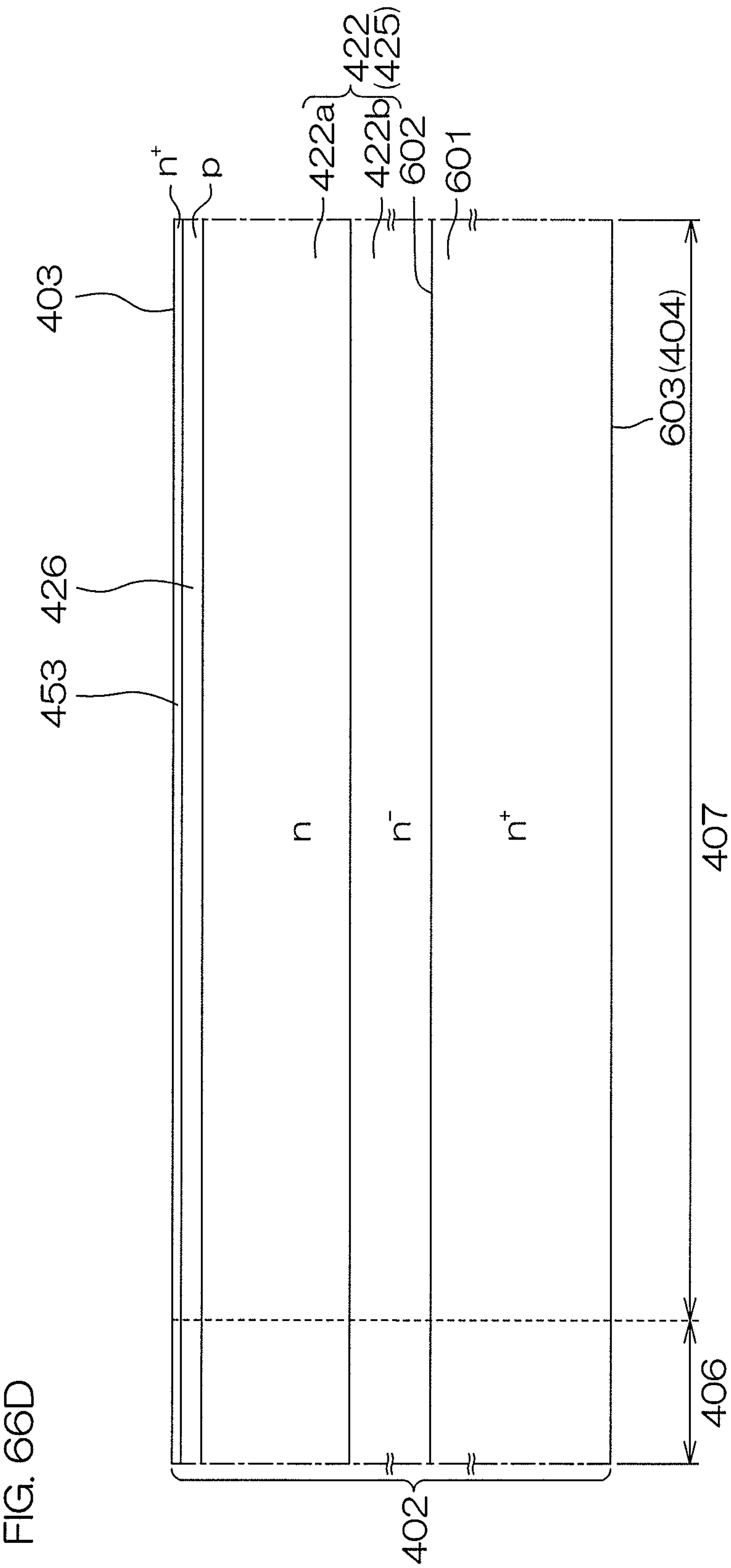

FIG. 66D is a sectional view of a step subsequent to that of FIG. 66C.

Figure 66E:
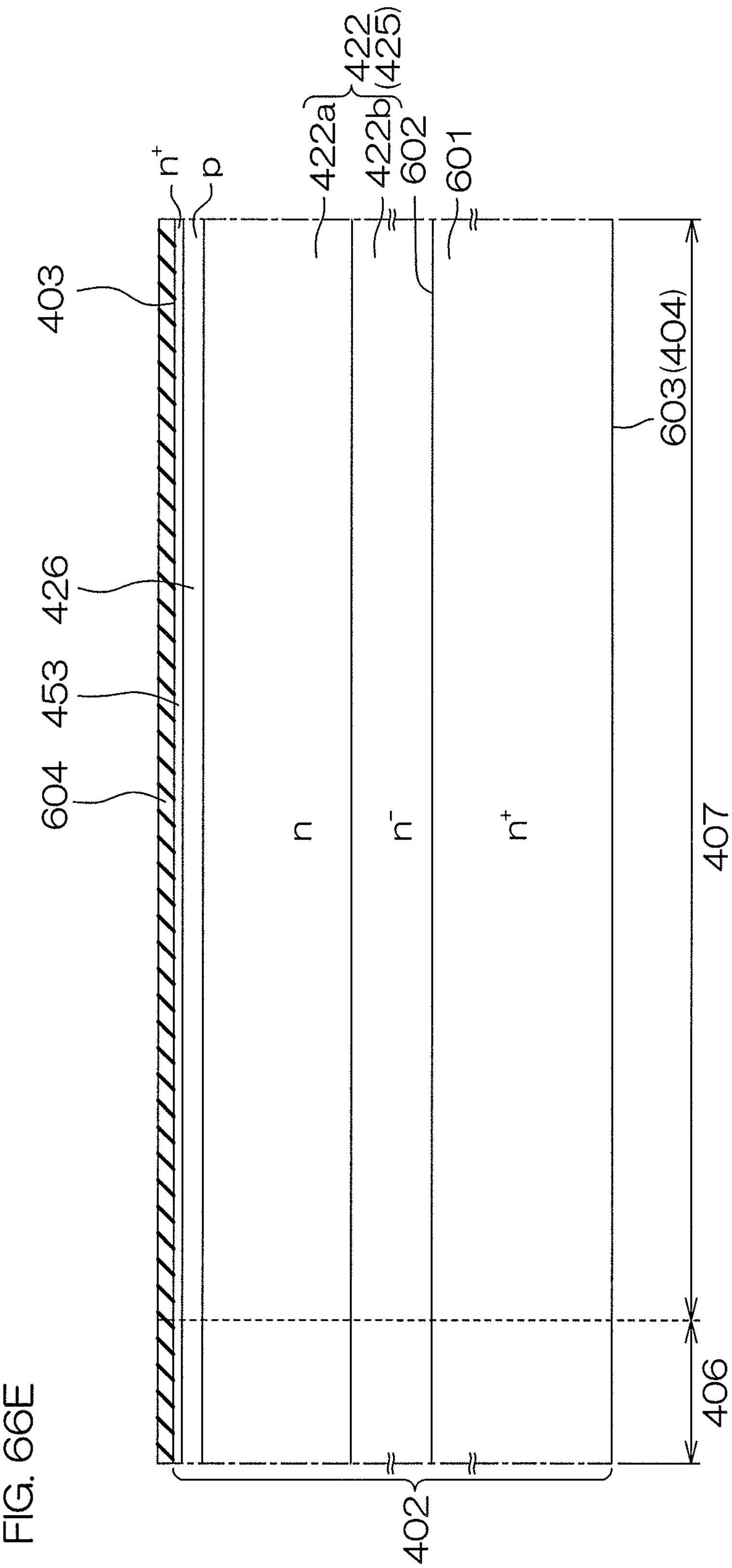

FIG. 66E is a sectional view of a step subsequent to that of FIG. 66D.

Figure 66F:
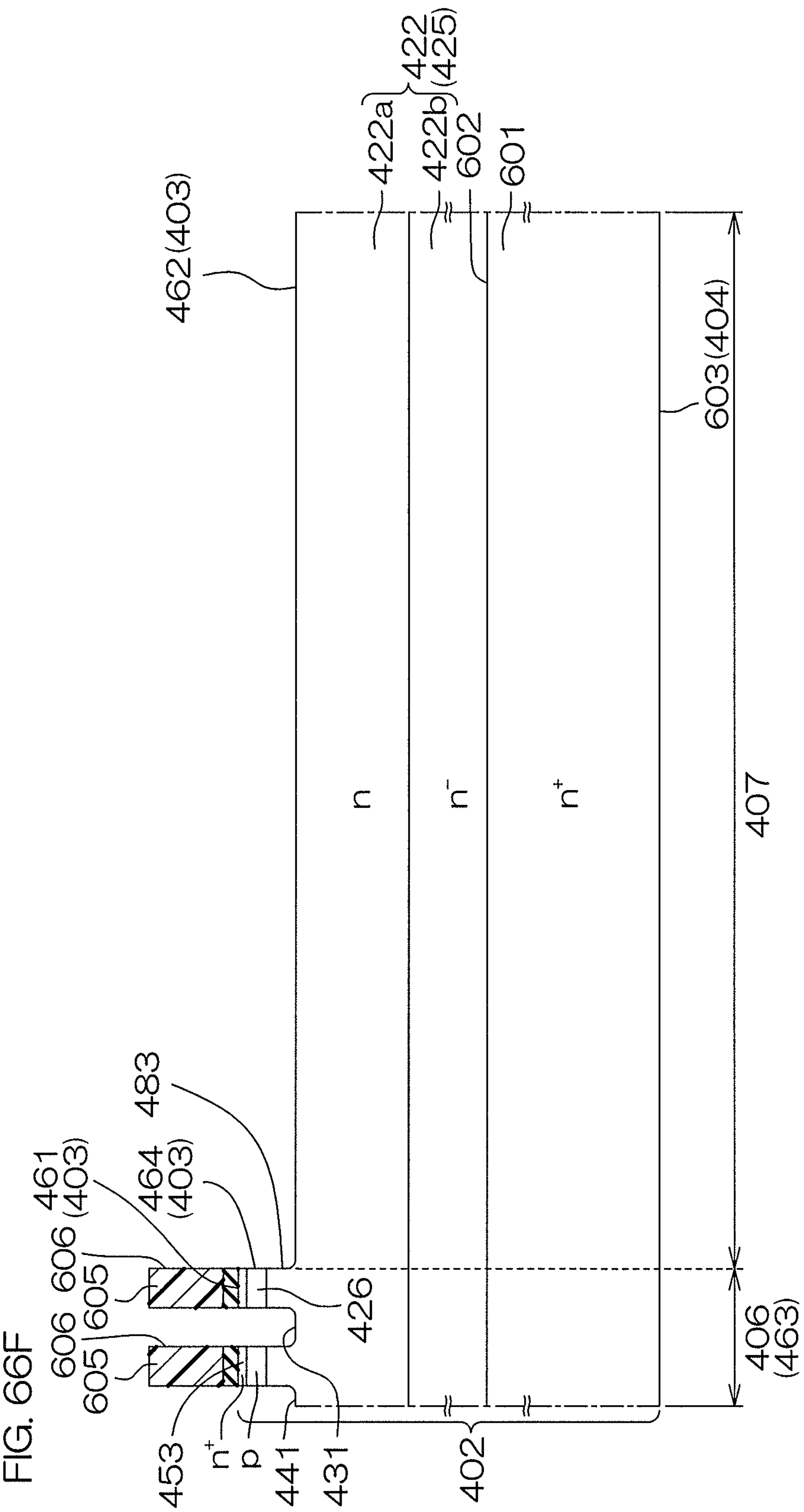

FIG. 66F is a sectional view of a step subsequent to that of FIG. 66E.

Figure 66G:
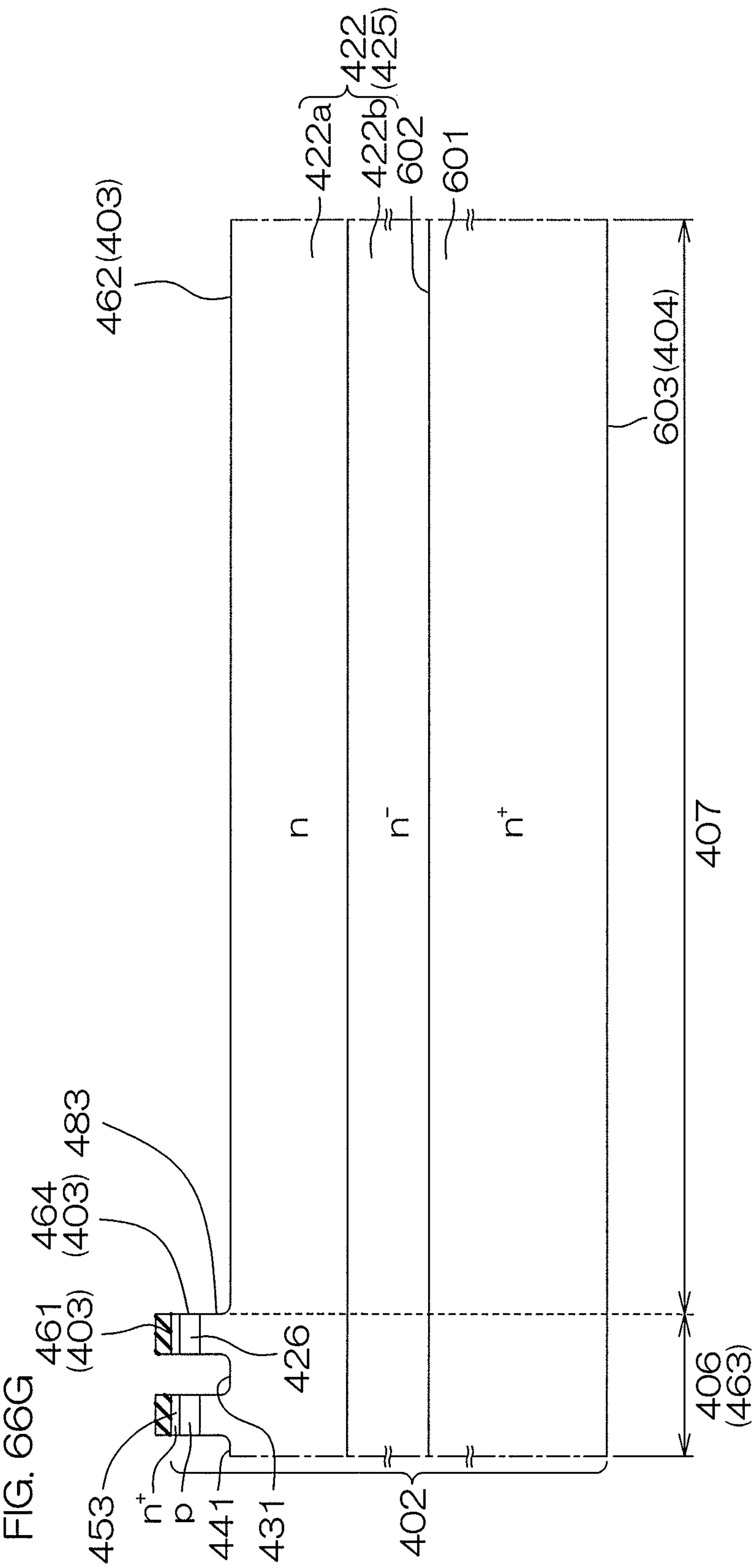

FIG. 66G is a sectional view of a step subsequent to that of FIG. 66F.

Figure 66H:
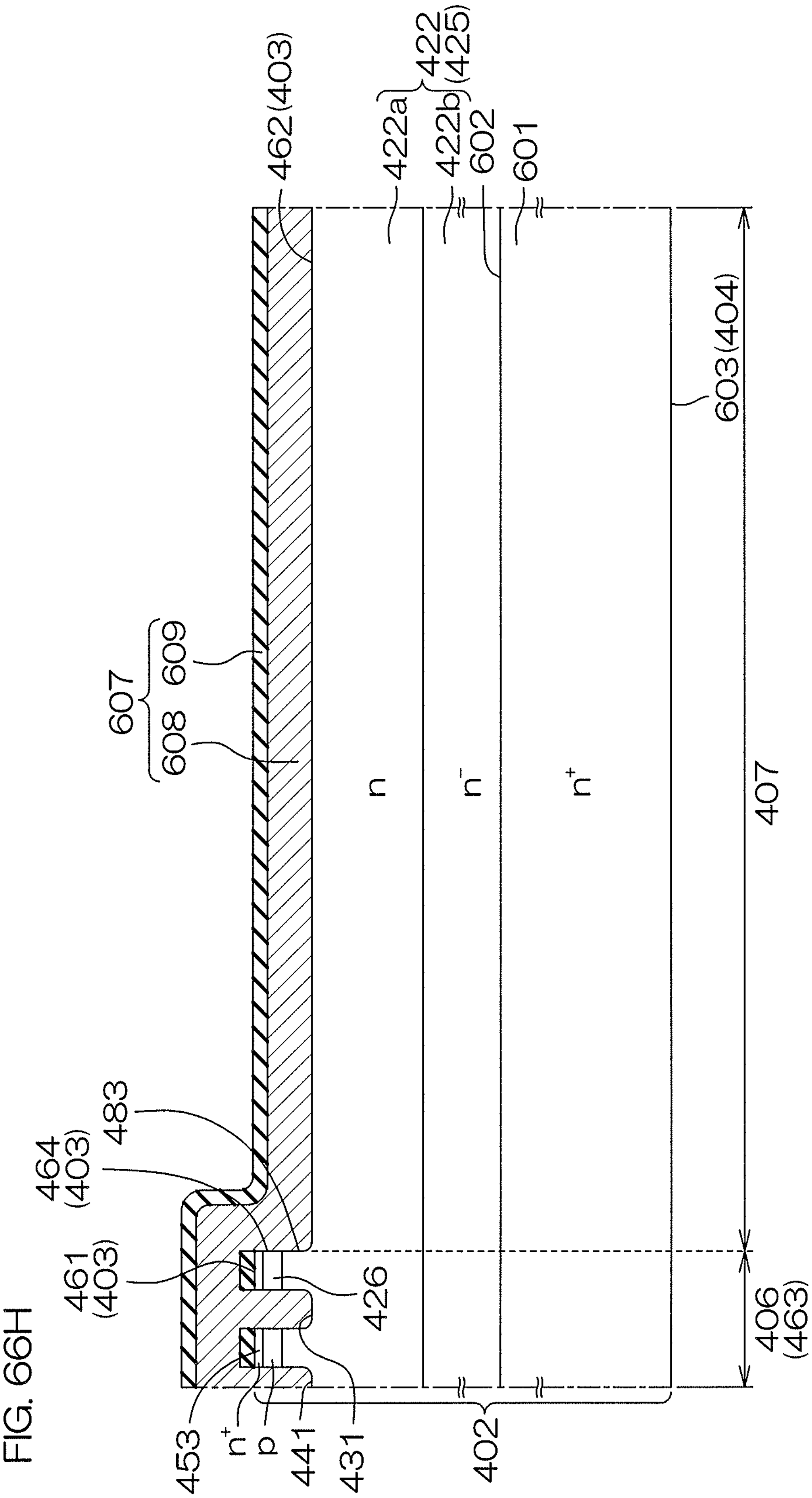

FIG. 66H is a sectional view of a step subsequent to that of FIG. 66G.

Figure 66I:
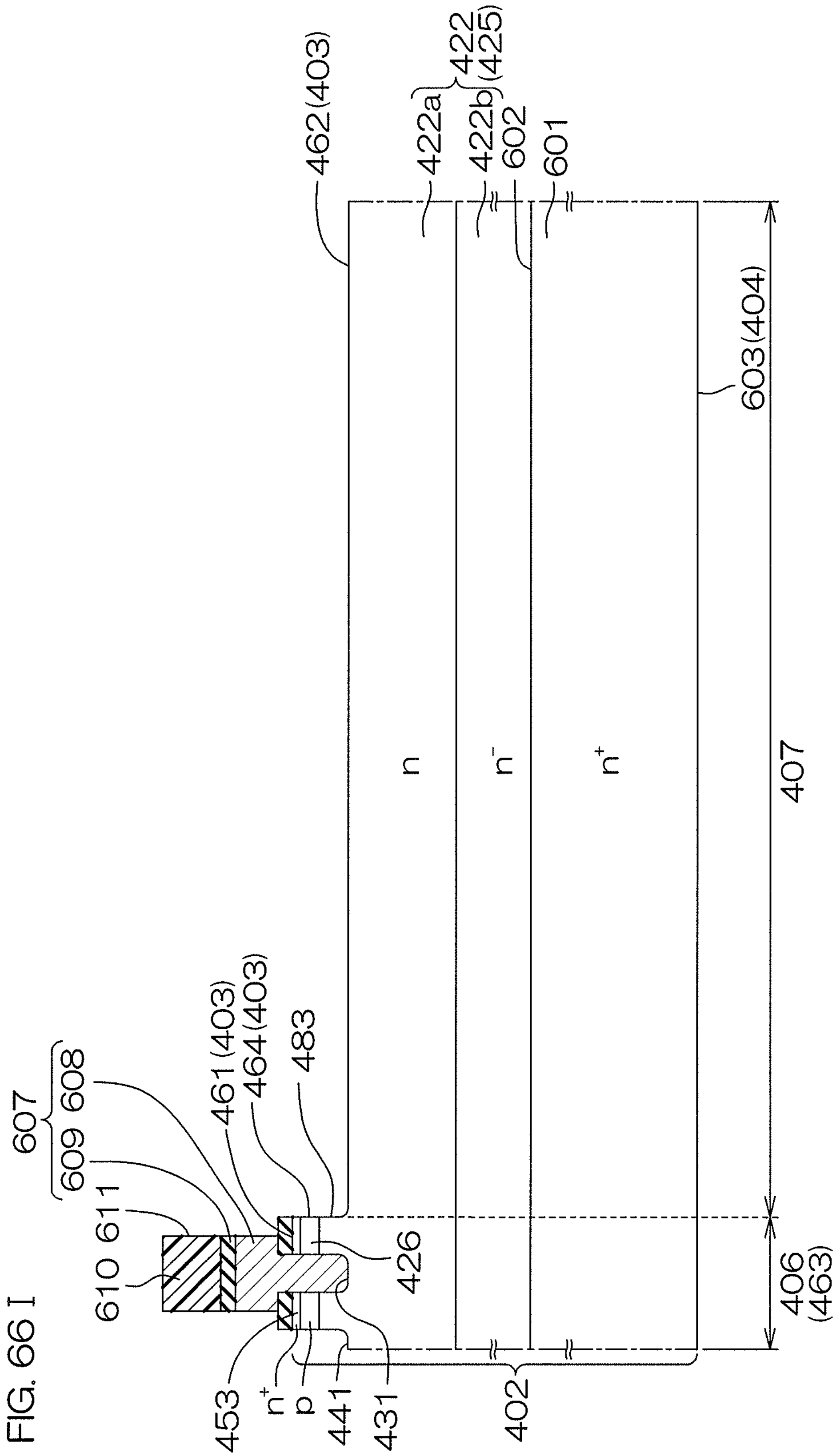

FIG. 66I is a sectional view of a step subsequent to that of FIG. 66H.

Figure 66J:
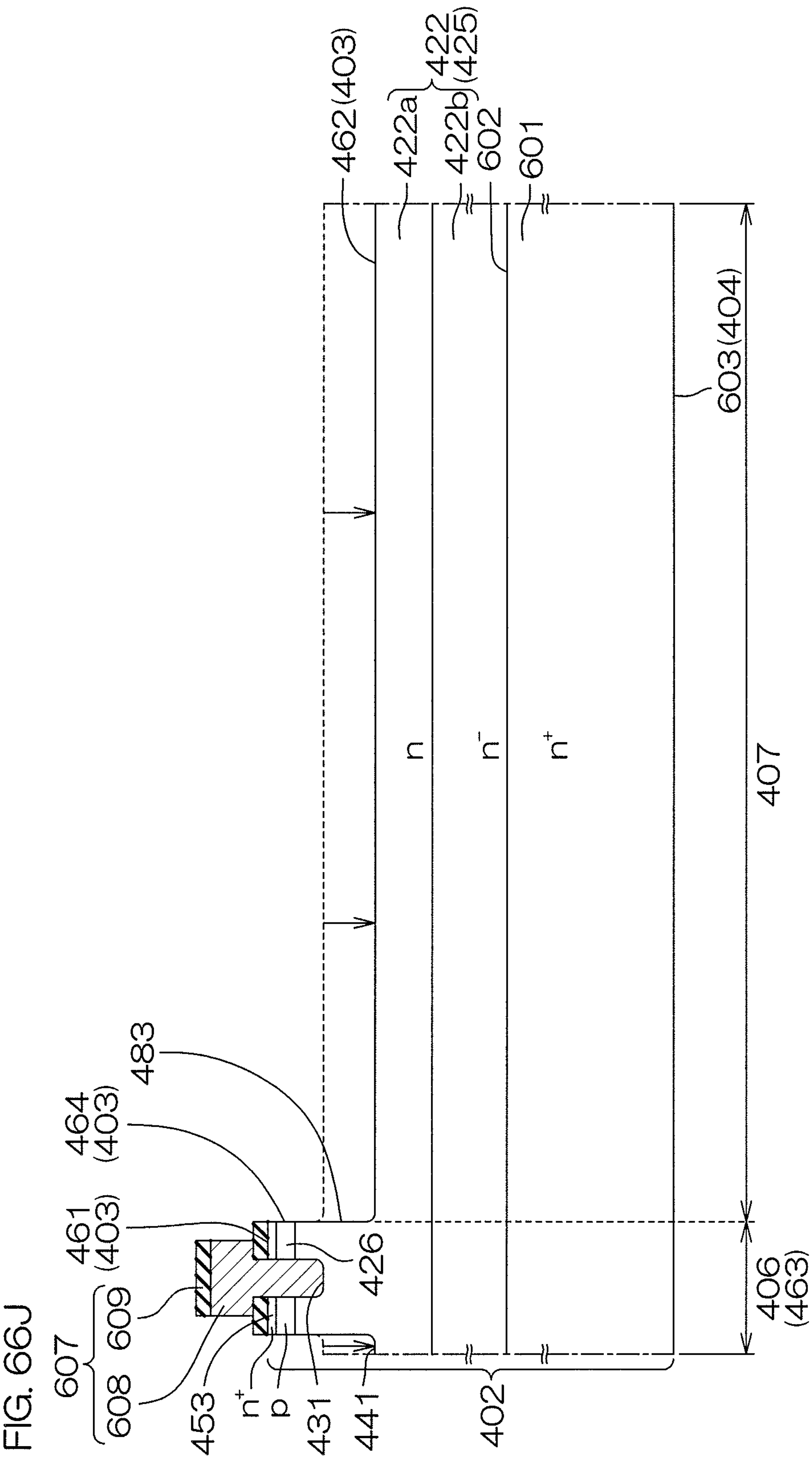

FIG. 66J is a sectional view of a step subsequent to that of FIG. 66I.

Figure 66K:
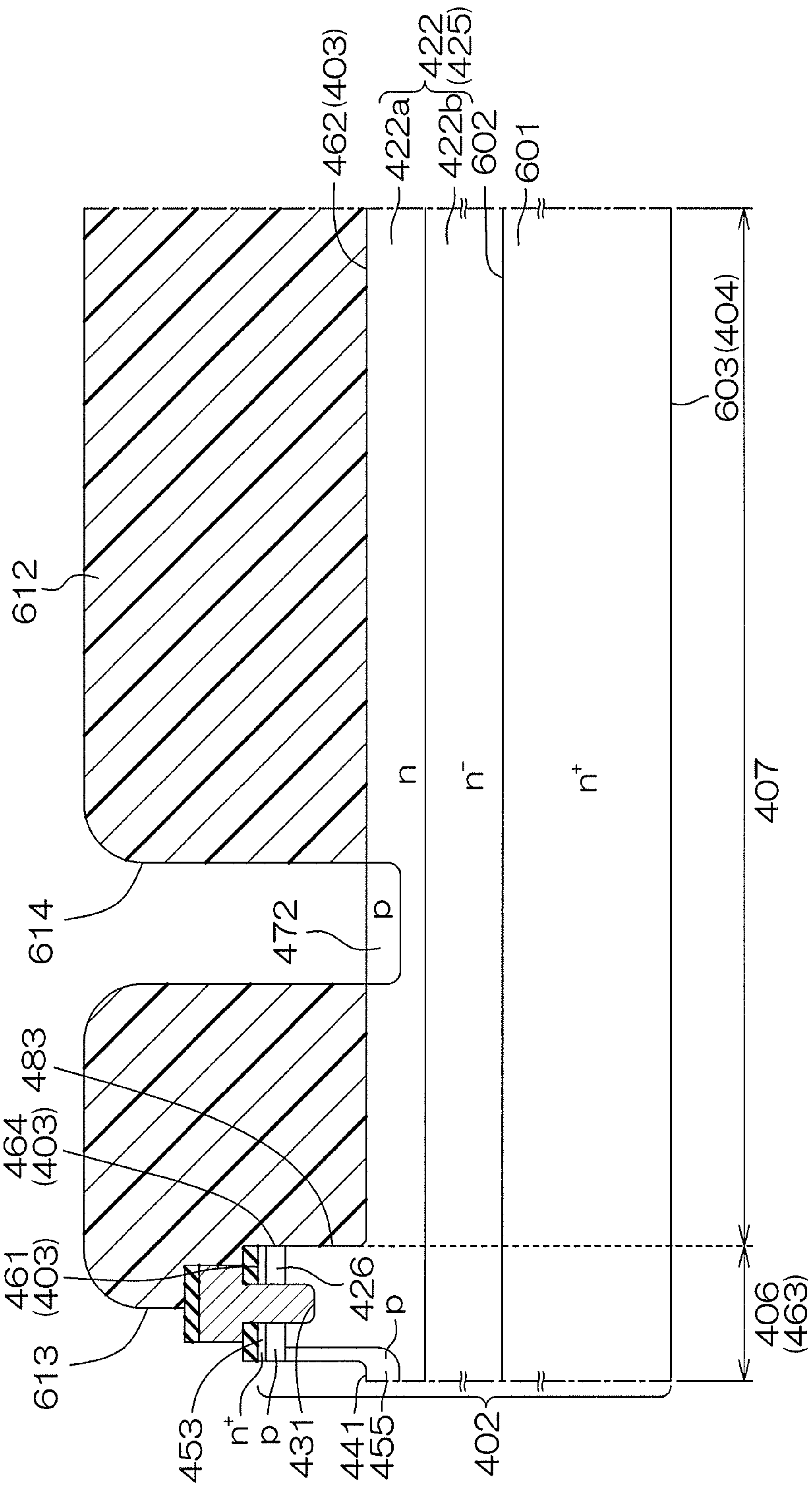

FIG. 66K is a sectional view of a step subsequent to that of FIG. 66J.

Figure 66L:
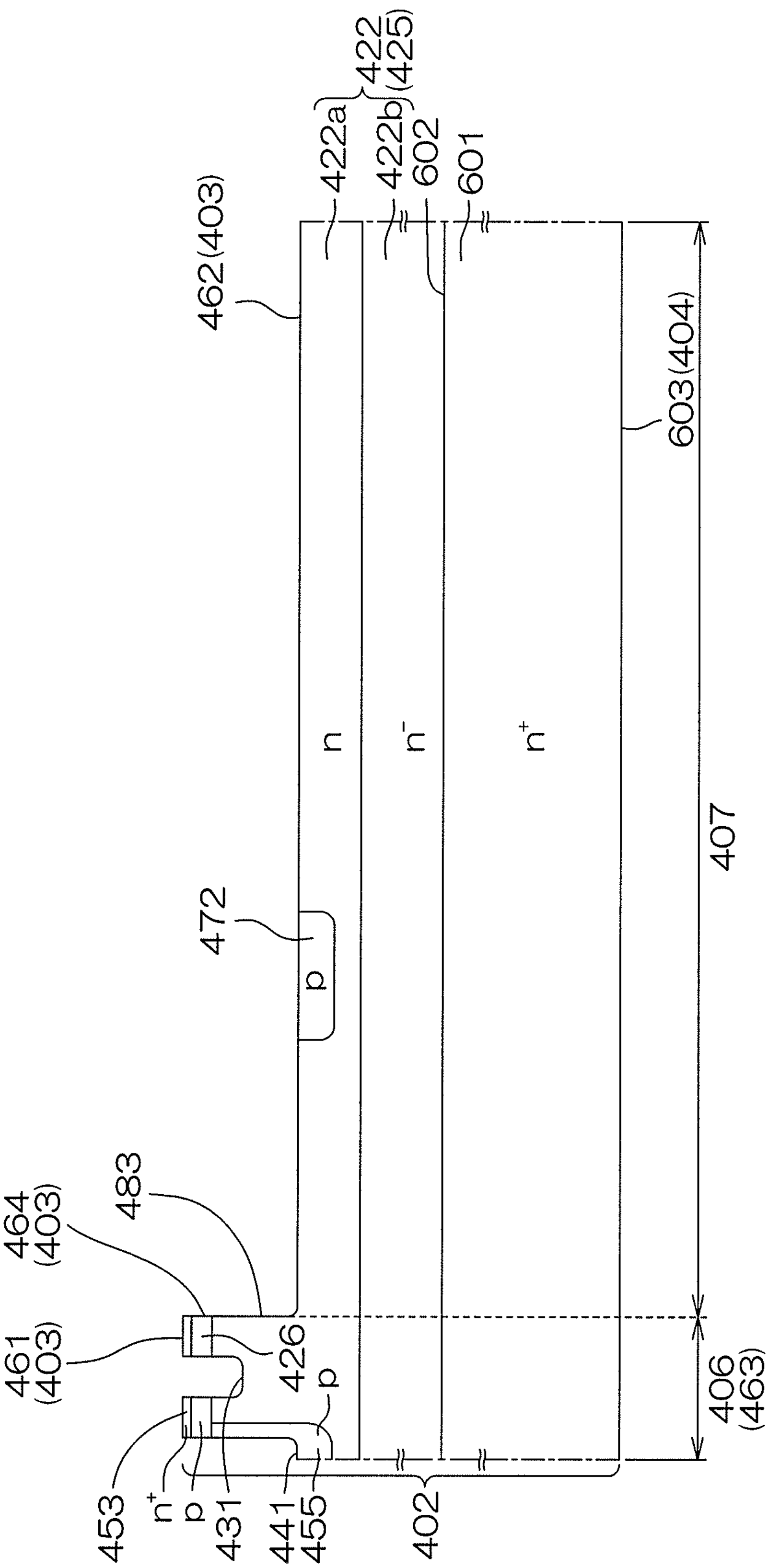

FIG. 66L is a sectional view of a step subsequent to that of FIG. 66K.

Figure 66M:
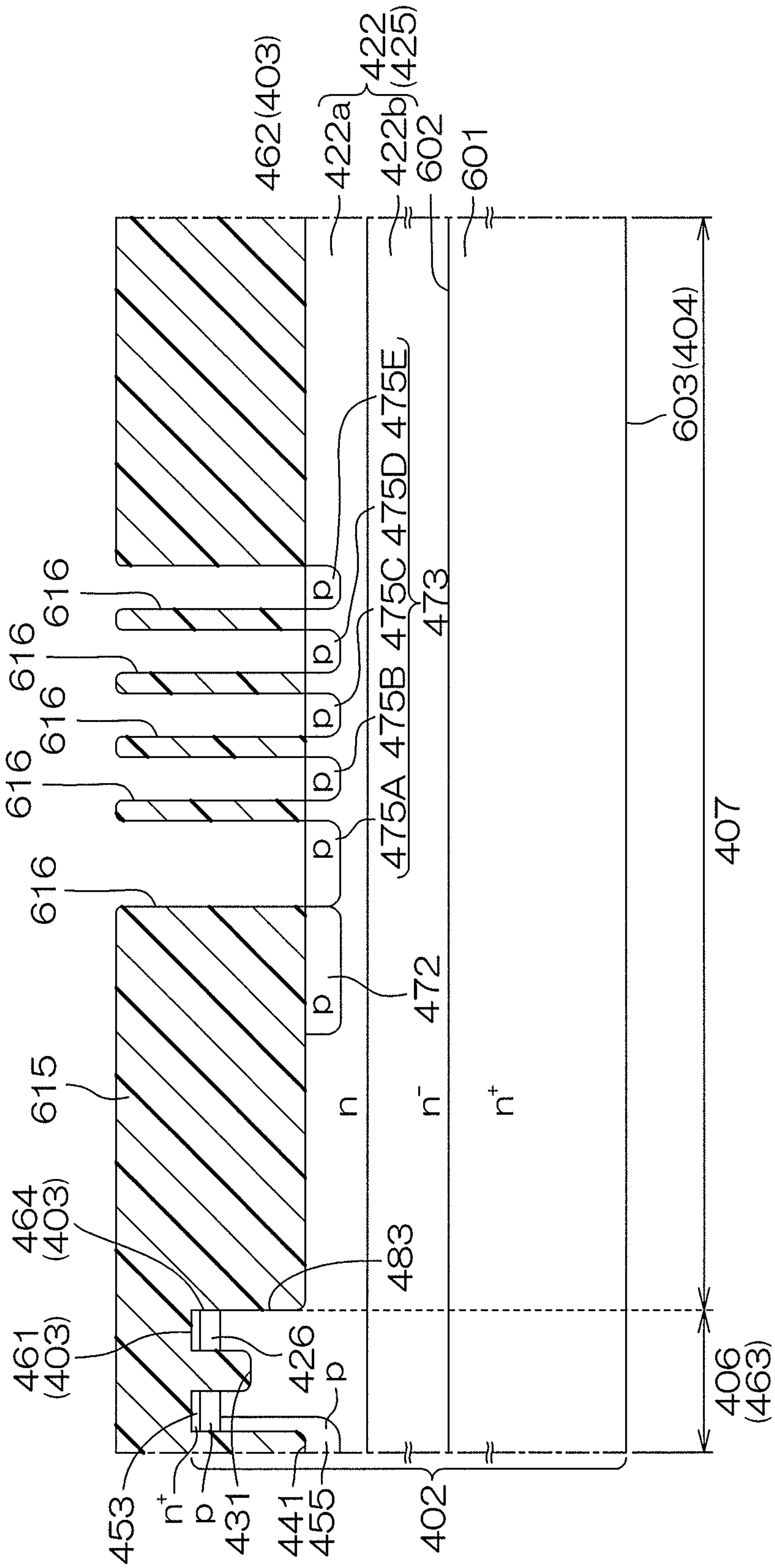

FIG. 66M is a sectional view of a step subsequent to that of FIG. 66L.

Figure 66N:
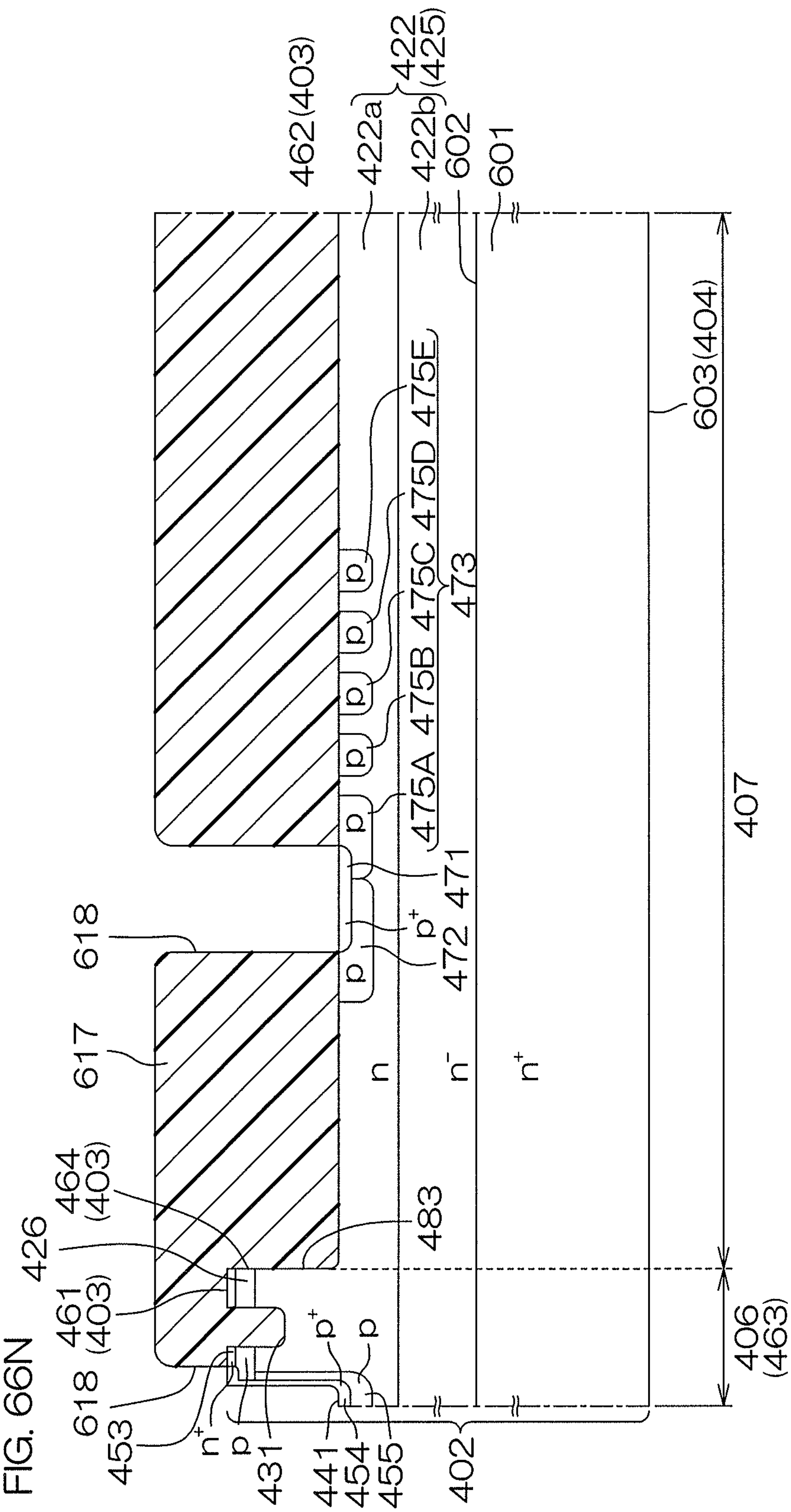

FIG. 66N is a sectional view of a step subsequent to that of FIG. 66M.

Figure 66O:
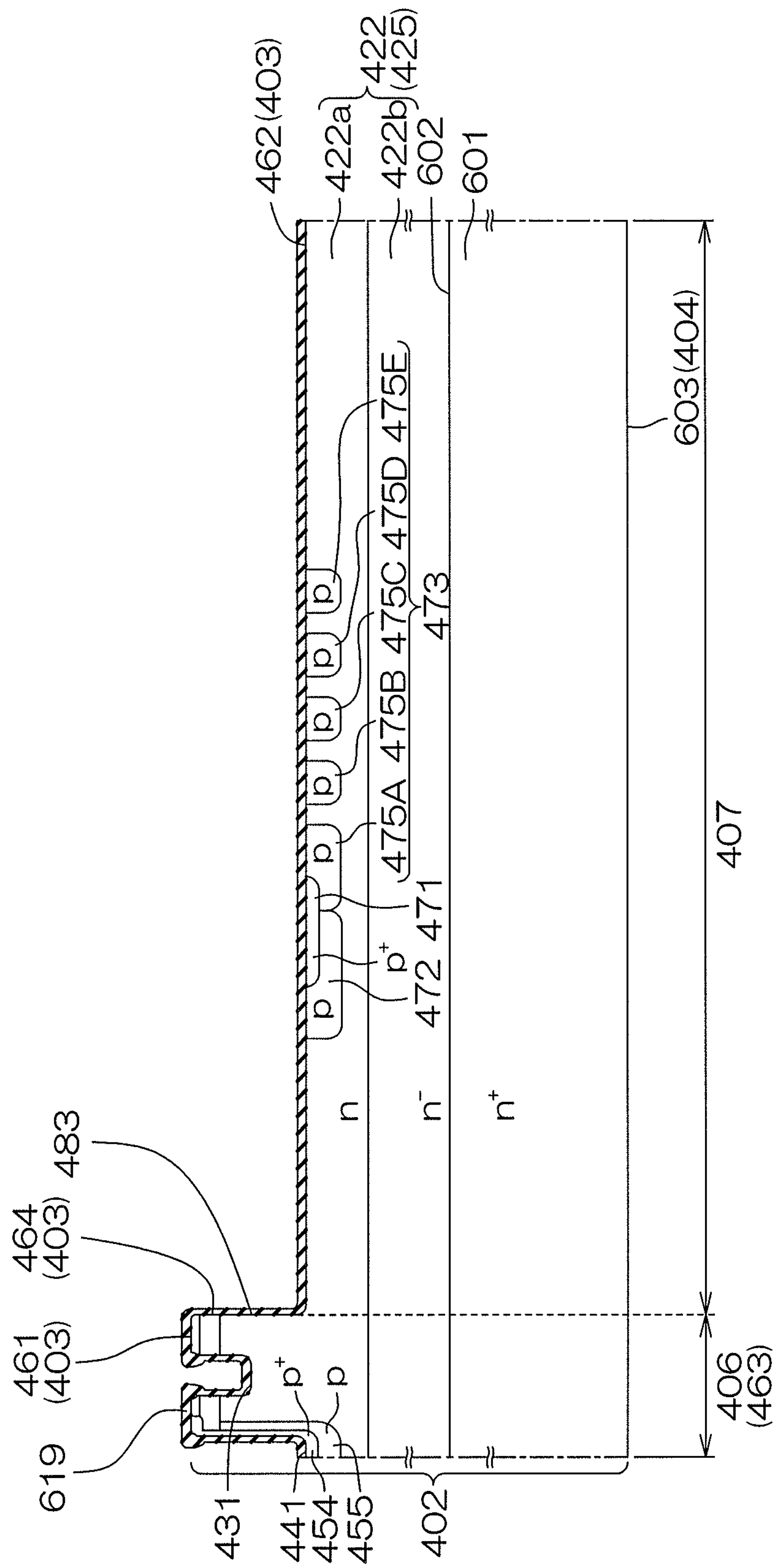

FIG. 66O is a sectional view of a step subsequent to that of FIG. 66N.

Figure 66P:
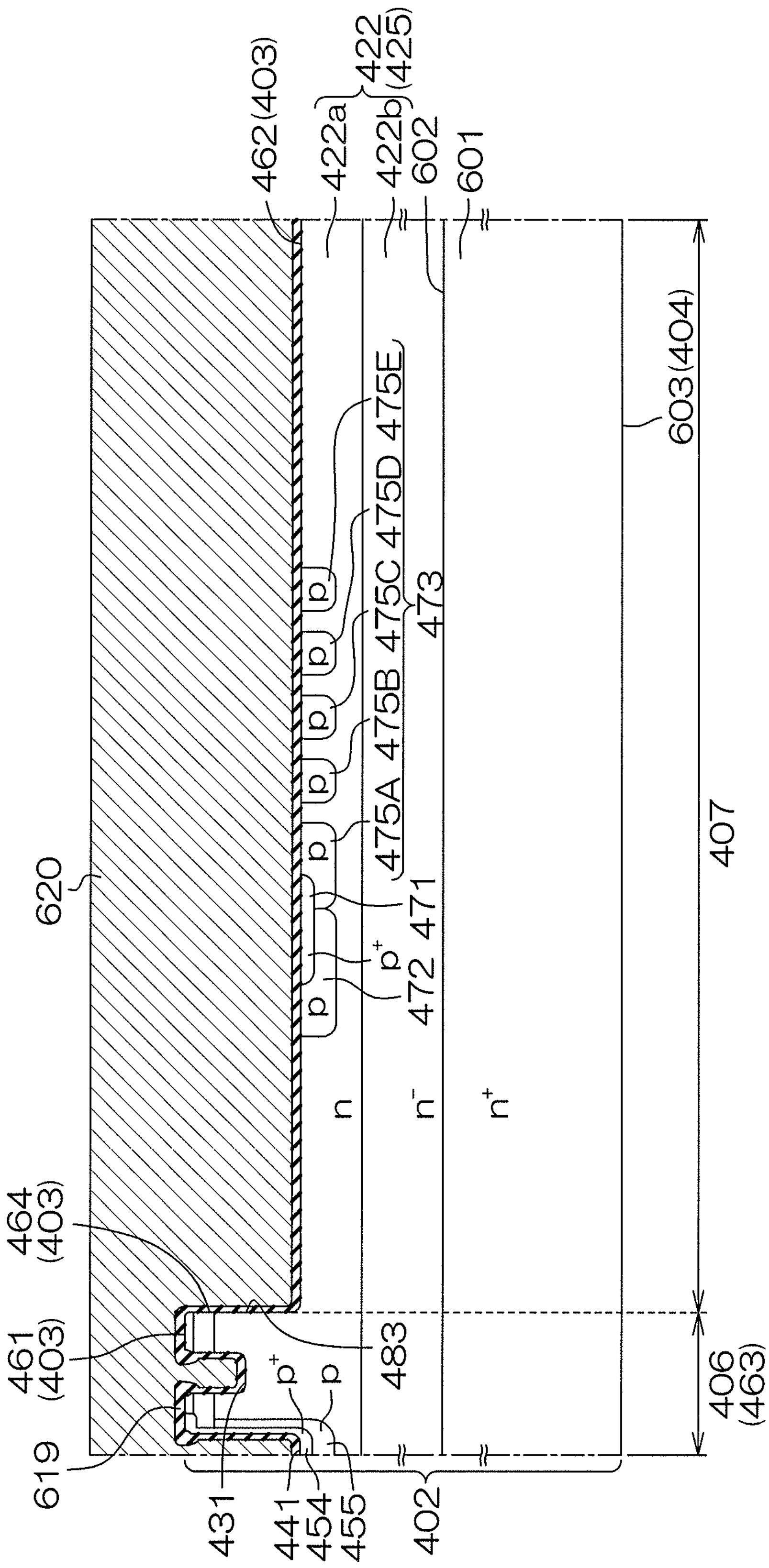

FIG. 66P is a sectional view of a step subsequent to that of FIG. 66O.

Figure 66Q:
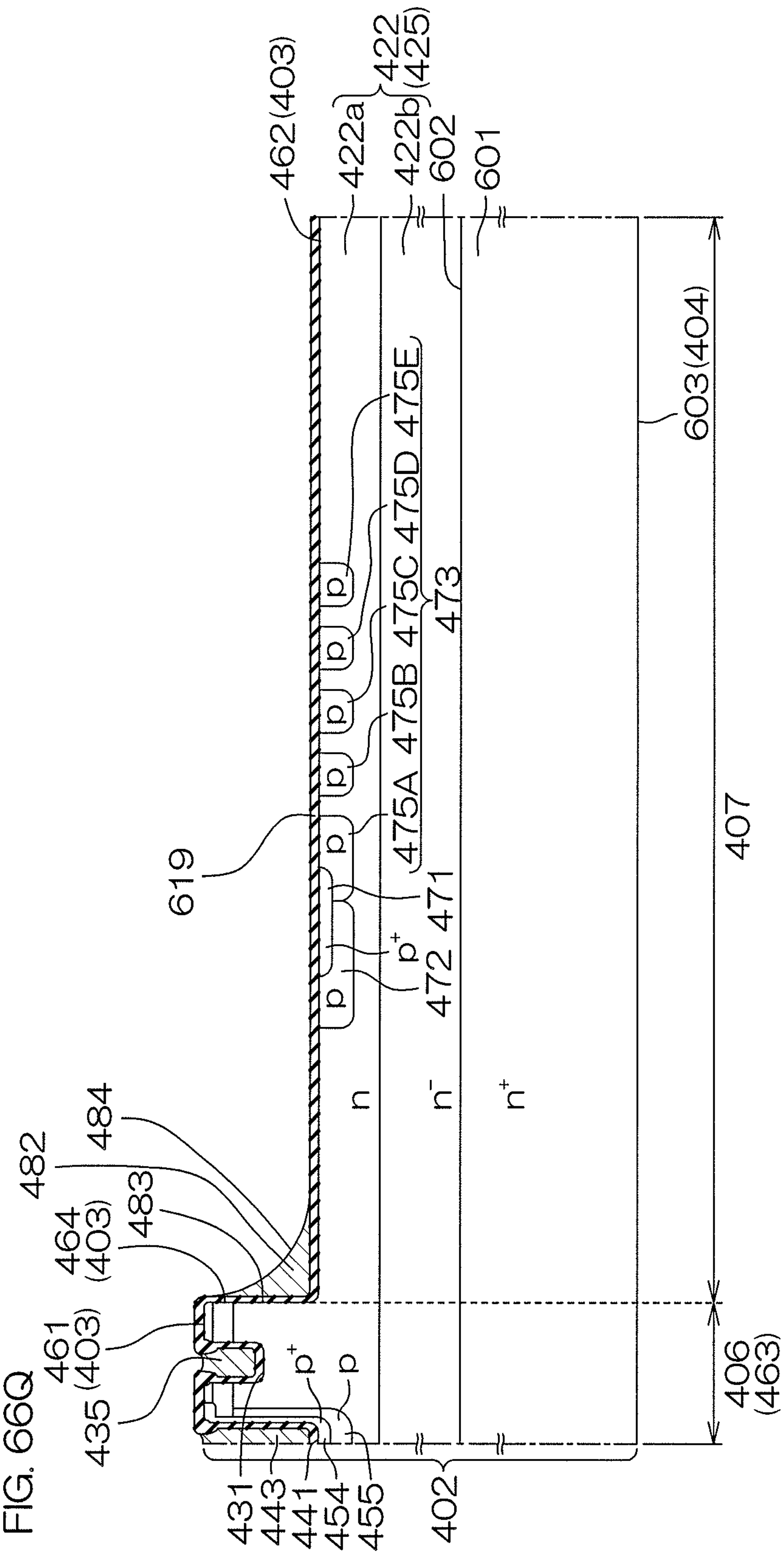

FIG. 66Q is a sectional view of a step subsequent to that of FIG. 66P.

Figure 66R:
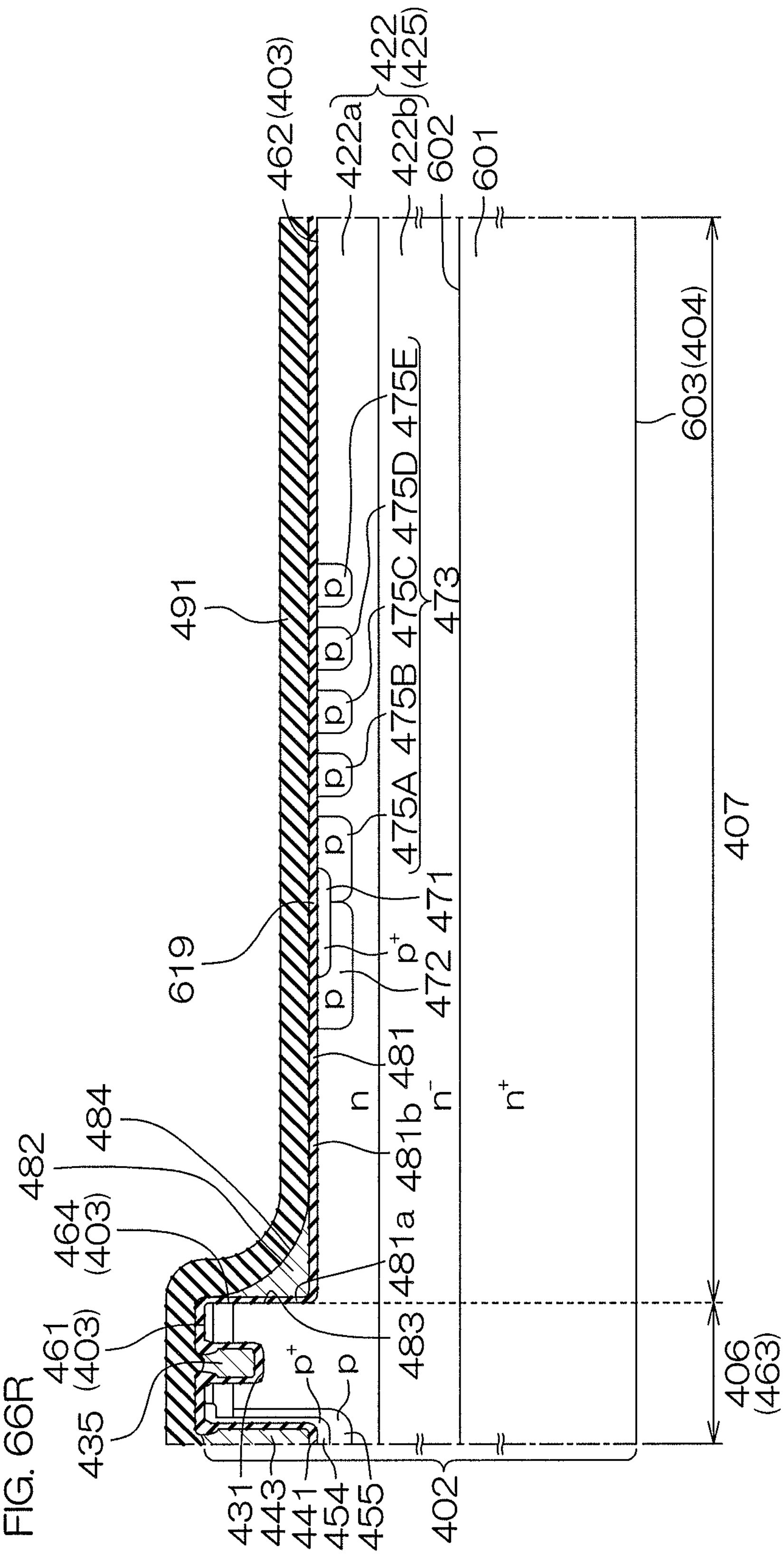

FIG. 66R is a sectional view of a step subsequent to that of FIG. 66Q.

Figure 66S:
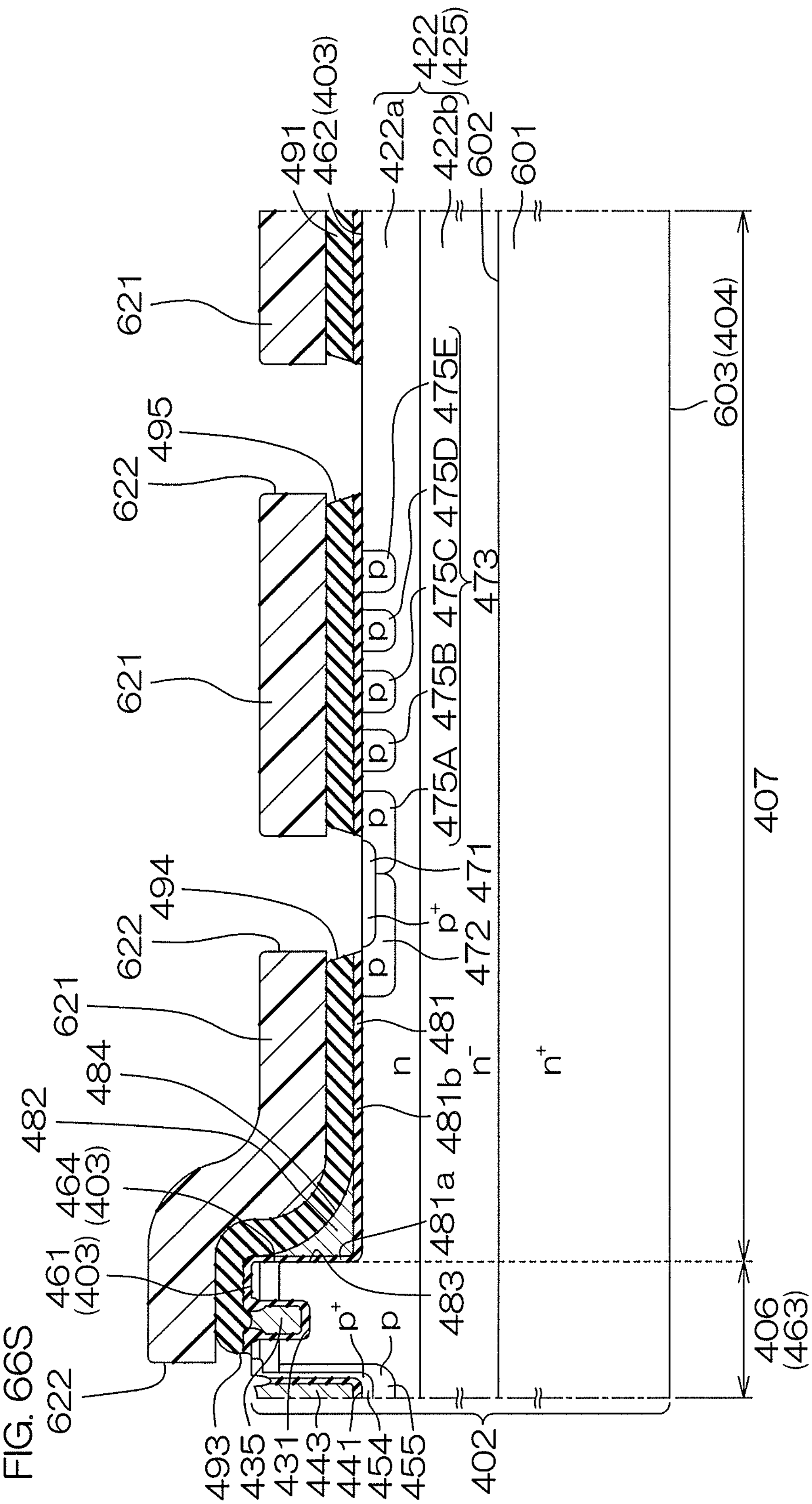

FIG. 66S is a sectional view of a step subsequent to that of FIG. 66R.

Figure 66T:
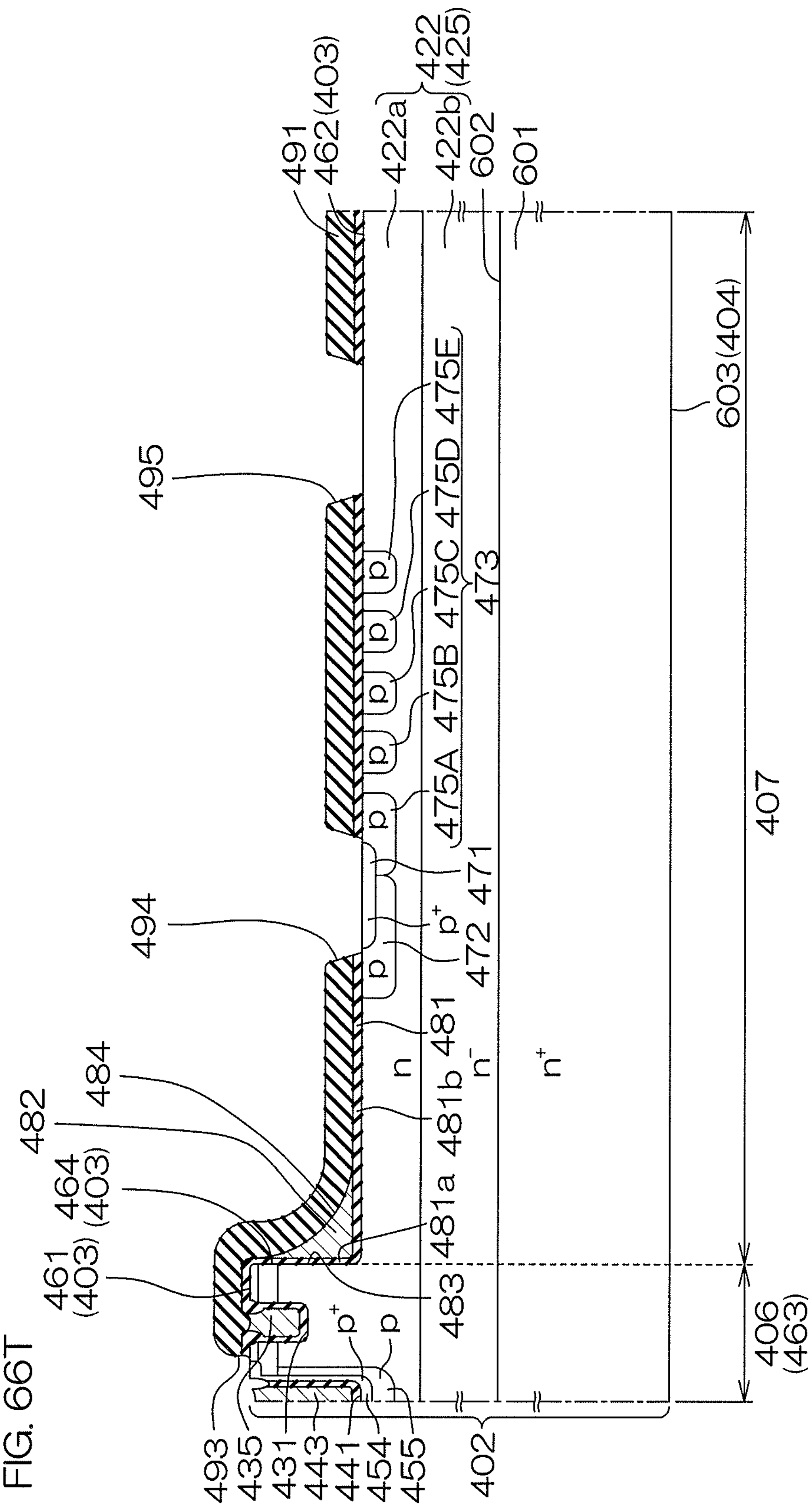

FIG. 66T is a sectional view of a step subsequent to that of FIG. 66S.

Figure 66U:
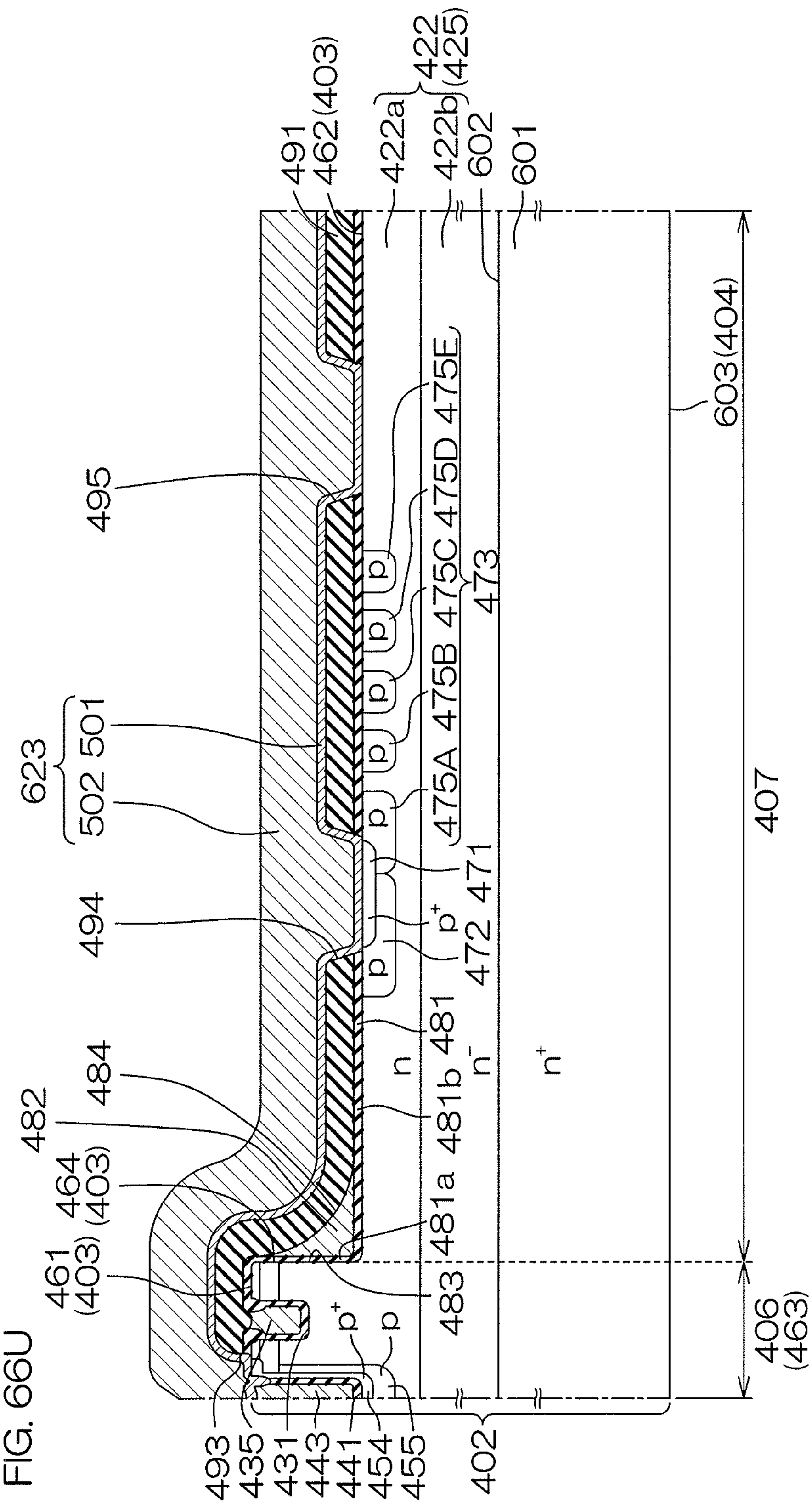

FIG. 66U is a sectional view of a step subsequent to that of FIG. 66T.

Figure 66V:
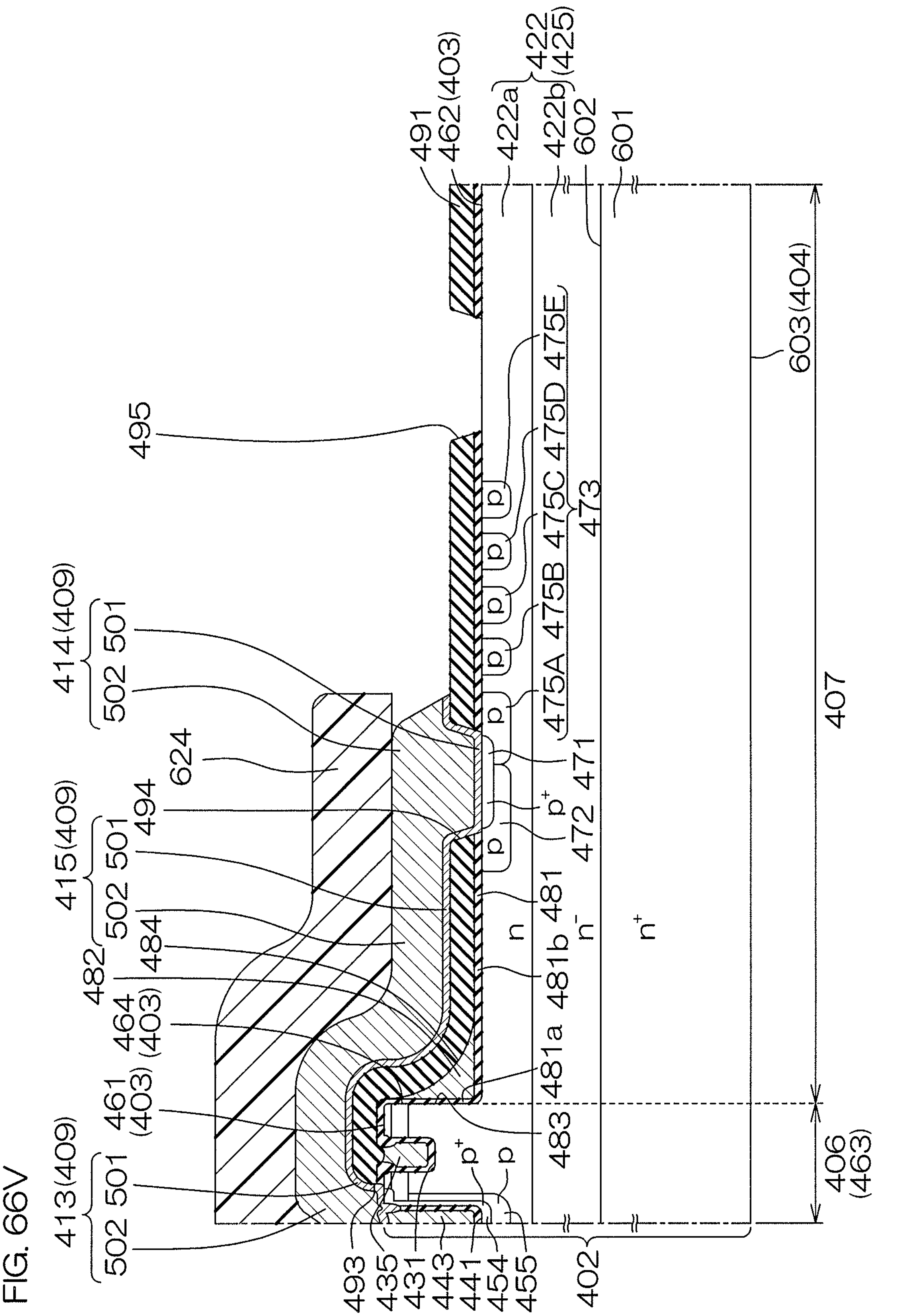

FIG. 66V is a sectional view of a step subsequent to that of FIG. 66U.

Figure 66W:
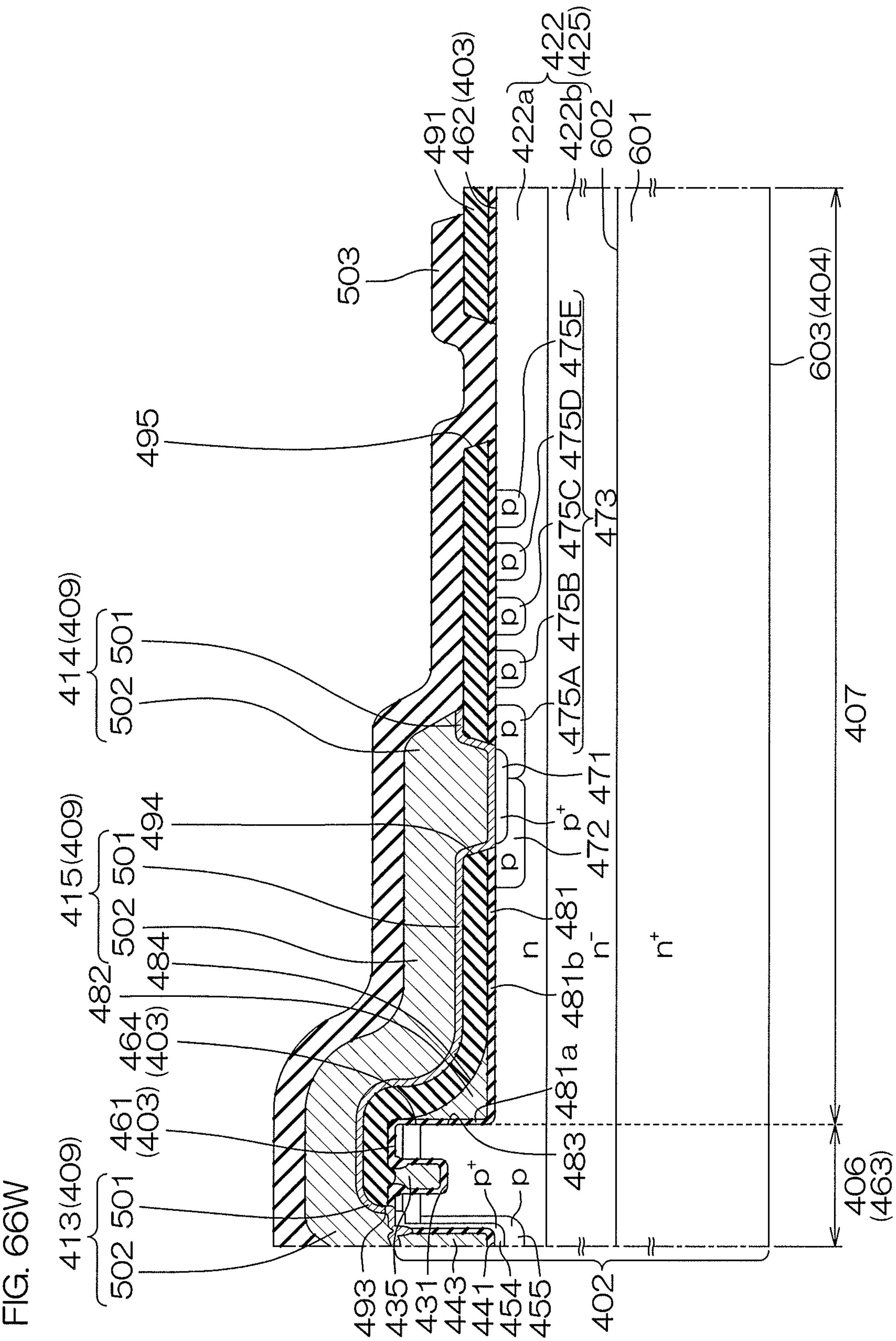

FIG. 66W is a sectional view of a step subsequent to that of FIG. 66V.

Figure 66X:
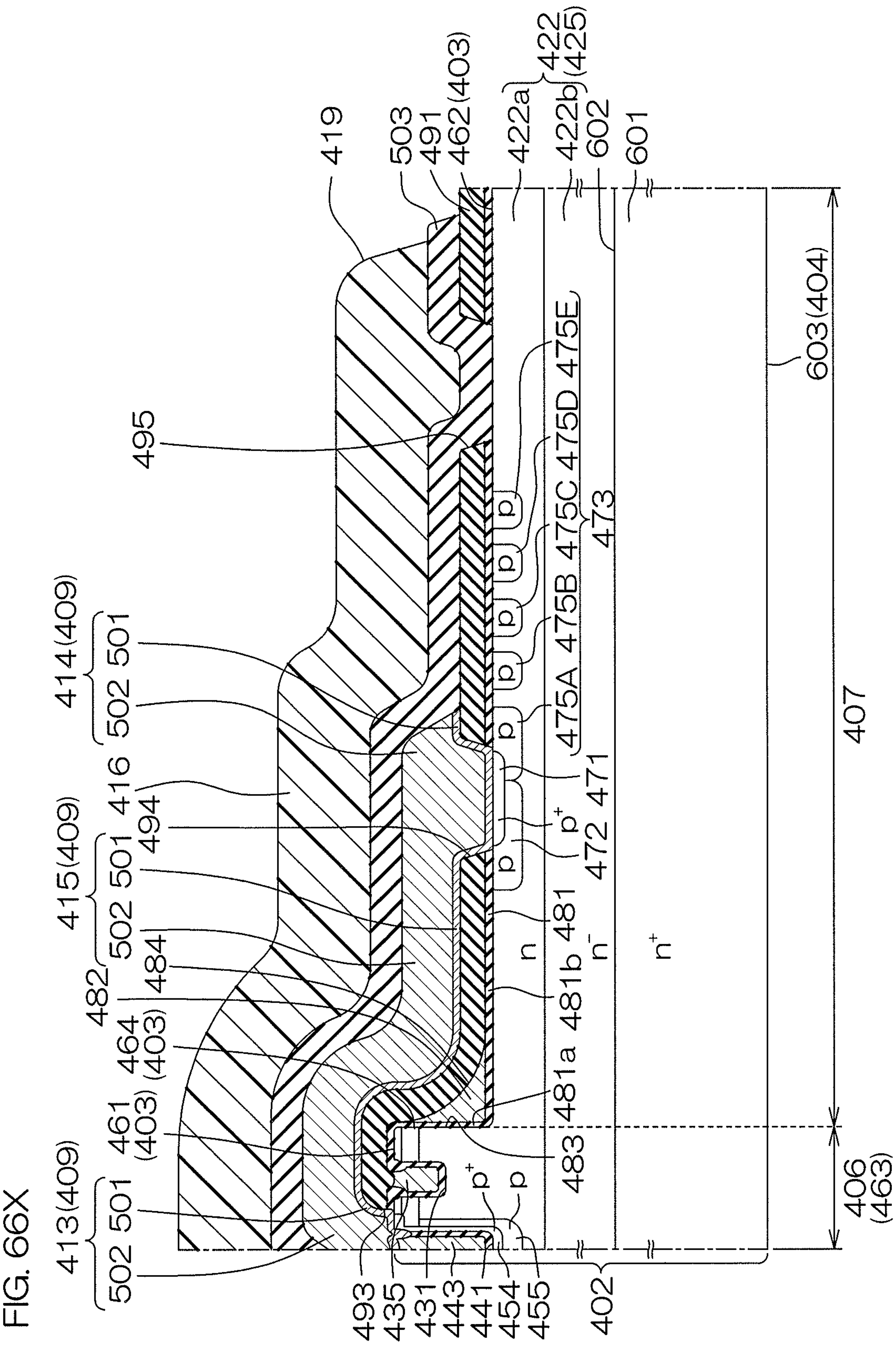

FIG. 66X is a sectional view of a step subsequent to that of FIG. 66W.

Figure 66Y:
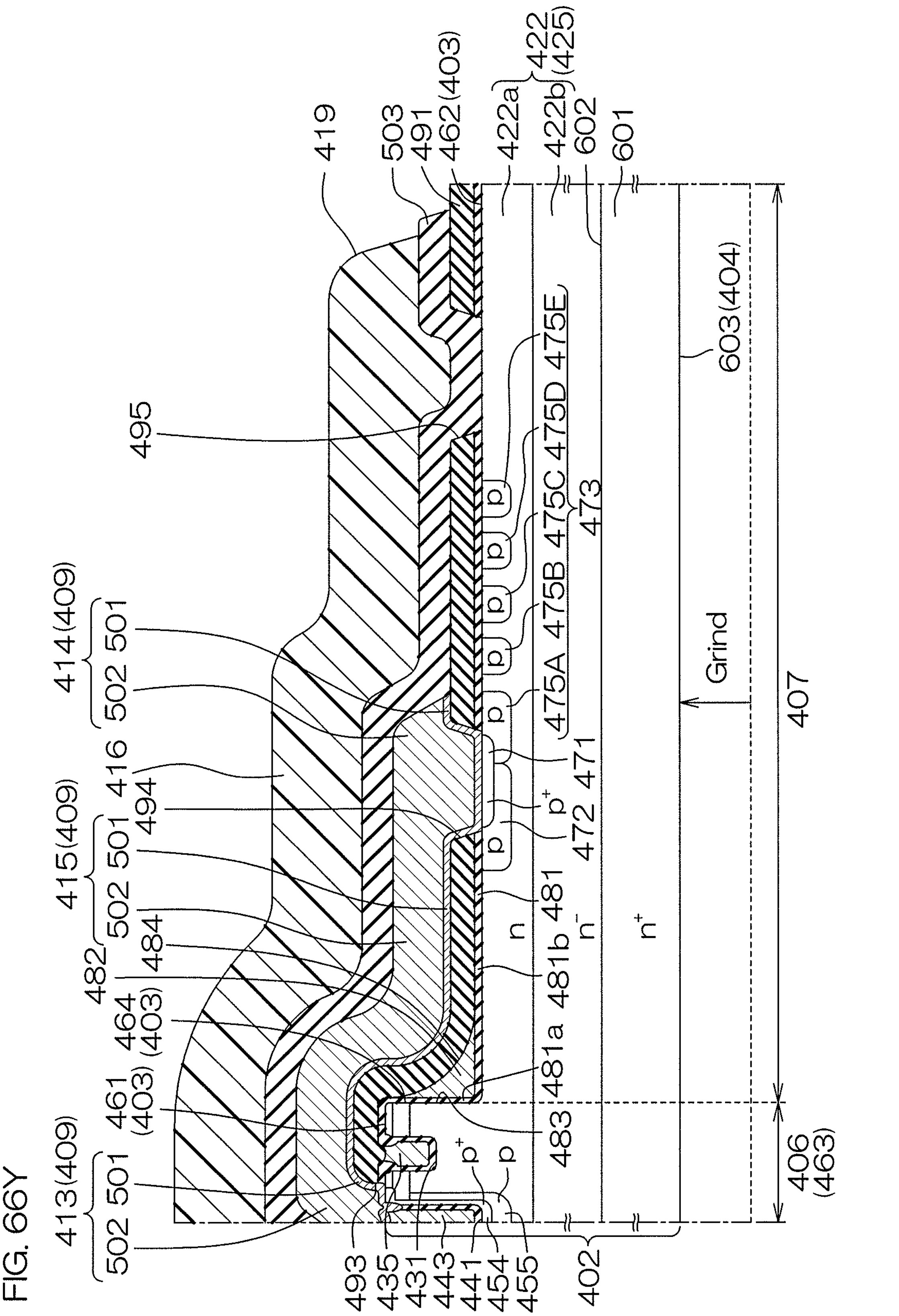

FIG. 66Y is a sectional view of a step subsequent to that of FIG. 66X.

Figure 66Z:
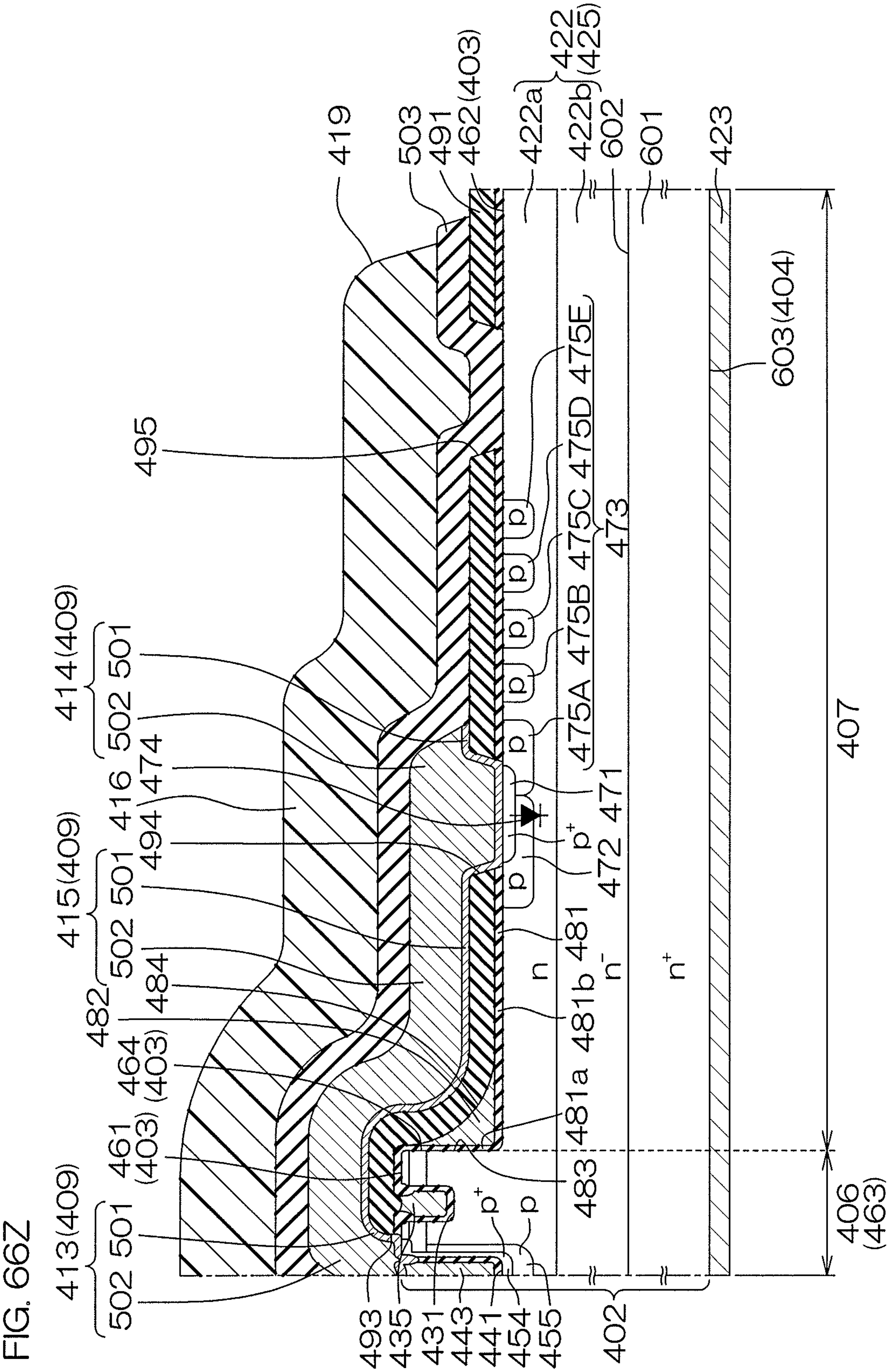

FIG. 66Z is a sectional view of a step subsequent to that of FIG. 66Y.

Figure 51:
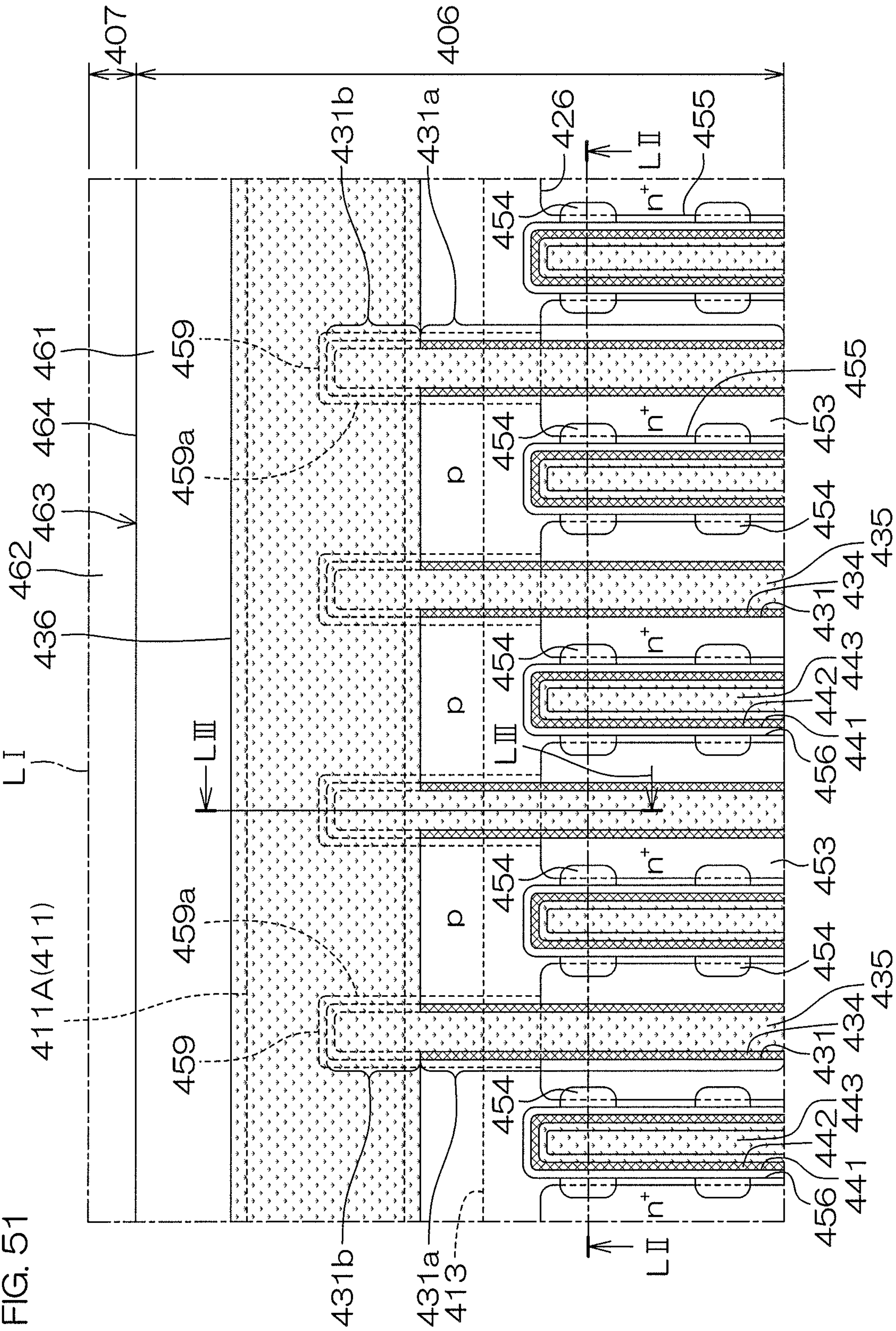
FIG. 51 is an enlarged view of a region LI shown in FIG. 50 and is a diagram for describing the structure of a first main surface of an SiC semiconductor layer.
Figure 67:
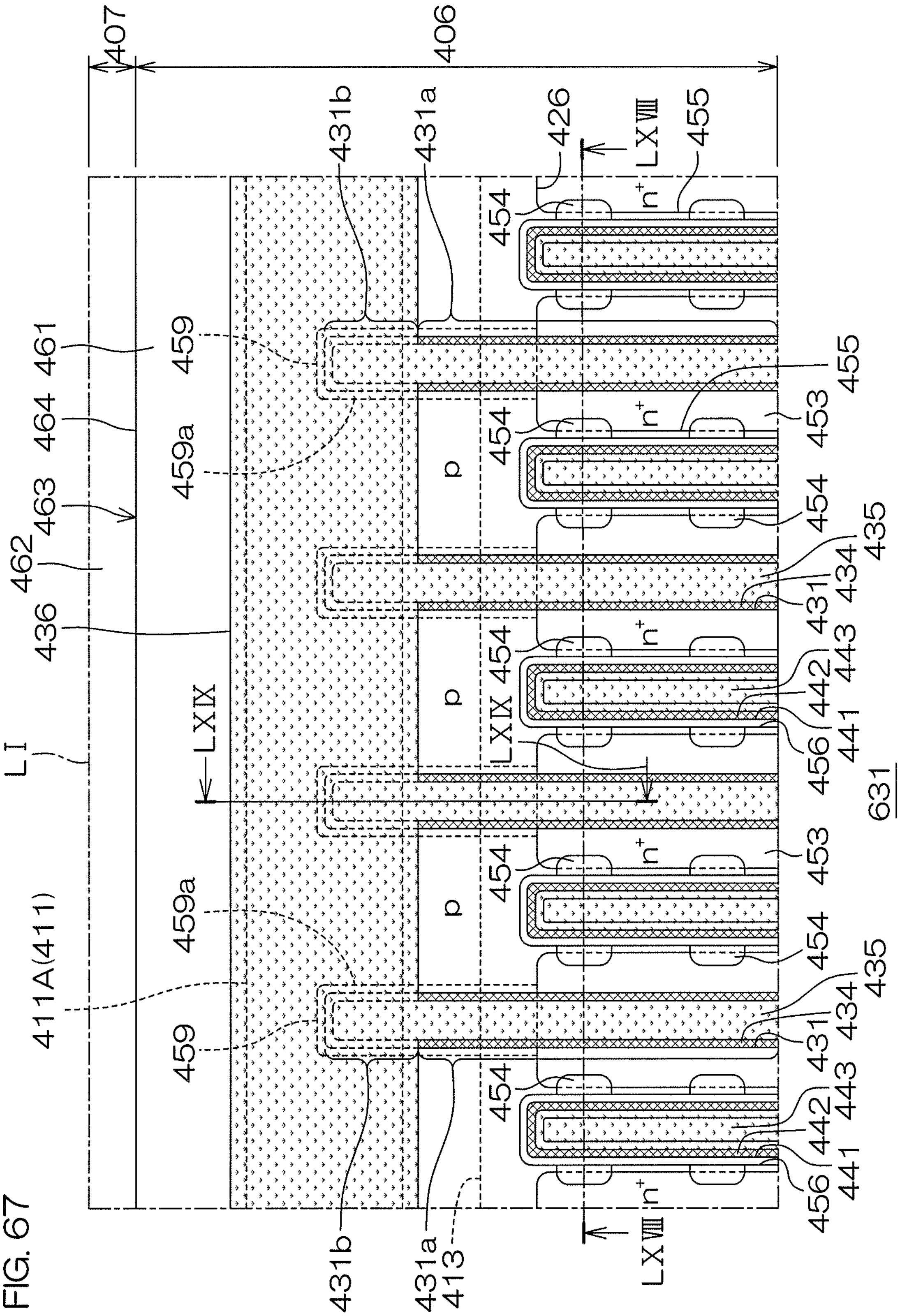

FIG. 67 is an enlarged view of a region corresponding to FIG. 51 and is an enlarged view of a semiconductor device according to a twenty-seventh preferred embodiment of the present invention.

Figure 68:
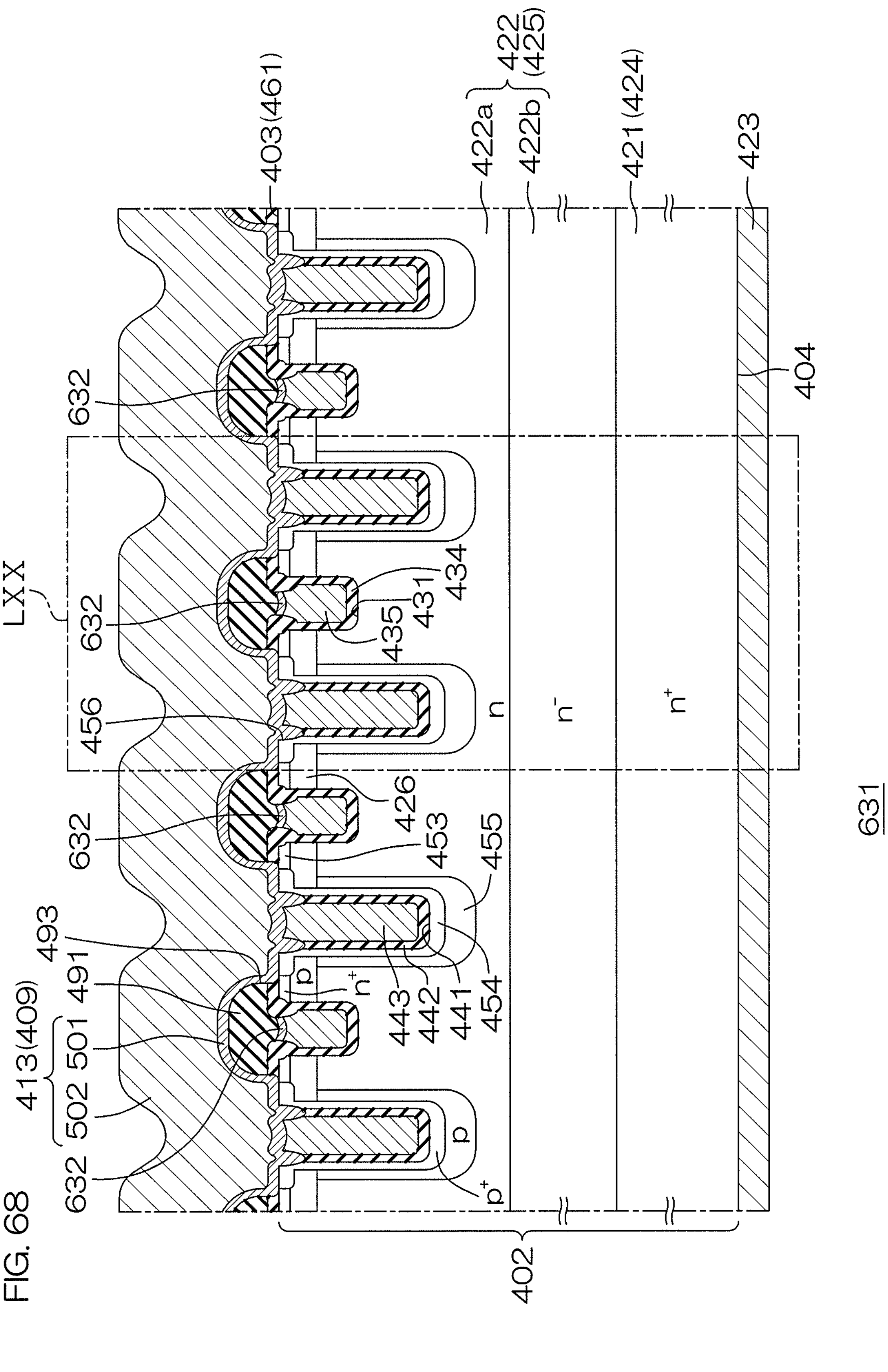

FIG. 68 is a sectional view taken along line LXVIII-LXVIII shown in FIG. 67.

Figure 69:
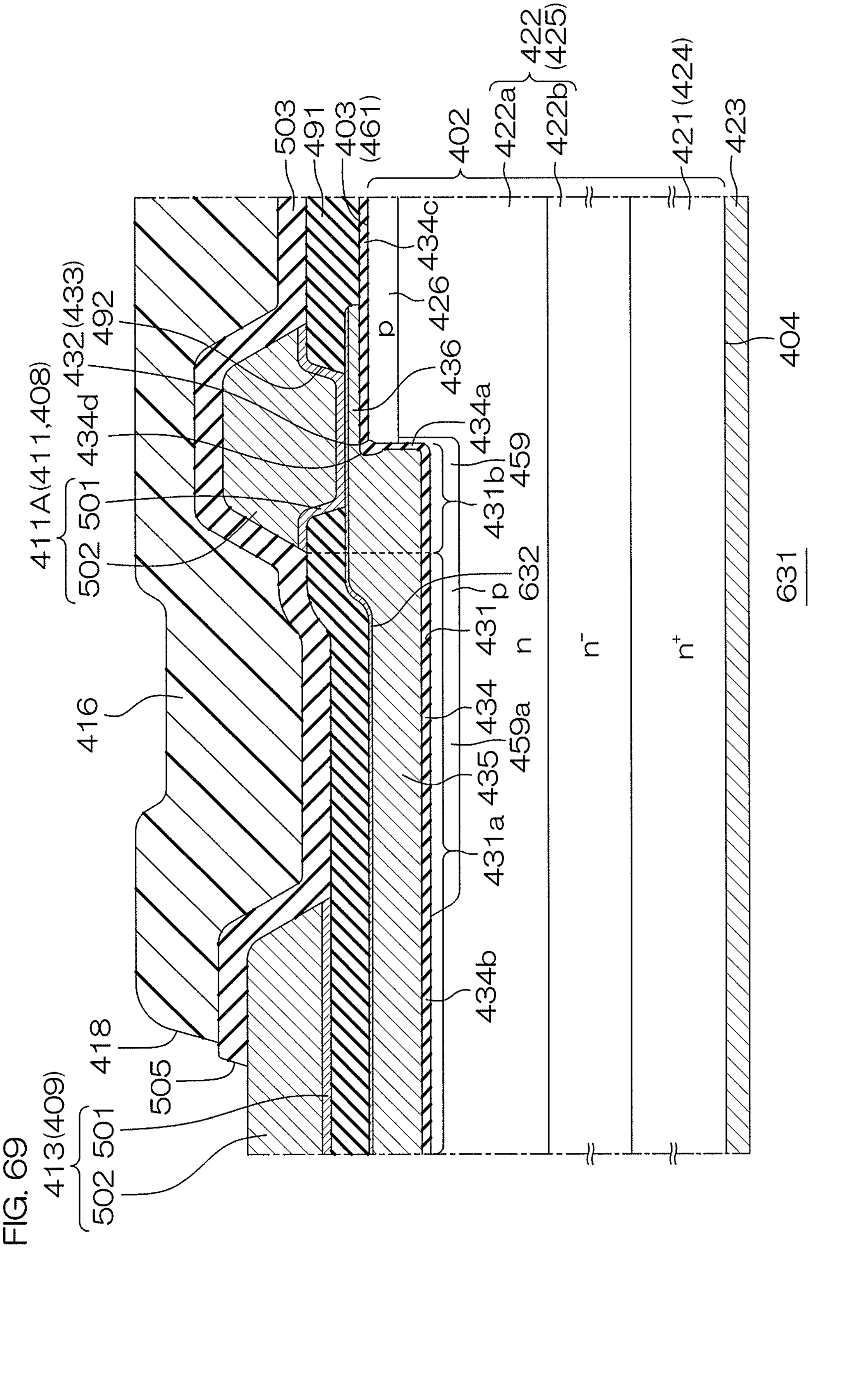

FIG. 69 is a sectional view taken along line LXIX-LXIX shown in FIG. 67.

Figure 70:
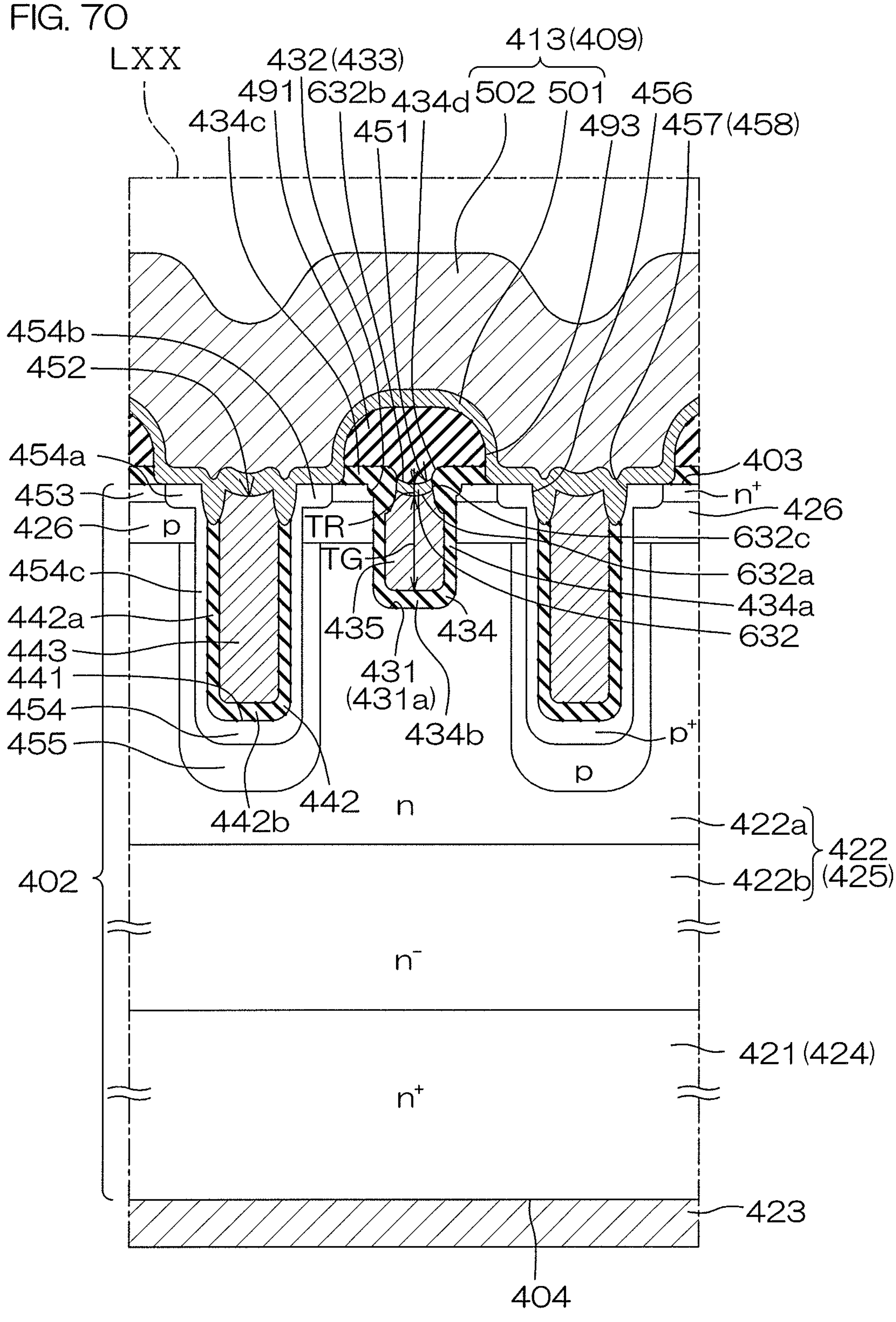

FIG. 70 is an enlarged view of a region LXX-LXX shown in FIG. 68.

Figure 71:
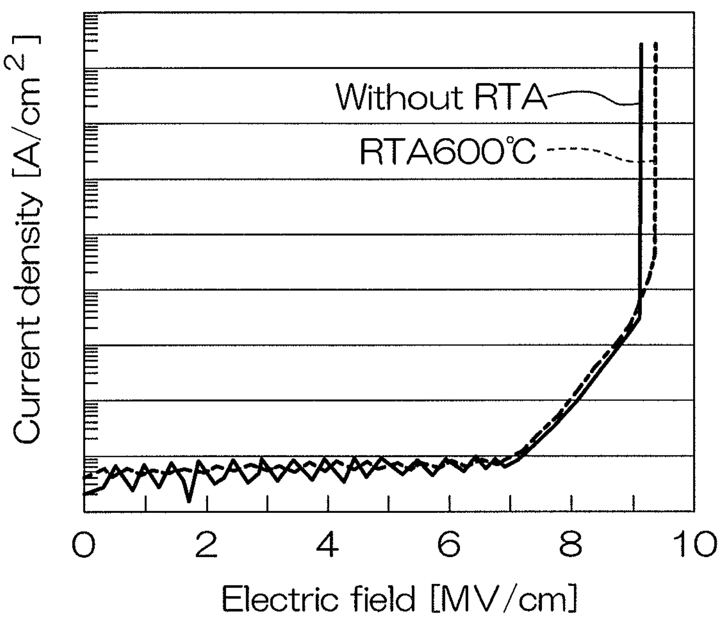

FIG. 71 is a graph of leak current characteristics for a case where NiSi is adopted as a low resistance electrode layer.

Figure 72:
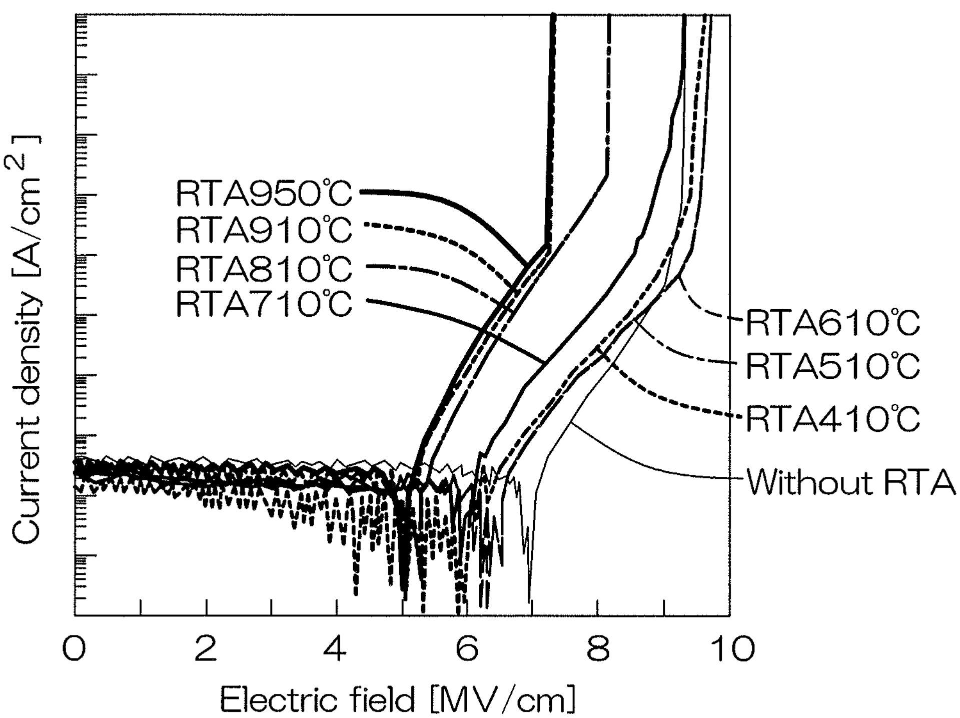

FIG. 72 is a graph of leak current characteristics for a case where $CoSi_2$ is adopted as the low resistance electrode layer.

Figure 73:
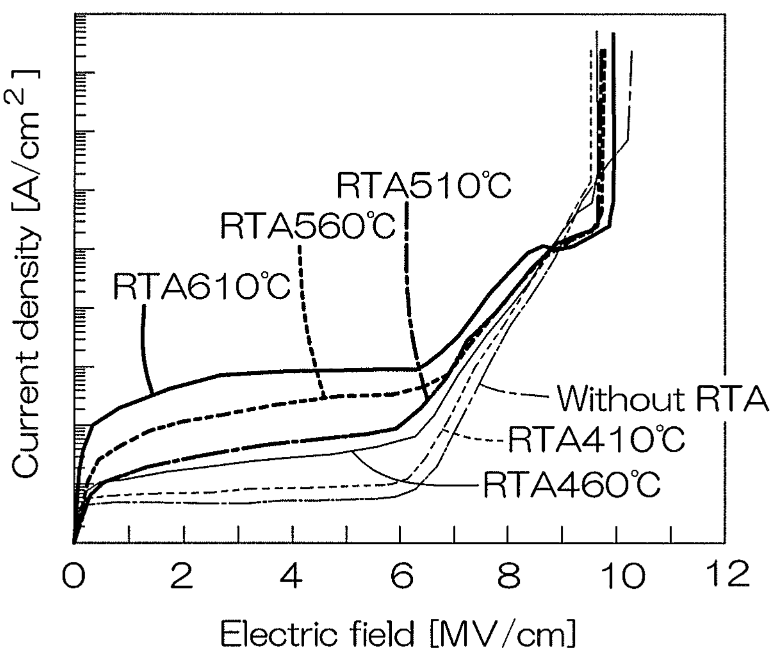

FIG. 73 is a graph of leak current characteristics for a case where $TiSi_2$ is adopted as the low resistance electrode layer.

Figure 74A:
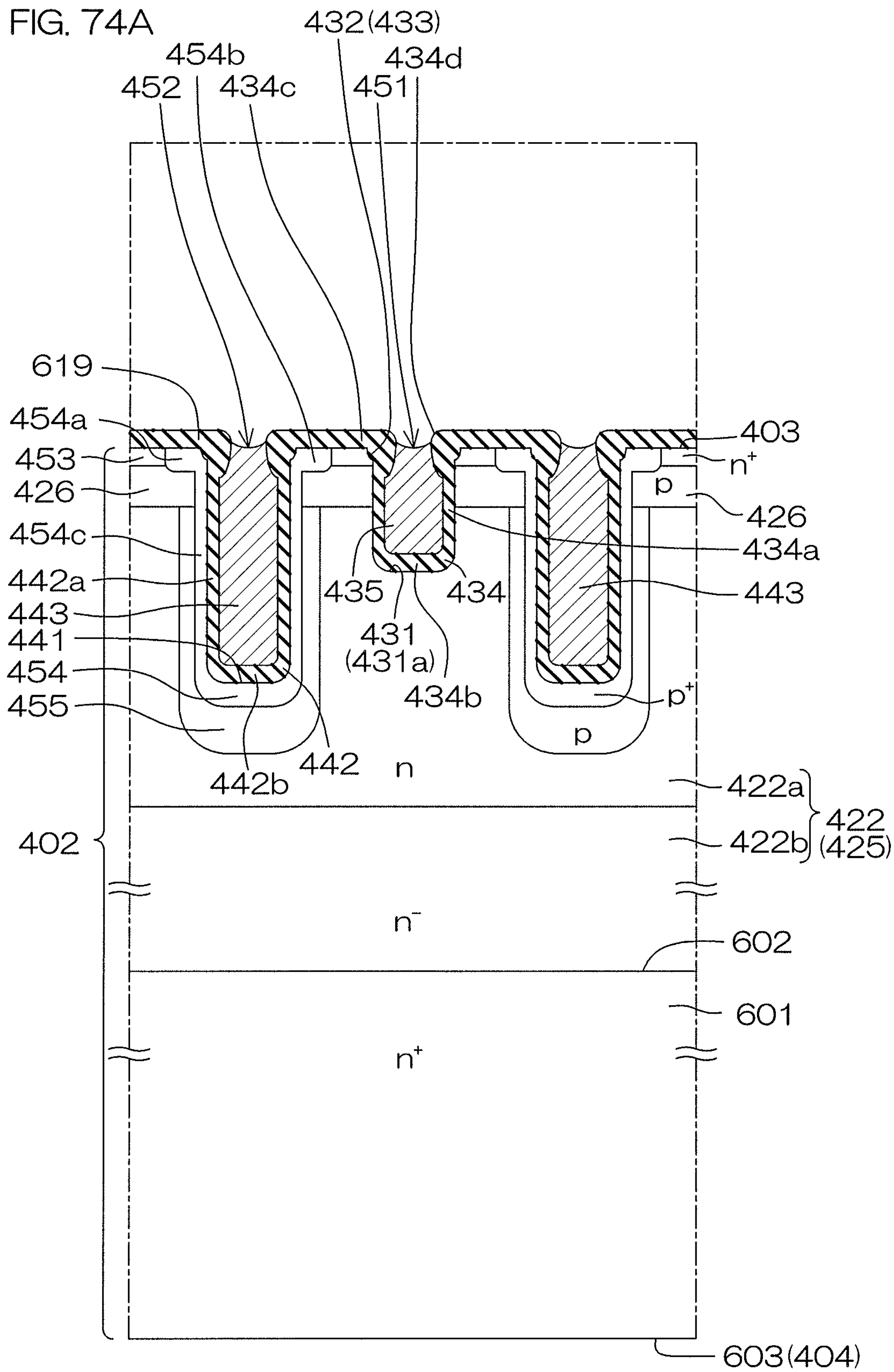

FIG. 74A is an enlarged view of a region corresponding to FIG. 70 and is an enlarged view for describing an example of a method for manufacturing the semiconductor device shown in FIG. 67.

Figure 74B:
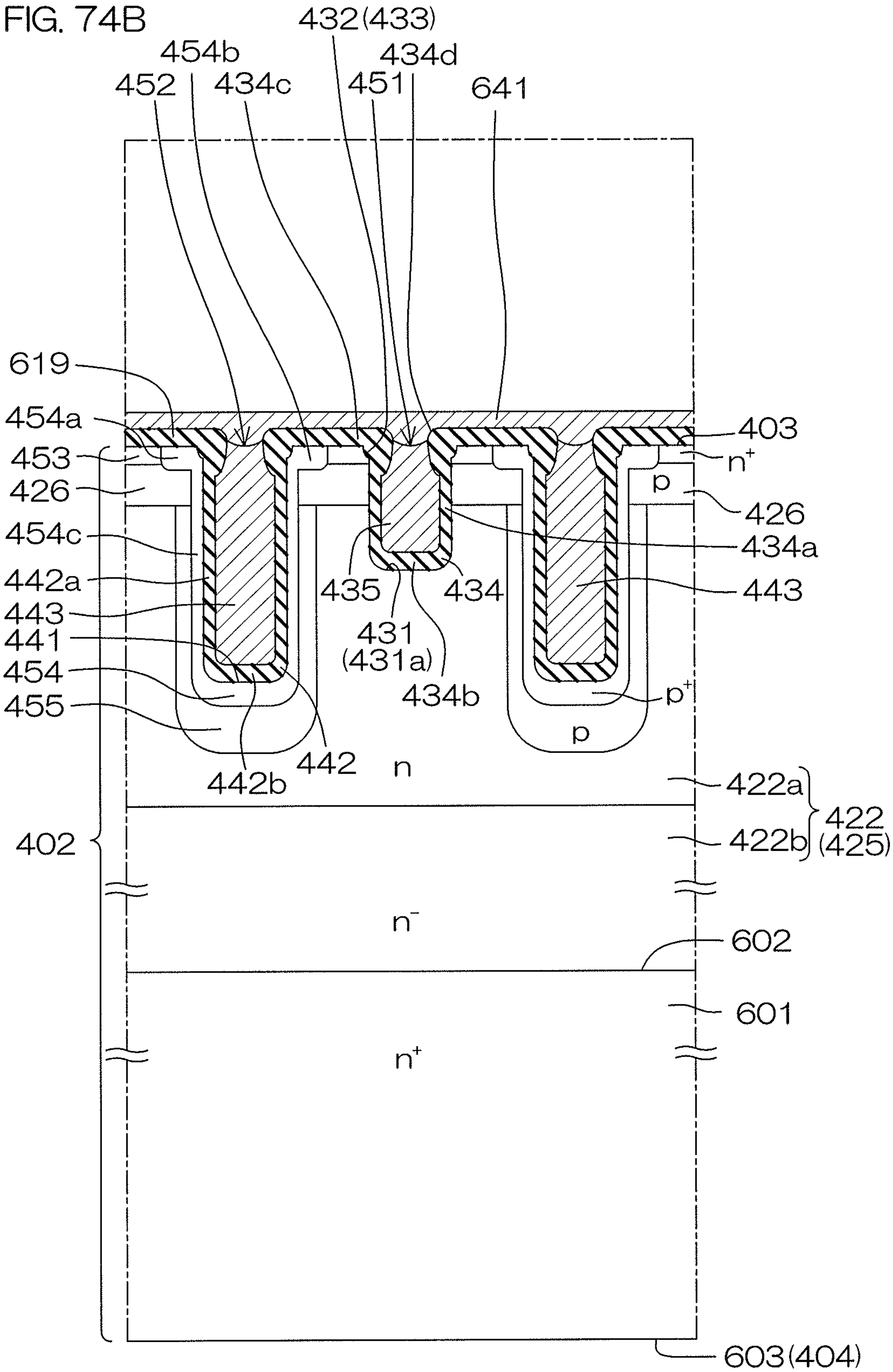

FIG. 74B is an enlarged view of a step subsequent to that of FIG. 74A.

Figure 74C:
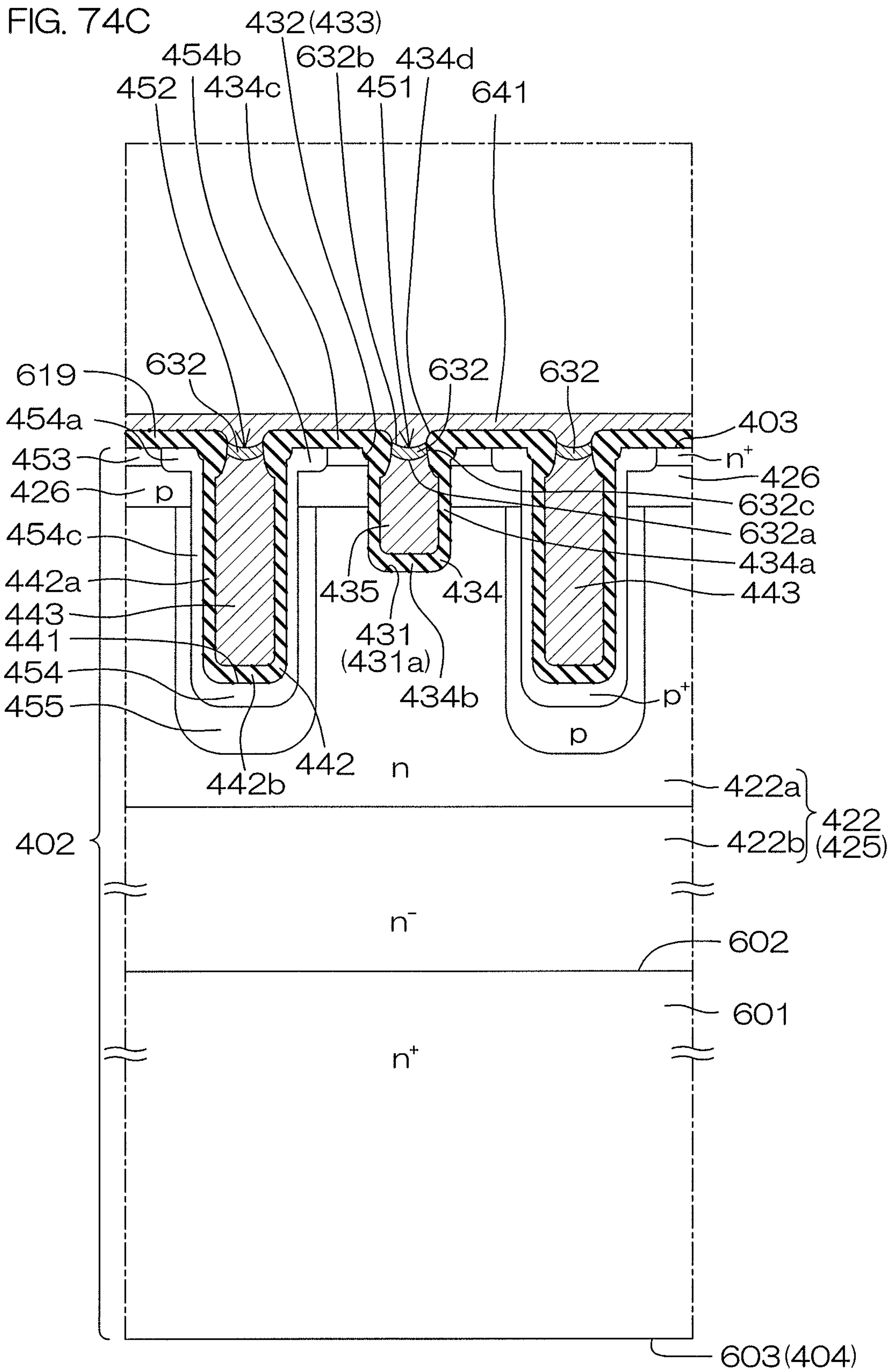

FIG. 74C is an enlarged view of a step subsequent to that of FIG. 74B.

Figure 74D:
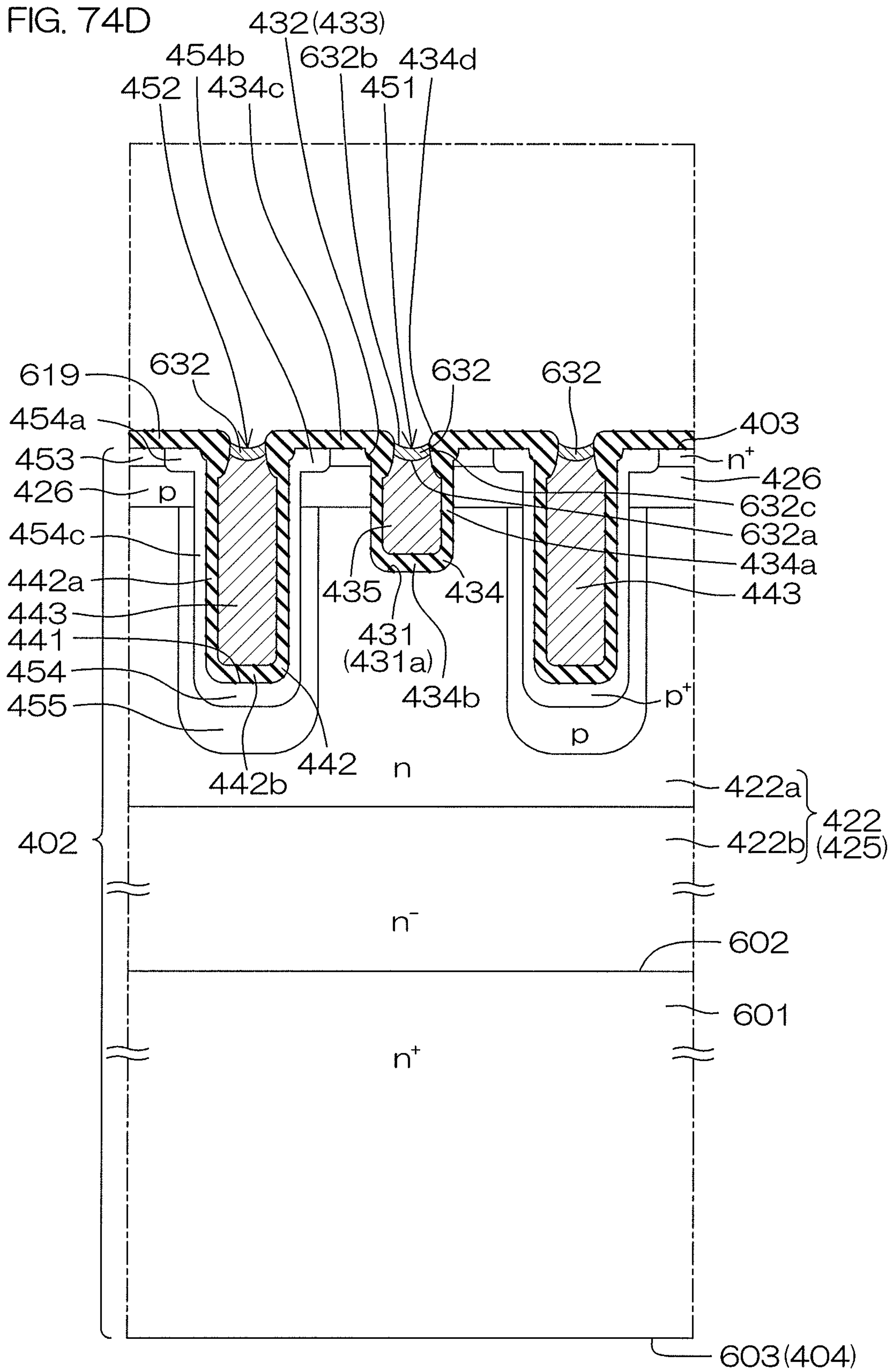

FIG. 74D is an enlarged view of a step subsequent to that of FIG. 74C.

Figure 74E:
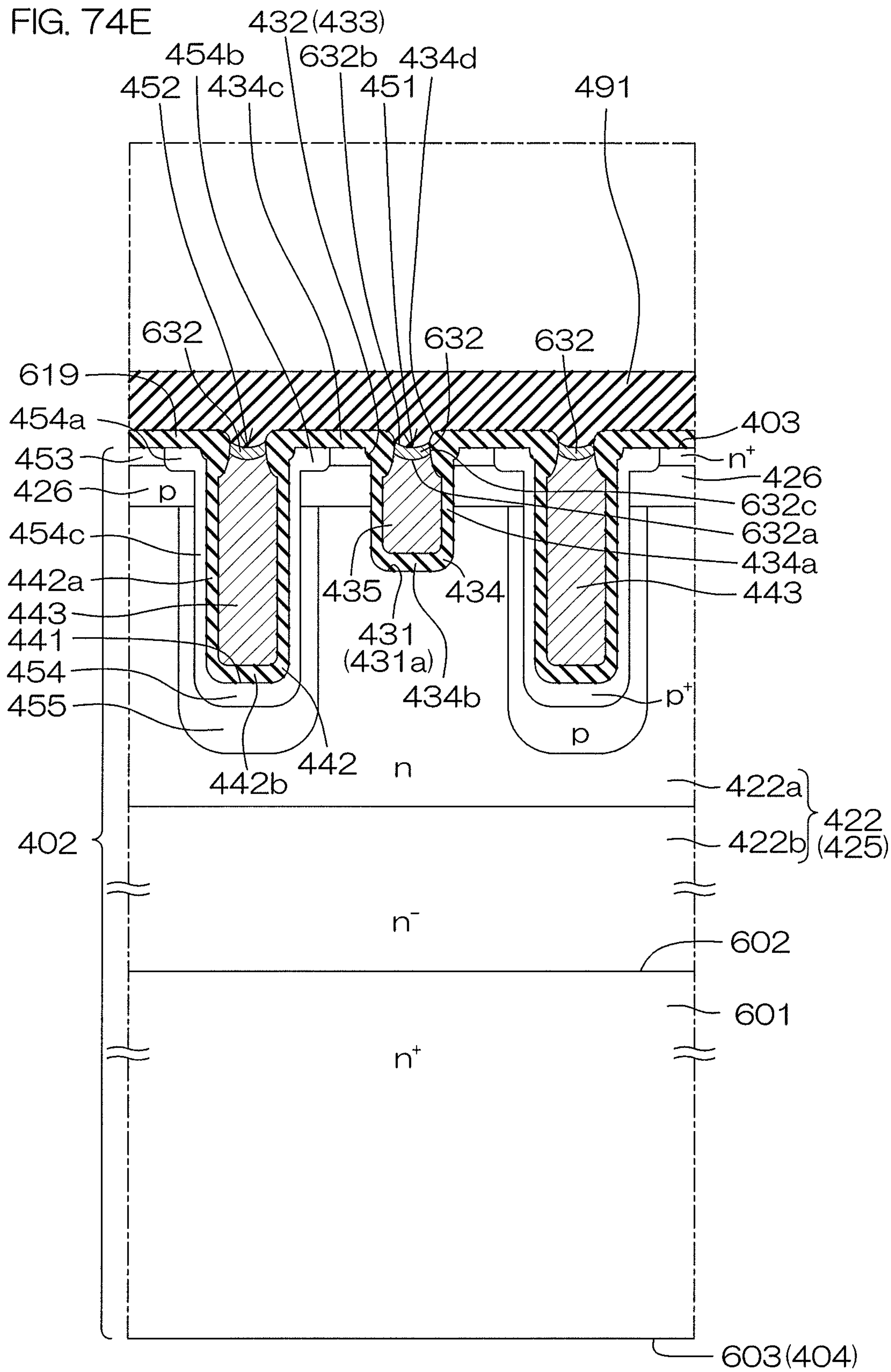

FIG. 74E is an enlarged view of a step subsequent to that of FIG. 74D.

Figure 74F:
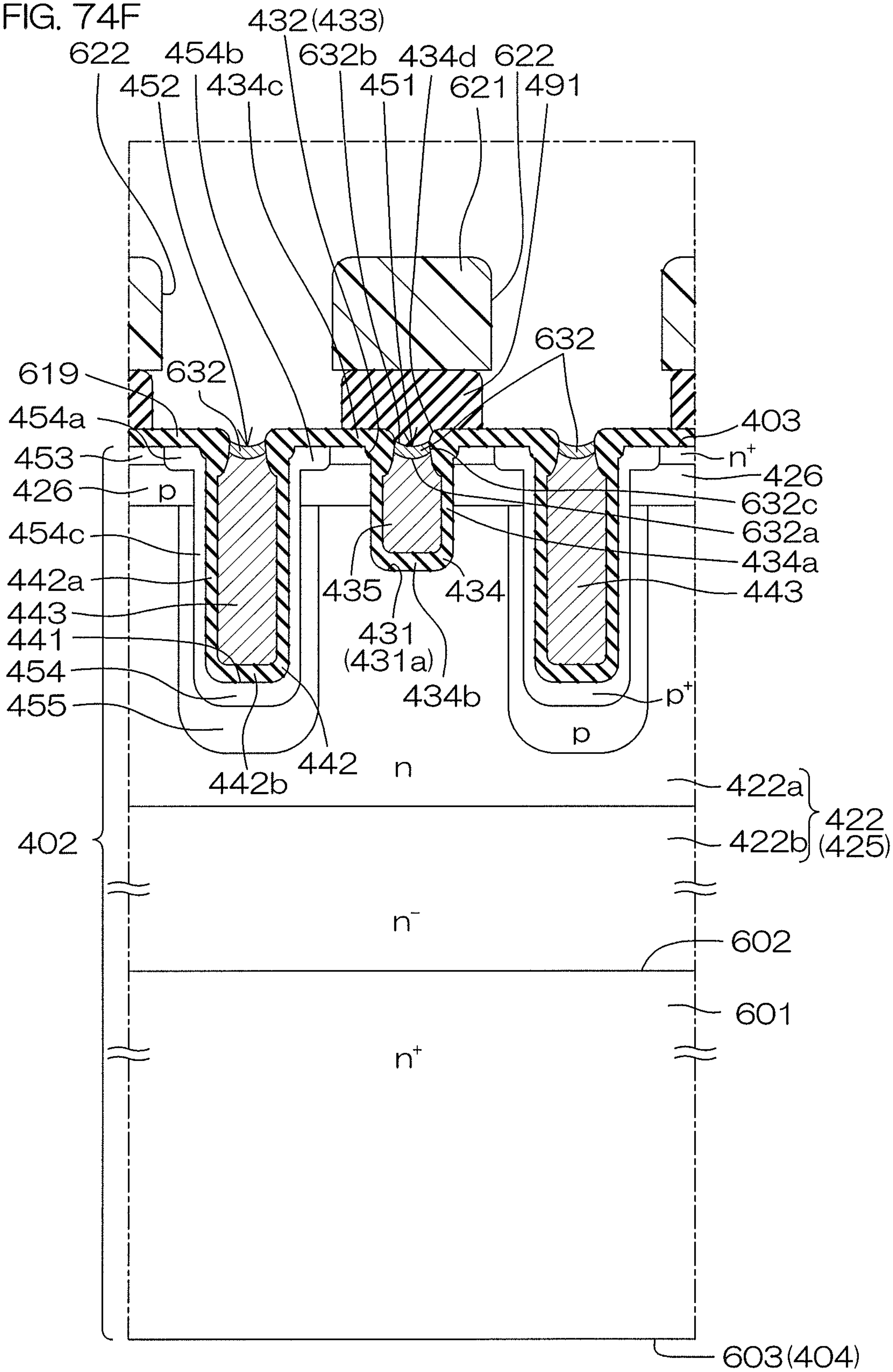

FIG. 74F is an enlarged view of a step subsequent to that of FIG. 74E.

Figure 74G:
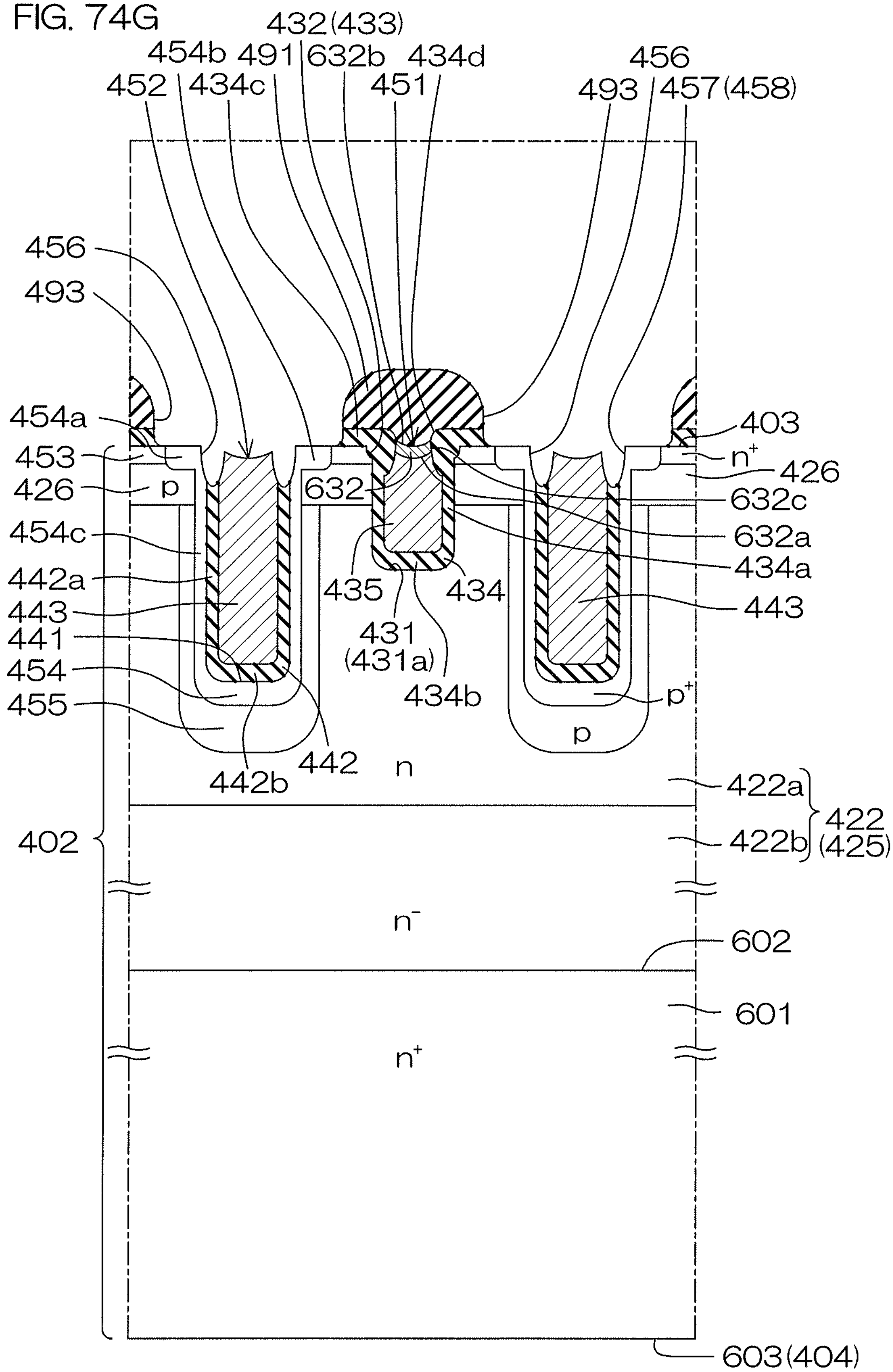

FIG. 74G is an enlarged view of a step subsequent to that of FIG. 74F.

Figure 75:
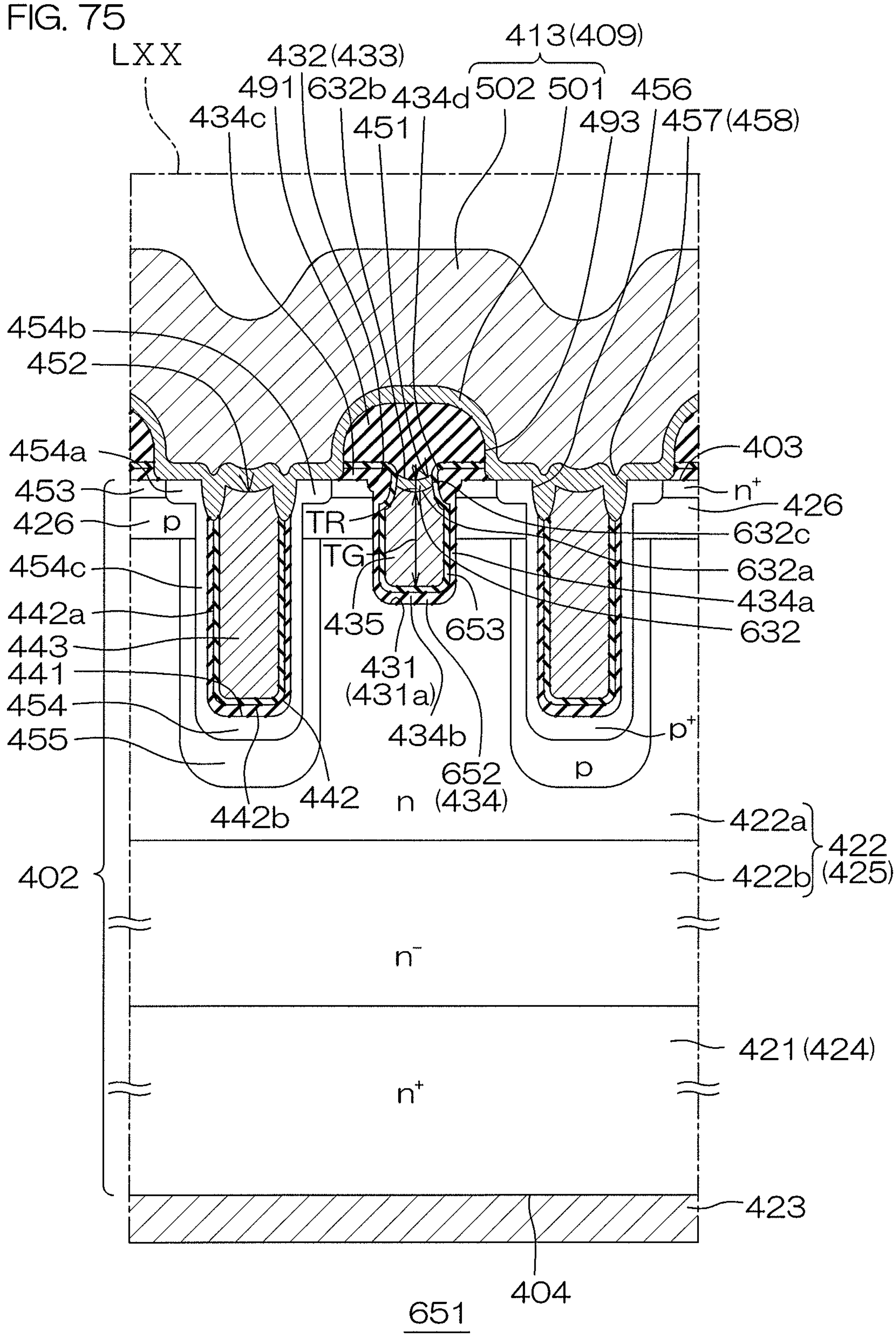

FIG. 75 is an enlarged view of a region corresponding to FIG. 70 and is an enlarged view of a semiconductor device according to a twenty-eighth preferred embodiment of the present invention.

Figure 76A:
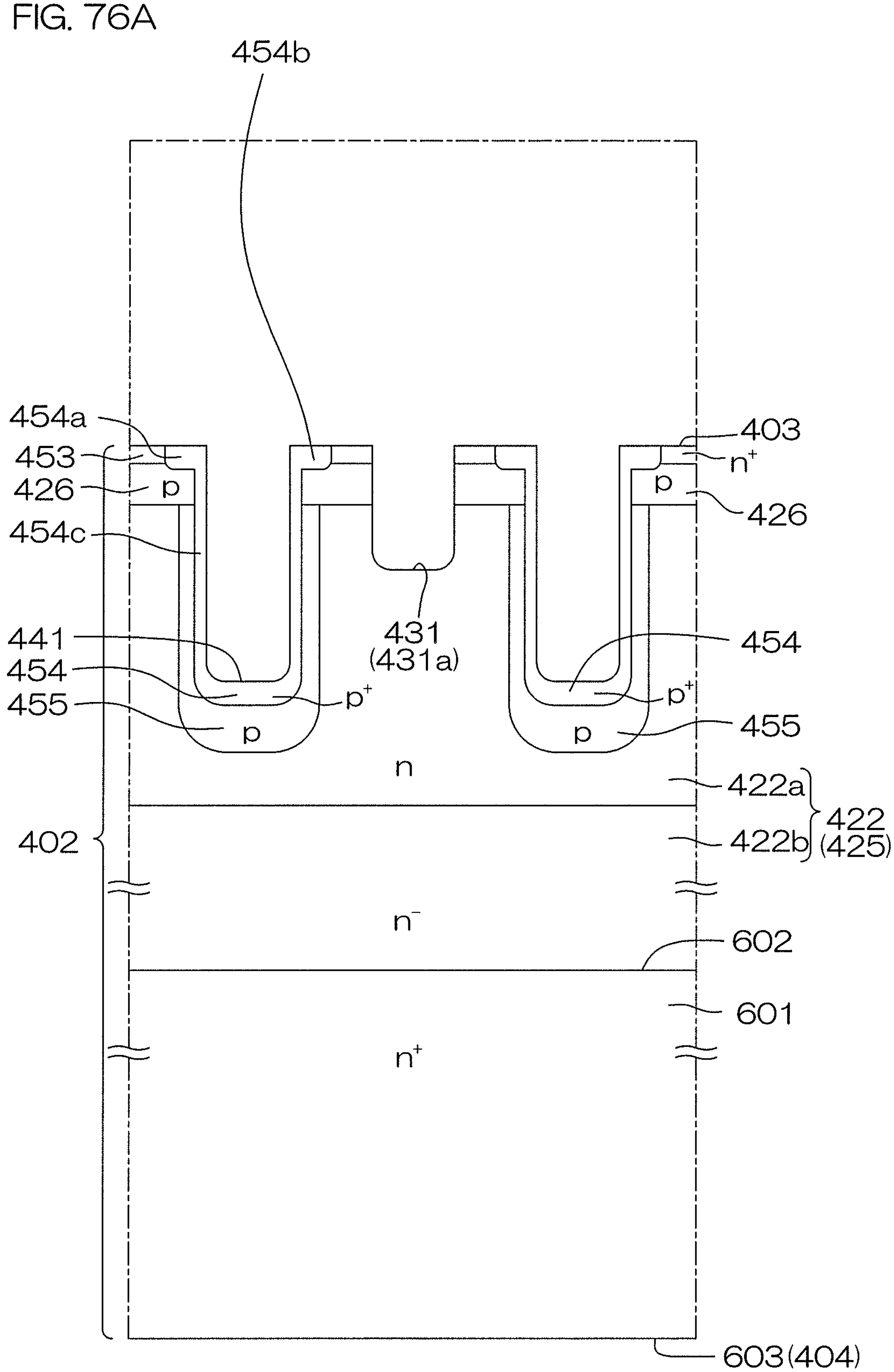

FIG. 76A is an enlarged view of a region corresponding to FIG. 75 and is an enlarged view for describing an example of a method for manufacturing the semiconductor device shown in FIG. 75.

Figure 76B:
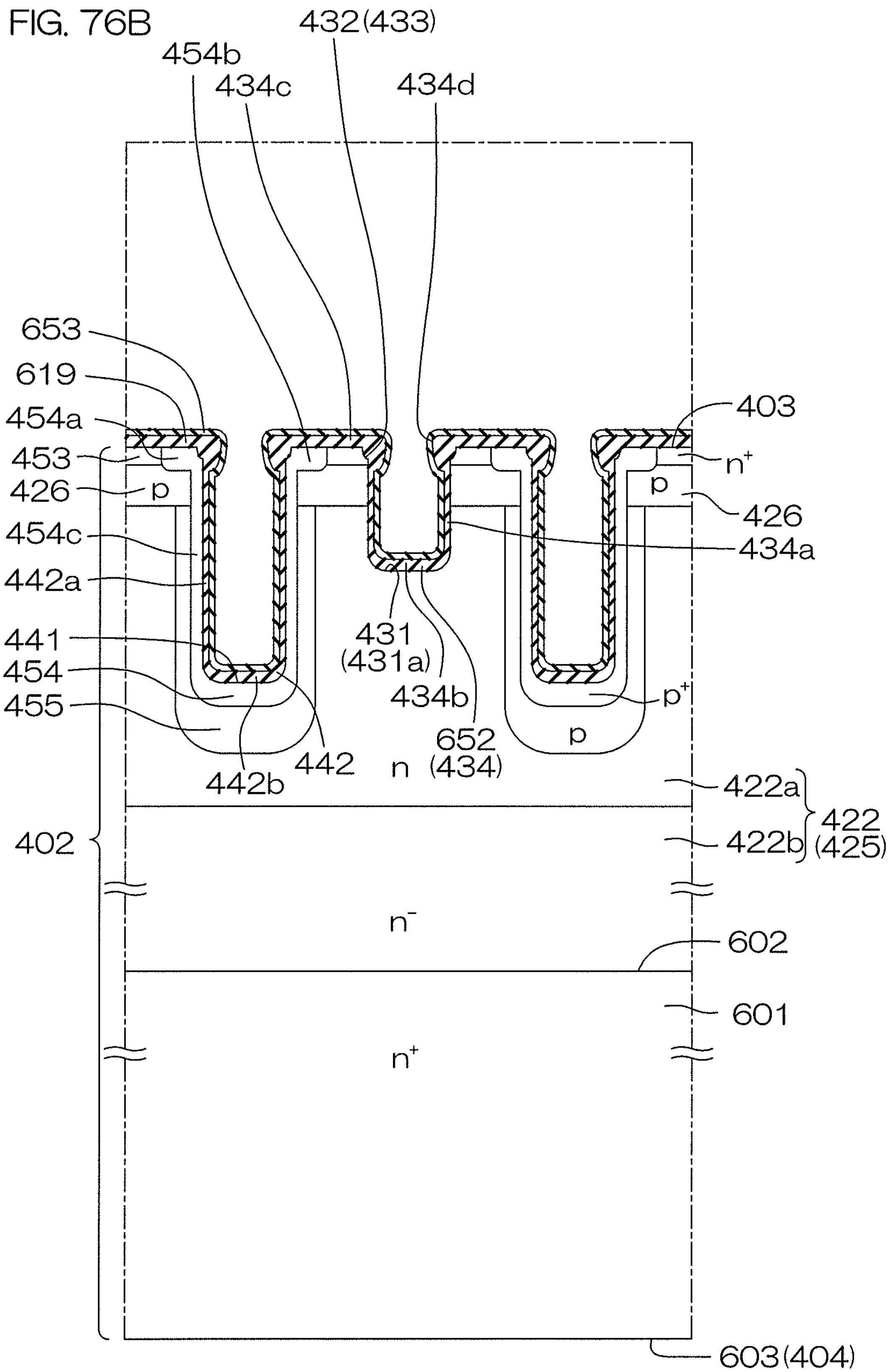

FIG. 76B is an enlarged view of a step subsequent to that of FIG. 76A.

Figure 76C:
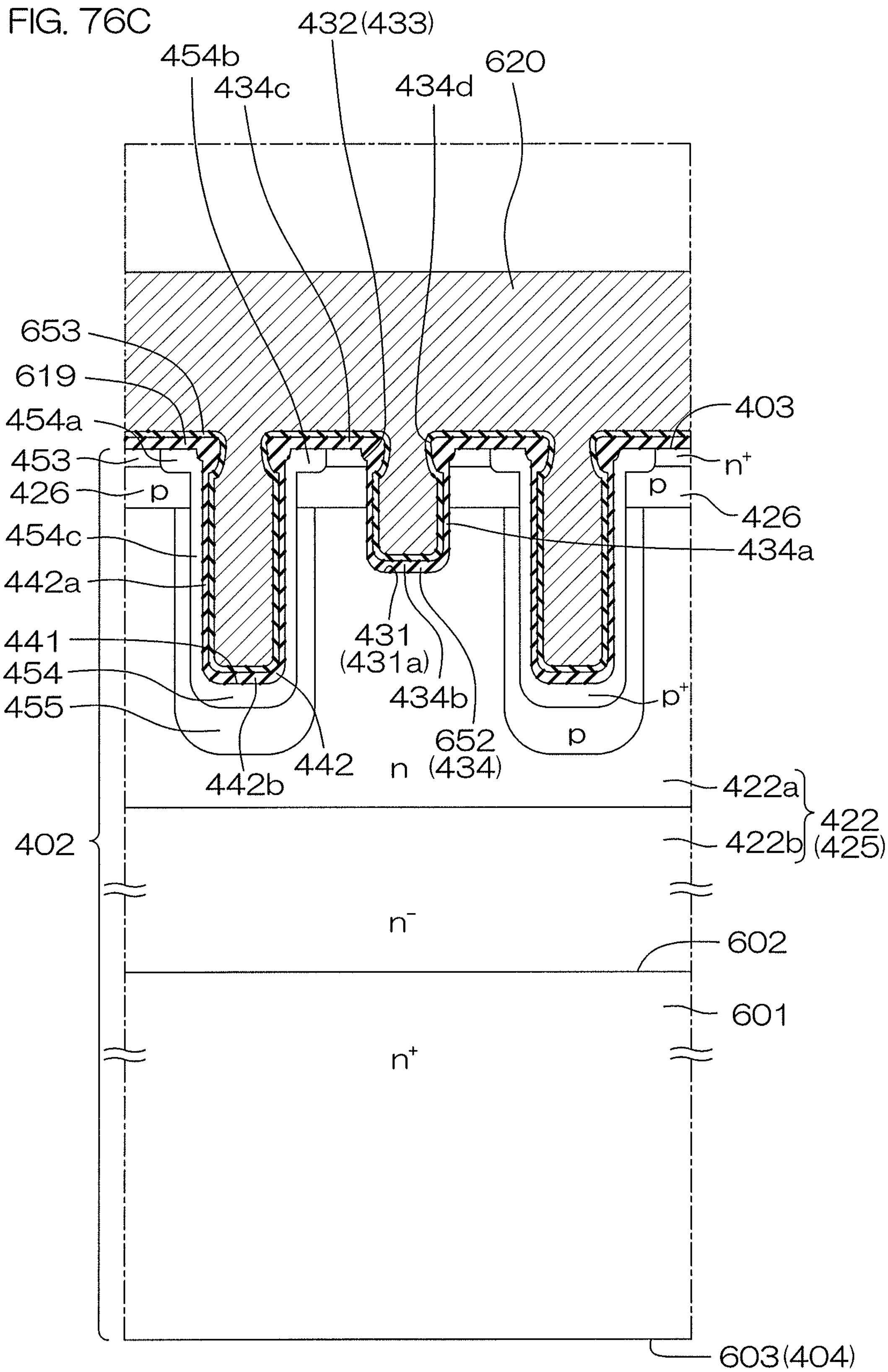

FIG. 76C is an enlarged view of a step subsequent to that of FIG. 76B.

Figure 76D:
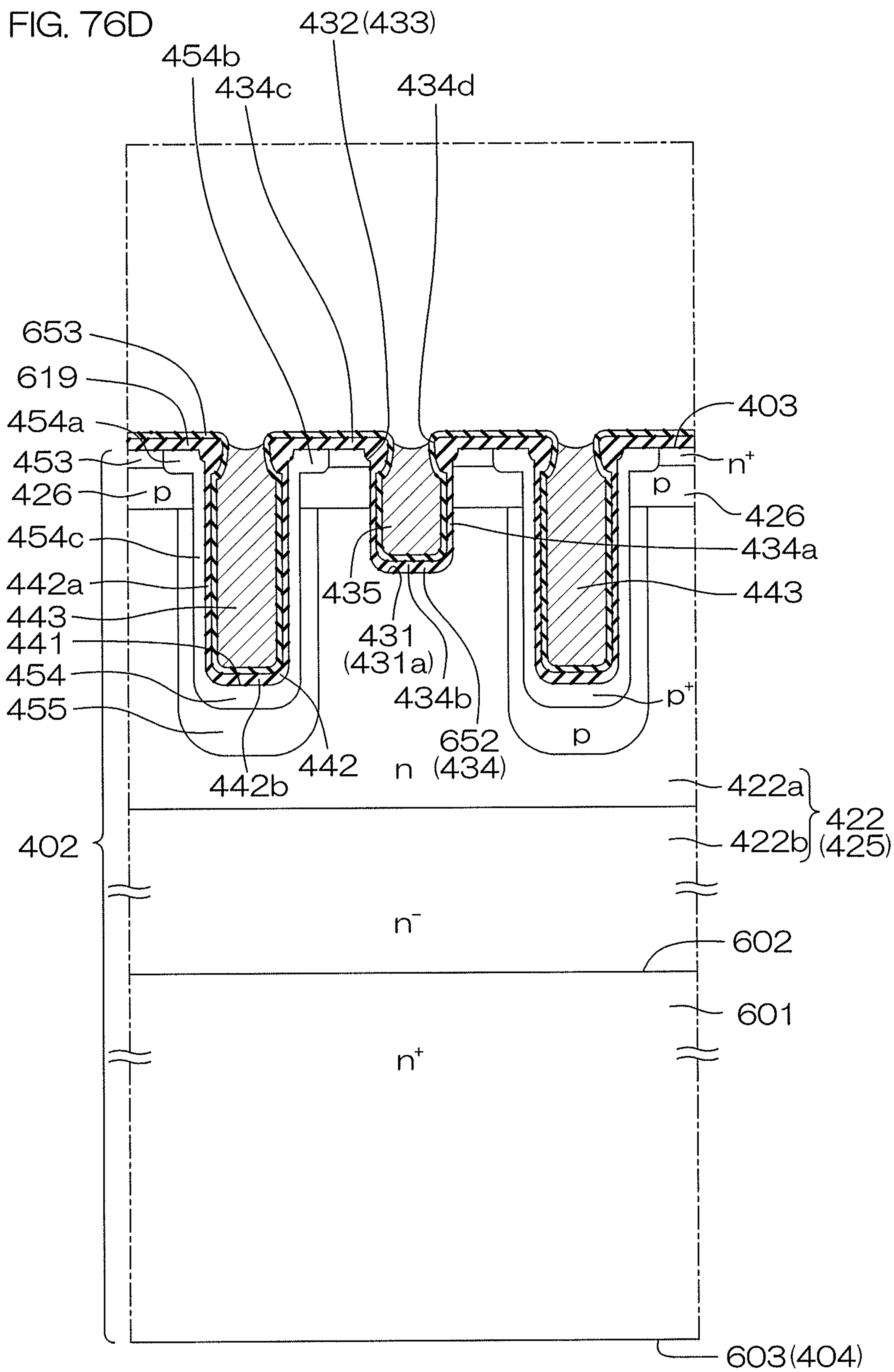

FIG. 76D is an enlarged view of a step subsequent to that of FIG. 76C.

Figure 76E:
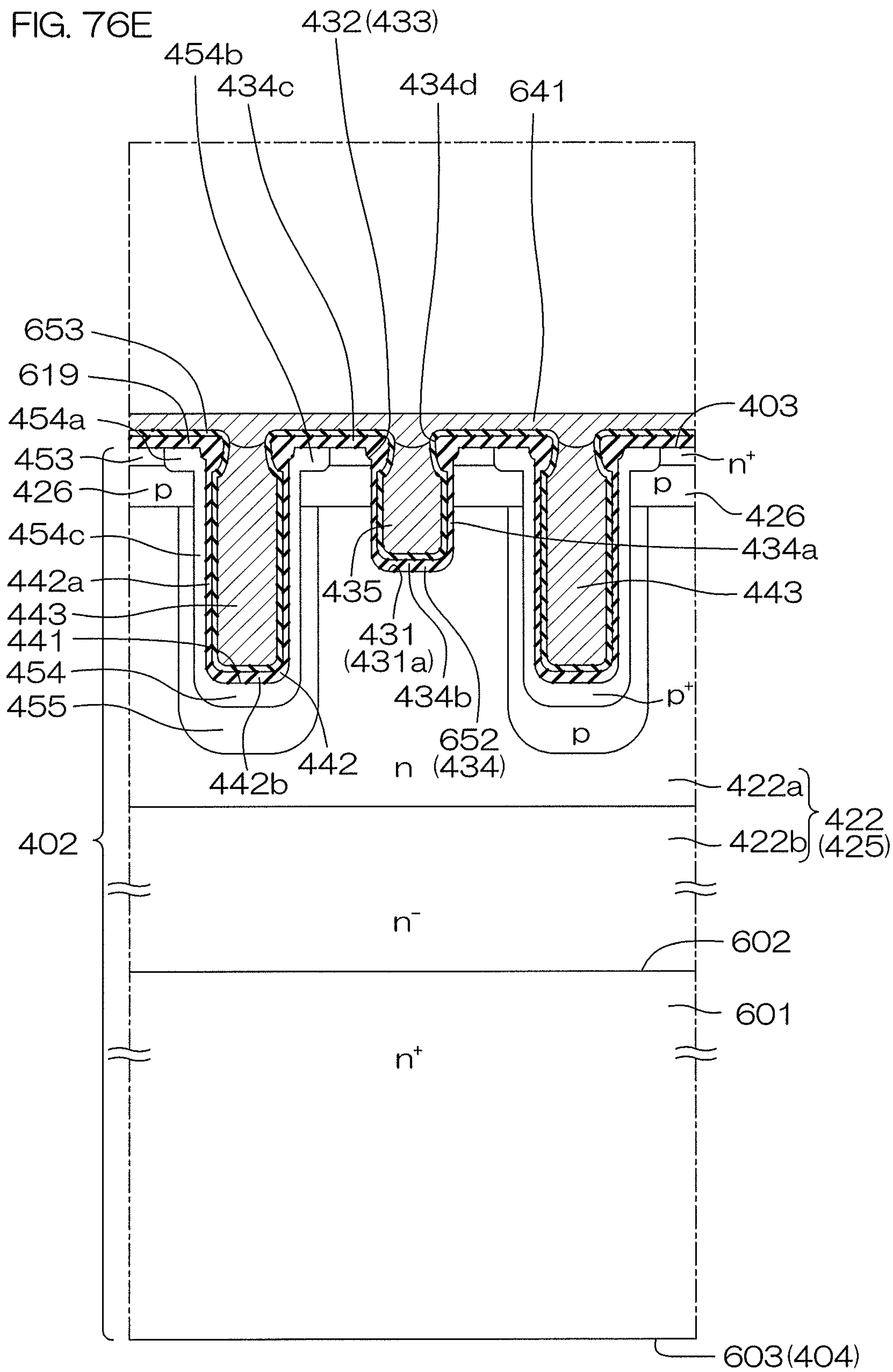

FIG. 76E is an enlarged view of a step subsequent to that of FIG. 76D.

Figure 76F:
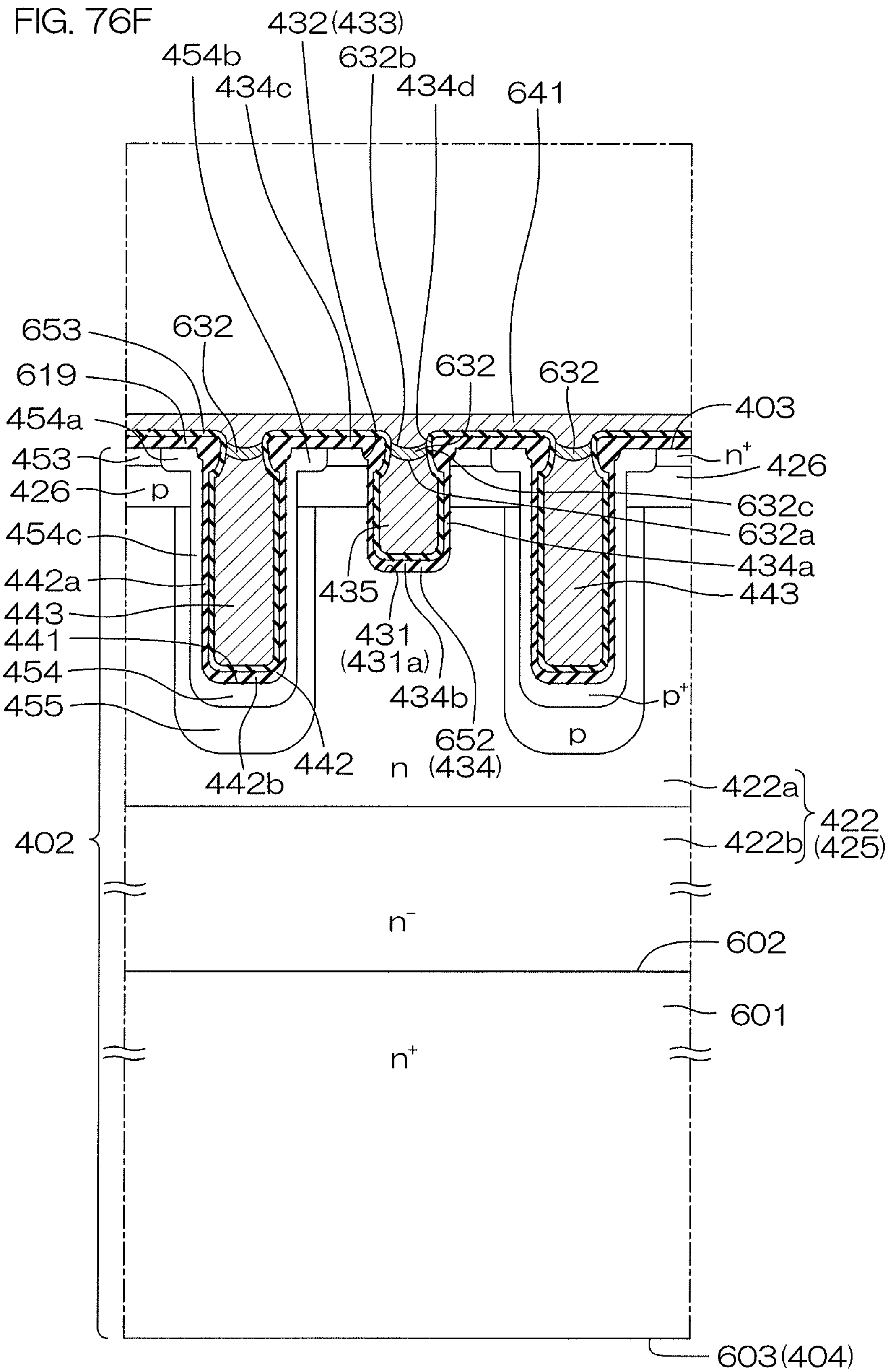

FIG. 76F is an enlarged view of a step subsequent to that of FIG. 76E.

Figure 76G:
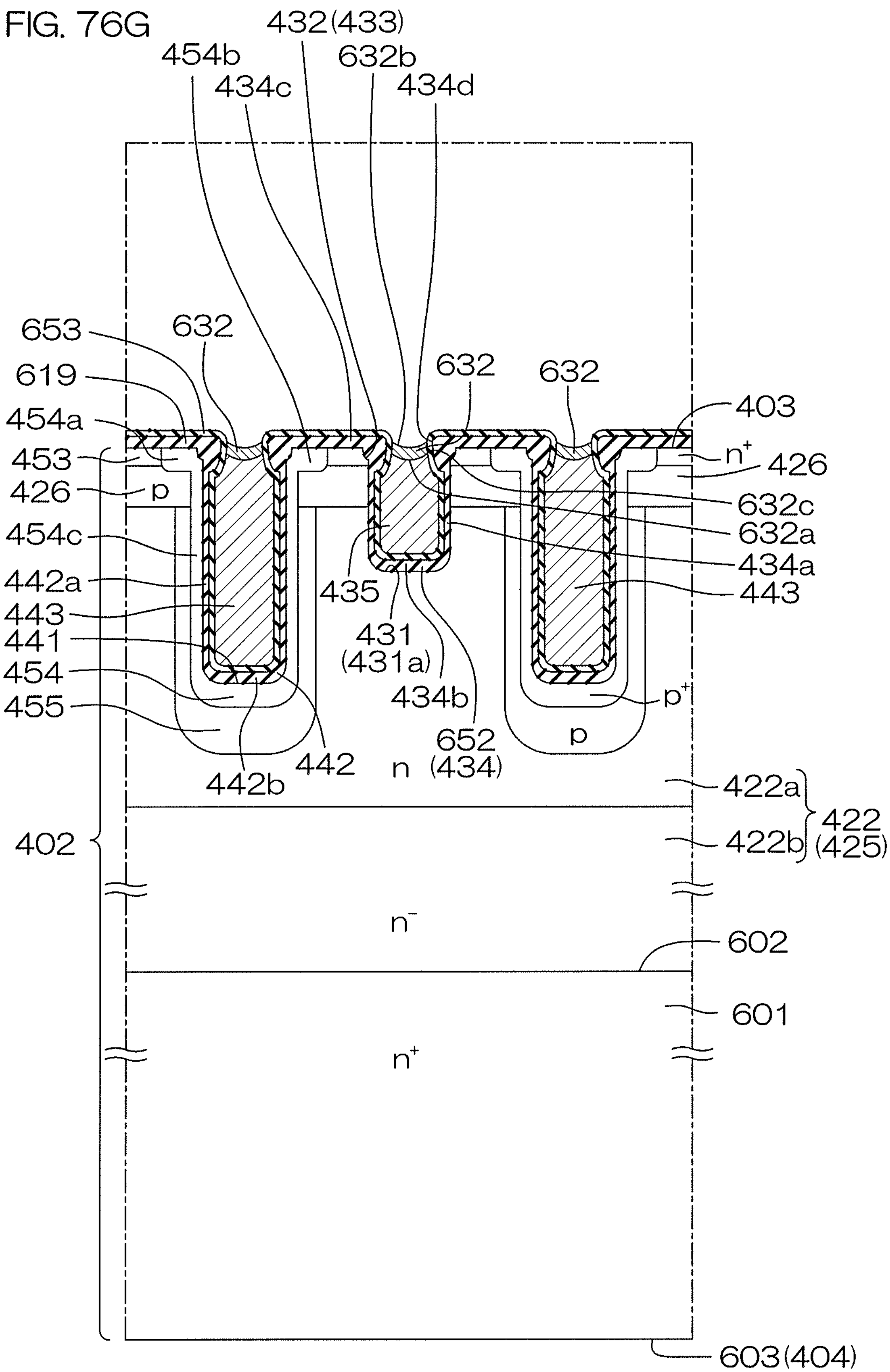

FIG. 76G is an enlarged view of a step subsequent to that of FIG. 76F.

Figure 77:
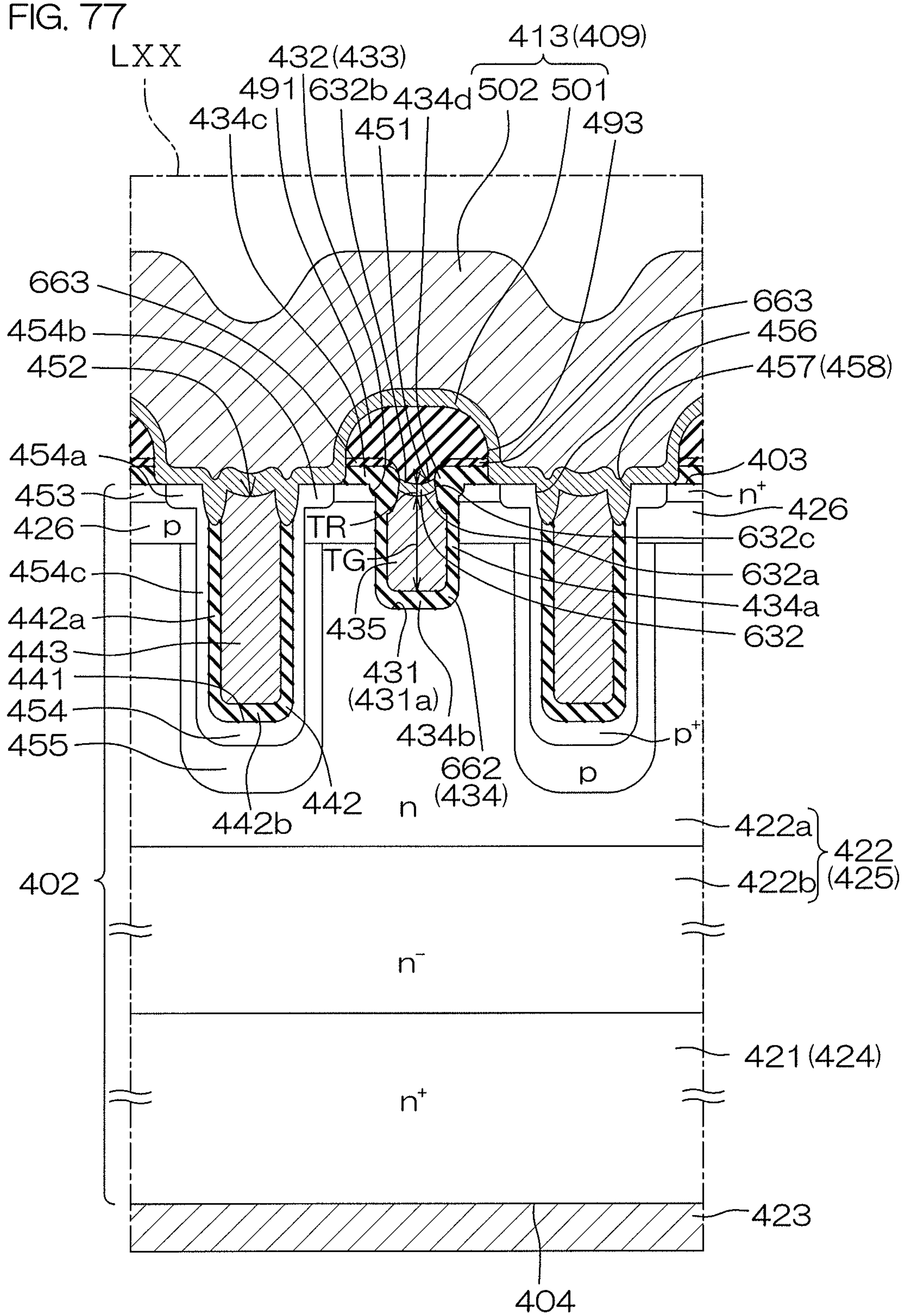

FIG. 77 is an enlarged view of a region corresponding to FIG. 70 and is an enlarged view of a semiconductor device according to a twenty-ninth preferred embodiment of the present invention.

Figure 78A:
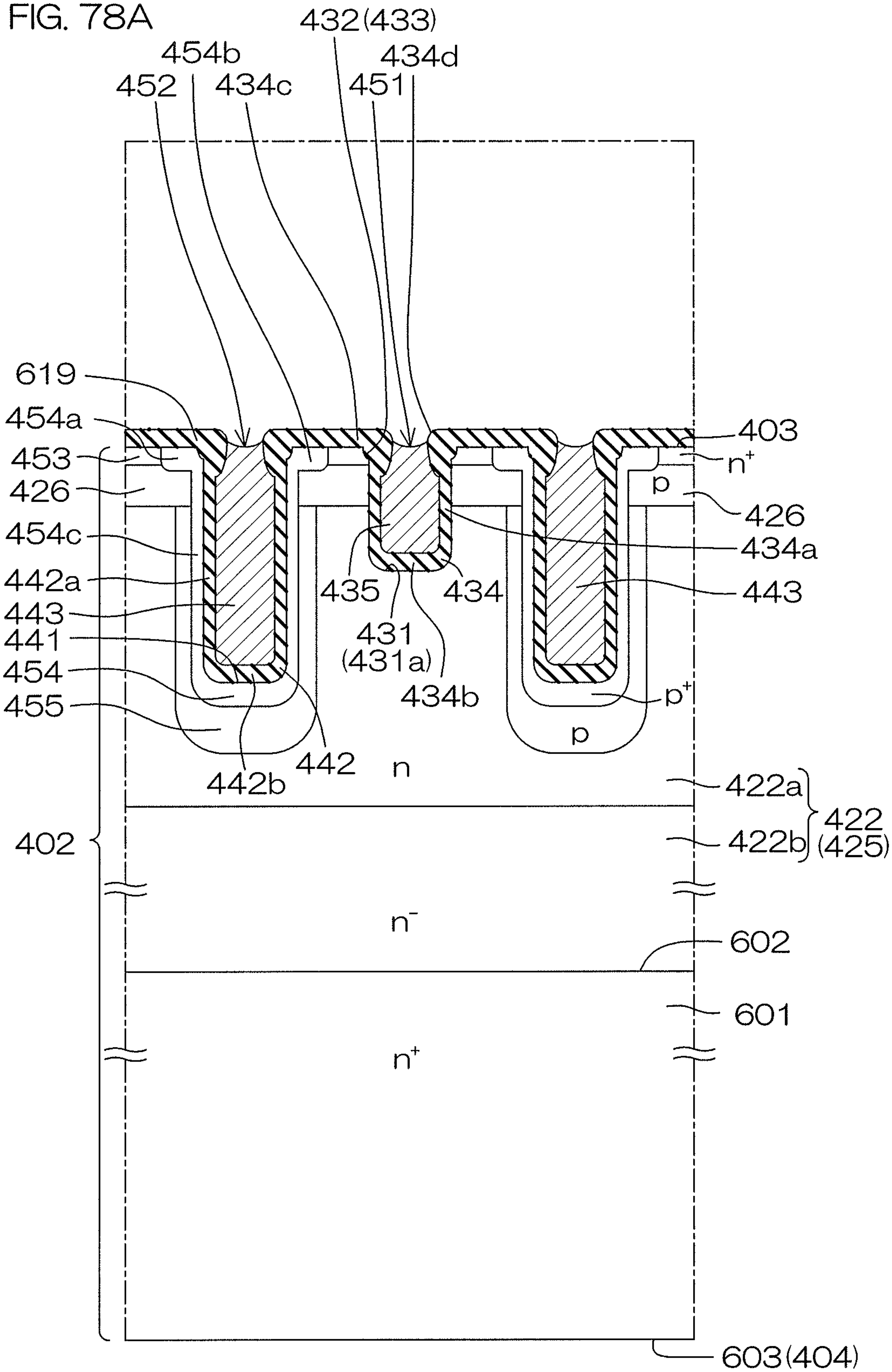

FIG. 78A is an enlarged view of a region corresponding to FIG. 77 and is an enlarged view for describing an example of a method for manufacturing the semiconductor device shown in FIG. 77.

Figure 78B:
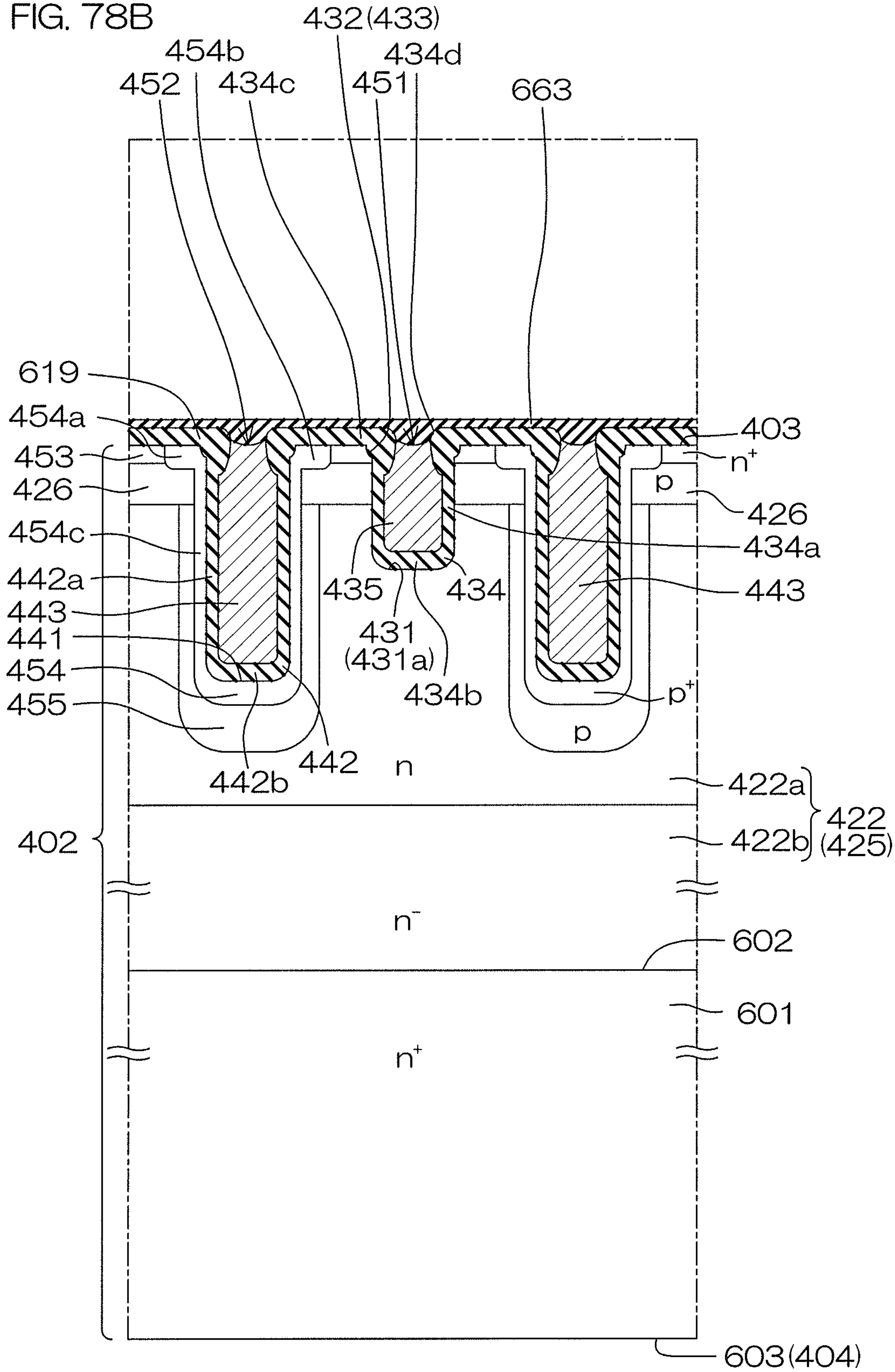

FIG. 78B is an enlarged view of a step subsequent to that of FIG. 78A.

Figure 78C:
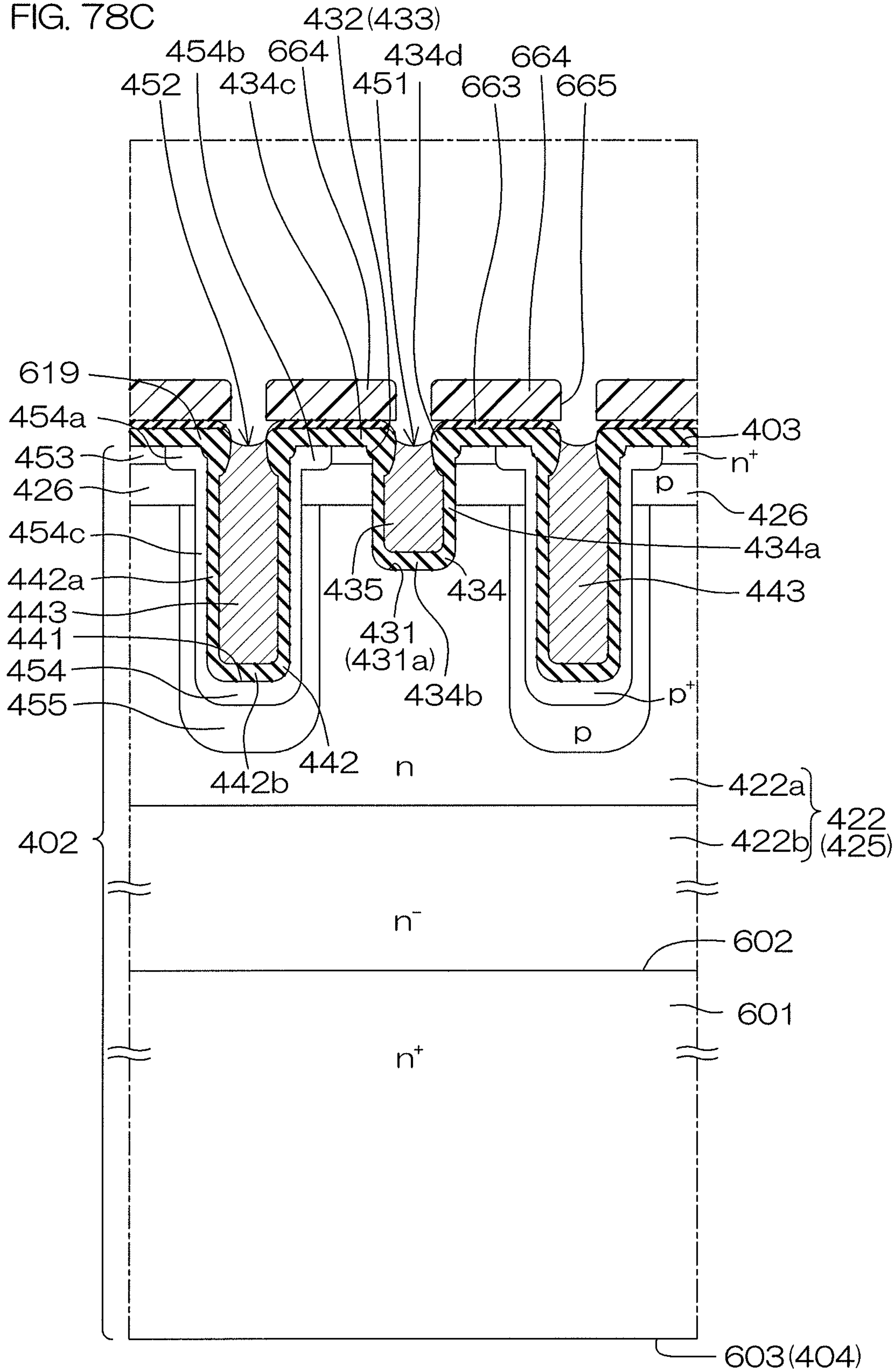

FIG. 78C is an enlarged view of a step subsequent to that of FIG. 78B.

Figure 78D:
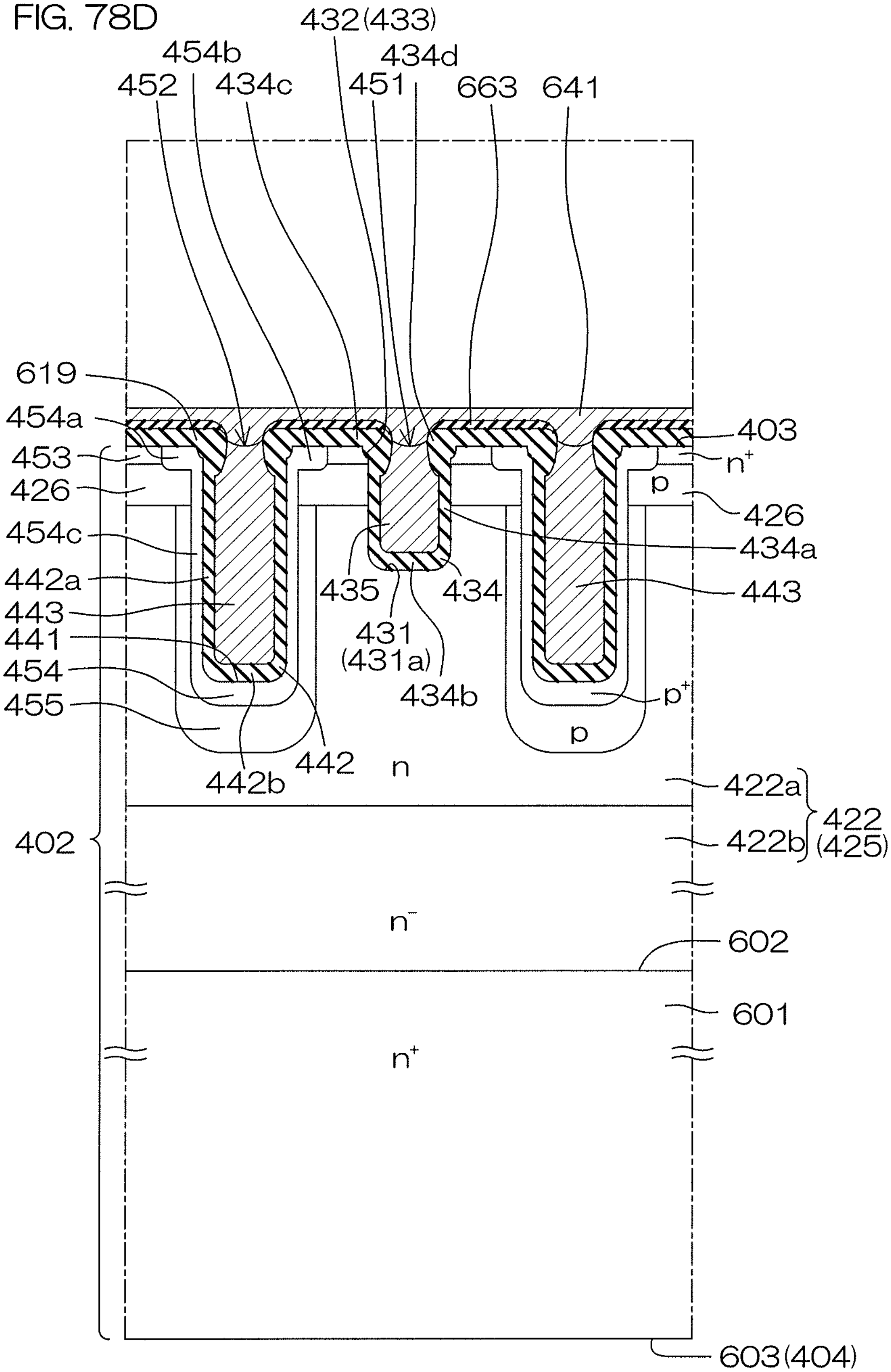

FIG. 78D is an enlarged view of a step subsequent to that of FIG. 78C.

Figure 78E:
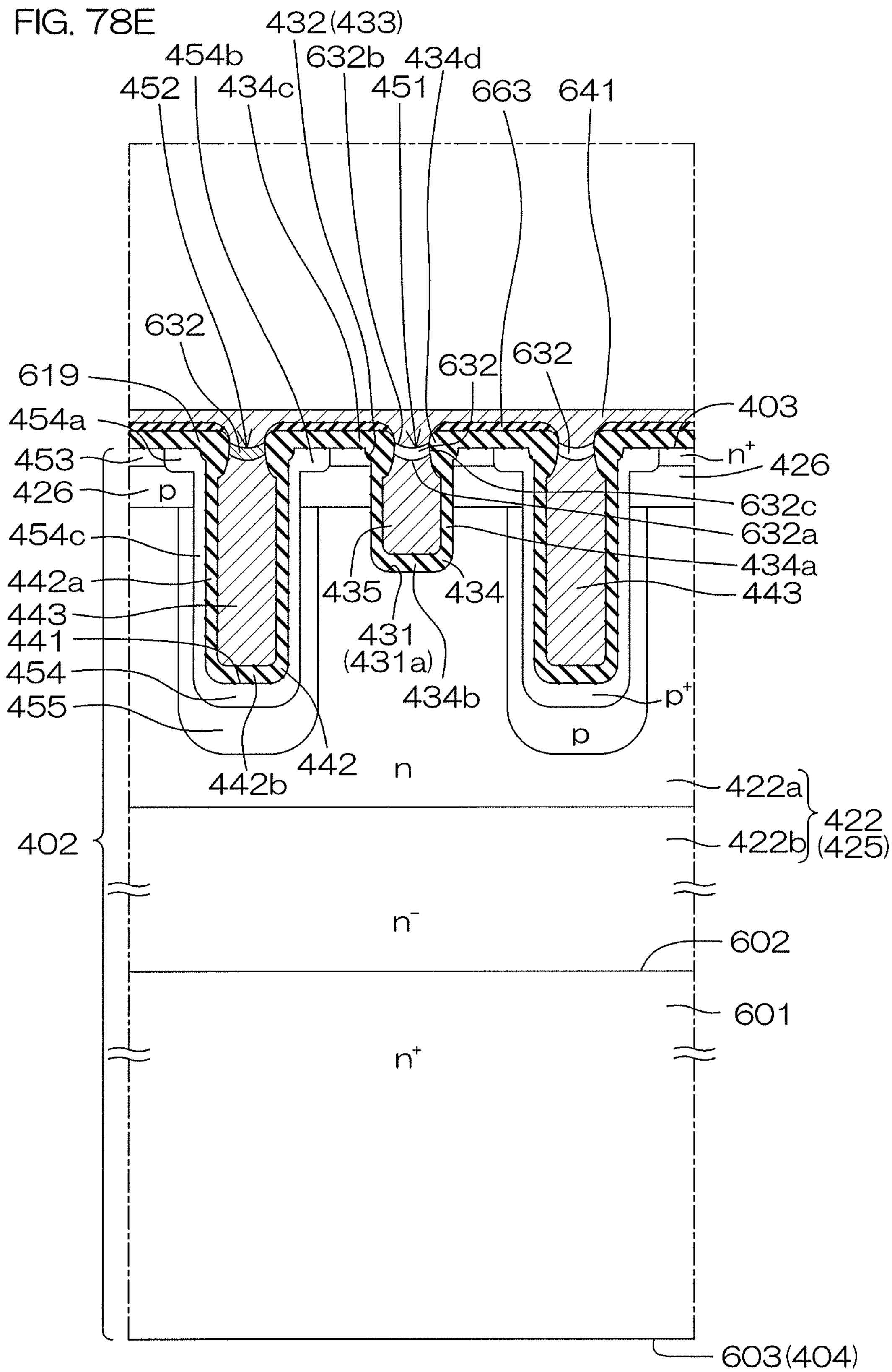

FIG. 78E is an enlarged view of a step subsequent to that of FIG. 78D.

Figure 78F:
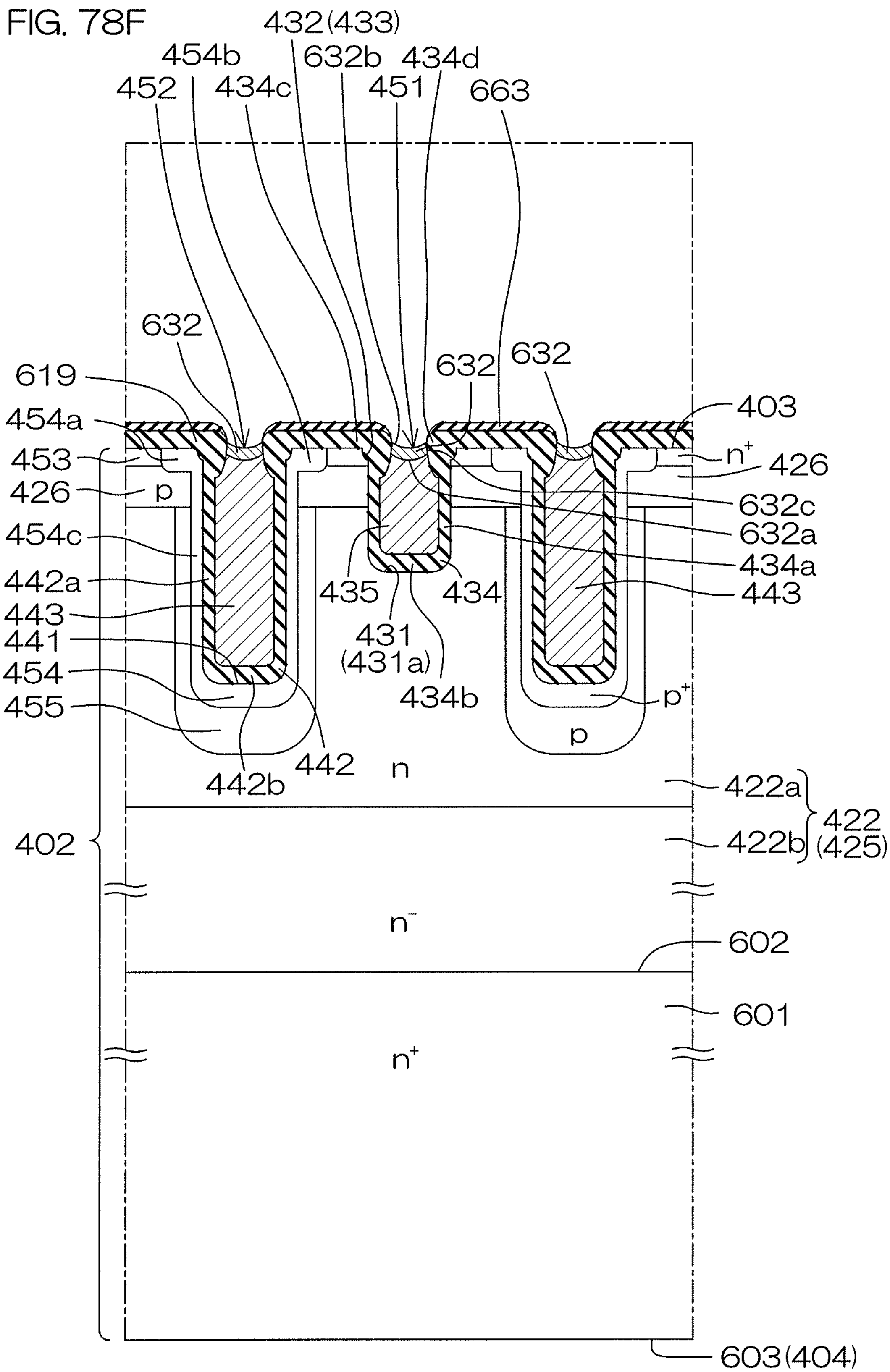

FIG. 78F is an enlarged view of a step subsequent to that of FIG. 78E.

Figure 79:
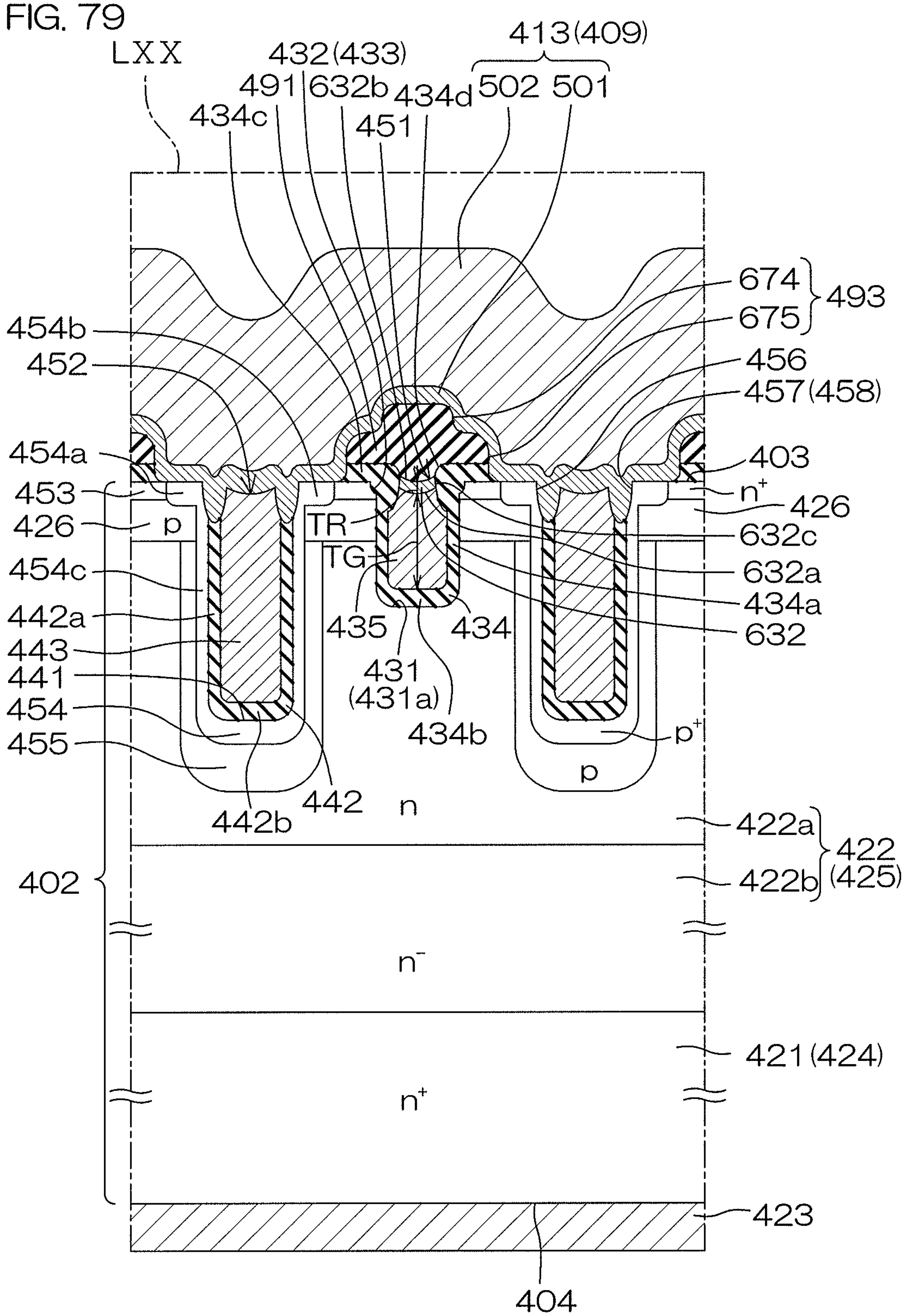

FIG. 79 is an enlarged view of a region corresponding to FIG. 70 and is an enlarged view of a semiconductor device according to a thirtieth preferred embodiment of the present invention.

Figure 80:
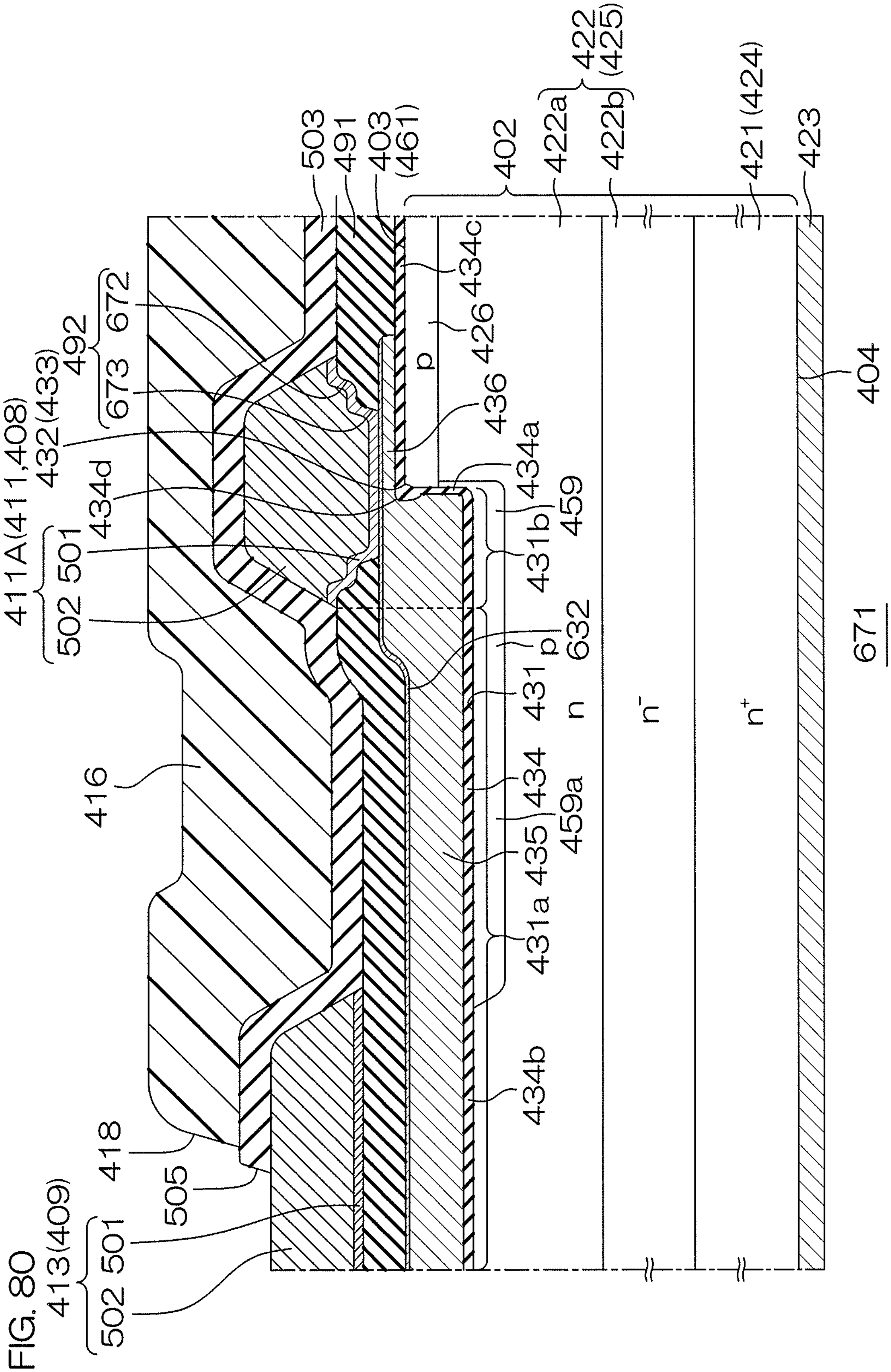

FIG. 80 is a sectional view of a region corresponding to FIG. 69 and is a sectional view of the semiconductor device shown in FIG. 79.

Figure 81:
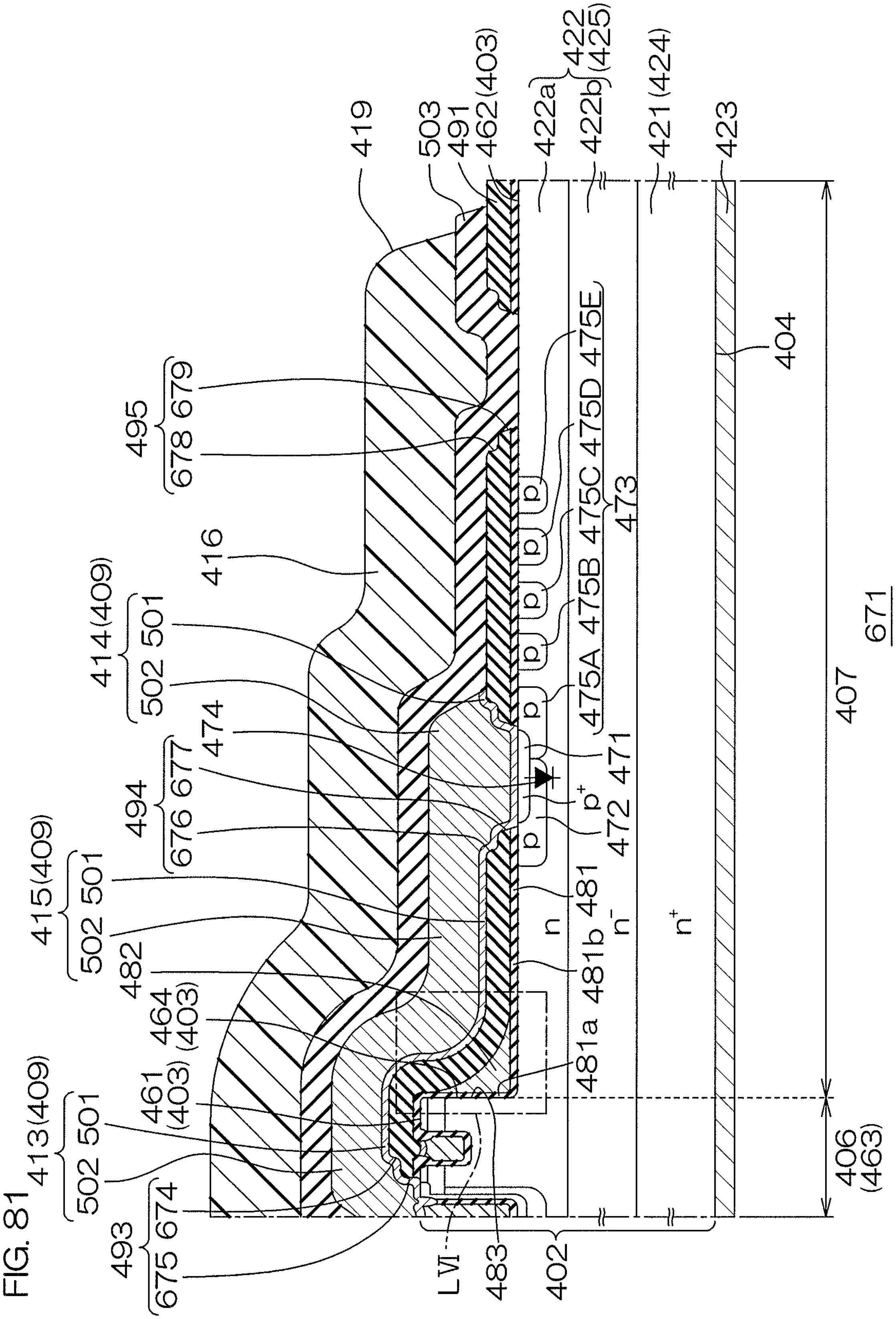

FIG. 81 is a sectional view of a region corresponding to FIG. 55 and is a sectional view of the semiconductor device shown in FIG. 79.

Figure 82A:
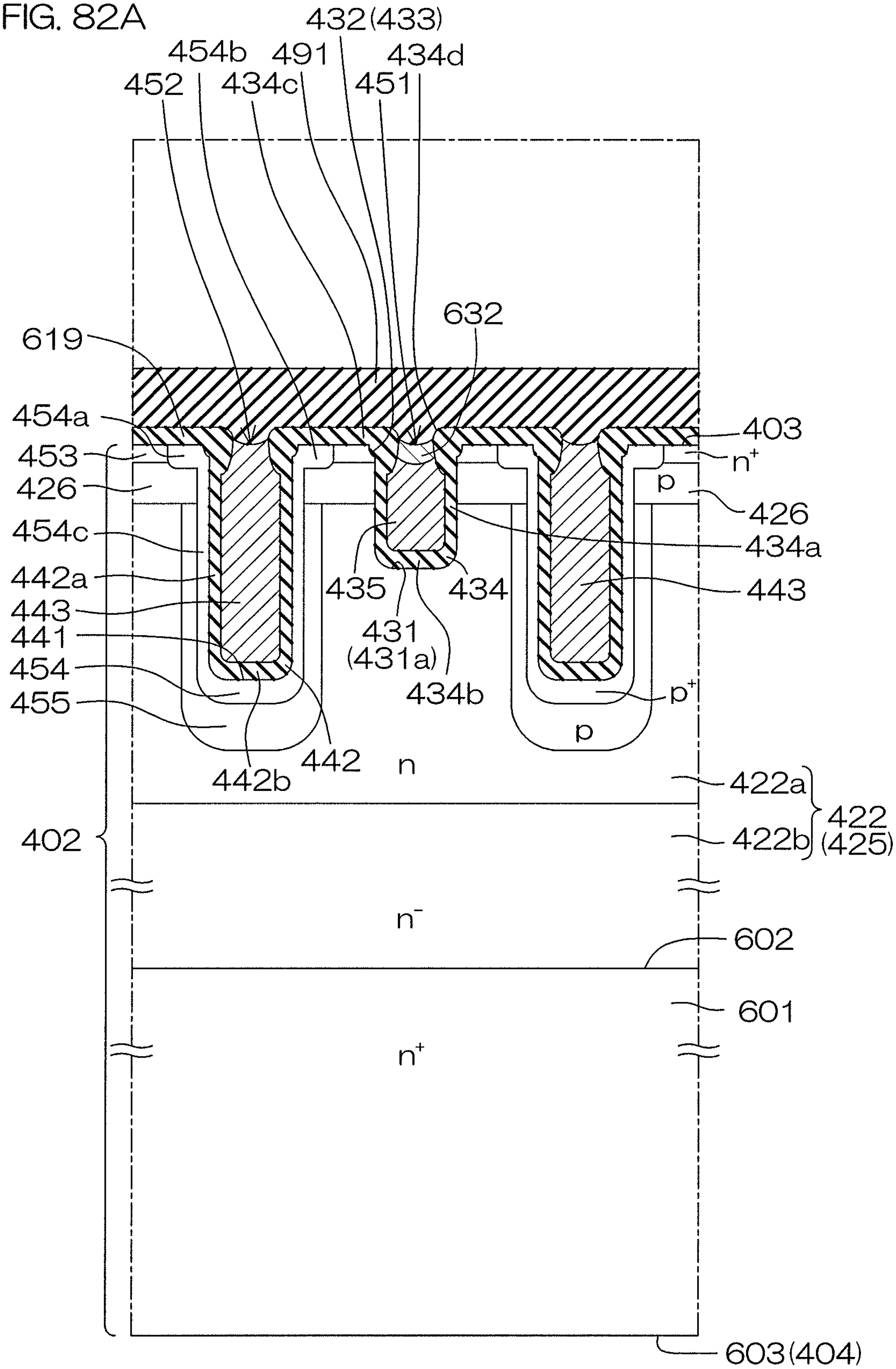

FIG. 82A is an enlarged view of a region corresponding to FIG. 79 and is an enlarged view for describing an example of a method for manufacturing the semiconductor device shown in FIG. 79.

Figure 82B:
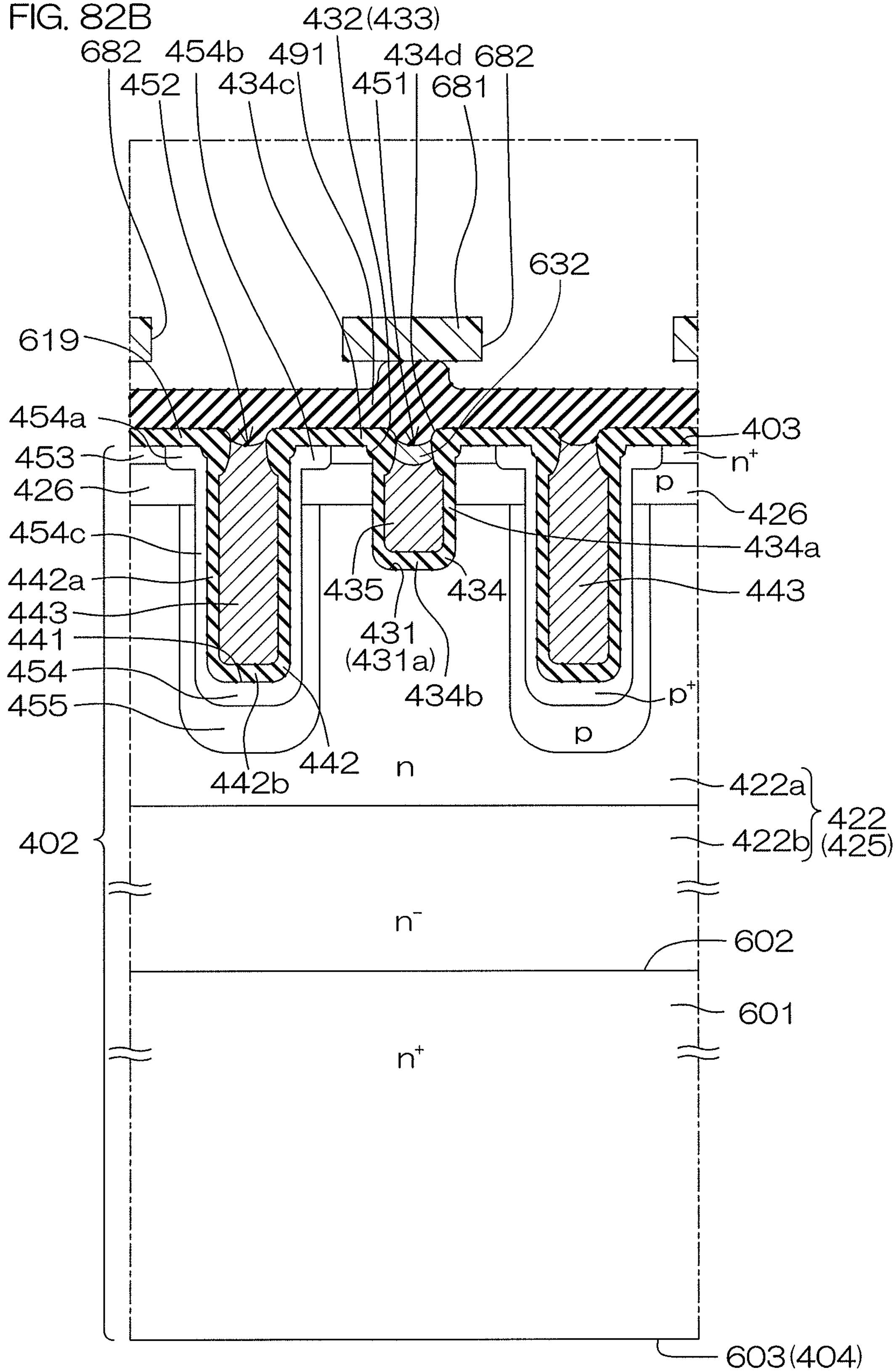

FIG. 82B is an enlarged view of a step subsequent to that of FIG. 82A.

Figure 82C:
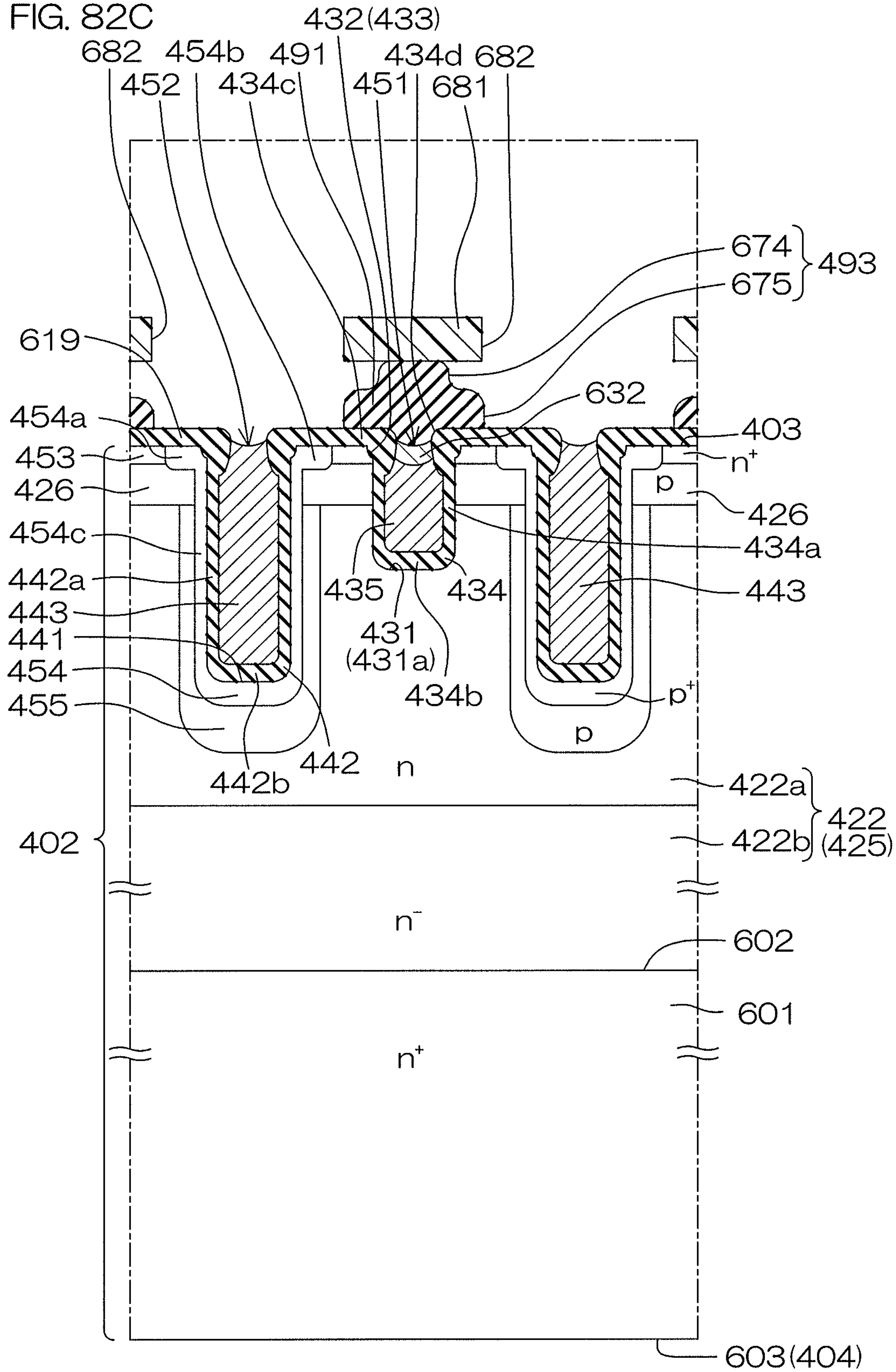

FIG. 82C is an enlarged view of a step subsequent to that of FIG. 82B.

Figure 83:
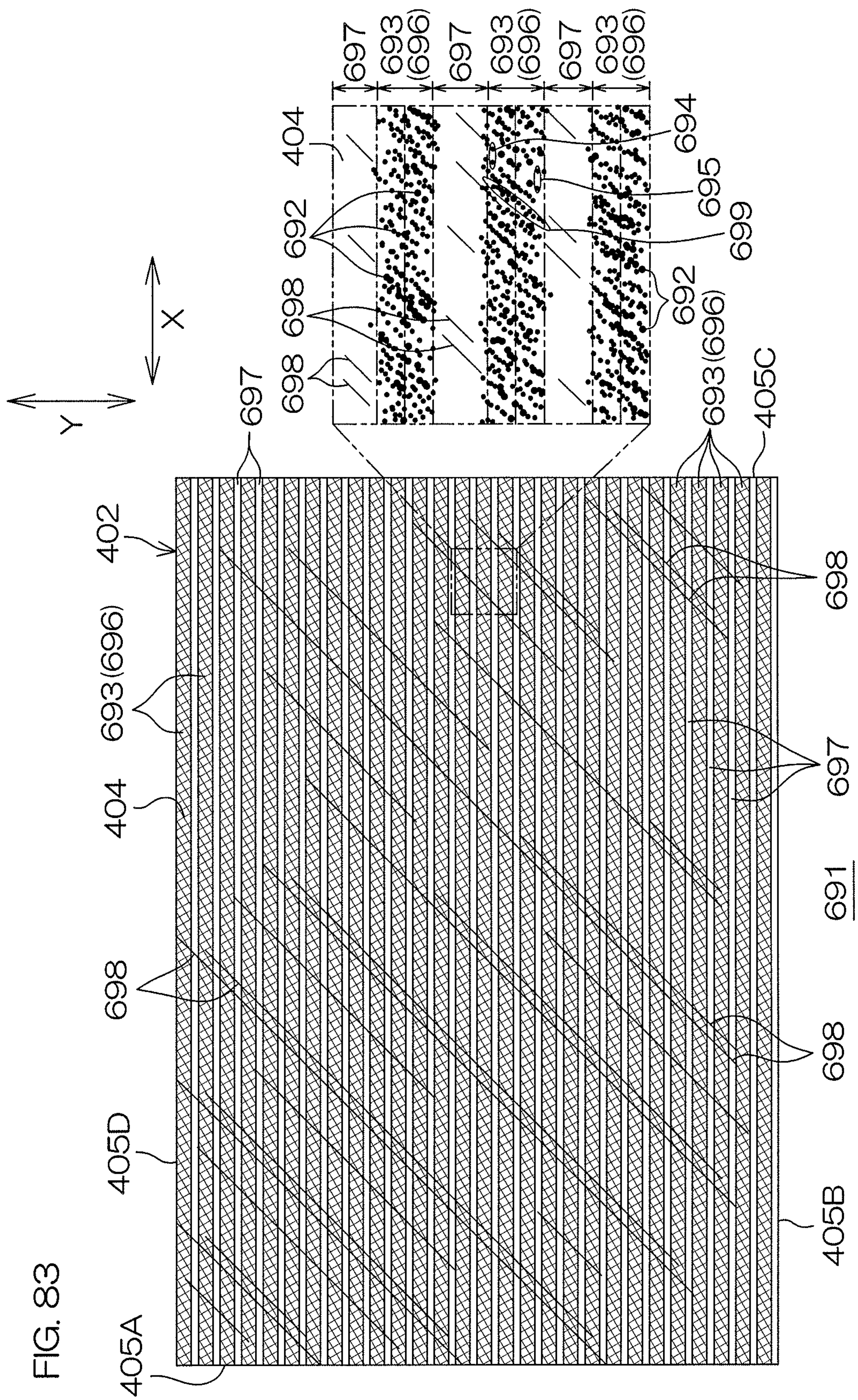

FIG. 83 is a bottom view of a semiconductor device according to a thirty-first preferred embodiment of the present invention and is a bottom view of a first configuration example of raised portion groups.

Figure 84A:
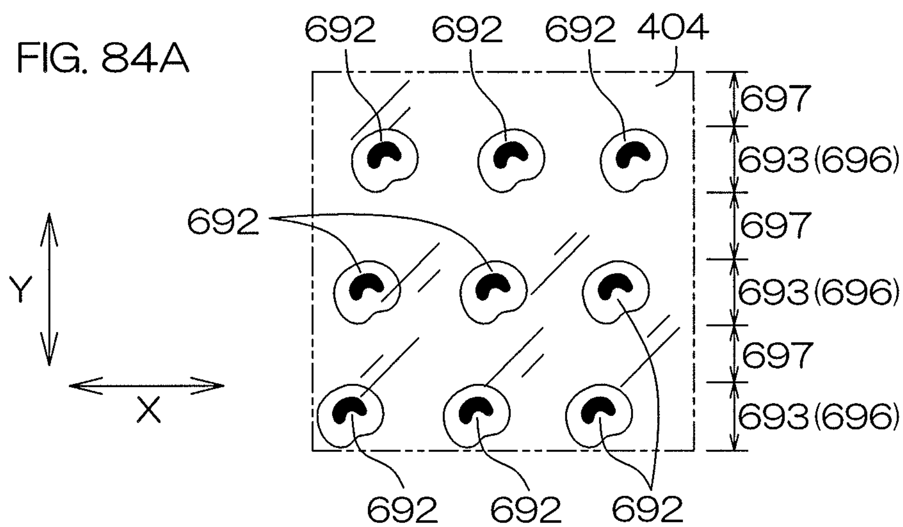

FIG. 84A is a diagram of a second configuration example of raised portion groups.

Figure 84B:
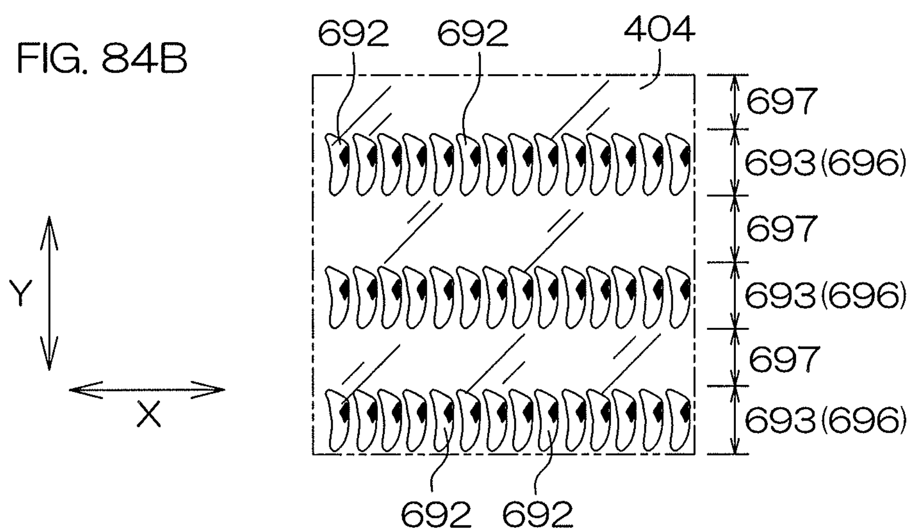

FIG. 84B is a diagram of a third configuration example of raised portion groups.

Figure 84C:
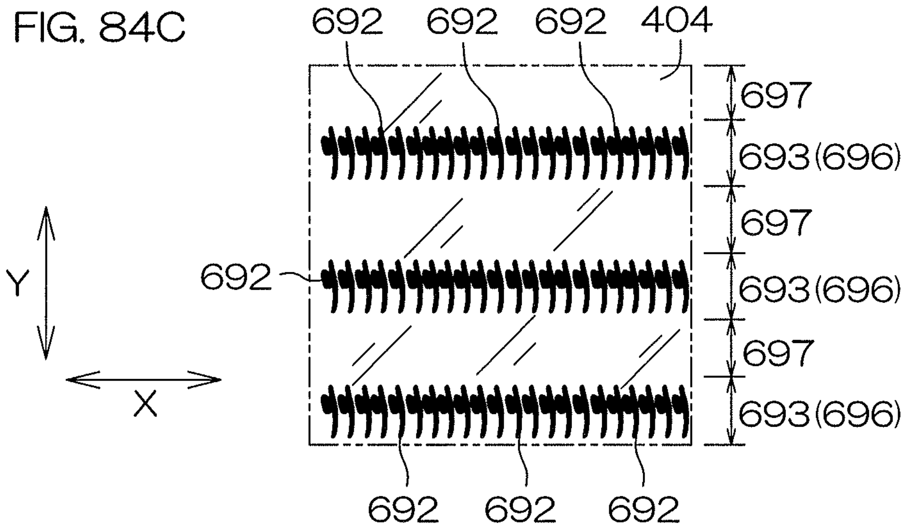

FIG. 84C is a diagram of a fourth configuration example of raised portion groups.

Figure 84D:
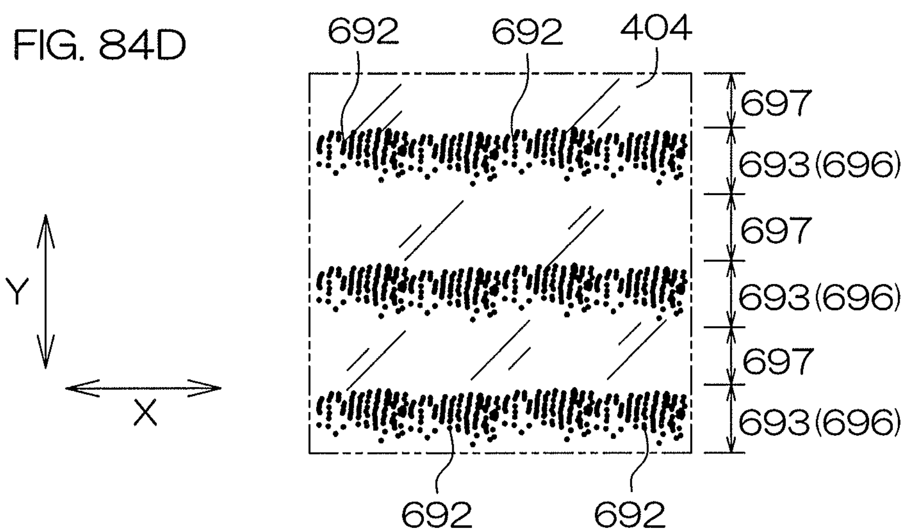

FIG. 84D is a diagram of a fifth configuration example of raised portion groups.

Figure 85:
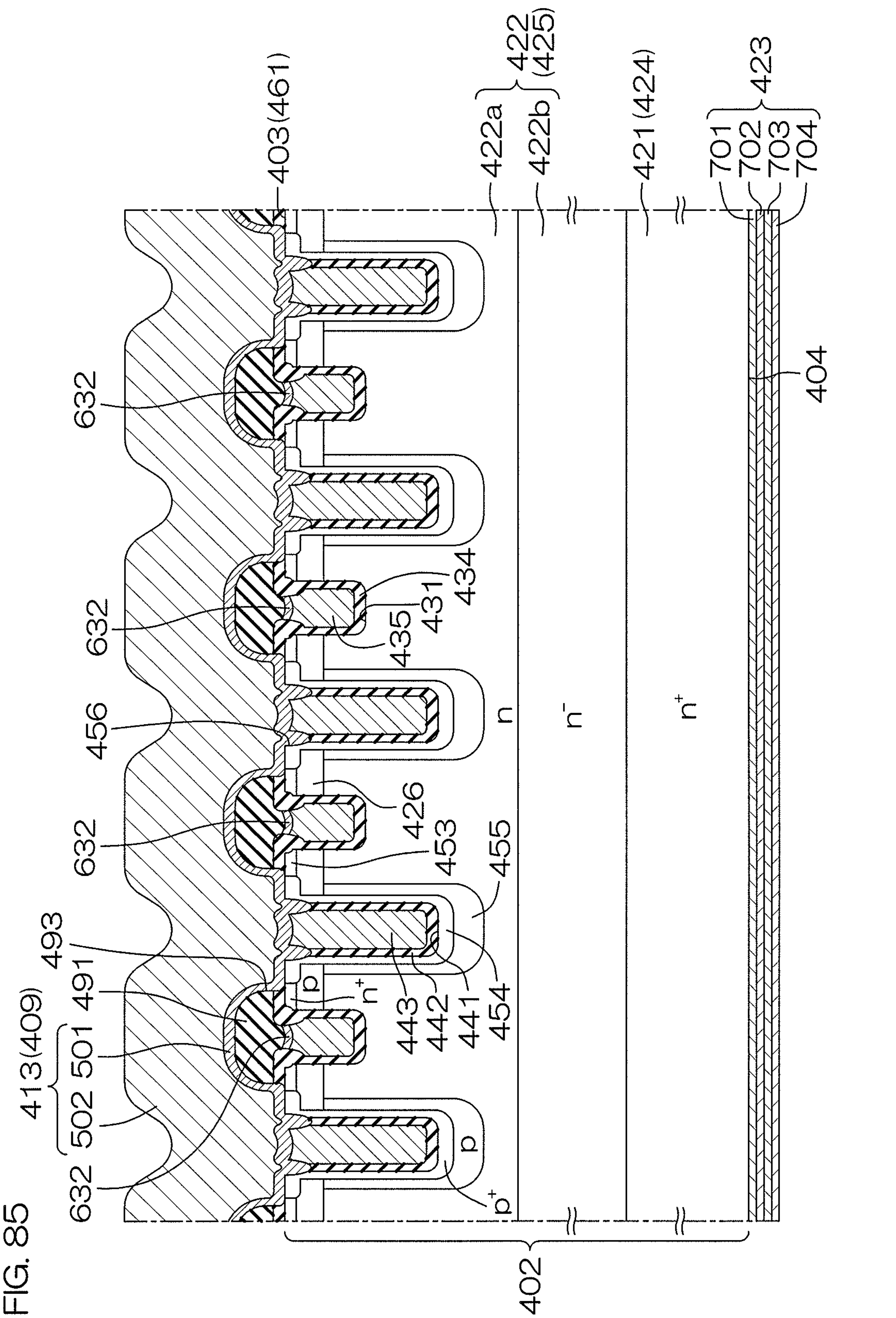

FIG. 85 is a sectional view of a region corresponding to FIG. 68 and is a sectional view of the semiconductor device shown in FIG. 83.

Figure 86:
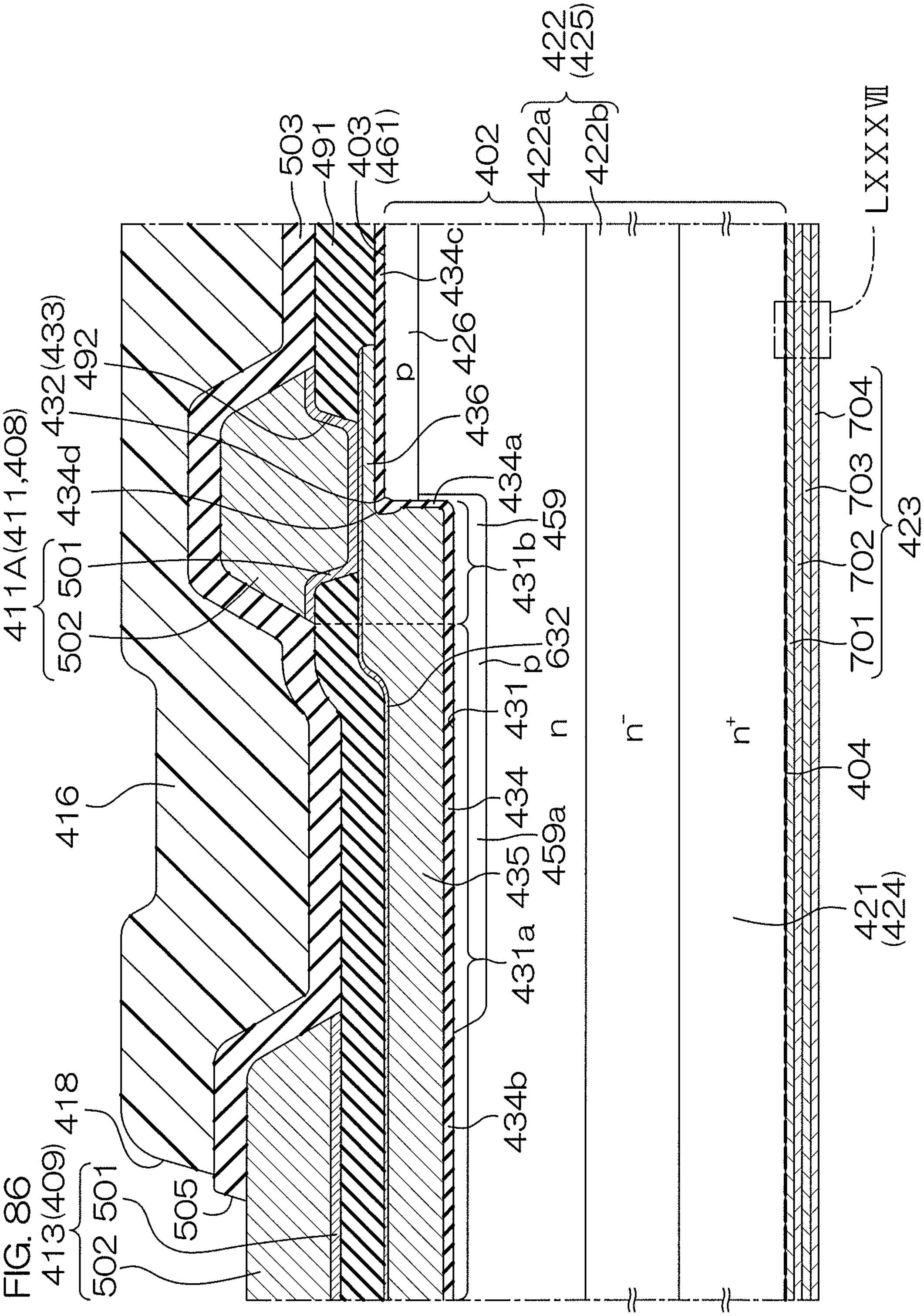

FIG. 86 is a sectional view of a region corresponding to FIG. 69 and is a sectional view of the semiconductor device shown in FIG. 83.

Figure 87:
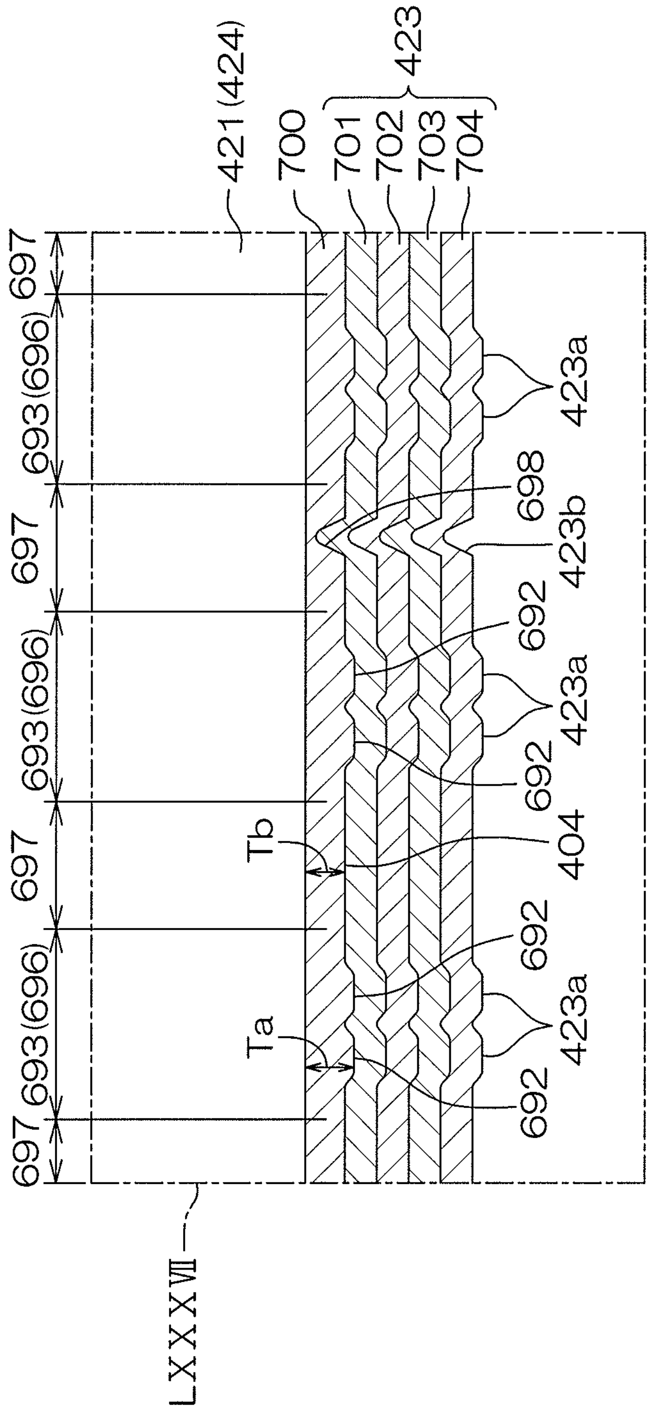

FIG. 87 is an enlarged view of a region LXXXVII shown in FIG. 86.

Figure 88:
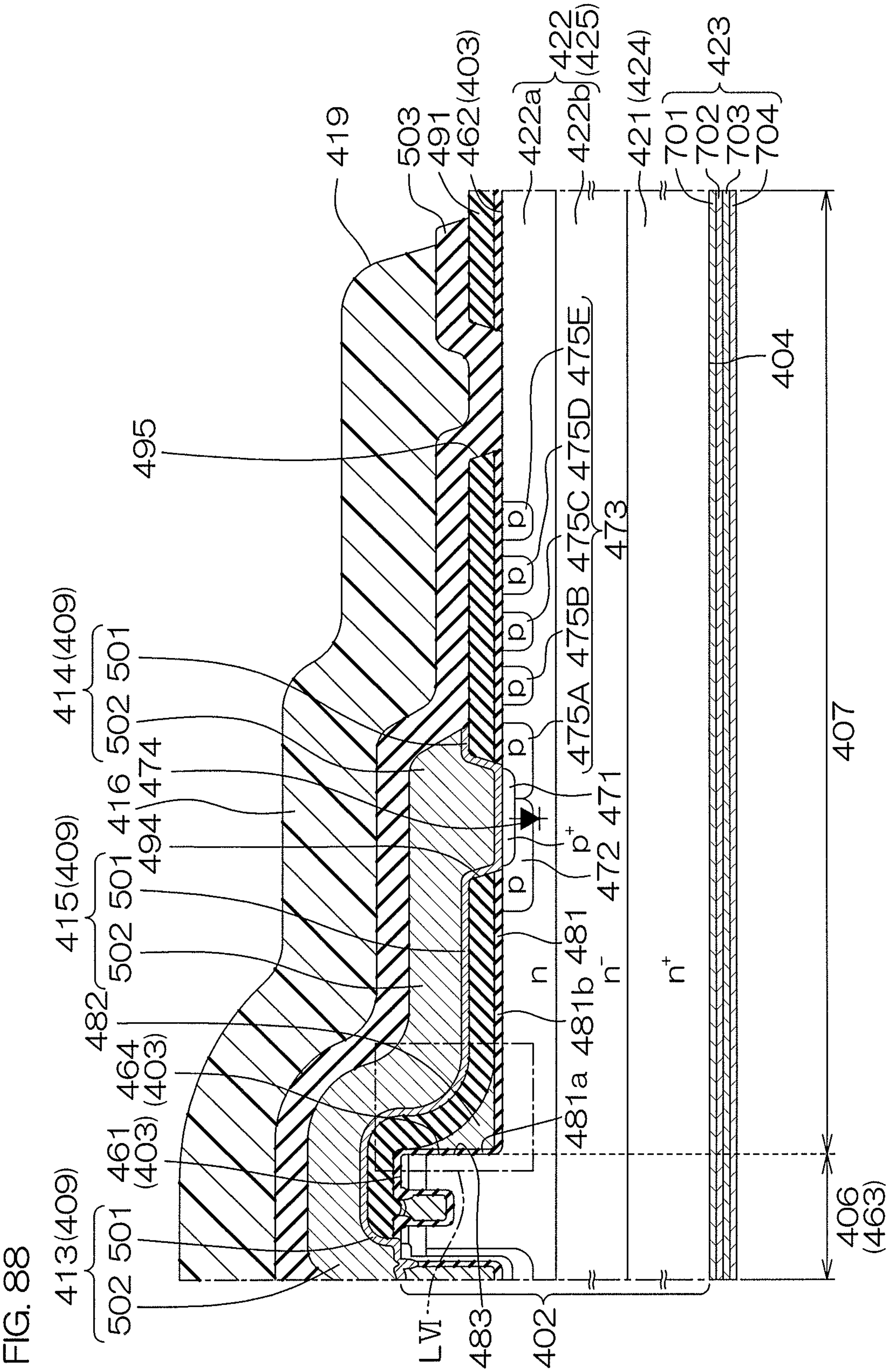

FIG. 88 is a sectional view of a region corresponding to FIG. 55 and is a sectional view of the semiconductor device shown in FIG. 83.

Figure 89:
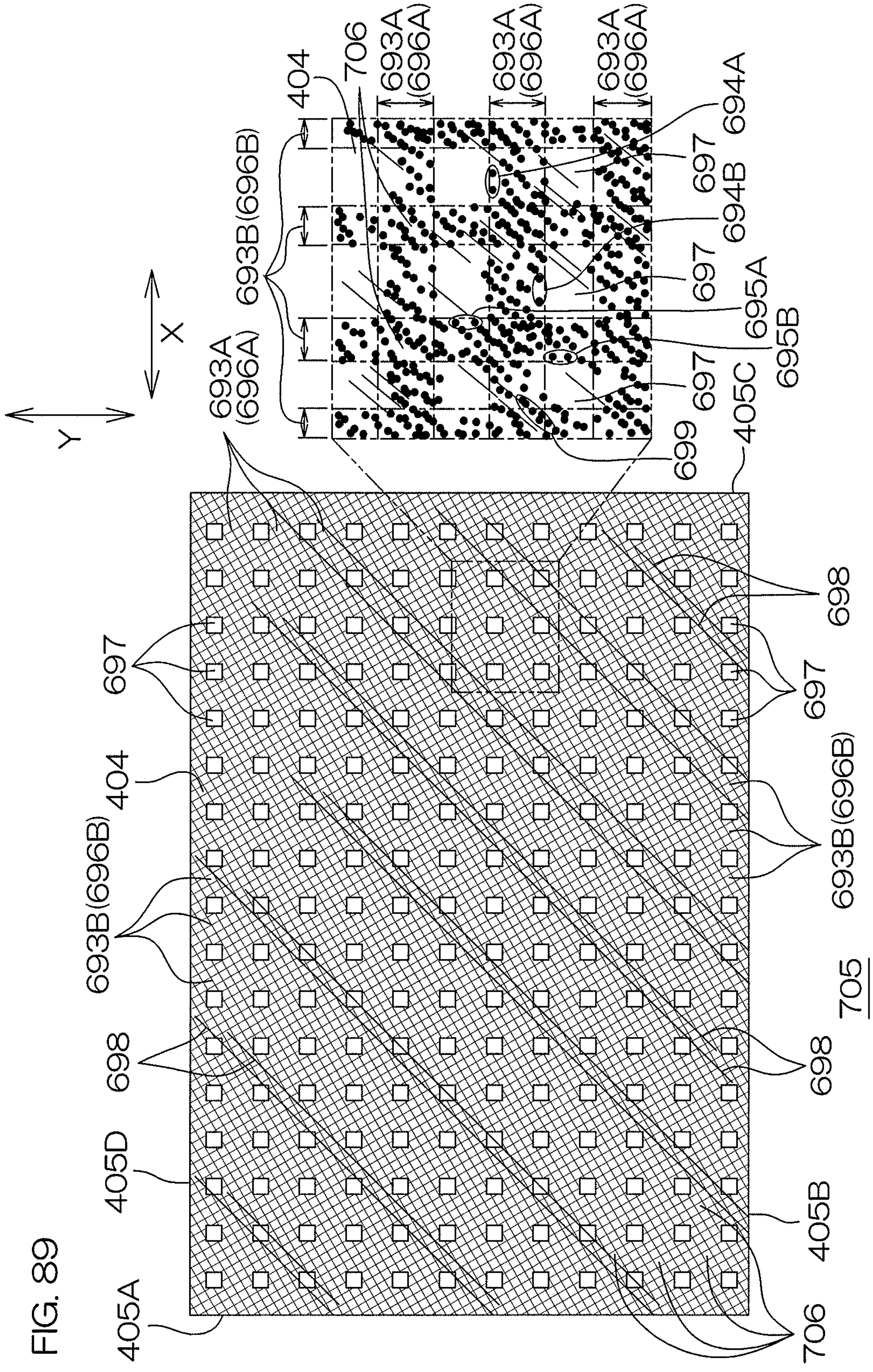

FIG. 89 is a bottom view corresponding to FIG. 83 and is a bottom view of a semiconductor device according to a thirty-second preferred embodiment of the present invention.

Figure 90:
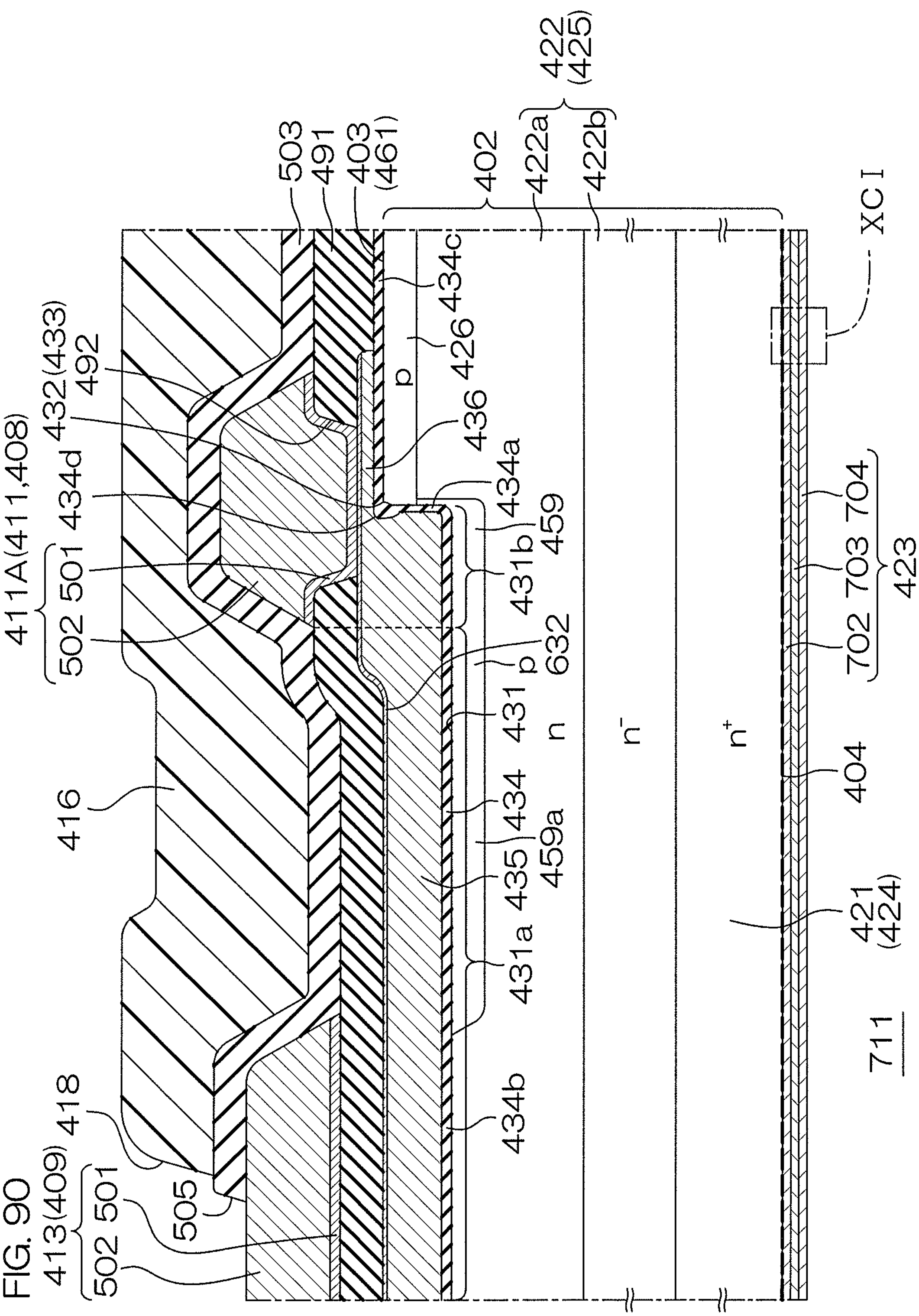

FIG. 90 is a sectional view corresponding to FIG. and is a sectional view of a semiconductor device according to a thirty-third preferred embodiment of the present invention.

Figure 91:
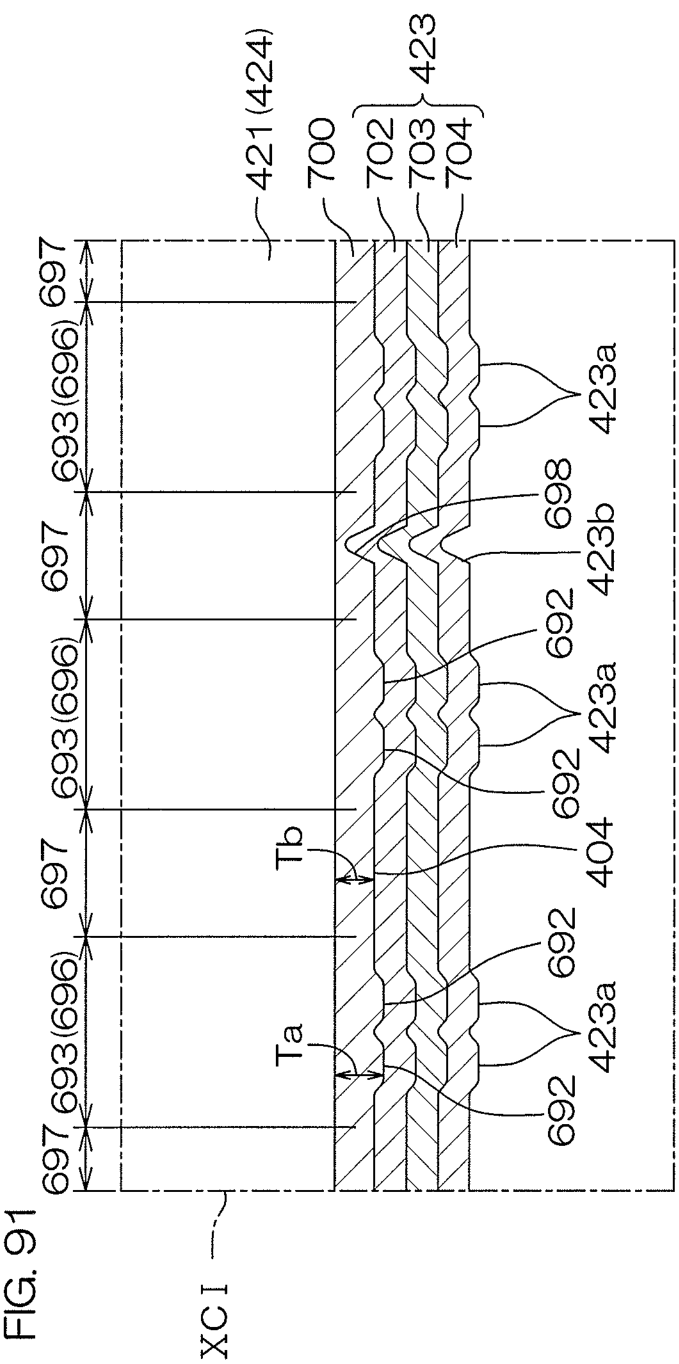

FIG. 91 is an enlarged view of a region XCI shown in FIG. 90.

Figure 92:
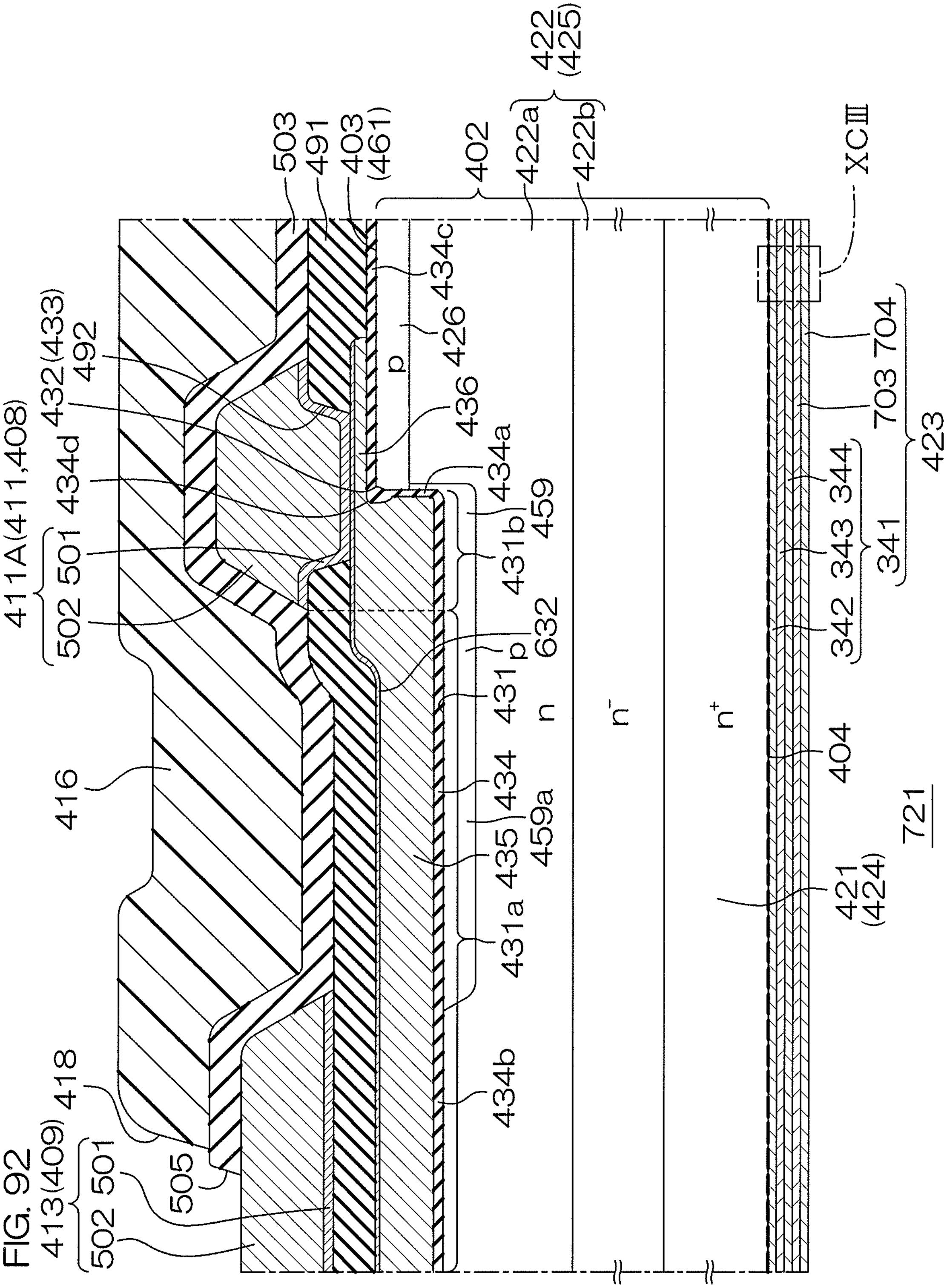

FIG. 92 is a sectional view corresponding to FIG. and is a sectional view of a semiconductor device according to a thirty-fourth preferred embodiment of the present invention.

Figure 93:
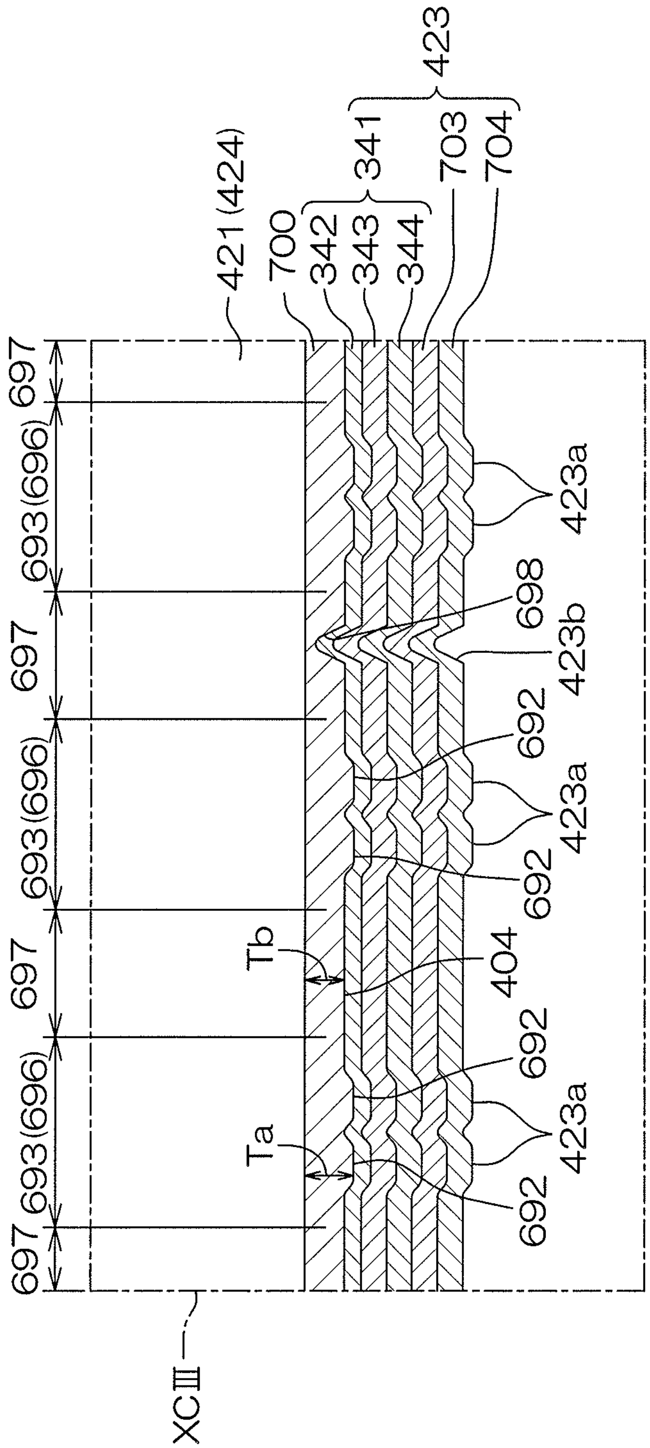

FIG. 93 is an enlarged view of a region XCIII shown in FIG. 92.

Figure 94:
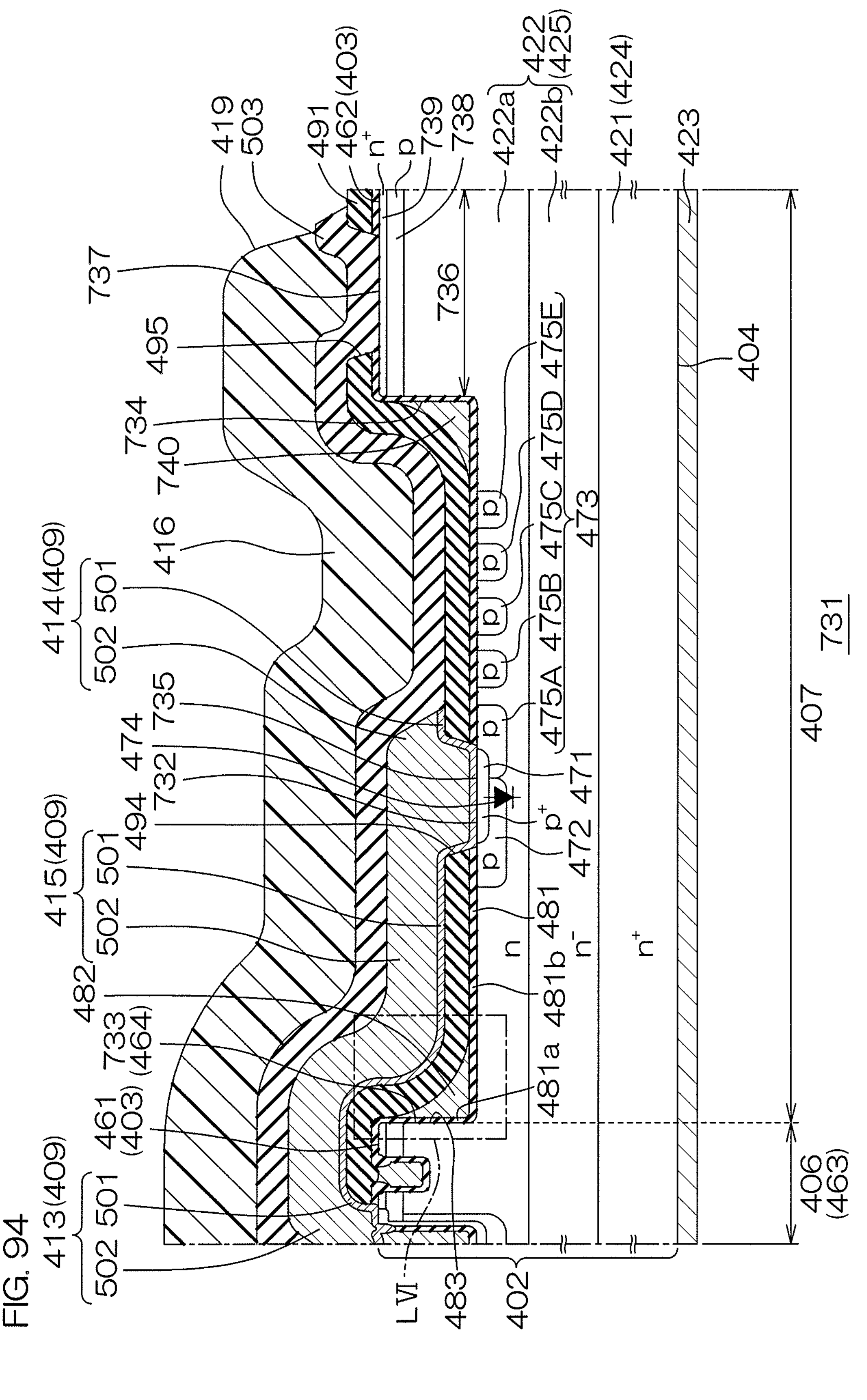

FIG. 94 is a sectional view of a region corresponding to FIG. 55 and is a sectional view of a semiconductor device according to a thirty-fifth preferred embodiment of the present invention.

Figure 95:
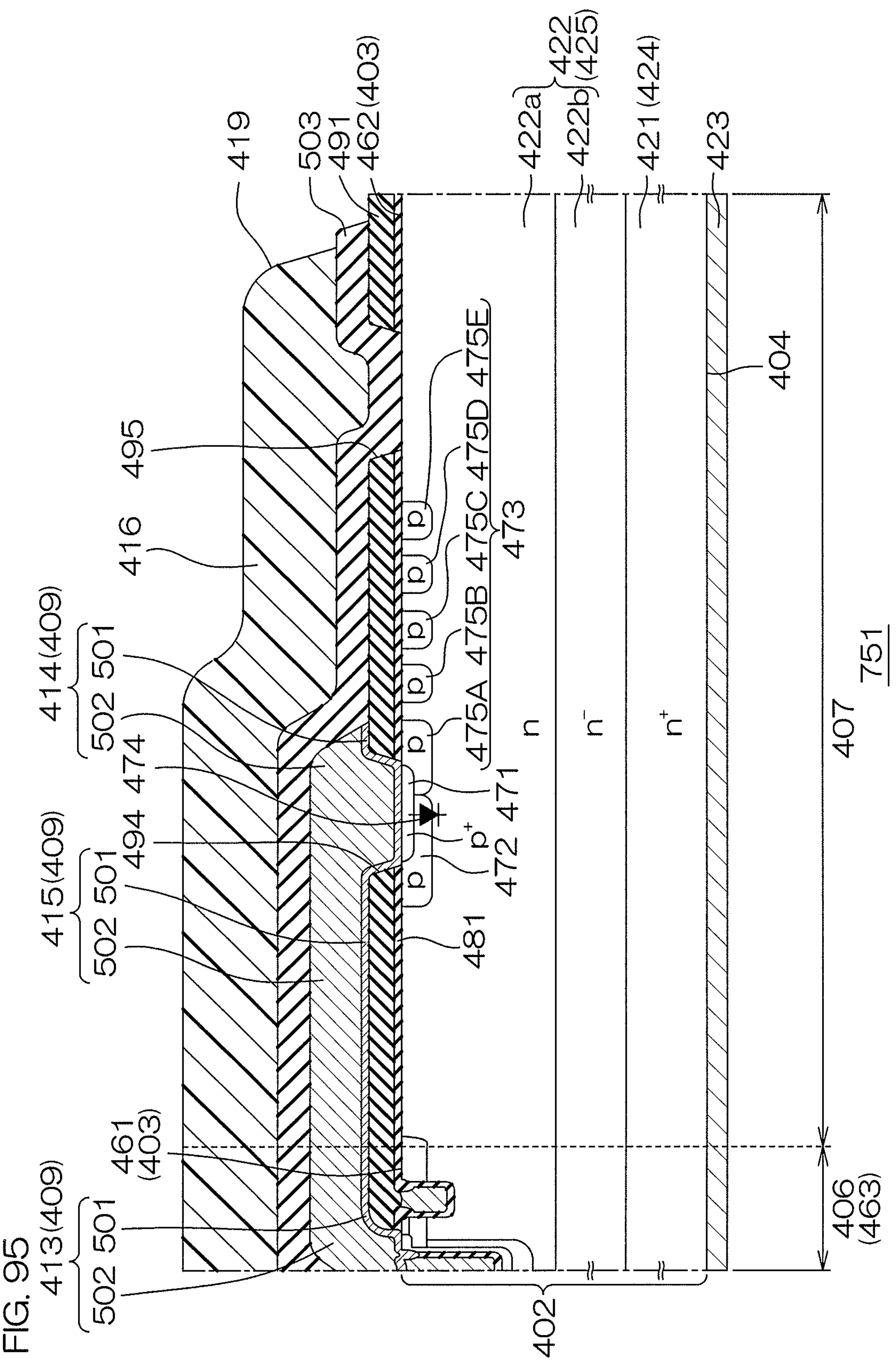

FIG. 95 is a sectional view of a region corresponding to FIG. 55 and is a sectional view of a semiconductor device according to a thirty-sixth preferred embodiment of the present invention.

Figure 96:
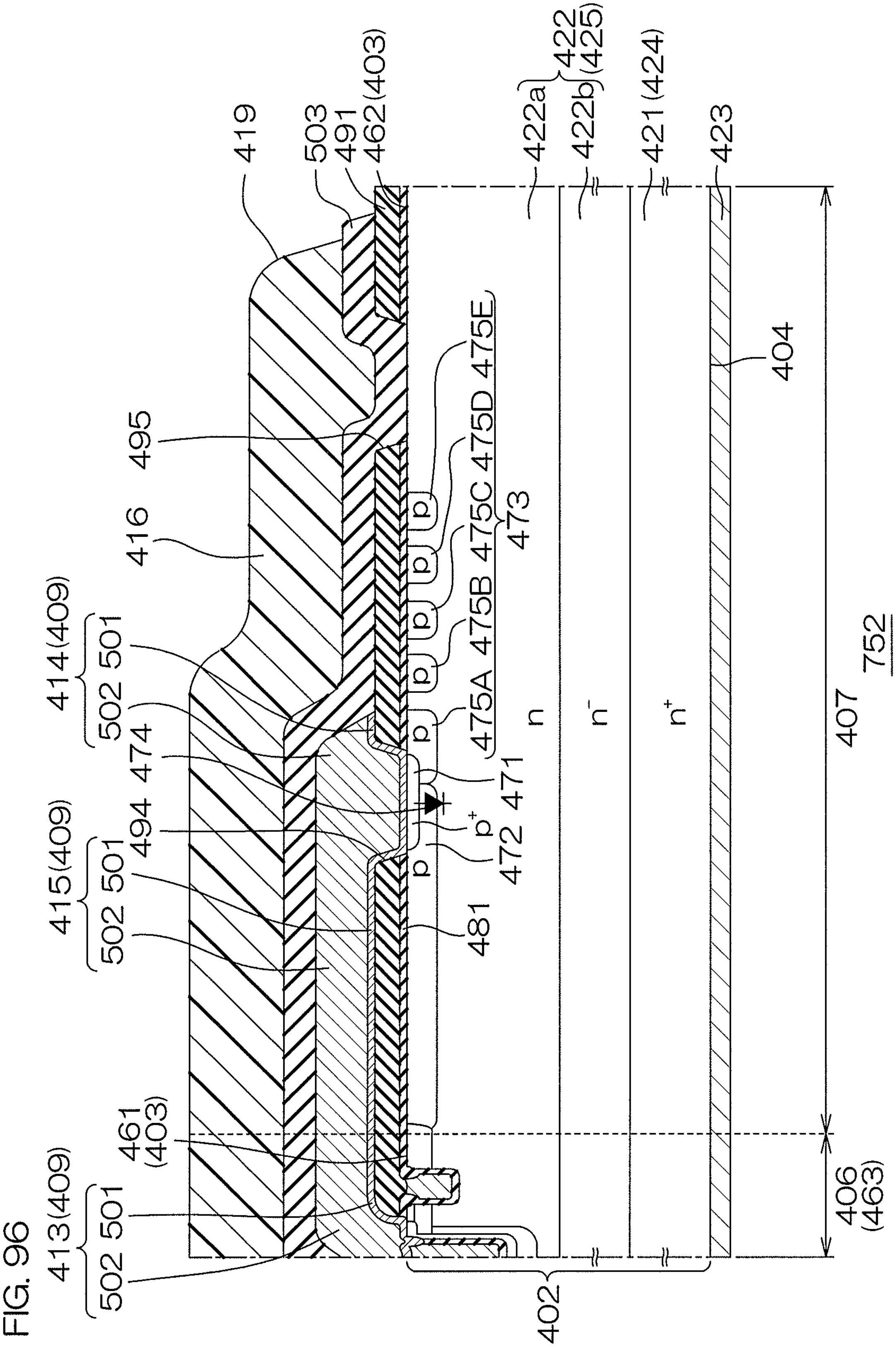

FIG. 96 is a sectional view of a region corresponding to FIG. 55 and is a sectional view of a semiconductor device according to a thirty-seventh preferred embodiment of the present invention.

Figure 97:
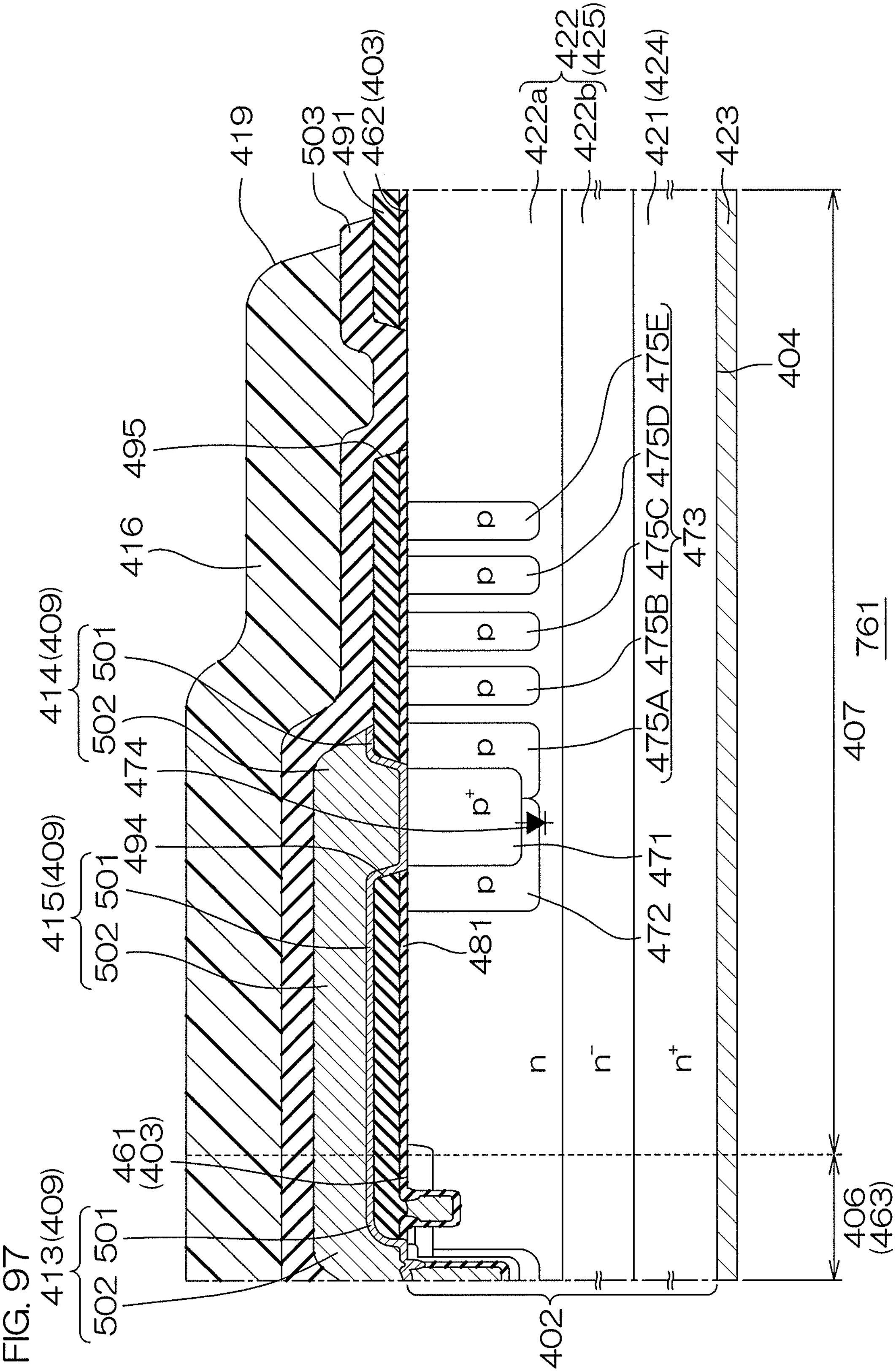

FIG. 97 is a sectional view of a region corresponding to FIG. 55 and is a sectional view of a semiconductor device according to a thirty-eighth preferred embodiment of the present invention.

Figure 98:
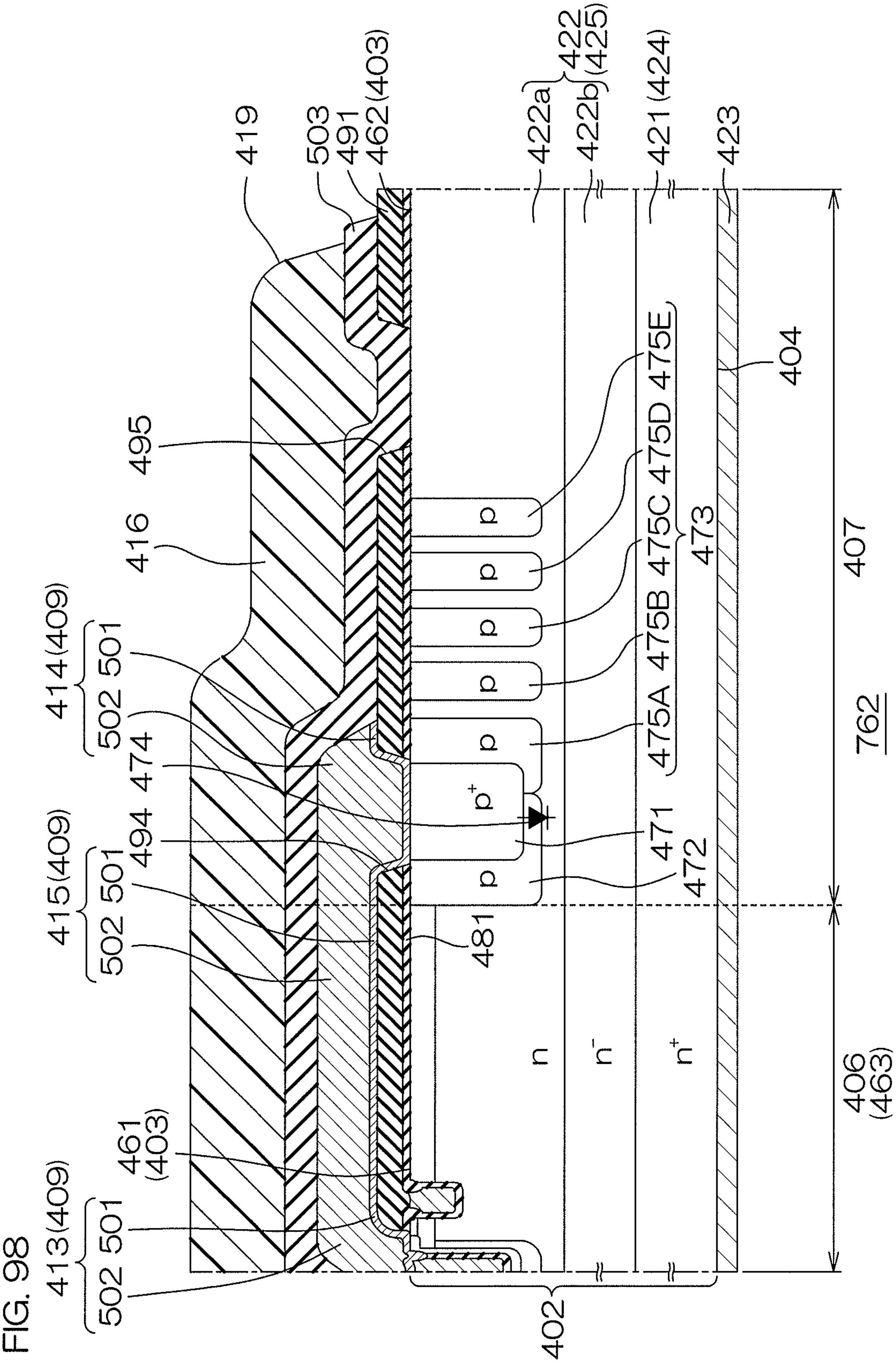

FIG. 98 is a sectional view of a region corresponding to FIG. 55 and is a sectional view of a semiconductor device according to a thirty-ninth preferred embodiment of the present invention.

Figure 99:
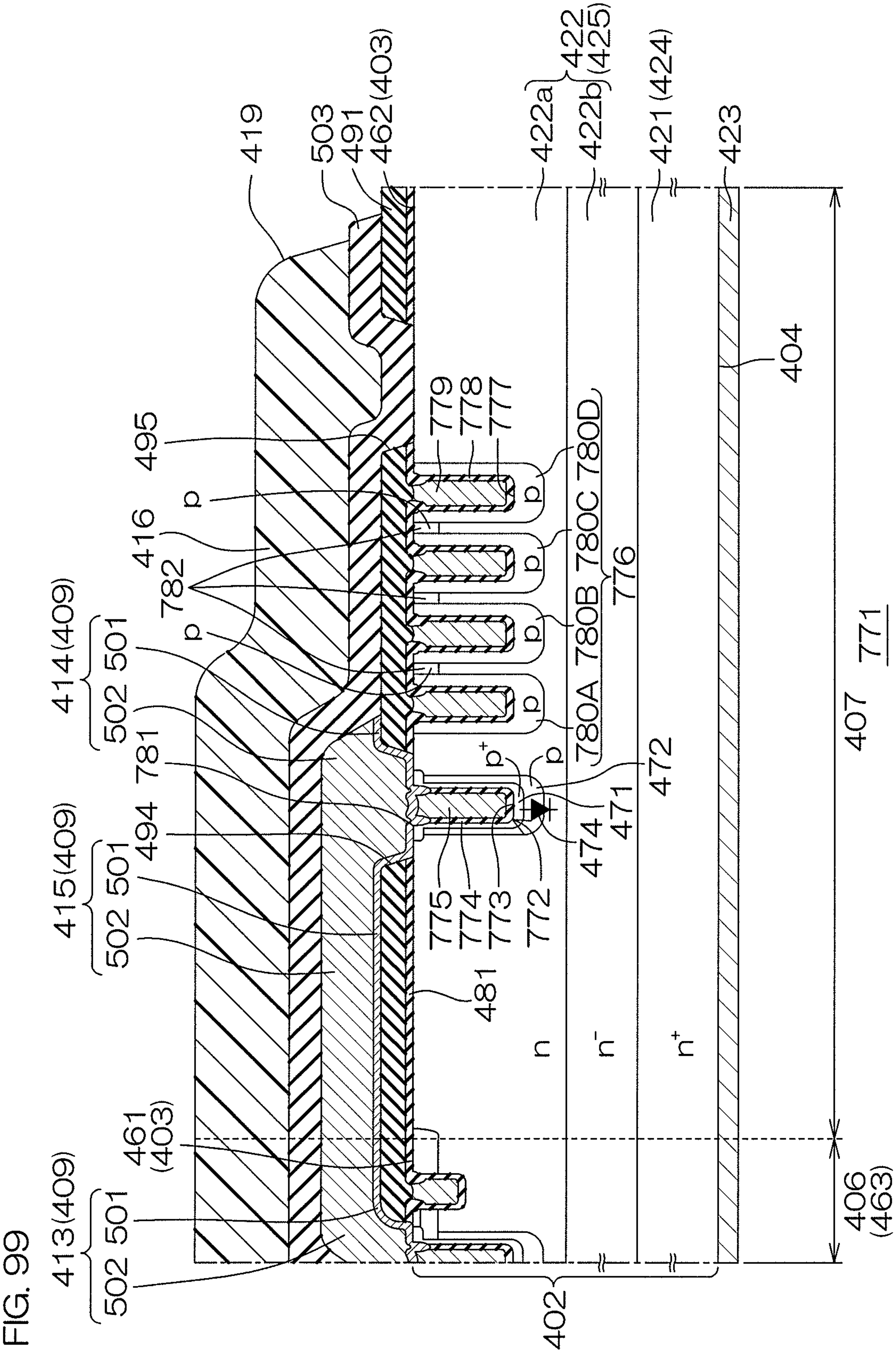

FIG. 99 is a sectional view of a region corresponding to FIG. 55 and is a sectional view of a semiconductor device according to a fortieth preferred embodiment of the present invention.

Figure 100:
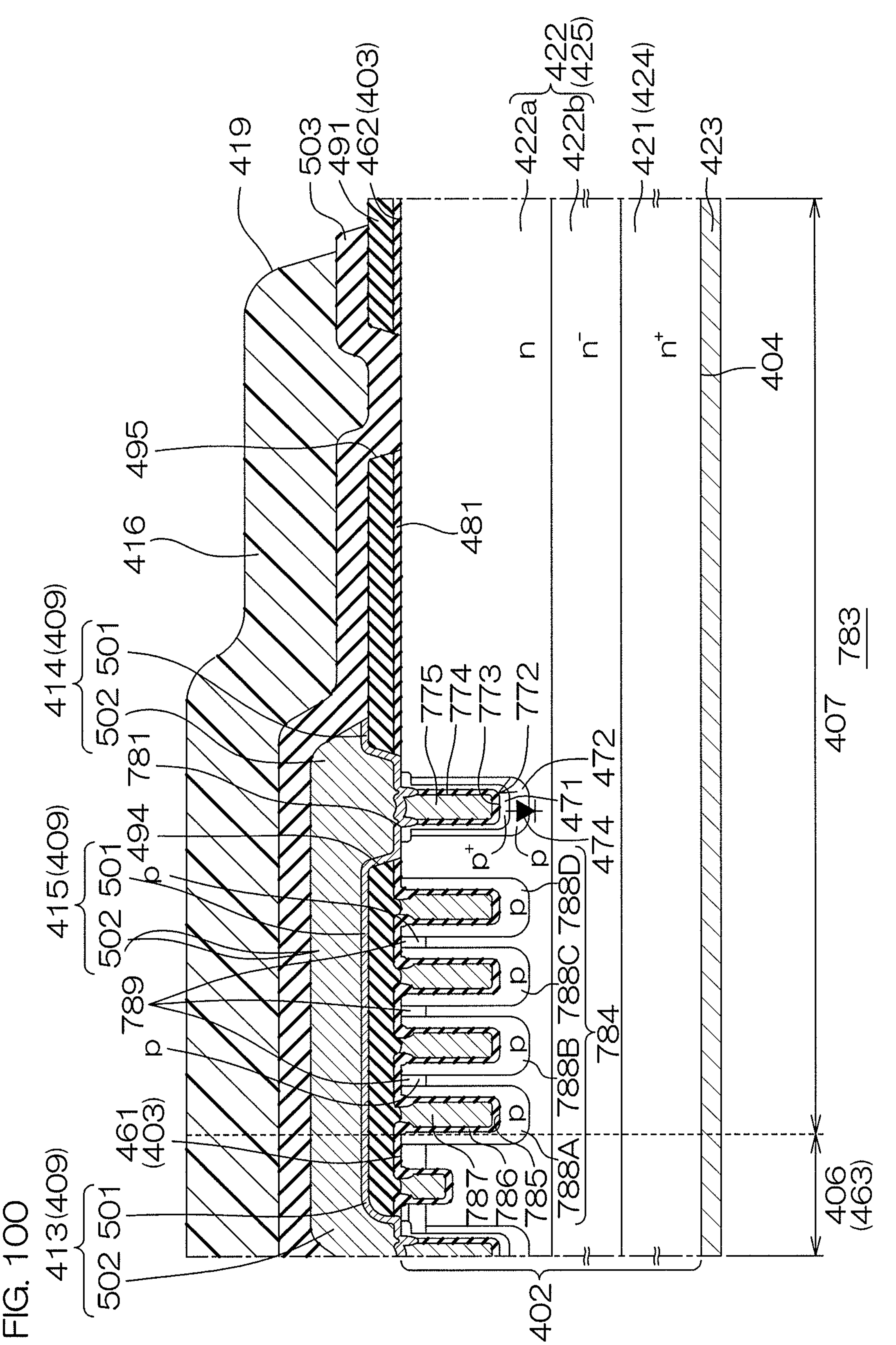

FIG. 100 is a sectional view of a region corresponding to FIG. 55 and is a sectional view of a semiconductor device according to a forty-first preferred embodiment of the present invention.

Figure 101:
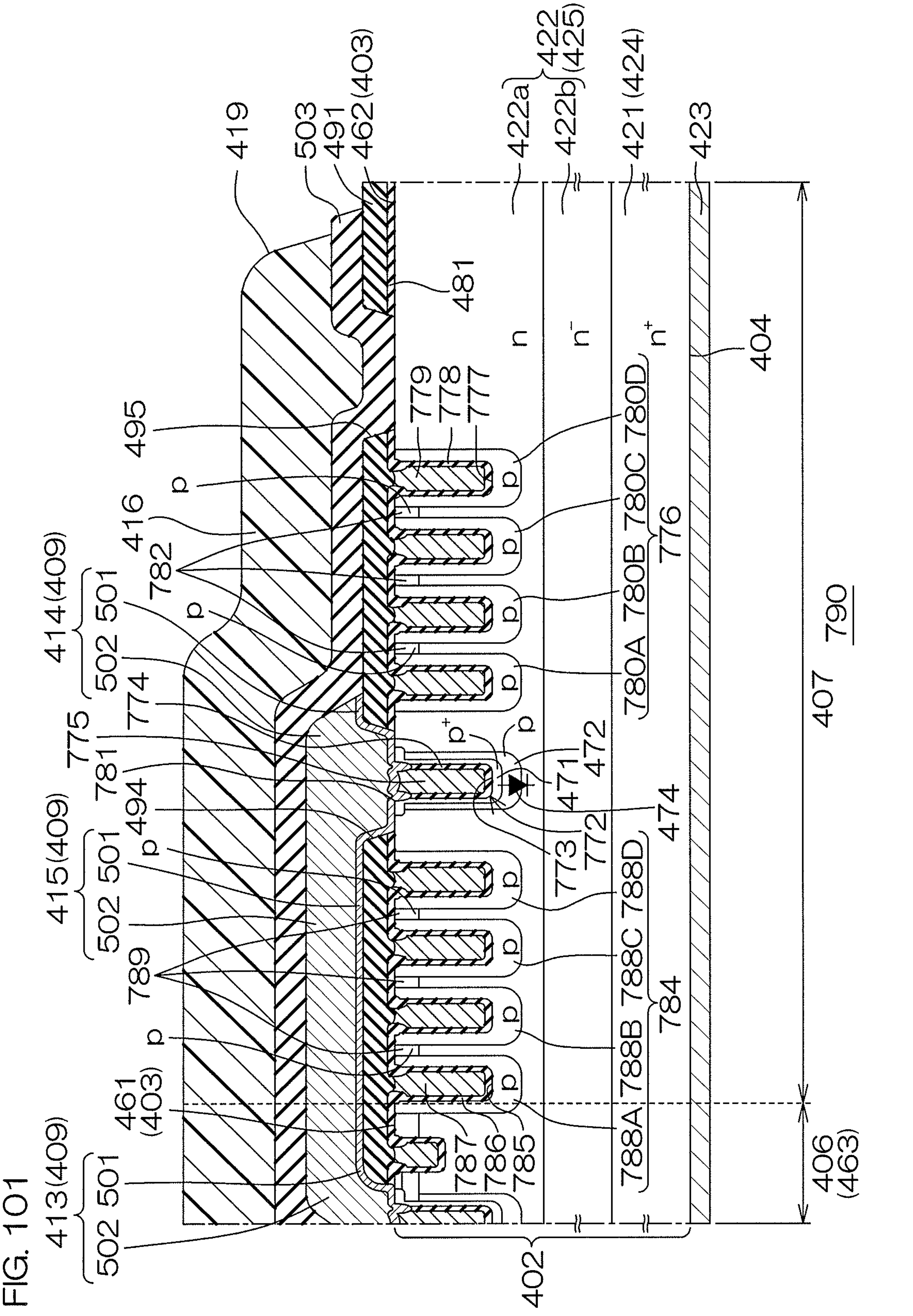

FIG. 101 is a sectional view of a region corresponding to FIG. 55 and is a sectional view of a semiconductor device according to a forty-second preferred embodiment of the present invention.

Figure 102:
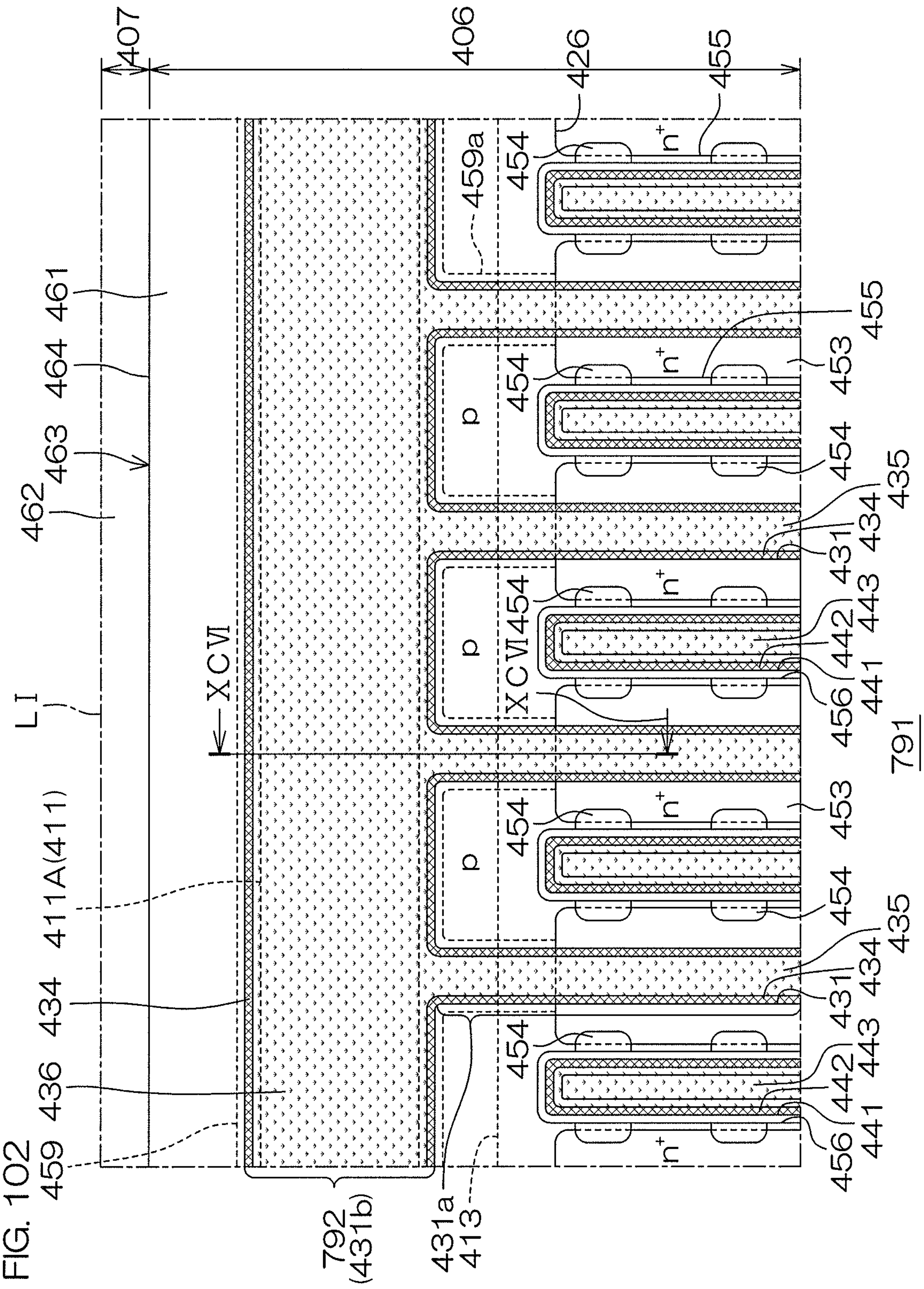

FIG. 102 is an enlarged view of a region corresponding to FIG. 51 and is an enlarged view of a semiconductor device according to a forty-third preferred embodiment of the present invention.

Figure 103:
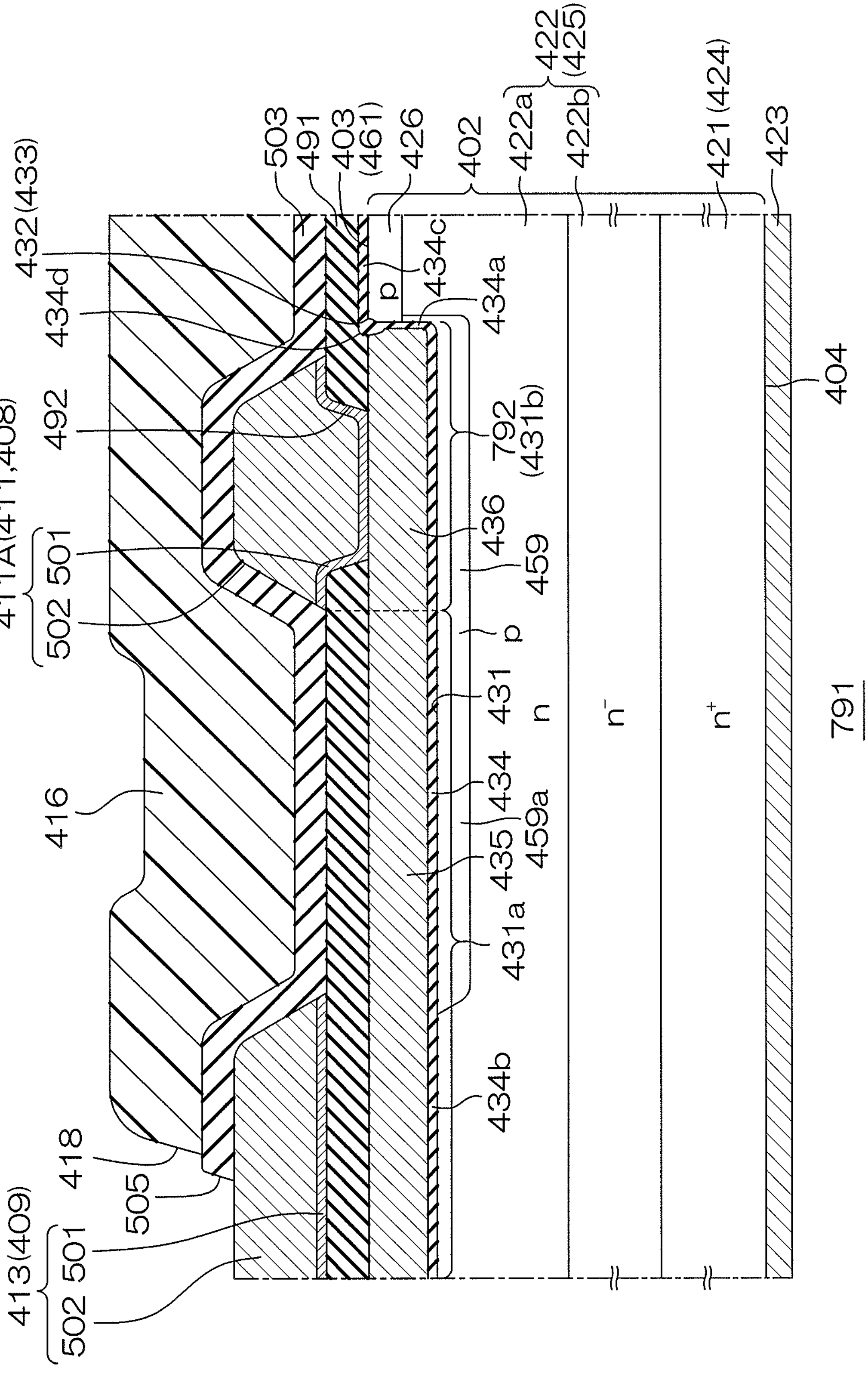

FIG. 103 is a sectional view taken along line CIII-CIII shown in FIG. 102.

Figure 104:
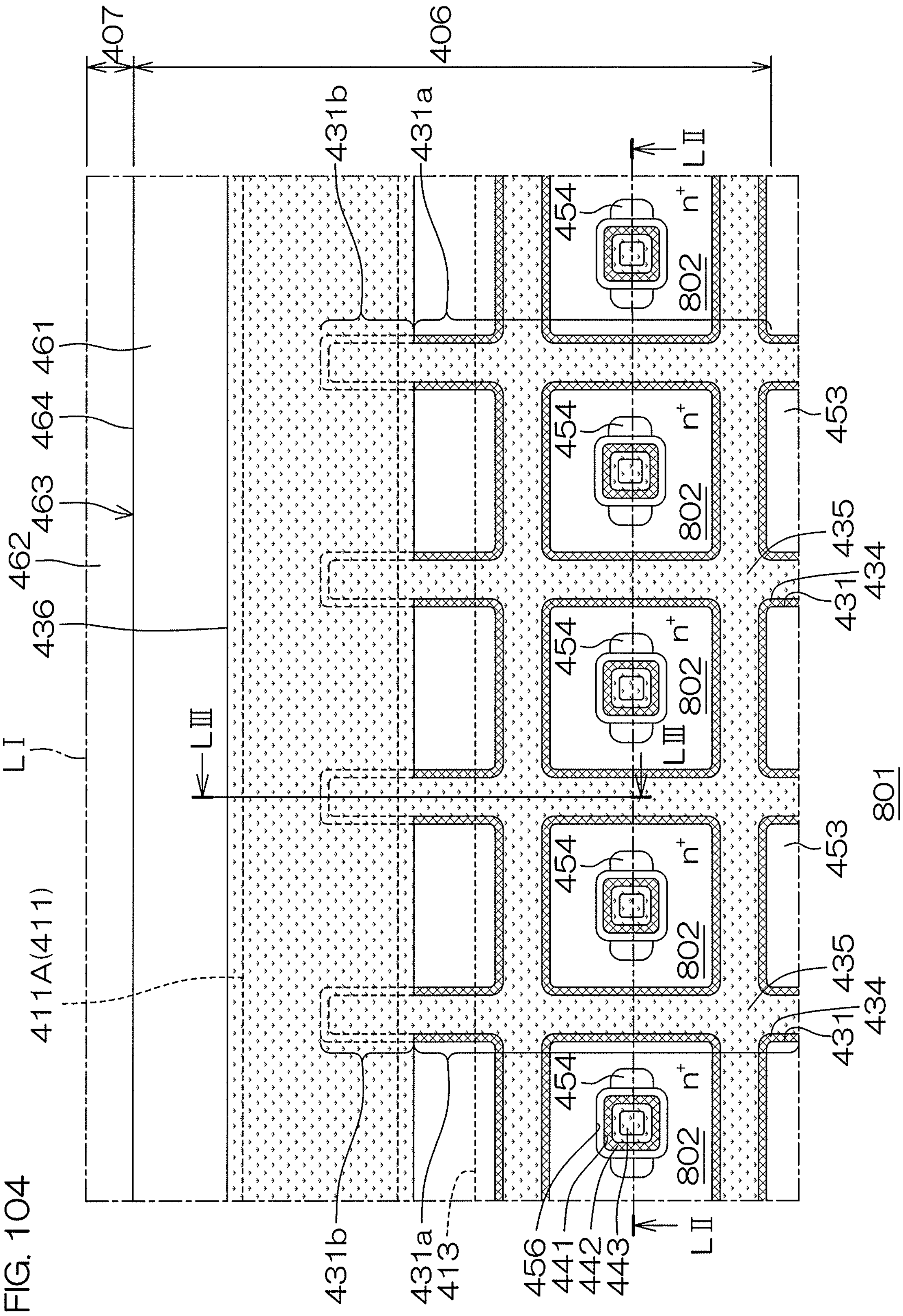

FIG. 104 is an enlarged view of a region corresponding to FIG. 51 and is an enlarged view of a semiconductor device according to a forty-fourth preferred embodiment of the present invention.

Figure 54:
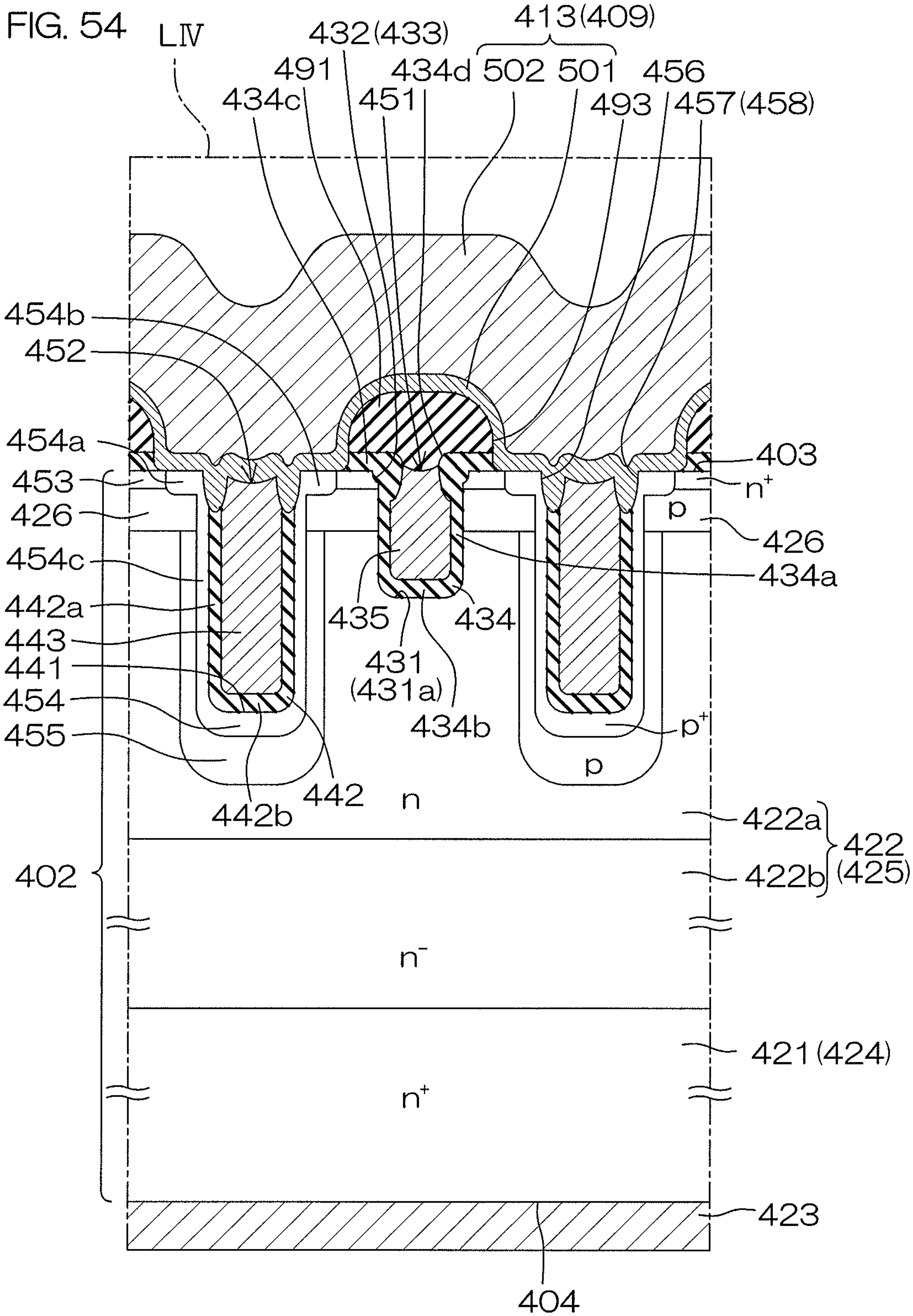
FIG. 54 is an enlarged view of a region LIV shown in FIG. 52.
Figure 105:
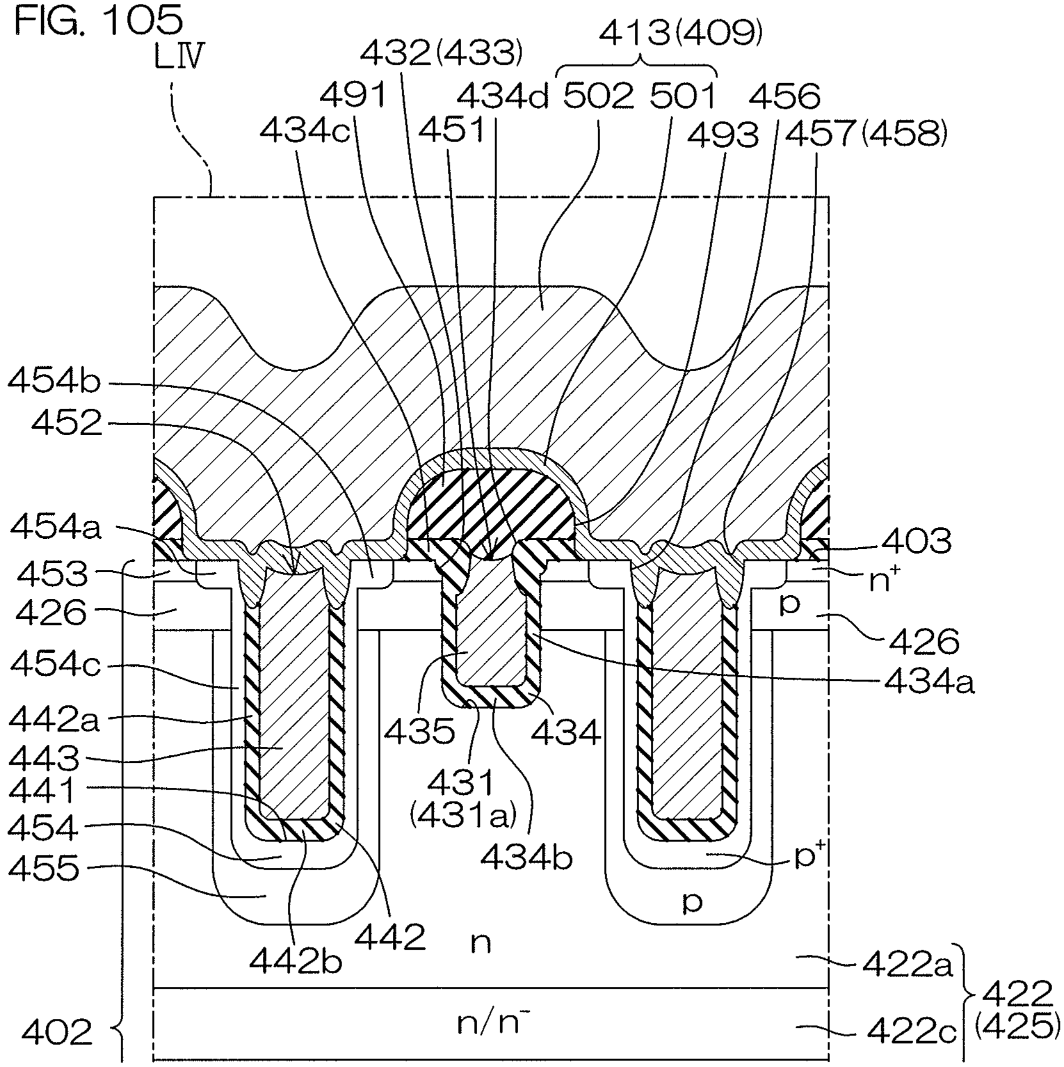

FIG. 105 is an enlarged view of a region corresponding to FIG. 54 and is an enlarged view of a semiconductor device according to a forty-fifth preferred embodiment of the present invention.

Figure 106:
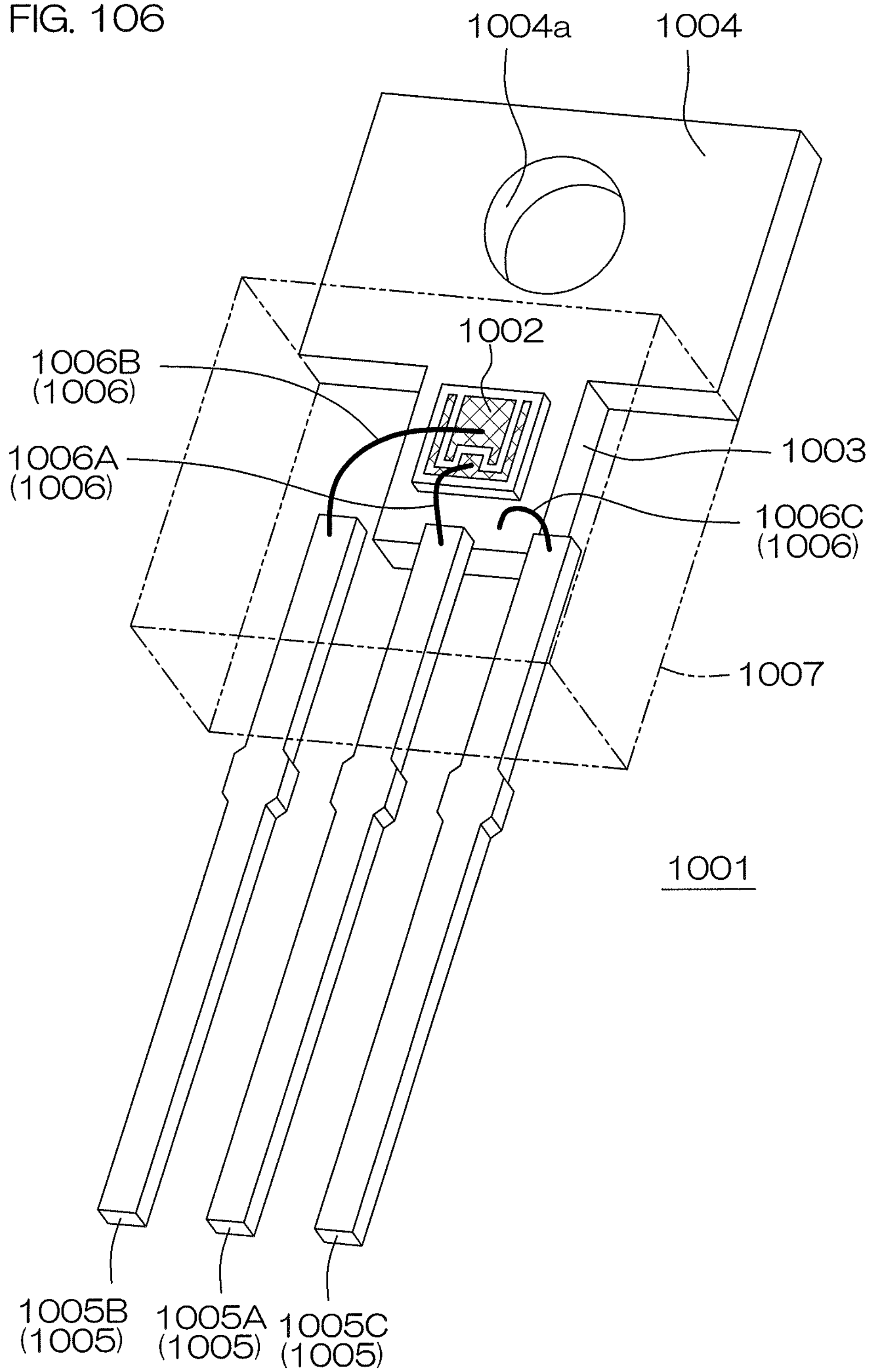

FIG. 106 is a perspective view, as seen through a sealing body, of a semiconductor package capable of incorporating any one of the semiconductor devices according to the first to forty-fifth preferred embodiments.

Figure 107:
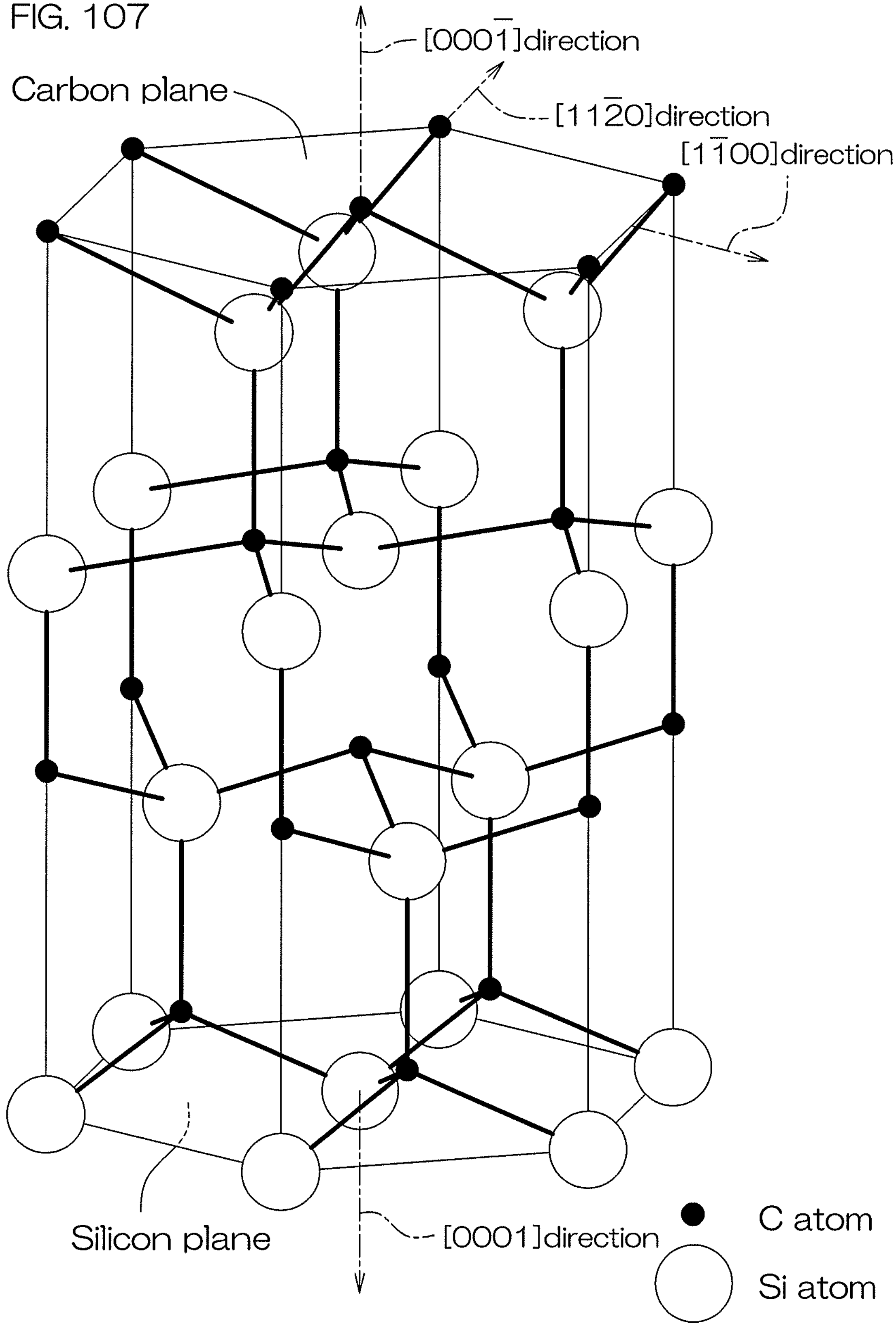

FIG. 107 is a diagram of a unit cell of a 4H—SiC monocrystal applied to the preferred embodiments of the present invention.

Figure 108:
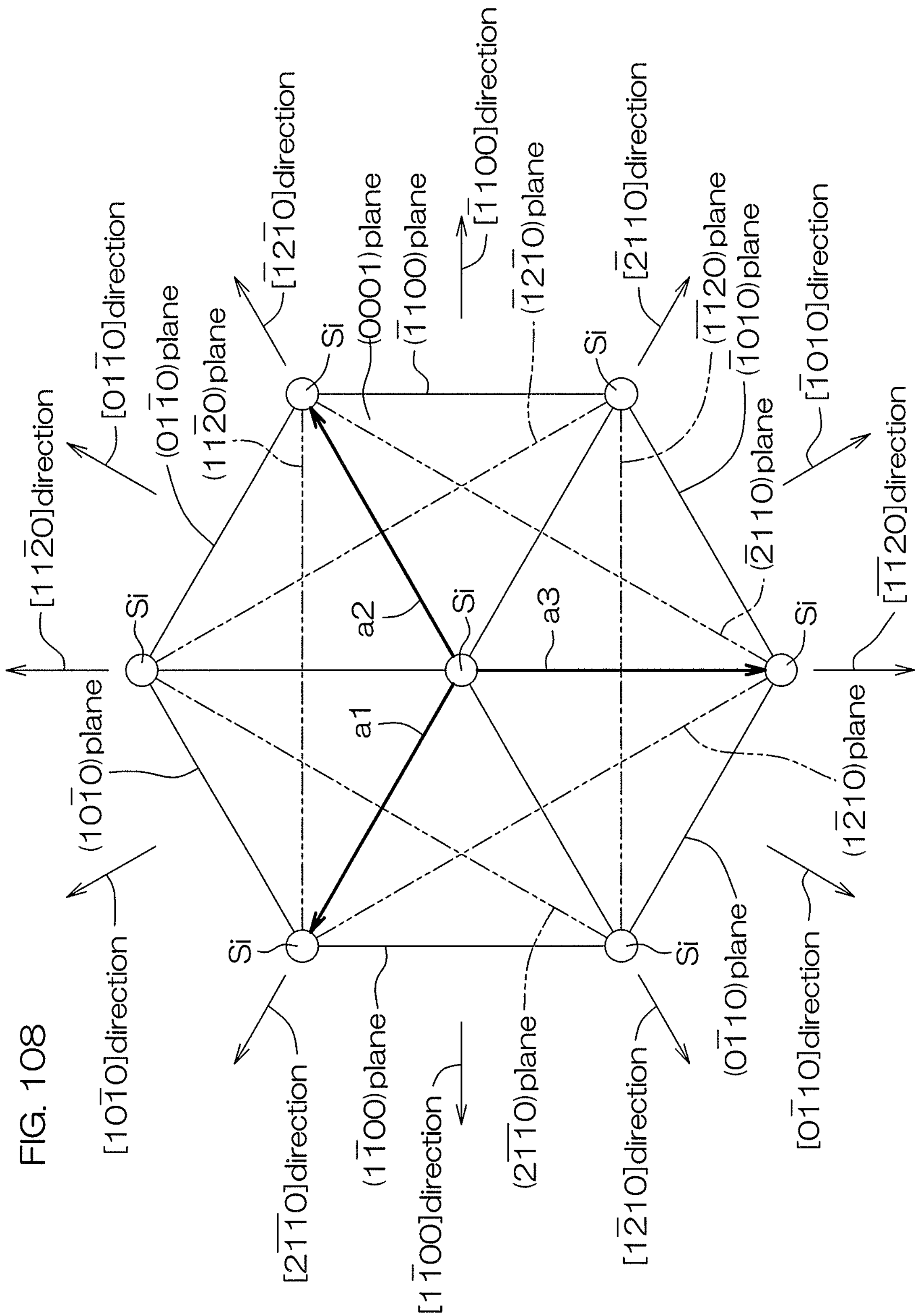

FIG. 108 is a plan view of a silicon plane of the unit cell of the 4H—SiC monocrystal shown in FIG. 107.

DESCRIPTION OF EMBODIMENTS

Figure 1:
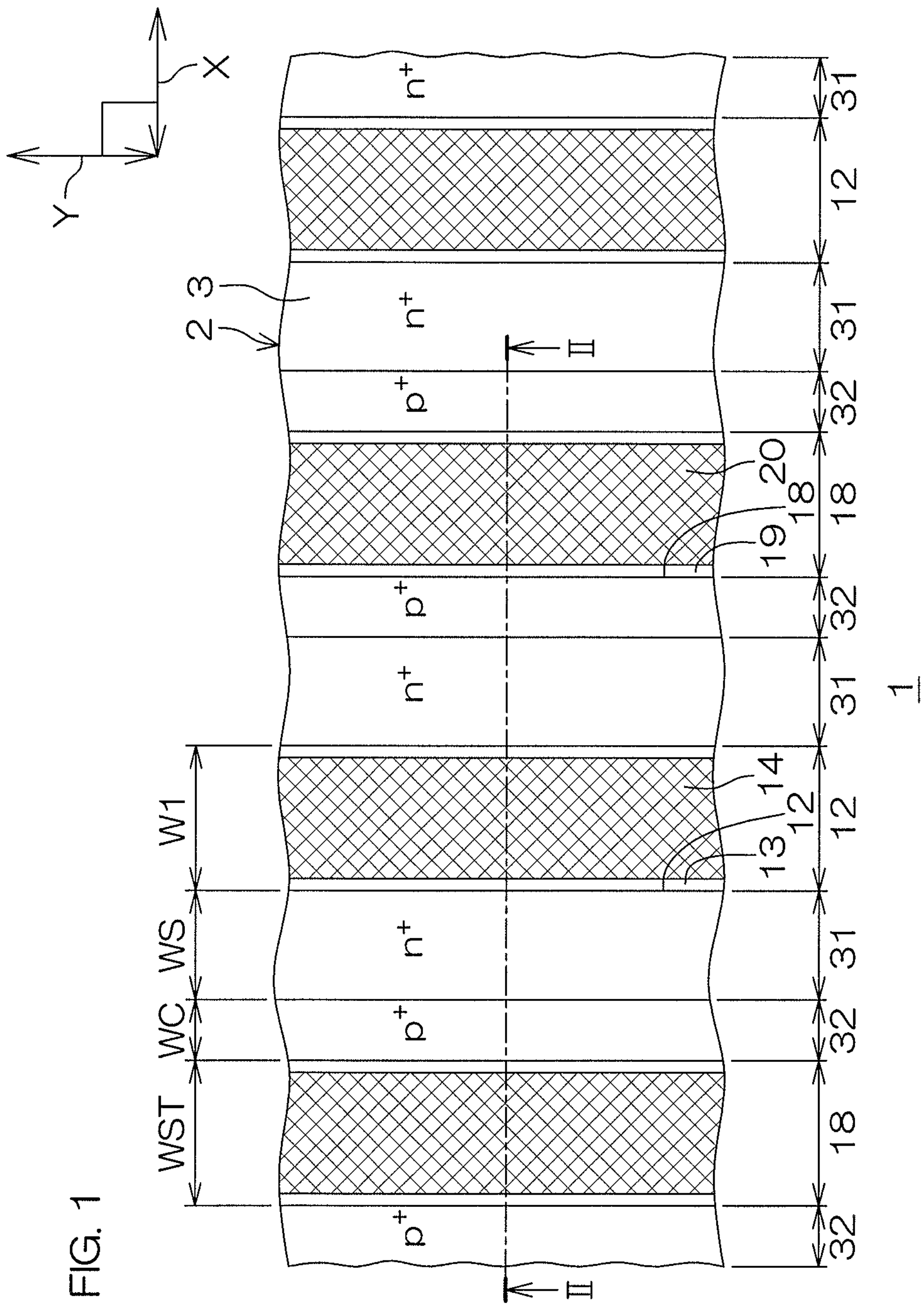
FIG. 1 is a plan view of a semiconductor device according to a first preferred embodiment of the present invention.
Figure 2:
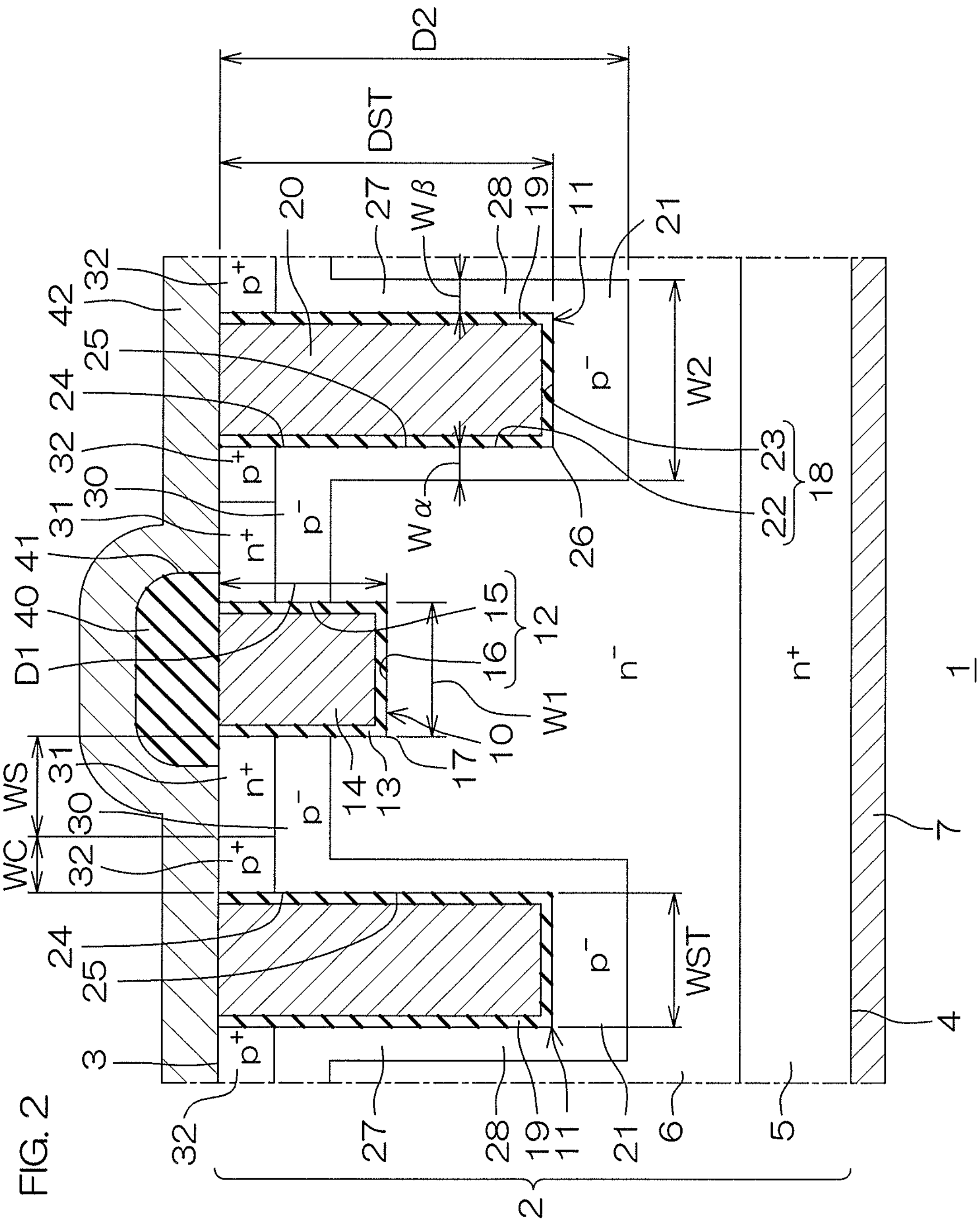
FIG. 2 is a sectional view taken along line II-II of FIG. 1.

FIG. 1 is a plan view of a semiconductor device 1 according to a first preferred embodiment of the present invention. FIG. 2 is a sectional view taken along line II-II of FIG. 1.

The semiconductor device 1 is a switching device that includes a vertical MISFET (Metal Insulator Semiconductor Field Effect Transistor). Referring to FIG. 1 and FIG. 2, the semiconductor device 1 has an n-type SiC semiconductor layer 2 that includes an SiC (silicon carbide) monocrystal.

The SiC semiconductor layer 2 includes a first main surface 3 at one side and a second main surface 4 at another side. The SiC semiconductor layer 2 has a laminated structure that includes an SiC semiconductor substrate 5 including an SiC monocrystal, and an n-type SiC epitaxial layer 6 including an SiC monocrystal, in this embodiment. The second main surface 4 of the SiC semiconductor layer 2 is formed by the SiC semiconductor substrate 5. The first main surface 3 of the SiC semiconductor layer 2 is formed by the SiC epitaxial layer 6.

A drain electrode 7 is connected to the second main surface 4 of the SiC semiconductor layer 2. The SiC semiconductor substrate 5 is formed as an $n^+$-type drain region. The SiC epitaxial layer 6 is formed as an n-type drain drift region.

An n-type impurity concentration of the SiC semiconductor substrate 5 may be not less than $1.0\times10^{18}$ cm$^{-3}$ and not more than $1.0\times10^{21}$ cm$^{-3}$. An n-type impurity concentration of the SiC epitaxial layer 6 may be not less than $1.0\times10^{15}$ cm$^{-3}$ and not more than $1.0\times10^{17}$ cm$^{-3}$. Hereinafter, in the present description, "impurity concentration" refers to a peak value of an impurity concentration.

Referring to FIG. 1 and FIG. 2, a plurality of trench gate structures 10 and a plurality of trench source structures 11 are formed in the first main surface 3 of the SiC semiconductor layer 2. The trench gate structures 10 and the trench source structures 11 are formed alternately at intervals from each other along an arbitrary first direction X.

The trench gate structures 10 and the trench source structures 11 are formed in band shapes extending along a second direction Y orthogonal to the first direction X. Preferably, the first direction X is a [11-20] direction and the second direction Y is a [1-100] direction.

A stripe structure including the plurality of trench gate structures 10 and the plurality of trench source structures 11 is formed in the first main surface 3 of the SiC semiconductor layer 2. In regard to the first direction X, a distance between the trench gate structure 10 and the trench source structure 11 may be not less than 0.3 μm and not more than 1.0 μm.

Each trench gate structure 10 includes a gate trench 12, a gate insulating layer 13, and a gate electrode layer 14. In FIG. 1, the gate electrode layer 14 is shown with hatching applied for clarity.

The gate trench 12 is formed by digging into the first main surface 3 of the SiC semiconductor layer 2 toward the second main surface 4 side. The gate trench 12 includes a first side wall 15 and a first bottom wall 16.

The gate insulating layer 13 is formed in a film shape along the first side wall 15, the first bottom wall 16, and a corner portion 17 connecting the first side wall 15 and the first bottom wall 16 in the gate trench 12. The gate insulating layer 13 defines a recessed space inside the gate trench 12.

The gate insulating layer 13 may include silicon oxide. The gate insulating layer 13 may include at least one of material among undoped silicon, silicon nitride, aluminum oxide, aluminum nitride, or aluminum oxynitride, besides silicon oxide.

The gate electrode layer 14 is embedded in the gate trench 12 across the gate insulating layer 13. More specifically, the gate electrode layer 14 is embedded in the recessed space defined by the gate insulating layer 13.

The gate electrode layer 14 may include a conductive polysilicon. The gate electrode layer 14 may include at least one of material among titanium, nickel, copper, aluminum, silver, gold, titanium nitride, or tungsten, besides the conductive polysilicon.

Each trench source structure 11 includes a source trench 18, a barrier forming layer 19, a source electrode layer 20, and a p-type deep well region 21. In FIG. 1, the source electrode layer 20 is shown with hatching applied for clarity. The deep well region 21 is also referred to as a withstand voltage holding region.

The source trench 18 is formed by digging into the first main surface 3 of the SiC semiconductor layer 2 toward the second main surface 4 side. The source trench 18 includes a second side wall 22 and a second bottom wall 23.

The second side wall 22 of the source trench 18 includes a first wall portion 24 and a second wall portion 25. The first wall portion 24 of the source trench 18 is positioned at the first main surface 3 side of the SiC semiconductor layer 2 with respect to the first bottom wall 16 of the gate trench 12. That is, the first wall portion 24 is a portion that overlaps with the gate trench 12 in a lateral direction parallel to the first main surface 3 of the SiC semiconductor layer 2.

The second wall portion 25 of the source trench 18 is positioned at the second main surface 4 side of the SiC semiconductor layer 2 with respect to the second bottom wall 23 of the gate trench 12. That is, the second wall portion 25 is a portion of the source trench 18 that is positioned in a region at the second main surface 4 side of the SiC semiconductor layer 2 with respect to the second bottom wall 23 of the gate trench 12.

In regard to a thickness direction of the SiC semiconductor layer 2, a length of the second wall portion 25 of the source trench 18 is greater than a length of the first wall portion 24 of the source trench 18. In regard to the thickness direction of the SiC semiconductor layer 2, the second bottom wall 23 of the source trench 18 is positioned in a region between the first bottom wall 16 of the gate trench 12 and the second main surface 4 of the SiC semiconductor layer 2.

The second bottom wall 23 of the source trench is positioned in the SiC epitaxial layer 6, in this embodiment. The second bottom wall 23 of the source trench 18 may be positioned in the SiC semiconductor substrate 5.

The barrier forming layer 19 is formed in a film shape along the second side wall 22, the second bottom wall 23, and a corner portion 26 connecting the second side wall 22 and the second bottom wall 23 in the source trench 18. The barrier forming layer 19 defines a recessed space inside the source trench 18.

The barrier forming layer 19 is made of a material differing from a conductive material of the source electrode layer 20. The barrier forming layer 19 has a higher potential barrier than a potential barrier between the source electrode layer 20 and the deep well region 21.

A conductive barrier forming layer may be adopted as the barrier forming layer 19. The conductive barrier forming layer may include at least one of material among a conductive polysilicon, tungsten, platinum, nickel, cobalt, or molybdenum.

An insulating barrier forming layer may be adopted as the barrier forming layer 19. The insulating barrier forming layer may include at least one of material among undoped silicon, silicon oxide, silicon nitride, aluminum oxide, aluminum nitride, or aluminum oxynitride. An example where an insulating barrier forming layer is formed as the barrier forming layer 19 is shown in FIG. 2.

The barrier forming layer 19 includes silicon oxide, more specifically. The barrier forming layer 19 and the gate insulating layer 13 are preferably made of the same material. In this case, a thickness of the barrier forming layer 19 and a thickness of the gate insulating layer 13 are preferably the same. In a case in which the barrier forming layer 19 and the gate insulating layer 13 are made of silicon oxide, the barrier forming layer 19 and the gate insulating layer 13 can be formed at the same time by a thermal oxidation treatment method.

The source electrode layer 20 is embedded in the recessed space of the source trench 18 across the barrier forming layer 19. The source electrode layer 20 may include a conductive polysilicon. The source electrode layer 20 may be of an n-type polysilicon, doped with an n-type impurity, or a p-type polysilicon, doped with a p-type impurity.

The source electrode layer 20 may include at least one of material among titanium, nickel, copper, aluminum, silver, gold, titanium nitride, or tungsten, besides a conductive polysilicon.

The source electrode layer 20 may be made of the same conductive material as the gate electrode layer 14. In this case, the gate electrode layer 14 and the source electrode layer 20 can be formed at the same time. Obviously, the source electrode layer 20 may be made of a conductive material differing from the gate electrode layer 14.

The deep well region 21 is formed in a region of the SiC semiconductor layer 2 along the source trench 18. A p-type impurity concentration of the deep well region 21 may be not less than $1.0\times10^{17}$ $cm^{-3}$ and not more than $1.0\times10^{19}$ $cm^{-3}$.

Each deep well region 21 is formed in regions of the SiC semiconductor layer 2 along the second side wall 22 of the source trench 18. The deep well region 21 is formed in a region of the SiC semiconductor layer 2 along the second bottom wall 23 of the source trench 18.

Each deep well region 21 is formed continuously in a region of the SiC semiconductor layer 2 along the second side wall 22, the corner portion 26, and the second bottom wall 23 of the source trench 18, in this embodiment. The deep well region 21 includes a first region 27 and a second region 28 at portions along the second side wall 22 of the source trench 18.

The first region 27 of the deep well region 21 is formed along the first wall portion 24 of the second side wall 22 of the source trench 18. The second region 28 of the deep well region 21 is formed along the second wall portion 25 of the second side wall 22 of the source trench 18. In regard to the thickness direction of the SiC semiconductor layer 2, a length of the second region 28 of the deep well region 21 is greater than a length of the first region 27 of the deep well region 21.

A thickness of a portion of the deep well region 21 along the second bottom wall 23 of the source trench 18 may be not less than a thickness of the portions of the deep well region 21 along the second side wall 22 of the source trench 18.

A portion of the deep well region 21 along the second bottom wall 23 of the source trench 18 may cross a boundary region between the SiC semiconductor substrate 5 and the SiC epitaxial layer 6 and be positioned inside the SiC semiconductor substrate 5.

At portions of the SiC semiconductor layer 2 along the second bottom walls 23 of the source trenches 18, the p-type impurity is implanted along a direction normal to the first main surface 3 of the SiC semiconductor layer 2. On the other hand, at portions of the SiC semiconductor layer 2 along the second side wall 22 of the source trenches 18, the p-type impurity is implanted in an inclining state with respect to the first main surface 3 of the SiC semiconductor layer 2.

Therefore, at the portions of the SiC semiconductor layer 2 along the second bottom walls 23 of the source trenches 18, the p-type impurity is implanted to deeper positions than at the portions along the second side walls 22 of the source trenches 18. Consequently, in each deep well region 21, a difference in thickness arises between the portion along the second bottom wall 23 of the source trench 18 and the portions along the second side wall 22 of the source trench 18.

A p-type body region 30 is formed in a surface layer portion of the first main surface 3 of the SiC semiconductor layer 2. The body region 30 is formed in regions between the gate trenches 12 and the source trenches 18. The body region 30 is formed in a band shape extending along the second direction Y in plan view.

The body region 30 is exposed from the first side wall 15 of the gate trenches 12 and the second side wall 22 of the source trenches 18. The body region 30 is continuous to the first region 27 of the deep well regions 21.

A p-type impurity concentration of the body region 30 may be not less than $1.0\times10^{16}$ $cm^{-3}$ and not more than $1.0\times10^{19}$ $cm^{-3}$. The p-type impurity concentration of the body region 30 may be substantially equal to the p-type impurity concentration of the deep well regions 21. The p-type impurity concentration of the body region 30 may be higher than the p-type impurity concentration of the deep well regions 21.

$n^+$-type source regions 31 are formed in a surface layer portion of the body region 30. The source regions 31 are formed in regions of the surface layer portion of the body region 30 along the first side wall 15 of the gate trenches 12. The source regions 31 are exposed from the first side wall 15 of the gate trenches 12.

The source regions 31 may be formed in band shapes extending along the second direction Y in plan view. Although unillustrated, each source region 31 may include a portion exposed from a second side wall 22 of a source trench 18.

A width WS of each source region 31 may be not less than 0.2 μm and not more than 0.6 μm (for example, approximately 0.4 μm). The width WS is a width of the source region 31 along the first direction X, in this embodiment. An n-type impurity concentration of the source region 31 may be not less than $1.0\times10^{18}$ $cm^{-3}$ and not more than $1.0\times10^{21}$ $cm^{-3}$.

A plurality of $p^+$-type contact regions 32 is formed in the surface layer portion of the body region 30. The contact regions 32 are formed in regions of the surface layer portion of the body region 30 along the second side wall 22 of the source trenches 18. The contact regions 32 are exposed from the second side wall 22 of the source trenches 18.

The contact regions 32 may be connected to the source regions 31. The contact regions 32 may be formed in band shapes extending along the second direction Y in plan view. The contact region 32 may include a portion exposed from the first side wall 15 of the adjacent gate trench 12.

A width WC of the contact region 32 may be not less than 0.1 μm and not more than 0.4 μm (for example, approximately 0.2 μm). The width WC is a width of the contact region 32 along the first direction X, in this embodiment. A p-type impurity concentration of the contact region 32 may be not less than $1.0\times10^{18}$ $cm^{-3}$ and not more than $1.0\times10^{21}$ $cm^{-3}$.

An insulating layer 40 is formed on the first main surface 3 of the SiC semiconductor layer 2. The insulating layer 40 covers the trench gate structures 10 altogether. Contact holes 41 are formed in the insulating layer 40. The contact holes 41 selectively expose the trench source structures 11, the source regions 31, and the contact regions 32.

A main surface source electrode 42 is formed on the insulating layer 40. The main surface source electrode enters into the contact holes 41 from above the insulating layer 40. The main surface source electrode 42 is electrically connected to the source electrode layers 20, the source regions 31, and the contact regions 32 inside the contact holes 41.

The main surface source electrode 42 may be made of the same conductive material as the source electrode layer 20. The main surface source electrode 42 may be made of a conductive material differing from the source electrode layer 20.

The source electrode layer 20 includes an n-type polysilicon or a p-type polysilicon, and the main surface source electrode 42 includes aluminum or a metal material containing aluminum as a main component, in this embodiment. The main surface source electrode 42 may include at least one of material among a conductive polysilicon, titanium, nickel, copper, aluminum, silver, gold, titanium nitride, or tungsten.

The main surface source electrode 42 may be formed by an electrode layer formed integral to the source electrode layers 20. In this case, the source electrode layer 20 and the main surface source electrode 42 may be formed through steps in common.

Dimensions of the trench gate structures 10 and dimensions of the trench source structures 11 shall now be described specifically.

The trench gate structure 10 has an aspect ratio D1/W1. The aspect ratio D1/W1 of the trench gate structure 10 is defined by a ratio of a depth D1 of the trench gate structure 10 with respect to a width W1 of the trench gate structure 10.

The width W1 is a width of the trench gate structure 10 along the first direction X, in this embodiment. The aspect ratio D1/W1 of the trench gate structure 10 is also an aspect ratio of the gate trench 12.

The aspect ratio D1/W1 of the trench gate structure 10 may be not less than 0.25 and not more than 15.0. The width W1 of the trench gate structure 10 may be not less than 0.2 μm and not more than 2.0 μm (for example, approximately 0.4 μm). The depth D1 of the trench gate structure 10 may be not less than 0.5 μm and not more than 3.0 μm (for example, approximately 1.0 μm).

The trench source structure 11 has an aspect ratio D2/W2. The aspect ratio D2/W2 of the trench source structure 11 is a ratio of a depth D2 of the trench source structure 11 with respect to a width W2 of the trench source structure 11.

The width W2 of the trench source structure 11 is a sum of a width WST of the source trench 18, a first width Wα of the deep well region 21, and a second width Wβ of the deep well region 21 (W2=WST+Wα+Wβ).

The width WST is a width of the source trench 18 along the first direction X, in this embodiment. The first width Wα is a width, along the first direction X, of a portion of the deep well region 21 along the second side wall 22 at one side of the source trench 18 in this embodiment. The second width Wβ is a width, along the first direction X, of a portion of the deep well region 21 along the second side wall 22 at the other side of the source trench 18, in this embodiment.

The aspect ratio D2/W2 of the trench source structure 11 is greater than the aspect ratio D1/W1 of the trench gate structure 10. The aspect ratio D2/W2 of the trench source structure 11 may be not less than 0.5 and not more than 18.0.

A ratio D2/D1 of the depth D2 of the trench source structure 11 with respect to the depth D1 of the trench gate structure 10 may be not less than 1.5 and not more than 4.0. A withstand voltage holding effect due to an SJ (super junction) structure can be improved by increasing the depth D2 of the trench source structure 11.

The width W2 of the trench source structure 11 may be not less than 0.6 μm and not more than 2.4 μm (for example, approximately 0.8 μm). The depth D2 of the trench source structure 11 may be not less than 1.5 μm and not more than 11 μm (for example, approximately 2.5 μm). The width W2 of the trench source structure 11 may be equal to the width W1 of the trench gate structure 10. The width W2 of the trench source structure 11 may differ from the width W1 of the trench gate structure 10.

In the trench source structure 11, the source trench 18 has an aspect ratio DST/WST. The aspect ratio DST/WST of the source trench 18 is a ratio of a depth DST of the source trench 18 with respect to the width WST of the source trench 18.

The aspect ratio DST/WST of the source trench 18 is greater than the aspect ratio D1/W1 of the trench gate structure 10. The aspect ratio DST/WST of the source trench 18 may be not less than 0.5 and not more than 18.0.

The width WST of the source trench 18 may be not less than 0.2 μm and not more than 2.0 μm (for example, approximately 0.4 μm). The width WST of the source trench 18 may be equal to the width W1 of the gate trench 12 (WST=W1).

If the width WST of the source trench 18 or the width W1 of the gate trench 12 differs along a depth direction, the width WST and the width W1 are defined as widths of opening portions. The depth DST of the source trench 18 may be not less than 1.0 μm and not more than 10 μm (for example, approximately 2.0 μm).

A ratio of the depth DST of the source trench 18 with respect to the depth D1 of the trench gate structure (gate trench 12) is preferably not less than 2. The ratio DST/D1 of the depth DST of the source trench 18 with respect to the depth D1 of the trench gate structure 10 may exceed 4.0. In this case, durability of a resist mask used in forming the source trenches 18 by an etching method must be taken into consideration.

For example, if the depth D1 of the trench gate structure 10 is approximately 3.0 μm and the ratio DST/D1 exceeds 4, it may be assumed that the resist mask would approach a durability limit or would exceed the durability limit by the etching. When the resist mask exceeds the durability limit, undesired etching of the SiC semiconductor layer 2 occurs.

It is therefore preferable for the ratio DST/D1 of the depth DST of the source trench 18 with respect to the depth D1 of the trench gate structure 10 to exceed 1.0 and be not more than 4.0. If the ratio DST/D1 is in this range, the source trenches 18 can be formed appropriately.

Figure 3:
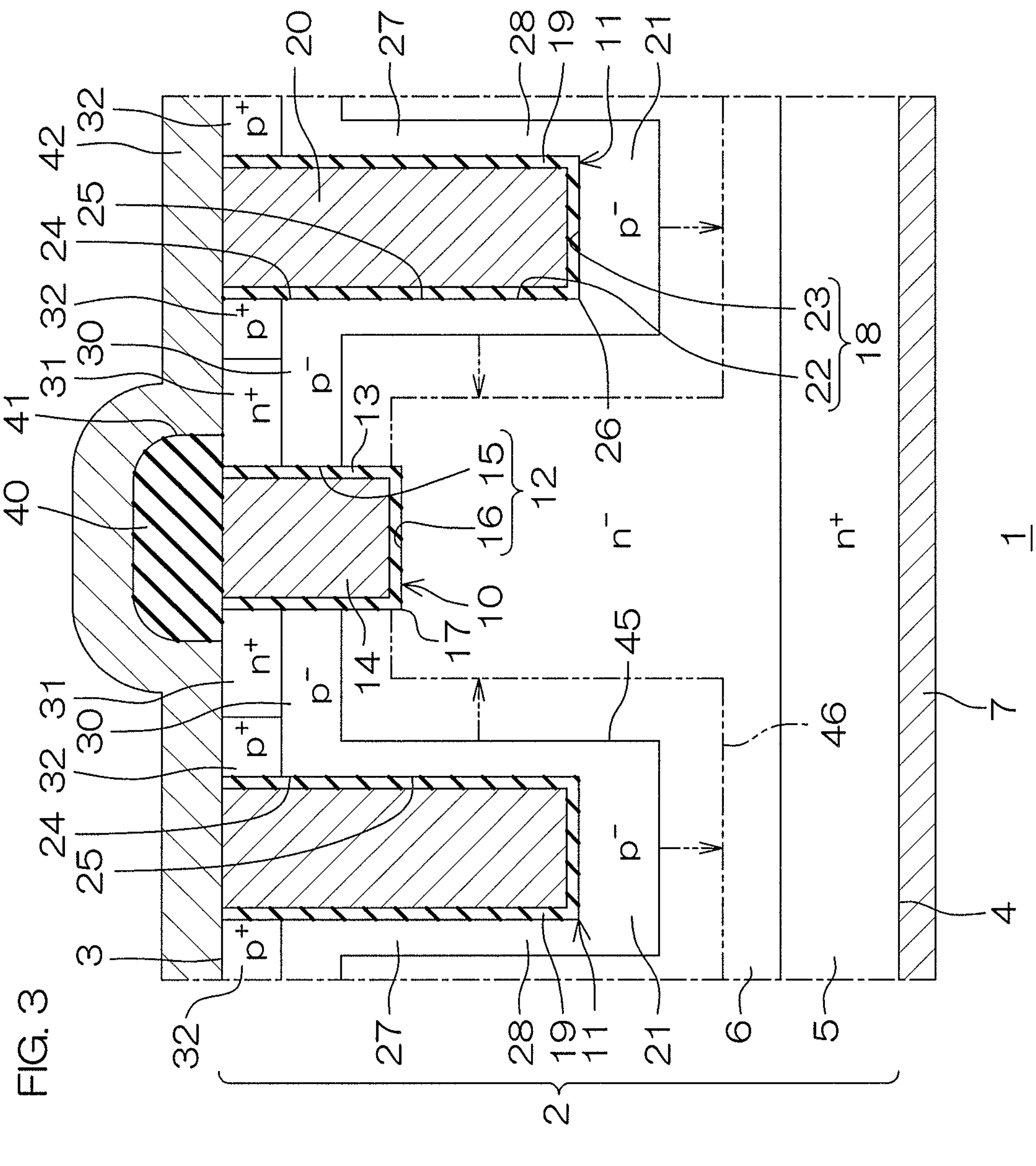
FIG. 3 is a sectional view for describing an operation of the semiconductor device of FIG. 1.

FIG. 3 is a sectional view for describing an operation of the semiconductor device 1 of FIG. 1. In FIG. 3, structures that are the same as those of FIG. 2 are provided with the same reference symbols.

With the semiconductor device 1, pn junction portions 45 are formed in boundary regions between the SiC semiconductor layer 2 and the deep well regions 21. When the semiconductor device 1 switches from an on state to an off state, depletion layers 46 spread toward the SiC semiconductor layer 2 from the pn junction portions 45. In FIG. 3, the depletion layers 46 are indicated by alternate long and two short dashed lines.

Each deep well region 21 includes the first region 27 and the second region 28. The first region 27 is formed along the first wall portion 24 of the second side wall 22 of the source trenches 18. The second region 28 is formed along the second wall portion 25 of the second side wall 22 of the source trenches 18.

The depletion layers 46 from the pn junction portions 45 spread to regions of the SiC semiconductor layer 2 further toward the first main surface 3 side than the first bottom walls 16 of the gate trenches 12. The depletion layers 46 from the pn junction portions 45 spread to regions of the SiC semiconductor layer 2 further toward the second main surface 4 side than the first bottom walls 16 of the gate trenches 12.

When the semiconductor device 1 switches from the on state to the off state, current paths of a short-circuit current flowing from the drain electrode 7 to the source electrode layers 20 are constricted by the depletion layers 46. Time until the semiconductor device 1 reaches breakdown can thereby be delayed.

Especially, with the semiconductor device 1, the aspect ratio D2/W2 of the trench source structure 11 is greater than the aspect ratio D1/W1 of the trench gate structure 10. The aspect ratio D2/W2 of the trench source structure 11 is not less than 0.5 and not more than 18.0.

Moreover, the ratio D2/D1 of the depth D2 of the trench source structure 11 with respect to the depth D1 of the trench gate structure 10 is not less than 1.5 and not more than 4.0. In regard to the thickness direction of the SiC semiconductor layer 2, the length of the second region 28 of the deep well region 21 is greater than the length of the first region 27 of the deep well region 21.

Therefore, in the SiC semiconductor layer 2, a proportion of regions occupied by the depletion layers 46 spreading to regions at the second main surface 4 side can reliably be increased more than a proportion of regions occupied by the depletion layers 46 spreading to regions at the first main surface 3 side. The current paths of the short-circuit current can thereby be constricted reliably in regions at the drain electrode 7 side.

The depletion layers 46 from the pn junction portions 45 may overlap with the first bottom walls 16 of the gate trenches 12. The depletion layers 46 at the second region 28 sides of the deep well regions 21 may overlap with the first bottom walls 16 of the gate trenches 12.

With this structure, the current paths of the short-circuit current can be constricted reliably in the regions at the drain electrode 7 side. Obviously, the depletion layers 46 at the first region 27 sides of the deep well regions 21 may overlap with the first bottom walls 16 of the gate trenches 12.

Also, with the semiconductor device 1, the regions of the SiC semiconductor layer 2 occupied by the depletion layers 46 can be increased and therefore a feedback capacitance Crss can be reduced in inverse proportion. The feedback capacitance Crss is a static capacitance across the gate electrode layers 14 and the drain electrode 7.

As described above, with the semiconductor device 1, a short circuit withstand capability can be improved and the feedback capacity Crss can be reduced.

Also, with the semiconductor device 1, the barrier forming layer 19 is formed inside the source trenches 18. The barrier forming layer 19 has a higher potential barrier than the potential barrier between the deep well region 21 and the source electrode layer 20.

Occurrence of punch-through can thus be suppressed even if a depletion layer 46 spreading from a pn junction portion 45 between the SiC semiconductor layer 2 and a deep well region 21 contacts an inner wall surface of a source trench 18. A leak current due to punch-through can thereby be suppressed.

If the barrier forming layers 19 are not present, there is a tendency for punch-through to be observed prominently at the corner portion 26 of the source trenches 18. This is because the depletion layers 46 would spread further along the second bottom walls 23 of the source trenches 18 from the second side walls 22 of the source trenches 18.

Therefore, with the semiconductor device 1, the inner wall surface of the source trenches 18 including the corner portions 26 are covered by the barrier forming layers 19. The occurrence of punch-through at the source trenches 18 can thereby be suppressed effectively.

With the semiconductor device 1, although the depletion layers 46 are formed in comparatively wide regions of the SiC semiconductor layer 2 from a design standpoint related to the short circuit withstand capability and the feedback capacity Crss, the leak current due to the depletion layers 46 can be suppressed appropriately by the barrier forming layers 19.

Figure 4:
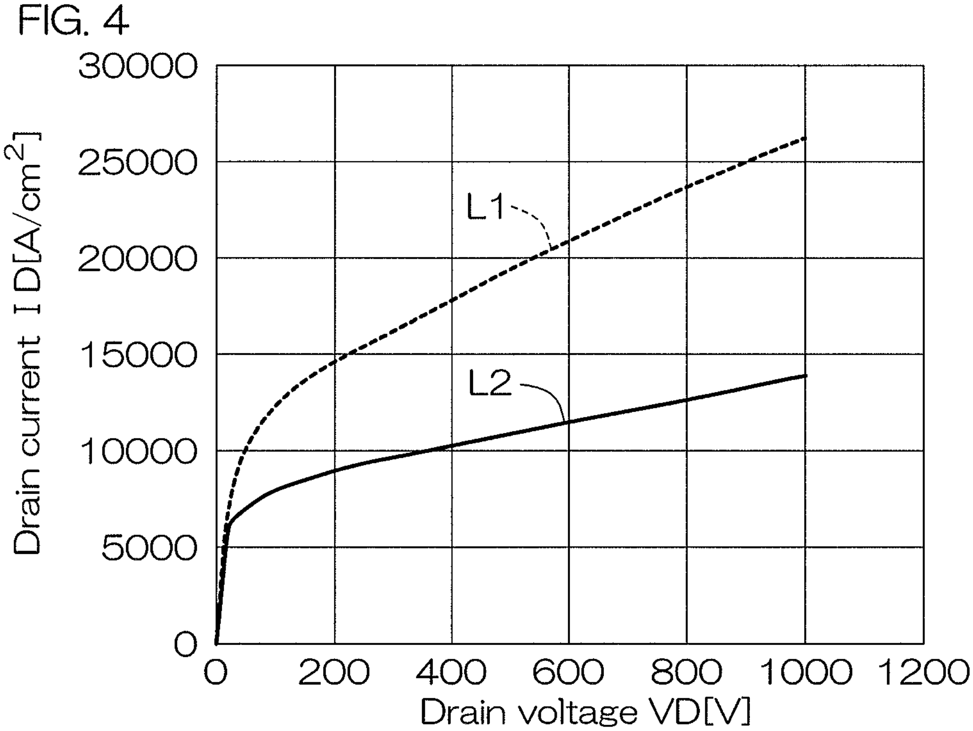
FIG. 4 is a graph of current-voltage characteristics of the semiconductor device of FIG. 1.

FIG. 4 is a graph of drain current-drain voltage characteristics of the semiconductor device 1 of FIG. 1. In FIG. 4, the ordinate indicates a drain current ID [A/cm$^2$] and the abscissa indicates a drain voltage VD [V]. The drain current ID is the current (short-circuit current) that flows between the drain electrode 7 and the source electrode layers 20.

A curve L1 and a curve L2 are shown in FIG. 4. The curve L1 and the curve L2 were both determined by simulation. The curve L1 and the curve L2 indicate changes of the drain current ID when the drain voltage VD of a predetermined range is applied to the drain electrode 7. The drain voltage VD is changed in a range from 0 V to 1000 V.

The curve L1 indicates the drain current-drain voltage characteristics of a semiconductor device according to a reference example. The curve L2 indicates the drain current-drain voltage characteristics of the semiconductor device 1. The semiconductor device according to the reference example has the same structure as the semiconductor device 1 with the exception of the point that the depth D2 of the source trench 18 is equal to the depth D1 of the gate trench 12.

Referring to the curve L1, with the semiconductor device according to the reference example, when the drain voltage VD exceeds 200 V, the drain current ID exceeds 15000 A/cm$^2$. On the other hand, referring to the curve L2, with the semiconductor device 1, the drain current ID is less than 15000 A/cm$^2$ in a range of the drain voltage VD from 0 V to 1000 V.

With the semiconductor device 1, the drain current ID stays within a range of not less than 10000 A/cm$^2$ and less than 15000 A/cm$^2$ in a range of the drain voltage VD from not less than 400 V to not more than 1000 V.

At a drain voltage VD of 600 V, the drain current ID of the semiconductor device 1 is approximately 45% less than the drain current ID of the semiconductor device according to the reference example.

From the simulation results, it was possible to confirm that the short circuit withstand capability can be improved significantly by forming the deep well regions 21 along the source trenches 18 that are deeper than the gate trenches 12.

Figure 5:
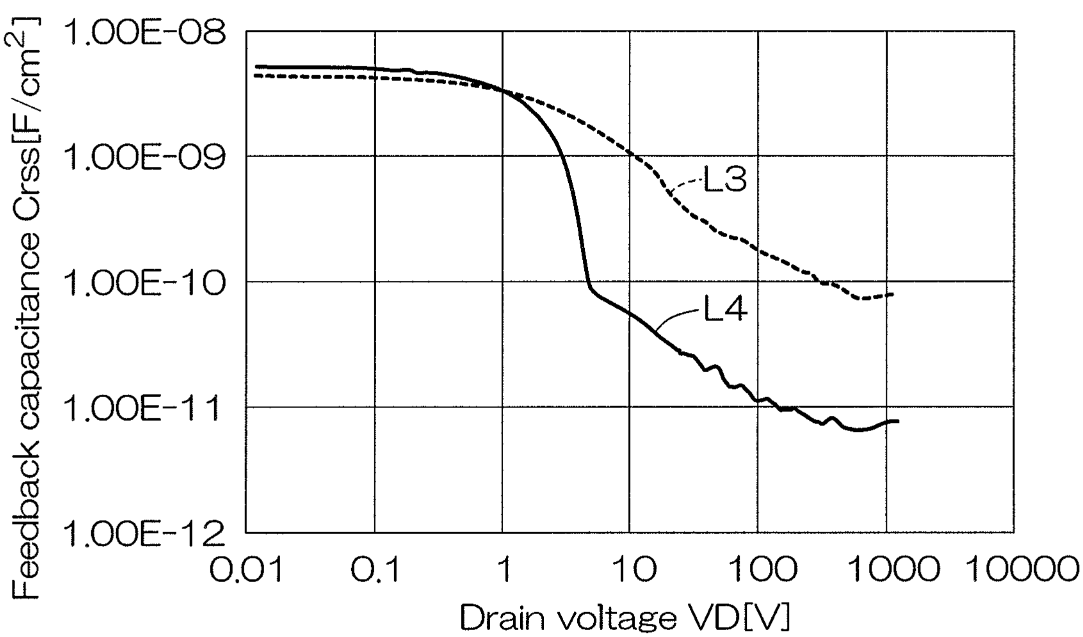
FIG. 5 is a graph of capacitance-voltage characteristics of the semiconductor device of FIG. 1.

FIG. 5 is a graph of feedback capacitance-drain voltage characteristics of the semiconductor device 1 of FIG. 1. In FIG. 5, the ordinate indicates the feedback capacitance Crss [F/cm$^2$] and the abscissa indicates the drain voltage VD [V].

A curve L3 and a curve L4 are shown in FIG. 5. The curve L3 and the curve L4 were both determined by simulation. The curve L3 and the curve L4 indicate changes of the feedback capacitance Crss when the drain voltage VD of a predetermined range is applied to the drain electrode 7. The drain voltage VD is changed in a range from 0 V to 1000 V.

The curve L3 indicates the feedback capacitance-drain voltage characteristics of the semiconductor device according to a reference example. The curve L4 indicates the feedback capacitance-drain voltage characteristics of the semiconductor device 1. The semiconductor device according to the reference example has the same structure as the semiconductor device 1 with the exception of the point that the depth D2 of the source trench 18 is equal to the depth D1 of the gate trench 12.

Referring to the curve L3, with the semiconductor device according to the reference example, the feedback capacitance Crss decreases gradually in a range of the drain voltage VD from 1 V to 10 V. With the semiconductor device according to the reference example, a decrease rate of the feedback capacitance Crss in the range of the drain voltage VD from 1 V to 10 V is approximately 25%.

On the other hand, with the semiconductor device 1, the feedback capacitance Crss decreases rapidly in the range of the drain voltage VD from 1 V to 10 V. At a drain voltage VD of 10 V, the feedback capacitance Crss of the semiconductor device 1 is approximately 95% less than the feedback capacitance Crss of the semiconductor device according to the reference example. With the semiconductor device 1, the decrease rate of the feedback capacitance Crss in the range of the drain voltage VD from 1 V to 10 V is not less than 95% and not more than 99%.

From the simulation results, it was possible to confirm that the feedback capacitance Crss can be reduced significantly by forming the deep well regions 21 along the source trenches 18 that are deeper than the gate trenches 12. That is, it was possible to confirm that a switching speed can be improved significantly by reducing the feedback capacitance Crss.

Figure 6:
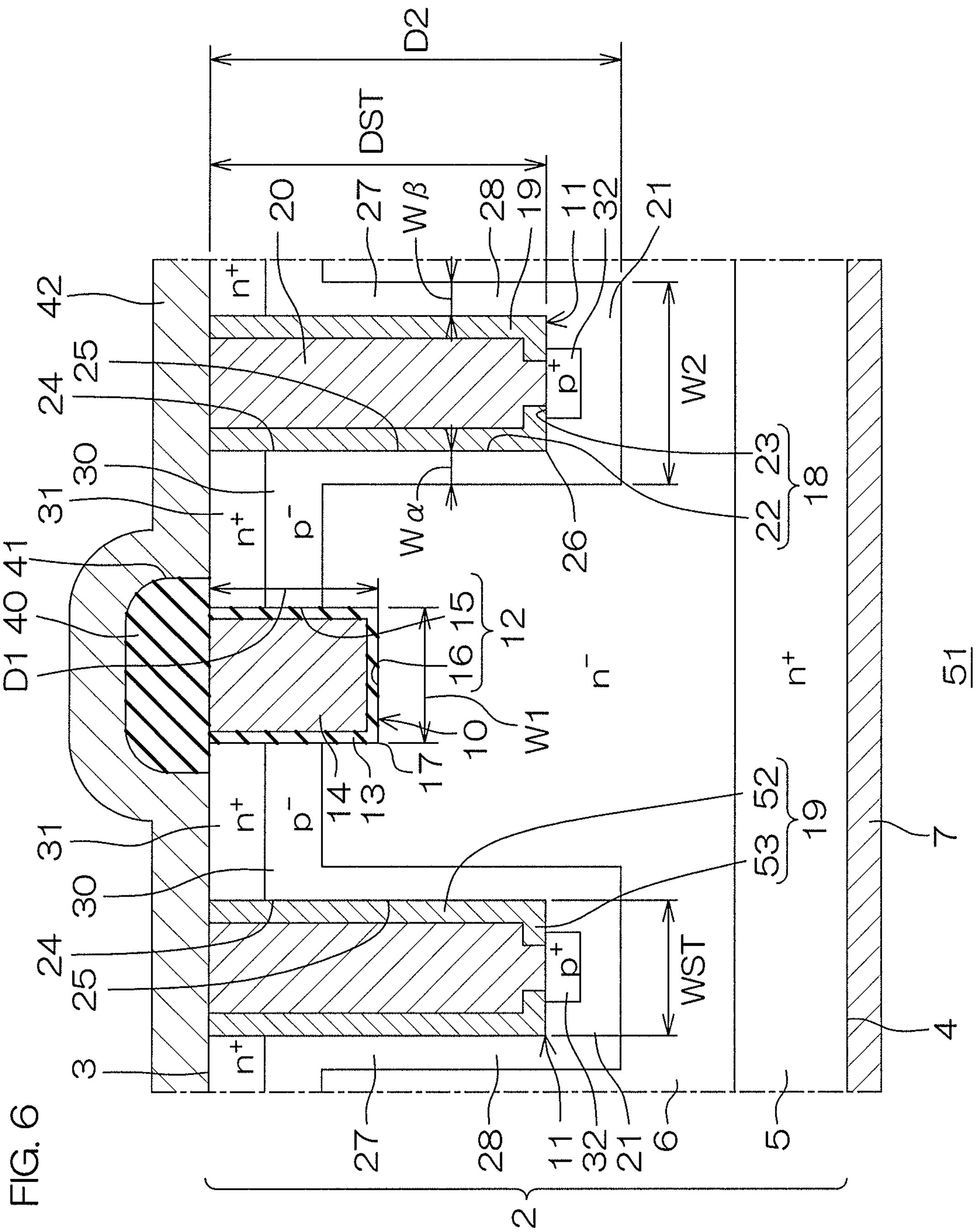
FIG. 6 is a sectional view of a semiconductor device according to a second preferred embodiment of the present invention.

FIG. 6 is a sectional view of a semiconductor device 51 according to a second preferred embodiment of the present invention. In the following, structures corresponding to structures described with the semiconductor device 1 shall be provided with the same reference symbols and description thereof shall be omitted.

Referring to FIG. 6, the source regions 31 are exposed from the first side walls 15 of the gate trenches 12 and the second side walls 22 of the source trenches 18. The contact regions 32 are formed in regions inside the deep well regions 21 along the second bottom walls 23 of the source trenches 18. The contact regions 32 are exposed from the second bottom walls 23 of the source trenches 18.

The contact regions 32 may cover entireties of the second bottom walls 23 of the source trenches. The p-type impurity concentration of the contact regions 32 is greater than the p-type impurity concentration of the deep well regions 21.

An example where the barrier forming layer 19 is constituted of a conductive barrier forming layer is shown in FIG. 6. The barrier forming layer 19 is formed along the inner wall surface of the source trench 18 and selectively exposes the contact region 32 from the second bottom wall 23 of the source trench 18.

More specifically, the barrier forming layer 19 includes a first portion 52 and a second portion 53. The first portion 52 of the barrier forming layer 19 covers the second side wall 22 of the source trench 18. The second portion 53 of the barrier forming layer 19 partially covers the second bottom wall 23 of the source trench 18.

The second portion 53 of the barrier forming layer 19 is continuous to the first portion 52 of the barrier forming layer 19. The second portion 53 of the barrier forming layer 19 extends along the second bottom wall 23 from the corner portion 26 of the source trench 18.

The second portion 53 of the barrier forming layer 19 exposes a central portion of the second bottom wall 23 of the source trench 18. The second portion 53 of the barrier forming layer 19 may be formed in an endless shape (annular shape) in plan view.

With the semiconductor device 51 described above, the same effects as the effects described for the semiconductor device 1 can be exhibited. Also, with the semiconductor device 51, even if the depletion layers 46 spread along the second bottom walls 23 from the corner portions 26 of the source trenches 18, distances until the depletion layers 46 reach the source electrode layers 20 can be increased by the barrier forming layers 19. The occurrence of punch-through can thereby be suppressed in vicinities of the corner portions 26 of the source trenches 18.

Figure 7:
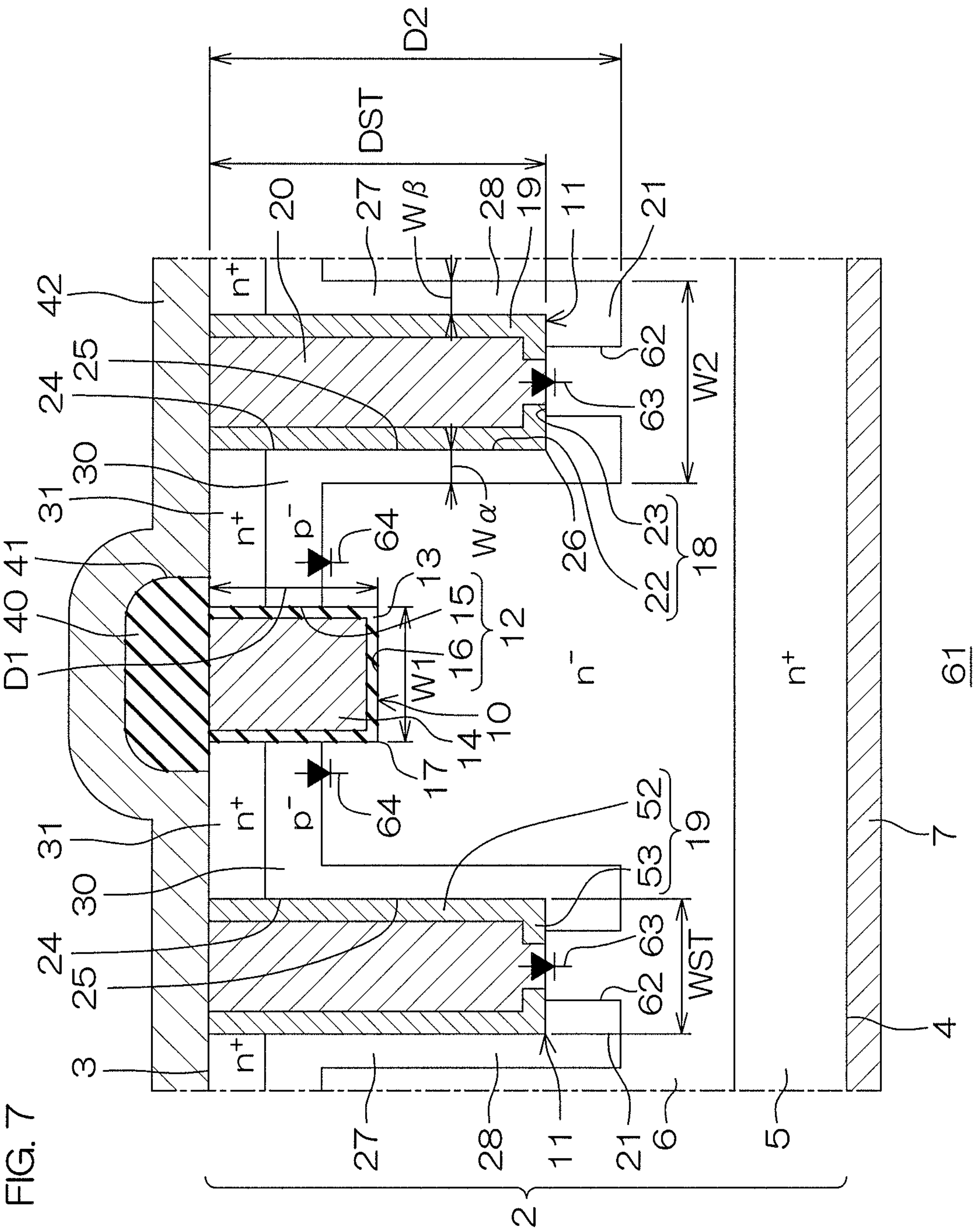
FIG. 7 is a sectional view of a semiconductor device according to a third preferred embodiment of the present invention.

FIG. 7 is a sectional view of a semiconductor device 61 according to a third preferred embodiment of the present invention. In the following, structures corresponding to structures described with the semiconductor device 51 shall be provided with the same reference symbols and description thereof shall be omitted.

An exposing portion 62 that selectively exposes the second bottom wall 23 of the source trench 18 is formed in the deep well region 21. More specifically, the second region 28 of the deep well region 21 is formed along the corner portion 26 of the source trench 18 such as to expose a central portion of the second bottom wall 23 of the source trench 18. The second region 28 of the deep well region 21 may be formed in an endless shape (annular shape) in plan view.

The contact regions 32 are not formed, in this embodiment. The contact regions 32 may be formed in regions of the surface layer portion of the body region 30 along the second side walls 22 of the source trenches 18.

The source electrode layer 20 forms a heterojunction portion with the SiC semiconductor layer 2 at the exposing portion 62 of the deep well region 21. A heterojunction diode 63 having the source electrode layer 20 as an anode and the SiC semiconductor layer 2 as a cathode is thereby formed.

The source electrode layer 20 may include a conductive polysilicon. Obviously, the source electrode layer 20 may include a conductive material besides a conductive polysilicon, as long as the heterojunction diode 63 is formed.

A body diode 64 is formed in a pn junction portion between the SiC semiconductor layer 2 and the body region 30. A junction barrier of the heterojunction diode 63 is smaller than a diffusion potential of the body diode 64. The junction barrier of the heterojunction diode 63 may be not less than 1.0 eV and not more than 1.5 eV. The diffusion potential of the body diode 64 may be not less than 2.8 eV and not more than 3.2 eV.

With the semiconductor device 61 described above, the same effects as the effects described for the semiconductor device 51 can be exhibited. Also, with the semiconductor device 61, when a reverse bias voltage is applied, current can be made to flow preferentially into the heterojunction diodes 63. Expansion of a crystal defect of SiC in the SiC semiconductor layer 2 can thereby be suppressed. Consequently, increase of on resistance can be suppressed while achieving improvement of the short circuit withstand capability and reduction of the feedback capacitance Crss.

Figure 8:
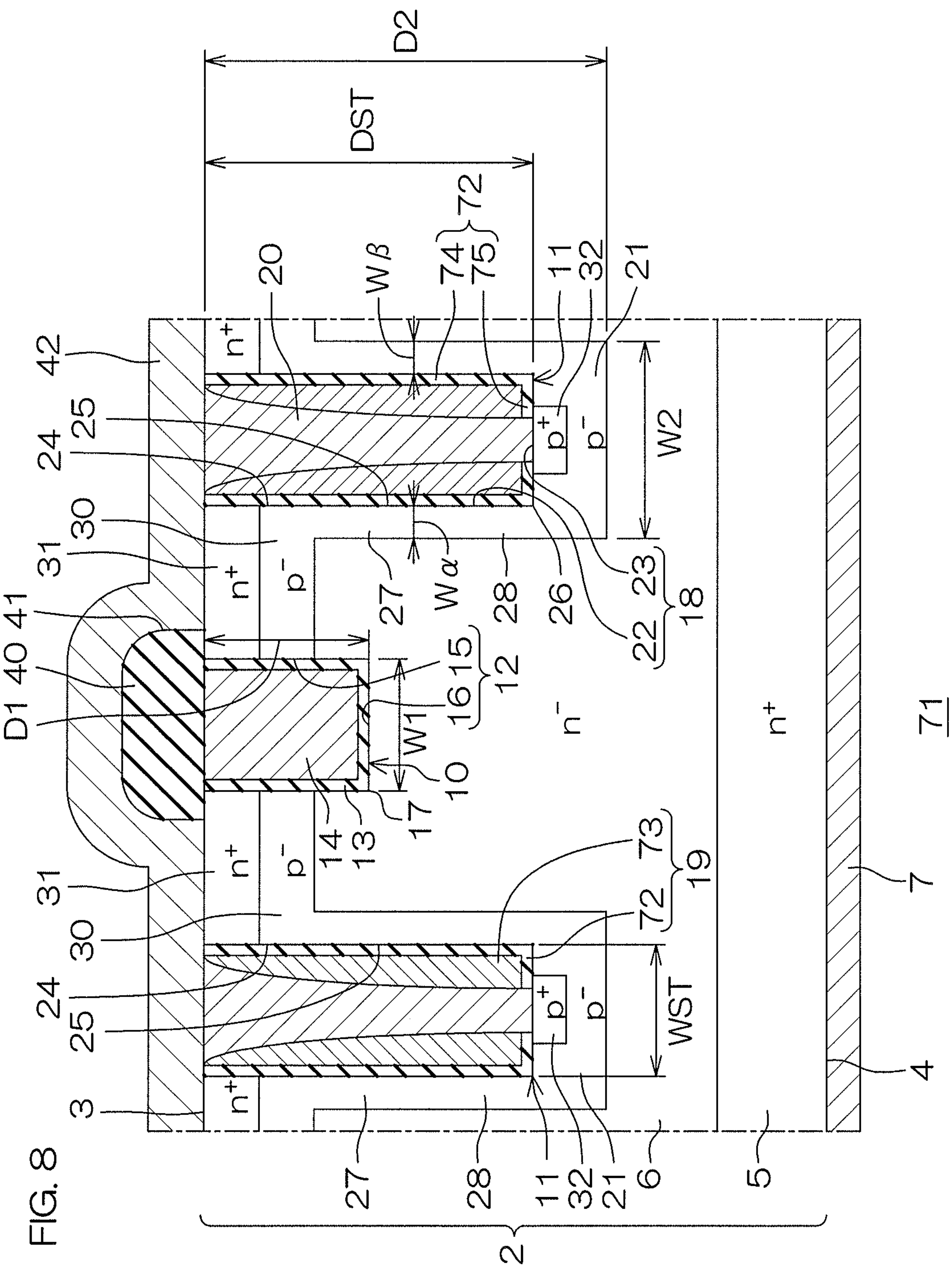
FIG. 8 is a sectional view of a semiconductor device according to a fourth preferred embodiment of the present invention.

FIG. 8 is a sectional view of a semiconductor device 71 according to a fourth preferred embodiment of the present invention. In the following, structures corresponding to structures described with the semiconductor device 51 shall be provided with the same reference symbols and description thereof shall be omitted.

The barrier forming layer 19 has a laminated structure including a plurality of barrier forming layers formed along inner wall of the source trench 18. The barrier forming layer 19 has the laminated structure that includes an insulating barrier forming layer 72 and a conductive barrier forming layer 73 that are laminated in that order from the inner wall of the source trench 18, in this embodiment.

The insulating barrier forming layer 72 is formed in a film shape along the inner wall surface of the source trench 18. The insulating barrier forming layer 72 selectively exposes a contact region 32 from the second bottom wall 23 of the source trench 18.

More specifically, the insulating barrier forming layer 72 includes a first portion 74 and a second portion 75. The first portion 74 covers a second side wall of the source trench 18. The second portion 75 selectively covers the second bottom wall 23 of the source trench 18.

The second portion 75 is continuous to the first portion 74. The second portion 75 extends along the second bottom wall 23 from a corner portion 26 of the source trench 18 such as to expose a central portion of the second bottom wall 23 of the source trench 18.

The insulating barrier forming layer 72 may include at least one of material among undoped silicon, silicon oxide, silicon nitride, aluminum oxide, aluminum nitride, or aluminum oxynitride.

The conductive barrier forming layer 73 is formed in a film shape along the insulating barrier forming layer 72 such as to selectively expose the contact region 32 from the second bottom wall 23 of the source trench 18. The conductive barrier forming layer 73 includes a conductive material differing from the conductive material of the source electrode layer 20.

The conductive barrier forming layer 73 may be made of the same conductive material as the conductive material of the gate electrode layers 14. The conductive barrier forming layer 73 may include at least one of material among a conductive polysilicon, tungsten, platinum, nickel, cobalt, or molybdenum.

With the semiconductor device 71 described above, the same effects as the effects described for the semiconductor device 51 can be exhibited. Also, with the semiconductor device 71, the barrier forming layer 19 has the laminated structure that includes the insulating barrier forming layer 72 and the conductive barrier forming layer 73. The occurrence of punch-through can thereby be suppressed by the double layer of the insulating barrier forming layer 72 and the conductive barrier forming layer 73.

If the conductive material of the conductive barrier forming layer 73 is the same as the conductive material of the gate electrode layers 14, the gate electrode layers 14 and the conductive barrier forming layer 73 can be formed in the same step. Increase of workload can thus be suppressed.

Figure 9:
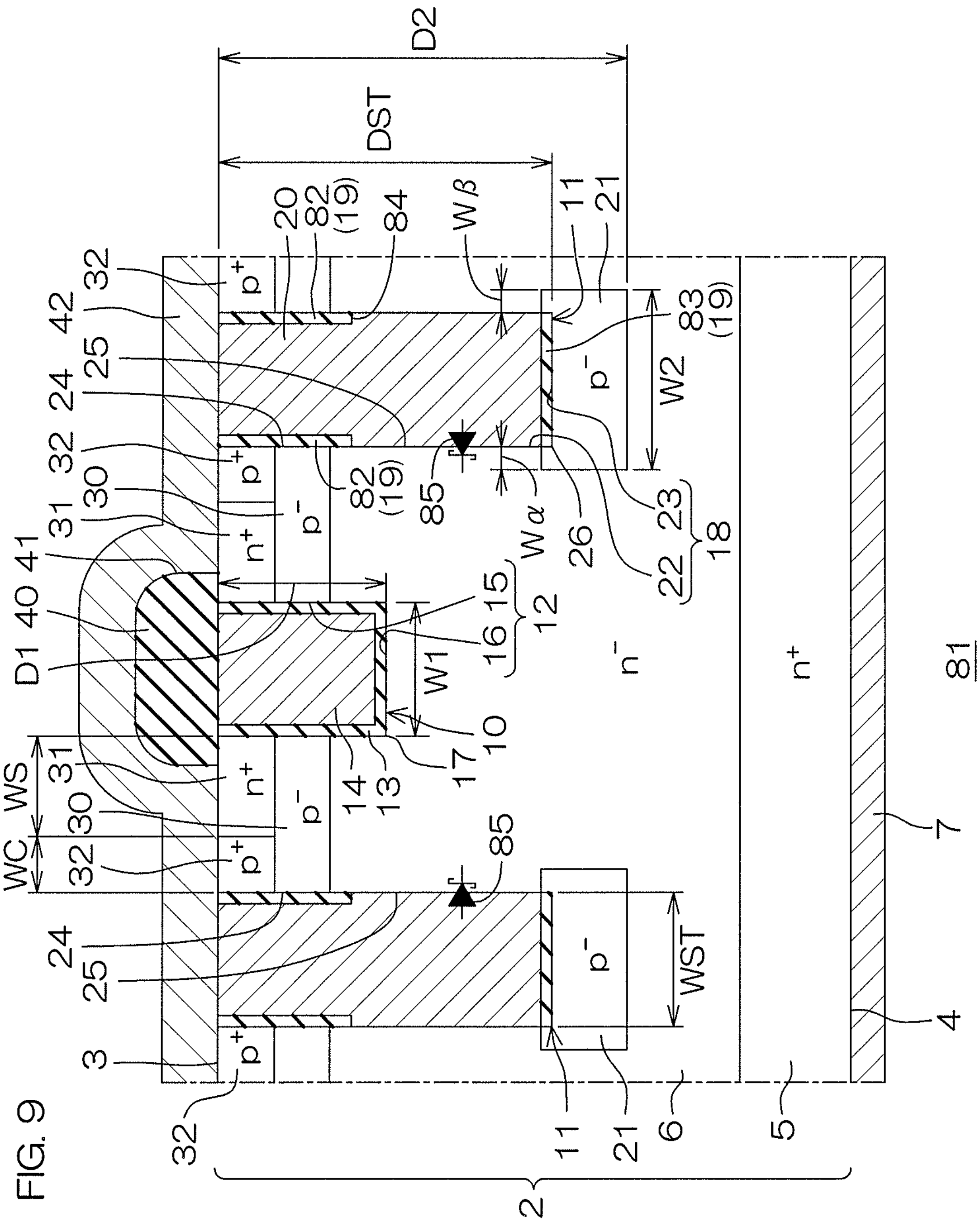
FIG. 9 is a sectional view of a semiconductor device according to a fifth preferred embodiment of the present invention.

FIG. 9 is a sectional view of a semiconductor device 81 according to a fifth preferred embodiment of the present invention. In the following, structures corresponding to structures described with the semiconductor device 1 shall be provided with the same reference symbols and description thereof shall be omitted.

The barrier forming layer 19 includes a first portion 82 and a second portion 83. The first portion 82 of the barrier forming layer 19 covers the second side wall 22 of the source trench 18. The second portion 83 of the barrier forming layer 19 covers the second bottom wall 23 of the source trench 18.

The first portion 82 of the barrier forming layer 19 selectively has a side wall contact hole 84 that exposes the SiC semiconductor layer 2 from a second side wall 22 of the source trench 18. The first portion 82 covers the first wall portion 24 of the source trench 18 and exposes the second wall portion 25.

The first portion 82 may be formed to cross a boundary region between the SiC semiconductor layer 2 and the body region 30. An end portion of the first portion 82 at the second main surface 4 side may be formed in a region deeper than a bottom portion of the body region 30.

The end portion of the first portion 82 at the second main surface 4 side may be formed in a region shallower than the bottom portion of the body region 30. The end portion of the first portion 82 at the second main surface 4 side may be formed in a region between the bottom portion of the body region 30 and bottom portions of the contact regions 32. In these cases, the source electrode layer 20 is connected at least to the body region 30 inside the source trench 18.

The end portion of the first portion 82 at the second main surface 4 side may be formed in a region between the first main surface 3 of the SiC semiconductor layer 2 and the bottom portions of the contact regions 32. The barrier forming layer 19 may just have the second portion 83 without having the first portion 82. In these cases, the source electrode layer 20 is connected to the body region 30 and the contact regions 32 inside the source trench 18.

The second portion 83 of the barrier forming layer 19 is formed across intervals from the first portion 82 of the barrier forming layer 19. The second portion 83 is separated from the first portion 82. The second portion 83 may cover the corner portion 26 of the source trench 18.

The second portion 83 may expose the corner portion 26 of the source trench 18. The second portion 83 may cover the corner portion 26 of the source trench 18 and cover a part of the second side wall 22 of the source trench 18.

The source electrode layer 20 forms a Schottky junction with the SiC semiconductor layer 2 inside the source trench 18. A Schottky barrier diode 85 having the source electrode layer 20 as an anode and the SiC semiconductor layer 2 as a cathode is thereby formed.

The source electrode layer 20 may be made of the same conductive material as the main surface source electrode 42. The source electrode layer 20 and the main surface source electrode 42 may be made of aluminum or a metal material containing aluminum as a main component.

The source electrode layer 20 and the main surface source electrode 42 may include at least one of material among a conductive polysilicon, titanium, nickel, copper, aluminum, silver, gold, titanium nitride, or tungsten. In this case, the gate electrode layer 14 is preferably made of a polysilicon (an n-type polysilicon or a p-type polysilicon).

The p-type deep well region 21 is formed in a region of the SiC semiconductor layer 2 along the second bottom wall 23 of the source trench 18. The deep well region 21 may be formed continuously in a region of the SiC semiconductor layer 2 along the second side wall 22 and the corner portion 26 of the source trench 18 such as to expose the source electrode layer 20 from the second side wall 22 of the source trench 18.

That is, the deep well region 21 covers the second bottom wall 23 of the source trench 18. Also, the deep well region 21 covers the corner portion 26 connecting the second side wall 22 and the second bottom wall 23 of the source trench 18. The deep well region 21 may expose substantially entire areas of the second side wall 22 of the source trench 18 in the SiC semiconductor layer 2.

The deep well region 21 is lead out in the lateral direction parallel to the first main surface 3 of the SiC semiconductor layer 2 from the second bottom wall 23 of the source trench 18. Thereby, the deep well region 21 faces the body region 30 across a partial region of the SiC semiconductor layer 2 in regard to the direction normal to the first main surface 3 of the SiC semiconductor layer 2.

More specifically, the source electrode layer 20 forms the Schottky junction with the SiC semiconductor layer 2 at a depth position between the body region 30 and the deep well region 21 in regard to the direction normal to the first main surface 3 of the SiC semiconductor layer 2.

Even more specifically, the source electrode layer 20 forms the Schottky junction with the SiC semiconductor layer 2 in regions of the SiC semiconductor layer 2 sandwiched by the body region 30 and the deep well region 21 in regard to the direction normal to the first main surface 3 of the SiC semiconductor layer 2.

The width W2 of the trench source structure 11 may be matched with the width WST of the source trench 18. That is, the first width Wα and the second width Wβ of the deep well region 21 may both be zero.

With the semiconductor device 81 described above, the same effects as the effects described for the semiconductor device 1 can be exhibited. Also, with the semiconductor device 81, when a reverse bias voltage is applied, current can be made to flow preferentially into the Schottky barrier diodes 85. Expansion of the crystal defect of SiC in the SiC semiconductor layer 2 can thereby be suppressed. Consequently, increase of on resistance can be suppressed while achieving improvement of the short circuit withstand capability and reduction of the feedback capacitance Crss.

With this embodiment, an example where each source electrode layer 20 forms Schottky junction with the SiC semiconductor layer 2 inside the side wall contact holes 84 of the barrier forming layer 19 was described. However, a configuration free from the barrier forming layer 19 (first portion 82 and second portion 83) may be adopted.

Figure 10:
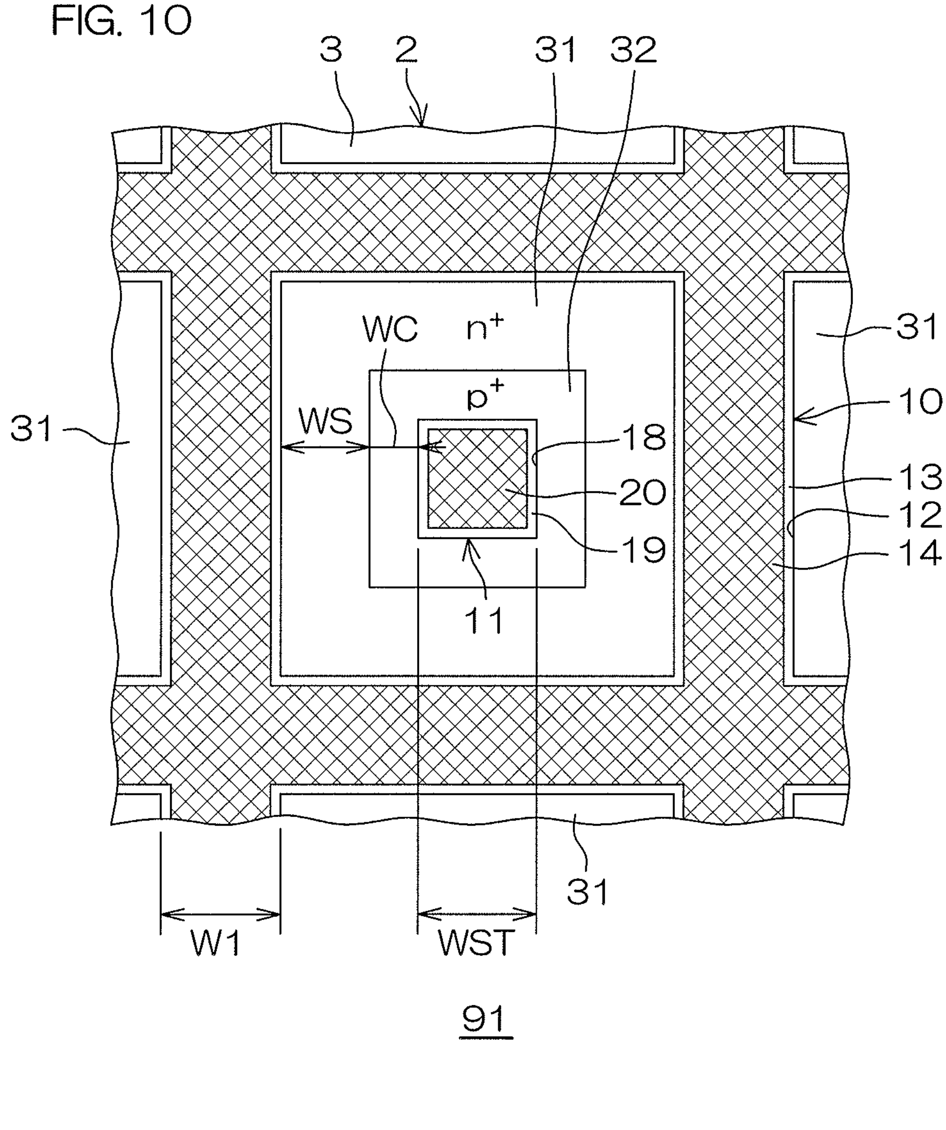
FIG. 10 is a plan view of a semiconductor device according to a sixth preferred embodiment of the present invention.

FIG. 10 is a plan view of a semiconductor device 91 according to a sixth preferred embodiment of the present invention. In the following, structures corresponding to structures described with the semiconductor device 1 shall be provided with the same reference symbols and description thereof shall be omitted.

Referring to FIG. 10, the trench gate structure is formed in a lattice shape in plan view, in this embodiment. The trench source structures 11 may be formed inside regions surrounded by the trench gate structure 10.

The source region 31 may be formed along peripheral edge of the trench gate structure 10. The contact region 32 may be formed along peripheral edge of the trench source structure 11.

Even with the semiconductor device 91 described above, the same effects as the effects described for the semiconductor device 1 can be exhibited. Also, with the semiconductor device 91, a density of a current flowing through the SiC semiconductor layer 2 can be increased.

The structure of the semiconductor device 91 may also be applied to the respective preferred embodiments described above. That is, the structure with which the trench gate structure 10 is formed in the lattice shape in plan view and the trench source structure 11 is formed inside the region surrounded by the trench gate structure may also be applied to the respective preferred embodiments described above.

Although the first to sixth preferred embodiments of the present invention have been described above, the first to sixth preferred embodiments of the present invention may also be implemented in yet other configurations.

In each of the first to sixth preferred embodiments described above, the barrier forming layer 19 may selectively expose the SiC semiconductor layer 2 from the second side wall 22 of the source trench 18. For example, the barrier forming layer 19 may expose at least one of the contact region 32, the source region 31, or the body region 30 inside the source trench 18.

In each of the first to sixth preferred embodiments described above, a structure with which the barrier forming layers 19 are omitted may be adopted.

In each of the first to sixth preferred embodiments described above, the gate trench 12 may be formed in a tapered shape with which an area of the first bottom wall 16 is smaller than an opening area in sectional view.

In each of the first to sixth preferred embodiments described above, the first bottom wall 16 of the gate trench 12 may be formed to be parallel to the first main surface 3 of the SiC semiconductor layer 2. The first bottom wall 16 of the gate trench 12 may be formed in a shape that is convexly curved from the first side wall 15 toward the second main surface 4 of the SiC semiconductor layer 2.

In each of the first to sixth preferred embodiments described above, the source trench 18 may be formed in a tapered shape with which an area of the second bottom wall 23 is smaller than the opening area in sectional view.

In each of the first to sixth preferred embodiments described above, the second bottom wall 23 of the source trench 18 may be formed to be parallel to the first main surface 3 of the SiC semiconductor layer 2. The second bottom wall 23 of the source trench 18 may be formed in a shape that is convexly curved outward from the second side wall 22.

In each of the first to sixth preferred embodiments described above, an Si semiconductor layer (2) made of Si (silicon) may be adopted in place of the SiC semiconductor layer 2 made of the SiC monocrystal. That is, the Si semiconductor layer (2) may have a laminated structure that includes an Si semiconductor substrate (5) made of Si and an Si epitaxial layer (6) made of Si.

In each of the first to sixth preferred embodiments described above, a structure with which the conductivity types of the respective semiconductor portions are inverted may be adopted. That is, a p-type portion may be formed to be of an n-type and an n-type portion may be formed to be of a p-type.

In each of the first to sixth preferred embodiments described above, a $p^+$-type SiC semiconductor substrate (5) may be adopted in place of the $n^+$-type SiC semiconductor substrate 5. With this structure, an IGBT (Insulated Gate Bipolar Transistor) can be provided in place of a MISFET.

In this case, the "source" of the MISFET is replaced by an "emitter" of the IGBT. Also, the "drain" of the MISFET is replaced by a "collector" of the IGBT. Even when an IGBT is adopted in place of a MISFET, the same effects as the effects described above for the respective preferred embodiments can be exhibited.

Figure 11:
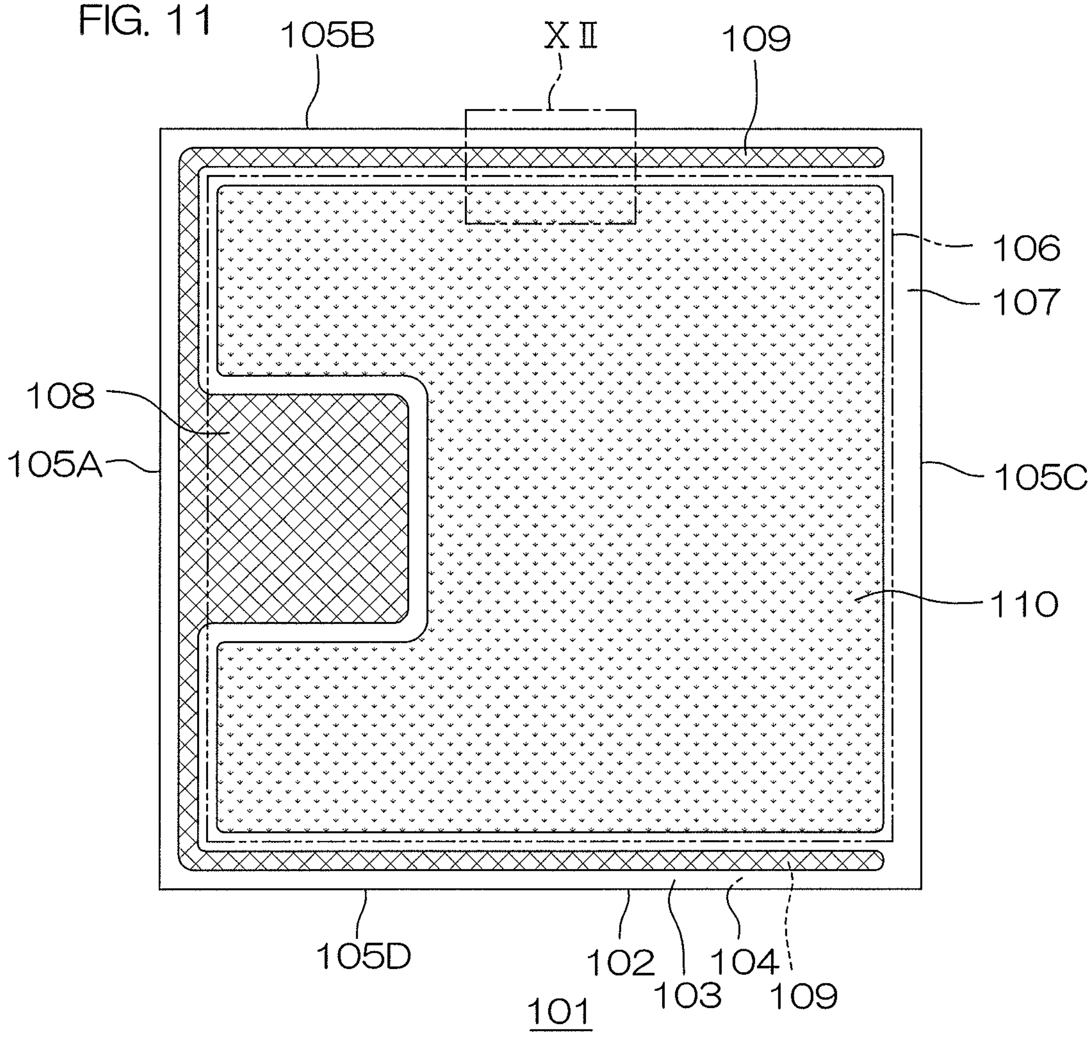
FIG. 11 is a plan view of a semiconductor device according to a seventh preferred embodiment of the present invention.

FIG. 11 is a plan view of a semiconductor device 101 according to a seventh preferred embodiment of the present invention.

Referring to FIG. 11, the semiconductor device 101 has an SiC semiconductor layer 102 that includes an SiC (silicon carbide) monocrystal. The SiC semiconductor layer 102 may include a 4H—SiC monocrystal.

The 4H—SiC monocrystal has an off angle inclined at an angle of within 10° in a [11-20] direction from a (0001) plane. The off angle may be not less than 0° and not more than 4°. The off angle may exceed 0° and be less than 4°. The off angle is typically 2° or 4° and more specifically is set in a range of 2°±0.2° or a range of 4°±0.4°.

The SiC semiconductor layer 102 is formed in a chip shape of rectangular parallelepiped shape, in this embodiment. The SiC semiconductor layer 102 has a first main surface 103 at one side, a second main surface 104 at another side, and side surfaces 105A, 105B, 105C, and 105D connecting the first main surface 103 and the second main surface 104.

The first main surface 103 and the second main surface 104 are formed in quadrilateral shapes in a plan view as viewed in a direction normal to the surfaces (hereinafter referred to simply as "plan view"). The side surface 105A faces the side surface 105C. The side surface 105B faces the side surface 105D.

The side surfaces 105A to 105D respectively extend as planes along the direction normal to the first main surface 103 and the second main surface 104. A length of each of the side surfaces 105A to 105D may be not less than 1 mm and not more than 10 mm (for example, not less than 2 mm and not more than 5 mm).

An active region 106 and an outer region 107 are set in the SiC semiconductor layer 102. The active region 106 is a region in which a vertical MISFET (Metal Insulator Semiconductor Field Effect Transistor) is formed. The outer region 107 is a region at an outer side of the active region 106.

In plan view, the active region 106 is set in a central portion of the SiC semiconductor layer 102 at intervals toward an inner region of the SiC semiconductor layer 102 from the side surfaces 105A to 105D of the SiC semiconductor layer 102. In plan view, the active region 106 is set to a quadrilateral shape having four sides parallel to the four side surfaces 105A to 105D of the SiC semiconductor layer 102.

The outer region 107 is set in a region between the side surfaces 105A to 105D of the SiC semiconductor layer 102 and a peripheral edge of the active region 106. The outer region 107 is set to an endless shape (quadrilateral annular shape) surrounding the active region 106 in plan view.

A gate pad 108, a gate finger 109, and a source pad 110 are formed as first main surface electrodes on the first main surface 103 of the SiC semiconductor layer 102. In FIG. 11, the gate pad 108, the gate finger 109, and the source pad 110 are shown with hatching applied for clarity. The gate pad 108, the gate finger 109, and the source pad 110 may include aluminum or copper.

The gate pad 108 is formed along the side surface 105A of the SiC semiconductor layer 102 in plan view. The gate pad 108 is formed along a central region of the side surface 105A of the SiC semiconductor layer 102 in plan view. The gate pad 108 may be formed along a corner portion connecting any two of the four side surfaces 105A to 105D of the SiC semiconductor layer 102 in plan view.

The gate pad 108 is formed in a quadrilateral shape in plan view. The gate pad 108 is lead out into the active region 106 from the outer region 107 such as to cross a boundary region between the outer region 107 and the active region 106 in plan view.

The gate finger 109 is formed in the outer region 107. The gate finger 109 is lead out from the gate pad 108 and extends as a band shape in the outer region 107. The gate finger 109 is formed along the three side surfaces 105A, 105B, and 105D of the SiC semiconductor layer 102 such as to define the active region 106 from three directions, in this embodiment.

The source pad 110 is formed in the active region 106 across intervals from the gate pad 108 and the gate finger 109. The source pad 110 is formed in a recessed shape in plan view such as to cover a region of recessed shape defined by the gate pad 108 and the gate finger 109.

A gate voltage is applied to the gate pad 108 and the gate finger 109. The gate voltage may be not less than 10 V and not more than 50 V (for example, approximately 30 V). A source voltage is applied to the source pad 110. The source voltage may be a reference voltage (for example, a GND voltage).

Figure 12:
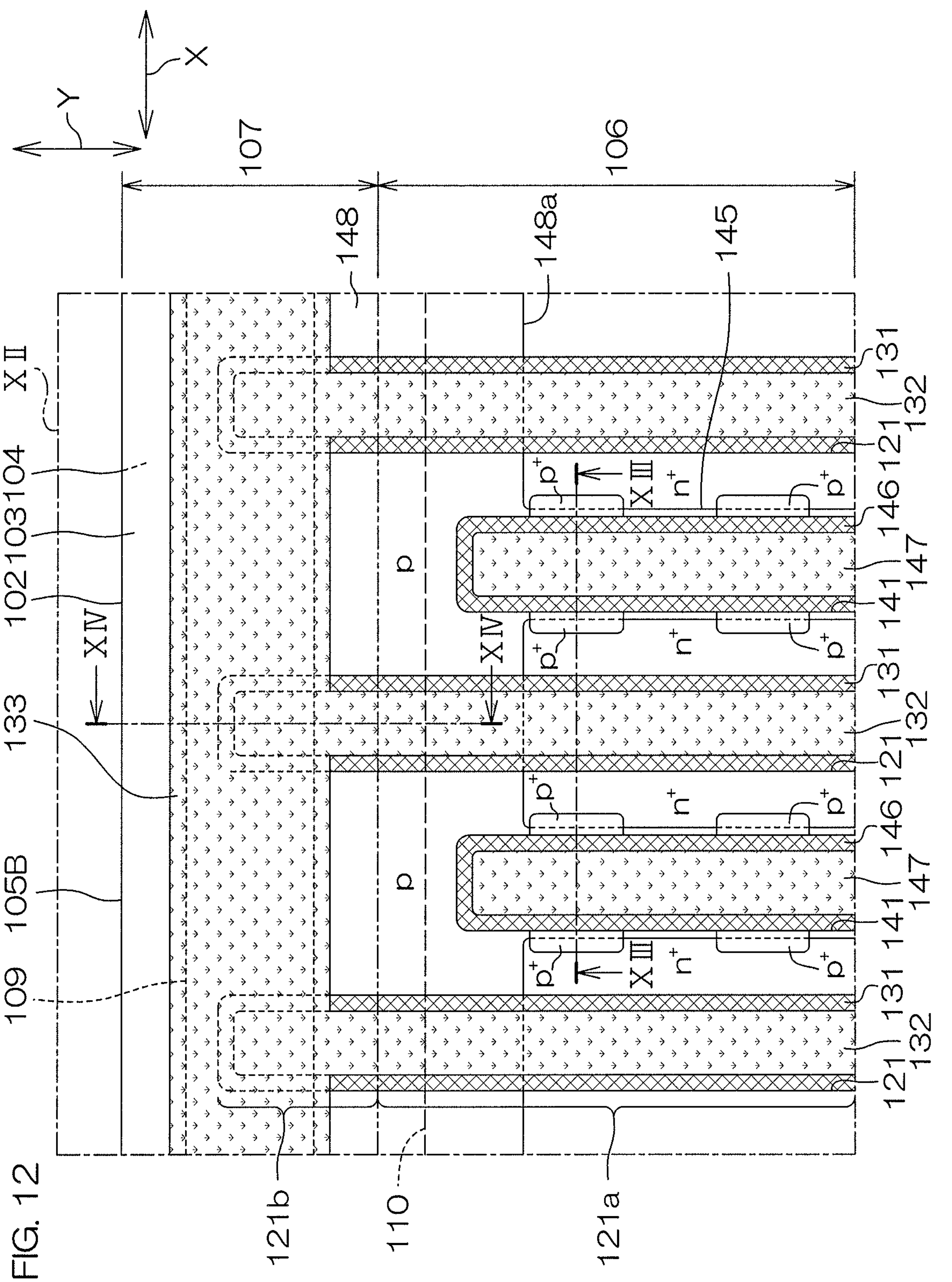
FIG. 12 is an enlarged view of a region XII shown in FIG. 11 and is a diagram for describing the structure of a first main surface of an SiC semiconductor layer.
Figure 13:
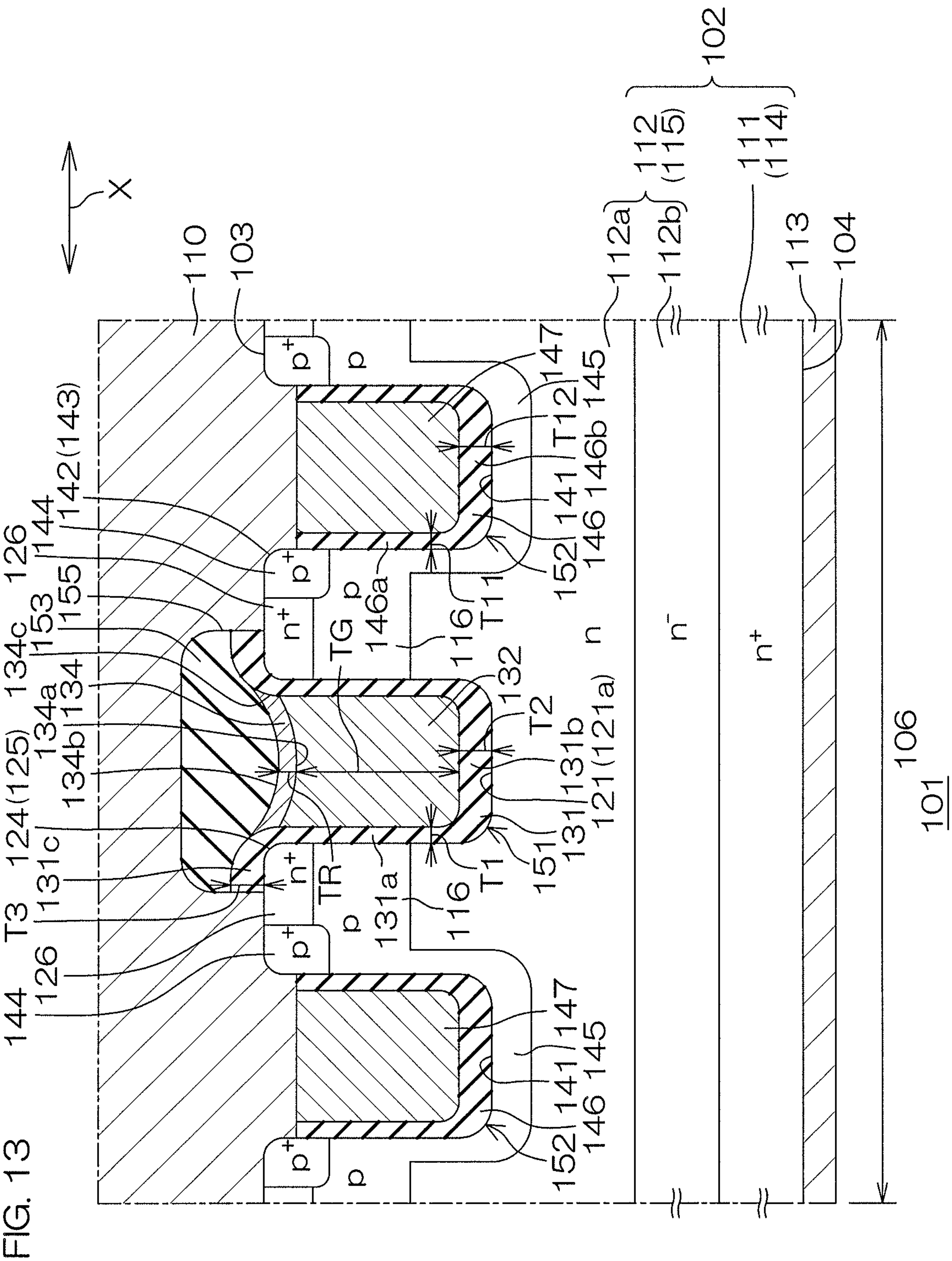
FIG. 13 is a sectional view taken along line XIII-XIII shown in FIG. 12.
Figure 14:
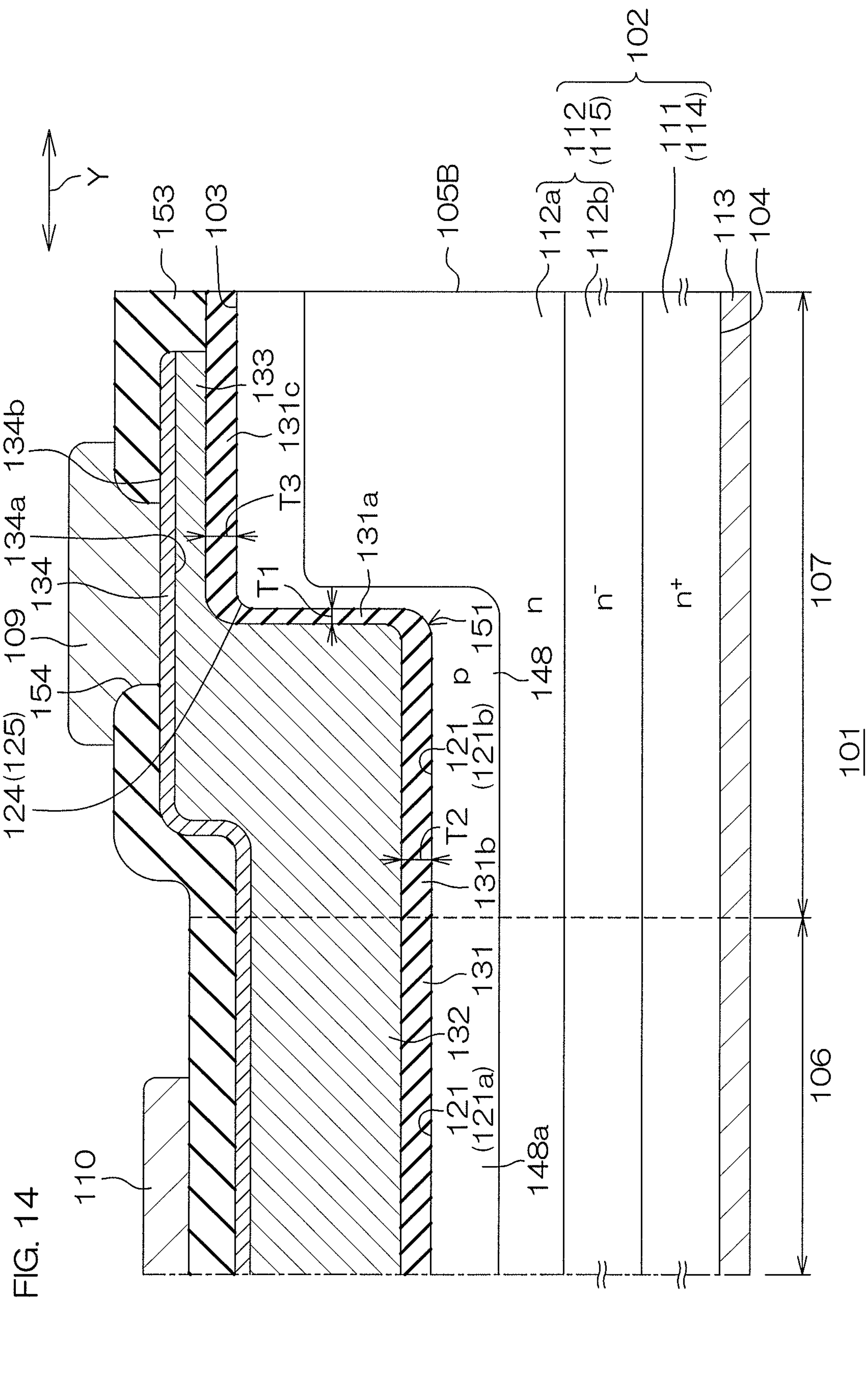
FIG. 14 is a sectional view taken along line XIV-XIV shown in FIG. 12.

FIG. 12 is an enlarged view of a region XII shown in FIG. 11 and is an enlarged view for describing the structure of the first main surface 103 of the SiC semiconductor layer 102. FIG. 13 is a sectional view taken along line XIII-XIII shown in FIG. 12. FIG. 14 is a sectional view taken along line XIV-XIV shown in FIG. 12.

Referring to FIG. 12 to FIG. 14, the SiC semiconductor layer 102 has a laminated structure including an $n^+$-type SiC semiconductor substrate 111 and an n-type SiC epitaxial layer 112, in this embodiment. The second main surface 104 of the SiC semiconductor layer 102 is formed by the SiC semiconductor substrate 111.

The first main surface 103 of the SiC semiconductor layer 102 is formed by the SiC epitaxial layer 112. The second main surface 104 of the SiC semiconductor layer 102 may be a ground surface. The second main surface 104 of the SiC semiconductor layer 102 may have grinding marks.

A thickness of the SiC semiconductor substrate 111 may be not less than 1 μm and less than 1000 μm. The thickness of the SiC semiconductor substrate 111 may be not less than 5 μm. The thickness of the SiC semiconductor substrate 111 may be not less than 25 μm. The thickness of the SiC semiconductor substrate 111 may be not less than 50 μm. The thickness of the SiC semiconductor substrate 111 may be not less than 100 μm.

The thickness of the SiC semiconductor substrate 111 may be not more than 700 μm. The thickness of the SiC semiconductor substrate 111 may be not more than 500 μm. The thickness of the SiC semiconductor substrate 111 may be not less than 400 μm. The thickness of the SiC semiconductor substrate 111 may be not more than 300 μm.

The thickness of the SiC semiconductor substrate 111 may be not more than 250 μm. The thickness of the SiC semiconductor substrate 111 may be not more than 200 μm. The thickness of the SiC semiconductor substrate 111 may be not more than 150 μm. The thickness of the SiC semiconductor substrate 111 may be not more than 100 μm.

The thickness of the SiC semiconductor substrate 111 is preferably not more than 150 μm. By making the thickness of the SiC semiconductor substrate 111 small, reduction of resistance value can be achieved by shortening of a current path.

A thickness of the SiC epitaxial layer 112 may be not less than 1 μm and not more than 100 μm. The thickness of the SiC epitaxial layer 112 may be not less than 5 μm. The thickness of the SiC epitaxial layer 112 may be not less than 10 μm.

The thickness of the SiC epitaxial layer 112 may be not more than 50 μm. The thickness of the SiC epitaxial layer 112 may be not more than 40 μm. The thickness of the SiC epitaxial layer 112 may be not more than 30 μm.

The thickness of the SiC epitaxial layer 112 may be not more than 20 μm. The thickness of the SiC epitaxial layer 112 is preferably not more than 15 μm. The thickness of the SiC epitaxial layer 112 is preferably not more than 10 μm.

An n-type impurity concentration of the SiC epitaxial layer 112 is not more than an n-type impurity concentration of the SiC semiconductor substrate 111. More specifically, the n-type impurity concentration of the SiC epitaxial layer 112 is less than the n-type impurity concentration of the SiC semiconductor substrate 111.

The n-type impurity concentration of the SiC semiconductor substrate 111 may be not less than $1.0\times10^{18}$ $cm^{-3}$ and not more than $1.0\times10^{21}$ $cm^{-3}$. The n-type impurity concentration of the SiC epitaxial layer 112 may be not less than $1.0\times10^{15}$ $cm^{-3}$ and not more than $1.0\times10^{18}$ $cm^{-3}$. The SiC epitaxial layer 112 has a plurality of regions having different n-type impurity concentrations along the direction normal to the first main surface 103 of the SiC semiconductor layer 102, in this embodiment.

More specifically, the SiC epitaxial layer 112 includes a high concentration region 112*a* having a comparatively high n-type impurity concentration and a low concentration region 112*b* having a low n-type impurity concentration with respect to the high concentration region 112*a*. The high concentration region 112*a* is formed in a region at the first main surface 103 side. The low concentration region 112*b* is formed in a region at the SiC semiconductor substrate 111 side with respect to the high concentration region 112*a*.

The n-type impurity concentration of the high concentration region 112*a* may be not less than $1\times10^{16}$ $cm^{-3}$ and not more than $1\times10^{18}$ $cm^{-3}$. The n-type impurity concentration of the low concentration region 112*b* may be not less than $1\times10^{15}$ $cm^{-3}$ and not more than $1\times10^{16}$ $cm^{-3}$. A thickness of the high concentration region 112*a* is not more than a thickness of the low concentration region 112*b*. More specifically, the thickness of the high concentration region 112*a* is less than the thickness of the low concentration region 112*b*.

A drain pad 113 serving as a second main surface electrode is connected to the second main surface 104 of the SiC semiconductor layer 102. A maximum voltage that can be applied across the source pad 110 and the drain pad 113 in an off state may be not less than 1000 V and not more than 10000 V.

The SiC semiconductor substrate 111 is formed as a drain region 114 of the MISFET. The SiC epitaxial layer 112 is formed as a drift region 115 of the MISFET.

A p-type body region 116 is formed in a surface layer portion of the first main surface 103 of the SiC semiconductor layer 102 in the active region 106. A p-type impurity concentration of the body region 116 may be not less than $1\times10^{17}$ $cm^{-3}$ and not more than $1\times10^{20}$ $cm^{-3}$. The active region 106 is defined by the body region 116.

A plurality of gate trenches 121 is formed in the surface layer portion of the first main surface 103 of the SiC semiconductor layer 102 in the active region 106. The gate trenches 121 are formed at intervals along an arbitrary first direction X. The gate trenches 121 are formed in band shapes extending along a second direction Y intersecting the first direction X.

The first direction X is, more specifically, a direction along the side surfaces 105B and 105D of the SiC semiconductor layer 102. The second direction Y is a direction orthogonal to the first direction X. The second direction Y is also a direction along the side surfaces 105A and 105C of the SiC semiconductor layer 102.

The gate trenches 121 are formed in a stripe shape in plan view. The gate trench 121 extends as a band from a peripheral edge portion at one side (the side surface 105B side) to a peripheral edge portion at another side (the side surface 105D side) of the first main surface 103 of the SiC semiconductor layer 102 in plan view, in this embodiment.

Each gate trench 121 crosses an intermediate portion between the peripheral edge portion at one side of the first main surface 103 and the peripheral edge portion at the other side of the first main surface 103 in plan view. One end portion of each gate trench 121 is positioned at the peripheral edge portion at one side of the first main surface 103 of the SiC semiconductor layer 102. Another end portion of each gate trench 121 is positioned at the peripheral edge portion at the other side of the first main surface 103 of the SiC semiconductor layer 102.

The first direction X may be set to the [11-20] direction ([−1-120] direction). In this case, each gate trench 121 may extend along the [11-20] direction. The first direction X may be set to a [−1100] direction ([1-100] direction) orthogonal to the [11-20] direction. In this case, each gate trench 121 may extend along the [−1100] direction ([1-100] direction).

Each gate trench 121 has a length of the millimeter order (a length not less than 1 mm). The length of the gate trench 121 is a length from an end portion at a side of a connection portion of the gate trench 121 and the gate finger 109 in the section shown in FIG. 14 to an end portion at an opposite side.

The length of each gate trench 121 may be not less than 0.5 mm. The length of each gate trench 121 is not less than 1 mm and not more than 10 mm (for example, not less than 2 mm and not more than 5 mm), in this embodiment. A total extension of one or a plurality of the gate trenches 121 per unit area may be not less than 0.5 μm/μm$^2$ and not more than 0.75 μm/μm$^2$.

Each gate trench 121 integrally includes an active trench portion 121*a* and a contact trench portion 121*b*. The active trench portion 121*a* is a portion of the gate trench 121 formed in the active region 106. The contact trench portion 121*b* is a portion of the gate trench 121 that is lead out from the active trench portion 121*a* to the outer region 107.

Each gate trench 121 penetrates through the body region 116 and reaches the SiC epitaxial layer 112. A bottom wall of each gate trench 121 is positioned inside the SiC epitaxial layer 112. More specifically, the bottom wall of each gate trench 121 is positioned in the high concentration region 112*a* of the SiC epitaxial layer 112.

A depth of the gate trench 121 in regard to the direction normal to the first main surface 103 of the SiC semiconductor layer 102 may be not less than 0.5 μm and not more than 3 μm (for example, approximately 1 μm). The depth of the gate trench 121 is preferably not less than 0.5 μm and not more than 1.0 μm.

A first direction width of the gate trench 121 may be not less than 0.1 μm and not more than 2 μm (for example, approximately 0.5 μm). The first direction width of the gate trench 121 is preferably not less than 0.1 μm and not more than 0.5 μm.

Referring to FIG. 13 and FIG. 14, an opening edge portion 124 of each gate trench 121 includes a curved portion 125 curving toward an inner side of the gate trench 121. The opening edge portion 124 of the gate trench 121 is a corner portion connecting the first main surface 103 of the SiC semiconductor layer 102 and a side wall of the gate trench 121.

An electric field at the opening edge portion 124 of the gate trench 121 is dispersed along the curved portion 125. Concentration of electric field with respect to the opening edge portion 124 of the gate trench 121 can thereby be relaxed.

$n^+$-type source regions 126 are formed in regions of a surface layer portion of the body region 116 along the side walls of the gate trenches 121. An n-type impurity concentration of the source regions 126 may be not less than $1.0\times10^{18}$ cm$^{-3}$ and not more than $1.0\times10^{21}$ cm$^{-3}$.

A plurality of the source regions 126 is formed along the side wall at one side and the side wall at another side of the gate trench 121 in regard to the first direction X. The source regions 126 are respectively formed in band shapes extending along the second direction Y. The source regions 126 are formed in a stripe shape in plan view.

A gate insulating layer 131 and a gate electrode layer 132 are formed inside each gate trench 121. In FIG. 12, the gate insulating layer 131 and the gate electrode layer 132 are shown with hatching applied for clarity.

The gate insulating layer 131 may include silicon oxide. The gate insulating layer 131 may include another insulating film such as silicon nitride, etc. The gate insulating layer 131 is formed in a film shape along inner wall surface of the gate trench 121 such as to define a recessed space inside the gate trench 121.

The gate insulating layer 131 includes a first region 131*a*, a second region 131*b*, and a third region 131*c*. The first region 131*a* is formed along the side wall of the gate trench 121. The second region 131*b* is formed along the bottom wall of the gate trench 121. The third region 131*c* is formed along the first main surface 103 of the SiC semiconductor layer 102.

A thickness T1 of the first region 131*a* is smaller than a thickness T2 of the second region 131*b* and a thickness T3 of the third region 131*c*. A ratio T2/T1 of the thickness T2 of the second region 131*b* with respect to the thickness T1 of the first region 131*a* may be not less than 2 and not more than 5. A ratio T3/T1 of the thickness T3 of the third region 131*c* with respect to the thickness T1 of the first region 131*a* may be not less than 2 and not more than 5.

The thickness T1 of the first region 131*a* may be not less than 0.01 μm and not more than 0.2 μm. The thickness T2 of the second region 131*b* may be not less than 0.05 μm and not more than 0.5 μm. The thickness T3 of the third region 131*c* may be not less than 0.05 μm and not more than 0.5 μm.

Increase of carriers induced in regions of the body region 116 in vicinities of the side wall of the gate trench 121 can be suppressed by thinly forming the first region 131*a* of the gate insulating layer 131. Increase of channel resistance can thereby be suppressed.

Concentration of electric field with respect to the bottom wall of the gate trench 121 can be relaxed by thickly forming the second region 131*b* of the gate insulating layer 131.

A withstand voltage of the gate insulating layer 131 in a vicinity of the opening edge portion 124 of the gate trench 121 can be improved by thickly forming the third region 131*c* of the gate insulating layer 131. Also, loss of the third region 131*c* due to an etching method can be suppressed by thickly forming the third region 131*c*.

Removal of the first region 131*a* by the etching method due to the loss of the third region 131*c* can thereby be suppressed. Consequently, the gate electrode layer 132 can be made to face the SiC semiconductor layer 102 appropriately across the gate insulating layer 131.

The gate electrode layer 132 is embedded in the gate trench 121 across the gate insulating layer 131. More specifically, the gate electrode layer 132 is embedded in the gate trench 121 such as to fill the recessed space defined by the gate insulating layer 131. The gate electrode layer 132 is controlled by the gate voltage.

Referring to FIG. 13 and FIG. 14, the gate electrode layer 132 is formed as a wall shape extending along the direction normal to the first main surface 103 of the SiC semiconductor layer 102 in a sectional view orthogonal to the direction in which the gate trench 121 extends.

The gate electrode layer 132 has an upper end portion positioned at an opening side of the gate trench 121. The upper end portion of the gate electrode layer 132 is formed in a curved shape that is recessed toward the bottom wall of the gate trench 121.

A cross-sectional area of the gate electrode layer 132 (cross-sectional area orthogonal to the direction of extension of the gate trench 121) may be not less than 0.05 μm$^2$ and not more than 0.5 $\mu m^2$. The cross-sectional area of the gate electrode layer 132 is defined as a product of a depth of the gate electrode layer 132 and a width of the gate electrode layer 132.

The depth of the gate electrode layer 132 is a distance from the upper end portion to a lower end portion of the gate electrode layer 132. The width of the gate electrode layer 132 is a width of the trench at an intermediate position between the upper end portion and the lower end portion of the gate electrode layer 132. When the upper end portion is a curved surface (a curved shape that is recessed toward the lower side in this embodiment), a position of the upper end portion of the gate electrode layer 132 is deemed to be an intermediate position in the depth direction of the upper surface of the gate electrode layer 132.

The gate electrode layer 132 contains a p-type polysilicon doped with a p-type impurity. The p-type impurity may include at least one of material among boron (B), aluminum (Al), indium (In), or gallium (Ga).

A p-type impurity concentration of the gate electrode layer 132 is not less than the p-type impurity concentration of the body region 116. More specifically, the p-type impurity concentration of the gate electrode layer 132 is greater than the p-type impurity concentration of the body region 116.

The p-type impurity concentration of the gate electrode layer 132 may be not less than $1\times10^{18}$ $cm^{-3}$ and not more than $1\times10^{22}$ $cm^{-3}$. A sheet resistance of the gate electrode layer 132 may be not less than 10Ω/□ and not more than 500Ω/□ (approximately 200Ω/□ in this embodiment).

Referring to FIG. 14, a gate wiring layer 133 is formed in the outer region 107. The gate wiring layer 133 is electrically connected to the gate pad 108 and the gate finger 109.

The gate wiring layer 133 is formed on the first main surface 103 of the SiC semiconductor layer 102. More specifically, the gate wiring layer 133 is formed on the third region 131*c* of the gate insulating layer 131.

The gate wiring layer 133 is formed along the gate finger 109, in this embodiment. The gate wiring layer 133 is formed along the three side surfaces 105A, 105B, and 105D of the SiC semiconductor layer 102 such as to define the active region 106 from three directions.

The gate wiring layer 133 is connected to the gate electrode layer 132 exposed from the contact trench portion 121*b* of each gate trench 121. The gate wiring layer 133 is formed by a lead-out portion lead out from the gate electrode 132 to above the first main surface 103 of the SiC semiconductor layer 102, in this embodiment. An upper end portion of the gate wiring layer 133 is connected to the upper end portions of the gate electrode layer 132.

Referring to FIG. 13, a low resistance electrode layer 134 is formed on the gate electrode layer 132. The low resistance electrode layer 134 covers the upper end portion of the gate electrode layer 132, inside the gate trench 121.

The low resistance electrode layer 134 contains a conductive material having a sheet resistance less than the sheet resistance of the gate electrode layer 132. A sheet resistance of the low resistance electrode layer 134 may be not less than 0.01Ω/□ and not more than 10 Ω/□.

A current supplied into the gate trenches 121 flows through the low resistance electrode layer 134 having the comparatively low sheet resistance and is transmitted to entirety of the gate electrode layer 132. The entirety of the gate electrode layer 132 (entire area of the active region 106) can thereby be made to transition rapidly from an off state to an on state and therefore delay of switching response can be suppressed.

In particular, although time is required for transmission of current in a case of the gate trenches 121 having the length of the millimeter order, the delay of the switching response can be suppressed appropriately by the low resistance electrode layer 134. That is, the low resistance electrode layer 134 is formed as a current diffusing electrode layer that diffuses the current into the gate trench 121.

Also, as refinement of cell structure progresses, the width, depth, cross-sectional area, etc., of the gate electrode layer 132 decreases and there is thus concern for the delay of the switching response due to increase of electrical resistance inside the gate trench 121.

However, the entirety of the gate electrode layer 132 can be made to transition rapidly from the off state to the on state by the low resistance electrode layer 134 and therefore the delay of the switching response due to refinement can be suppressed.

The low resistance electrode layer 134 is formed in a film shape. The low resistance electrode layer 134 has a connection portion 134*a* in contact with the upper end portion of the gate electrode layer 132 and a non-connection portion 134*b* opposite thereof. The connection portion 134*a* and the non-connection portion 134*b* of the low resistance electrode layer 134 may be formed in curved shapes conforming to the upper end portion of the gate electrode layer 132. The connection portion 134*a* and the non-connection portion 134*b* of the low resistance electrode layer 134 may take on any of various configurations.

An entirety of the connection portion 134*a* of the low resistance electrode layer 134 may be positioned higher than the first main surface 103 of the SiC semiconductor layer 102. The entirety of the connection portion 134*a* of the low resistance electrode layer 134 may be positioned lower than the first main surface 103 of the SiC semiconductor layer 102.

The connection portion 134*a* of the low resistance electrode layer 134 may include a portion positioned higher than the first main surface 103 of the SiC semiconductor layer 102. The connection portion 134*a* of the low resistance electrode layer 134 may include a portion positioned lower than the first main surface 103 of the SiC semiconductor layer 102.

For example, a central portion of the connection portion 134*a* of the low resistance electrode layer 134 may be positioned lower than the first main surface 103 of the SiC semiconductor layer 102 and a peripheral edge portion of the connection portion 134*a* of the low resistance electrode layer 134 may be positioned higher than the first main surface 103 of the SiC semiconductor layer 102.

An entirety of the non-connection portion 134*b* of the low resistance electrode layer 134 may be positioned higher than the first main surface 103 of the SiC semiconductor layer 102. The entirety of the non-connection portion 134*b* of the low resistance electrode layer 134 may be positioned lower than the first main surface 103 of the SiC semiconductor layer 102.

The non-connection portion 134*b* of the low resistance electrode layer 134 may include a portion positioned higher than the first main surface 103 of the SiC semiconductor layer 102. The non-connection portion 134*b* of the low resistance electrode layer 134 may include a portion positioned lower than the first main surface 103 of the SiC semiconductor layer 102.

For example, a central portion of the non-connection portion 134*b* of the low resistance electrode layer 134 may be positioned lower than the first main surface 103 of the SiC semiconductor layer 102 and a peripheral edge portion of the non-connection portion 134*b* of the low resistance electrode layer 134 may be positioned higher than the first main surface 103 of the SiC semiconductor layer 102.

The low resistance electrode layer 134 has an edge portion 134*c* contacting the gate insulating layer 131. The edge portion 134*c* of the low resistance electrode layer 134 contacts a corner portion connecting the first region 131*a* and the second region 131*b* of the gate insulating layer 131.

The edge portion 134*c* of the low resistance electrode layer 134 is formed in a region at the first main surface 103 side of the SiC semiconductor layer 102 with respect to bottom portions of the source regions 126. That is, the edge portion 134*c* of the low resistance electrode layer 134 is formed in a region further to the first main surface 103 side of the SiC semiconductor layer 102 than boundary regions between the body region 116 and the source regions 126.

The edge portion 134*c* of the low resistance electrode layer 134 thus faces the source regions 126 across the gate insulating layer 131. The edge portion 134*c* of the low resistance electrode layer 134 is free from facing the body region 116 across the gate insulating layer 131.

Formation of a current path in a region of the gate insulating layer 131 between the low resistance electrode layer 134 and the body region 116 can thereby be suppressed. The current path may be formed by undesired diffusion of an electrode material of the low resistance electrode layer 134 into the gate insulating layer 131.

In particular, a design of connecting the edge portion 134*c* of the low resistance electrode layer 134 to the comparatively thick third region 131*c* of the gate insulating layer 131 (corner portion of the gate insulating layer 131) is effective in terms of reducing a risk of formation of the current path.

In regard to the direction normal to the first main surface 103 of the SiC semiconductor layer 102, a thickness TR of the low resistance electrode layer 134 is not more than a thickness TG of the gate electrode layer 132 ($TR \leq TG$). The thickness TR of the low resistance electrode layer 134 is preferably less than the thickness TG of the gate electrode layer 132 ($TR < TG$). More specifically, the thickness TR of the low resistance electrode layer 134 is preferably not more than half the thickness TG of the gate electrode layer 132 ($TR \leq TG/2$).

A ratio TR/TG of the thickness TR of the low resistance electrode layer 134 with respect to the thickness TG of the gate electrode layer 132 is not less than 0.01 and not more than 1. The thickness TG of the gate electrode layer 132 may be not less than 0.5 μm and not more than 3 μm. The thickness TR of the low resistance electrode layer 134 may be not less than 0.01 μm and not more than 3 μm.

Referring to FIG. 14, the low resistance electrode layer 134 also covers the upper end portion of the gate wiring layer 133, in this embodiment. A portion of the low resistance electrode layer 134 that covers the upper end portion of the gate wiring layer 133 is formed integral to a portion of the low resistance electrode layer 134 covering the upper end portion of the gate electrode layer 132. The low resistance electrode layer 134 thereby covers entire areas of the gate electrode layers 132 and an entire area of the gate wiring layer 133.

A current supplied to the gate wiring layer 133 from the gate pad 108 and the gate finger 109 thus flows through the low resistance electrode layers 134 having comparatively low sheet resistance and is transmitted to the entireties of the gate electrode layers 132 and the gate wiring layer 133.

The entirety of the gate electrode layer 132 (the entire area of the active region 106) can thereby be made to transition rapidly from the off state to the on state via the gate wiring layer 133 and therefore the delay of the switching response can be suppressed.

In particular, in the case of the gate trenches 121 having the length of the millimeter order, the delay of the switching response can be suppressed appropriately by the low resistance electrode layer 134 covering the upper end portion of the gate wiring layer 133.

The low resistance electrode layer 134 includes a polycide layer. The polycide layer is formed by a portion of the p-type polysilicon forming a surface layer portion of the gate electrode layer 132 silicided by a metal material. More specifically, the polycide layer is made of a p-type polycide layer that contains the p-type impurity doped in the gate electrode layer 132 (p-type polysilicon).

The polycide layer has a specific resistance of not less than 10 μΩ·cm and not more than 110 μΩ·cm, in this embodiment. More specifically, the polycide layer contains at least one of material among TiSi, $TiSi_2$, NiSi, CoSi, $CoSi_2$, $MoSi_2$, or $WSi_2$.

A sheet resistance inside the gate trench 121 when the low resistance electrode layer 134 is formed on the p-type polysilicon is not more than a sheet resistance of the gate electrode layer 132 (p-type polysilicon) alone. The sheet resistance inside the gate trench 121 is preferably not more than a sheet resistance of an n-type polysilicon doped with an n-type impurity.

The sheet resistance inside the gate trench 121 is approximated to the sheet resistance of the low resistance electrode layer 134. That is, the sheet resistance inside the gate trench 121 may be not less than 0.01Ω/□ and not more than 10Ω/□. The sheet resistance inside the gate trench 121 is preferably less than 10 Ω/□.

Figure 15:
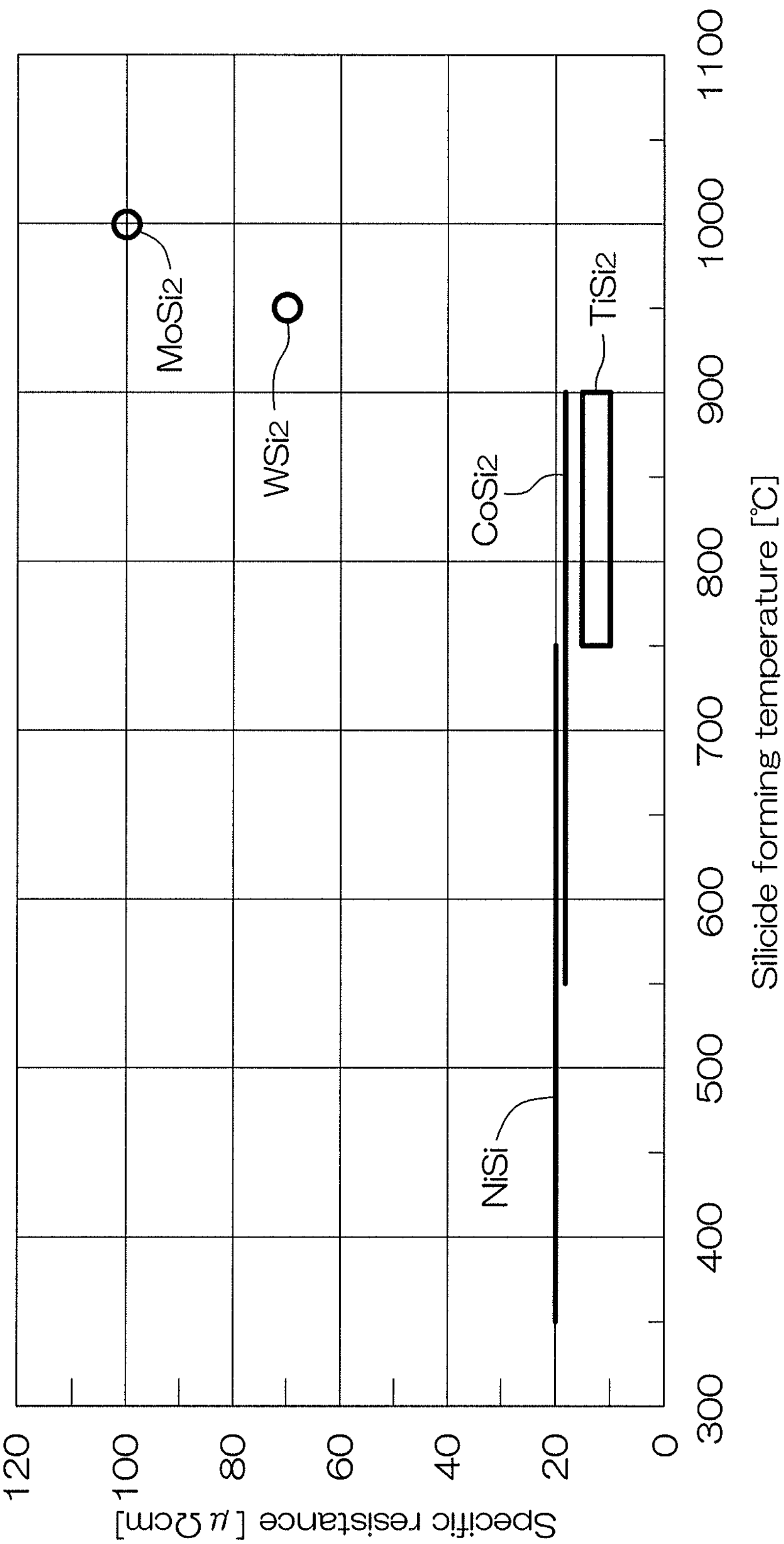
FIG. 15 is a graph of relationships of specific resistances and forming temperatures of polycides.

Results of examining the specific resistance of the polycide layer are shown in FIG. 15. FIG. 15 is a graph of relationships of the specific resistance and forming temperature of polycides. In FIG. 15, the ordinate indicates the specific resistance [μΩ·cm] and the abscissa indicates the polycide forming temperature [° C.].

Referring to FIG. 15, the specific resistance decreases in the order of $MoSi_2$, $WSi_2$, NiSi, $CoSi_2$, and $TiSi_2$. Preference of material used as the polycide layer thus increases in the order of $MoSi_2$, $WSi_2$, NiSi, $CoSi_2$, and $TiSi_2$.

Among the above types of materials, NiSi, $CoSi_2$, and $TiSi_2$ are especially suitable as the polycide layer forming the low resistance electrode layer 134 due to having comparatively low value in the specific resistance and temperature dependence.

Furthermore, as a result of the verification by the inventors, in a case in which $TiSi_2$ was adopted as the material of the low resistance electrode layer 134, an increase in a leakage current between the gate and the source was observed during application of low electric field. On the other hand, in a case in which $CoSi_2$ was adopted, no increase in the leakage current between the gate and the source was observed during application of low electric field. $CoSi_2$ is most preferable as the polycide layer forming the low resistance electrode layer 134, in consideration that NiSi has a problem in heat resistance in comparison to $CoSi_2$.

Referring to FIG. 12 and FIG. 13, a plurality of source trenches 141 is formed in the first main surface 103 of the SiC semiconductor layer 102 in the active region 106. Each source trench 141 is formed in a region between two mutually adjacent gate trenches 121.

The source trenches 141 are respectively formed in a band shape extending along the second direction Y. The source trenches 141 are formed in a stripe shape in plan view. In regard to the first direction X, a pitch between central portions of mutually adjacent source trenches 141 may be not less than 1.5 μm and not more than 3 μm.

Each source trench 141 penetrates through the body region 116 and reaches the SiC epitaxial layer 112. A bottom wall of each source trench 141 is positioned inside the SiC epitaxial layer 112. More specifically, the bottom wall of each source trench 141 is positioned in the high concentration region 112*a* of the SiC epitaxial layer 112.

A depth of the source trench 141 may be substantially equal to the depth of the gate trench 121. The depth of the source trench 141 may be not less than the depth of the gate trench 121. In regard to the direction normal to the first main surface 103 of the SiC semiconductor layer 102, the depth of the source trench 141 may be not less than 0.5 μm and not more than 10 μm (for example, approximately 1 μm).

A first direction width of the source trench 141 may be substantially equal to the first direction width of the gate trench 121. The first direction width of the source trench 141 may be not less than the first direction width of the gate trench 121. The first direction width of the source trench 141 may be not less than 0.1 μm and not more than 2 μm (for example, approximately 0.5 μm).

An opening edge portion 142 of each source trench 141 includes a curved portion 143 curving toward an inner side of the source trench 141. The opening edge portion 142 of the source trench 141 is a corner portion connecting the first main surface 103 of the SiC semiconductor layer 102 and side wall of the source trench 141.

An electric field at the opening edge portion 142 of the source trench 141 is dispersed along the curved portion 143. Concentration of electric field with respect to the opening edge portion 142 of the source trench 141 can thereby be relaxed.

A plurality of $p^+$-type contact regions 144 is formed in regions of the SiC semiconductor layer 102 along the side walls of the source trenches 141. A p-type impurity concentration of the contact regions 144 may be not less than $1.0\times10^{18}$ $cm^{-3}$ and not more than $1.0\times10^{21}$ $cm^{-3}$. The contact regions 144 are formed with respect to each of the side wall at one side and the side wall at another side of one source trench 141.

The contact regions 144 are formed at intervals along the second direction Y. The contact regions 144 are formed at intervals along the first direction X from the gate trenches 121.

A p-type deep well region 145 is formed in a region of the SiC semiconductor layer 102 along inner wall of the source trench 141. The deep well region 145 is also referred to as a withstand voltage holding region. The deep well region 145 is formed in a band shape extending along the source trench 141. The deep well region 145 extends along the inner wall of the source trench 141.

Referring to FIG. 12 and FIG. 14, more specifically, the deep well region 145 extends along the side wall of the source trench 141 and passes along an edge portion to cover the bottom wall of the source trench 141. The deep well region 145 is continuous to the body region 116 at the side wall of the source trench 141.

The deep well region 145 has a bottom portion positioned at the second main surface 104 side of the SiC semiconductor layer 102 with respect to the bottom wall of the gate trench 121. The deep well region 145 is formed in the high concentration region 112*a* of the SiC epitaxial layer 112.

A p-type impurity concentration of the deep well region 145 may be substantially equal to the p-type impurity concentration of the body region 116. The p-type impurity concentration of the deep well region 145 may exceed the p-type impurity concentration of the body region 116. The p-type impurity concentration of the deep well region 145 may be less than the p-type impurity concentration of the body region 116.

The p-type impurity concentration of the deep well region 145 may be not more than the p-type impurity concentration of the contact region 144. The p-type impurity concentration of the deep well region 145 may be less than the p-type impurity concentration of the contact region 144. The p-type impurity concentration of the deep well region 21 may be not less than $1.0\times10^{17}$ $cm^{-3}$ and not more than $1.0\times10^{19}$ $cm^{-3}$.

Referring to FIG. 12 and FIG. 14, a p-type peripheral edge deep well region 148 is formed in the outer region 107. The peripheral edge deep well region 148 is electrically connected to the deep well regions 145.

The peripheral edge deep well region 148 forms an equal potential with the deep well regions 145. The peripheral edge deep well region 148 is formed integral to the deep well region 145, in this embodiment.

More specifically, the peripheral edge deep well region 148 extends as a band shape along the peripheral edge of the active region 106 in the outer region 107. More specifically, the peripheral edge deep well region 148 is formed in an endless shape (a quadrilateral annular shape in this embodiment) surrounding the active region 106.

The peripheral edge deep well region 148 is formed in the surface layer portion of the first main surface 103 of the SiC semiconductor layer 102 and formed in a region along inner wall of the contact trench portions 121*b* of the gate trench 121, in the outer region 107. The peripheral edge deep well region 148 extends along the side wall of the contact trench portion 121*b* and passes along edge portion to cover bottom wall of the contact trench portion 121*b*.

The peripheral edge deep well region 148 overlaps with the gate wiring layer 133 in plan view. That is, the peripheral edge deep well region 148 faces the gate wiring layer 133 across the gate insulating layer 131 (third region 131*c*).

The peripheral edge deep well region 148 has a bottom portion positioned at the second main surface 104 side of the SiC semiconductor layer 102 with respect to the bottom wall of the contact trench portion 121*b* of the gate trench 121. The peripheral edge deep well region 148 is formed in the high concentration region 112*a* of the SiC epitaxial layer 112.

The peripheral edge deep well region 148 has a lead-out portion 148*a* lead out from the outer region 107 to a peripheral edge portion of the active region 106 in plan view. The lead-out portion 148*a* of the peripheral edge deep well region 148 covers end portions of the source trenches 141 that are positioned at the outer region 107 side in plan view.

The lead-out portion 148*a* of the peripheral edge deep well region 148 covers inner wall of the active trench portion 121*a* at the peripheral edge portion of the active region 106. The lead-out portion 148*a* of the peripheral edge deep well region 148 extends along the side wall of the active trench portion 121*a* and passes along edge portion to cover bottom wall of the active trench portion 121*a*. The lead-out portion 148*a* of the peripheral edge deep well region 148 is continuous to the deep well region 145 in the active region 106.

The lead-out portion 148*a* of the peripheral edge deep well region 148 has a bottom portion positioned at the second main surface 104 side of the SiC semiconductor layer 102 with respect to the bottom wall of the active trench portion 121*a* of the gate trench 121. The lead-out portion

148*a* of the peripheral edge deep well region 148 is formed in the high concentration region 112*a* of the SiC epitaxial layer 112.

A p-type impurity concentration of the peripheral edge deep well region 148 may be substantially equal to the p-type impurity concentration of the body region 116. The p-type impurity concentration of the peripheral edge deep well region 148 may exceed the p-type impurity concentration of the body region 116. The p-type impurity concentration of the peripheral edge deep well region 148 may be less than the p-type impurity concentration of the body region 116.

The p-type impurity concentration of the peripheral edge deep well region 148 may be substantially equal to the p-type impurity concentration of the deep well region 145. The p-type impurity concentration of the peripheral edge deep well region 148 may exceed the p-type impurity concentration of the deep well region 145. The p-type impurity concentration of the peripheral edge deep well region 148 may be less than the p-type impurity concentration of the deep well region 145.

The p-type impurity concentration of the peripheral edge deep well region 148 may be not more than the p-type impurity concentration of the contact region 144. The p-type impurity concentration of the peripheral edge deep well region 148 may be less than the p-type impurity concentration of the contact region 144. The p-type impurity concentration of the peripheral edge deep well region 148 may be not less than $1.0\times10^{17}$ $cm^{-3}$ and not more than $1.0\times10^{19}$ $cm^{-3}$.

A source insulating layer 146 and a source electrode layer 147 are formed inside each source trench 141. In FIG. 12, the source insulating layer 146 and the source electrode layer 147 are shown with hatching applied for clarity.

The source insulating layer 146 may include silicon oxide. The source insulating layer 146 is formed in a film shape along inner wall surface of the source trench 141 such as to define a recessed space inside the source trench 141.

The source insulating layer 146 includes a first region 146*a* and a second region 146*b*. The first region 146*a* is formed along the side wall of the source trench 141. The second region 146*b* is formed along the bottom wall of the source trench 141. A thickness T11 of the first region 146*a* is smaller than a thickness T12 of the second region 146*b*.

A ratio T12/T11 of the thickness T12 of the second region 146*b* with respect to the thickness T11 of the first region 146*a* may be not less than 2 and not more than 5. The thickness T11 of the first region 146*a* may be not less than 0.01 μm and not more than 0.2 μm. The thickness T12 of the second region 146*b* may be not less than 0.05 μm and not more than 0.5 μm.

The thickness T11 of the first region 146*a* may be substantially equal to the thickness T1 of the first region 131*a* of the gate insulating layer 131. The thickness T12 of the second region 146*b* may be substantially equal to the thickness T2 of the second region 131*b* of the gate insulating layer 131.

The source insulating layer 146 exposes the opening edge portion 142 of the source trench 141. More specifically, the source insulating layer 146 exposes the source regions 126 and the contact regions 144 from the opening edge portion 142 of the source trench 141.

Even more specifically, the first region 146*a* of the source insulating layer 146 has an upper end portion positioned at an opening side of the source trench 141. The upper end portion of the first region 146*a* is formed lower than the first main surface 103 of the SiC semiconductor layer 102.

The upper end portion of the first region 146*a* exposes the side wall of the source trench 141 at the opening side of the source trench 141. The first region 146*a* thus exposes the source regions 126 and the contact regions 144 from the opening edge portion 142 of the source trench 141.

The source electrode layer 147 is embedded in the source trench 141 across the source insulating layer 146. More specifically, the source electrode layer 147 is embedded in the source trench 141 such as to fill the recessed space defined by the source insulating layer 146. The source electrode layer 147 is controlled by the source voltage.

The source electrode layer 147 has an upper end portion positioned at the opening side of the source trench 141. The upper end portion of the source electrode layer 147 is formed lower than the first main surface 103 of the SiC semiconductor layer 102. The upper end portion of the source electrode layer 147 may be formed to be flush with an upper end portion of the source insulating layer 146.

The upper end portion of the source electrode layer 147 may project higher than the upper end portion of the source insulating layer 146. The upper end portion of the source electrode layer 147 may be positioned lower than the upper end portion of the source insulating layer 146. A thickness of the source electrode layer 147 may be not less than 0.5 μm and not more than 10 μm (for example, approximately 1 μm).

The source electrode layer 147 preferably contains a polysilicon having properties close to SiC in terms of material properties. Stress arising inside the SiC semiconductor layer 102 can thereby be reduced. The source electrode layer 147 preferably contains a p-type polysilicon doped with a p-type impurity. In this case, the source electrode layers 147 can be formed at the same time as the gate electrode layers 132.

A p-type impurity concentration of the source electrode layer 147 is not less than the p-type impurity concentration of the body region 116. More specifically, the p-type impurity concentration of the source electrode layer 147 is greater than the p-type impurity concentration of the body region 116. The p-type impurity of the source electrode layer 147 may include at least one of material among boron (B), aluminum (Al), indium (In), or gallium (Ga).

The p-type impurity concentration of the source electrode layer 147 may be not less than $1\times10^{18}$ $cm^{-3}$ and not more than $1\times10^{22}$ $cm^{-3}$. A sheet resistance of the source electrode layer 147 may be not less than 10Ω/□ and not more than 500Ω/□ (approximately 200Ω/□ in this embodiment).

The p-type impurity concentration of the source electrode layer 147 may be substantially equal to the p-type impurity concentration of the gate electrode layer 132. The sheet resistance of the source electrode layer 147 may be substantially equal to the sheet resistance of the gate electrode layer 132.

The source electrode layer 147 may include an n-type polysilicon instead of the p-type polysilicon. The source electrode layer 147 may include at least one of material among tungsten, aluminum, copper, an aluminum alloy, or a copper alloy instead of the p-type polysilicon.

The semiconductor device 101 thus has trench gate structures 151 and trench source structures 152. The trench gate structure 151 includes the gate trench 121, the gate insulating layer 131, the gate electrode layer 132, and the low resistance electrode layer 134. The trench source structure 152 includes the source trench 141, the source insulating layer 146, and the source electrode layer 147.

Referring to FIG. 13 and FIG. 14, an interlayer insulating layer 153 is formed on the first main surface 103 of the SiC semiconductor layer 102. The interlayer insulating layer 153 covers a region above the trench gate structure 151 in the active region 106 and a region on the gate wiring layer 133 in the outer region 107.

The interlayer insulating layer 153 may include silicon oxide or silicon nitride. A gate contact hole 154 and a plurality of source contact holes 155 are formed in the interlayer insulating layer 153.

The gate contact hole 154 exposes the gate wiring layer 133 (low resistance electrode layer 134) in the outer region 107. Each source contact holes 155 exposes the source region 126, the contact region 144, and the trench source structure 152 in the active region 106. The gate pad 108, the gate finger 109, and the source pad 110 are formed on the interlayer insulating layer 153.

The gate finger 109 enters into the gate contact hole 154 from above the interlayer insulating layer 153. The gate finger 109 is electrically connected to the low resistance electrode layer 134 inside the gate contact hole 154. An electrical signal from the gate pad 108 is thereby transmitted to the gate electrode layer 132 via the low resistance electrode layer 134 having a comparatively low resistance value.

The source pad 110 enters into the source contact holes 155 from above the interlayer insulating layer 153. The source pad 110 is electrically connected to the source region 126, the contact region 144, and the source electrode layer 147 inside the source contact holes 155. The source electrode layers 147 may be formed using partial regions of the source pad 110.

Figure 16:
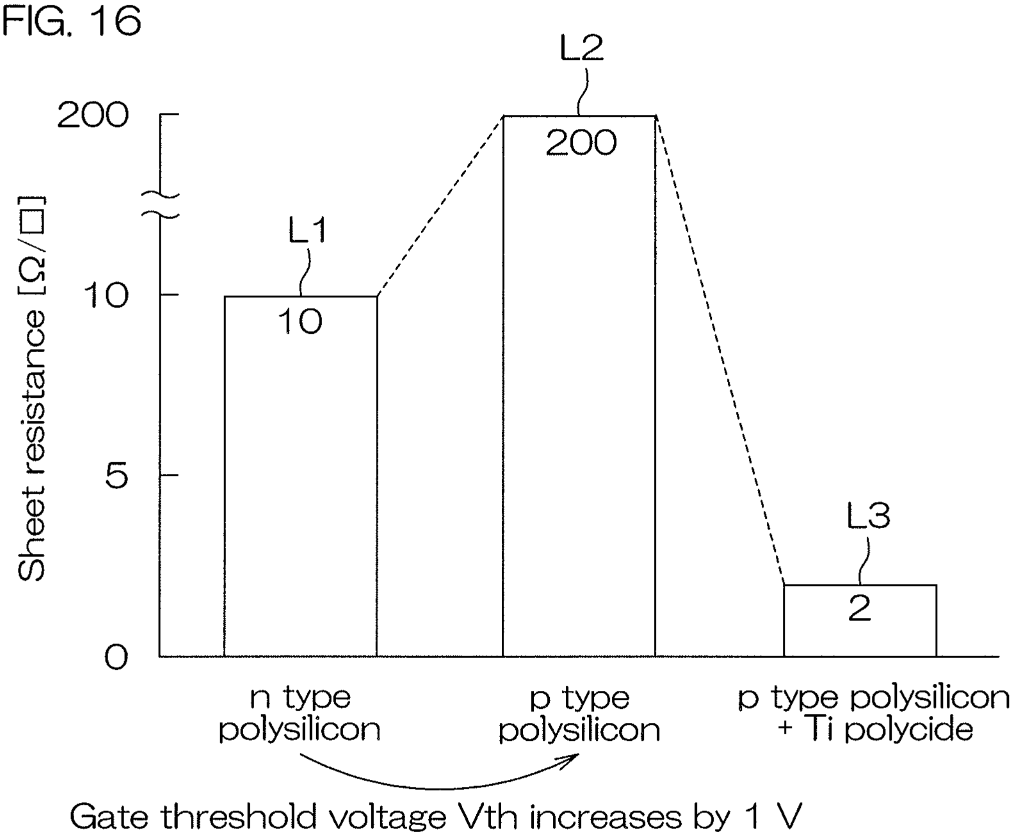
FIG. 16 is a graph for describing sheet resistance.

FIG. 16 is a graph for describing sheet resistance. In FIG. 16, the ordinate indicates the sheet resistance [Ω/□ ] and the abscissa indicates item. A first bar L1, a second bar L2, and a third bar L3 are shown in FIG. 16.

The first bar L1 indicates a sheet resistance of an n-type polysilicon. The second bar L2 indicates a sheet resistance of a p-type polysilicon. The third bar L3 indicates a sheet resistance in a case where the low resistance electrode layer 134 is formed on the p-type polysilicon. The low resistance electrode layer 134 here contains $TiSi_2$ (p-type titanium silicide).

Referring to the first bar L1, the sheet resistance of the n-type polysilicon was 10Ω/□. Referring to the second bar L2, the sheet resistance of the p-type polysilicon was 200Ω/□. Referring to the third bar L3, the sheet resistance in the case of forming the low resistance electrode layer 134 on the p-type polysilicon was 2 Ω/□.

The p-type polysilicon has a work function differing from the n-type polysilicon and just by embedding the p-type polysilicon in the gate trench 121, a gate threshold voltage Vth can be increased by approximately 1 V.

However, the p-type polysilicon has a sheet resistance that is several tens of times (20 times in the present example) greater than the sheet resistance of the n-type polysilicon. Therefore, in case in which the p-type polysilicon is used as the material of the gate electrode layer 132, energy loss increases significantly in accordance with an increase of parasitic resistance inside the gate trench 121 (hereinafter referred to simply as “gate resistance”).

On the other hand, with the structure having the low resistance electrode layer 134 on the p-type polysilicon, the sheet resistance can be lowered to not more than 1/100th in comparison to the case of not forming the low resistance electrode layer 134. With the structure having the low resistance electrode layer 134, the sheet resistance can be lowered to not more than 1/5th in comparison to the gate electrode layer 132 containing the n-type polysilicon.

As described above, with the semiconductor device 101, the trench gate structures 151 having the structure in which the gate electrode layer 132 is embedded across the gate insulating layer 131 in the gate trench 121. With the trench gate structure 151, the gate electrode layer 132 is covered by the low resistance electrode layer 134 in a limited space of the gate trench 121.

The gate electrode layer 132 contains the p-type polysilicon. The gate threshold voltage Vth can thereby be increased. The low resistance electrode layer 134 contains the conductive material having the sheet resistance less than the sheet resistance of the p-type polysilicon.

Reduction of the gate resistance can thereby be achieved. Consequently, a current can be diffused efficiently along the trench gate structures 151 and reduction of switching delay can thus be achieved.

Especially, with the structure where the gate electrode layer 132 is covered by the low resistance electrode layer 134, the p-type impurity concentration of the body region 116 does not have to be increased. The gate threshold voltage Vth can thus be increased while preventing the increase of channel resistance.

Also, with the semiconductor device 101, the gate wiring layer 133 is covered with the low resistance electrode layer 134 in the outer region 107. Reduction of a gate resistance of the gate wiring layer 133 can also be achieved thereby.

Especially, with the structure where the gate electrode layers 132 and the gate wiring layer 133 are covered by the low resistance electrode layer 134, the current can be diffused efficiently along the trench gate structures 151. The reduction of switching delay can thus be achieved appropriately.

FIG. 17A to FIG. 17L are sectional views of an example of a method for manufacturing the semiconductor device 101 shown in FIG. 11. FIG. 17A to FIG. 17L are sectional views of the portion corresponding to FIG. 12.

Figure 17A:
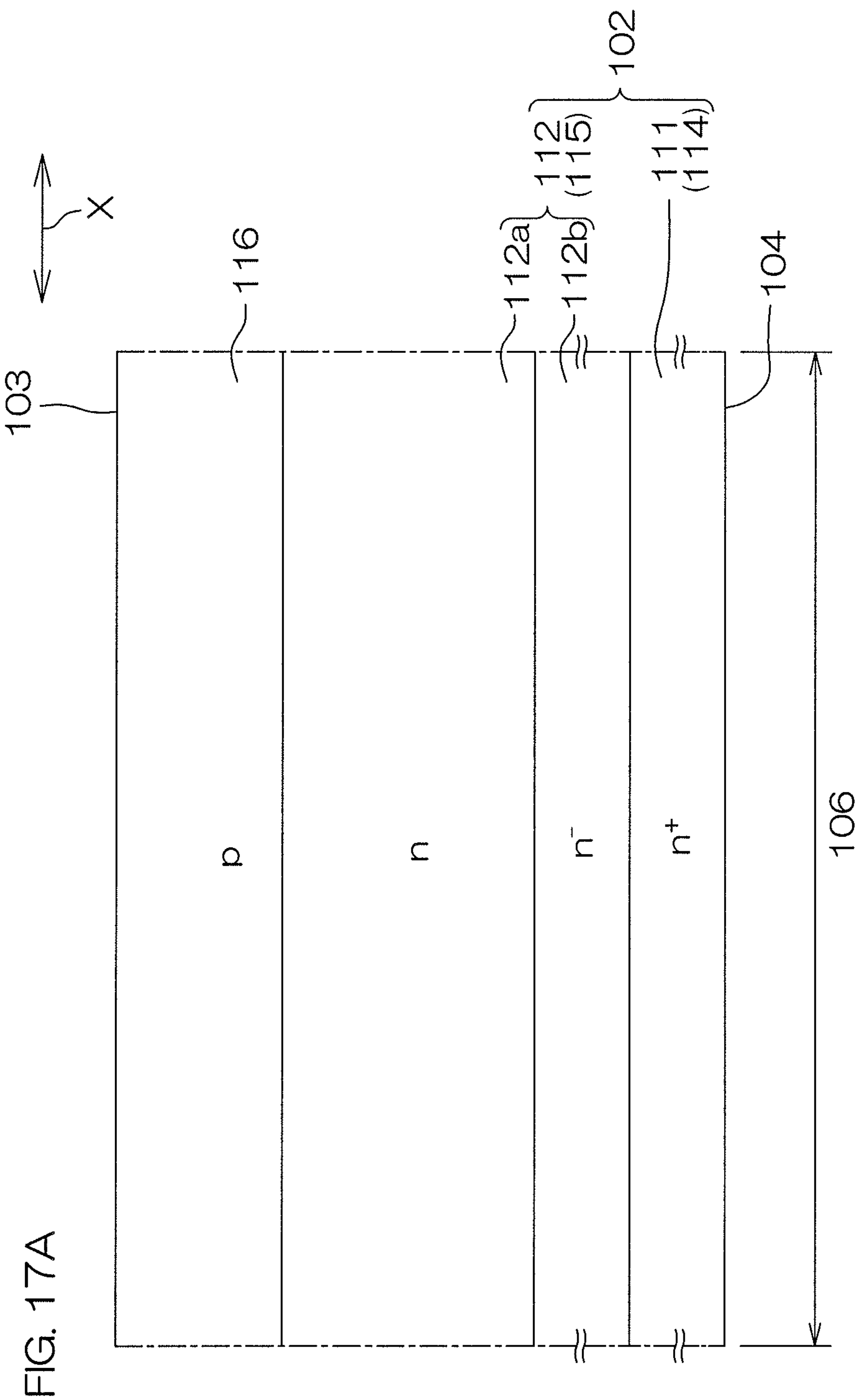
FIG. 17A is a sectional view of an example of a method for manufacturing the semiconductor device shown in FIG. 11.

Referring to FIG. 17A, first, the $n^+$-type SiC semiconductor substrate 111 is prepared. Next, the SiC epitaxial layer 112 is formed on a main surface of the SiC semiconductor substrate 111. The SiC epitaxial layer 112 is formed by growing SiC from above the main surface of the SiC semiconductor substrate 111 by an epitaxial growth method.

The SiC epitaxial layer 112 having the high concentration region 112*a* and the low concentration region 112*b* is formed, in this embodiment. The SiC semiconductor layer 102 including the SiC semiconductor substrate 111 and the SiC epitaxial layer 112 is thereby formed.

Next, the p-type body region 116 is formed in the surface layer portion of the first main surface 103 of the SiC semiconductor layer 102. The body region 116 is formed by introducing the p-type impurity into the first main surface 103 of the SiC semiconductor layer 102.

The body region 116 may be formed in the surface layer portion of the first main surface 103 of the SiC semiconductor layer 102 by an ion implantation method via an ion implantation mask (not shown). The active region 106 is defined by the body region 116.

Figure 17B:
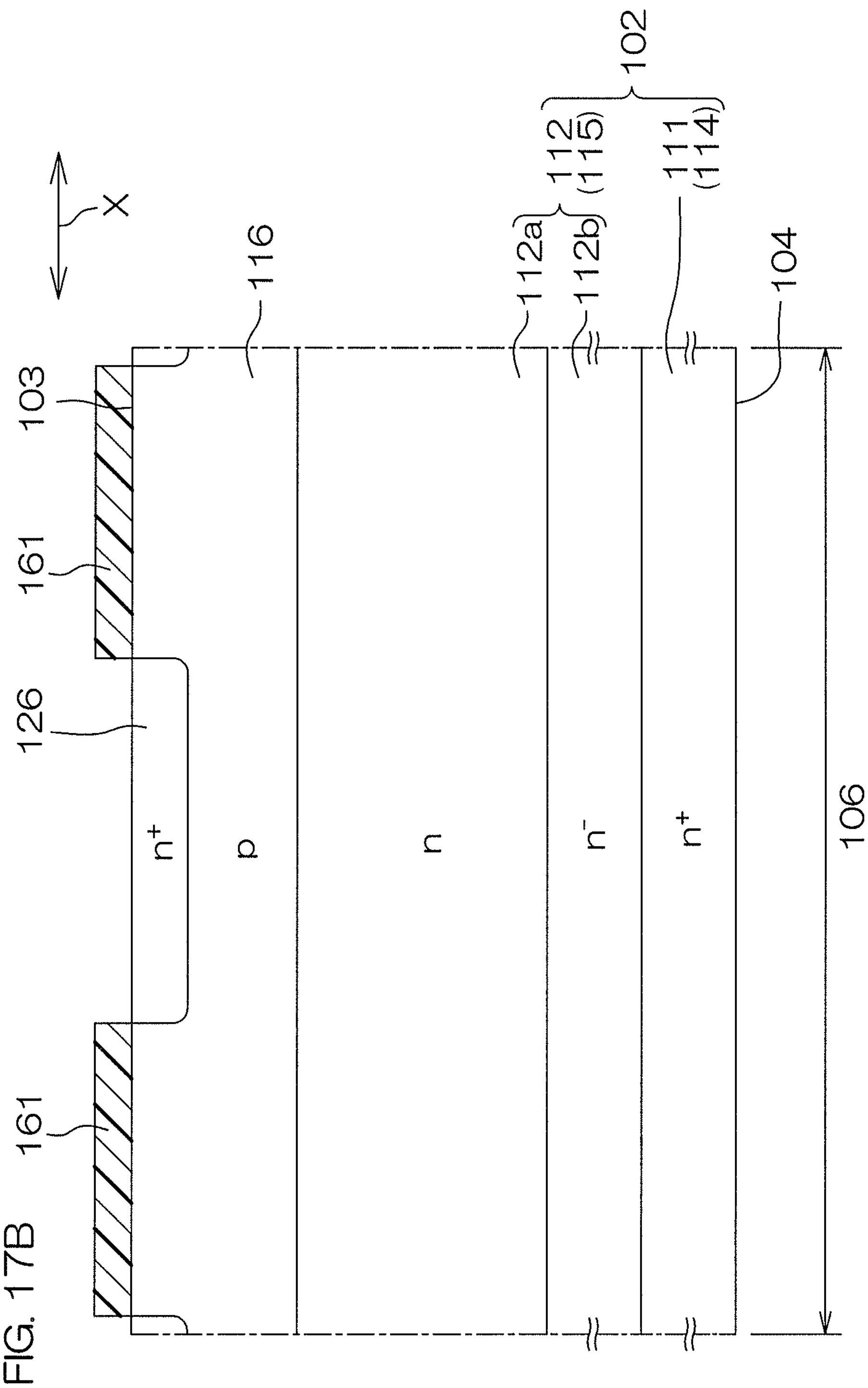
FIG. 17B is a sectional view of a step subsequent to that of FIG. 17A.

Next, referring to FIG. 17B, the $n^+$-type source regions 126 are formed in the surface layer portion of the body region 116. The source regions 126 are formed by introducing the n-type impurity into the surface layer portion of the body region 116. The source regions 126 may be formed in the surface layer portion of the body region 116 by an ion implantation method via an ion implantation mask 161.

Figure 17C:
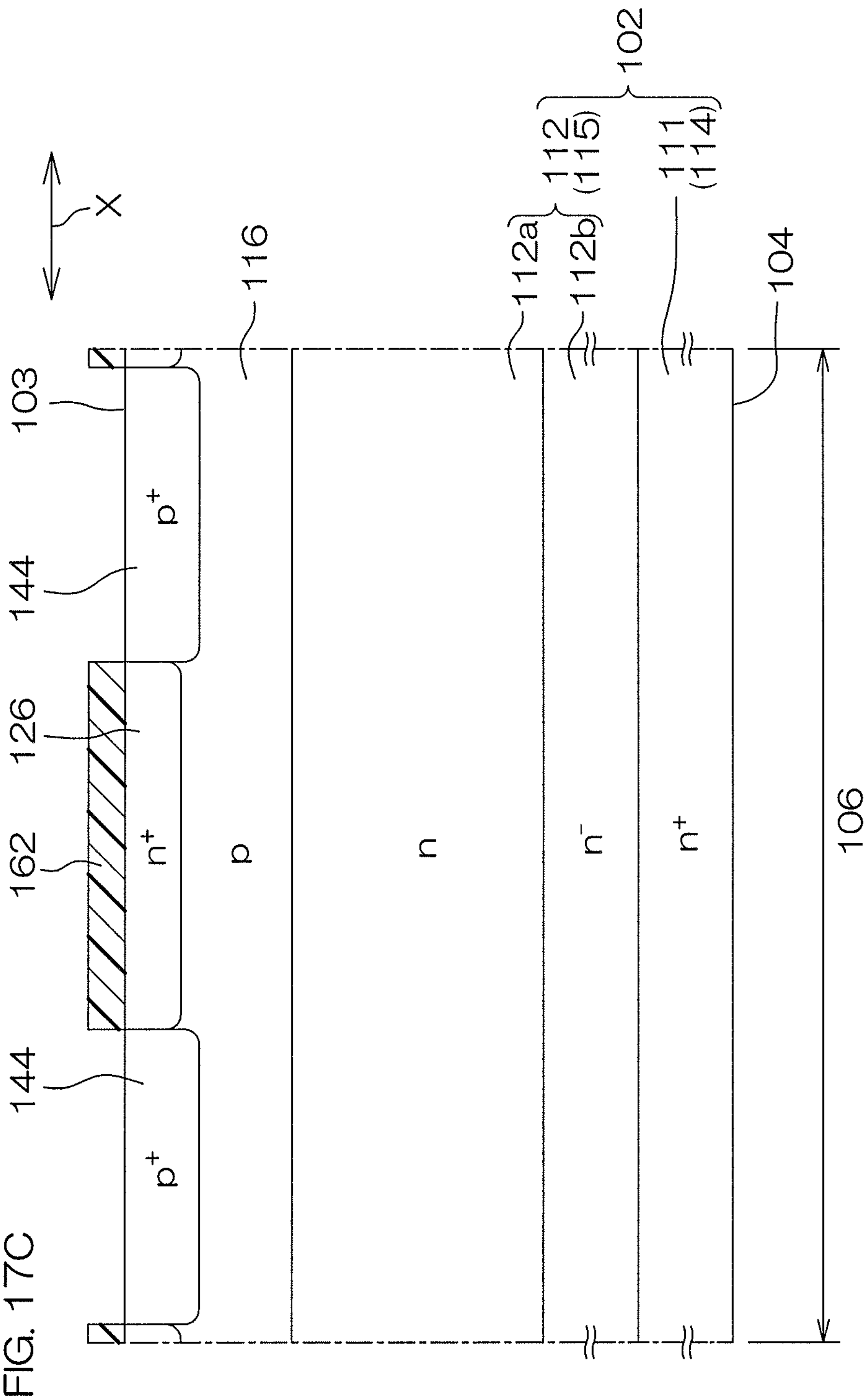
FIG. 17C is a sectional view of a step subsequent to that of FIG. 17B.

Next, referring to FIG. 17C, the $p^+$-type contact regions 144 are formed in the surface layer portion of the body region 116. The contact regions 144 are formed by introducing the p-type impurity into the surface layer portion of the body region 116. The contact regions 144 may be formed in the surface layer portion of the body region 116 by an ion implantation method via an ion implantation mask 162.

Figure 17D:
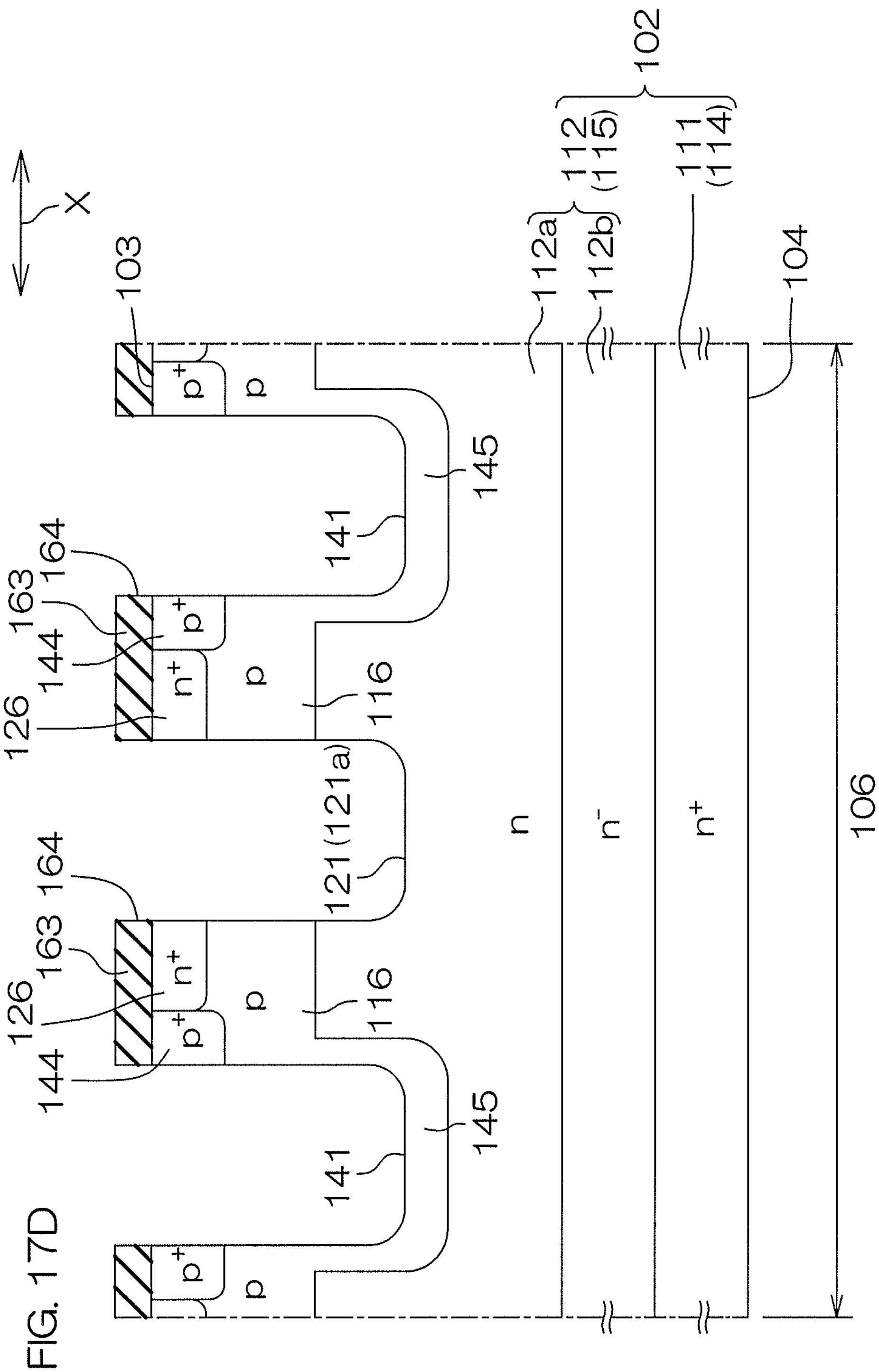
FIG. 17D is a sectional view of a step subsequent to that of FIG. 17C.

Next, referring to FIG. 17D, a mask 163 having a predetermined pattern is formed on the first main surface 103 of the SiC semiconductor layer 102. The mask 163 has a plurality of openings 164 exposing regions at which the gate trenches 121 and the source trenches 141 are to be formed.

Next, unnecessary portions of the SiC semiconductor layer 102 are removed. The unnecessary portions of the SiC semiconductor layer 102 may be removed by an etching method (for example, a wet etching method) via the mask 163. The gate trenches 121 and the source trenches 141 are thereby formed. The mask 163 is thereafter removed.

Next, the deep well regions 145 are formed in regions of the SiC semiconductor layer 102 along the inner walls of the source trenches 141. The deep well regions 145 may be formed in the SiC semiconductor layer 102 by an ion implantation method via an unillustrated ion implantation mask.

Also, the peripheral edge deep well region 148 is formed in the surface layer portion of the first main surface 103 of the SiC semiconductor layer 102 and is formed in regions along the inner walls of the contact trench portions 121*b* of the gate trenches 121 in the outer region 107. In this step, the peripheral edge deep well region 148 including the lead-out portion 148*a* lead out from the outer region 107 to the peripheral edge portion of the active region 106 is formed.

The peripheral edge deep well region 148 may be formed in the SiC semiconductor layer 102 by an ion implantation method via an unillustrated ion implantation mask. A portion or an entirety of the peripheral edge deep well region 148 may be formed at the same time as the deep well regions 145 using the step of forming the deep well regions 145. A portion of the peripheral edge deep well region 148 may be formed at the same time as the body region 116 using the step of forming the body region 116.

Figure 17E:
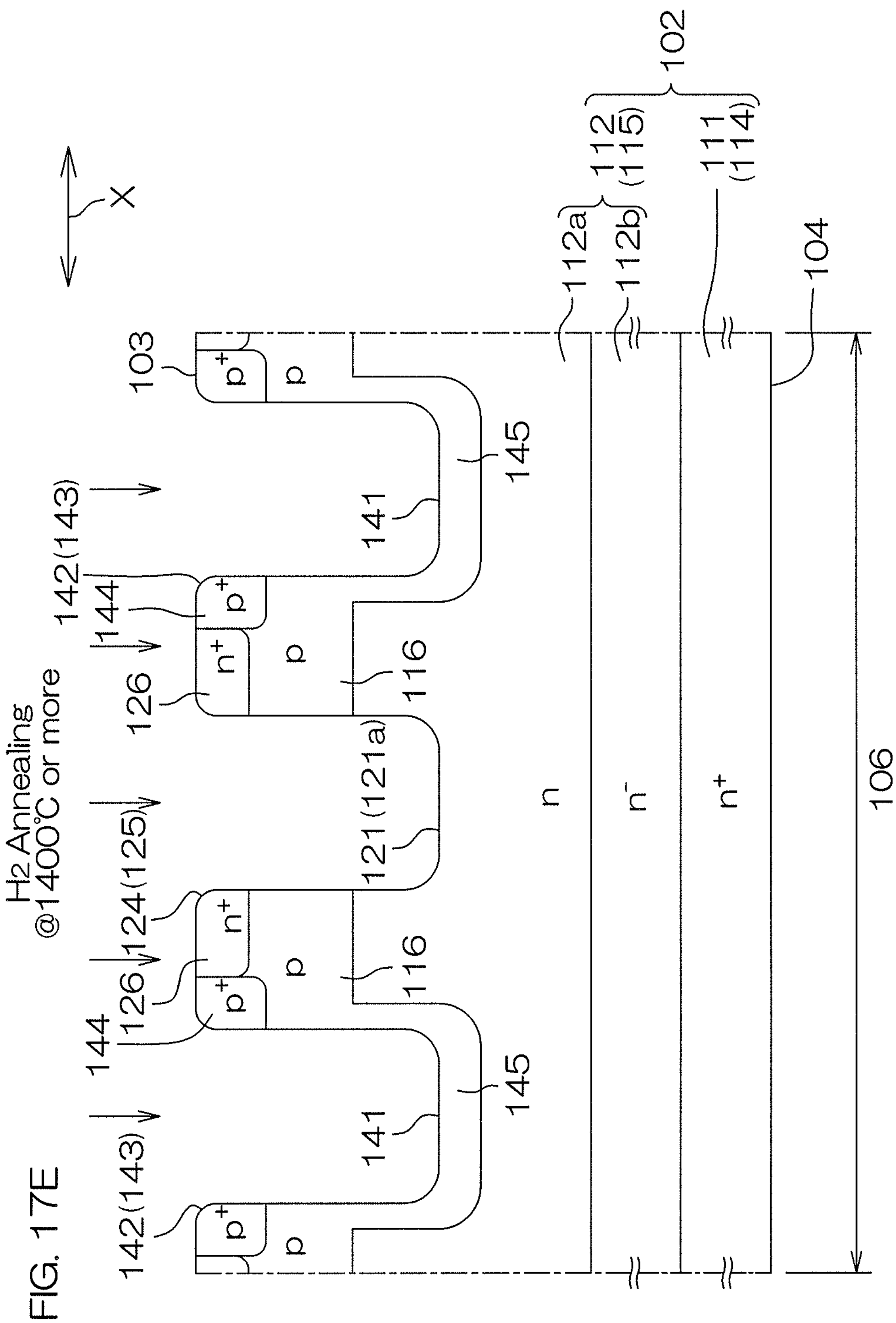
FIG. 17E is a sectional view of a step subsequent to that of FIG. 17D.

Next, referring to FIG. 17E, an annealing treatment is applied to the SiC semiconductor layer 102. The annealing treatment may be a high temperature hydrogen annealing treatment. An annealing temperature may be not less than 1400° C.

The curved portions 125 are thereby formed at the opening edge portions 124 of the gate trenches 121. Also, the curved portions 143 are formed at the opening edge portions 142 of the source trenches 141.

Figure 17F:
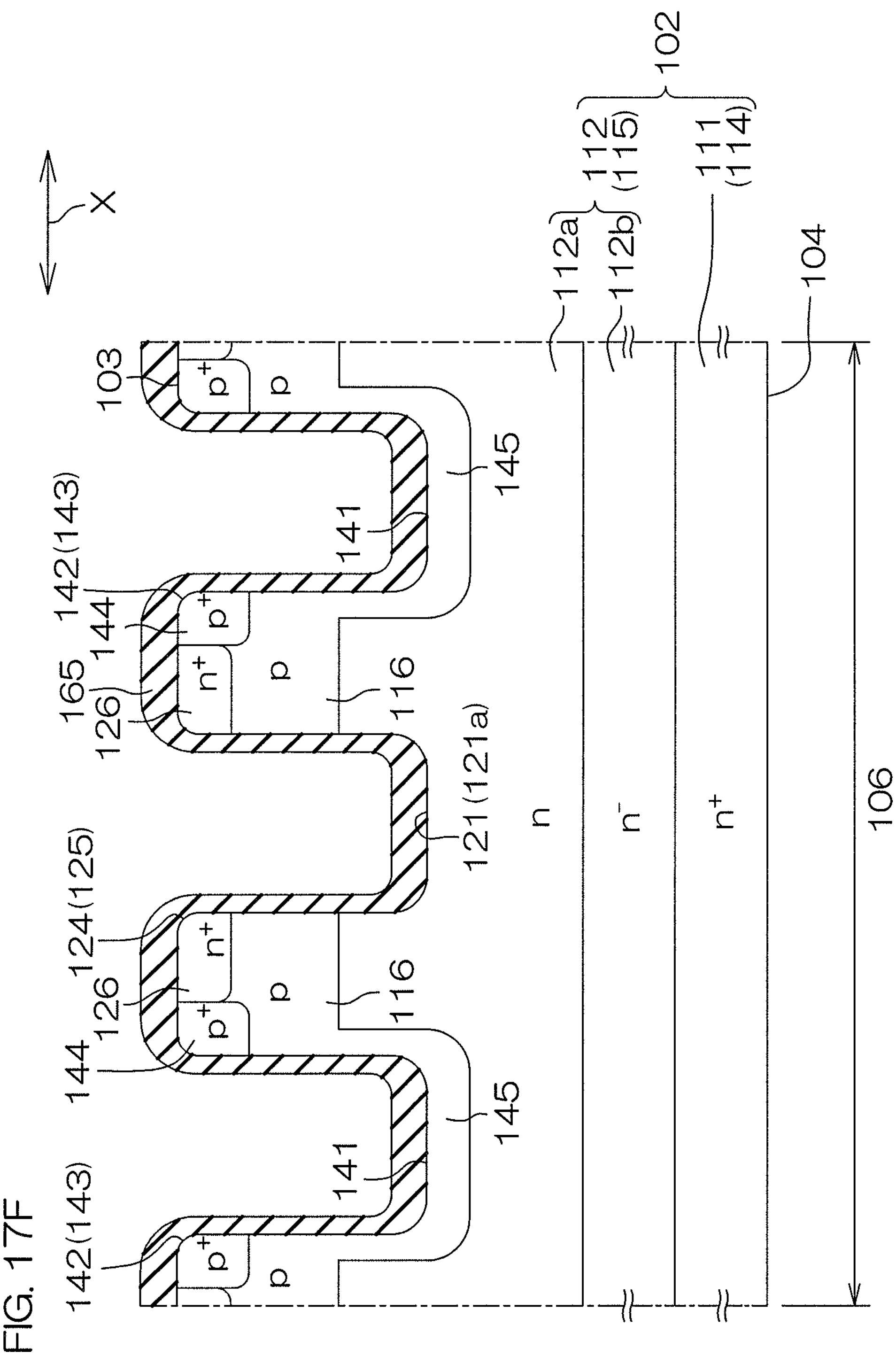
FIG. 17F is a sectional view of a step subsequent to that of FIG. 17E.

Next, referring to FIG. 17F, a base insulating layer 165 to be a base of the gate insulating layer 131 and the source insulating layers 146 is formed such as to cover the first main surface 103 of the SiC semiconductor layer 102. The base insulating layer 165 may be formed by a CVD (Chemical Vapor Deposition) method. The base insulating layer 165 may include silicon oxide.

Portions covering the side walls of the gate trenches 121 and portions covering the side walls of the source trenches 141 are formed to be thinner than other portions in the base insulating layer 165, in this step.

The base insulating layer 165 of such configuration is formed by adjusting predetermined conditions, such as a gas flow rate, gas type, gas ratio, gas supplying time, etc., in the CVD method. The base insulating layer 165 may be formed by an oxidation treatment method instead of the CVD method. The oxidation treatment method may be a thermal oxidation treatment method or a wet oxidation treatment method.

Figure 17G:
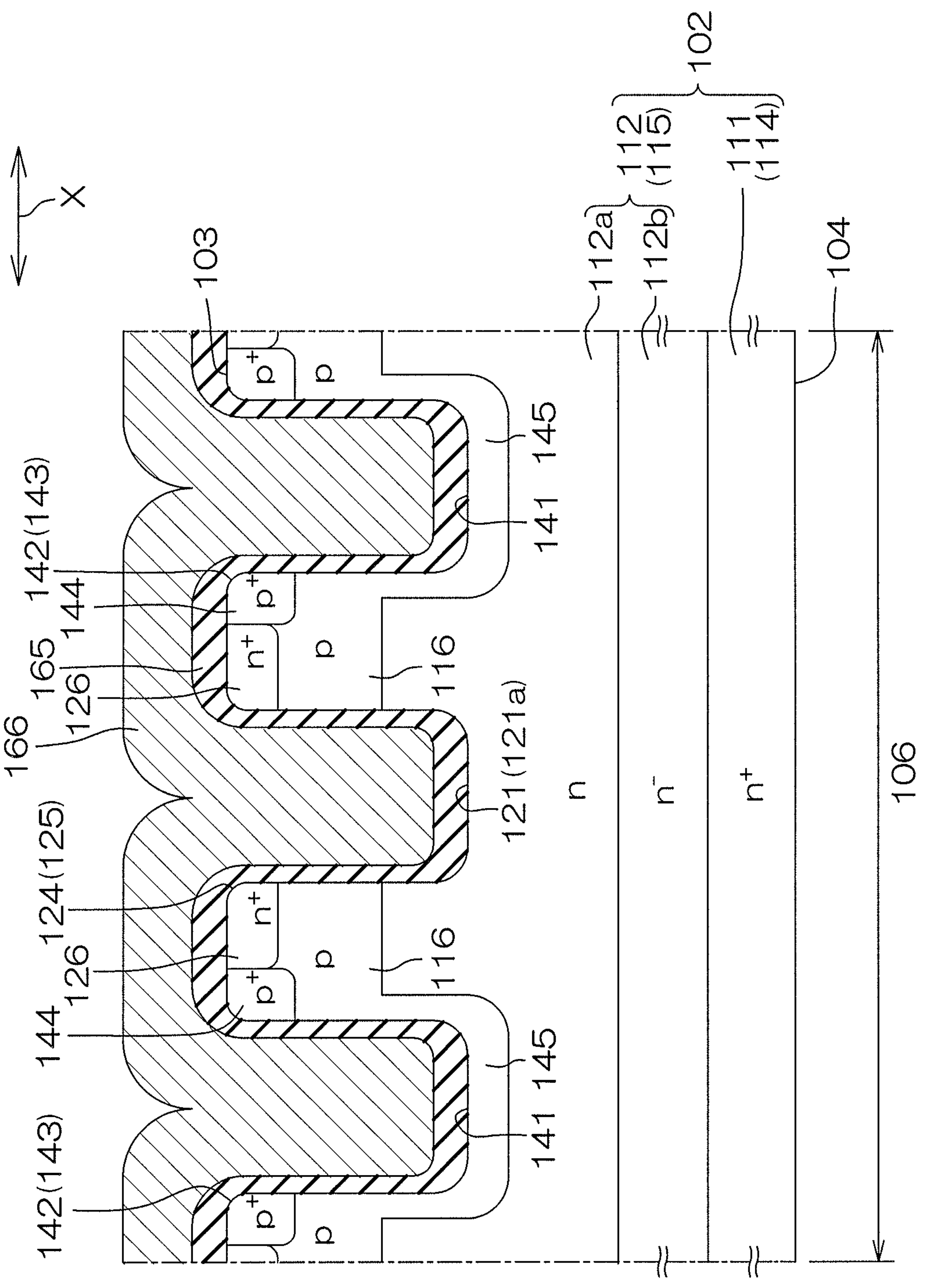
FIG. 17G is a sectional view of a step subsequent to that of FIG. 17F.

Next, referring to FIG. 17G, a base conductor layer 166 to be a base of the gate electrode layers 132, the gate wiring layer 133, and the source electrode layers 147 is formed on the first main surface 103 of the SiC semiconductor layer 102.

The base conductor layer 166 contains the p-type polysilicon doped with the p-type impurity. The base conductor layer 166 may be formed by a CVD method. The CVD method may be an LP-CVD (low pressure-CVD) method.

Figure 17H:
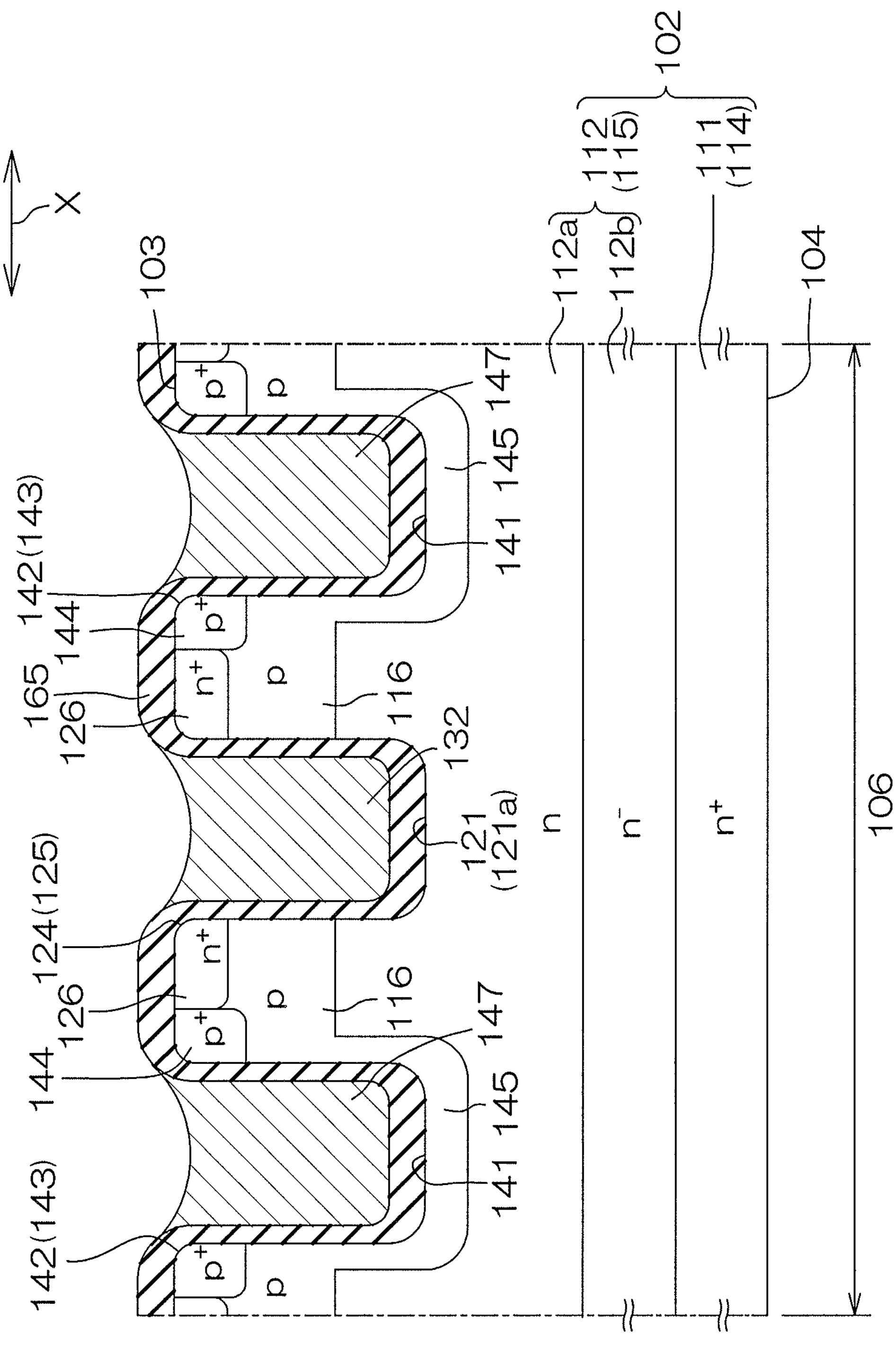
FIG. 17H is a sectional view of a step subsequent to that of FIG. 17G.
Figure 17:
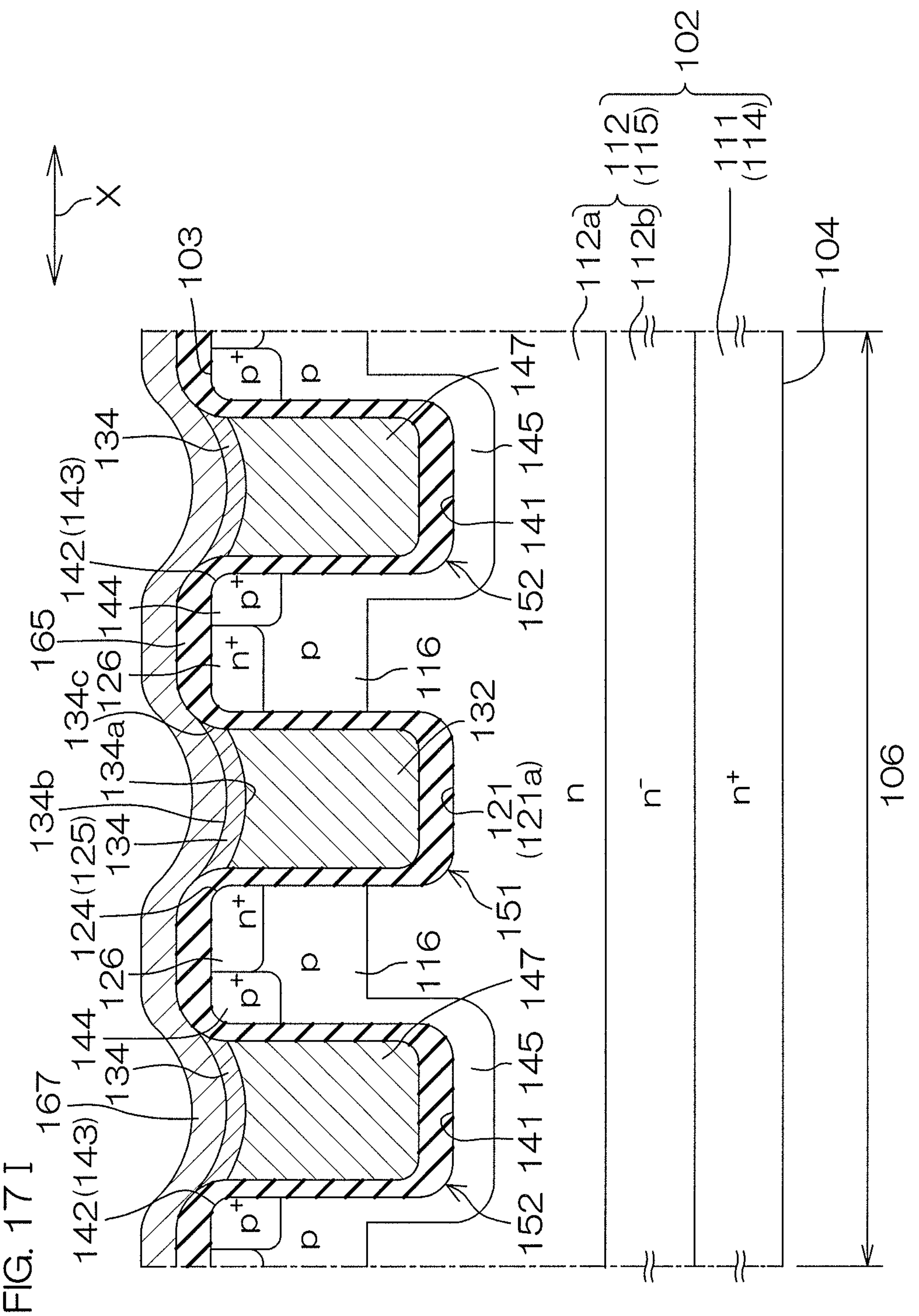
FIG. 17I is a sectional view of a step subsequent to that of FIG. 17H.
FIG. 17J is a sectional view of a step subsequent to that of FIG. 17I.
FIG. 17K is a sectional view of a step subsequent to that of FIG. 17J.
FIG. 17L is a sectional view of a step subsequent to that of FIG. 17K.

Next, referring to FIG. 17H, unnecessary portions of the base conductor layer 166 are removed. The unnecessary portions of the base conductor layer 166 are removed by an etching method (for example, a wet etching method) via a mask (not shown) having a predetermined pattern.

The mask (not shown) covers a region at which the gate wiring layer 133 is to be formed. The unnecessary portions of the base conductor layer 166 are removed at least until portions of the base insulating layer 165 covering the first main surface 103 of the SiC semiconductor layer 102 become exposed. The gate electrode layers 132, the gate wiring layer 133, and the source electrode layers 147 are thereby formed.

In a case where the source electrode layers 147 are made of a different electrode material from the gate electrode layers 132, the source electrode layers 147 may be formed by separately executing steps similar to the steps of FIG. 17G to FIG. 17H, in regard to the electrode material of the source electrode layers 147. In a case where the source electrode layers 147 are formed by portions of the source pad 110, the source electrode layers 147 are formed when the source pad 110 is formed.

Next, referring to FIG. 17I, a metal material layer 167 is formed on the gate electrode layers 132. The metal material layer 167 is formed on the first main surface 103 of the SiC semiconductor layer 102 such as to cover the gate electrode layers 132 and the source electrode layers 147 altogether, in this embodiment.

The metal material layer 167 contains a metal material that can be polycided with the p-type polysilicon. The metal material layer 167 may include at least one of material among Mo, W, Ni, Co, or Ti.

Next, the p-type polycide layer is formed in the surface layer portions of gate electrode layers 132 and a surface layer portion of the gate wiring layer 133. The p-type polycide layer is also formed in surface layer portions of the source electrode layers 147, in this embodiment.

The p-type polycide layer is formed by polyciding the surface layer portions of the gate electrode layers 132, the surface layer portion of the gate wiring layer 133, and the surface layer portions of the source electrode layers 147 by heat treatment with respect to the metal material layer 167. The heat treatment to the metal material layer 167 may be an RTA (Rapid Thermal Annealing) method.

The p-type polycide containing at least one of material among TiSi, $TiSi_2$, NiSi, CoSi, $CoSi_2$, $MoSi_2$, or $WSi_2$ is thereby formed in accordance with the metal material of the metal material layer 167. The low resistance electrode layer 134 is formed by the p-type polycide layer.

Figure 17J:
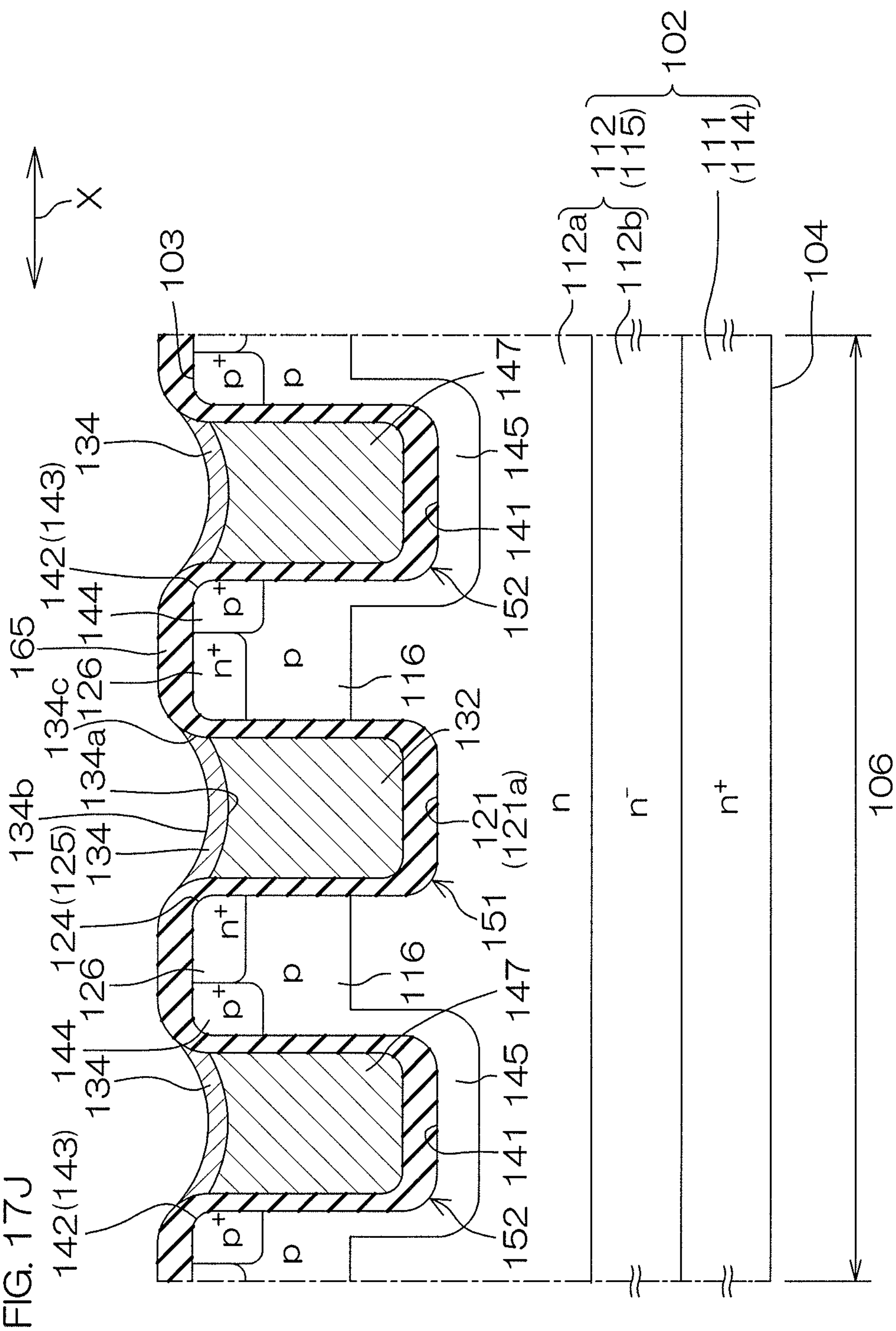

Next, referring to FIG. 17J, unreacted portions of the metal material layer 167 that did not bind with the p-type polysilicon are removed. The unreacted portions of the metal material layer 167 may be removed by an etching method (for example, a wet etching method).

In a case where the low resistance electrode layer 134 (p-type polycide) contains at least one of material among TiSi or CoSi, a heat treatment may be applied as necessary to the low resistance electrode layer 134 after the unreacted portions of the metal material layer 167 have been removed.

The heat treatment of the low resistance electrode layer 134 may be an RTA method. Thereby, TiSi is modified to $TiSi_2$, and CoSi is modified to $CoSi_2$, and lowering of resistance can thus be achieved.

Figure 17K:
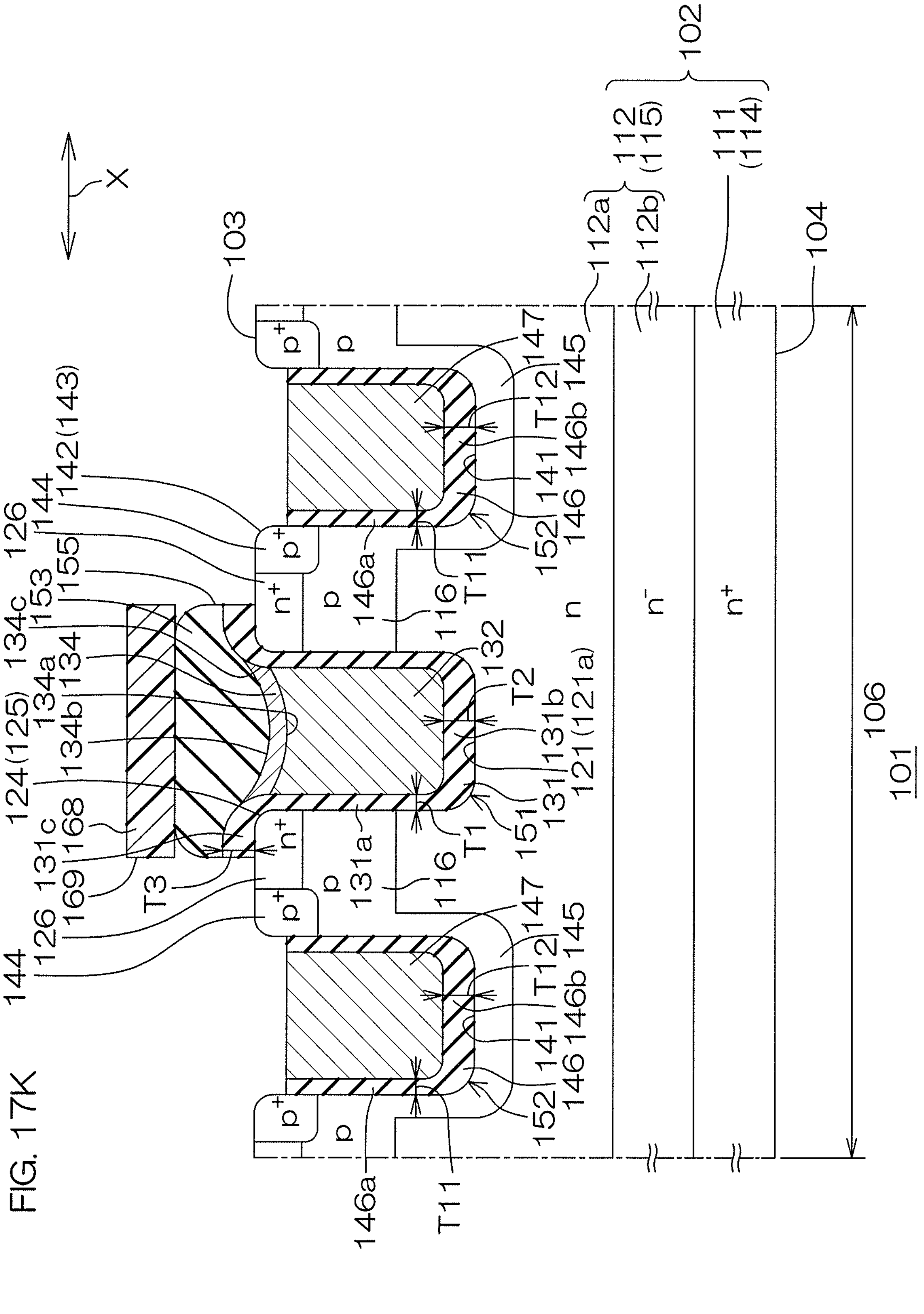

Next, referring to FIG. 17K, the interlayer insulating layer 153 is formed on the first main surface 103 of the SiC semiconductor layer 102. The interlayer insulating layer 153 is formed on the first main surface 103 of the SiC semiconductor layer 102 such as to cover the trench gate structures 151 and the gate wiring layer 133. The interlayer insulating layer 153 contains silicon oxide or silicon nitride. The interlayer insulating layer 153 may be formed by a CVD method.

Next, a mask 168 having a predetermined pattern is formed on the interlayer insulating layer 153. The mask 168 has a plurality of openings 169 exposing regions at which the gate contact hole 154 and the source contact holes 155 are to be formed.

Next, unnecessary portions of the interlayer insulating layer 153 are removed. The unnecessary portions of the interlayer insulating layer 153 may be removed by an etching method (for example, a dry etching method) via the mask 168. The gate contact hole 154 and the source contact holes 155 are thereby formed.

Figure 17L:
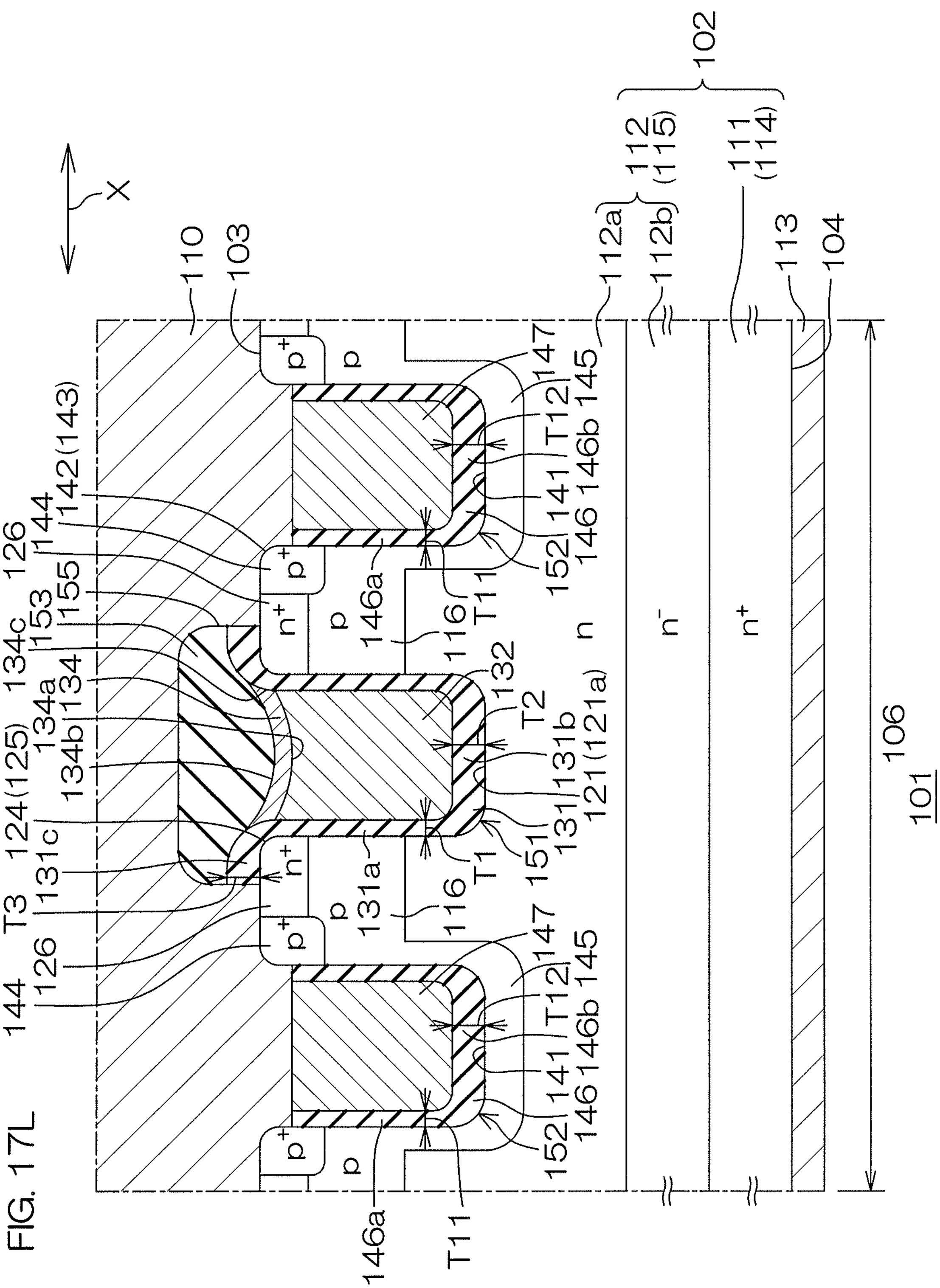

Next, referring to FIG. 17L, the gate pad 108, the gate finger 109, and the source pad 110 are formed on the interlayer insulating layer 153. The gate pad 108, the gate finger 109, and the source pad 110 are formed using a mask (not shown) having a predetermined pattern. Also, the drain pad 113 is formed on the second main surface 104 of the SiC semiconductor layer 102. The semiconductor device 101 is manufactured through steps including the above.

Figure 18:
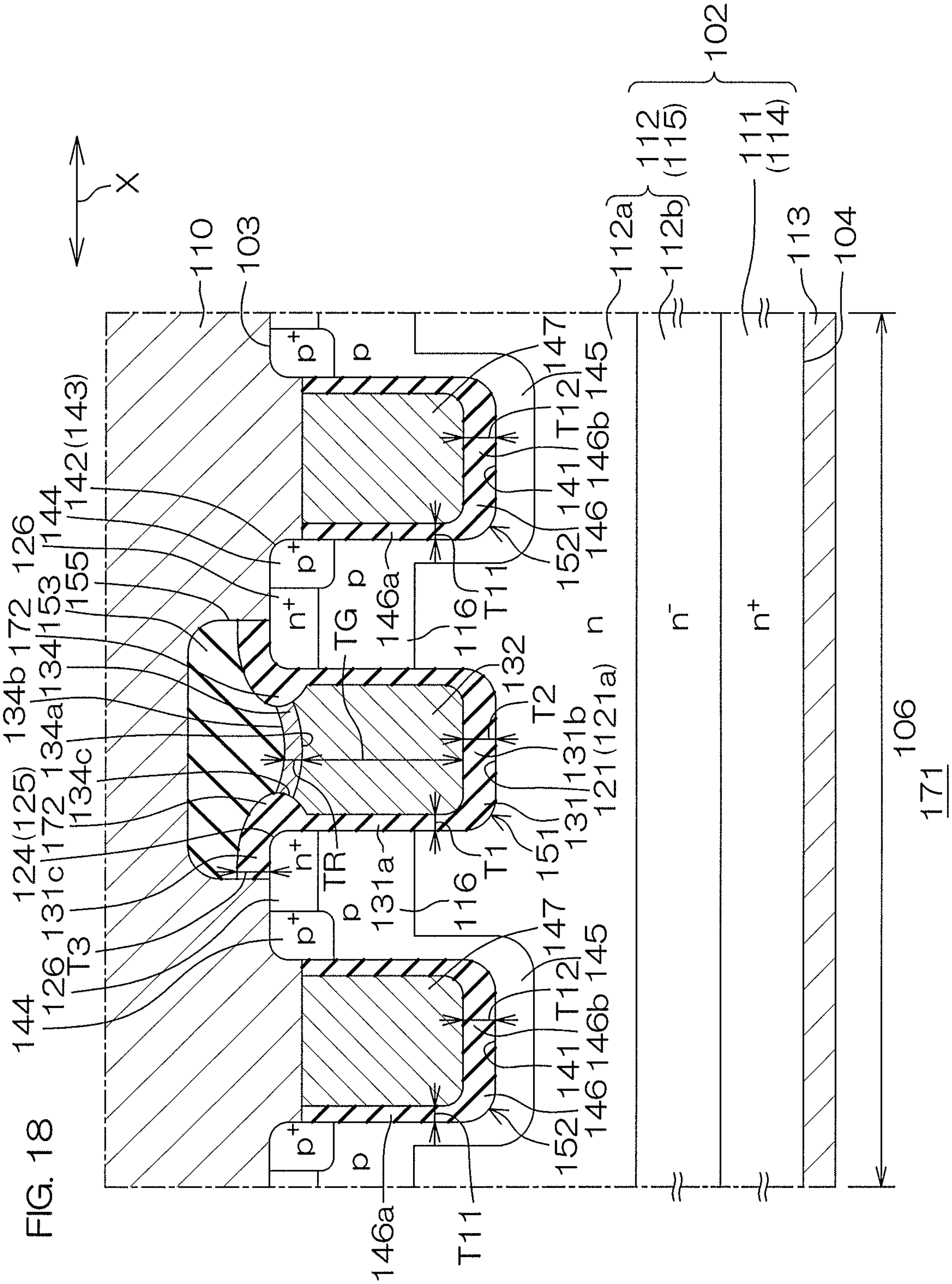
FIG. 18 is a sectional view of a region corresponding to FIG. 13 and is a sectional view of a semiconductor device according to an eighth preferred embodiment of the present invention.

FIG. 18 is a sectional view of a region corresponding to FIG. 13 and is a sectional view of a semiconductor device 171 according to an eighth preferred embodiment of the present invention. In the following, structures corresponding to structures described with the semiconductor device 101 shall be provided with the same reference symbols and description thereof shall be omitted.

Referring to FIG. 18, with the semiconductor device 171, the gate insulating layer 131 includes a bulging portion 172 bulging toward an interior of the gate trench 121 at the opening edge portion 124 of the gate trench 121. The bulging portion 172 is formed at the corner portion connecting the first region 131$a$ and the third region 131$c$ in the gate insulating layer 131.

The bulging portion 172 bulges curvingly toward the inner side of the gate trench 121. The bulging portion 172 narrows the opening of the gate trench 121 at the opening edge portion 124 of the gate trench 121.

The upper end portion of the gate electrode layer 132 has a constricted portion that is recessed along the bulging portion 172 of the gate insulating layer 131. The low resistance electrode layer 134 covers the constricted portion (upper end portion) of the gate electrode layer 132. The edge portion 134$c$ of the low resistance electrode layer 134 contacts the bulging portion 172 of the gate insulating layer 131, in this embodiment.

The bulging portion 172 of the gate insulating layer 131 is formed by setting the predetermined conditions (gas flow rate, gas type, gas ratio, gas supplying time, etc.) of the CVD method in the above-described step of FIG. 17F while also taking into consideration the shape of the bulging portion 172 of the gate insulating layer 131.

With the semiconductor device 171 described above, the edge portion 134$c$ of the low resistance electrode layer 134 contacts the bulging portion 172 of the gate insulating layer 131. Forming of the current path in the region between the low resistance electrode layer 134 and the SiC semiconductor layer 102 can thereby be suppressed appropriately.

Also, with the semiconductor device 171, the bulging portion 172 is formed at the opening edge portion 124 of the gate trench 121, in addition to the opening edge portion 124 of the gate trench 121 having the curved portion 125. Further improvement of the withstand voltage of the gate insulating layer 131 at the opening edge portion 124 of the gate trench 121 can thereby be achieved.

Figure 19:
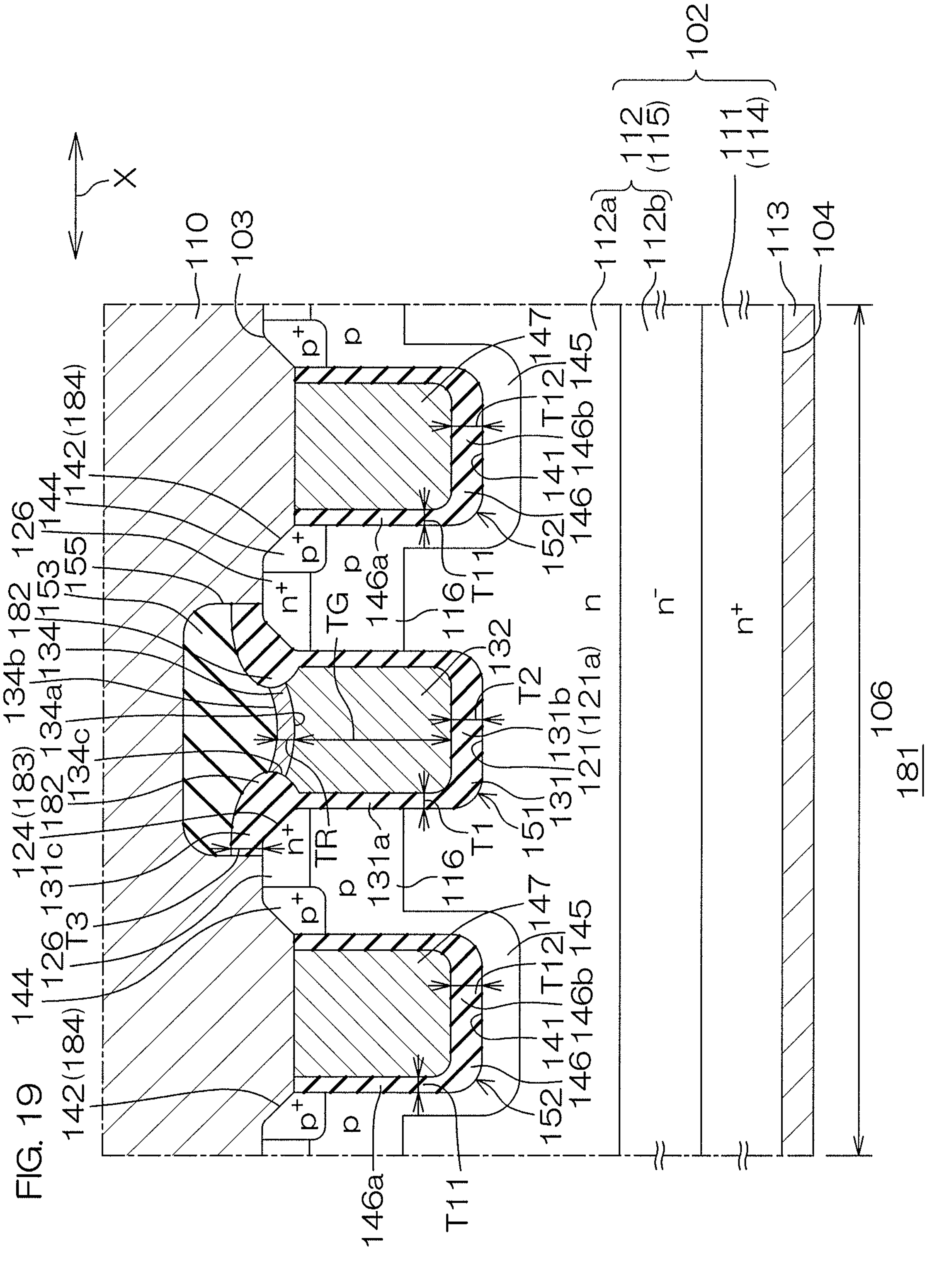
FIG. 19 is a sectional view of a region corresponding to FIG. 13 and is a sectional view of a semiconductor device according to a ninth preferred embodiment of the present invention.

FIG. 19 is a sectional view of a region corresponding to FIG. 13 and is a sectional view of a semiconductor device 181 according to a ninth preferred embodiment of the present invention. In the following, structures corresponding to structures described with the semiconductor device 101 shall be provided with the same reference symbols and description thereof shall be omitted.

Referring to FIG. 19, in the semiconductor device 181, the opening edge portion 124 of the gate trench 121 has an inclining portion 182 that inclines downwardly from the first main surface 103 of the SiC semiconductor layer 102 toward the side wall of the gate trench 121.

With the inclining portion 182 of the gate trench 121, an electric field can be dispersed along the inclining portion 182 and therefore the concentration of electric field with respect to the opening edge portion 124 of the gate trench 121 can be relaxed.

The gate insulating layer 131 includes a bulging portion 183 bulging toward the interior of the gate trench 121 at the inclining portion 182 of the gate trench 121. The bulging portion 183 is formed at the corner portion connecting the first region 131$a$ and the third region 131$c$ of the gate insulating layer 131.

The bulging portion 183 bulges curvingly toward the inner side of the gate trench 121. The bulging portion 183 narrows the opening of the gate trench 121 at the opening edge portion 124 of the gate trench 121.

The upper end portion of the gate electrode layer 132 has a constricted portion that is recessed along the bulging portion 183 of the gate insulating layer 131. The low resistance electrode layer 134 covers the constricted portion (upper end portion) of the gate electrode layer 132. The edge portion 134$c$ of the low resistance electrode layer 134 contacts the bulging portion 183 of the gate insulating layer 131, in this embodiment.

The opening edge portion 142 of the source trench 141 has an inclining portion 184 that inclines downwardly from the first main surface 103 of the SiC semiconductor layer 102 toward the side wall of the source trench 141. An electric field can be dispersed along the inclining portion 184 and therefore the concentration of electric field with respect to the opening edge portion 142 of the source trench 141 can be relaxed with the inclining portion 184 of the source trench 141.

Figure 20A:
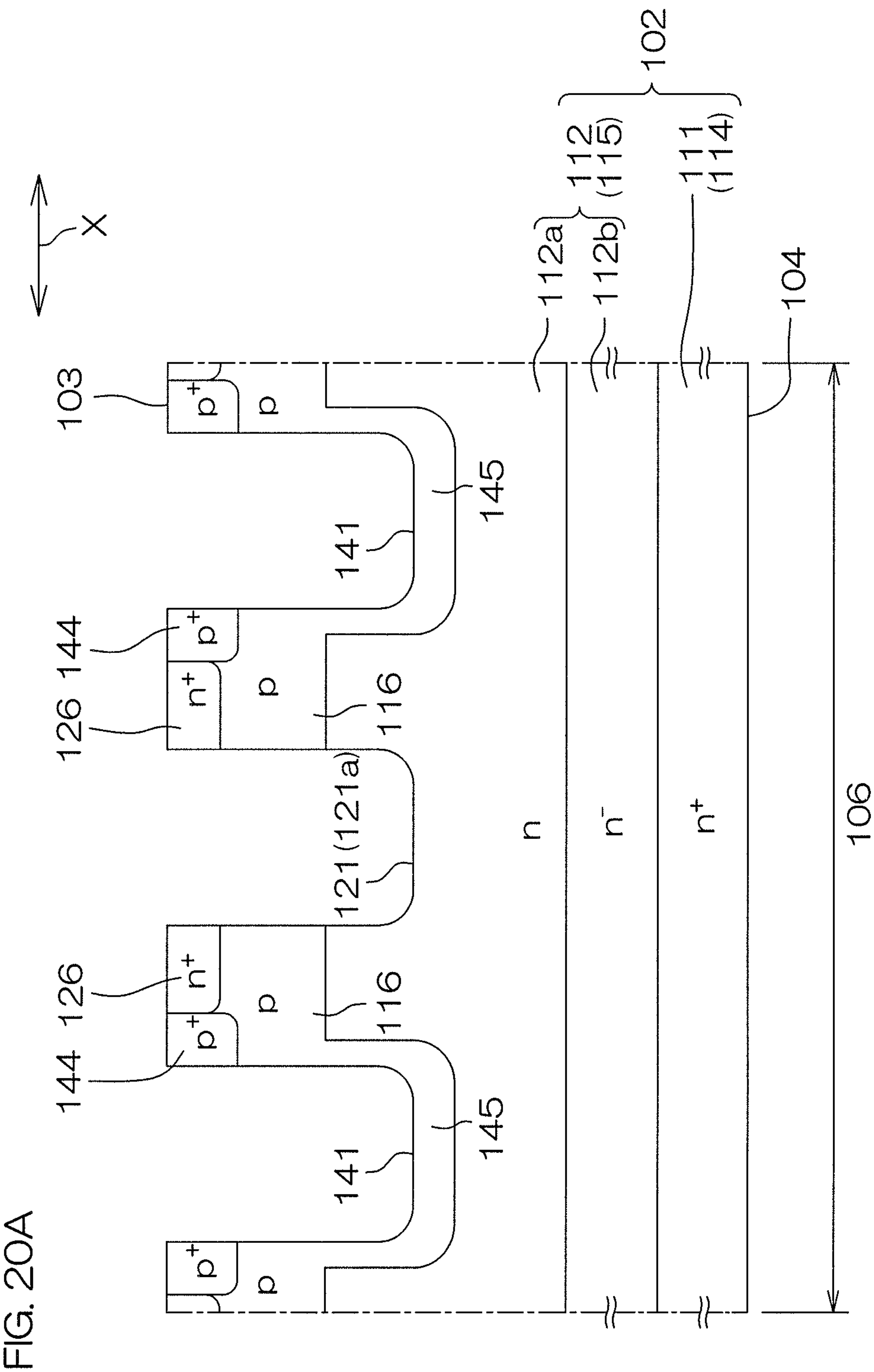
FIG. 20A is a sectional view of an example of a method for manufacturing the semiconductor device shown in FIG. 19.
Figure 20B:
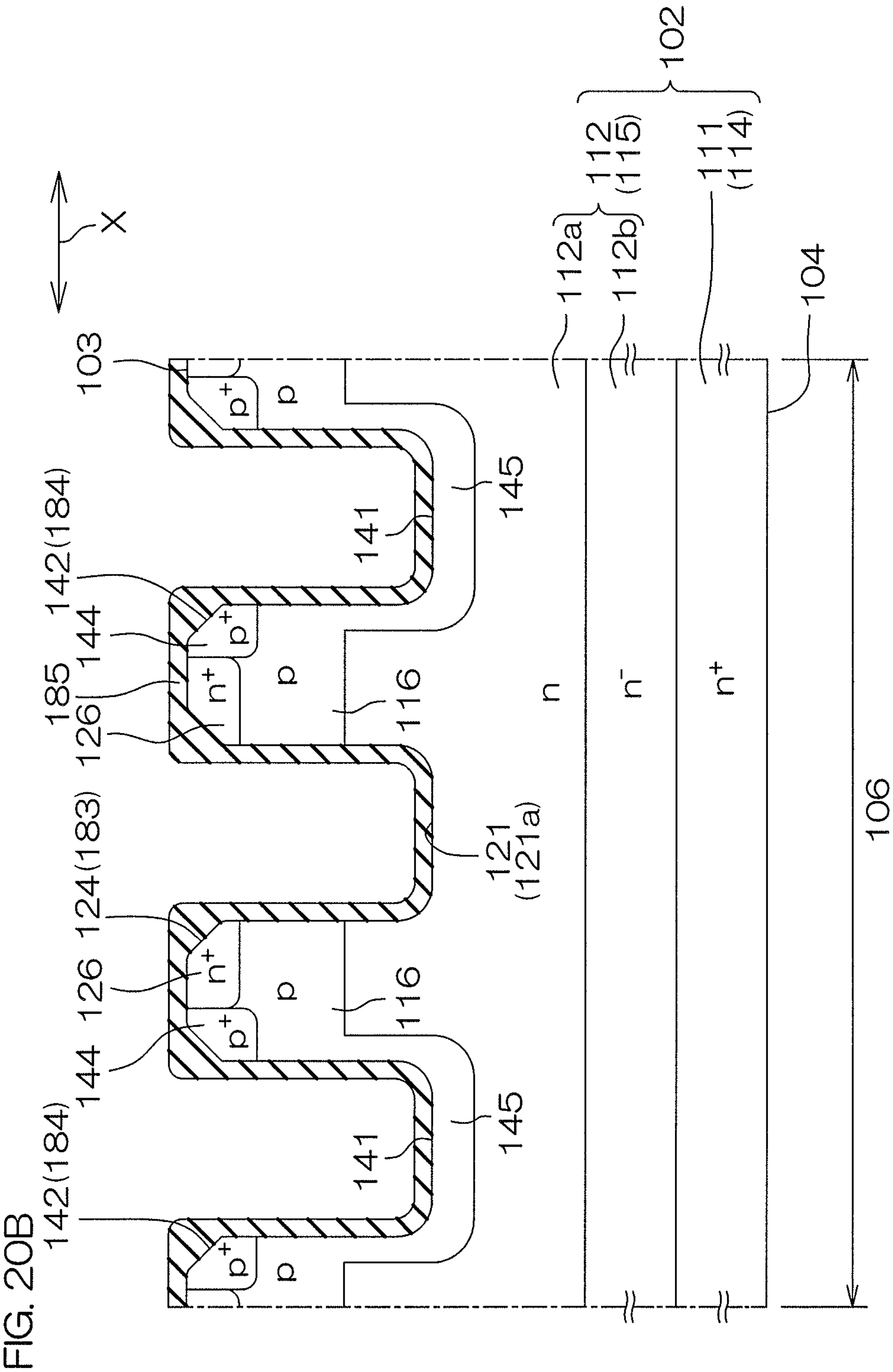
FIG. 20B is a sectional view of a step subsequent to that of FIG. 20A.
Figure 20C:
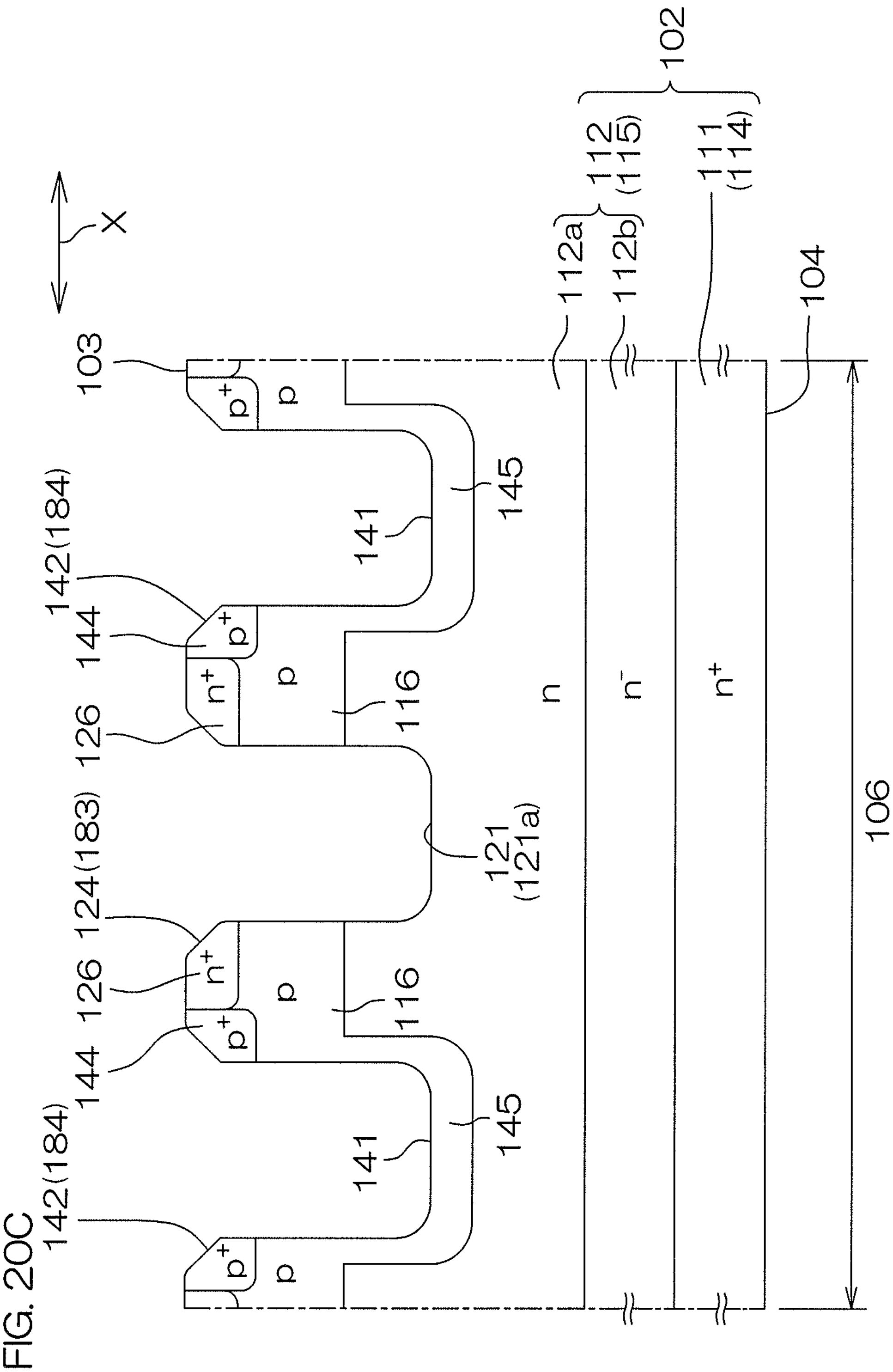
FIG. 20C is a sectional view of a step subsequent to that of FIG. 20B.

FIG. 20A to FIG. 20C are sectional views of an example of a method for manufacturing the semiconductor device 181 shown in FIG. 19.

First, referring to FIG. 20A, the SiC semiconductor layer 102 having the gate trenches 121 and the source trenches 141 formed in the first main surface 103 through the steps of FIG. 17A to FIG. 17D is prepared.

Next, referring to FIG. 20B, a thermal oxidation treatment is applied to the first main surface 103 of the SiC semiconductor layer 102 to form a sacrificial oxide film 185. In this step, oxidation starts uniformly from both the first main surface 103 of the SiC semiconductor layer 102 and the side wall of the gate trenches 121.

An oxide film progressing from the first main surface 103 of the SiC semiconductor layer 102 and oxide films progressing from the side wall of the gate trenches 121 become integral at the opening edge portions 124 of the gate trenches 121.

Oxidation at the opening edge portions 124 of the gate trenches 121 is accelerated by integration of the oxide films. The inclining portions 182 are then formed below the integrated oxide film at the opening edge portions 124 of the gate trenches 121.

The oxide film progressing from the first main surface 103 of the SiC semiconductor layer 102 and oxide films progressing from the side wall of the source trenches 141 become integral at the opening edge portions 142 of the source trenches 141.

Oxidation at the opening edge portions 142 of the source trenches 141 is accelerated by integration of the oxide films. The inclining portions 184 are then formed below the integrated oxide film at the opening edge portions 142 of the source trenches 141.

Next, referring to FIG. 20C, the sacrificial oxide film 185 is removed. The sacrificial oxide film 185 may be removed by an etching method (for example, a wet etching method). Thereafter, the steps of FIG. 17F to FIG. 17L are executed successively.

In the step of FIG. 17F, the bulging portion 183 of the gate insulating layer 131 is formed by setting the predetermined conditions (gas flow rate, gas type, gas ratio, gas supplying time, etc.) of the CVD method while also taking into consideration the shape of the bulging portion 183 of the gate insulating layer 131. The semiconductor device 181 is manufactured through steps including the above.

With the semiconductor device 181 described above, the edge portion 134*c* of the low resistance electrode layer 134 contacts the bulging portion 183 of the gate insulating layer 131. The forming of the current path in the region between the low resistance electrode layer 134 and the SiC semiconductor layer 102 can thereby be suppressed appropriately.

Also, with the semiconductor device 181, the bulging portion 183 is formed at the opening edge portion 124 of the gate trench 121, in addition to the opening edge portion 124 of the gate trench 121 having the inclining portion 182. Further improvement of the withstand voltage of the gate insulating layer 131 at the opening edge portion 124 of the gate trench 121 can thereby be achieved.

With the present preferred embodiment, a configuration example where the gate insulating layer 131 having the bulging portion 183 is formed in semiconductor device 181 was described. However, the gate insulating layer 131 free from the bulging portion 183 may be formed in the semiconductor device 181.

Figure 21:
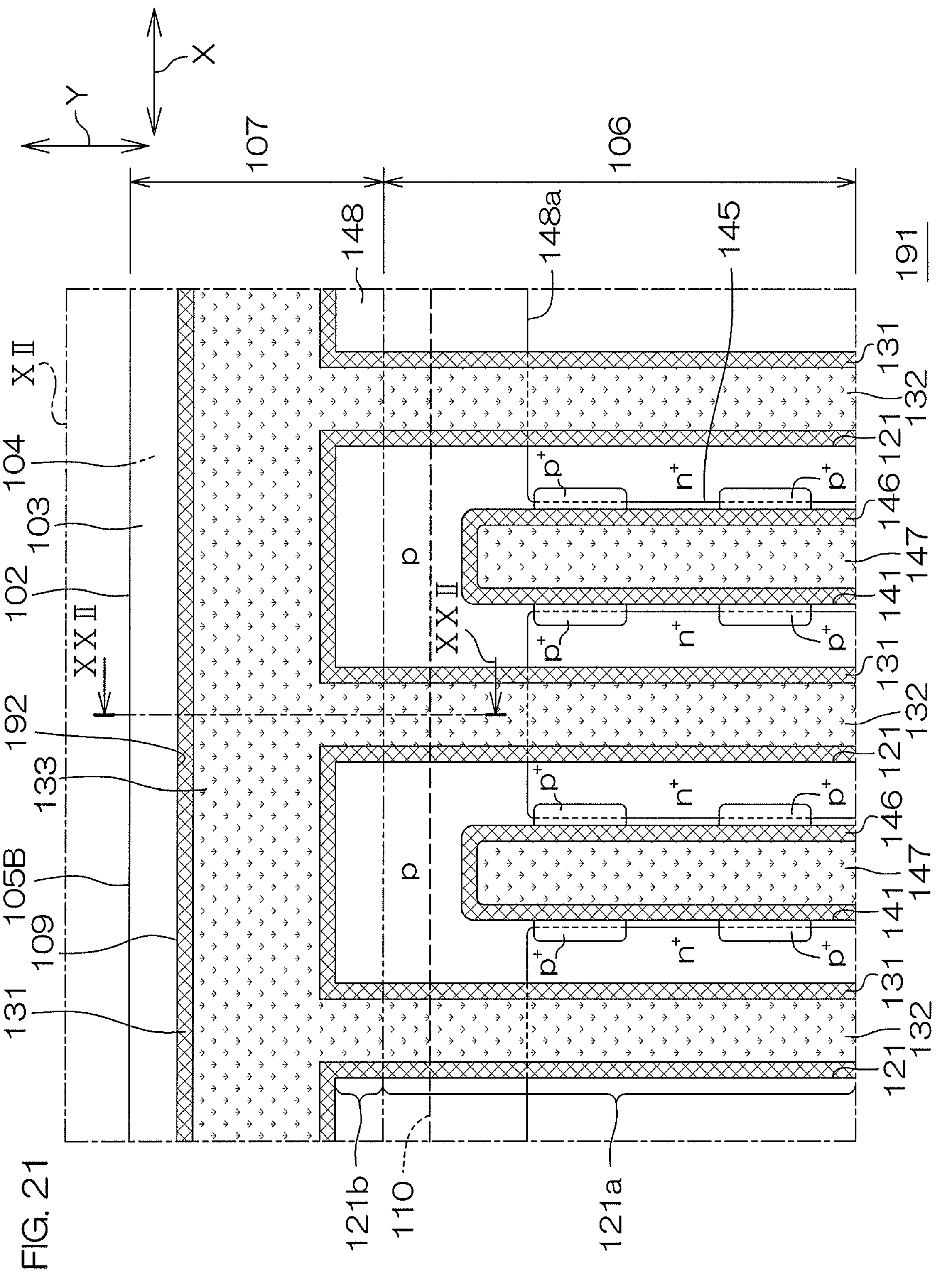
FIG. 21 is an enlarged view of a region corresponding to FIG. 12 and is an enlarged view of a semiconductor device according to a tenth preferred embodiment of the present invention.
Figure 22:
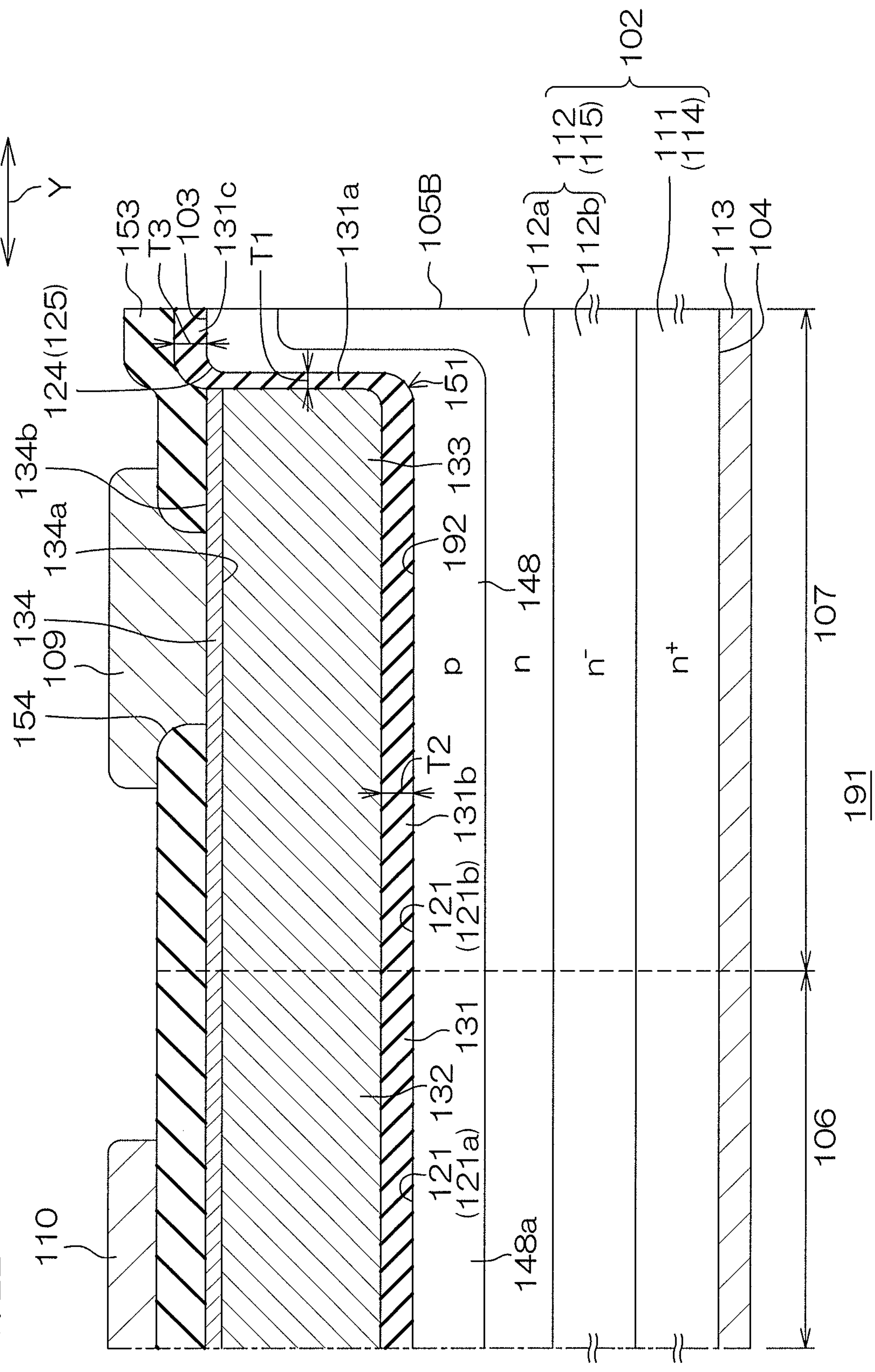
FIG. 22 is a sectional view taken along line XXII-XXII shown in FIG. 21.

FIG. 21 is an enlarged view of a region corresponding to FIG. 12 and is an enlarged view of a semiconductor device 191 according to a tenth preferred embodiment of the present invention. FIG. 22 is a sectional view taken along line XXII-XXII shown in FIG. 21. In the following, structures corresponding to structures described with the semiconductor device 101 shall be provided with the same reference symbols and description thereof shall be omitted.

Referring to FIG. 21 and FIG. 22, with the semiconductor device 191, an outer gate trench 192 is formed in the first main surface 103 of the SiC semiconductor layer 102 in the outer region 107. The outer gate trench 192 extends as a band shape in the outer region 107.

The outer gate trench 192 is formed in a region of the first main surface 103 of the SiC semiconductor layer 102 directly below the gate finger 109. The outer gate trench 192 extends along the gate finger 109.

More specifically, the outer gate trench 192 is formed along the three side surfaces 105A, 105B, and 105D of the SiC semiconductor layer 102 such as to define the active region 106 from three directions. The outer gate trench 192 may be formed in an endless shape (for example, a quadrilateral annular shape) that surrounds the active region 106.

The outer gate trench 192 is in communication with the contact trench portion 121*b* of each gate trench 121. The outer gate trench 192 and the gate trenches 121 are thereby formed by a single trench.

The gate wiring layer 133 is embedded in the outer gate trench 192. The gate wiring layer 133 is connected to the gate electrode layers 132 at communication portions of the outer gate trench 192 and the contact trench portions 121*b*.

The low resistance electrode layer 134 covers the upper end portion of the gate wiring layer 133 in an interior of the outer gate trench 192, in this embodiment. Therefore, the low resistance electrode layer 134 covering the gate electrode layers 132 and the low resistance electrode layer 134 covering the gate wiring layer 133 are both positioned inside a single trench.

the peripheral edge deep well region 148 covers inner wall of the outer gate trench 192 in the outer region 107, in this embodiment. The peripheral edge deep well region 148 extends along side wall of the outer gate trench 192 and passes along an edge portion to cover the bottom wall of the outer gate trench 192.

That is, the peripheral edge deep well region 148 faces the gate wiring layer 133 across the gate insulating layer 131 at a portion along the inner wall of the outer gate trench 192. The peripheral edge deep well region 148 also faces the gate wiring layers 133 across the gate insulating layer 131 at a portion along the inner wall of the gate trench 121.

Even with the semiconductor device 191 described above, the same effects as the effects described for the semiconductor device 101 can be exhibited. Also, with the semiconductor device 191, the gate wiring layer 133 is not required to be lead out to above the first main surface 103 of the SiC semiconductor layer 102.

The gate wiring layer 133 can thereby be suppressed from facing the SiC semiconductor layer 102 across the gate insulating layer 131 at the opening edge portions of the gate trenches 121 and the outer gate trench 192. Consequently, the concentration of electric field at the opening edge portions of the gate trenches 121 can be suppressed.

Figure 23:
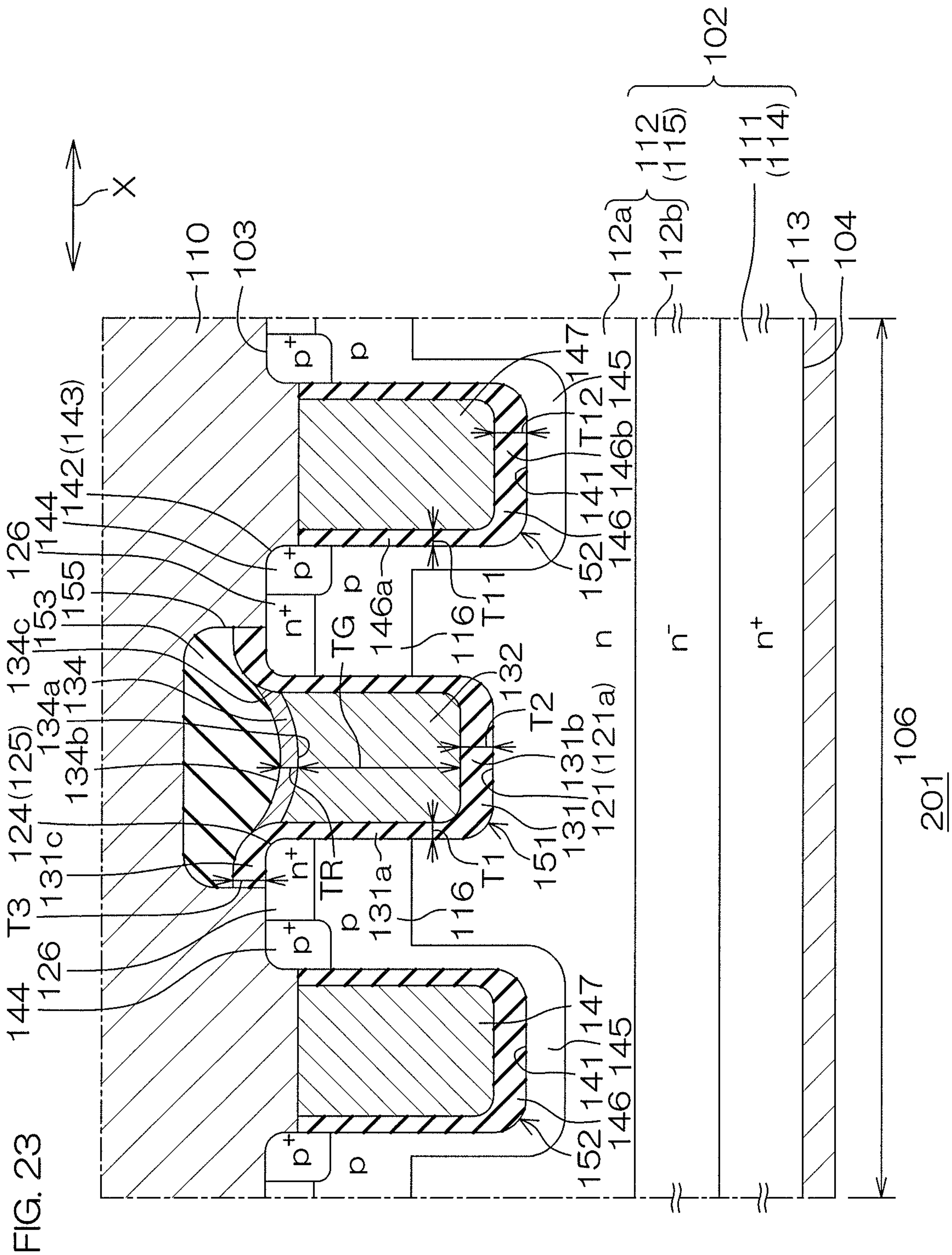
FIG. 23 is a sectional view of a region corresponding to FIG. 13 and is a sectional view for describing the structure of a semiconductor device according to an eleventh preferred embodiment of the present invention.

FIG. 23 is a sectional view of a region corresponding to FIG. 13 and is a sectional view for describing the structure of a semiconductor device 201 according to an eleventh preferred embodiment of the present invention. In the following, structures corresponding to structures described with the semiconductor device 101 shall be provided with the same reference symbols and description thereof shall be omitted.

Referring to FIG. 23, with the semiconductor device 201, the respective source trenches 141 are formed deeper than the gate trenches 121. A bottom wall of each source trench 141 is thus positioned at the second main surface 104 side of the SiC semiconductor layer 102 with respect to a bottom portion of the gate trench 121. More specifically, the bottom wall of each source trench 141 is positioned in the high concentration region 112*a* of the SiC epitaxial layer 112.

A ratio of the depth of the source trench 141 with respect to the depth of the gate trench 121 may be not less than 1.5.

The ratio of the depth of the source trench 141 with respect to the depth of the gate trench 121 is preferably not less than 2.

The depth of the gate trench 121 may be not less than 0.5 μm and not more than 3 μm (for example, approximately 1 μm). The depth of the source trench 141 may be not less than 0.75 μm and not more than 10 μm (for example, approximately 2 μm).

As in the case of the semiconductor device 101, the deep well region 145 extends along the inner wall of the source trench 141 and has a bottom portion positioned at the second main surface 104 side of the SiC semiconductor layer 102 with respect to the bottom wall of the gate trench 121. The deep well region 145 is formed in the high concentration region 112*a* of the SiC epitaxial layer 112.

Even with the semiconductor device 201 described above, the same effects as the effects described for the semiconductor device 101 can be exhibited.

Figure 24:
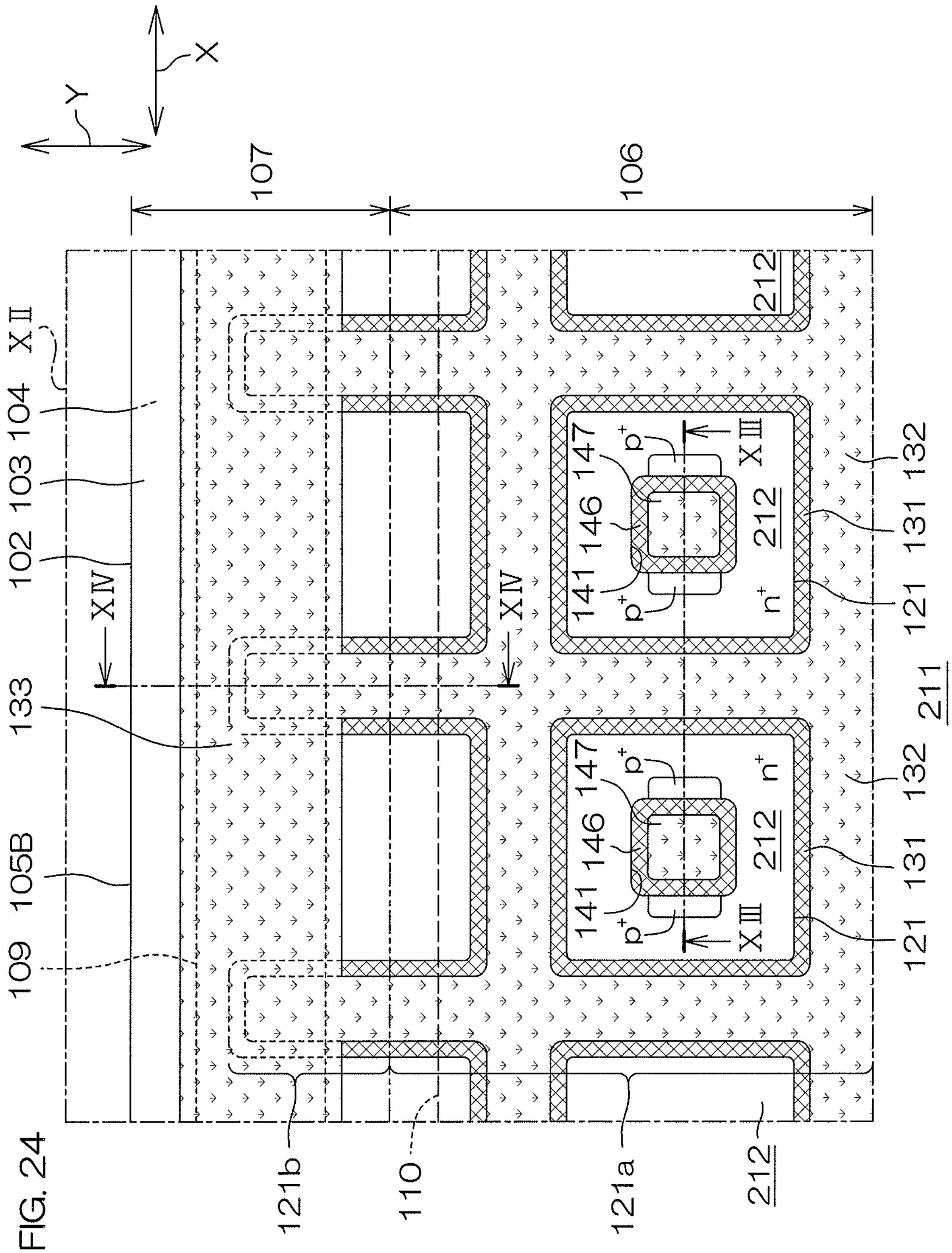
FIG. 24 is an enlarged view of a region corresponding to FIG. 12 and is an enlarged view for describing the structure of a semiconductor device according to a twelfth preferred embodiment of the present invention.

FIG. 24 is a plan view of a region corresponding to FIG. 12 and is a plan view for describing the structure of a semiconductor device 211 according to a twelfth preferred embodiment of the present invention. In the following, structures corresponding to structures described with the semiconductor device 101 shall be provided with the same reference symbols and description thereof shall be omitted.

Referring to FIG. 24, The gate trenches 121 are formed in a lattice shape that integrally includes a plurality of gate trenches 121 extending along the first direction X and a plurality of gate trenches 121 extending along the second direction Y in plan view, in this embodiment.

A plurality of cell regions 212 is defined in a matrix by the gate trenches 121 in the first main surface 103 of the SiC semiconductor layer 102. Each cell region 212 is formed in a quadrilateral shape in plan view. The source trenches 141 are formed respectively in the cell regions 212. The source trench 141 may be formed in a quadrilateral shape in plan view.

A sectional view taken along line XIII-XIII of FIG. 24 is substantially the same as the sectional view of FIG. 13. A sectional view taken along line XIV-XIV of FIG. 24 is substantially the same as the sectional view of FIG. 14.

Even with the semiconductor device 211 described above, the same effects as the effects described for the semiconductor device 101 can be exhibited. The gate trenches 121 having the structure formed in a lattice shape in place of stripes is applicable to other configurations as well.

Figure 25:
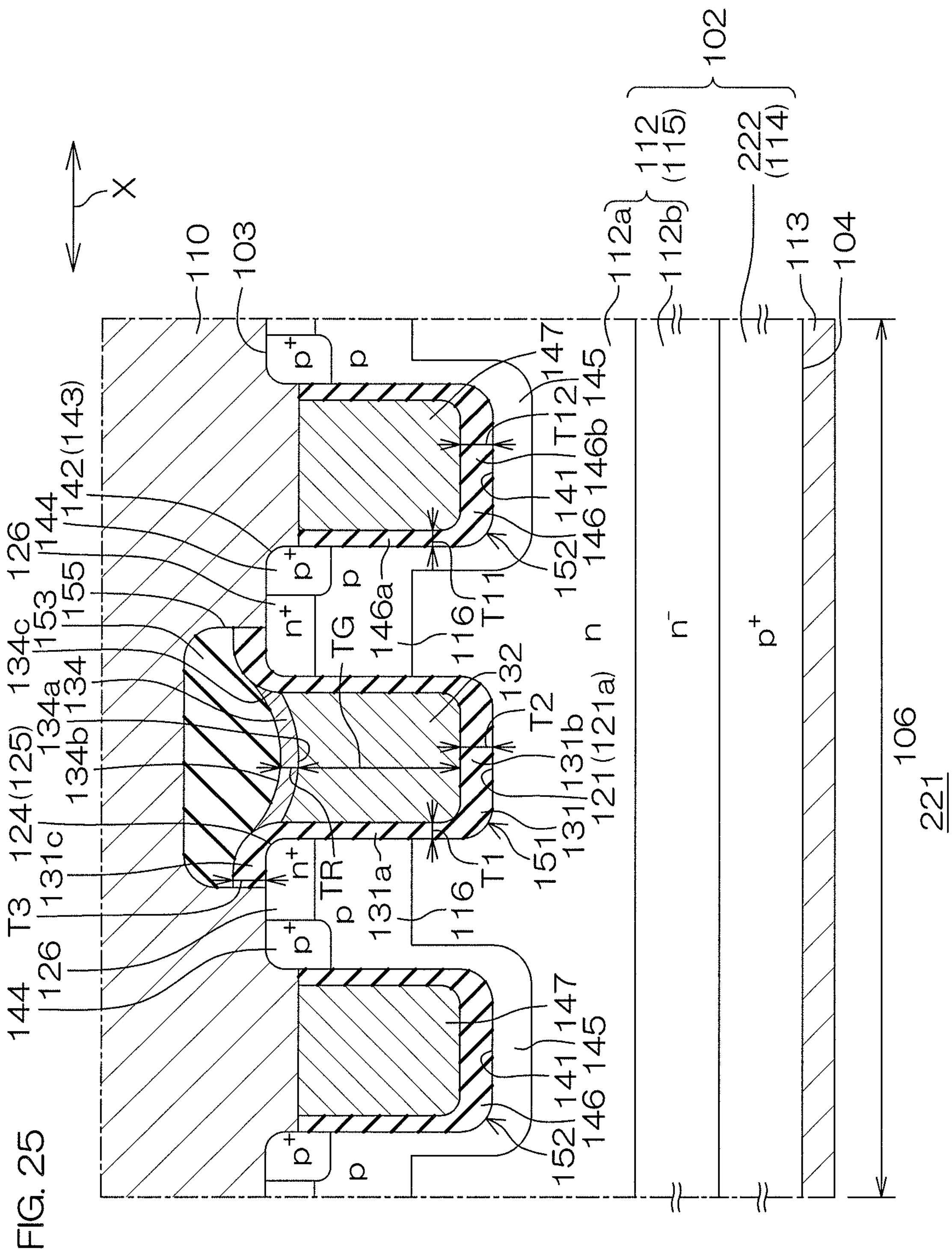
FIG. 25 is a sectional view of a region corresponding to FIG. 13 and is a sectional view for describing the structure of a semiconductor device according to a thirteenth preferred embodiment of the present invention.

FIG. 25 is a sectional view of a region corresponding to FIG. 13 and is a plan view for describing the structure of a semiconductor device 221 according to a thirteenth preferred embodiment of the present invention. In the following, structures corresponding to structures described with the semiconductor device 101 shall be provided with the same reference symbols and description thereof shall be omitted.

Referring to FIG. 25, in the semiconductor device 221, the SiC semiconductor layer 102 includes a $p^+$-type SiC semiconductor substrate 222 in place of the $n^+$-type SiC semiconductor substrate 111. The $p^+$-type SiC semiconductor substrate 222 is formed as a collector region of an IGBT (insulated gate bipolar transistor).

The description of the semiconductor device 101 applies to the description of the semiconductor device 221 with the "source" of the MISFET being replaced by an "emitter" of the IGBT and the "drain" of the MISFET being replaced by a "collector" of the IGBT.

That is, the source pad 110 and the source regions 126 are respectively replaced by an emitter pad (110) and emitter regions (126). Also, the drain pad 113 and the drain region 114 are respectively replaced by a collector electrode layer (113) and a collector region (114).

Even with the semiconductor device 221 described above, the same effects as the effects described for the semiconductor device 101 can be exhibited.

Figure 26:
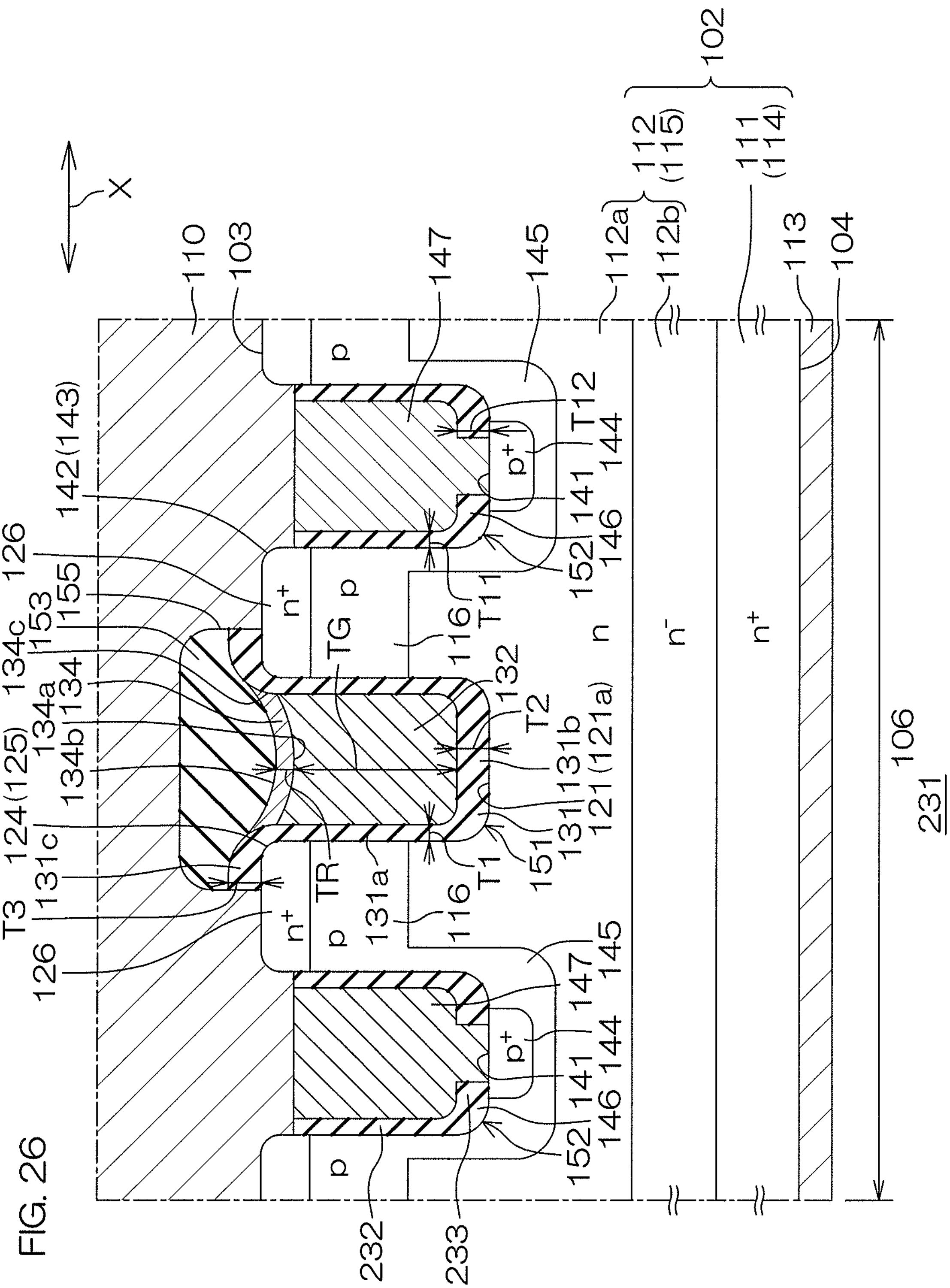
FIG. 26 is a sectional view of a region corresponding to FIG. 13 and is a sectional view for describing the structure of a semiconductor device according to a fourteenth preferred embodiment of the present invention.

FIG. 26 is a sectional view of a region corresponding to FIG. 13 and is a sectional view for describing the structure of a semiconductor device 231 according to a fourteenth preferred embodiment of the present invention. In the following, structures corresponding to structures described with the semiconductor device 101 shall be provided with the same reference symbols and description thereof shall be omitted.

Referring to FIG. 26, the contact regions 144 are formed in regions inside the deep well regions 145 along the bottom walls of the source trenches 141. The contact region 144 is exposed from the bottom wall of the source trench 141.

The source insulating layer 146 is formed along the inner wall surface of the source trench 141 such as to selectively expose the contact region 144 from the bottom wall of the source trench 141.

More specifically, the source insulating layer 146 includes a first portion 232 and a second portion 233. The first portion 232 covers the side wall of the source trench 141. The second portion 233 partially covers the bottom wall of the source trench 141.

The second portion 233 is continuous to the first portion 232. The second portion 233 extends along the bottom wall from the corner portion of the source trench 141 such as to expose a central portion of the bottom wall of the source trench 141. The second portion 233 may be formed in an endless shape (annular shape) in plan view.

With the semiconductor device 231 described above, the same effects as the effects described for the semiconductor device 101 can be exhibited. Also, with the semiconductor device 231, a pn junction portion is formed in boundary region between the SiC semiconductor layer 102 and the deep well region 145.

Even if depletion layer spread along the corner portion to the bottom wall of the source trench 141 from the pn junction portion, distance by which the depletion layer reaches the source electrode layer 147 can be increased by the source insulating layer 146. A occurrence of punch-through can thereby be suppressed in vicinity of the corner portion of the source trench 141.

Figure 27:
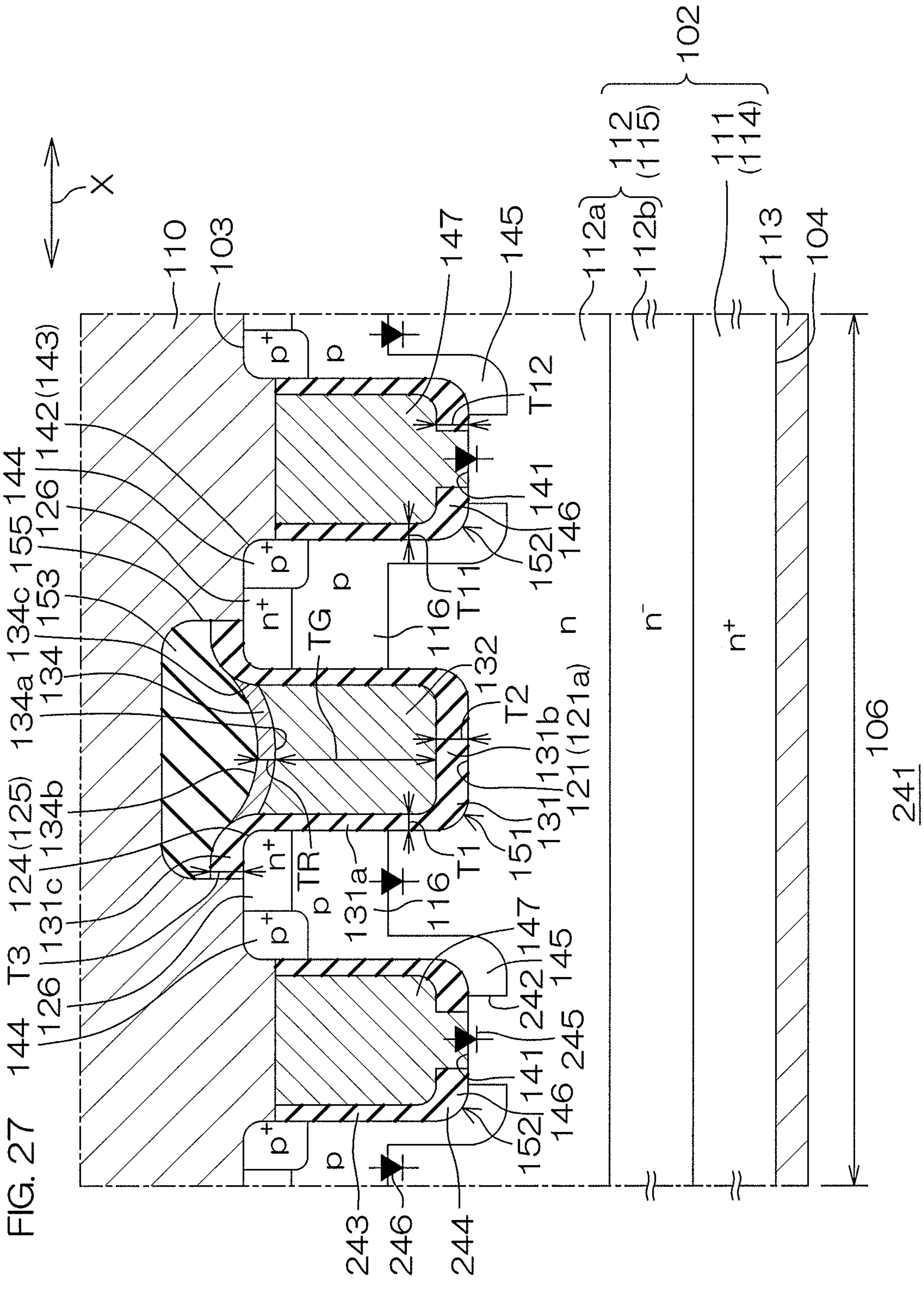
FIG. 27 is a sectional view of a region corresponding to FIG. 13 and is a sectional view for describing the structure of a semiconductor device according to a fifteenth preferred embodiment of the present invention.

FIG. 27 is a sectional view of a region corresponding to FIG. 13 and is a sectional view for describing the structure of a semiconductor device 241 according to a fifteenth preferred embodiment of the present invention. In the following, structures corresponding to structures described with the semiconductor device 101 shall be provided with the same reference symbols and description thereof shall be omitted.

Referring to FIG. 27, an exposing portion 242 selectively exposing the bottom wall of the source trench 141 is formed in each deep well region 145. The exposing portion 242 exposes a central portion of the bottom wall of the source trench 141.

The source insulating layer 146 includes a first portion 243 and a second portion 244 in this embodiment. The first portion 243 covers the side wall of the source trench 141. The second portion 244 partially covers the bottom wall of the source trench 141.

The second portion 244 is continuous to the first portion 243. The second portion 244 extends along the bottom wall from the corner portion of the source trench 141 such as to expose the central portion of the bottom wall of the source trench 141. The second portion 244 may be formed in an endless shape (annular shape) in plan view.

The source electrode layer 147 forms a heterojunction portion with the SiC semiconductor layer 102 at the exposing portion 242 of the deep well region 145. A heterojunction diode 245, having the source electrode layer 147 as an anode and the SiC semiconductor layer 102 as a cathode, is thereby formed. The source electrode layer 147 may include a conductive material besides a polysilicon as long as the heterojunction diode 245 is formed.

A body diode 246 is formed in a pn junction portion between the SiC semiconductor layer 102 and the body region 116. A junction barrier of the heterojunction diode 245 is smaller than a diffusion potential of the body diode 246.

The junction barrier of the heterojunction diode 245 may be not less than 1.0 eV and not more than 1.5 eV. The diffusion potential of the body diode 246 may be not less than 2.8 eV and not more than 3.2 eV.

With the semiconductor device 241 described above, the same effects as the effects described for the semiconductor device 101 can be exhibited. Also, with the semiconductor device 241, when a reverse bias voltage is applied, current can be made to flow preferentially into the heterojunction diodes 245.

Expansion of a crystal defect of SiC in the SiC semiconductor layer 102 can thereby be suppressed. Consequently, increase of on resistance can be suppressed while achieving improvement of the short circuit withstand capability and reduction of the feedback capacitance Crss.

Figure 28:
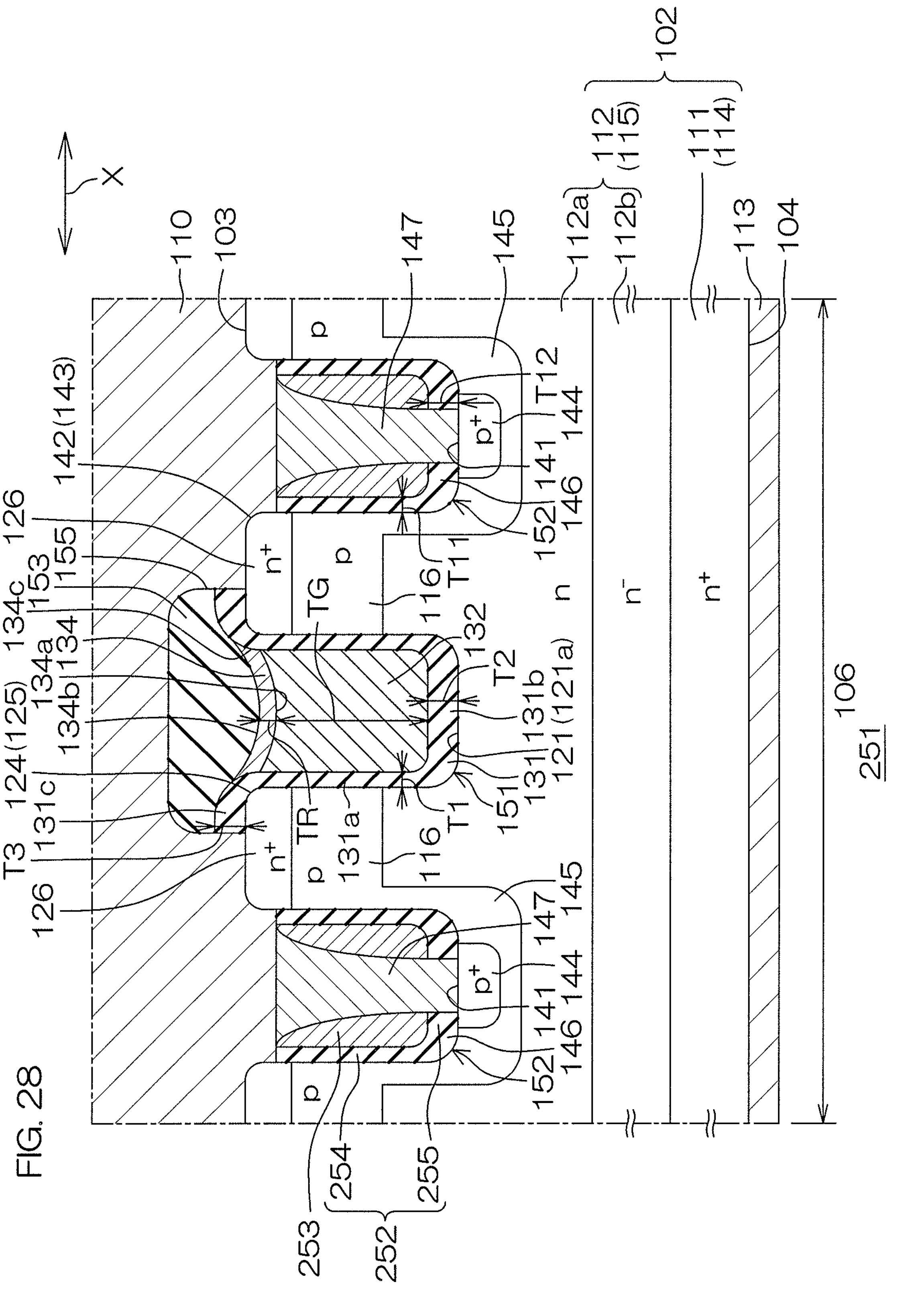
FIG. 28 is a sectional view of a region corresponding to FIG. 13 and is a sectional view for describing the structure of a semiconductor device according to a sixteenth preferred embodiment of the present invention.

FIG. 28 is a sectional view of a region corresponding to FIG. 13 and is a sectional view for describing the structure of a semiconductor device 251 according to a sixteenth preferred embodiment of the present invention. In the following, structures corresponding to structures described with the semiconductor device 101 shall be provided with the same reference symbols and description thereof shall be omitted.

Referring to FIG. 28, the contact regions 144 are formed in regions inside the deep well regions 145 along the bottom wall of the source trench 141. The contact region 144 is exposed from the bottom wall of the source trench 141.

The source insulating layer 146 has a laminated structure including a plurality of barrier forming layers formed along the inner wall of the source trench 141. The source insulating layer 146 has the laminated structure that includes an insulating barrier forming layer 252 and a conductive barrier forming layer 253 that are laminated in that order from the inner wall of the source trench 141, in this embodiment.

The insulating barrier forming layer 252 may include at least one of material among undoped silicon, silicon oxide, silicon nitride, aluminum oxide, aluminum nitride, or aluminum oxynitride.

The insulating barrier forming layer 252 is formed in a film shape along the inner wall surface of the source trench 141 such as to selectively expose the contact region 144 from the bottom wall of the source trench 141.

More specifically, the insulating barrier forming layer 252 includes a first portion 254 and a second portion 255. The first portion 254 covers the side wall of the source trench 141. The second portion 255 selectively covers the bottom wall of the source trench 141.

The second portion 255 is continuous to the first portion 254. The second portion 255 extends along the bottom wall from the corner portion of the source trench 141 such as to expose a central portion of the bottom wall of the source trench 141.

The conductive barrier forming layer 253 may include at least one of material among a conductive polysilicon, tungsten, platinum, nickel, cobalt, or molybdenum. The conductive barrier forming layer 253 contains a conductive material differing from the conductive material of the source electrode layer 147.

The conductive barrier forming layer 253 is formed in a film shape along the insulating barrier forming layer 252 such as to selectively expose the contact region 144 from the bottom wall of the source trench 141.

The source insulating layer 146 may include an insulating barrier forming layer made of an insulating material differing from the insulating barrier forming layer 252 in place of the conductive barrier forming layer 253. The source insulating layer 146 may include an insulating barrier forming layer made of the same insulating material as the insulating barrier forming layer 252 in place of the conductive barrier forming layer 253.

With the semiconductor device 251 described above, the same effects as the effects described for the semiconductor device 101 can be exhibited. Also, with the semiconductor device 251, the source insulating layer 146 has the laminated structure that includes the insulating barrier forming layer 252 and the conductive barrier forming layer 253. The occurrence of punch-through can thereby be suppressed by the double layer of the insulating barrier forming layer 252 and the conductive barrier forming layer 253.

Figure 29:
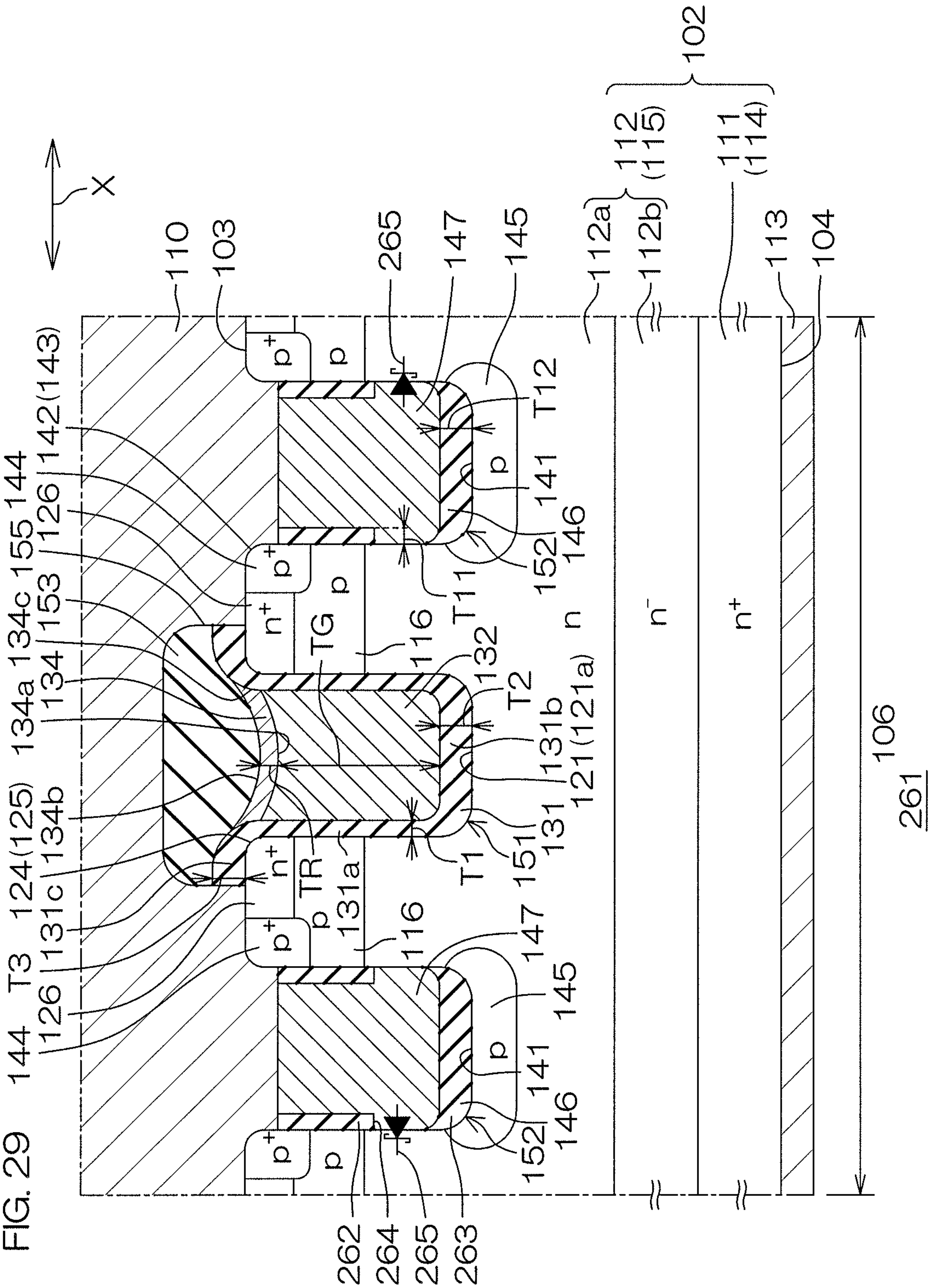
FIG. 29 is a sectional view of a region corresponding to FIG. 13 and is a sectional view for describing the structure of a semiconductor device according to a seventeenth preferred embodiment of the present invention.

FIG. 29 is a sectional view of a region corresponding to FIG. 13 and is a sectional view for describing the structure of a semiconductor device 261 according to a seventeenth preferred embodiment of the present invention. In the following, structures corresponding to structures described with the semiconductor device 101 shall be provided with the same reference symbols and description thereof shall be omitted.

Referring to FIG. 29, the contact regions 144 are formed in regions inside the deep well regions 145 along the bottom wall of the source trench 141. The contact region 144 is exposed from the bottom wall of the source trench 141.

The source insulating layer 146 includes a first portion 262 and a second portion 263. The first portion 262 covers the side wall of the source trench 141. The second portion 263 covers the bottom wall of the source trench 141.

The first portion 262 selectively has a side wall contact hole 264 that exposes the SiC semiconductor layer 102 from the side wall of the source trench 141. The first portion 262 may be formed to cross a boundary region between the SiC semiconductor layer 102 and the body region 116.

A lower side end portion (an end portion at the bottom wall side of the source trench 141) of the first portion 262 may be positioned at the bottom wall side of the source trench 141 with respect to a bottom portion of the body region 116. In this case, the source electrode layer 147 is electrically connected to the drift region 115 inside the source trench 141.

The lower side end portion of the first portion 262 may be positioned at the first main surface 103 side with respect to the bottom portion of the body region 116. The lower side end portion of the first portion 262 may be formed in a region between the bottom portion of the body region 116 and the bottom portions of the source regions 126. In these cases, the source electrode layer 147 is connected at least to the body region 116 inside the source trench 141.

The lower side end portion of the first portion 262 may be formed in a region between the first main surface 103 of the SiC semiconductor layer 102 and the bottom portion of the source region 126. The source insulating layer 146 may just have the second portion 263 without having the first portion 262. In these cases, the source electrode layer 147 is connected to the body region 116 and the contact regions 144 inside the source trench 141.

The second portion 263 of the source insulating layer 146 is formed across an interval from the first portion 262 of the source insulating layer 146. That is, the second portion 263 is separated from the first portion 262. The second portion 263 may cover the corner portion of the source trench 141.

The second portion 263 may expose the corner portion of the source trench 141. The second portion 263 may cover the corner portion of the source trench 141 and cover portion of the side wall of the source trench 141.

The source electrode layer 147 forms a Schottky junction with the SiC semiconductor layer 102 (drift region 115) inside the source trench 141. A Schottky barrier diode 265 having the source electrode layer 147 as an anode and the SiC semiconductor layer 102 as a cathode is thereby formed.

The p-type deep well region 145 is formed in a region of the SiC semiconductor layer 102 along the bottom wall of the source trench 141. The deep well region 145 is formed in the high concentration region 112*a* of the SiC epitaxial layer 112, in this embodiment. An entire area of the deep well region 145 is formed in the high concentration region 112*a*.

The deep well region 145 may be formed continuously in a region of the SiC semiconductor layer 102 along the side wall and the corner portion of the source trench 141 such as to expose the source electrode layer 147 from the side wall of the source trench 141.

The deep well region 145 covers the bottom wall of the source trench 141. The deep well region 145 covers the corner portion connecting the side wall and the bottom wall of the source trench 141. The deep well region 145 may expose substantially entire areas of the side wall of the source trench 141 in the SiC semiconductor layer 102.

The deep well region 145 is lead out in the lateral direction parallel to the first main surface 103 of the SiC semiconductor layer 102 from the bottom wall of the source trench 141. Thereby, the deep well region 145 faces the body region 116 across a partial region of the SiC semiconductor layer 102 (drift region 115) in regard to the direction normal to the first main surface 103 of the SiC semiconductor layer 102.

More specifically, the source electrode layer 147 forms the Schottky junction with the SiC semiconductor layer 102 (drift region 115) at a depth position between the body region 116 and the deep well region 145 in regard to the direction normal to the first main surface 103 of the SiC semiconductor layer 102.

Even more specifically, the source electrode layer 147 forms the Schottky junction with the SiC semiconductor layer 102 (drift region 115) in a region of the SiC semiconductor layer 102 sandwiched by the body region 116 and the deep well region 145 in regard to the direction normal to the first main surface 103 of the SiC semiconductor layer 102.

The source electrode layer 147 may have a laminated structure that includes a plurality of electrode layers. The source electrode layer 147 may include a first electrode layer and a second electrode layer laminated in that order from the SiC semiconductor layer 102 side.

The first electrode layer may be a barrier electrode layer that includes a Ti (titanium) film and/or a TiN (titanium nitride) film. The first electrode layer may have a laminated structure, in which a Ti (titanium) film and a TiN (titanium nitride) film are laminated in that order from the SiC semiconductor layer 102 side. The first electrode layer may have a single layer structure constituted of a Ti (titanium) film or a TiN (titanium nitride) film. The second electrode layer may include aluminum or tungsten.

With the semiconductor device 261 described above, the same effects as the effects described for the semiconductor device 101 can be exhibited. Also, with the semiconductor device 261, when a reverse bias voltage is applied, current can be made to flow preferentially into the Schottky barrier diodes 265.

Expansion of the crystal defect of SiC in the SiC semiconductor layer 102 can thereby be suppressed. Consequently, increase of on resistance can be suppressed while achieving improvement of the short circuit withstand capability and reduction of the feedback capacitance Crss.

With this embodiment, an example where each source electrode layer 147 forms a Schottky junction with the SiC semiconductor layer 102 inside the side wall contact hole 264 of the source insulating layer 146 was described. However, a configuration free from the source insulating layer 146 (first portion 262 and second portion 263) may be adopted.

Figure 30:
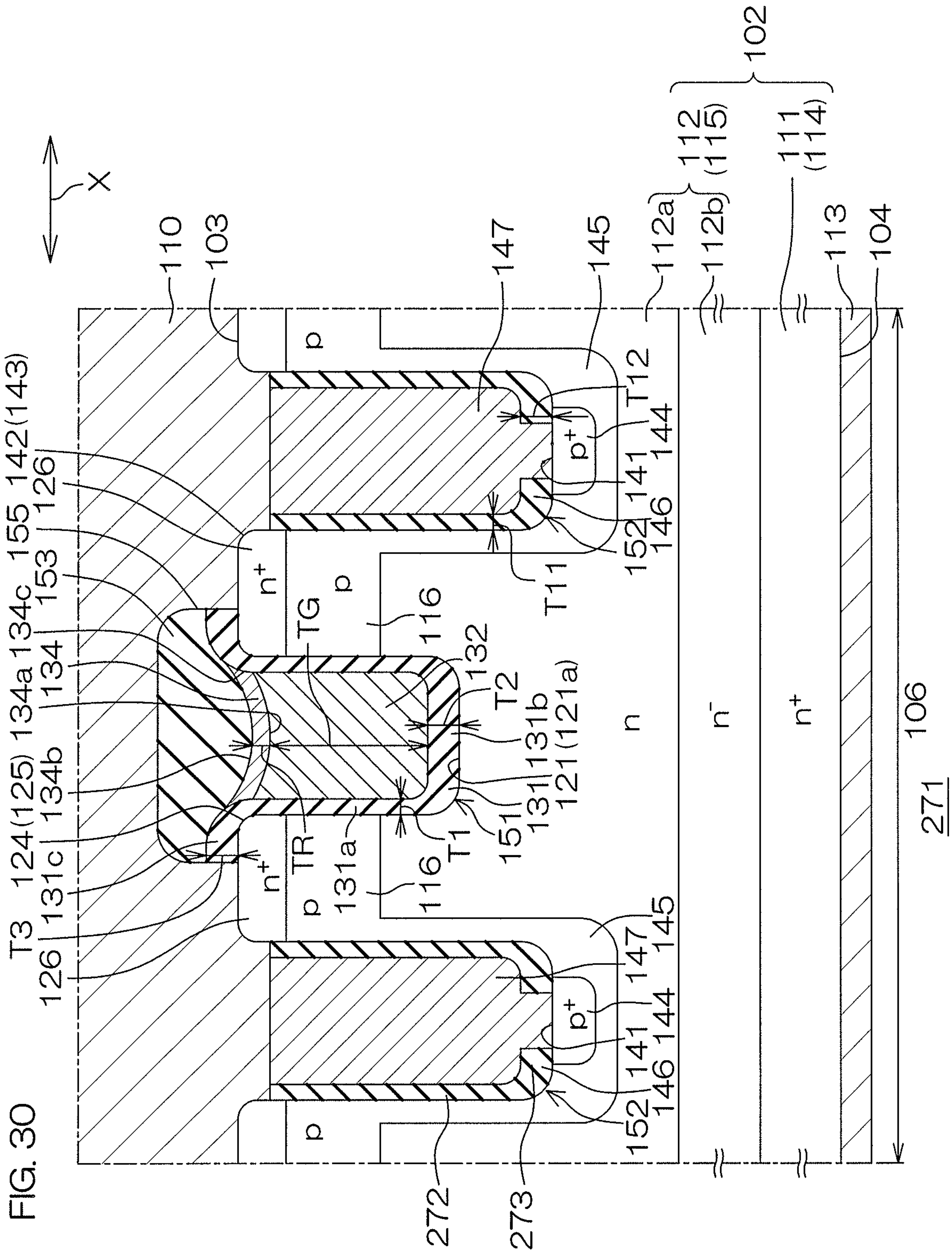
FIG. 30 is a sectional view of a region corresponding to FIG. 13 and is a sectional view for describing the structure of a semiconductor device according to an eighteenth preferred embodiment of the present invention.

FIG. 30 is a sectional view of a region corresponding to FIG. 13 and is a sectional view for describing the structure of a semiconductor device 271 according to an eighteenth preferred embodiment of the present invention. In the following, structures corresponding to structures described with the semiconductor device 201 shall be provided with the same reference symbols and description thereof shall be omitted.

Referring to FIG. 30, the contact region 144 is formed in region inside the deep well region 145 along the bottom wall of the source trench 141. The contact region 144 is exposed from the bottom wall of the source trench 141. The source insulating layer 146 is formed along the inner wall surface of the source trench 141 such as to selectively expose the contact region 144 from the bottom wall of the source trench 141.

More specifically, the source insulating layer 146 includes a first portion 272 and a second portion 273. The first portion 272 covers the side wall of the source trench 141. The second portion 273 partially covers the bottom wall of the source trench 141.

The second portion 273 is continuous to the first portion 272. The second portion 273 extends along the bottom wall from the corner portion of the source trench 141 such as to expose a central portion of the bottom wall of the source trench 141. The second portion 273 may be formed in an endless shape (annular shape) in plan view.

With the semiconductor device 271 described above, the same effects as the effects described for the semiconductor device 201 can be exhibited. Also, with the semiconductor device 271, pn junction portion is formed in boundary region between the SiC semiconductor layer 102 and the deep well region 145.

Even if depletion layer spread along the corner portion to the bottom wall of the source trench 141 from the pn junction portion, distance by which the depletion layer reaches the source electrode layer 147 can be increased by the source insulating layer 146. The occurrence of punch-through can thereby be suppressed in vicinity of the corner portion of the source trench 141.

Figure 31:
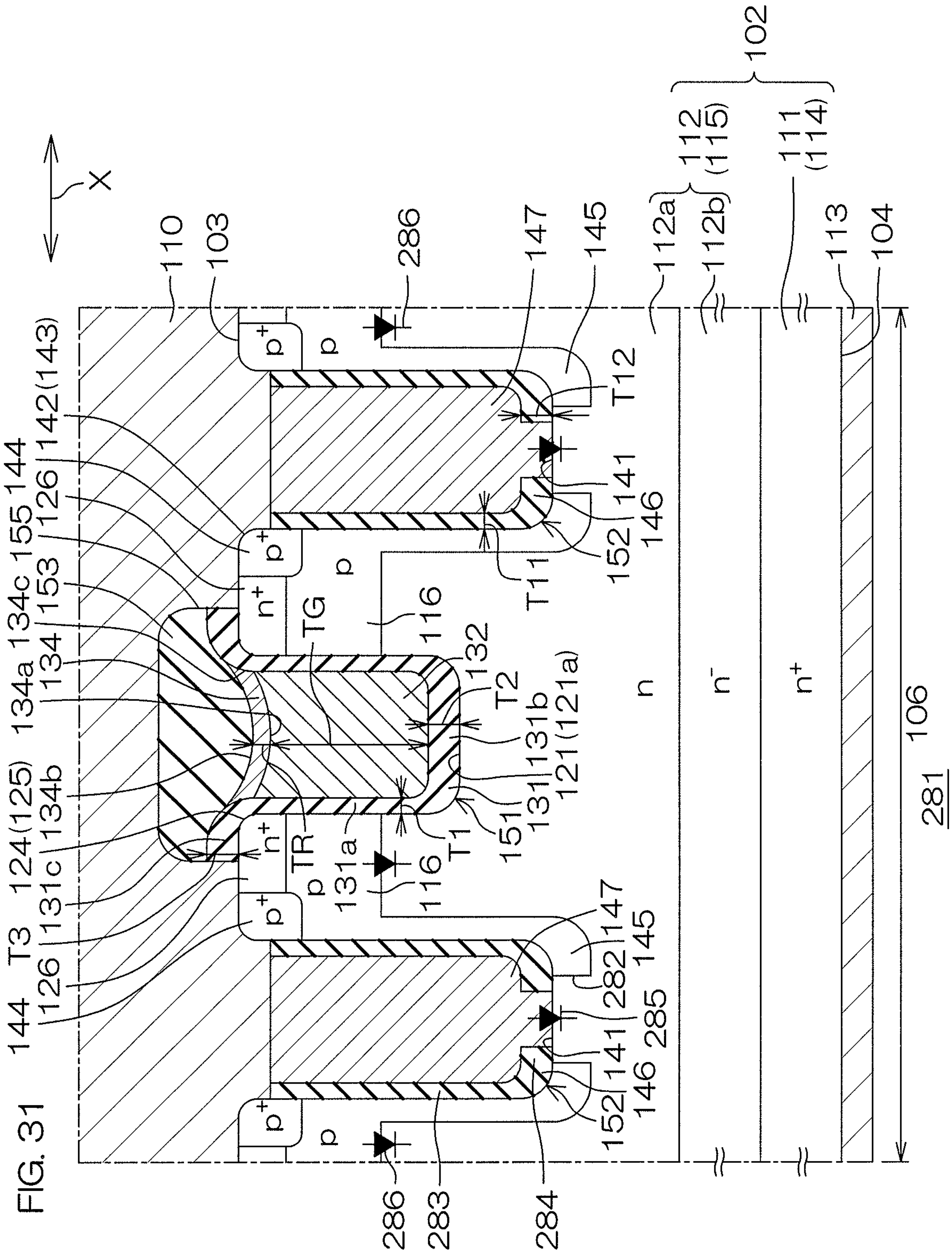
FIG. 31 is a sectional view of a region corresponding to FIG. 13 and is a sectional view for describing the structure of a semiconductor device according to a nineteenth preferred embodiment of the present invention.

FIG. 31 is a sectional view of a region corresponding to FIG. 13 and is a sectional view for describing the structure of a semiconductor device 281 according to a nineteenth preferred embodiment of the present invention. In the following, structures corresponding to structures described with the semiconductor device 201 shall be provided with the same reference symbols and description thereof shall be omitted.

Referring to FIG. 31, an exposing portion 282 selectively exposing the bottom wall of the source trench 141 is formed in the deep well region 145. The exposing portion 282 exposes a central portion of the bottom wall of the source trench 141.

The source insulating layer 146 includes a first portion 283 and a second portion 284 in this embodiment. The first portion 283 covers the side wall of the source trench 141. The second portion 284 partially covers the bottom wall of the source trench 141.

The second portion 284 is continuous to the first portion 283. The second portion 284 extends along the bottom wall from the corner portion of the source trench 141 such as to expose the central portion of the bottom wall of the source trench 141. The second portion 284 may be formed in an endless shape (annular shape) in plan view.

The source electrode layer 147 forms a heterojunction portion with the SiC semiconductor layer 102 at the exposing portion 282 of the deep well region 145. A heterojunction diode 285 having the source electrode layer 147 as an anode and the SiC semiconductor layer 102 as a cathode is thereby formed. The source electrode layer 147 may include a conductive material besides a polysilicon as long as the heterojunction diode 285 is formed.

A body diode 286 is formed in a pn junction portion between the SiC semiconductor layer 102 and the body region 116. A junction barrier of the heterojunction diode 285 is smaller than a diffusion potential of the body diode 286.

The junction barrier of the heterojunction diode 285 may be not less than 1.0 eV and not more than 1.5 eV. The diffusion potential of the body diode 286 may be not less than 2.8 eV and not more than 3.2 eV.

With the semiconductor device 281 described above, the same effects as the effects described for the semiconductor device 201 can be exhibited. Also, with the semiconductor device 281, when a reverse bias voltage is applied, current can be made to flow preferentially into the heterojunction diodes 285.

Expansion of a crystal defect of SiC in the SiC semiconductor layer 102 can thereby be suppressed. Consequently, increase of on resistance can be suppressed while achieving improvement of the short circuit withstand capability and reduction of the feedback capacitance Crss.

Figure 32:
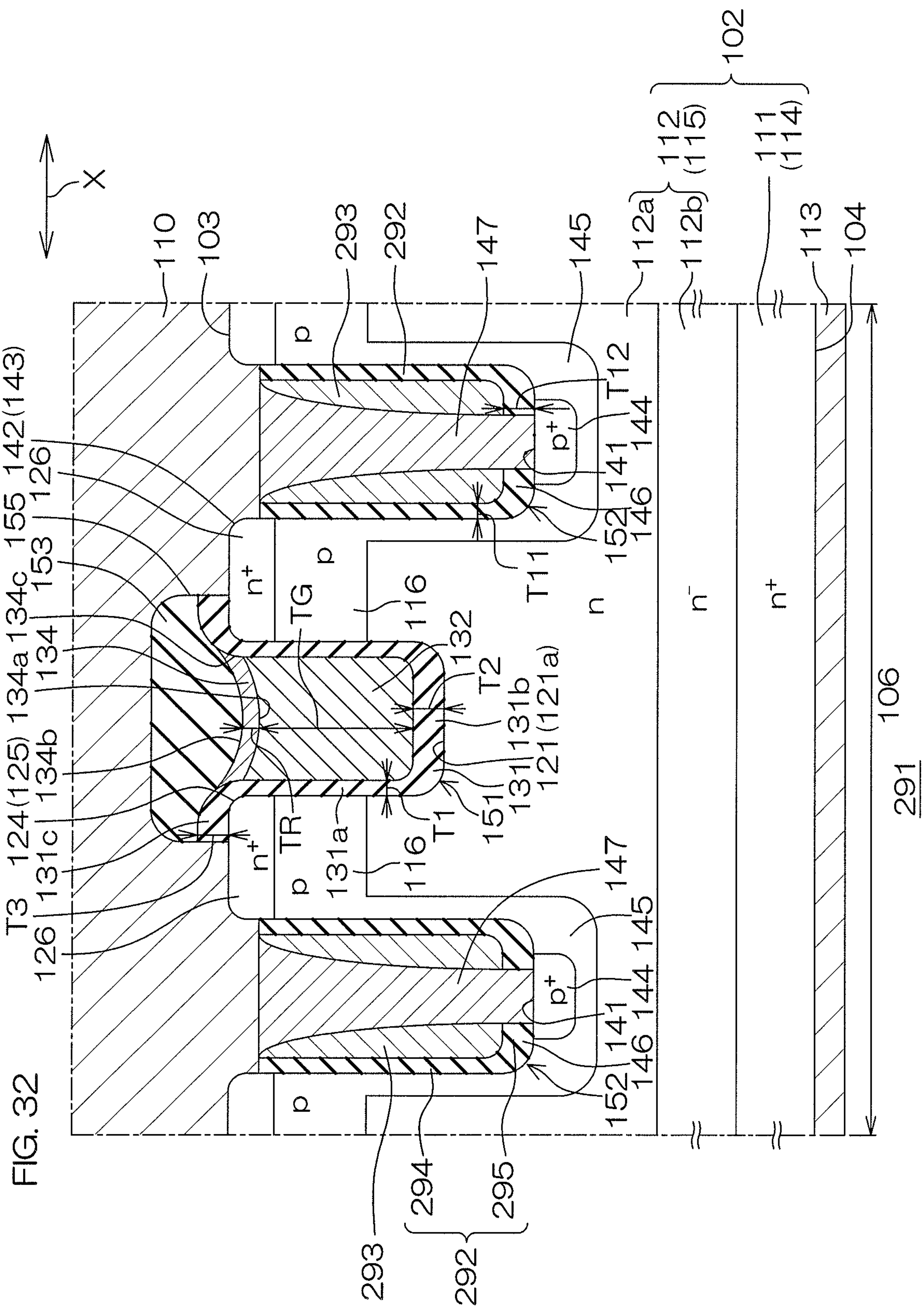
FIG. 32 is a sectional view of a region corresponding to FIG. 13 and is a sectional view for describing the structure of a semiconductor device according to a twentieth preferred embodiment of the present invention.

FIG. 32 is a sectional view of a region corresponding to FIG. 13 and is a sectional view for describing the structure of a semiconductor device 291 according to a twentieth preferred embodiment of the present invention. In the following, structures corresponding to structures described with the semiconductor device 201 shall be provided with the same reference symbols and description thereof shall be omitted.

Referring to FIG. 32, the contact region 144 is formed in region inside the deep well region 145 along the bottom wall of the source trench 141. The contact region 144 is exposed from the bottom wall of the source trench 141.

The source insulating layer 146 has a laminated structure including a plurality of barrier forming layers formed along the inner wall of the source trench 141. The source insulating layer 146 has the laminated structure that includes an insulating barrier forming layer 292 and a conductive barrier forming layer 293 that are laminated in that order from the inner wall of the source trench 141, in this embodiment.

The insulating barrier forming layer 292 may include at least one of material among undoped silicon, silicon oxide, silicon nitride, aluminum oxide, aluminum nitride, or aluminum oxynitride.

The insulating barrier forming layer 292 is formed in a film shape along the inner wall surface of the source trench 141 such as to selectively expose the contact region 144 from the bottom wall of the source trench 141.

More specifically, the insulating barrier forming layer 292 includes a first portion 294 and a second portion 295. The first portion 294 covers the side wall of the source trench 141. The second portion 295 selectively covers the bottom wall of the source trench 141.

The second portion 295 is continuous to the first portion 294. The second portion 295 extends along the bottom wall from the corner portion of the source trench 141 such as to expose a central portion of the bottom wall of the source trench 141.

The conductive barrier forming layer 293 may include at least one of material among a conductive polysilicon, tungsten, platinum, nickel, cobalt, or molybdenum. The conductive barrier forming layer 293 contains a conductive material differing from the conductive material of the source electrode layer 147.

The conductive barrier forming layer 293 is formed in a film shape along the insulating barrier forming layer 292 such as to selectively expose the contact region 144 from the bottom wall of the source trench 141.

With the semiconductor device 291 described above, the same effects as the effects described for the semiconductor device 201 can be exhibited. Also, with the semiconductor device 291, the source insulating layer 146 has the laminated structure that includes the insulating barrier forming layer 292 and the conductive barrier forming layer 293. The occurrence of punch-through can thereby be suppressed by the double layer of the insulating barrier forming layer 292 and the conductive barrier forming layer 293.

Figure 33:
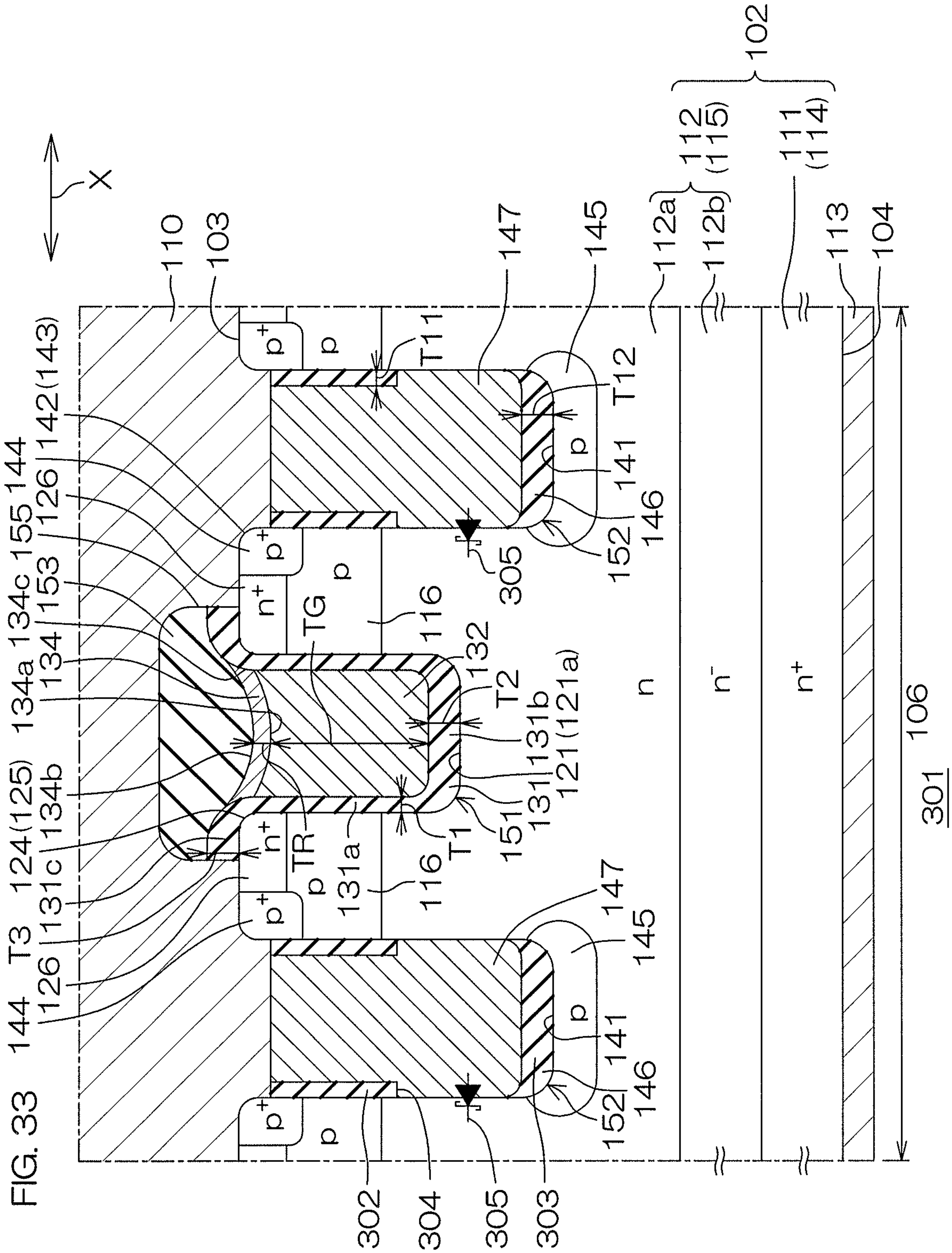
FIG. 33 is a sectional view of a region corresponding to FIG. 13 and is a sectional view for describing the structure of a semiconductor device according to a twenty-first preferred embodiment of the present invention.

FIG. 33 is a sectional view of a region corresponding to FIG. 13 and is a sectional view for describing the structure of a semiconductor device 301 according to a twenty-first preferred embodiment of the present invention. In the following, structures corresponding to structures described with the semiconductor device 201 shall be provided with the same reference symbols and description thereof shall be omitted.

Referring to FIG. 33, the contact region 144 is formed in region inside the deep well region 145 along the bottom wall of the source trench 141. The contact region 144 is exposed from the bottom wall of the source trench 141.

The source insulating layer 146 includes a first portion 302 and a second portion 303. The first portion 302 covers the side wall of the source trench 141. The second portion 303 covers the bottom wall of the source trench 141.

The first portion 302 selectively has a side wall contact hole 304 that exposes the SiC semiconductor layer 102 from the side wall of the source trench 141. The first portion 302 may be formed to cross a boundary region between the SiC semiconductor layer 102 and the body region 116.

A lower side end portion (an end portion at the source trench 141 side) of the first portion 302 may be positioned at the bottom wall side of the source trench 141 with respect to a bottom portion of the body region 116. In this case, the source electrode layer 147 is electrically connected to the drift region 115, inside the source trench 141.

The lower side end portion of the first portion 302 may be positioned at the first main surface 103 side with respect to the bottom portion of the body region 116. The lower side end portion of the first portion 302 may be formed in a region between the bottom portion of the body region 116 and the bottom portions of the source regions 126. In these cases, the source electrode layer 147 is connected at least to the body region 116, inside the source trench 141.

The lower side end portion of the first portion 302 may be formed in a region between the first main surface 103 of the SiC semiconductor layer 102 and the bottom portions of the source regions 126. The source insulating layer 146 may just have the second portion 303 without having the first portion 302. In these cases, the source electrode layer 147 is connected to the body region 116 and the contact regions 144, inside the source trench 141.

The second portion 303 of the source insulating layer 146 is formed across an interval from the first portion 302 of the source insulating layer 146. That is, the second portion 303 is separated from the first portion 302. The second portion 303 may cover the corner portion of the source trench 141.

The second portion 303 may expose the corner portion of the source trench 141. The second portion 303 may cover the corner portion of the source trench 141 and cover portions of the side wall of the source trench 141.

The source electrode layer 147 forms a Schottky junction with the SiC semiconductor layer 102 (drift region 115), inside the source trench 141. A Schottky barrier diode 305 having the source electrode layer 147 as an anode and the SiC semiconductor layer 102 as a cathode is thereby formed.

The p-type deep well region 145 is formed in a region of the SiC semiconductor layer 102 along the bottom wall of the source trench 141. The deep well region 145 is formed in the high concentration region 112*a* of the SiC epitaxial layer 112, in this embodiment. An entire area of the deep well region 145 is formed in the high concentration region 112*a*.

The deep well region 145 may be formed continuously in a region of the SiC semiconductor layer 102 along the side wall and the corner portion of the source trench 141 such as to expose the source electrode layer 147 from the side wall of the source trench 141.

The deep well region 145 covers the bottom wall of the source trench 141. The deep well region 145 covers the corner portion connecting the side wall and the bottom wall of the source trench 141. The deep well region 145 may expose substantially entire areas of the side wall of the source trench 141 in the SiC semiconductor layer 102.

The deep well region 145 is lead out in the lateral direction parallel to the first main surface 103 of the SiC semiconductor layer 102 from the bottom wall of the source trench 141. Thereby, the deep well region 145 faces the body region 116 across a partial region of the SiC semiconductor layer 102 (drift region 115) in regard to the direction normal to the first main surface 103 of the SiC semiconductor layer 102.

The deep well region 145 is lead out in the lateral direction parallel to the first main surface 103 of the SiC semiconductor layer 102 from the bottom wall of the source trench 141. Thereby, the deep well region 145 faces the body region 116 across partial regions of the SiC semiconductor layer 102 (drift region 115) in regard to the direction normal to the first main surface 103 of the SiC semiconductor layer 102.

More specifically, the source electrode layer 147 forms the Schottky junction with the SiC semiconductor layer 102 (drift region 115) at a depth position between the body region 116 and the deep well region 145 in regard to the direction normal to the first main surface 103 of the SiC semiconductor layer 102.

Even more specifically, the source electrode layer 147 forms the Schottky junction with the SiC semiconductor layer 102 (drift region 115) in a region of the SiC semiconductor layer 102 sandwiched by the body region 116 and the deep well region 145 in regard to the direction normal to the first main surface 103 of the SiC semiconductor layer 102.

The source electrode layer 147 may have a laminated structure that includes a plurality of electrode layers. The source electrode layer 147 may include a first electrode layer and a second electrode layer laminated in that order from the SiC semiconductor layer 102 side.

The first electrode layer may be a barrier electrode layer that includes a Ti (titanium) film and/or a TiN (titanium nitride) film. The first electrode layer may have a laminated structure, in which a Ti (titanium) film and a TiN (titanium nitride) film are laminated in that order from the SiC semiconductor layer 102 side. The first electrode layer may have a single layer structure constituted of a Ti (titanium) film or a TiN (titanium nitride) film. The second electrode layer may include aluminum or tungsten.

With the semiconductor device 301 described above, the same effects as the effects described for the semiconductor device 201 can be exhibited. Also, with the semiconductor device 301, when a reverse bias voltage is applied, current can be made to flow preferentially into the Schottky barrier diodes 305.

Expansion of the crystal defect of SiC in the SiC semiconductor layer 102 can thereby be suppressed. Consequently, increase of on resistance can be suppressed while achieving improvement of the short circuit withstand capability and reduction of the feedback capacitance Crss.

With this embodiment, an example where each source electrode layer 147 forms a Schottky junction with the SiC semiconductor layer 102 inside the side wall contact hole 264 of the source insulating layer 146 was described. However, a configuration free from the source insulating layer 146 (first portion 302 and second portion 303) may be adopted.

Although the seventh to twenty-first preferred embodiments of the present invention have been described above, the seventh to twenty-first preferred embodiments of the present invention may also be implemented in yet other configurations.

With each of the seventh to twenty-first preferred embodiments described above, an example where the SiC epitaxial layer 112 having the high concentration region 112*a* and the low concentration region 112*b* is formed by an epitaxial growth method was described. However, the SiC epitaxial layer 112 may be formed by steps such as the following.

First, the SiC epitaxial layer 112 having a comparatively low n-type impurity concentration is formed by an epitaxial growth method. Next, the n-type impurity is introduced into a surface layer portion of the SiC epitaxial layer 112 by an ion implantation method. The SiC epitaxial layer 112 having the high concentration region 112*a* and the low concentration region 112*b* is thereby formed.

With each of the seventh to twenty-first preferred embodiments described above, an example where the SiC semiconductor layer 102 has the laminated structure that includes the SiC semiconductor substrate 111 and the SiC epitaxial layer 112 was described. However, the SiC semiconductor layer 102 may have a single layer structure constituted of the SiC semiconductor substrate 111. The SiC semiconductor layer 102 may have a single layer structure constituted of the SiC epitaxial layer 112.

With each of the seventh to twenty-first preferred embodiments described above, a structure with which the conductivity types of the respective semiconductor portions are inverted may be adopted. That is, a p-type portion may be formed to be of an n-type and an n-type portion may be formed to be of a p-type.

With each of the seventh to twenty-first preferred embodiments described above, an example where the gate electrode layer 132 and the gate wiring layer 133 that contain the p-type polysilicon doped with the p-type impurity are formed was described. However, the gate electrode layers 132 and the gate wiring layer 133 may include an n-type polysilicon doped with an n-type impurity instead of the p-type polysilicon, if increase of the gate threshold voltage Vth is not emphasized.

The low resistance electrode layer 134 may be formed by a siliciding portion forming surface layer portion of the gate electrode layer 132 (n-type polysilicon) by a metal material. That is, the low resistance electrode layer 134 may include an n-type polycide. With such a structure, reduction of gate resistance can be achieved.

The structure of the semiconductor device 221 may be adopted in the seventh to twenty-first preferred embodiments described above. That is, in each of the seventh to twenty-first preferred embodiments, the $p^+$-type SiC semiconductor substrate 222 may be adopted in place of the $n^+$-type SiC semiconductor substrate 111. In this case, in the description of the seventh to thirteenth preferred embodiments described above, "source" is replaced by "emitter" and "drain" is replaced by "collector."

Figure 34:
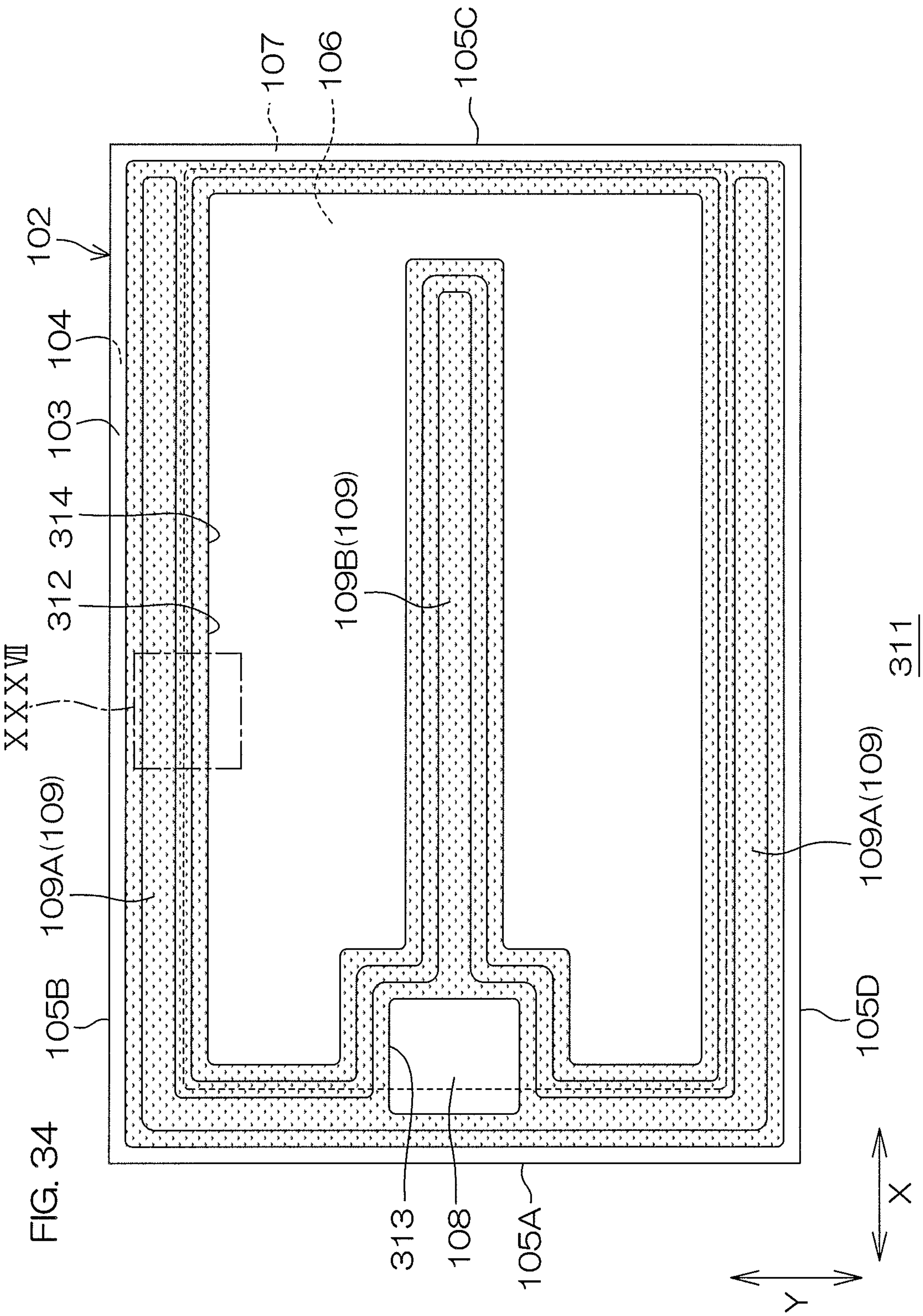
FIG. 34 is a top view of a semiconductor device according to a twenty-second preferred embodiment of the present invention.
Figure 35:
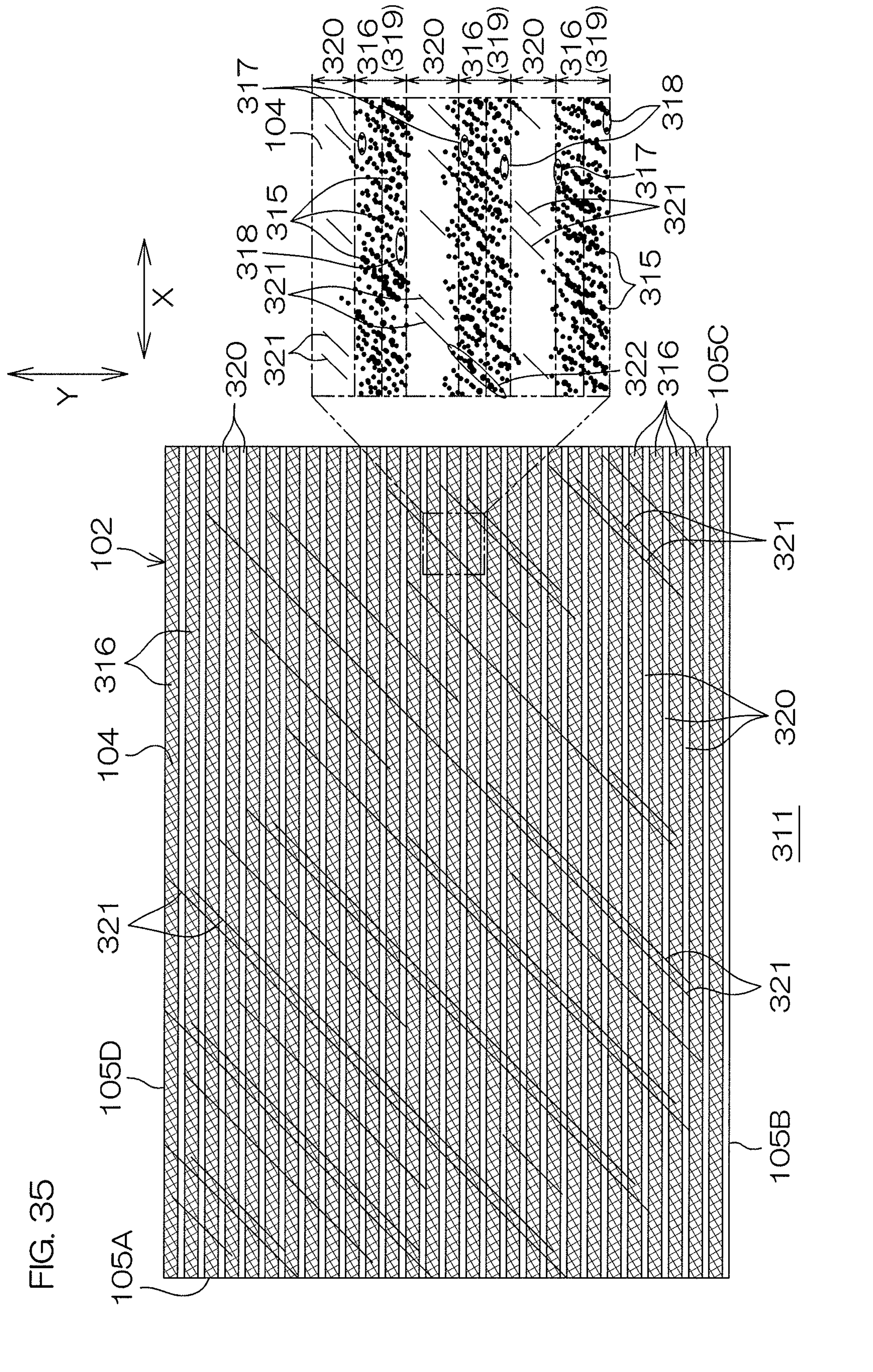
FIG. 35 is a bottom view of the semiconductor device shown in FIG. 34 and is a bottom view of a first configuration example of raised portion groups.

FIG. 34 is a top view of a semiconductor device 311 according to a twenty-second preferred embodiment of the present invention. FIG. 35 is a bottom view of the semiconductor device 311 shown in FIG. 34. In the following, structures corresponding to structures described with the semiconductor device 101 shall be provided with the same reference symbols and description thereof shall be given.

Referring to FIG. 34, the semiconductor device 311 has the SiC semiconductor layer 102 that includes an SiC (silicon carbide) monocrystal. The SiC semiconductor layer 102 may include a 4H—SiC monocrystal.

The 4H—SiC monocrystal has an off angle inclined at an angle of within 10° in the [11-20] direction from a [0001] plane. The off angle may be not less than 0° and not more than 4°. The off angle may exceed 0° and be less than 4°. The off angle is typically 2° or 4° and more specifically is set in a range of 2°±0.2° or a range of 4°±0.4°.

The SiC semiconductor layer 102 is formed in a chip shape of rectangular parallelepiped shape, in this embodiment. The SiC semiconductor layer 102 has the first main surface 103 at one side, the second main surface 104 at another side, and the side surfaces 105A, 105B, 105C, and 105D connecting the first main surface 103 and the second main surface 104. The first main surface 103 and the second main surface 104 are formed in quadrilateral shapes (rectangular shapes in this embodiment) in a plan view as viewed in a direction normal to the surfaces (hereinafter referred to simply as "plan view").

The side surface 105A faces the side surface 105C. The side surface 105B faces the side surface 105D. The four side surfaces 105A to 105D respectively extend as planes along the direction normal to the first main surface 103 and the second main surface 104. A length of each of the side surfaces 105A to 105D may be not less than 1 mm and not more than 10 mm (for example, not less than 2 mm and not more than 5 mm).

The active region 106 and the outer region 107 are set in the SiC semiconductor layer 102. The active region 106 is a region in which a vertical MISFET is formed. The outer region 107 is a region at an outer side of the active region 106.

The active region 106 is set in a central portion of the SiC semiconductor layer 102 at intervals toward an inner region from the side surfaces 105A to 105D of the SiC semiconductor layer 102 in plan view. The active region 106 is set to a quadrilateral shape (a rectangular shape in this embodiment) having four sides parallel to the four side surfaces 105A to 105D of the SiC semiconductor layer 102 in plan view.

The outer region 107 is set in a region between the side surfaces 105A to 105D of the SiC semiconductor layer 102 and peripheral edges of the active region 106. The outer region 107 is set to an endless shape (quadrilateral annular shape) surrounding the active region 106 in plan view.

The gate pad 108, the gate finger 109, and the source pad 110 are formed on the first main surface 103 of the SiC semiconductor layer 102. The gate pad 108, the gate finger 109, and the source pad 110 may include aluminum and/or copper.

The gate pad 108 is formed along the side surface 105A of the SiC semiconductor layer 102 in plan view. The gate pad 108 is formed along the central region of the side surface 105A of the SiC semiconductor layer 102 in plan view. The gate pad 108 may be formed along the corner portion connecting any two of the four side surfaces 105A to 105D of the SiC semiconductor layer 102 in plan view.

The gate pad 108 is formed in the quadrilateral shape in plan view. The gate pad 108 is lead out into the active region 106 from the outer region 107 such as to cross the boundary region between the outer region 107 and the active region 106 in plan view.

The gate finger 109 includes an outer gate finger 109A and an inner gate finger 109B. The outer gate finger 109A is lead out from the gate pad 108 to the outer region 107. The outer gate finger 109A extends as a band shape in the outer region 107.

The outer gate finger 109A is formed along the three side surfaces 105A, 105B, and 105D of the SiC semiconductor layer 102 such as to define the active region 106 from three directions in this embodiment.

The inner gate finger 109B is lead out from the gate pad 108 to the active region 106. The inner gate finger 109B extends as a band shape in the active region 106. The inner gate finger 109B extends from the side surface 105A side toward the side surface 105C side.

The source pad 110 is formed in the active region 106 across intervals from the gate pad 108 and the gate finger 109. The source pad 110 is formed in a C shape (an inverted C shape in FIG. 34) in plan view such as to cover a region of a C shape (inverted C shape in FIG. 34) defined by the gate pad 108 and the gate finger 109.

The gate voltage is applied to the gate pad 108 and the gate finger 109. The gate voltage may be not less than 10 V and not more than 50 V (for example, approximately 30 V). The source voltage is applied to the source pad 110. The source voltage may be a reference voltage (for example, a GND voltage).

A resin layer 312 is formed above the first main surface 103 of the SiC semiconductor layer 102 (more specifically, on the interlayer insulating layer 153). In FIG. 34, the resin layer 312 is shown with hatching applied for clarity. The resin layer 312 covers the gate pad 108, the gate finger 109, and the source pad 110.

The resin layer 312 may include a negative type or positive type photosensitive resin. The resin layer 312 includes a polybenzoxazole as an example of a positive type photosensitive resin, in this embodiment. The resin layer 312 may include a polyimide as an example of a negative type photosensitive resin.

A peripheral edge portion of the resin layer 312 is formed across intervals in an inner region from the side surfaces 105A to 105D of the SiC semiconductor layer 102. The peripheral edge portion of the resin layer 312 thereby exposes the first main surface 103 of the SiC semiconductor layer 102. More specifically, the peripheral edge portion of the resin layer 312 exposes the interlayer insulating layer 153.

A gate pad opening 313 and a source pad opening 314 are formed in the resin layer 312. The gate pad opening 313 exposes the gate pad 108. The source pad opening 314 exposes the source pad 110.

Referring to FIG. 35 and an enlarged view in FIG. 35, raised portion groups 316 each including a plurality of raised portions 315 is formed on the second main surface 104 of the SiC semiconductor layer 102. The raised portions 315 are portions of the second main surface 104 of the SiC semiconductor layer 102 that are raised along the direction normal to the second main surface 104 of the SiC semiconductor layer 102.

The raised portions 315 are formed at intervals from each other along an arbitrary first direction X and a second direction Y intersecting the first direction X. The first direction X is one of planar directions of the first main surface 103 of the SiC semiconductor layer 102.

The first direction X is set to a direction parallel to the side surfaces 105B and 105D of the SiC semiconductor layer 102 in this embodiment. The second direction Y is, more specifically, a direction orthogonal to the first direction X. That is, the second direction Y is set to a direction parallel to the side surfaces 105A and 105C of the SiC semiconductor layer 102 in this embodiment.

The raised portion group 316 has a first portion 317 in which some raised portions 315 among the raised portions 315 overlap in the first direction X in a first direction view viewed from the first direction X.

The raised portion group 316 also has a second portion 318 in which some raised portions 315 among the raised portions 315 are formed separated from the first portion 317 and overlap in the first direction X in the first direction view.

The raised portions 315 are formed successively along the first direction X. More specifically, the raised portions 315 have a dotted pattern interspersed at intervals along the first direction X and the second direction Y.

The raised portions 315 are formed successively along the first direction X while maintaining the dotted pattern. The raised portions 315 are formed across from a peripheral edge at the side surface 105A side at one side to a peripheral edge at the side surface 105C side at the other side of the SiC semiconductor layer 102 in plan view, in this embodiment.

Distances between the raised portions 315 that are formed at intervals in the first direction X in each raised portion group 316 may differ from each other. Distances between the raised portions 315 that are formed at intervals in the second direction Y in each raised portion group 316 may differ from each other.

The raised portions 315 may be formed in non-uniform shape, size, and thickness, respectively. The thickness of a raised portion 315 is a distance from a base portion to a top portion (tip portion) of the raised portion 315 in regard to the direction normal to the second main surface 104 of the SiC semiconductor layer 102.

The raised portions 315 may each have a size exceeding 0 μm and not more than 10 μm. Each raised portion 315 may have a thickness of not more than 500 nm (for example, not less than 1 nm and 250 nm).

Each raised portion group 316 is formed in a range of the second main surface 104 of the SiC semiconductor layer 102 that is narrower than widths of the side surfaces 105A to 105D (side surfaces 105A and 105C in this embodiment) of the SiC semiconductor layer 102.

The raised portion group 316 is, for example, formed in a range that is not less than 1/1000th and not more than 1/5th the widths of the side surfaces 105A to 105D (side surfaces 105A and 105C in this embodiment) of the SiC semiconductor layer 102.

The raised portion group 316 may be formed in a range that is not less than 1/200th and not more than 1/10th the widths of the side surfaces 105A to 105D (side surfaces 105A and 105C in this embodiment) of the SiC semiconductor layer 102.

The raised portion group 316 may be formed in a range of not less than 10 μm and not more than 200 μm in regard to the second direction Y. The raised portion group 316 may be formed in a range of not less than 50 μm and not more than 150 μm in regard to the second direction Y. The raised portion group 316 may be formed in a range of not less than 80 μm and not more than 120 μm in regard to the second direction Y.

The raised portion group 316 has a layout in which the raised portions 315 overlap in the first direction X in the first direction view viewed from the first direction X. The raised portion group 316 thereby forms a raised portion group region 319 extending as a band shape along the first direction X by a collective pattern of the raised portions 315 interspersed successively along the first direction X.

In other words, the raised portion group region 319 includes the raised portions 315 (the raised portion group 316) formed in a band-shaped region of the second main surface 104 of the SiC semiconductor layer 102 extending along the first direction X.

The raised portion groups 316 (raised portion group regions 319) of such configuration is formed on the second main surface 104 of the SiC semiconductor layer 102 at intervals along the second direction Y.

That is, the dotted pattern of the raised portions 315 is formed intermittently in a second direction view viewed from the second direction Y. Distances between the raised portion groups 316 may have a value of not less than 1% and not more than 25% of the range in which each raised portion group 316 is formed.

A distance between the mutually adjacent raised portion groups 316 in regard to the second direction Y may be not more than 100 μm. The distance between the raised portion groups 316 may be not less than 5 μm and not more than 50 μm. The distance between the raised portion groups 316 may be not more than 20 μm.

The first direction X may be set to the [11-20] direction and the second direction Y may be set to the [1-100] direction. That is, the raised portion groups 316 may each form the band-shaped raised portion group region 319 extending substantially in parallel or in parallel to the [11-20] direction and be formed in plurality at intervals along the [1-100] direction.

The first direction X may be set to the [1-100] direction and the second direction Y may be set to the [11-20] direction. That is, the raised portion groups 316 may each form the band-shaped raised portion group region 319 extending substantially in parallel or in parallel to the [1-100] direction and be formed in plurality at intervals along the [11-20] direction.

Spaces 320 free from the dotted pattern constituted of the raised portions 315 are defined in regions of the second main surface 104 of the SiC semiconductor layer 102 between raised portion groups 316 that are mutually adjacent in the second direction Y.

The space 320 is defined as a band shape extending in parallel to the first direction X by mutually adjacent raised portion groups 316 (raised portion group regions 319). A stripe pattern in which the raised portion groups 316 and the spaces 320 are formed alternately along the second direction Y is thereby formed on the second main surface 104 of the SiC semiconductor layer 102.

A plurality of grooves 321 is formed in the second main surface 104 of the SiC semiconductor layer 102. In FIG. 35 and the enlarged view in FIG. 35, the grooves 321 are indicated by lines. The grooves 321 are formed in the raised portion groups 316 and the spaces 320.

The plurality of grooves 321 includes grinding marks formed due to grinding of a second wafer main surface 333 of an SiC semiconductor wafer 331 to be described below. A direction in which the grooves 321 extend thus differs according to a position at which the SiC semiconductor layer 102 is cut out from the SiC semiconductor wafer 331.

The grooves 321 may extend substantially parallel or parallel to the respective raised portion groups 316. The grooves 321 may include portions intersecting the raised portion groups 316. The grooves 321 may extend in a direction intersecting or orthogonal to the respective raised portion groups 316. The grooves 321 may extend rectilinearly or may extend in arcs.

Some of the raised portions 315 included in each raised portion group 316 are formed at intervals along the groove 321. That is, each raised portion group 316 includes a third portion 322 with which some raised portions 315 of the raised portions 315 are formed at intervals along a groove 321 in plan view.

Each raised portion group 316 is formed, for example, by an annealing treatment method. The raised portions 315 may be laser processing marks formed by a laser annealing treatment method.

The raised portions 315 along the grooves 321 (the third portions 322 of the raised portion groups 316) may be formed by an annealing treatment method performed on unevenness of the second main surface 104 of the SiC semiconductor layer 102 (second wafer main surface 333 of the SiC semiconductor wafer 331) defined by the grooves 321.

Each raised portion group 316 may take on any of various configurations by adjustment of annealing treatment conditions (laser annealing treatment conditions in the present case) as shown in FIG. 36A to FIG. 36D.

Figure 36A:
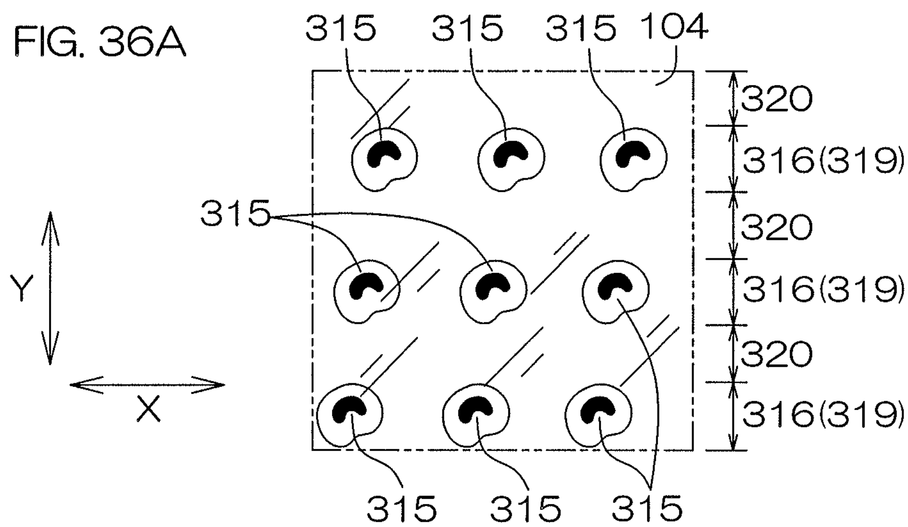
FIG. 36A is a diagram of a second configuration example of raised portion groups.

FIG. 36A is a diagram of a second configuration example of the respective raised portion groups 316.

As shown in FIG. 36A, the raised portion group 316 may include the raised portions 315 convexly curved shape extending along the first direction X and projecting along the second direction Y (to the side surface 105B side in FIG. 36A) in plan view. The raised portion 315 may be formed by a plurality of mutually overlapping raised portions 315.

A distance between the most separated two points in the raised portion 315 may be not less than 1 μm and not more than 200 μm (approximately 50 μm in the present configuration example). A distance between a plurality of mutually adjacent raised portions 315 in regard to the first direction X is set to a value not less than 10% of the size of each raised portion 315. The raised portions 315 are formed by shifting mutually adjacent laser irradiation positions in the first direction X.

Figure 36B:
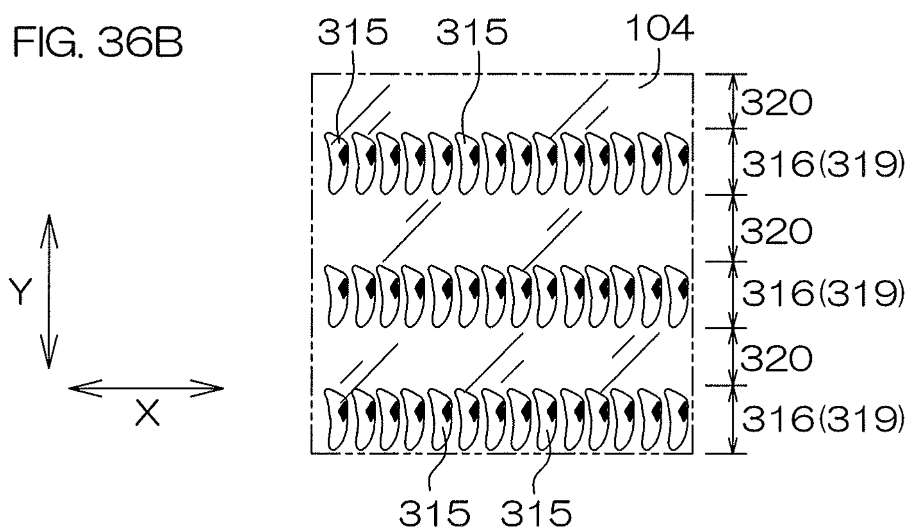
FIG. 36B is a diagram of a third configuration example of raised portion groups.

FIG. 36B is a diagram of a third configuration example of the raised portion groups 316.

As shown in FIG. 36B, the raised portion group 316 may include the raised portions 315 concavely curved shape extending along the second direction Y and recessed along the first direction X in plan view. The raised portion 315 may be formed by a plurality of mutually overlapping raised portions 315.

The distance between the most separated two points in each raised portion 315 may be not less than 1 μm and not more than 200 μm (approximately 50 μm in the present configuration example). The raised portions 315 are formed by making mutually adjacent laser irradiation positions overlap in a range of not less than 50% and not more than 70%.

Figure 36C:
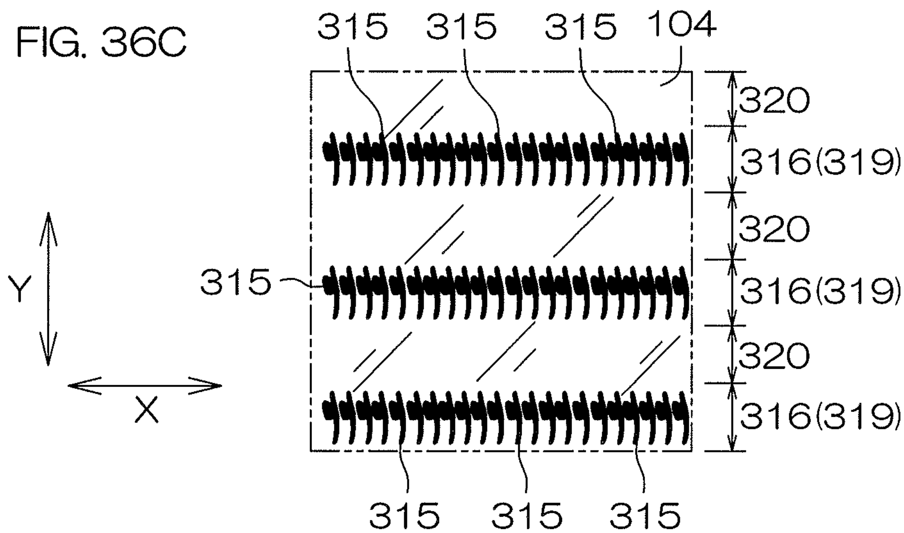
FIG. 36C is a diagram of a fourth configuration example of raised portion groups.

FIG. 36C is a diagram of a fourth configuration example of the raised portion groups 316.

As shown in FIG. 36C, the raised portion group 316 may include the raised portions 315 of line shapes extending along the second direction Y and recessed along the first direction X in plan view. The raised portion 315 may have a projecting portion projecting along the first direction X. The raised portion 315 may be formed by a plurality of mutually overlapping raised portions 315.

The distance between the most separated two points in each raised portion 315 may be not less than 1 μm and not more than 200 μm (approximately 50 μm in the present configuration example). The raised portions 315 are formed by making mutually adjacent laser irradiation positions overlap in a range of not less than 70% and not more than 90%.

Figure 36D:
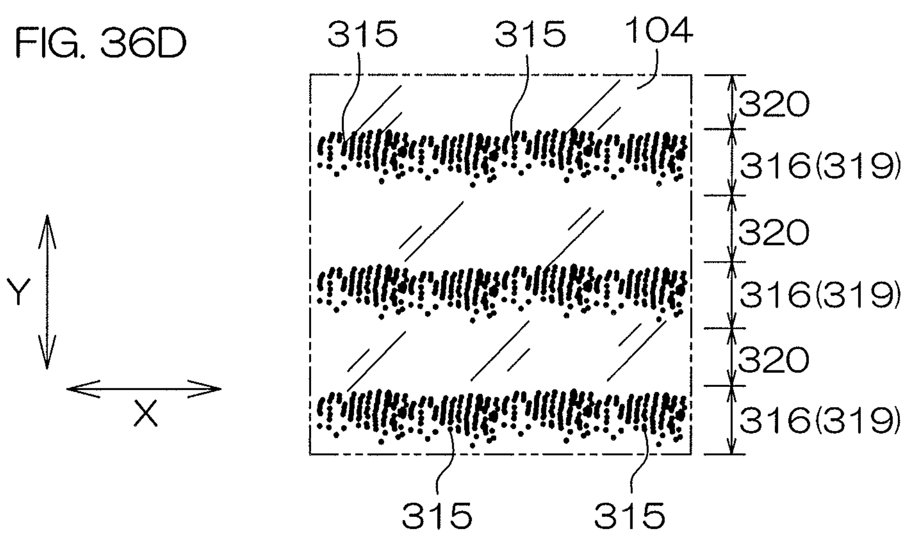
FIG. 36D is a diagram of a fifth configuration example of raised portion groups.

FIG. 36D is a diagram of a fifth configuration example of the raised portion groups 316.

As shown in FIG. 36D, the raised portion group 316 may have a layout where raised portion columns including the raised portions 315 aligned at intervals along the second direction Y are formed at intervals along the first direction X.

The distance between the most separated two points in each raised portion 315 may be not less than 1 μm and not more than 200 μm (approximately 5 μm in the present configuration example). The raised portions 315 are formed by making mutually adjacent laser irradiation positions overlap in a range of not less than 90% and less than 100%.

Figure 37:
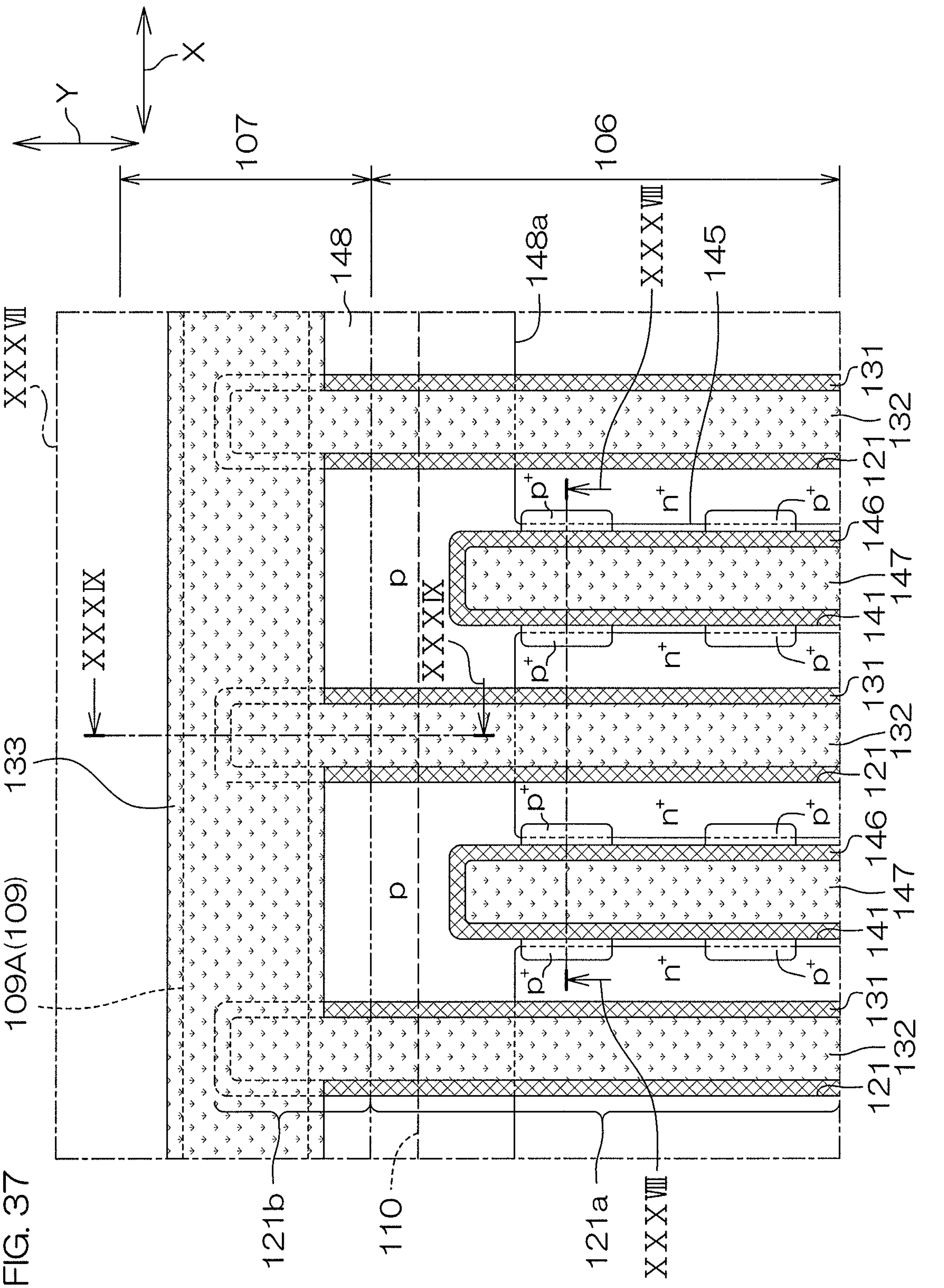
FIG. 37 is an enlarged view of a region XXXVII shown in FIG. 34 and is a diagram with which the structure above the first main surface of the SiC semiconductor layer is removed.
Figure 38:
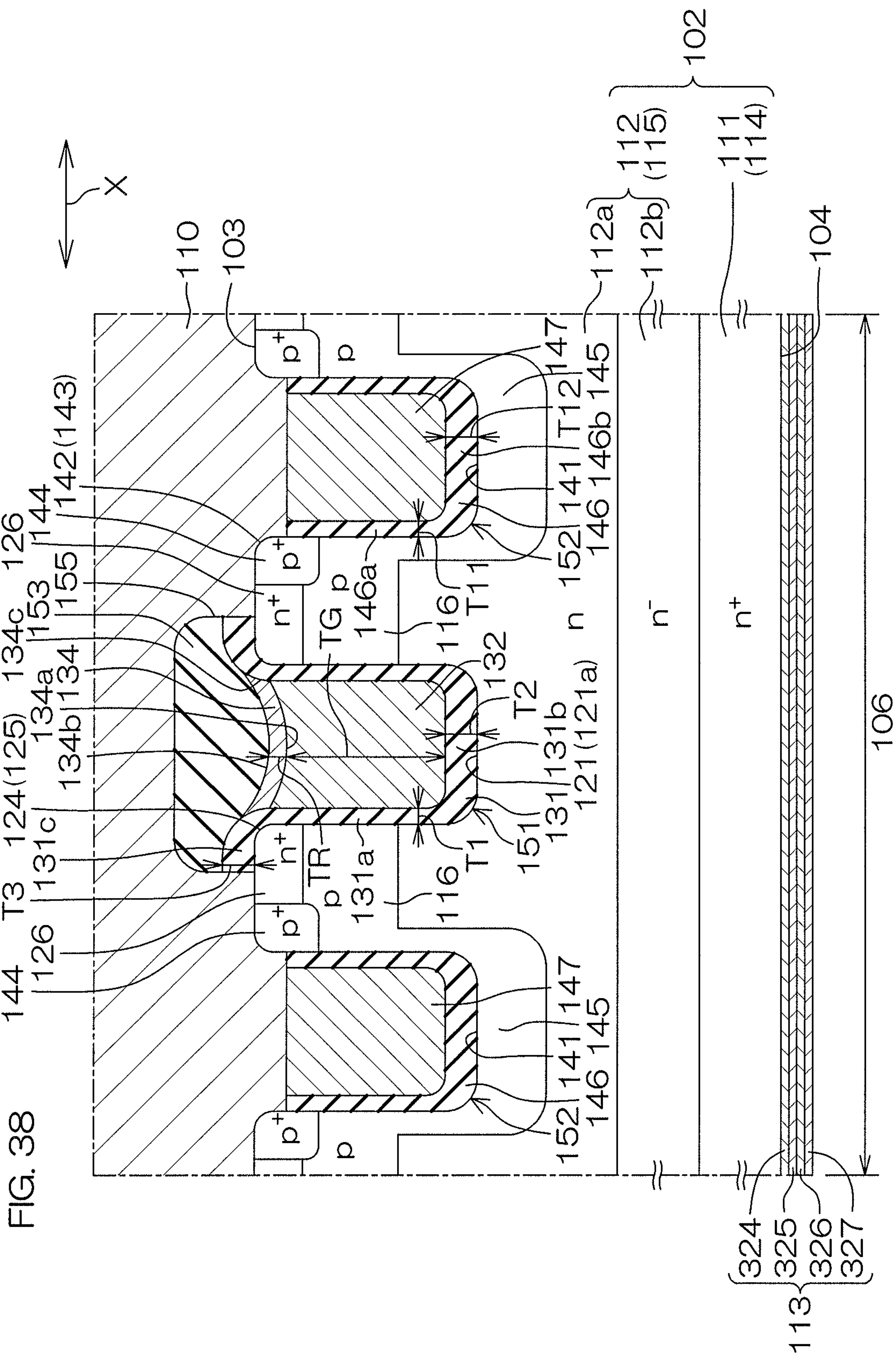
FIG. 38 is a sectional view taken along line XXXVIII-XXXVIII of FIG. 37.
Figure 39:
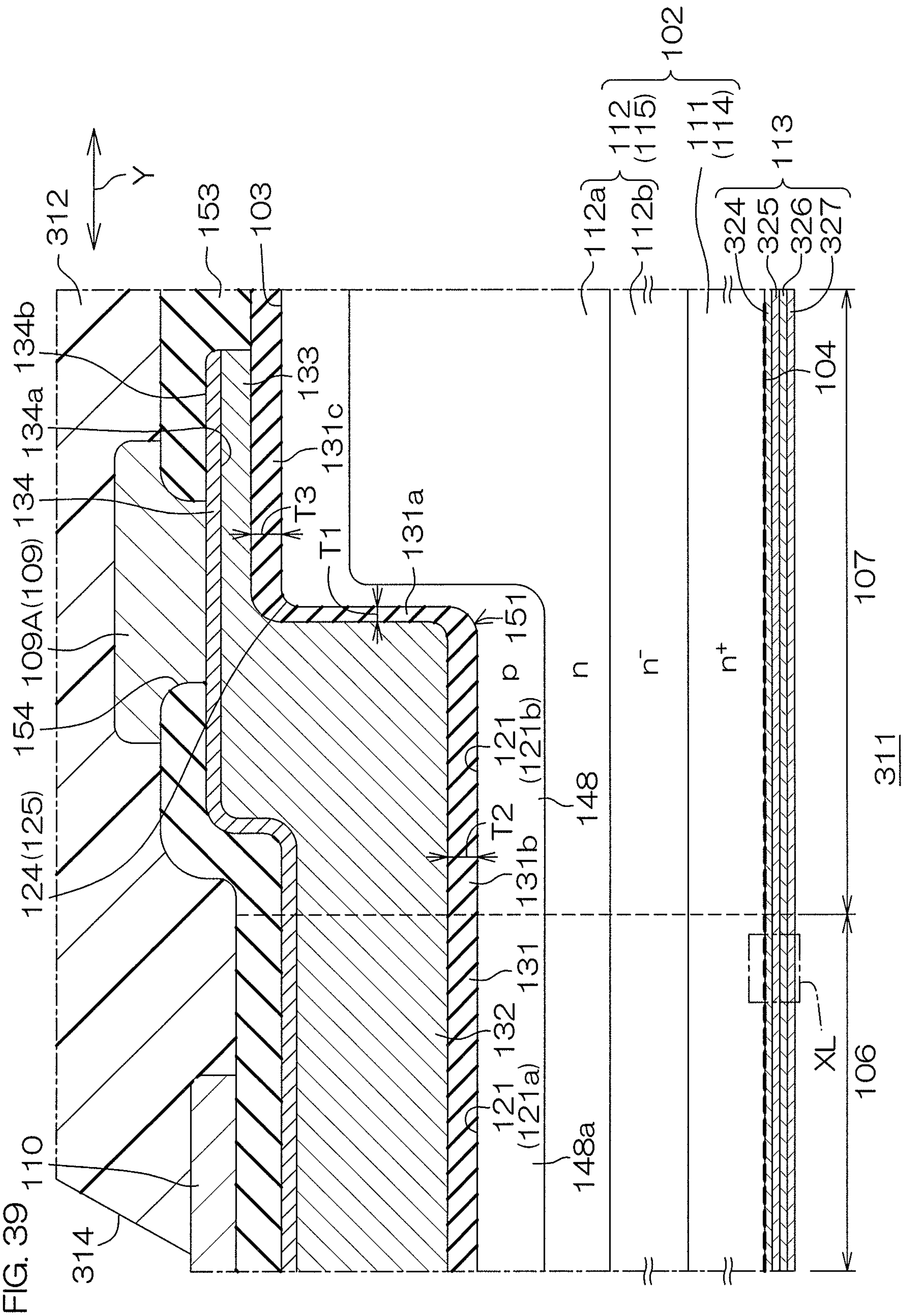
FIG. 39 is a sectional view taken along line XXXIX-XXXIX of FIG. 37.
Figure 40:
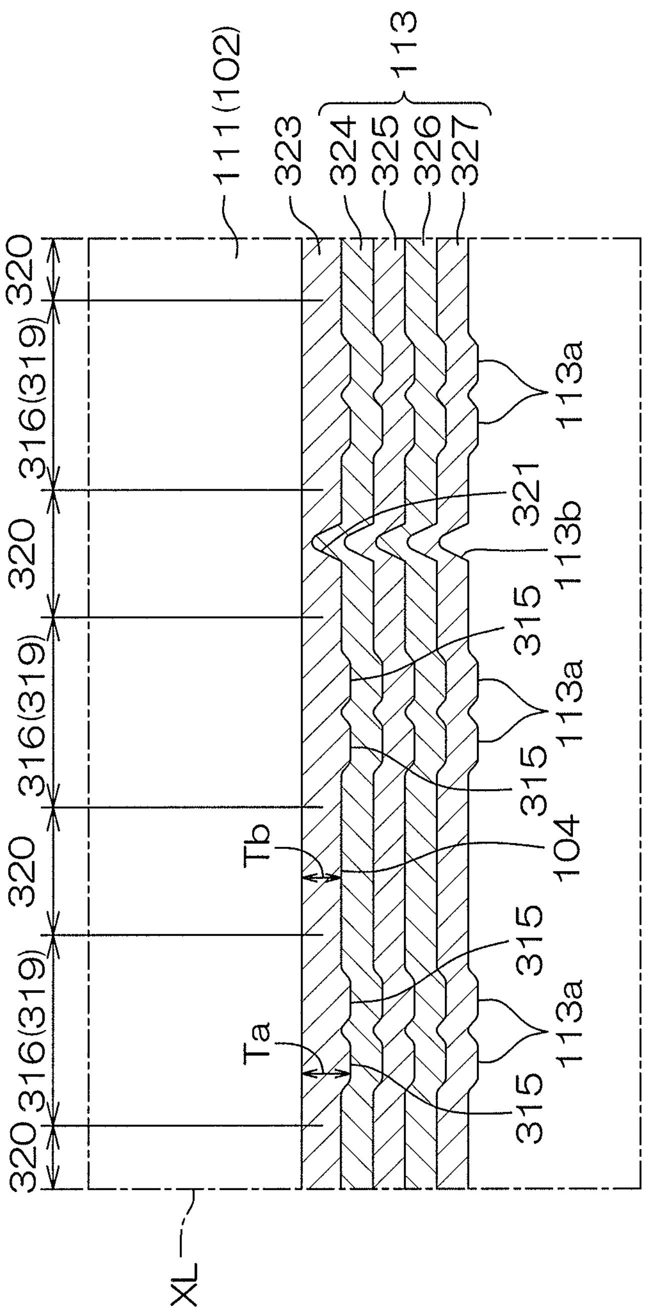
FIG. 40 is an enlarged view of a region XL shown in FIG. 39.

FIG. 37 is an enlarged view of a region XXXVII shown in FIG. 34 and is a diagram with which the structure above the first main surface 103 of the SiC semiconductor layer 102 is removed. FIG. 38 is a sectional view taken along line XXXVIII-XXXVIII of FIG. 37. FIG. 39 is a sectional view taken along line XXXIX-XXXIX of FIG. 37. FIG. 40 is an enlarged view of a region XL shown in FIG. 39.

Referring to FIG. 37 to FIG. 39, the semiconductor device 311 has the same planar structure and cross-sectional structure as the semiconductor device 101 with the exception of the point that the raised portion groups 316 are formed on the second main surface 104 of the SiC semiconductor layer 102.

Referring to FIG. 40, the raised portion groups 316 (raised portions 315) and the grooves 321 are formed on the SiC semiconductor substrate 111. A modified layer 323 with which a portion of the SiC of the SiC semiconductor layer 102 (SiC semiconductor substrate 111) is modified to have different properties is formed in a surface layer portion of the second main surface 104 of the SiC semiconductor layer 102. The modified layer 323 is formed by the annealing treatment method being performed on the second main surface 104 of the SiC semiconductor layer 102.

The modified layer 323 contains Si atoms and C atoms. More specifically, the modified layer 323 has a carbon density lower than a carbon density of a region of the SiC semiconductor layer 102 (SiC semiconductor substrate 111) outside the modified layer 323.

The modified layer 323 also has a silicon density that is higher than the carbon density. That is, the modified layer 323 includes an Si modified layer with which the SiC of the SiC semiconductor layer 102 (SiC semiconductor substrate 111) is modified to Si. The Si modified layer may be an Si amorphous layer.

The modified layer 323 may include a lattice defect due to the modification of SiC. That is, the modified layer 323 may include a lattice defect region having a defect level introduced due to the modification of SiC.

The modified layer 323 is formed in regions of the surface layer portion of the second main surface 104 of the SiC semiconductor layer 102 along the raised portion groups 316, in this embodiment. The raised portions 315 are thereby formed by the modified layer 323 in each raised portion group 316.

Further, the modified layer 323 extends from the raised portion groups 316 to the spaces 320, in this embodiment. That is, the annealing treatment method performed on the second main surface 104 of the SiC semiconductor layer 102 extends to the spaces 320 as well.

A thickness of a portion of the modified layer 323 along the raised portion groups 316 is made not less than a thickness of a portion of the modified layer 323 along the spaces 320 by the presence of the raised portions 315. More specifically, the thickness of the portion of the modified layer 323 along the raised portion groups 316 is greater than the thickness of the portion of the modified layer 323 along the spaces 320.

The thickness of the modified layer 323 may be not less than 1 nm and not more than 1000 nm. A thickness Ta of a region of the modified layer 323 forming the raised portion 315 may be not less than 50 nm and not more than 1000 nm. A thickness Tb of a region of the modified layer 323 outside the raised portion 315 may be not less than 1 nm and not more than 300 nm.

The thickness Ta may be not less than 50 nm and not more than 100 nm. The thickness Ta may be not less than 100 nm and not more than 150 nm. The thickness Ta may be not less than 150 nm and not more than 200 nm. The thickness Ta may be not less than 200 nm and not more than 250 nm.

The thickness Ta may be not less than 250 nm and not more than 300 nm. The thickness Ta may be not less than 300 nm and not more than 350 nm. The thickness Ta may be not less than 350 nm and not more than 400 nm. The thickness Ta may be not less than 400 nm and not more than 450 nm. The thickness Ta may be not less than 450 nm and not more than 500 nm.

The thickness Ta may be not less than 500 nm and not more than 600 nm. The thickness Ta may be not less than 600 nm and not more than 700 nm. The thickness Ta may be not less than 700 nm and not more than 800 nm. The thickness Ta may be not less than 800 nm and not more than 900 nm. The thickness Ta may be not less than 900 nm and not more than 1000 nm.

The thickness Tb may be not less than 1 nm and not more than 10 nm. The thickness Tb may be not less than 10 nm and not more than 50 nm. The thickness Tb may be not less than 50 nm and not more than 100 nm.

The thickness Tb may be not less than 100 nm and not more than 150 nm. The thickness Tb may be not less than 150 nm and not more than 200 nm. The thickness Tb may be not less than 200 nm and not more than 250 nm. The thickness Tb may be not less than 250 nm and not more than 300 nm.

The thickness Tb may be not more than $\frac{1}{2}$, not more than $\frac{1}{3}$, not more than $\frac{1}{4}$, not more than $\frac{1}{5}$, not more than $\frac{1}{6}$, not more than $\frac{1}{7}$, not more than $\frac{1}{8}$, not more than $\frac{1}{9}$, not more than $\frac{1}{10}$, not more than $\frac{1}{11}$, not more than $\frac{1}{12}$, not more than $\frac{1}{13}$, not more than $\frac{1}{14}$, not more than $\frac{1}{15}$, not more than $\frac{1}{16}$, not more than $\frac{1}{17}$, not more than $\frac{1}{18}$, not more than $\frac{1}{19}$, or not more than $\frac{1}{20}$ of the thickness Ta.

A resistance value of the second main surface 104 when the raised portion groups 316 are not present on the second main surface 104 of the SiC semiconductor layer 102 is greater than a resistance value of the second main surface 104 when the raised portion groups 316 are present on the second main surface 104 of the SiC semiconductor layer 102.

That is, the raised portion groups 316 each have a resistance value not more than a resistance value of an SiC monocrystal alone as an electrical characteristic. More specifically, the raised portion groups 316 each have a resistance value less than the resistance value of the SiC monocrystal alone.

The raised portion groups 316 also each have a resistance value not more than a resistance value of the spaces 320. More specifically, the raised portion groups 316 each have a resistance value less than the resistance value of the spaces 320.

The resistance value of the raised portion groups 316 is reduced by the modified layer 323. That is, the resistance value of the raised portion groups 316 is made not more than the resistance value of the SiC monocrystal due to the modified layer 323 with which the properties of SiC are modified. The resistance value of the spaces 320 is also reduced by the modified layer 323.

The drain pad 113 is connected directly to the second main surface 104 of the SiC semiconductor layer 102, in this embodiment. The drain pad 113 covers the raised portion groups 316 on the second main surface 104 of the SiC semiconductor layer 102. The drain pad 113 covers the raised portion groups 316 altogether.

The drain pad 113 is formed in a film shape conforming to outer surfaces of the raised portion groups 316 (outer surfaces of the raised portions 315) and inner surfaces of the grooves 321. A plurality of raised portions **113*a* raised in a direction away from the second main surface 104 is thereby formed at portions of an outer surface of the drain pad 113 covering the raised portion groups 316 (raised portions 315). A plurality of recesses 113*b* recessed toward the second main surface 104 is also formed at portions of the outer surface of the drain pad 113 covering the grooves 321**.

The drain pad 113 forms an ohmic contact with the second main surface 104 of the SiC semiconductor layer 102. More specifically, the drain pad 113 forms an ohmic contact with the raised portion group 316.

Even more specifically, the drain pad 113 forms ohmic contacts with the plurality of raised portion groups 316. The drain pad 113 forms ohmic contacts with the spaces 320 as well, in this embodiment.

The drain pad 113 has a laminated structure that includes a plurality of electrode layers laminated on the second main surface 104 of the SiC semiconductor layer 102. The drain pad 113 has a four-layer structure that includes a Ti layer 324, an Ni layer 325, an Au layer 326, and an Ag layer 327 that are laminated in that order from the second main surface 104 of the SiC semiconductor layer 102, in this embodiment.

The Ti layer 324, the Ni layer 325, the Au layer 326, and the Ag layer 327 are respectively formed in film shapes conforming to the outer surfaces of the raised portion groups 316 (outer surfaces of the raised portions 315) and the inner surfaces of the grooves 321. The raised portions 113*a* and the recesses 113*b* of the drain pad 113 are formed at an outer surface of the Ag layer 327.

The Ti layer 324 is directly connected to the second main surface 104 of the SiC semiconductor layer 102. The Ti layer 324 covers the plurality of raised portion groups 316 altogether and forms an ohmic contact with the second main surface 104 of the SiC semiconductor layer 102. The Ti layer 324 also forms ohmic contacts with the spaces 320 as well, in this embodiment.

The Ni layer 325 covers substantially an entire area or the entire area of the Ti layer 324. The Au layer 326 covers substantially an entire area or the entire area of the Ni layer 325. The Ag layer 327 covers substantially an entire area or the entire area of the Au layer 326.

A thickness of the Ti layer 324 may be not less than 0.01 μm and not more than 5 μm (for example, approximately 0.07 μm). A thickness of the Ni layer 325 may be not less than 0.1 μm and not more than 40 μm (for example, approximately 1.2 μm).

A thickness of the Au layer 326 may be not less than 0.1 μm and not more than 40 μm (for example, approximately 0.07 μm). A thickness of the Ag layer 327 may be not less than 0.1 μm and not more than 40 μm (for example, approximately 0.3 μm). Obviously, the drain pad 113 may have a single layer structure including the Ti layer 324, the Ni layer 325, the Au layer 326, or the Ag layer 327.

The drain pad 113 forms the ohmic contact with the second main surface 104 of the SiC semiconductor layer 102 without interposition of a silicide layer that includes a silicide as a main constituent. The drain pad 113 forms the ohmic contact with each raised portion group 316 without interposition of a silicide layer that includes a silicide as a main constituent.

The drain pad 113 forms the ohmic contact with the second main surface 104 of the SiC semiconductor layer 102 without interposition of a carbon layer that includes carbon as a main constituent. The drain pad 113 forms the ohmic contact with each raised portion group 316 without interposition of a carbon layer that includes carbon as a main constituent.

The drain pad 113 is free from a region in which a material including a silicide as a main constituent is formed as a layer. The drain pad 113 is also free from a region in which a material including carbon as a main constituent is formed as a layer.

Figure 41A:
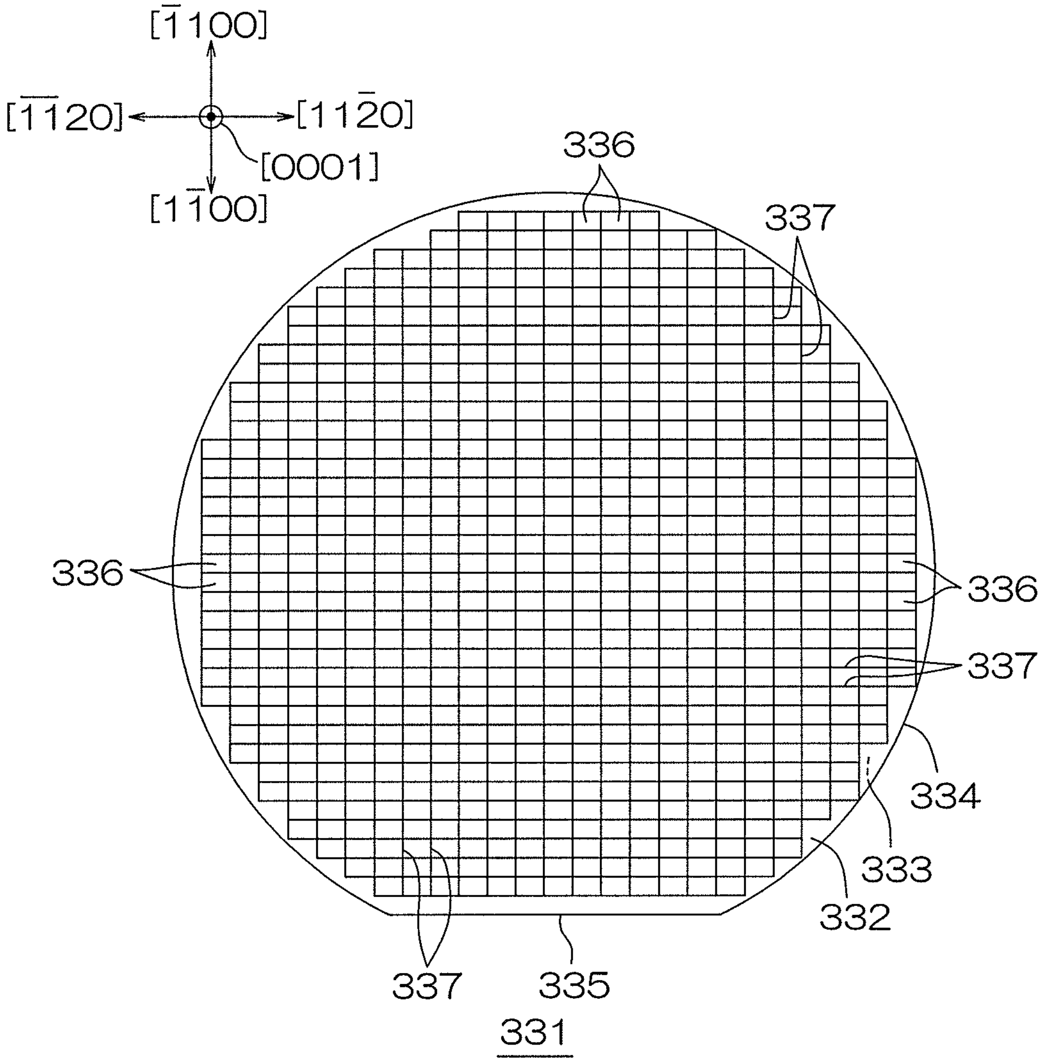
FIG. 41A is a top view of a semiconductor wafer used in manufacture of the semiconductor device shown in FIG. 34.
Figure 41B:
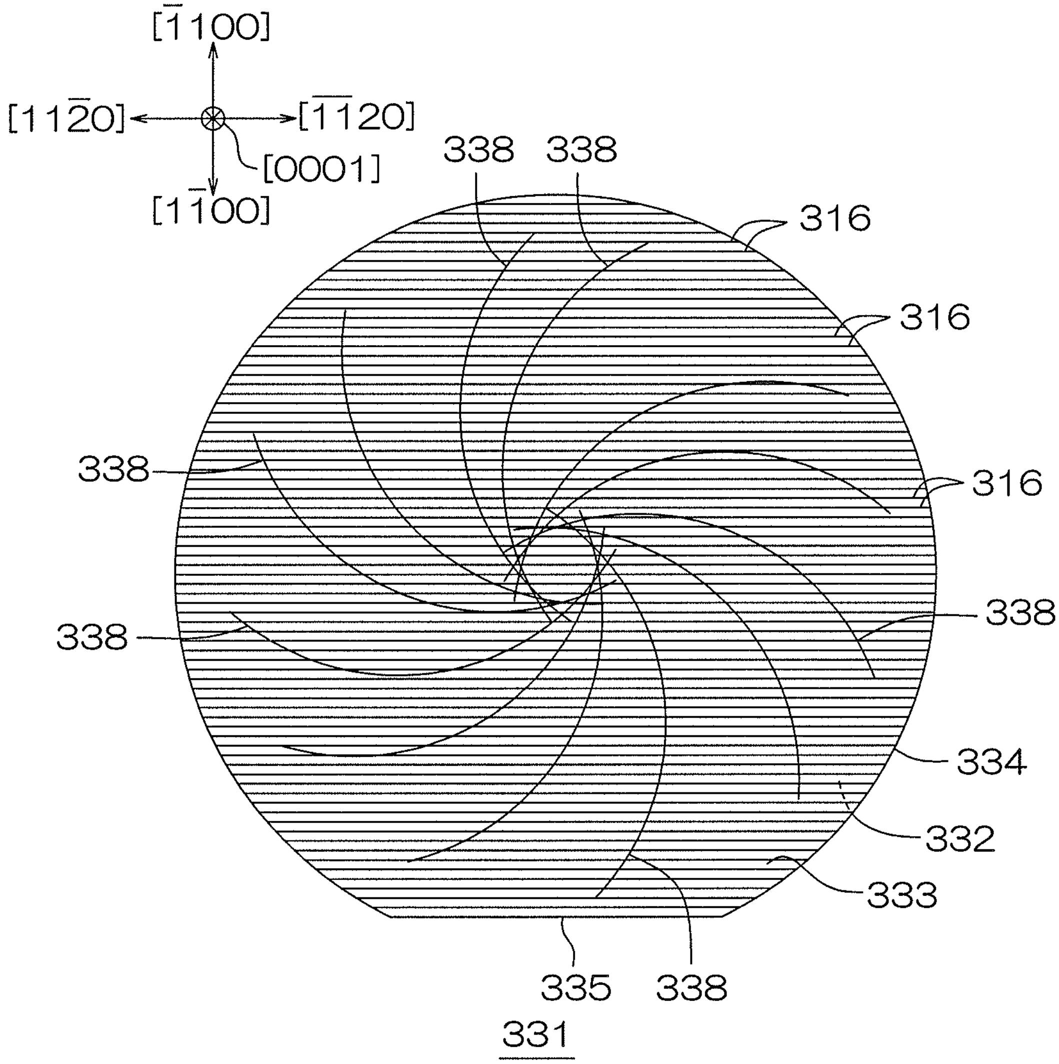
FIG. 41B is a bottom view of the semiconductor wafer shown in FIG. 41A and is a diagram of a state after a grinding step and an annealing treatment.

FIG. 41A is a top view of the SiC semiconductor wafer 331 used in manufacture of the semiconductor device 311 shown in FIG. 34. FIG. 41B is a bottom view of the SiC semiconductor wafer 331 shown in FIG. 41A and is a diagram of a state after a grinding step and an annealing treatment have been performed on the second wafer main surface 333 of the SiC semiconductor wafer 331.

Referring to FIG. 41A and FIG. 41B, the SiC semiconductor wafer 331 is formed in a plate-shaped SiC monocrystal formed in a disk shape. The SiC semiconductor wafer 331 is to be a base of the SiC semiconductor substrate 111.

The SiC semiconductor wafer 331 has a first wafer main surface 332 at one side, the second wafer main surface 333 at another side, and a wafer side surface 334 connecting the first wafer main surface 332 and the second wafer main surface 333.

The SiC semiconductor wafer 331 may include a 4H—SiC monocrystal. The first wafer main surface 332 of the SiC semiconductor wafer 331 has an off angle inclined at an angle of within 10° in the [11-20] direction from a (0001) plane.

The off angle may be not less than 0° and not more than 4°. The off angle may exceed 0° and be less than 4°. The off angle is typically 2° or 4° and more specifically is set in a range of 2°±0.2° or a range of 4°±0.4°.

One or a plurality (one in this embodiment) of an orientation flat 335 indicating a crystal orientation is formed on the wafer side surface 334 of the SiC semiconductor wafer 331. The orientation flat 335 is a notched portion formed at a peripheral edge of the SiC semiconductor wafer 331. The orientation flat 335 extends rectilinearly along the [11-20] direction, in this embodiment.

The first wafer main surface 332 is a device forming surface in which MISFET is formed. A plurality of device forming regions 336 each corresponding to a semiconductor device 311 are set in the first wafer main surface 332.

The plurality of device forming regions 336 are arrayed in a matrix along the [11-20] direction ([−1-120] direction) and the [−1100] direction ([1-100] direction), in this embodiment.

A lattice region defining the plurality of device forming regions 336 is a dicing line 337. The semiconductor devices 311 are cut out by cutting the SiC semiconductor wafer 331 along peripheral edges (dicing line 337) of the plurality of device forming regions 336.

Referring to FIG. 41B, the plurality of raised portion groups 316 and the plurality of grinding marks 338 are formed in the second wafer main surface 333 of the SiC semiconductor wafer 331, in the state after the grinding step and the annealing treatment have been performed on the second wafer main surface 333 of the SiC semiconductor wafer 331.

The plurality of raised portion groups 316 is formed in a stripe shape substantially parallel or parallel to the orientation flat 335. The plurality of raised portion groups 316 may be formed in a stripe shape intersecting or orthogonal to the orientation flat 335.

The grinding marks 338 extend in an arc shape from a central portion to a peripheral edge portion of the SiC semiconductor wafer 331. The grinding marks 338 generally include a grinding mark 338 that intersects the [11-20] direction and the [1-100] direction.

The grinding marks 338 also include a grinding mark 338 that extends substantially parallel or parallel to the [11-20] direction or the [1-100] direction at a portion at which a tangent to the arc extends along the [11-20] direction or the [1-100] direction. The grooves 321 formed in the second main surface 104 of the SiC semiconductor layer 102 may be formed by portions of the grinding marks 338.

Figure 42:
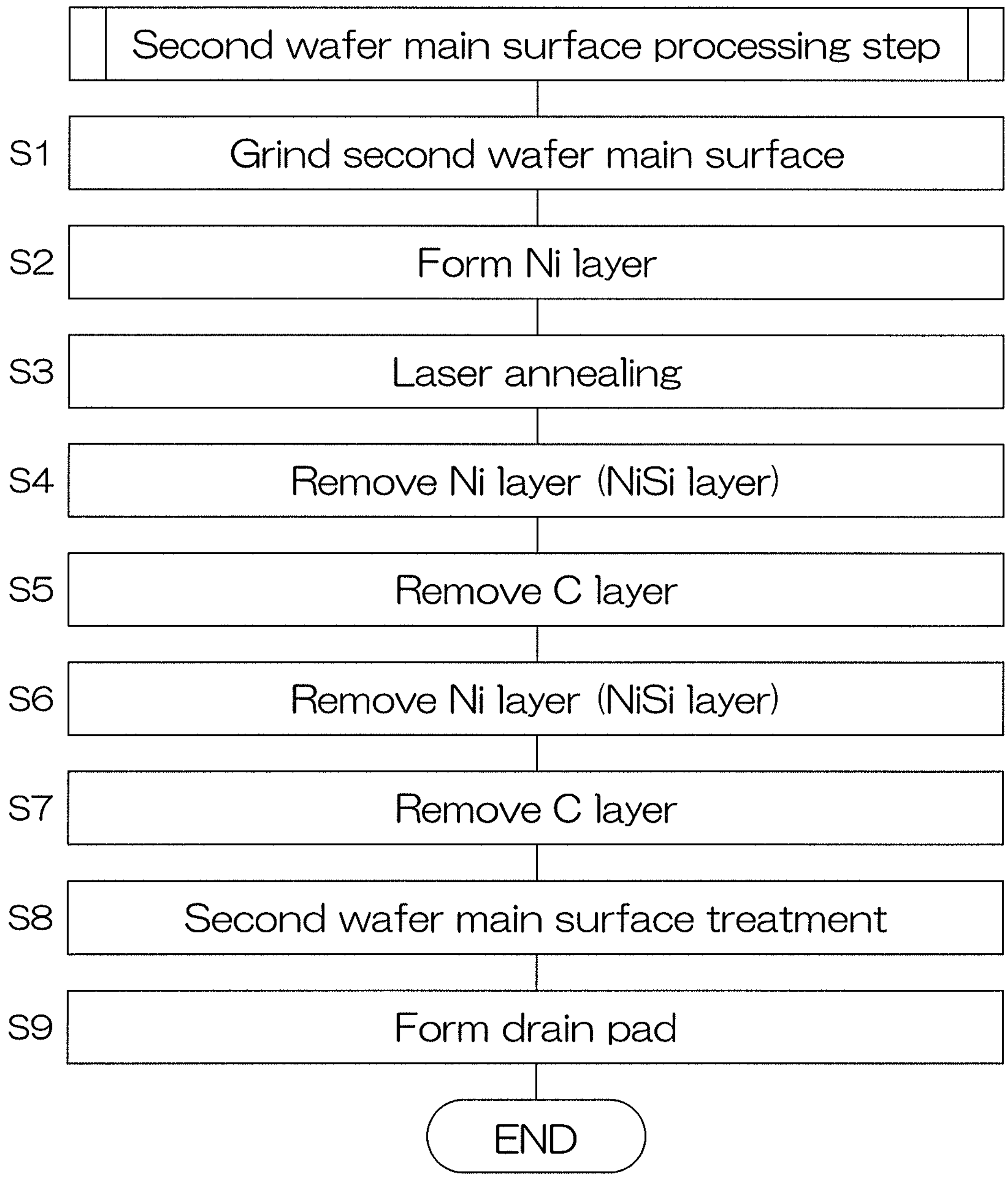
FIG. 42 is a flowchart for describing an example of the semiconductor device shown in FIG. 34.

FIG. 42 is a flowchart for describing an example of a method for manufacturing the semiconductor device 311 shown in FIG. 34. FIG. 43A to FIG. 43I are sectional views for describing the method for manufacturing the semiconductor device 311 shown in FIG. 34.

With the method for manufacturing the semiconductor device 311, a step of processing the second wafer main surface 333 is performed in advance of the step of forming the drain pad 113 (see FIG. 17L) according to the method for manufacturing the semiconductor device 101. The step of processing the second wafer main surface 333 may be performed after the step of forming the gate pad 108, the gate finger 109, and the source pad 110.

Figure 43A:
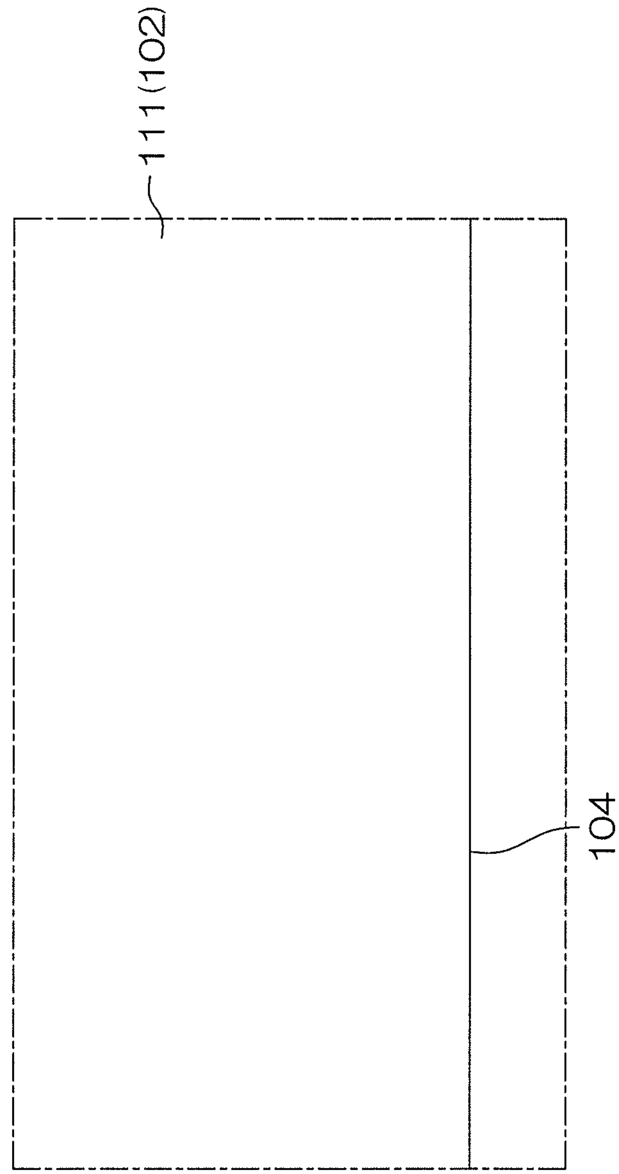
FIG. 43A is a sectional view for describing the manufacturing method shown in FIG. 42.

Referring to FIG. 43A, first, the steps of FIG. 17A to FIG. 17L are performed, and prepare the SiC semiconductor wafer 331 in which MISFET is built in the first wafer main surface 332 is prepared. The second wafer main surface 333 of the SiC semiconductor wafer 331 is in an unprocessed state.

Figure 43B:
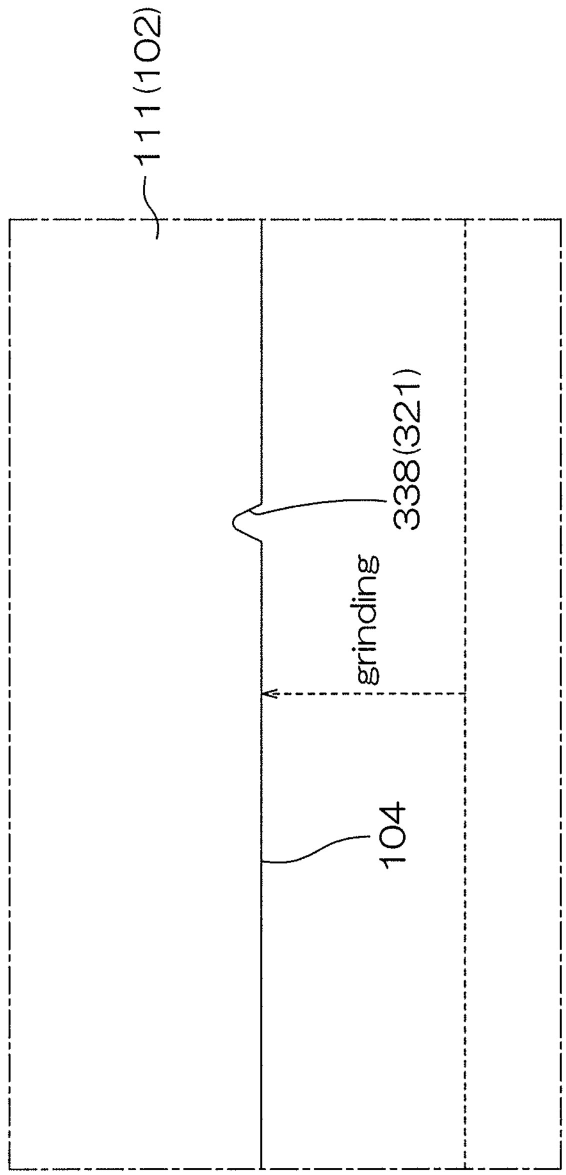
FIG. 43B is a sectional view for describing a step subsequent to that of FIG. 43A.

Next, referring to FIG. 43B, the second wafer main surface 333 of the SiC semiconductor wafer 331 is ground (step S1 of FIG. 42). In the present step, the second wafer main surface 333 of the SiC semiconductor wafer 331 is ground using abrasive grains of not less than 500 grit.

The abrasive grains are preferably of not less than 1000 grit and not more than 5000 grit. The plurality of grinding marks 338 are thereby formed on the second wafer main surface 333 of the SiC semiconductor wafer 331 (see also FIG. 41B). Also, the second wafer main surface 333 of the SiC semiconductor wafer 331 is thereby flattened and the SiC semiconductor wafer 331 is thinned at the same time.

Figure 43C:
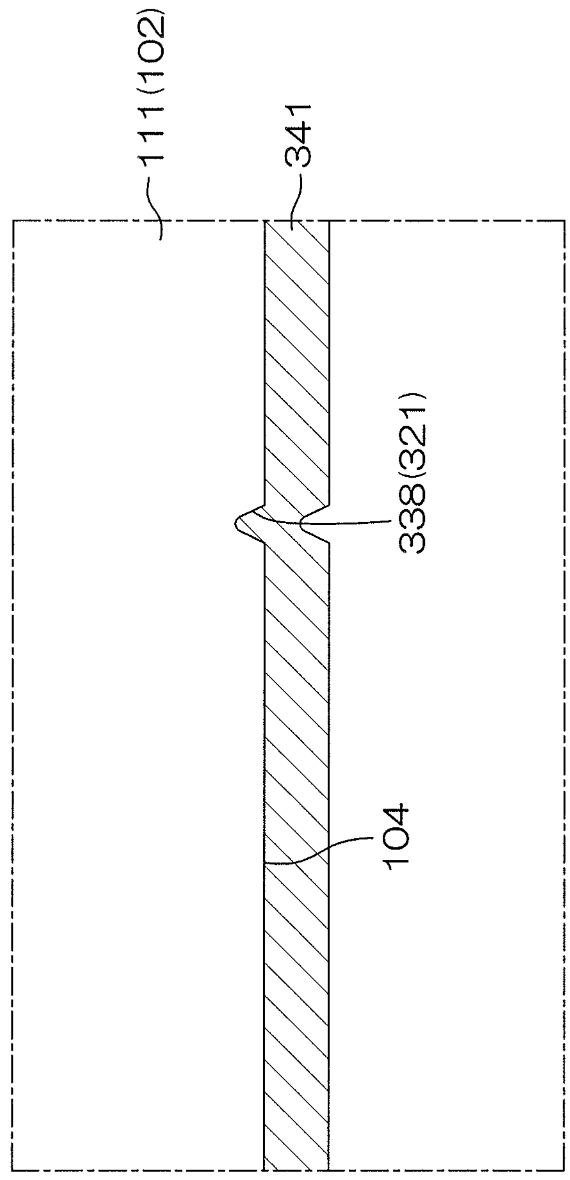
FIG. 43C is a sectional view for describing a step subsequent to that of FIG. 43B.

Next, referring to FIG. 43C, a metal layer 341 is formed on the second wafer main surface 333 of the SiC semiconductor wafer 331 (step S2 of FIG. 42). The metal layer 341 is made of an Ni layer, in this embodiment. The Ni layer may be formed by a sputtering method. A thickness of the Ni layer may be not less than 100 Å and not more than 1000 Å.

Figure 43D:
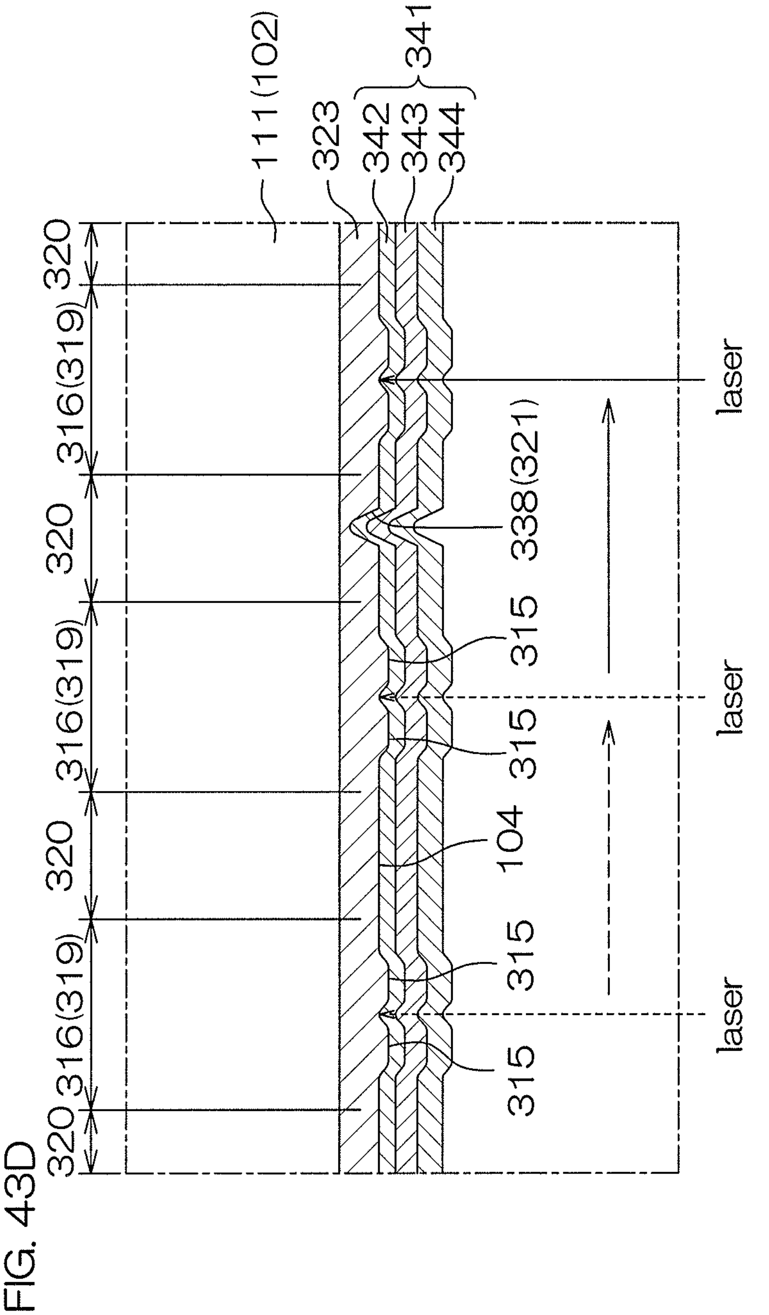
FIG. 43D is a sectional view for describing a step subsequent to that of FIG. 43C.

Next, referring to FIG. 43D, the annealing treatment method is performed on the second wafer main surface 333 of the SiC semiconductor wafer 331 (step S3 of FIG. 42). In this step, a laser annealing treatment method is implemented as an example of the annealing treatment method.

With the laser annealing treatment method, pulsed laser light having a laser diameter φ of not less than 50 μm 200 μm (for example, approximately 100 μm) is used. The pulsed laser light is a UV laser light having a wavelength in an ultraviolet region. Energy of the pulsed laser light may be not less than 1.0 $J/cm^2$ and not more than 4.0 $J/cm^2$ (for example, approximately 3.0 $J/cm^2$).

The pulsed laser light is shot onto the second wafer main surface 333 of the SiC semiconductor wafer 331 via the metal layer 341. The pulsed laser light is shot onto the second wafer main surface 333 of the SiC semiconductor wafer 331 while an irradiation position is moved along the orientation flat 335, in this embodiment.

One or a plurality of the raised portions 315 is or are formed on the second wafer main surface 333 of the SiC semiconductor wafer 331, in a region of the second wafer main surface 333 of the SiC semiconductor wafer 331 onto which the pulsed laser light is shot.

The modified layer 323 in which the SiC of the SiC semiconductor wafer 331 is modified to have different properties is also formed in the region of the second wafer main surface 333 of the SiC semiconductor wafer 331 onto which the pulsed laser light is shot. More specifically, the SiC of the SiC semiconductor wafer 331 is modified to Si by C atoms being desorbed and/or sublimated from the SiC by heating.

The modified layer 323 including the Si modified layer is thereby formed. The modified layer 323 may include the silicon amorphous layer. The modified layer 323 may include C atoms. The one or plurality of the raised portions 315 formed on the second wafer main surface 333 may be formed of the modified layer 323.

The pulsed laser light is shot successively in a direction along the orientation flat 335 and a plurality of the raised portions 315 are formed along the orientation flat 335. One raised portion group 316 that includes the raised portions 315 and extends along the [11-20] direction is thereby formed on the second wafer main surface 333 of the SiC semiconductor wafer 331.

The irradiation position of the pulsed laser light is moved in the [1-100] direction after one raised portion group 316 is formed. The pulsed laser light is then shot onto the second wafer main surface 333 of the SiC semiconductor wafer 331 while the irradiation position is moved along the orientation flat 335 again.

Another raised portion group 316 extending substantially parallel or parallel to the one raised portion group 316 is thereby formed on the second wafer main surface 333 of the SiC semiconductor wafer 331.

In the laser annealing treatment method, such steps are repeated until a plurality of raised portion groups 316 are formed across substantially an entire area or an entire area of the second wafer main surface 333 of the SiC semiconductor wafer 331 (see also FIG. 41B).

The metal layer 341 through the laser annealing treatment method has a laminated structure that includes a carbon layer 342, an NiSi (nickel silicide) layer 343, and a Ni layer 344 laminated in that order from the second wafer main surface 333 side of the SiC semiconductor wafer 331, in this embodiment.

That is, the laser annealing treatment method includes a step of siliciding the metal layer 341 by making it react with the SiC semiconductor wafer 331. More specifically, the laser annealing treatment method includes a step of forming the NiSi layer 343.

In the laser annealing treatment method, the carbon layer 342 including C atoms is formed as a byproduct inside the metal layer 341, in addition to the NiSi layer 343. The carbon layer 342 is formed by segregation of the C atoms that constituted the SiC.

The carbon layer 342 and the NiSi layer 343 may become peeling starting points in the metal layer 341. That is, although the metal layer 341 may be used as it is as the drain pad 113, the metal layer 341 has problems of connection failure and increased resistance value due to connection failure. It is therefore preferable to form a metal layer differing from the metal layer 341 as the drain pad 113.

A temperature applied to the metal layer 341 in accompaniment with the forming of the NiSi layer 343 is not less than melting points of the gate pad 108, the gate finger 109, and the source pad 110 (for example, not less than 1000°).

With the laser annealing treatment method, the temperature of the second wafer main surface 333 of the SiC semiconductor wafer 331 can be increased locally and therefore the gate pad 108, the gate finger 109, and the source pad 110 would not have to be heated. Melting of the gate pad 108, the gate finger 109, and the source pad 110 can thus be suppressed appropriately.

Figure 43E:
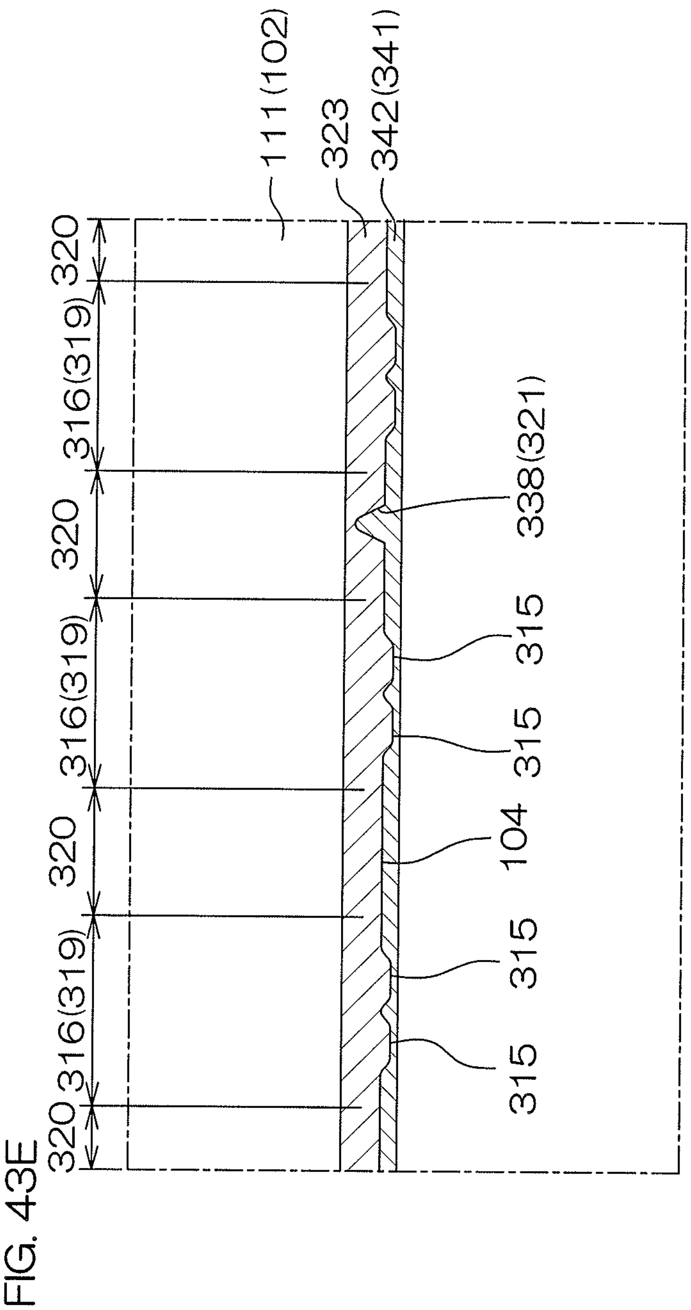
FIG. 43E is a sectional view for describing a step subsequent to that of FIG. 43D.

Next, referring to FIG. 43E, a step of removing the metal layer 341 is performed. The step of removing the metal layer 341 is performed until the second wafer main surface 333 of the SiC semiconductor wafer 331 is exposed.

In this step, first, the NiSi layer 343 and the Ni layer 344 inside the metal layer 341 are removed (step S4 of FIG. 42). The NiSi layer 343 and the Ni layer 344 may be removed by a wet etching method.

Figure 43F:
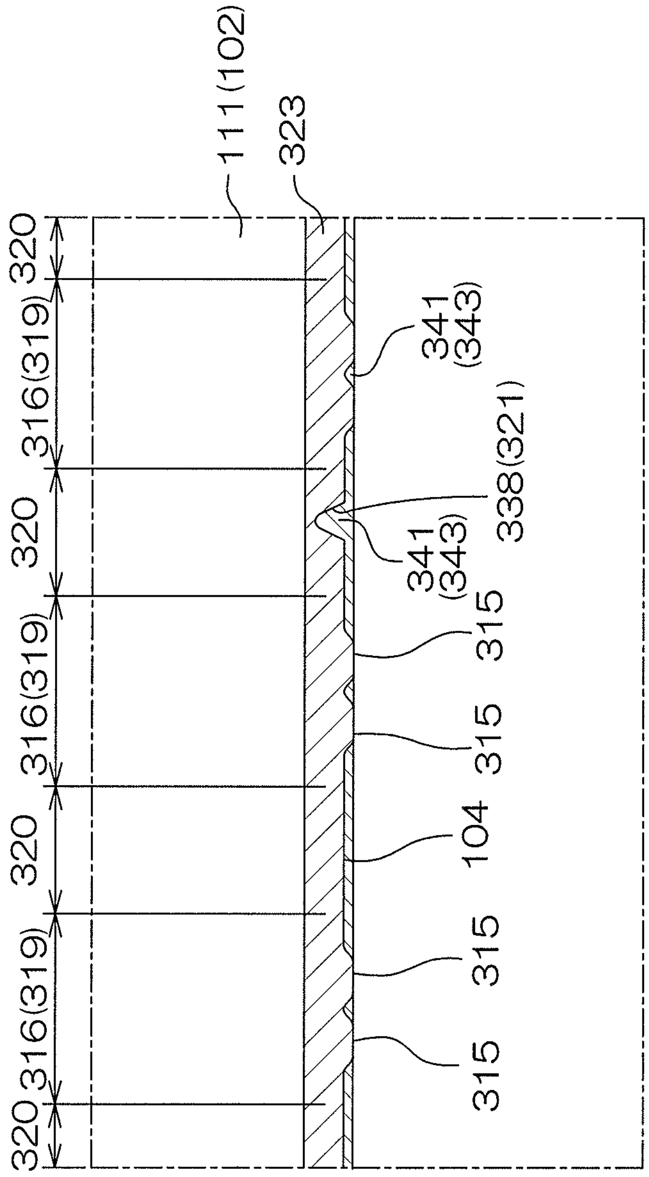
FIG. 43F is a sectional view for describing a step subsequent to that of FIG. 43E.

Next, referring to FIG. 43F, the carbon layer 342 inside the metal layer 341 is removed (step S5 of FIG. 42). The carbon layer 342 may be removed by a dry etching method.

Figure 43G:
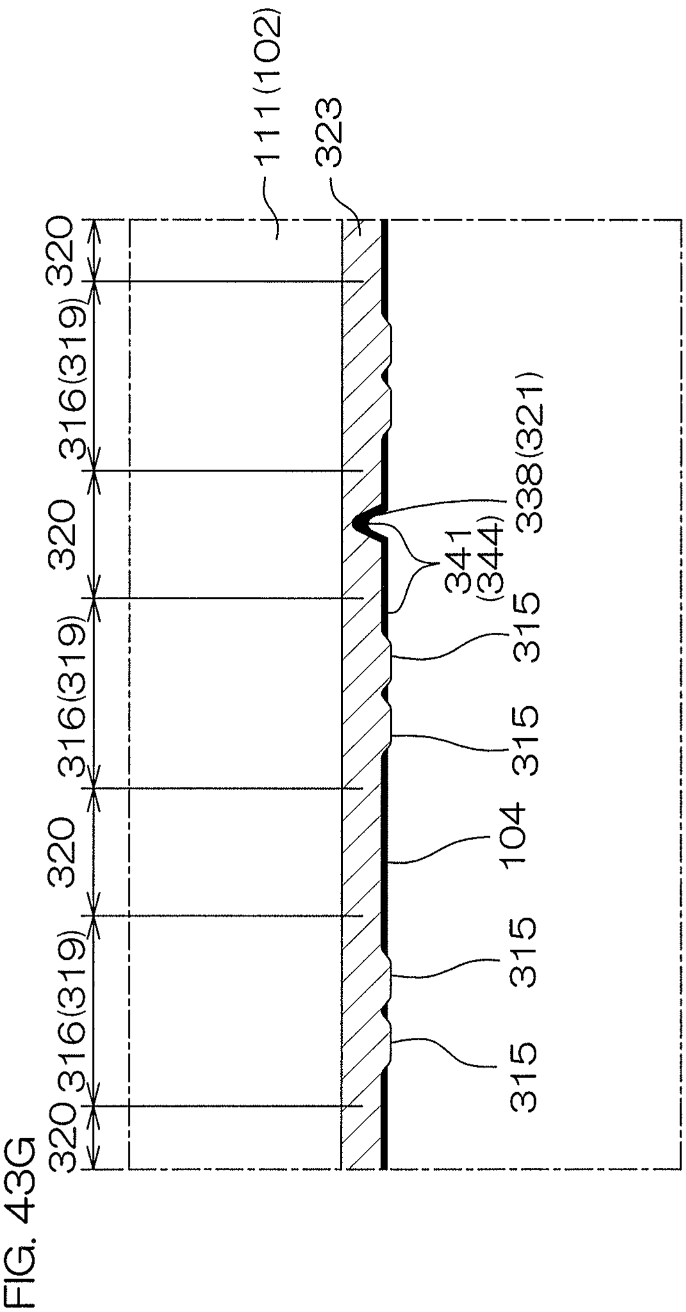
FIG. 43G is a sectional view for describing a step subsequent to that of FIG. 43F.

Next, referring to FIG. 43G, residues of the NiSi layer 343 and residues of the Ni layer 344 attached to the second wafer main surface 333 of the SiC semiconductor wafer 331 are removed (step S6 of FIG. 42). The NiSi layer 343 and the Ni layer 344 may be removed by a wet etching method.

Figure 43H:
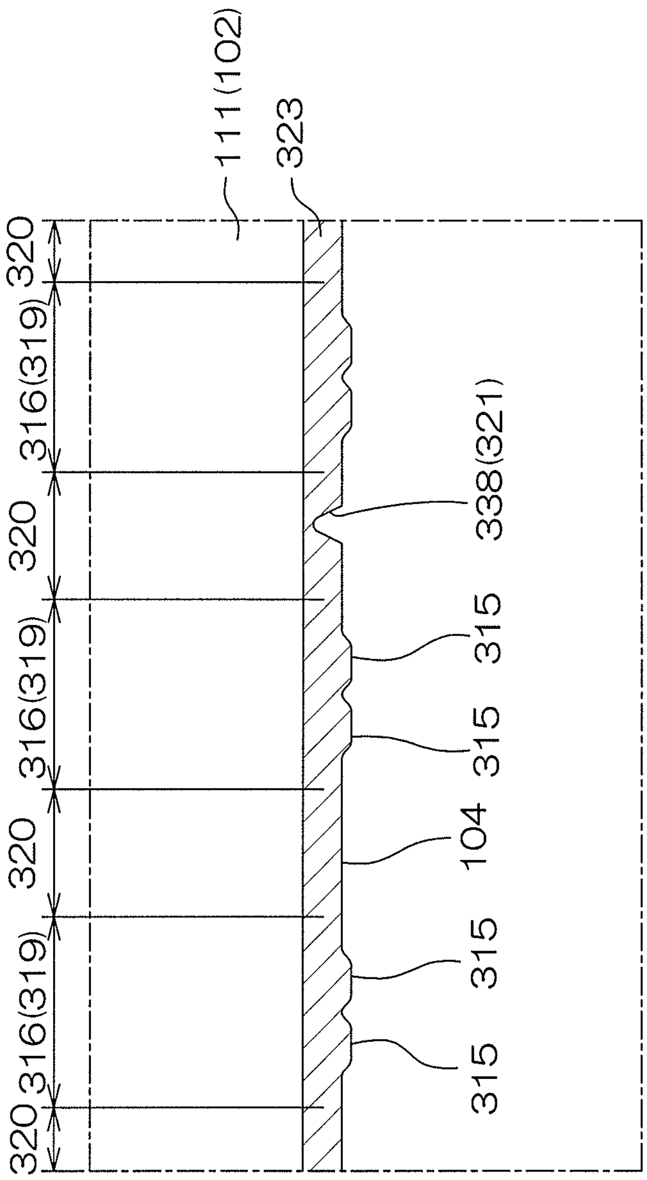
FIG. 43H is a sectional view for describing a step subsequent to that of FIG. 43G.
Figure 43:
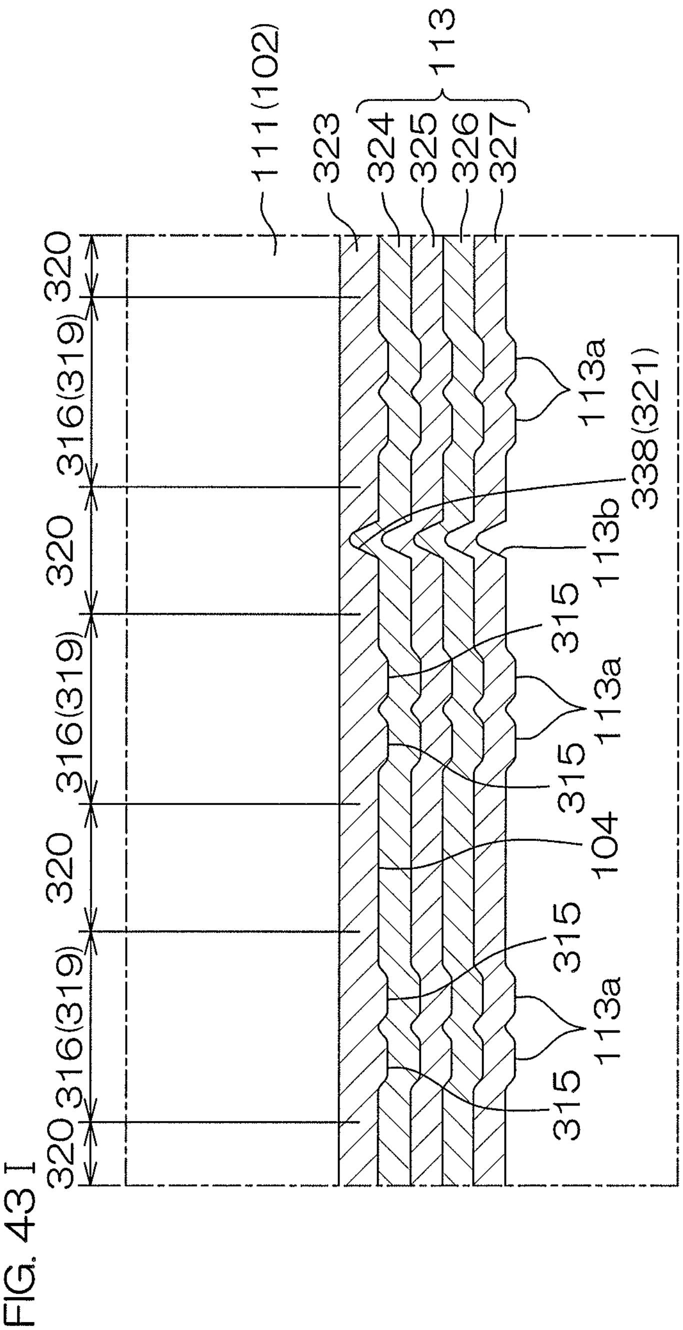
FIG. 43I is a sectional view for describing a step subsequent to that of FIG. 43H.

Next, referring to FIG. 43H, residues of the carbon layer 342 attached to the second wafer main surface 333 of the SiC semiconductor wafer 331 are removed (step S7 of FIG. 42). The carbon layer 342 may be removed by a dry etching method.

Next, a natural oxide film is removed from the second wafer main surface 333 of the SiC semiconductor wafer 331 (step S8 of FIG. 42). The natural oxide film may be removed by a wet etching method.

Thus, a step of removing a layer that contains Ni (the NiSi layer 343 and the Ni layer 344) and a step of removing a layer that contains carbon (the carbon layer 342) are repeated twice, in this embodiment.

The metal layer 341 can thereby be removed appropriately. Also, the second wafer main surface 333 of the SiC semiconductor wafer 331 with which reduction of resistance value has been achieved by the laser annealing treatment is exposed appropriately after the step of removing the metal layer 341.

Next, referring to FIG. 43I, the drain pad 113 is formed on the second wafer main surface 333 of the SiC semiconductor wafer 331 (step S9 of FIG. 42).

The present step includes a step of forming the Ti layer 324, the Ni layer 325, the Au layer 326, and the Ag layer 327 in that order from on the second wafer main surface 333 of the SiC semiconductor wafer 331. The Ti layer 324, the Ni layer 325, the Au layer 326, and the Ag layer 327 may all be formed by a sputtering method.

The Ti layer 324 of the drain pad 113 is directly connected to the second wafer main surface 333 of the SiC semiconductor wafer 331. The Ti layer 324 covers the plurality of raised portion groups 316 altogether and forms the ohmic contacts with the plurality of raised portion groups 316 and with the plurality of spaces 320.

Next, the SiC semiconductor wafer 331 is cut along the peripheral edges (dicing line 337) of the plurality of device forming regions 336. The plurality of semiconductor devices 311 are thereby cut out from the SiC semiconductor wafer 331. The semiconductor devices 311 are manufactured through steps including the above.

With the semiconductor device 311 described above, the same effects as the effects described for the semiconductor device 101 can be exhibited. Also, with the semiconductor device 311, a connection area of the drain pad 113 with respect to the second main surface 104 of the SiC semiconductor layer 102 can be increased by the raised portion groups 316. Electrical characteristics can thereby be improved.

More specifically, the drain pad 113 forms the ohmic contacts with the raised portion groups 316. Satisfactory ohmic characteristics can thereby be obtained between the SiC semiconductor layer 102 and the drain pad 113 and the electrical characteristics can thus be improved.

Also, with the semiconductor device 311, the drain pad 113 is directly connected to the second main surface 104 of the SiC semiconductor layer 102. More specifically, the drain pad 113 forms the ohmic contacts with the raised portion groups 316 without interposition of a carbon layer. The drain pad 113 also forms the ohmic contacts with the raised portion groups 316 without interposition of a silicide layer.

A carbon layer or a silicide layer tends to become a peeling starting point. Therefore, connection failure and increased resistance value due to connection failure can be suppressed appropriately by the structure where the drain pad 113 is directly connected to the second main surface 104 of the SiC semiconductor layer 102.

Figure 44:
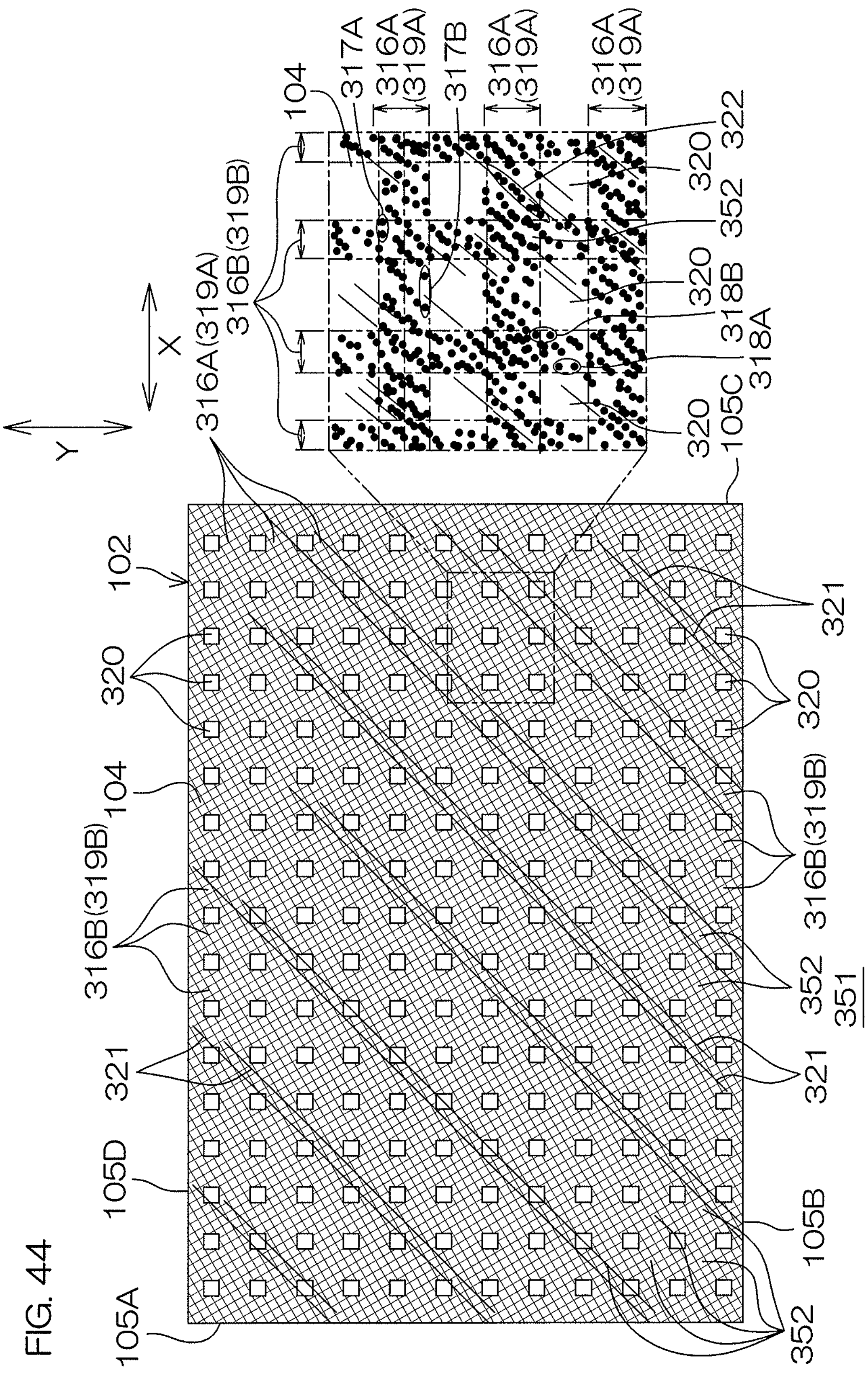
FIG. 44 is a bottom view corresponding to FIG. 35 and is a bottom view of a semiconductor device according to a twenty-third preferred embodiment of the present invention.

FIG. 44 is a bottom view corresponding to FIG. and is a bottom view of a semiconductor device 351 according to a twenty-third preferred embodiment of the present invention. In the following, structures corresponding to structures described with the semiconductor device 311 shall be provided with the same reference symbols and description thereof shall be omitted.

Referring to FIG. 44, the semiconductor device 351 has a plurality of raised portion groups 316 including first raised portion groups 316A and second raised portion groups 316B.

The first raised portion group 316A includes a plurality of first raised portions 315A formed on the second main surface 104 of the SiC semiconductor layer 102. The first raised portions 315A are portions of the second main surface 104 of the SiC semiconductor layer 102 that are raised along the direction normal to the second main surface 104 of the SiC semiconductor layer 102.

The first raised portions 315A are formed at intervals from each other along the first direction X and the second direction Y intersecting the first direction X. The first raised portions 315A have a first portion 317A in which some first raised portions 315A among the first raised portions 315A overlap in the first direction X in the first direction view viewed from the first direction X.

The first raised portions 315A also have a second portion 318A in which some first raised portions 315A among the first raised portions 315A are formed separated from the first portion 317A and overlap in the first direction X in the first direction view.

The first raised portions 315A are formed successively along the first direction X. More specifically, the first raised portions 315A have a dotted pattern interspersed at intervals along the first direction X and the second direction Y.

The first raised portions 315A are formed successively along the first direction X while maintaining the dotted pattern. The dotted pattern of the first raised portions 315A is formed across from the peripheral edge at the side surface 105A side at one side to the peripheral edge at the side surface 105C side at the other side of the SiC semiconductor layer 102 in plan view, in this embodiment.

The first raised portion group 316A has a layout in which the raised portions 315 overlap in the first direction X when viewed from the first direction X. The first raised portion group 316A thereby forms a first raised portion group region 319A extending as a band shape along the first direction X by a collective pattern of the raised portions 315 dotted successively along the first direction X.

In other words, the first raised portion group region 319A includes the first raised portions 315A (the first raised portion group 316A) formed in a band-shaped region of the second main surface 104 of the SiC semiconductor layer 102 extending along the first direction X.

The second raised portion group 316B includes second raised portions 315B formed on the second main surface 104 of the SiC semiconductor layer 102. The second raised portions 315B are portions of the second main surface 104 of the SiC semiconductor layer 102 that are raised along the direction normal to the second main surface 104 of the SiC semiconductor layer 102.

The second raised portions 315B are formed at intervals from each other along the first direction X and the second direction Y intersecting the first direction X. The second raised portion group 316B has a first portion 317B in which some second raised portions 315B among the second raised portions 315B overlap in the second direction Y in the second direction view viewed from the second direction Y.

The second raised portion group 316B also has a second portion 318B in which some second raised portions 315B among the second raised portions 315B are formed separated from the first portion 317B and overlap in the second direction Y in the second direction view.

The second raised portions 315B are formed successively along the second direction Y while maintaining the dotted pattern. More specifically, the second raised portions 315B have a dotted pattern interspersed at intervals along the first direction X and the second direction Y.

The second raised portions 315B are formed successively along the second direction Y while maintaining the dotted pattern. The dotted pattern of the second raised portions 315B is formed across from a peripheral edge at the side surface 105B side at one side to a peripheral edge at the side surface 105D side at the other side of the SiC semiconductor layer 102 in plan view, in this embodiment.

The second raised portion group 316B has a layout in which the second raised portions 315B overlap in the second direction Y when viewed from the second direction Y. The second raised portion group 316B thereby forms a second raised portion group region 319B extending as a band shape along the second direction Y by a collective pattern of the second raised portions 315B dotted successively along the second direction Y.

In other words, the second raised portion group region 319B includes the second raised portions 315B (the second raised portion group 316B) formed in a band-shaped region of the second main surface 104 of the SiC semiconductor layer 102 extending along the second direction Y.

The second raised portion groups 316B (second raised portion group regions 319B) cross the first raised portion groups 316A (first raised portion group regions 319A). Intersection regions 352 in each of which a first raised portion group 316A (first raised portion group region 319A) and a second raised portion group 316B (second raised portion group region 319B) intersect mutually are thereby formed on the second main surface 104 of the SiC semiconductor layer 102.

The first raised portion groups 316A are formed on the second main surface 104 of the SiC semiconductor layer 102 at intervals along the second direction Y, in this embodiment. That is, the dotted pattern of the first raised portions 315A is formed intermittently in regard to the second direction Y.

The second raised portion groups 316B are also formed on the second main surface 104 of the SiC semiconductor layer 102 at intervals along the first direction X, in this embodiment. That is, the dotted pattern of the second raised portions 315B is formed intermittently in regard to the first direction X.

The intersection regions 352 are therefore formed in a matrix array at intervals from each other in the first direction X and the second direction Y, in this embodiment. Spaces 320 are also defined by the first raised portion groups 316A and the second raised portion groups 316B. The spaces 320 are formed in a matrix array at intervals from each other in the first direction X and the second direction Y.

The first raised portions 315A and the second raised portions 315B may be mutually overlapped in each intersection region 352. Thicknesses of the first raised portions 315A and the second raised portions 315B formed in each intersection region 352 may be greater than thicknesses of the first raised portions 315A and the second raised portions 315B formed in each region outside the intersection region 352.

Numbers of the first raised portions 315A and the second raised portions 315B formed in each intersection region 352 may be greater than numbers of first raised portions 315A and second raised portions 315B formed in the region outside the intersection region 352.

The first direction X may be set to the [11-20] direction and the second direction Y may be set to the [1-100] direction. That is, the first raised portion groups 316A (first raised portion group regions 319A) may be formed substantially parallel or parallel to the [11-20] direction, and the second raised portion groups 316B (second raised portion group regions 319B) may be formed substantially parallel or parallel to the [1-100] direction.

The first direction X may be set to the [1-100] direction and the second direction Y may be set to the [11-20] direction. That is, the first raised portion groups 316A (first raised portion group regions 319A) may be formed substantially parallel or parallel to the [1-100] direction, and the second raised portion groups 316B (second raised portion group regions 319B) may be formed substantially parallel or parallel to the [11-20] direction.

The first raised portions 315A and the first raised portion groups 316A correspond to the raised portions 315 and the raised portion groups 316 according to the twenty-second preferred embodiment. It shall be deemed that the descriptions of the raised portions 315 and the raised portion groups 316 according to the twenty-second preferred embodiment apply to descriptions of the first raised portions 315A and the first raised portion groups 316A and other specific descriptions concerning the first raised portions 315A and the first raised portion groups 316A shall be omitted.

The second raised portions 315B and the second raised portion groups 316B correspond to the raised portions 315 and the raised portion groups 316 according to the twenty-second preferred embodiment. It shall be deemed that the descriptions of the raised portions 315 and the raised portion groups 316 according to the twenty-second preferred embodiment apply to descriptions of the second raised portions 315B and the second raised portion groups 316B and other specific descriptions concerning the second raised portions 315B and the second raised portion groups 316B shall be omitted.

The drain pad 113 covers the first raised portion groups 316A and the second raised portion groups 316B on the second main surface 104 of the SiC semiconductor layer 102, in this embodiment. The drain pad 113 covers the first raised portion groups 316A and the second raised portion groups 316B altogether, in this embodiment.

The drain pad 113 is formed in a film shape conforming to outer surfaces of the first raised portion groups 316A (outer surfaces of the first raised portions 315A), outer surfaces of the second raised portion groups 316B (outer surfaces of the second raised portions 315B), and the inner surfaces of the grooves 321.

Although not illustrated, raised portions 113*a* are thereby formed at portions of the outer surface of the drain pad 113 covering the first raised portion groups 316A (first raised portions 315A) and the second raised portion groups 316B (second raised portions 315B). The recesses 113*b* are also formed at the portions of the outer surface of the drain pad 113 covering the grooves 321.

The drain pad 113 forms an ohmic contact with the second main surface 104 of the SiC semiconductor layer 102. More specifically, the drain pad 113 forms an ohmic contact with the first raised portion group 316A and the second raised portion group 316B.

Even more specifically, the drain pad 113 forms ohmic contacts with the first raised portion groups 316A and with the second raised portion groups 316B. The drain pad 113 also forms ohmic contacts with the spaces 320 as well, in this embodiment.

The portions of the drain pad 113 covering the first raised portion groups 316A and the second raised portion groups 316B are engaged with uneven portions defined by the first raised portion groups 316A, the second raised portion groups 316B, and the grooves 321.

That is, a contact region of the drain pad 113 with respect to the second main surface 104 of the SiC semiconductor layer 102 is increased by the first raised portion groups 316A, the second raised portion groups 316B, and the grooves 321. An adhesion force of the drain pad 113 with respect to the second main surface 104 of the SiC semiconductor layer 102 is thereby increased.

The semiconductor devices 351 of such structure are manufactured by performing the following steps in the laser annealing step (step S3 of FIG. 42) described above.

First, the first raised portion groups 316A are formed along a direction substantially parallel or parallel to the orientation flat 335 by the laser annealing treatment method. Next, the second raised portion groups 316B are formed along a direction intersecting (orthogonal to) the orientation flat 335 by the laser annealing treatment method.

In the present step, the first raised portion groups 316A may be formed in a direction intersecting (orthogonal to) the orientation flat 335, and the second raised portion groups 316B may be formed substantially parallel or parallel along the orientation flat 335. Thereafter, the semiconductor devices 351 are manufactured through the step S4 to step S9 of FIG. 42.

The first raised portion groups 316A and the second raised portion groups 316B may be formed in any order. Therefore, the first raised portion groups 316A may be formed after the second raised portion groups 316B are formed. Also, the first raised portion groups 316A and the second raised portion groups 316B may be formed alternately.

Even with the semiconductor device 351 described above, the same effects as the effects described for the semiconductor device 311 can be exhibited.

Figure 45:
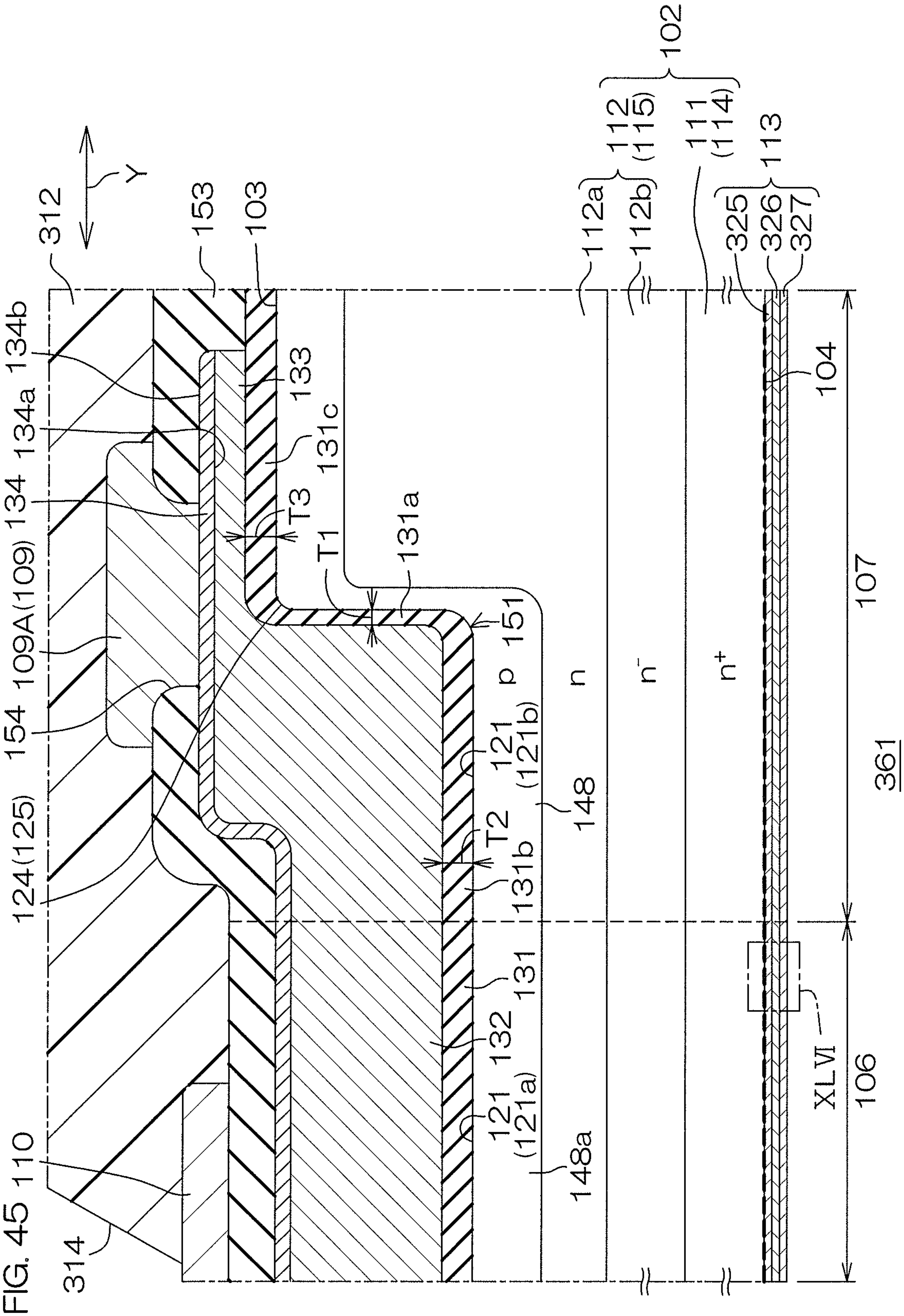
FIG. 45 is a sectional view corresponding to FIG. and is a sectional view of a semiconductor device according to a twenty-fourth preferred embodiment of the present invention.
Figure 46:
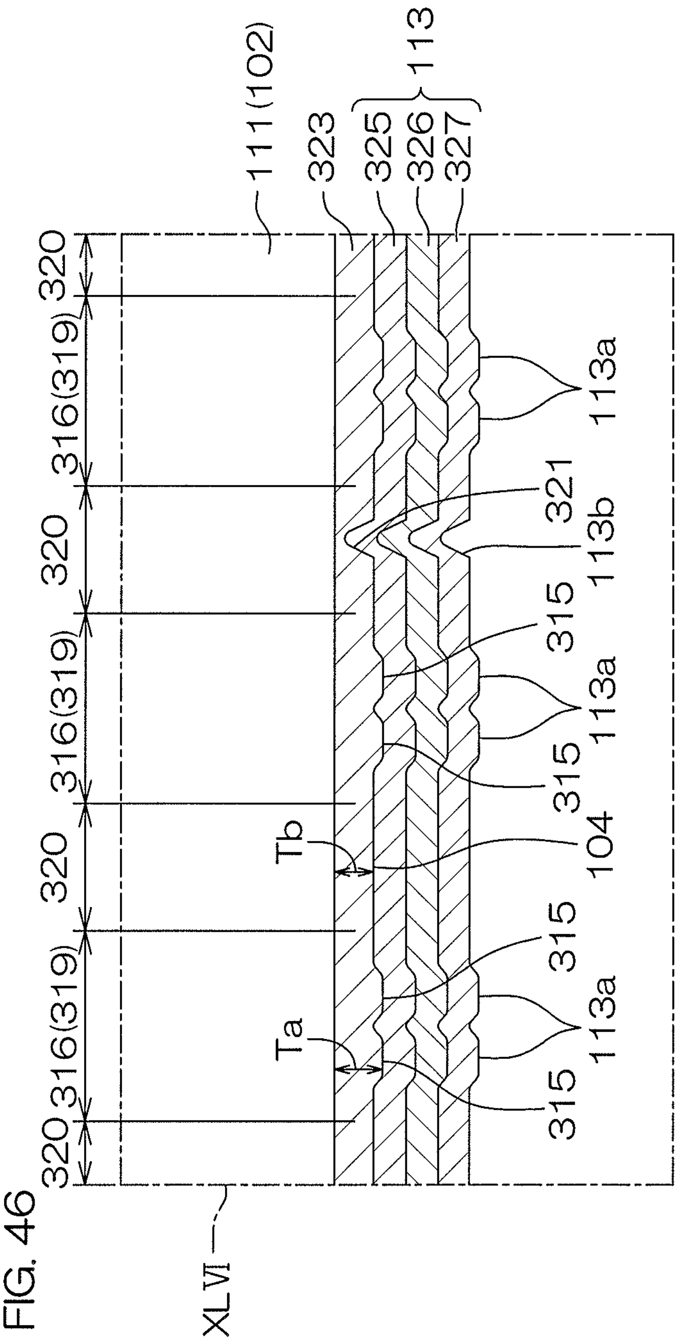
FIG. 46 is an enlarged view of a region XLVI shown in FIG. 45.

FIG. 45 is a sectional view corresponding to FIG. 39 and is a sectional view of a semiconductor device 361 according to a twenty-fourth preferred embodiment of the present invention. FIG. 46 is an enlarged view of a region XLVI shown in FIG. 45. In the following, structures corresponding to structures described with the semiconductor device 311 shall be provided with the same reference symbols and description thereof shall be omitted.

With the semiconductor device 361, the drain pad 113 has a three-layer structure that includes the Ni layer 325, the Au layer 326, and the Ag layer 327 that are laminated in that order from the second main surface 104 of the SiC semiconductor layer 102. That is, the drain pad 113 is formed by omitting the step of forming the Ti layer 324 in step S9 of FIG. 42.

The Ni layer 325 is directly connected to the second main surface 104 of the SiC semiconductor layer 102. The Ni layer 325 covers the raised portion groups 316 altogether.

The Ni layer 325 forms ohmic contacts with the raised portion groups 316 and with the spaces 320. The Au layer 326 covers substantially an entire area or the entire area of the Ni layer 325. The Ag layer 327 covers substantially an entire area or the entire area of the Au layer 326.

Even with the semiconductor device 361 described above, the same effects as the effects described for the semiconductor device 311 can be exhibited. In the semiconductor device 361, the drain pad 113 may have a single layer structure constituted of the Ni layer 325.

Figure 47:
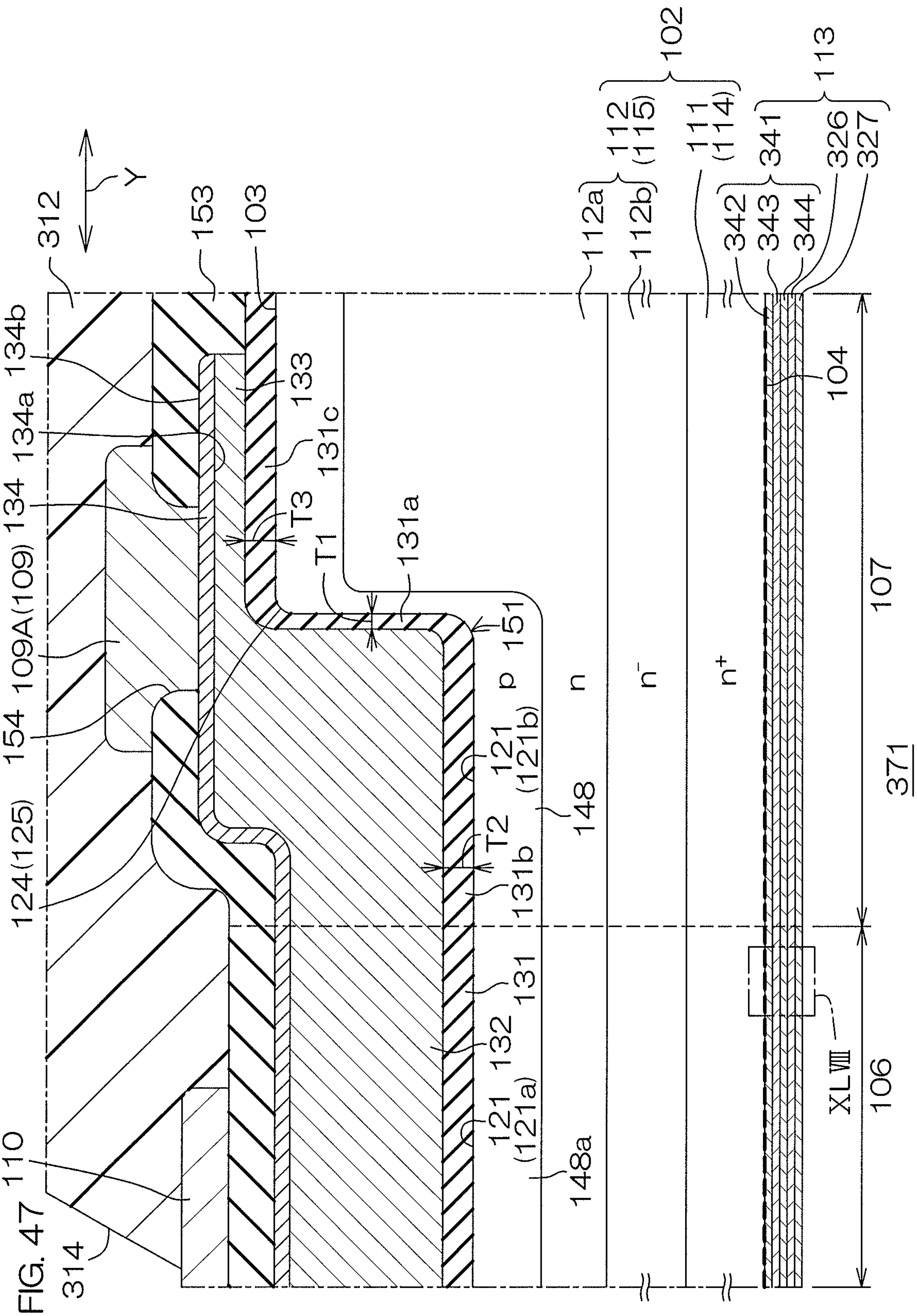
FIG. 47 is a sectional view corresponding to FIG. and is a sectional view of a semiconductor device according to a twenty-fifth preferred embodiment of the present invention.
Figure 48:
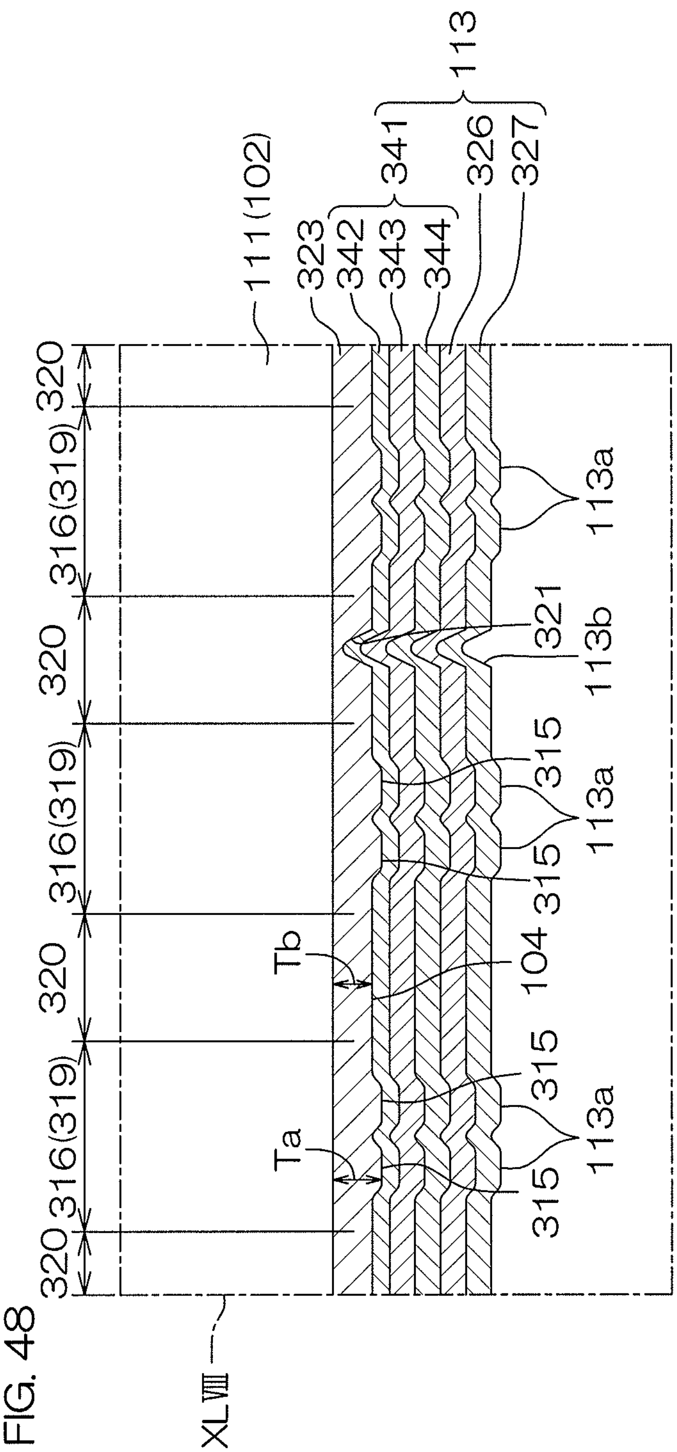
FIG. 48 is an enlarged view of a region XLVIII shown in FIG. 47.

FIG. 47 is a sectional view corresponding to FIG. 39 and is a sectional view of a semiconductor device 371 according to a twenty-fifth preferred embodiment of the present invention. FIG. 48 is an enlarged view of a region XLVIII shown in FIG. 47. In the following, structures corresponding to structures described with the semiconductor device 311 shall be provided with the same reference symbols and description thereof shall be omitted.

With the semiconductor device 371, the drain pad 113 includes the metal layer 341, the Au layer 326, and the Ag layer 327. The metal layer 341 has the laminated structure that includes the carbon layer 342, the NiSi layer 343, and the Ni layer 344 laminated in that order from the second main surface 104 side of the SiC semiconductor layer 102, in this embodiment.

The metal layer 341 is connected to the second main surface 104 of the SiC semiconductor layer 102. The metal layer 341 covers the raised portion groups 316 altogether.

The metal layer 341 forms ohmic contacts with the raised portion groups 316 and with the spaces 320. The Au layer 326 covers substantially an entire area or the entire area of the metal layer 341. The Ag layer 327 covers substantially an entire area or the entire area of the Au layer 326.

The semiconductor device 371 is formed by omitting the steps of removing the metal layer 341 in FIG. 42 (see steps S4 to S8 shown in FIG. 42). With the semiconductor device 371, the Au layer 326 and the Ag layer 327 are formed on the metal layer 341 in step S9 of FIG. 42 described above.

With the semiconductor device 371 described above, the drain pad 113 includes the carbon layer 342 and the NiSi layer 343. With the semiconductor device 371, although a connection strength of the drain pad 113 cannot be made as high as in the semiconductor device 311, substantially the same effects as the effects described for the semiconductor device 311 can be exhibited. In the semiconductor device 371, the drain pad 113 may be made of just the metal layer 341.

Although the twenty-second to twenty-fifth preferred embodiments of the present invention have been described above, the twenty-second to twenty-fifth preferred embodiments of the present invention may also be implemented in yet other configurations.

With each of the twenty-second to twenty-fifth preferred embodiments described above, an example where the SiC semiconductor layer 102 has the laminated structure that includes the SiC semiconductor substrate 111 and the SiC epitaxial layer 112 was described.

However, the SiC semiconductor layer 102 may instead have a single layer structure constituted of the SiC semiconductor substrate 111. The SiC semiconductor layer 102 may have a single layer structure constituted of the SiC epitaxial layer 112.

With each of the twenty-second to twenty-fifth preferred embodiments described above, an example where the SiC epitaxial layer 112 having the high concentration region 112*a* and the low concentration region 112*b* is formed by an epitaxial growth method was described. However, the SiC epitaxial layer 112 may instead be formed by steps such as the following.

First, the SiC epitaxial layer 112 having a comparatively low n-type impurity concentration is formed by an epitaxial growth method. Next, the n-type impurity is introduced into a surface layer portion of the SiC epitaxial layer 112 by an ion implantation method. The SiC epitaxial layer 112 having the high concentration region 112*a* and the low concentration region 112*b* is thereby formed.

With each of the twenty-second to twenty-fifth preferred embodiments described above, an example where the gate electrode layers 132 and the gate wiring layer 133 that contain the p-type polysilicon doped with the p-type impurity are formed was described. However, if increase of the gate threshold voltage Vth is not emphasized, the gate electrode layers 132 and the gate wiring layer 133 may include an n-type polysilicon doped with an n-type impurity instead of the p-type polysilicon.

That is, the low resistance electrode layer 134 may include an n-type polycide. The low resistance electrode layer 134 may be formed by siliciding portions forming surface layer portions of the gate electrode layers 132 (n-type polysilicon) by a metal material. In this case, reduction of gate resistance can be achieved.

With each of the twenty-second to twenty-fifth preferred embodiments described above, a structure with which the conductivity types of the respective semiconductor portions are inverted may be adopted. That is, a p-type portion may be formed to be of an n-type and an n-type portion may be formed to be of a p-type.

With each of the twenty-second to twenty-fifth preferred embodiments, a $p^+$-type SiC semiconductor substrate (111) may be adopted in place of the $n^+$-type SiC semiconductor substrate 111. In this case, in the description of the twenty-second to twenty-fifth preferred embodiments described above, "source" is replaced by "emitter" and "drain" is replaced by "collector."

Figure 50:
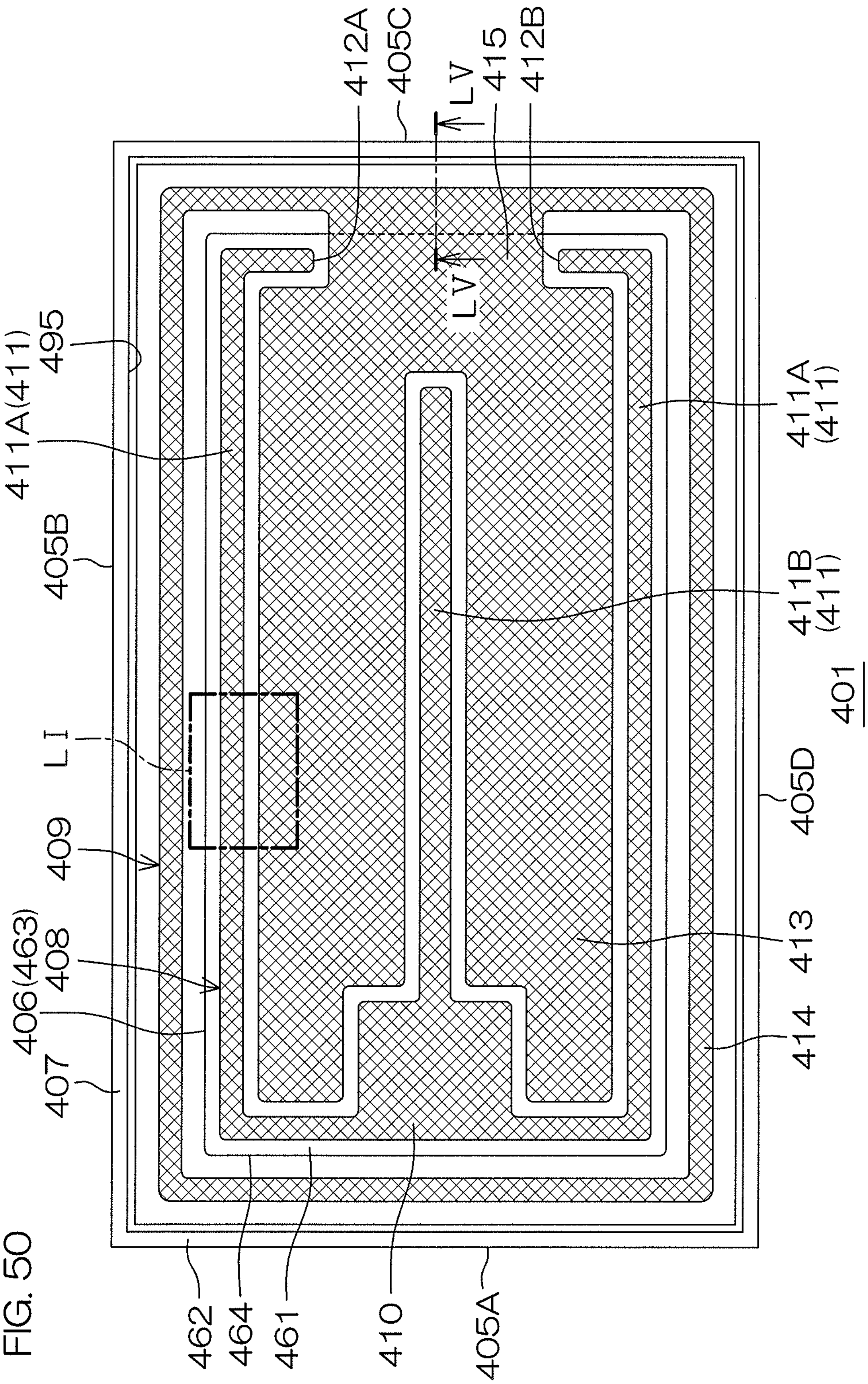
FIG. 50 is a top view of the semiconductor device shown in FIG. 49 and is a top view with which a resin layer is removed.

FIG. 49 is a top view of a semiconductor device 401 according to a twenty-sixth preferred embodiment of the present invention. FIG. 50 is a top view of the semiconductor device 401 shown in FIG. 49 and is a top view with which a resin layer 416 is removed.

Referring to FIG. 49 and FIG. 50, the semiconductor device 401 has a SiC semiconductor layer 402 that includes an SiC (silicon carbide) monocrystal. The SiC semiconductor layer 402 may include a 4H—SiC monocrystal.

The 4H—SiC monocrystal has an off angle inclined at an angle of within 10° in a [11-20] direction from a [0001] plane. The off angle may be not less than 0° and not more than 4°. The off angle may exceed 0° and be less than 4°. The off angle is typically 2° or 4° and more specifically is set in a range of 2°±0.2° or a range of 4°±0.4°.

The SiC semiconductor layer 402 is formed in a chip shape of rectangular parallelepiped shape, in this embodiment. The SiC semiconductor layer 402 has a first main surface 403 at one side, a second main surface 404 at another side, and side surfaces 405A, 405B, 405C, and 405D connecting the first main surface 403 and the second main surface 404. The first main surface 403 and the second main surface 404 are formed in quadrilateral shapes (rectangular shapes in this embodiment) in a plan view as viewed in a direction normal to the surfaces (hereinafter referred to simply as "plan view").

The side surface 405A faces the side surface 405C. The side surface 405B faces the side surface 405D. The side surfaces 405A to 405D respectively extend as planes along the direction normal to the first main surface 403 and the second main surface 404. A length of each of the side surfaces 405A to 405D may be not less than 1 mm and not more than 10 mm (for example, not less than 2 mm and not more than 5 mm).

An active region 406 and an outer region 407 are set in the SiC semiconductor layer 402. The active region 406 is a region in which a vertical MISFET is formed. The outer region 407 is a region at an outer side of the active region 406.

The active region 406 is set in a central portion of the SiC semiconductor layer 402 at intervals toward an inner region from the side surfaces 405A to 405D of the SiC semiconductor layer 402 in plan view. The active region 406 is set to a quadrilateral shape (a rectangular shape in this embodiment) having four sides parallel to the four side surfaces 405A to 405D of the SiC semiconductor layer 402 in plan view.

The outer region 407 is set in a region between the side surfaces 405A to 405D of the SiC semiconductor layer 402 and peripheral edges of the active region 406. The outer region 407 is set to an endless shape (quadrilateral annular shape) surrounding the active region 406 in plan view.

A main surface gate electrode 408 and a main surface source electrode 409 are formed on the first main surface 403 of the SiC semiconductor layer 402.

The main surface gate electrode 408 includes a gate pad 410 and a gate finger 411. The gate pad 410 and the gate finger 411 are arranged in the active region 406, in this embodiment.

The gate pad 410 is formed along the side surface 405A of the SiC semiconductor layer 402 in plan view. The gate pad 410 is formed along a central region of the side surface 405A of the SiC semiconductor layer 402 in plan view.

The gate pad 410 may be formed along a corner portion connecting any two of the side surfaces 405A to 405D of the SiC semiconductor layer 402 in plan view. The gate pad 410 is formed in a quadrilateral shape in plan view.

The gate finger 411 includes an outer gate finger 411A and an inner gate finger 411B.

The outer gate finger 411A is lead out from the gate pad 410 and extends as a band shape along the peripheral edge of the active region 406. The outer gate finger 411A is formed along the three side surfaces 405A, 405B, and 405D of the SiC semiconductor layer 402 such as to define an inner region of the active region 406 from three directions, in this embodiment.

The outer gate finger 411A has a pair of open end portions 412A and 412B. The pair of open end portions 412A and 412B of the outer gate finger 411A is formed in a region facing the gate pad 410 across the inner region of the active region 406. The pair of open end portions 412A and 412B of the outer gate finger 411A is formed along the side surface 405C of the SiC semiconductor layer 402, in this embodiment.

The inner gate finger 411B is lead out from the gate pad 410 to the inner region of the active region 406. The inner gate finger 411B extends as a band shape in the inner region of the active region 406. The inner gate finger 411B extends from the side surface 405A side toward the side surface 405C side.

The main surface source electrode 409 includes a source pad 413, a source routing wiring 414, and a source connection portion 415, in this embodiment.

The source pad 413 is formed in the active region 406 across intervals from the gate pad 410 and the gate finger 411. The source pad 413 is formed in a C shape (an inverted C shape in FIG. 49 and FIG. 50) in plan view such as to cover a region of C shape (inverted C shape in FIG. 49 and FIG. 50) defined by the gate pad 410 and the gate finger 411.

The source routing wiring 414 is formed in the outer region 407. The source routing wiring 414 extends as a band shape along the active region 406. The source routing wiring 414 is formed in an endless shape (quadrilateral annular shape) surrounding the active region 406 in plan view, in this embodiment. The source routing wiring 414 is electrically connected to the SiC semiconductor layer 402 in the outer region 407.

The source connection portion 415 connects the source pad 413 and the source routing wiring 414. The source connection portion 415 is arranged in a region between the pair of open end portions 412A and 412B of the outer gate finger 411A. The source connection portion 415 crosses a boundary region between the active region 406 and the outer region 407 from the source pad 413 and is connected to the source routing wiring 414.

The MISFET formed in the active region 406 includes an npn-type parasitic bipolar transistor due to its structure. When an avalanche current generated in the outer region 407 flows into the active region 406, the parasitic bipolar transistor is switched to an on state. In this case, control of the MISFET may become unstable, for example, due to latchup.

Therefore, with the semiconductor device 401, the structure of the main surface source electrode 409 is used to form an avalanche current absorbing structure that absorbs the avalanche current generated in a region outside the active region 406.

More specifically, the avalanche current generated in the outer region 407 is absorbed by the source routing wiring 414. The avalanche current is thereby made to reach the source pad 413 via the source connection portion 415. If a lead wire (for example, a bonding wire) for external connection is connected to the source pad 413, the avalanche current is taken out by this lead wire.

Switching of the parasitic bipolar transistor to the on state by an undesired current generated in the outer region 407 can thereby be suppressed. Latchup can thus be suppressed and therefore stability of control of the MISFET can be improved.

A gate voltage is applied to the gate pad 410 and the gate finger 411. The gate voltage may be not less than 10 V and not more than 50 V (for example, approximately 30 V). A source voltage is applied to the source pad 413. The source voltage may be a reference voltage (for example, a GND voltage).

A resin layer 416 is formed above the first main surface 403 of the SiC semiconductor layer 402 (more specifically, on an interlayer insulating layer 491 to be described below). In FIG. 49, the resin layer 416 is shown with hatching applied for clarity. The resin layer 416 covers the gate pad 410, the gate finger 411, and the source pad 413.

The resin layer 416 may include a negative type or positive type photosensitive resin. The resin layer 416 includes a polybenzoxazole as an example of a positive type photosensitive resin, in this embodiment. The resin layer 416 may include a polyimide as an example of a negative type photosensitive resin.

A gate pad opening 417 and a source pad opening 418 are formed in the resin layer 416. The gate pad opening 417 exposes the gate pad 410. The source pad opening 418 exposes the source pad 413.

A peripheral edge portion 419 of the resin layer 416 is formed across intervals in an inner region from the side surfaces 405A to 405D of the SiC semiconductor layer 402. The resin layer 416 thereby exposes a peripheral edge portion (more specifically, the interlayer insulating layer 491 to be described below) of the SiC semiconductor layer 402.

The peripheral edge portion 419 of the resin layer 416 is a portion in which dicing streets were formed in a process of cutting out the semiconductor device 401 from a single SiC semiconductor wafer. It becomes unnecessary to physically cut the resin layer 416 by exposing the peripheral edge portion of the SiC semiconductor layer 402 from the resin layer 416.

The semiconductor device 401 can thus be cut out smoothly from a single SiC semiconductor wafer. The side surfaces 405A to 405D of the SiC semiconductor layer 402 may be cut surfaces (ground surfaces). The side surfaces 405A to 405D of the SiC semiconductor layer 402 may have grinding marks.

Figure 52:
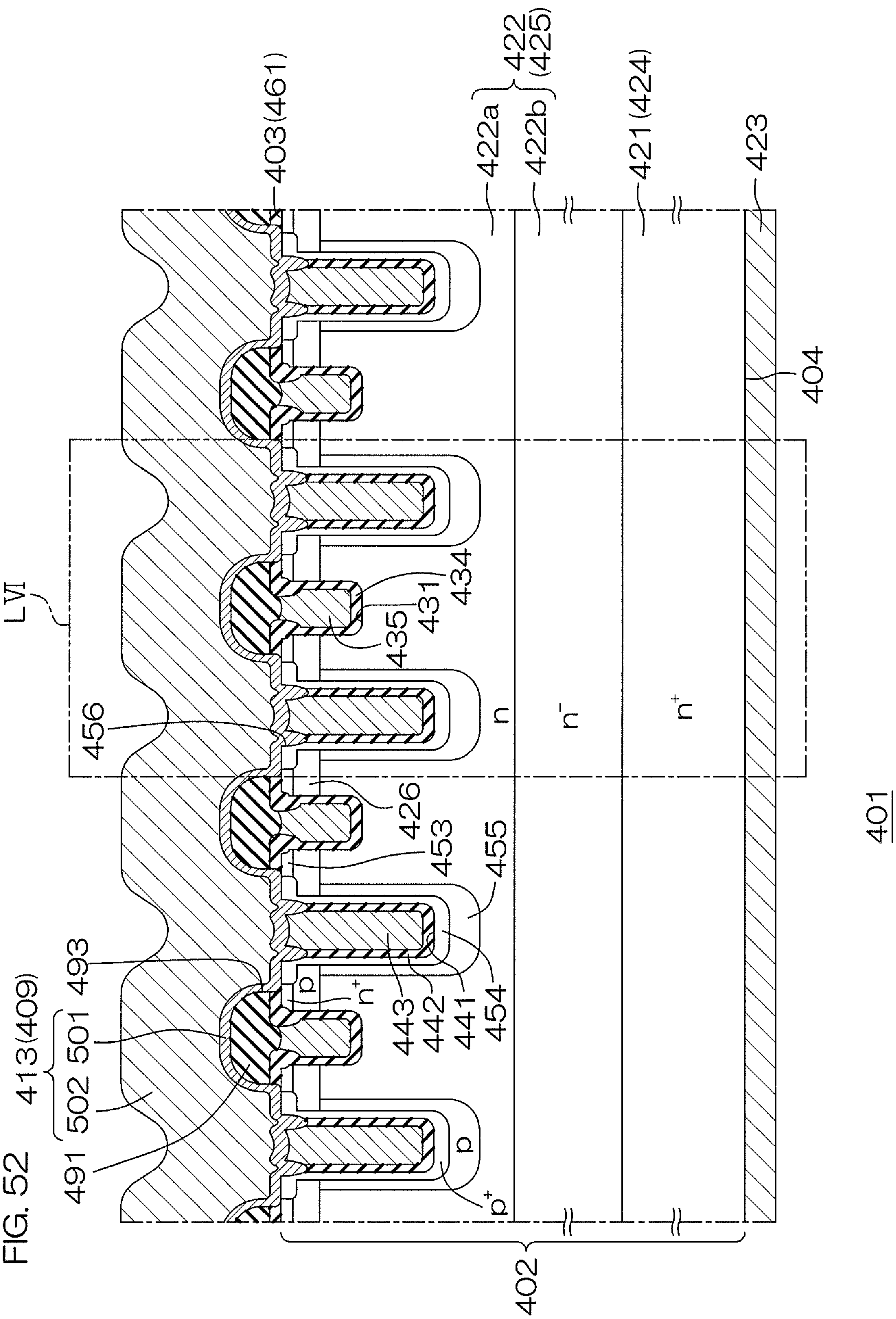
FIG. 52 is a sectional view taken along line LII-LII shown in FIG. 51 and is a sectional view of a first configuration example of gate trenches and a first configuration example of source trenches.
Figure 53:
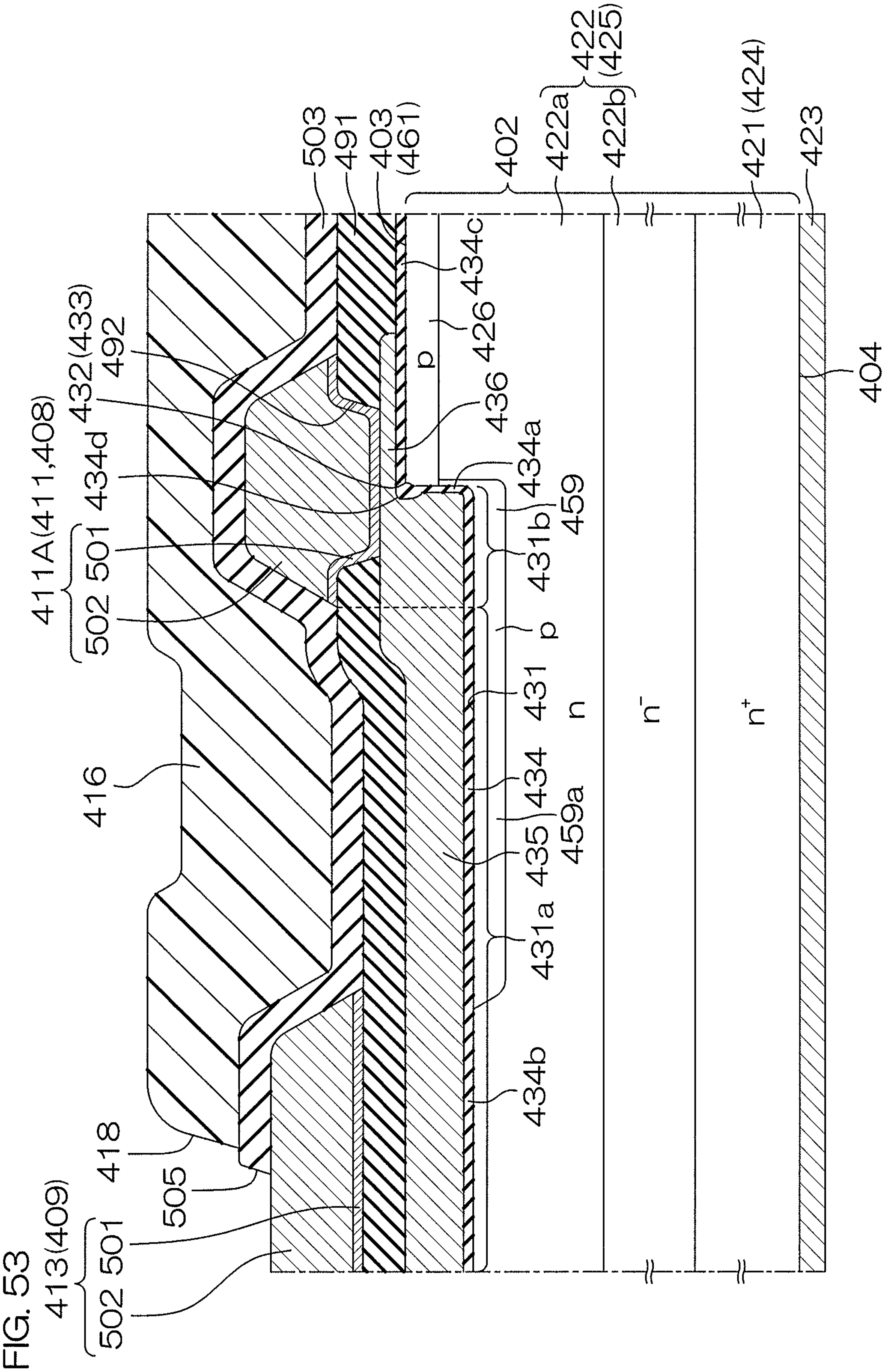
FIG. 53 is a sectional view taken along line LIII-LIII shown in FIG. 51 and is a sectional view of a first configuration example of a gate wiring layer.

FIG. 51 is an enlarged view of a region LI shown in FIG. 50 and is a diagram for describing the structure of the first main surface 403 of the SiC semiconductor layer 402. FIG. 52 is a sectional view taken along line LII-LII shown in FIG. 51 and is a sectional view of a first configuration example of gate trenches 431 and a first configuration example of source trenches 441. FIG. 53 is a sectional view taken along line LIII-LIII shown in FIG. 51 and is a sectional view of a first configuration example of a gate wiring layer 436. FIG. 54 is an enlarged view of a region LIV shown in FIG. 52.

Figure 56:
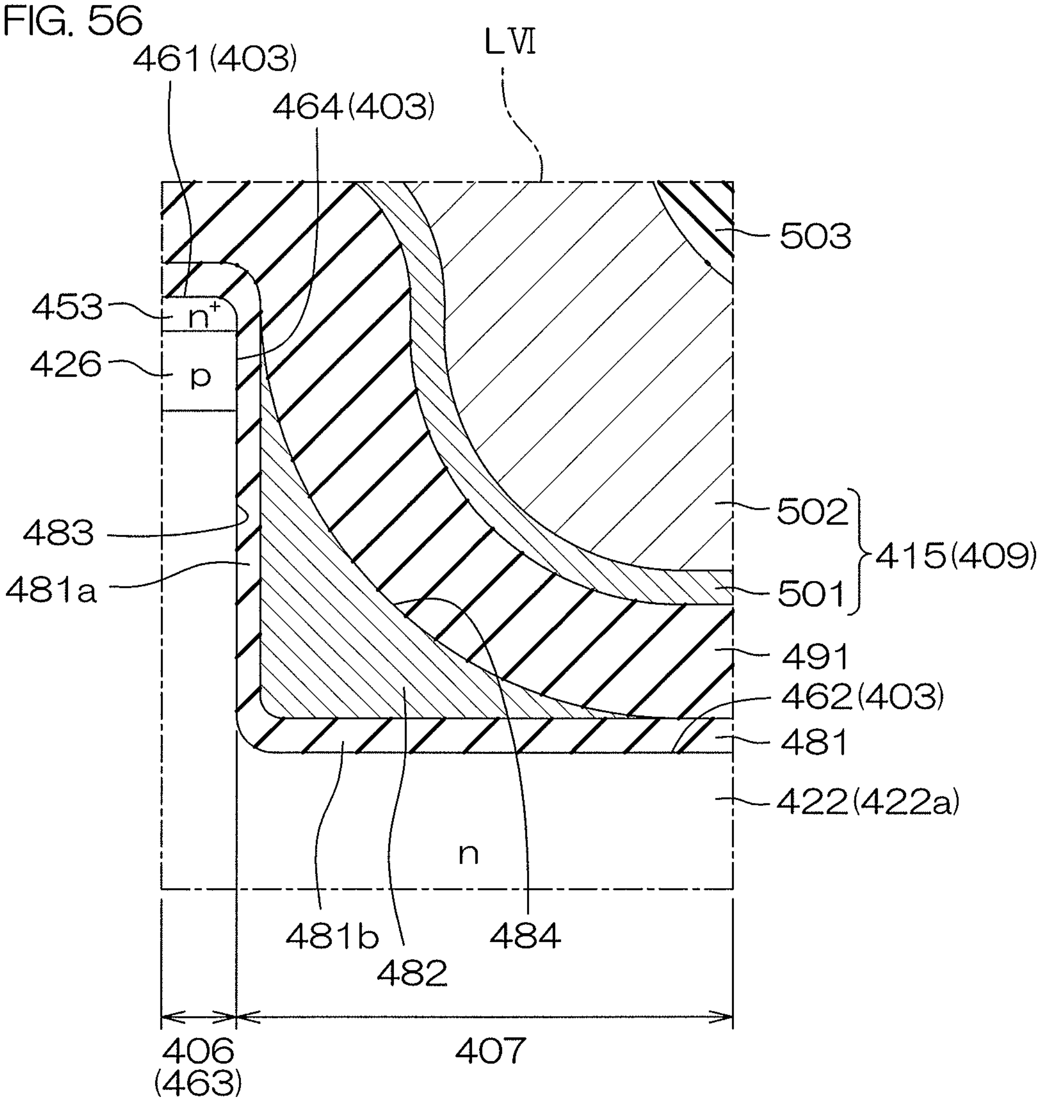
FIG. 56 is an enlarged view of the region LVI shown in FIG. 55 and is an enlarged view of the first configuration example of the active side wall and the first configuration example of the outer main surface.

FIG. 55 is a sectional view taken along line LV-LV shown in FIG. 50 and is a sectional view of a first configuration example of an active side wall 464, a first configuration example of an outer main surface 462, a first configuration example of a side wall structure 482, a first configuration example of a diode region 471, a first configuration example of an outer deep well region 472, a first configuration example of a field limit structure 473, and a first configuration example of an anchor hole 495. FIG. 56 is an enlarged view of the region LVI shown in FIG. and is an enlarged view of the first configuration example of the active side wall 464 and the first configuration example of the outer main surface 462.

Referring to FIG. 51 to FIG. 55, the SiC semiconductor layer 402 has a laminated structure including an $n^+$-type SiC semiconductor substrate 421 and an n-type SiC epitaxial layer 422, in this embodiment. The second main surface 404 of the SiC semiconductor layer 402 is formed by the SiC semiconductor substrate 421.

The first main surface 403 of the SiC semiconductor layer 402 is formed by the SiC epitaxial layer 422. The second main surface 404 of the SiC semiconductor layer 402 may be a ground surface. The second main surface 404 of the SiC semiconductor layer 402 may have grinding marks.

A thickness of the SiC semiconductor substrate 421 may be not less than 1 μm and less than 1000 μm. The thickness of the SiC semiconductor substrate 421 may be not less than 5 μm. The thickness of the SiC semiconductor substrate 421 may be not less than 25 μm. The thickness of the SiC semiconductor substrate 421 may be not less than 50 μm. The thickness of the SiC semiconductor substrate 421 may be not less than 100 μm.

The thickness of the SiC semiconductor substrate 421 may be not more than 700 μm. The thickness of the SiC semiconductor substrate 421 may be not more than 500 μm. The thickness of the SiC semiconductor substrate 421 may be not less than 400 μm. The thickness of the SiC semiconductor substrate 421 may be not more than 300 μm.

The thickness of the SiC semiconductor substrate 421 may be not more than 250 μm. The thickness of the SiC semiconductor substrate 421 may be not more than 200 μm. The thickness of the SiC semiconductor substrate 421 may be not more than 150 μm. The thickness of the SiC semiconductor substrate 421 may be not more than 100 μm.

The thickness of the SiC semiconductor substrate 421 is preferably not more than 150 μm. Reduction of resistance value can be achieved by shortening of a current path by making the thickness of the SiC semiconductor substrate 421 small.

A thickness of the SiC epitaxial layer 422 may be not less than 1 μm and not more than 100 μm. The thickness of the SiC epitaxial layer 422 may be not less than 5 μm. The thickness of the SiC epitaxial layer 422 may be not less than 10 μm.

The thickness of the SiC epitaxial layer 422 may be not more than 50 μm. The thickness of the SiC epitaxial layer 422 may be not more than 40 μm. The thickness of the SiC epitaxial layer 422 may be not more than 30 μm.

The thickness of the SiC epitaxial layer 422 may be not more than 20 μm. The thickness of the SiC epitaxial layer 422 is preferably not more than 15 μm. The thickness of the SiC epitaxial layer 422 is preferably not more than 10 μm.

An n-type impurity concentration of the SiC epitaxial layer 422 is not more than an n-type impurity concentration of the SiC semiconductor substrate 421. The n-type impurity concentration of the SiC epitaxial layer 6 may be not less than $1.0\times10^{15}$ $cm^{-3}$ and not more than $1.0\times10^{18}$ $cm^{-3}$.

The SiC epitaxial layer 422 has a plurality of regions having different n-type impurity concentrations along the direction normal to the first main surface 403 of the SiC semiconductor layer 402, in this embodiment. More specifically, the SiC epitaxial layer 422 includes a high concentration region 422*a* of comparatively high n-type impurity concentration and a low concentration region 422*b* of low n-type impurity concentration with respect to the high concentration region 422*a*.

The high concentration region 422*a* is formed in a region at the first main surface 403 side. The low concentration region 422*b* is formed in a region at the second main surface 404 side of the SiC semiconductor layer 402 with respect to the high concentration region 422*a*.

The n-type impurity concentration of the high concentration region 422*a* may be not less than $1\times10^{16}$ $cm^{-3}$ and not more than $1\times10^{18}$ $cm^{-3}$. The n-type impurity concentration of the low concentration region 422*b* may be not less than $1\times10^{15}$ $cm^{-3}$ and not more than $1\times10^{16}$ $cm^{-3}$.

A thickness of the high concentration region 422*a* is not more than a thickness of the low concentration region 422*b*. More specifically, the thickness of the high concentration region 422*a* is less than the thickness of the low concentration region 422*b*. That is, the thickness of the high concentration region 422*a* is less than half the total thickness of the SiC epitaxial layer 422.

A drain pad 423 serving as a second main surface electrode is connected to the second main surface 404 of the SiC semiconductor layer 402. A maximum voltage that can be applied across the source pad 413 and the drain pad 423 in an off state may be not less than 1000 V and not more than 10000 V.

The drain pad 423 may include at least one layer among a Ti layer, an Ni layer, an Au layer, and an Ag layer. The drain pad 423 may have a four-layer structure that includes a Ti layer, an Ni layer, an Au layer, and an Ag layer that are laminated in that order from the second main surface 404 of the SiC semiconductor layer 402.

The SiC semiconductor substrate 421 is formed as a drain region 424 of the MISFET. The SiC epitaxial layer 422 is formed as a drift region 425 of the MISFET.

A p-type body region 426 is formed in a surface layer portion of the first main surface 403 of the SiC semiconductor layer 402 in the active region 406. The body region 426 defines the active region 406.

That is, the body region 426 is formed in an entire area of a region of the first main surface 403 of the SiC semiconductor layer 402 that forms the active region 406, in this embodiment. A p-type impurity concentration of the body region 426 may be not less than $1\times10^{17}$ $cm^{-3}$ and not more than $1\times10^{20}$ $cm^{-3}$.

A plurality of the gate trenches 431 is formed in the surface layer portion of the first main surface 403 of the SiC semiconductor layer 402 in the active region 406. The plurality of gate trenches 431 are formed at intervals along an arbitrary first direction X. The plurality of gate trenches 431 are formed in band shapes extending along a second direction Y intersecting the first direction X.

The first direction X is, more specifically, a direction along the side surfaces 405B and 405D of the SiC semiconductor layer 402. The second direction Y is a direction orthogonal to the first direction X. The second direction Y is also a direction along the side surfaces 405A and 405C of the SiC semiconductor layer 402.

The plurality of gate trenches 431 is formed in a stripe shape in plan view. The gate trench 431 extends as a band shape from a peripheral edge portion at one side (the side surface 405B side) to a peripheral edge portion at another side (the side surface 405D side) of the active region 406, in this embodiment.

Each gate trench 431 crosses an intermediate portion between the peripheral edge portion at one side and the peripheral edge portion at the other side of the active region 406. One end portion of each gate trench 431 is positioned at the peripheral edge portion at one side of the active region 406. Another end portion of each gate trench 431 is positioned at the peripheral edge portion at the other side of the active region 406.

The first direction X may be set to the [11-20] direction ([−1-120] direction). In this case, each gate trench 431 may extend along the [11-20] direction. The first direction X may be set to a [−1100] direction ([1-100] direction) orthogonal to the [11-20] direction. In this case, each gate trench 431 may extend along the [−1100] direction ([1-100] direction).

Each gate trench 431 has a length of the millimeter order. That is, the length of the gate trench 431 is the length from an end portion at a side of a connection portion of the gate trench 431 and the gate finger 411 in the section shown in FIG. 53 to an end portion at the opposite side.

The length of each gate trench 431 may be not less than 0.5 mm. The length of each gate trench 431 is not less than 1 mm and not more than 10 mm (for example, not less than 2 mm and not more than 5 mm), in this embodiment. A total extension of one or a plurality of the gate trenches 431 per unit area may be not less than 0.5 μm/μm2 and not more than 0.75 μm/μm2.

Each gate trench 431 integrally includes an active trench portion 431*a* and a contact trench portion 431*b*. The active trench portion 431*a* is a portion in the active region 406 along a channel region of the MISFET.

The contact trench portion 431*b* is a portion of the gate trench 431 that mainly serves as a contact with the gate finger 411. The contact trench portion 431*b* is lead out from the active trench portion 431*a* to a peripheral edge portion of the active region 406. The contact trench portion 431*b* is formed in a region directly below the gate finger 411. A lead-out amount of the contact trench portion 431*b* is arbitrary.

Each gate trench 431 penetrates through the body region 426 and reaches the SiC epitaxial layer 422. A bottom wall of each gate trench 431 is positioned inside the SiC epitaxial layer 422.

More specifically, the bottom wall of each gate trench 431 is positioned in the high concentration region 422*a* of the SiC epitaxial layer 422. The bottom wall of the gate trench 431 may be formed parallel to the first main surface 403 of the SiC semiconductor layer 402.

Side wall of the gate trench 431 may extend along the direction normal to the first main surface 403 of the SiC semiconductor layer 402. That is, the side wall of the gate trench 431 may be formed substantially perpendicular to the first main surface 403 of the SiC semiconductor layer 402.

A depth of the gate trench 431 in regard to the direction normal to the first main surface 403 of the SiC semiconductor layer 402 may be not less than 0.5 μm and not more than 3 μm (for example, approximately 1 μm). The depth of the gate trench 431 is preferably not less than 0.5 μm and not more than 1.0 μm.

A first direction width of the gate trench 431 may be not less than 0.1 μm and not more than 2 μm (for example, approximately 0.5 μm). The first direction width of the gate trench 431 is preferably not less than 0.1 μm and not more than 0.5 μm.

Referring to FIG. 54, an opening edge portion 432 of each gate trench 431 includes an inclining portion 433 that inclines downwardly from the first main surface 403 of the SiC semiconductor layer 402 toward an inner side of the gate trench 431. The opening edge portion 432 of the gate trench 431 is a corner portion connecting the first main surface 403 of the SiC semiconductor layer 402 and the side wall of the gate trench 431.

The inclining portion 433 is formed in a shape that is concavely curved toward an inner side of the SiC semiconductor layer 402, in this embodiment. The inclining portion 433 may be formed in a shape that is convexly curved toward the inner side of the gate trench 431.

An electric field at the opening edge portion 432 of the gate trench 431 is dispersed along the inclining portion 433. Concentration of electric field with respect to the opening edge portion 432 of the gate trench 431 can thereby be relaxed.

A gate insulating layer 434 and a gate electrode layer 435 are formed inside each gate trench 431. In FIG. 51, the gate insulating layer 434 and the gate electrode layer 435 are shown with hatching applied for clarity.

The gate insulating layer 434 contains silicon oxide. The gate insulating layer 434 may include another insulating film such as silicon nitride, etc. The gate insulating layer 434 is formed in a film shape along inner wall surface of the gate trench 431 such as to define a recessed space inside the gate trench 431.

The gate insulating layer 434 includes a first region 434*a*, a second region 434*b*, and a third region 434*c*. The first region 434*a* is formed along the side wall of the gate trench 431. The second region 434*b* is formed along the bottom wall of the gate trench 431. The third region 434*c* is formed along the first main surface 403 of the SiC semiconductor layer 402.

A thickness T1 of the first region 434*a* is smaller than a thickness T2 of the second region 434*b* and a thickness T3 of the third region 434*c*. A ratio T2/T1 of the thickness T2 of the second region 434*b* with respect to the thickness T1 of the first region 434*a* may be not less than 2 and not more than 5. A ratio T3/T1 of the thickness T3 of the third region 434*c* with respect to the thickness T1 of the first region 434*a* may be not less than 2 and not more than 5.

The thickness T1 of the first region 434*a* may be not less than 0.01 μm and not more than 0.2 μm. The thickness T2 of the second region 434*b* may be not less than 0.05 μm and not more than 0.5 μm. The thickness T3 of the third region 434*c* may be not less than 0.05 μm and not more than 0.5 μm.

Increase of carriers induced in regions of the body region 426 in vicinities of the side wall of the gate trench 431 can be suppressed by thinly forming the first region 434*a* of the gate insulating layer 434. Increase of channel resistance can thereby be suppressed. Concentration of electric field with respect to the bottom wall of the gate trench 431 can be relaxed by thickly forming the second region 434*b* of the gate insulating layer 434.

A withstand voltage of the gate insulating layer 434 in a vicinity of the opening edge portion 432 of the gate trench 431 can be improved by thickly forming the third region 434*c* of the gate insulating layer 434. Loss of the third region 434*c* due to an etching method can also be suppressed by thickly forming the third region 434*c*.

Removal of the first region 434*a* by the etching method due to the loss of the third region 434*c* can thereby be suppressed. Consequently, the gate electrode layer 435 can be made to face the SiC semiconductor layer 402 (body region 426) appropriately across the gate insulating layer 434.

The gate insulating layer 434 further includes a bulging portion 434*d* bulging toward an interior of the gate trench 431 at the opening edge portion 432 of the gate trench 431. The bulging portion 434*d* is formed at a corner portion connecting the first region 434*a* and the third region 434*c* of the gate insulating layer 434.

The bulging portion 434*d* bulges curvingly toward the inner side of the gate trench 431. The bulging portion 434*d* narrows the opening of the gate trench 431 at the opening edge portion 432 of the gate trench 431.

Improvement of the withstand voltage of the gate insulating layer 434 at the opening edge portion 432 is achieved by the bulging portion 434*d*. Obviously, a gate insulating layer 434 not having the bulging portion 434*d* may be formed. A gate insulating layer 434 having a uniform thickness may be formed.

The gate electrode layer 435 is embedded in the gate trench 431 across the gate insulating layer 434. More specifically, the gate electrode layer 435 is embedded in the gate trench 431 such as to fill the recessed space defined by the gate insulating layer 434. The gate electrode layer 435 is controlled by the gate voltage.

The gate electrode layer 435 is formed as a wall shape extending along the direction normal to the first main surface 403 of the SiC semiconductor layer 402 in a sectional view orthogonal to the direction in which the gate trench 431 extends. The gate electrode layer 435 has an upper end portion positioned at an opening side of the gate trench 431.

The upper end portion of the gate electrode layer 435 is formed in a curved shape that is recessed toward the bottom wall of the gate trench 431. The upper end portion of the gate electrode layer 435 has a constricted portion that is constricted along the bulging portion 434*d* of the gate insulating layer 434.

A cross-sectional area of the gate electrode layer 435 (cross-sectional area orthogonal to the direction of extension of the gate trench 431) may be not less than 0.05 $\mu m^2$ and not more than 0.5 $\mu m^2$. The cross-sectional area of the gate electrode layer 435 is defined as a product of a depth of the gate electrode layer 435 and a width of the gate electrode layer 435.

The depth of the gate electrode layer 435 is a distance from the upper end portion to a lower end portion of the gate electrode layer 435. The width of the gate electrode layer 435 is a width of the trench at an intermediate position between the upper end portion and the lower end portion of the gate electrode layer 435. When the upper end portion is a curved surface (a curved shape that is recessed toward the lower side in this embodiment), a position of the upper end portion of the gate electrode layer 435 is deemed to be an intermediate position in the depth direction of the upper surface of the gate electrode layer 435.

The gate electrode layer 435 may include a conductive polysilicon. The gate electrode layer 435 may include an n-type polysilicon or a p-type polysilicon as an example of a conductive polysilicon. In place of a conductive polysilicon, the gate electrode layer 435 may include at least one of material among tungsten, aluminum, copper, aluminum alloy, or copper alloy.

Referring to FIG. 51 and FIG. 53, the gate wiring layer 436 is formed in the active region 406. The gate wiring layer 436 is electrically connected to the gate pad 410 and the gate finger 411. In FIG. 53, the gate wiring layer 436 is shown with hatching applied for clarity.

The gate wiring layer 436 is formed on the first main surface 403 of the SiC semiconductor layer 402. More specifically, the gate wiring layer 436 is formed on the third region 434*c* of the gate insulating layer 434.

The gate wiring layer 436 is formed along the gate finger 411, in this embodiment. More specifically, the gate wiring layer 436 is formed along the three side surfaces 405A, 405B, and 405D of the SiC semiconductor layer 402 such as to define the inner region of the active region 406 from three directions.

The gate wiring layer 436 is connected to the gate electrode layer 435 exposed from the contact trench portion 431*b* of each gate trench 431. The gate wiring layer 436 is formed by lead-out portion lead out from the gate electrode 435 to above the first main surface 403 of the SiC semiconductor layer 402, in this embodiment. An upper end portion of the gate wiring layer 436 is connected to the upper end portion of the gate electrode layer 435.

Referring to FIG. 51, FIG. 52 and FIG. 54, a plurality of the source trenches 441 is formed in the first main surface 403 of the SiC semiconductor layer 402 in the active region 406. Each source trench 441 is formed in a region between two mutually adjacent gate trenches 431.

The source trenches 441 are respectively formed in band shapes extending along the second direction Y. The source trenches 441 are formed in a stripe shape in plan view. In regard to the first direction X, a pitch between central portions of mutually adjacent source trenches 441 may be not less than 1.5 μm and not more than 3 μm.

Each source trench 441 penetrates through the body region 426 and reaches the SiC epitaxial layer 422. A bottom wall of each source trench 441 is positioned inside the SiC epitaxial layer 422. More specifically, the bottom wall of each source trench 441 is positioned in the high concentration region 422*a*.

A depth of the source trench 441 is not less than the depth of the gate trench 431, in this embodiment. More specifically, the depth of the source trench 441 is greater than the depth of the gate trench 431. The bottom wall of the source trench 441 is positioned at the second main surface 404 side of the SiC semiconductor layer 402 with respect to the bottom wall of the gate trench 431.

The bottom wall of the source trench 441 is positioned in a region between the bottom wall of the gate trench 431 and the low concentration region 422*b*. The bottom wall of the source trench 441 may be formed parallel to the first main surface 403 of the SiC semiconductor layer 402.

Side wall of the source trench 441 may extend along the direction normal to the first main surface 403 of the SiC semiconductor layer 402. That is, the side wall of the source trench 441 may be formed substantially perpendicular to the first main surface 403 of the SiC semiconductor layer 402.

In regard to the direction normal to the first main surface 403 of the SiC semiconductor layer 402, the depth of the source trench 441 may be not less than 0.5 μm and not more than 10 μm (for example, approximately 2 μm). A ratio of the depth of the source trench 441 with respect to the depth of the gate trench 431 may be not less than 1.5. The ratio of the depth of the source trench 441 with respect to the depth of the gate trench 431 is preferably not less than 2.

A first direction width of the source trench 441 may be substantially equal to the first direction width of the gate trench 431. The first direction width of the source trench 441 may be not less than the first direction width of the gate trench 431. The first direction width of the source trench 441 may be not less than 0.1 μm and not more than 2 μm (for example, approximately 0.5 μm).

A source insulating layer 442 and a source electrode layer 443 are formed inside each source trench 441. In FIG. 51, the source insulating layer 442 and the source electrode layer 443 are shown with hatching applied for clarity.

The source insulating layer 442 may include silicon oxide. The source insulating layer 442 is formed in a film shape along inner wall surface of the source trench 441 such as to define a recessed space inside the source trench 441.

The source insulating layer 442 includes a first region 442*a* and a second region 442*b*. The first region 442*a* is formed along the side wall of the source trench 441. The second region 442*b* is formed along the bottom wall of the source trench 441. A thickness T11 of the first region 442*a* is smaller than a thickness T12 of the second region 442*b*.

A ratio T12/T11 of the thickness T12 of the second region 442*b* with respect to the thickness T11 of the first region 442*a* may be not less than 2 and not more than 5. The thickness T11 of the first region 442*a* may be not less than 0.01 μm and not more than 0.2 μm. The thickness T12 of the second region 442*b* may be not less than 0.05 μm and not more than 0.5 μm.

The thickness T11 of the first region 442*a* may be substantially equal to the thickness T1 of the first region 434*a* of the gate insulating layer 434. The thickness T12 of the second region 442*b* may be substantially equal to the thickness T2 of the second region 434*b* of the gate insulating layer 434. Obviously, a source insulating layer 442 having a uniform thickness may be formed.

The source electrode layer 443 is embedded in the source trench 441 across the source insulating layer 442. More specifically, the source electrode layer 443 is embedded in the source trench 441 such as to fill the recessed space defined by the source insulating layer 442. The source electrode layer 443 is controlled by the source voltage.

The source electrode layer 443 has an upper end portion positioned at an opening side of the source trench 441. The upper end portion of the source electrode layer 443 is formed lower than the first main surface 403 of the SiC semiconductor layer 402. The upper end portion of the source electrode layer 443 may be formed higher than the first main surface 403 of the SiC semiconductor layer 402.

The upper end portion of the source electrode layer 443 is formed in a curved shape that is recessed toward the bottom wall of the source trench 441. The upper end portion of the source electrode layer 443 may be formed parallel to the first main surface 403 of the SiC semiconductor layer 402.

The upper end portion of the source electrode layer 443 may project higher than an upper end portion of the source insulating layer 442. The upper end portion of the source electrode layer 443 may be positioned lower than the upper end portion of the source insulating layer 442. A thickness of the source electrode layer 443 may be not less than 0.5 μm and not more than 10 μm (for example, approximately 1 μm).

The source electrode layer 443 preferably contains a polysilicon having properties close to SiC in terms of material properties. Stress arising inside the SiC semiconductor layer 402 can thereby be reduced. The source electrode layer 443 preferably contains the same conductive material type as the gate electrode layer 435.

The source electrode layer 443 may include a conductive polysilicon. The source electrode layer 443 may include an n-type polysilicon or a p-type polysilicon as an example of a conductive polysilicon. In place of a conductive polysilicon, the source electrode layer 443 may include at least one of material among tungsten, aluminum, copper, aluminum alloy, or copper alloy.

The semiconductor device 401 thus has trench gate structures 451 and trench source structures 452. The trench gate structure 451 includes the gate trench 431, the gate insulating layer 434, and the gate electrode layer 435. The trench source structure 452 includes the source trench 441, the source insulating layer 442, and the source electrode layer 443.

A plurality of $n^+$-type source regions 453 is formed in regions of a surface layer portion of the body region 426 along the side wall of the gate trench 431. An n-type impurity concentration of the source regions 453 may be not less than $1.0\times10^{18}$ $cm^{-3}$ and not more than $1.0\times10^{21}$ $cm^{-3}$. The source regions 453 are formed along the side wall at one side and the side wall at another side of the gate trenches 431 in regard to the first direction X.

The source regions 453 are respectively formed in band shapes extending along the second direction Y. The source regions 453 are formed in a stripe shape in plan view. The source regions 453 are exposed from the side wall of each gate trench 431 and the side wall of the source trench 441.

A plurality of $p^+$-type contact regions 454 is formed in the surface layer portion of the first main surface 403 of the SiC semiconductor layer 402. The plurality of $p^+$-type contact regions 454 is formed along the side wall of each source trenche 441.

A p-type impurity concentration of the contact regions 454 is greater than the p-type impurity concentration of the body region 426. The p-type impurity concentration of the contact regions 454 may be not less than $1.0\times10^{18}$ $cm^{-3}$ and not more than $1.0\times10^{21}$ $cm^{-3}$.

The contact regions 454 are formed at intervals along the second direction Y. The contact regions 454 are formed at intervals along the first direction X from the gate trench 431.

The contact region 454 covers the side wall and the bottom wall of each source trench 441. A bottom portion of the contact region 454 may be formed parallel to the bottom wall of each source trench 441. More specifically, each contact region 454 integrally includes a first surface layer region 454*a*, a second surface layer region 454*b*, and an inner wall region 454*c*.

The first surface layer region 454*a* is formed along the side wall at one side of the source trench 441 in the surface layer portion of the first main surface 403 of the SiC semiconductor layer 402. The first surface layer region 454*a* extends from the side wall at one side of the source trench 441 toward the adjacent gate trench 431. The first surface layer region 454*a* may extend to an intermediate region between the source trench 441 and the gate trench 431.

The second surface layer region 454*b* is formed along the side wall at the other side of the source trench 441 in the surface layer portion of the first main surface 403 of the SiC semiconductor layer 402. The second surface layer region 454*b* extends from the side surface at the other side of the source trench 441 toward the adjacent gate trench 431. The second surface layer region 454*b* may extend to an intermediate region between the source trench 441 and the gate trench 431.

The inner wall region 454*c* is formed in a region of the SiC semiconductor layer 402 along the inner wall of the source trench 441. The inner wall region 454*c* is formed along the side wall of the source trench 441.

The inner wall region 454*c* covers corner portion connecting the side wall and the bottom wall of the source trench 441. The inner wall region 454*c* covers the bottom wall of the source trench 441 from the side wall of the source trench 441 via the corner portion. The bottom portion of each contact region 454 is formed by the inner wall region 454*c*.

A plurality of p-type deep well regions 455 is formed in the surface layer portion of the first main surface 403 of the SiC semiconductor layer 402. The deep well regions 455 are also referred to as withstand voltage adjusting regions (withstand voltage holding regions) that adjust the withstand voltage of the SiC semiconductor layer 402 in the active region 406.

The respective deep well regions 455 are formed along the inner wall of the respective source trenches 441 such as to cover the contact regions 454. The deep well region 455 is formed in a band shape extending along the source trench 441. The deep well region 455 extends along the side wall of the source trench 441.

The deep well region 455 covers the corner portion connecting the side wall and the bottom wall of the source trench 441. The deep well region 455 covers the bottom wall of the source trench 441 from the side wall of the source trench 441 via the corner portion. The deep well region 455 is continuous to the body region 426 at the side wall of the source trench 441.

The deep well region 455 has a bottom portion positioned at the second main surface 404 side of the SiC semiconductor layer 402 with respect to the bottom wall of the gate trench 431. The deep well region 455 is formed in the high concentration region 422*a* of the SiC epitaxial layer 422. The bottom portion of the deep well region 455 may be formed parallel to the bottom wall of the source trench 441.

A p-type impurity concentration of the deep well region 455 may be substantially equal to the p-type impurity concentration of the body region 426. The p-type impurity concentration of the deep well region 455 may exceed the p-type impurity concentration of the body region 426. The p-type impurity concentration of the deep well region 455 may be less than the p-type impurity concentration of the body region 426.

The p-type impurity concentration of the deep well region 455 may be not more than the p-type impurity concentration of the contact region 454. The p-type impurity concentration of the deep well region 455 may be less than the p-type impurity concentration of the contact region 454. The p-type impurity concentration of the deep well region 455 may be not less than $1.0\times10^{17}$ $cm^{-3}$ and not more than $1.0\times10^{19}$ $cm^{-3}$.

The deep well regions 455 form pn junction portions with the SiC semiconductor layer 402 (high concentration region 422*a* of the SiC epitaxial layer 422). Depletion layers spread toward regions between the mutually adjacent gate trenches 431 from the pn junction portions. The depletion layers spread toward regions at the second main surface 404 side of the SiC semiconductor layer 402 with respect to the bottom walls of the gate trenches 431.

The depletion layers spreading from the deep well regions 455 may overlap with the bottom walls of the gate trenches 431. The depletion layers spreading from the bottom portions of the deep well regions 455 may overlap with the bottom walls of the gate trenches 431.

With a semiconductor device that includes just a pn junction diode, a problem of concentration of electric field inside the SiC semiconductor layer 402 does not occur frequently due to a structure free from a trench. The deep well regions 455 make the trench gate type MISFET approach the structure of a pn junction diode.

The electric field inside the SiC semiconductor layer 402 can thereby be relaxed in the trench gate type MISFET. Narrowing a pitch between the mutually adjacent deep well regions 455 is thus effective in terms of relaxing the concentration of electric field.

Also, with the deep well regions 455 having the bottom portions at the second main surface 404 side of the SiC semiconductor layer 402 with respect to the bottom walls of the gate trenches 431, concentration of electric field with respect to the gate trenches 431 can be relaxed appropriately by the depletion layers.

Distances between the bottom portions of the respective deep well regions 455 and the second main surface 404 of the SiC semiconductor layer 402 are preferably substantially fixed. Occurrence of variation among the distances between the bottom portions of the respective deep well regions 455 and the second main surface 404 of the SiC semiconductor layer 402 can thereby be suppressed.

The withstand voltage (for example, electrostatic breakdown strength) of the SiC semiconductor layer 402 can thus be suppressed from being restricted by the configuration of the deep well regions 455 and therefore improvement of the withstand voltage can be achieved appropriately.

The high concentration region 422*a* of the SiC epitaxial layer 422 is interposed in the regions between the mutually adjacent deep well regions 455, in this embodiment. A JFET (junction field effect transistor) resistance can thus be reduced in the regions between the mutually adjacent deep well regions 455.

Further, the bottom portions of the deep well regions 455 are positioned inside the high concentration region 422*a* of the SiC epitaxial layer 422, in this embodiment. Current paths can thereby be expanded in a lateral direction parallel to the first main surface 403 of the SiC semiconductor layer 402 from the bottom portions of the deep well regions 455. A current spread resistance can thereby be reduced. The low concentration region 422*b* of the SiC epitaxial layer 422 increases the withstand voltage of the SiC semiconductor layer 402 in such a structure.

The deep well regions 455 can be formed conformally to the inner wall of the source trenches 441 by forming the source trenches 441. Occurrence of variation among the depths of the respective deep well regions 455 can thereby be suppressed appropriately. Also, the respective deep well regions 455 can be formed appropriately in comparatively deep regions of the SiC semiconductor layer 402 by using the inner wall of the source trenches 441.

Referring to FIG. 51 and FIG. 53, p-type peripheral edge deep well region 459 is formed in the peripheral edge portion of the active region 406. The peripheral edge deep well region 459 is electrically connected to the deep well regions 455.

The peripheral edge deep well region 459 forms an equal potential with the deep well regions 455. The peripheral edge deep well region 459 is formed integral to the deep well regions 455, in this embodiment.

More specifically, the peripheral edge deep well region 459 is formed in a region of the peripheral edge portion of the active region 406 along the inner wall of the contact trench portions 431*b* of the gate trenches 431.

The peripheral edge deep well region 459 extends along side wall of a contact trench portion 431*b* and passes along edge portion to cover a bottom wall of the contact trench portion 431*b*. The peripheral edge deep well region 459 is connected to the body region 426 in a region at an opening side of the contact trench portion 431*b*.

The peripheral edge deep well region 459 has a bottom portion positioned at the second main surface 404 side of the SiC semiconductor layer 402 with respect to the bottom wall of the contact trench portion 431*b* of the gate trench 431. The peripheral edge deep well region 459 is formed in the high concentration region 422*a* of the SiC epitaxial layer 422.

The peripheral edge deep well region 459 overlaps with the gate wiring layer 436 in plan view. That is, the peripheral edge deep well region 459 faces the gate wiring layer 436 across the gate insulating layer 434 (third region 434*c*).

The peripheral edge deep well region 459 includes a lead-out portion 459*a* lead out from the contact trench portion 431*b* of the gate trench 431 to the active trench portion 431*a* of the gate trench 431.

The lead-out portion 459*a* of the peripheral edge deep well region 459 extends along side wall of the active trench portion 431*a* and passes along edge portion to cover a bottom wall of the active trench portion 431*a*. The lead-out portion 459*a* of the peripheral edge deep well region 459 is connected to the body region 426 in a region at an opening side of the active trench portion 431*a*.

The lead-out portion 459*a* of the peripheral edge deep well region 459 are connected to the deep well region 455 via the body region 426. That is, the peripheral edge deep well region 459 is electrically connected to the deep well region 455 via the body region 426.

The lead-out portion 459*a* of the peripheral edge deep well region 459 has a bottom portion positioned at the second main surface 104 side of the SiC semiconductor layer 402 with respect to the bottom wall of the active trench portion 431*a*. The lead-out portion 459*a* of the peripheral edge deep well region 459 is formed in the high concentration region 422*a* of the SiC epitaxial layer 422.

A p-type impurity concentration of the peripheral edge deep well region 459 may be substantially equal to the p-type impurity concentration of the body region 426. The p-type impurity concentration of the peripheral edge deep well region 459 may exceed the p-type impurity concentration of the body region 426. The p-type impurity concentration of the peripheral edge deep well region 459 may be less than the p-type impurity concentration of the body region 426.

The p-type impurity concentration of the peripheral edge deep well region 459 may be substantially equal to the p-type impurity concentration of the deep well region 455. The p-type impurity concentration of the peripheral edge deep well region 459 may exceed the p-type impurity concentration of the deep well region 455. The p-type impurity concentration of the peripheral edge deep well region 459 may be less than the p-type impurity concentration of the deep well region 455.

The p-type impurity concentration of the peripheral edge deep well region 459 may be not more than the p-type impurity concentration of the contact region 454. The p-type impurity concentration of the peripheral edge deep well region 459 may be less than the p-type impurity concentration of the contact region 454. The p-type impurity concentration of the peripheral edge deep well region 459 may be not less than $1.0\times10^{17}$ $cm^{-3}$ and not more than $1.0\times10^{19}$ $cm^{-3}$.

Source sub-trenches 456 each in communication with the source trench 441 are formed in regions of the first main surface 403 of the SiC semiconductor layer 402 along the upper end portions of the source electrode layers 443. The source sub-trench 456 forms a portion of the side wall of the source trench 441.

The source sub-trench 456 is formed in an endless shape (quadrilateral annular shape) surrounding the upper end portions of the source electrode layer 443 in plan view, in this embodiment. That is, the source sub-trench 456 borders the upper end portion of the source electrode layer 443.

The source sub-trench 456 is formed by digging into a portion of the source insulating layer 442. More specifically, the source sub-trench 456 is formed by digging into the upper end portion of the source insulating layer 442 and the upper end portion of the source electrode layer 443 from the first main surface 403 of the SiC semiconductor layer 402.

The upper end portion of the source electrode layer 443 has a shape that is constricted with respect to a lower end portion of the source electrode layer 443. The lower end portion of the source electrode layer 443 is a portion of the source electrode layer 443 that is positioned at the bottom wall side of the source trench 441. A first direction width of the upper end portion of the source electrode layer 443 may be less than a first direction width of the lower end portion of the source electrode layer 443.

The source sub-trench 456 is formed in a tapered shape having a bottom area being smaller than an opening area in sectional view. A bottom wall of the source sub-trench 456 may be formed in a shape that is convexly curved toward the second main surface 404 of the SiC semiconductor layer 402.

The source region 453, the contact region 454, the source insulating layer 442, and the source electrode layer 443 are exposed from an inner wall of the source sub-trench 456. At least the first region 442*a* of the source insulating layer 442 is exposed from the bottom wall of the source sub-trench 456. An upper end portion of the first region 442*a* of the source insulating layer 442 is positioned lower than the first main surface 403 of the SiC semiconductor layer 402.

An opening edge portion 457 of each source trench 441 includes an inclining portion 458 that inclines downwardly from the first main surface 403 of the SiC semiconductor layer 402 toward an inner side of the source trench 441. The opening edge portion 457 of the source trench 441 is a corner portion connecting the first main surface 403 of the SiC semiconductor layer 402 and the side wall of the source trench 441. The inclining portion 458 of the source trench 441 is formed by the source sub-trench 456.

The inclining portion 458 is formed in a shape that is concavely curved toward an inner side of the SiC semiconductor layer 402, in this embodiment. The inclining portion 458 may be formed in a shape that is convexly curved toward the inner side of the source sub-trench 456.

An electric field at the opening edge portion 457 of the source trench 441 is dispersed along the inclining portion 458. Concentration of electric field with respect to the opening edge portion 457 of the source trench 441 can thereby be relaxed.

Referring to FIG. 55 and FIG. 56, the active region 406 has an active main surface 461 forming a portion of the first main surface 403 of the SiC semiconductor layer 402. The outer region 407 has an outer main surface 462 forming a portion of the first main surface 403 of the SiC semiconductor layer 402. The outer main surface 462 is connected to the side surfaces 405A to 405D of the SiC semiconductor layer 402, in this embodiment.

The outer main surface 462 is positioned at the second main surface 404 side of the SiC semiconductor layer 402 with respect to the active main surface 461. The outer region 407 is formed by digging into the first main surface 403 of the SiC semiconductor layer 402 toward the second main surface 404 side, in this embodiment. The outer main surface 462 is thus formed in a region that is recessed toward the second main surface 404 side of the SiC semiconductor layer 402 with respect to the active main surface 461.

The outer main surface 462 may be positioned at the second main surface 404 side of the SiC semiconductor layer 402 with respect to the bottom wall of the gate trench 431. The outer main surface 462 may be formed at a depth position substantially equal to the bottom wall of the source trench 441. That is, the outer main surface 462 may be positioned on substantially the same plane as the bottom wall of the source trench 441.

A distance between the outer main surface 462 and the second main surface 404 of the SiC semiconductor layer 402 may be substantially equal to a distance between the bottom wall of the source trench 441 and the second main surface 404 of the SiC semiconductor layer 402.

The outer main surface 462 may be positioned at the second main surface 404 side of the SiC semiconductor layer 402 with respect to the bottom wall of the source trench 441. The outer main surface 462 may be positioned in a range of not less than 0 μm and not more than 1 μm to the second main surface 404 side of the SiC semiconductor layer 402 with respect to the bottom wall of the source trench 441.

The SiC epitaxial layer 422 is exposed from the outer main surface 462. More specifically, the high concentration region 422*a* of the SiC epitaxial layer 422 is exposed from the outer main surface 462 of the outer region 407. The outer main surface 462 faces the low concentration region 422*b* of the SiC epitaxial layer 422 across the high concentration region 422*a* of the SiC epitaxial layer 422.

The active region 406 is defined as a mesa by the outer region 407, in this embodiment. That is, the active region 406 is formed as an active mesa 463 of a mesa shape projecting further upward than the outer region 407.

The active mesa 463 includes active side wall 464 connecting the active main surface 461 and the outer main surface 462. The first main surface 403 of the SiC semiconductor layer 402 is formed by the active main surface 461, the outer main surface 462, and the active side wall 464.

The active side wall 464 extends in a direction substantially perpendicular to the active main surface 461 (outer main surface 462), in this embodiment. The active side wall 464 defines a boundary region between the active region 406 and the outer region 407.

The SiC epitaxial layer 422 is exposed from the active side wall 464. More specifically, the high concentration region 422*a* of the SiC epitaxial layer 422 is exposed from the active side wall 464.

At least the body region 426 is exposed from a region of the active side wall 464 at the active main surface 461 side. In FIG. 55 and FIG. 56, a configuration example where the body region 426 and the source region 453 are exposed from the active side wall 464 is shown.

In the outer region 407, the $p^+$-type diode region 471, the p-type outer deep well region 472, and the p-type field limit structure 473 are formed in a surface layer portion at the first main surface 403 (outer main surface 462) of the SiC semiconductor layer 402.

The diode region 471 is formed in a region of the outer region 407 between the active side wall 464 and the side surfaces 405A to 405D of the SiC semiconductor layer 402. The diode region 471 is formed across intervals from the active side wall 464 and the side surfaces 405A to 405D.

The diode region 471 extends along the active region 406 in plan view. The diode region 471 is formed in an endless shape (quadrilateral annular shape) surrounding the active region 406 in plan view, in this embodiment.

The diode region 471 overlaps with the source routing wiring 414 in plan view. The diode region 471 is electrically connected to the source routing wiring 414. The diode region 471 forms a portion of the avalanche current absorbing structure.

The diode region 471 forms a pn junction portion with the SiC semiconductor layer 402. More specifically, the diode region 471 is positioned inside the SiC epitaxial layer 422. The diode region 471 thus forms the pn junction portion with the SiC epitaxial layer 422.

Even more specifically, the diode region 471 is positioned inside the high concentration region 422*a* of the SiC epitaxial layer 422. The diode region 471 thus forms the pn junction portion with the high concentration region 422*a* of the SiC epitaxial layer 422. A pn junction diode 474 having the diode region 471 as an anode and the SiC semiconductor layer 402 as a cathode is thereby formed.

An entirety of the diode region 471 is positioned at the second main surface 404 side of the SiC semiconductor layer 402 with respect to the bottom wall of the gate trench 431. A bottom portion of the diode region 471 is positioned at the second main surface 404 side of the SiC semiconductor layer 402 with respect to the bottom wall of the source trench 441.

The bottom portion of the diode region 471 may be formed at a depth position substantially equal to the bottom portion of the contact region 454. That is, the bottom portion of the diode region 471 may be positioned on substantially the same plane as the bottom portion of the contact region 454.

A distance between the bottom portion of the diode region 471 and the second main surface 404 of the SiC semiconductor layer 402 may be substantially equal to a distance between the bottom portion of the contact region 454 and the second main surface 404 of the SiC semiconductor layer 402.

The bottom portion of the diode region 471 may be positioned at the second main surface 404 side of the SiC semiconductor layer 402 with respect to the bottom portion of the contact region 454. The bottom portion of the diode region 471 may be positioned in a range of not less than 0 μm and not more than 1 μm to the second main surface 404 side of the SiC semiconductor layer 402 with respect to the bottom portion of the contact region 454.

A p-type impurity concentration of the diode region 471 is substantially equal to the p-type impurity concentration of the contact regions 454. The p-type impurity concentration of the diode region 471 is greater than the p-type impurity concentration of the body region 426. The p-type impurity concentration of the diode region 471 may be not less than $1.0\times10^{18}$ $cm^{-3}$ and not more than $1.0\times10^{21}$ $cm^{-3}$.

The outer deep well region 472 is formed in a region between the active side wall 464 and the diode region 471 in plan view. The outer deep well region 472 is formed across intervals toward the diode region 471 side from the active side wall 464, in this embodiment. The outer deep well region 472 is also referred to as a withstand voltage adjusting region (withstand voltage holding region) that adjusts the withstand voltage of the SiC semiconductor layer 402 in the outer region 407.

The outer deep well region 472 extends along the active region 406 in plan view. The outer deep well region 472 is formed in an endless shape (quadrilateral annular shape) surrounding the active region 406 in plan view, in this embodiment.

A bottom portion of the outer deep well region 472 is positioned at the second main surface 404 side of the SiC semiconductor layer 402 with respect to the bottom portion of the diode region 471. An outer peripheral edge of the outer deep well region 472 covers the diode region 471 from the second main surface 404 side of the SiC semiconductor layer 402, in this embodiment. The outer deep well region 472 may overlap with the source routing wiring 414 in plan view.

The outer deep well region 472 is electrically connected to the source routing wiring 414 via the diode region 471. The outer deep well region 472 may form a portion of the pn junction diode 474. The outer deep well region 472 may form a portion of the avalanche current absorbing structure.

An entirety of the outer deep well region 472 is positioned at the second main surface 404 side of the SiC semiconductor layer 402 with respect to the bottom wall of the gate trench 431. The bottom portion of the outer deep well region 472 is positioned at the second main surface 404 side of the SiC semiconductor layer 402 with respect to the bottom wall of the source trench 441.

The bottom portion of the outer deep well region 472 may be formed at a depth position substantially equal to the bottom portion of deep well region 455. That is, the bottom portion of the outer deep well region 472 may be positioned on substantially the same plane as the bottom portion of the deep well region 455.

A distance between the bottom portion of the outer deep well region 472 and the outer main surface 462 may be substantially equal to a distance between the bottom portion of the deep well region 455 and the bottom wall of the source trench 441. A distance between the bottom portion of the outer deep well region 472 and the second main surface 404 of the SiC semiconductor layer 402 may be substantially equal to a distance between the bottom portion of the deep well region 455 and the second main surface 404 of the SiC semiconductor layer 402.

Variation can thereby be suppressed from occurring between the distance between the bottom portion of the outer deep well region 472 and the second main surface 404 of the SiC semiconductor layer 402 and the distance between the bottom portion of the deep well region 455 and the second main surface 404 of the SiC semiconductor layer 402.

The withstand voltage (for example, electrostatic breakdown strength) of the SiC semiconductor layer 402 can thus be suppressed from being restricted by the configuration of the outer deep well region 472 and the configuration of the deep well region 455 and therefore improvement of the withstand voltage can be achieved appropriately.

The bottom portion of the outer deep well region 472 may be positioned at the second main surface 404 side of the SiC semiconductor layer 402 with respect to the bottom portion of the deep well region 455. The bottom portion of the outer deep well region 472 may be positioned in a range of not less than 0 μm and not more than 1 μm to the second main surface 404 side of the SiC semiconductor layer 402 with respect to the bottom portion of the deep well region 455.

A p-type impurity concentration of the outer deep well region 472 may be not more than the p-type impurity concentration of the diode region 471. The p-type impurity concentration of the outer deep well region 472 may be less than the p-type impurity concentration of the diode region 471.

The p-type impurity concentration of the outer deep well region 472 may be substantially equal to the p-type impurity concentration of the deep well region 455. The p-type impurity concentration of the outer deep well region 472 may be substantially equal to the p-type impurity concentration of the body region 426. The p-type impurity concentration of the outer deep well region 472 may be not less than $1.0\times10^{17}$ $cm^{-3}$ and not more than $1.0\times10^{19}$ $cm^{-3}$.

The p-type impurity concentration of the outer deep well region 472 may exceed the p-type impurity concentration of the body region 426. The p-type impurity concentration of the outer deep well region 472 may be less than the p-type impurity concentration of the body region 426.

The p-type impurity concentration of the outer deep well region 472 may be not more than the p-type impurity concentration of the contact region 454. The p-type impurity concentration of the outer deep well region 472 may be less than the p-type impurity concentration of the contact region 454.

The field limit structure 473 is formed in a region between the diode region 471 and the side surfaces 405A to 405D of the SiC semiconductor layer 402 in plan view. The field limit structure 473 is formed across intervals toward the diode region 471 side from the side surfaces 405A to 405D, in this embodiment.

The field limit structure 473 includes one or a plurality of (for example, not less than two and not more than twenty) field limit regions. The field limit structure 473 includes a field limit region group having a plurality of (five) field limit regions 475A, 475B, 475C, 475D, and 475E, in this embodiment.

The field limit regions 475A to 475E are formed in that order at intervals along a direction away from the diode region 471. The field limit regions 475A to 475E respectively extend as a band shape along the peripheral edge of the active region 406 in plan view.

More specifically, the field limit regions 475A to 475E are respectively formed in an endless shape (quadrilateral annular shape) surrounding the active region 406 in plan view. Each of the field limit regions 475A to 475E is also referred to as an FLR (field limiting ring).

Bottom portions of the field limit regions 475A to 475E are positioned at the second main surface 404 side of the SiC semiconductor layer 402 with respect to the bottom portion of the diode region 471, in this embodiment.

The field limit region 475A at an innermost side among the field limit regions 475A to 475E covers the diode region 471 from the second main surface 404 side of the SiC semiconductor layer 402, in this embodiment. The field limit region 475A may be overlapped in plan view with the source routing wiring 414 described above.

The field limit region 475A is electrically connected to the source routing wiring 414 via the diode region 471. The field limit region 475A may form a portion of the pn junction diode 474. The field limit region 475A may form a portion of the avalanche current absorbing structure.

Entireties of the field limit regions 475A to 475E are positioned at the second main surface 404 side of the SiC semiconductor layer 402 with respect to the bottom wall of the gate trench 431. The bottom portions of the field limit regions 475A to 475E are positioned at the second main surface 404 side of the SiC semiconductor layer 402 with respect to the bottom wall of the source trench 441.

The field limit regions 475A to 475E may be formed at a depth position substantially equal to the deep well region 455 (outer deep well region 472). That is, the bottom portions of the field limit regions 475A to 475E may be positioned on substantially the same plane as the bottom portion of the deep well region 455 (outer deep well region 472).

The bottom portions of the field limit regions 475A to 475E may be positioned at the outer main surface 462 side with respect to the bottom portion of the deep well region 455 (outer deep well region 472). The bottom portions of the field limit regions 475A to 475E may be positioned at the second main surface 404 side of the SiC semiconductor layer 402 with respect to the bottom portion of the deep well region 455 (outer deep well region 472).

Widths between mutually adjacent field limit regions 475A to 475E may differ from each other. The widths between mutually adjacent field limit regions 475A to 475E may increase in a direction away from the active region 406. The widths between mutually adjacent field limit regions 475A to 475E may decrease in the direction away from the active region 406.

Depths of the field limit regions 475A to 475E may differ from each other. The depths of the field limit regions 475A to 475E may decrease in the direction away from the active region 406. The depths of the field limit regions 475A to 475E may increase in the direction away from the active region 406.

A p-type impurity concentration of the field limit regions 475A to 475E may be not more than the p-type impurity concentration of the diode region 471. The p-type impurity concentration of the field limit regions 475A to 475E may be less than the p-type impurity concentration of the diode region 471.

The p-type impurity concentration of the field limit regions 475A to 475E may be not more than the p-type impurity concentration of the outer deep well region 472. The p-type impurity concentration of the field limit regions 475A to 475E may be less than the p-type impurity concentration of the outer deep well region 472.

The p-type impurity concentration of the field limit regions 475A to 475E may be not less than the p-type impurity concentration of the outer deep well region 472. The p-type impurity concentration of the field limit regions 475A to 475E may be greater than the p-type impurity concentration of the outer deep well region 472.

The p-type impurity concentration of the field limit regions 475A to 475E may be not less than $1.0\times10^{15}$ $cm^{-3}$ and not more than $1.0\times10^{18}$ $cm^{-3}$. Preferably, the p-type impurity concentration of the diode region 471>the p-type impurity concentration of the outer deep well region 472>the p-type impurity concentration of the field limit regions 475A to 475E.

The field limit structure 473 relaxes concentration of electric field in the outer region 407. The number, widths, depths, p-type impurity concentration, etc., of the field limit regions may take on any of various values in accordance with the electric field to be relaxed.

An outer insulating layer 481 is formed on the first main surface 403 of the SiC semiconductor layer 402 in the outer region 407. The outer insulating layer 481 selectively covers the diode region 471, the outer deep well region 472, and the field limit structure 473 in the outer region 407.

The outer insulating layer 481 is formed in a film shape along the active the outer main surface 462 and side wall 464. The outer insulating layer 481 is continuous to the gate insulating layer 434 on the active main surface 461. More specifically, the outer insulating layer 481 is continuous to the third region 434*c* of the gate insulating layer 434.

The outer insulating layer 481 may include silicon oxide. The outer insulating layer 481 may include another insulating film such as silicon nitride, etc. The outer insulating layer 481 is made of the same insulating material type as the gate insulating layer 434, in this embodiment.

The outer insulating layer 481 includes a first region 481*a* and a second region 481*b*. The first region 481*a* of the outer insulating layer 481 covers the active side wall 464. The second region 481*b* of the outer insulating layer 481 covers the outer main surface 462.

A thickness of the second region 481*b* of the outer insulating layer 481 may be not more than a thickness of the first region 481*a* of the outer insulating layer 481. The thickness of the second region 481*b* of the outer insulating layer 481 may be less than the thickness of the first region 481*a* of the outer insulating layer 481.

The thickness of the first region 481*a* of the outer insulating layer 481 may be substantially equal to the thickness of the first region 434*a* of the gate insulating layer 434. The thickness of the second region 481*b* of the outer insulating layer 481 may be substantially equal to the thickness of the third region 434*c* of the gate insulating layers 434. Obviously, an outer insulating layer 481 having a uniform thickness may be formed.

Referring to FIG. 55 and FIG. 56, the semiconductor device 401 further includes the side wall structure 482 covering the active side wall 464. The side wall structure 482 protects and reinforces the active mesa 463 from the outer region 407 side.

The side wall structure 482 also forms a level difference moderating structure that moderates a level difference 483 between the active main surface 461 and the outer main surface 462. In a case in which an upper layer structure (covering layer) covering the boundary region between the active region 406 and the outer region 407 is formed, the upper layer structure covers the side wall structure 482. The side wall structure 482 improves flatness of the upper layer structure.

The side wall structure 482 may have an inclining portion 484 that inclines downwardly from the active main surface 461 toward the outer main surface 462. The level difference 483 can be moderated appropriately by the inclining portion 484. The inclining portion 484 of the side wall structure 482 may be formed in a shape that is concavely curved toward the SiC semiconductor layer 402 side.

The side wall structure 482 is formed self-alignigly with respect to the active main surface 461. More specifically, the side wall structure 482 is formed along the active side wall 464. The side wall structure 482 is formed in an endless shape (quadrilateral annular shape) surrounding the active region 406 in plan view, in this embodiment.

The side wall structure 482 may include a conductive material. The side wall structure 482 may include the same conductive material type as the gate electrode layer 435. The side wall structure 482 may include the same conductive material type as the source electrode layer 443.

The side wall structure 482 may include an insulating material. In this case, an insulating property of the active region 406 with respect to the outer region 407 can be improved by the side wall structure 482. The side wall structure 482 includes a polysilicon. The side wall structure 482 may include an n-type polysilicon or a p-type polysilicon, in this embodiment.

Referring to FIG. 52 to FIG. 56, the interlayer insulating layer 491 is formed on the first main surface 403 of the SiC semiconductor layer 402. The interlayer insulating layer 491 selectively covers the active region 406 and the outer region 407. The interlayer insulating layer 491 is formed in a film shape along the active main surface 461 and the outer main surface 462.

The interlayer insulating layer 491 selectively covers the trench gate structures 451, the gate wiring layer 436, and the trench source structures 452 in the active region 406. The interlayer insulating layer 491 selectively covers the diode region 471, the outer deep well region 472, and the field limit structure 473 in the outer region 407.

The interlayer insulating layer 491 is formed along an outer surface (inclining portion 484) of the side wall structure 482 in the boundary region between the active region 406 and the outer region 407. The interlayer insulating layer 491 forms a portion of the upper layer structure covering the side wall structure 482. A peripheral edge portion of the interlayer insulating layer 491 may be formed flush with the side surfaces 405A to 405D of the SiC semiconductor layer 402.

The interlayer insulating layer 491 may include silicon oxide or silicon nitride. The interlayer insulating layer 491 may include PSG (phosphor silicate glass) and/or BPSG (boron phosphor silicate glass) as an example of silicon oxide.

A gate contact hole 492, source contact holes 493, and a diode contact hole 494 are formed in the interlayer insulating layer 491. The anchor hole 495 is also formed in the interlayer insulating layer 491.

The gate contact hole 492 exposes the gate wiring layer 436 in the active region 406. The gate contact hole 492 may be formed in a band shape along the gate wiring layer 436. An opening edge portion of the gate contact hole 492 is formed in a shape that is convexly curved toward an interior of the gate contact hole 492.

The source contact holes 493 expose the source regions 453, the contact regions 454, and the trench source structures 452 in the active region 406. The source contact holes 493 may be formed in band shapes along the trench source structures 452, etc. An opening edge portion of the source contact hole 493 is formed in a shape that is convexly curved toward an interior of the source contact hole 493.

The diode contact hole 494 exposes the diode region 471 in the outer region 407. The diode contact hole 494 may be formed in a band shape (more specifically, an endless shape) extending along the diode region 471.

The diode contact hole 494 may expose the outer deep well region 472 and/or the field limit structure 473. An opening edge portion of the diode contact hole 494 is formed in a shape that is convexly curved toward an interior of the diode contact hole 494.

The anchor hole 495 is formed by digging into the interlayer insulating layer 491 in the outer region 407. The anchor hole 495 is formed in a region between the diode region 471 and the side surfaces 405A to 405D of the SiC semiconductor layer 402 in plan view. More specifically, the anchor hole 495 is formed in a region between the field limit structure 473 and the side surfaces 405A to 405D of the SiC semiconductor layer 402 in plan view.

The anchor hole 495 exposes the first main surface 403 (outer main surface 462) of the SiC semiconductor layer 402. An opening edge portion of the anchor hole 495 is formed in a shape that is convexly curved toward an interior of the anchor hole 495.

Referring to FIG. 50, the anchor hole 495 extends as a band shape along the active region 406 in plan view. The anchor hole 495 is formed in an endless shape (quadrilateral annular shape) surrounding the active region 406 in plan view, in this embodiment.

The main surface gate electrode 408 and the main surface source electrode 409 are formed on the interlayer insulating layer 491. The main surface gate electrode 408 and the main surface source electrode 409 each have a laminated structure that includes a barrier electrode layer 501 and a main electrode layer 502 laminated in that order from the first main surface 403 side of the SiC semiconductor layer 402.

The barrier electrode layer 501 may have a single layer structure that includes a titanium layer or a titanium nitride layer. The barrier electrode layer 501 may have a laminated structure including a titanium layer and a titanium nitride layer that are laminated in that order from the first main surface 403 side of the SiC semiconductor layer 402.

A thickness of the main electrode layer 502 is greater than a thickness of the barrier electrode layer 501. The main electrode layer 502 includes a conductive material having a lower resistance value than a resistance value of the barrier electrode layer 501. The main electrode layer 502 may include at least one of material among aluminum, copper, an aluminum alloy, or a copper alloy.

The main electrode layer 502 may include at least one of material among an aluminum-silicon alloy, an aluminum-silicon-copper alloy, or an aluminum-copper alloy. The main electrode layer 502 contains an aluminum-silicon-copper alloy, in this embodiment.

The gate finger 411 of the main surface gate electrode 408 enters into the gate contact hole 492 from above the interlayer insulating layer 491. The gate finger 411 is electrically connected to the gate wiring layer 436 inside the gate contact hole 492. An electrical signal from the gate pad 410 is thereby transmitted to the gate electrode layer 435 via the gate finger 411.

The source pad 413 of the main surface source electrode 409 enters into the source contact holes 493 and the source sub-trenches 456 from above the interlayer insulating layer 491. The source pad 413 is electrically connected to the source regions 453, the contact regions 454, and the source electrode layers 443 inside the source contact holes 493 and the source sub-trenches 456.

The source electrode layer 443 may be formed using partial region of the source pad 413. That is, the source electrode layer 443 may be formed by portion of the source pad 413 entering into the source trench 441.

The source routing wiring 414 of main surface source electrode 409 enters into the diode contact hole 494 from above the interlayer insulating layer 491. The source routing wiring 414 is electrically connected to the diode region 471 inside the diode contact hole 494.

The source connection portion 415 of the main surface source electrode 409 crosses the side wall structure 482 from the active region 406 and is lead out to the outer region 407. The source connection portion 415 forms a portion of the upper layer structure covering the side wall structure 482.

A passivation layer 503 is formed on the interlayer insulating layer 491. The passivation layer 503 may include silicon oxide and/or silicon nitride. The passivation layer 503 has a single layer structure that includes a silicon nitride layer, in this embodiment.

The passivation layer 503 is formed in a film shape along the interlayer insulating layer 491. The passivation layer 503 selectively covers the active region 406 and the outer region 407 via the interlayer insulating layer 491.

The passivation layer 503 crosses the side wall structure 482 from the active region 406 and is lead out to the outer region 407. The passivation layer 503 forms a portion of the upper layer structure covering the side wall structure 482.

A gate sub-pad opening 504 and a source sub-pad opening 505 (see also FIG. 50) are formed in the passivation layer 503. The gate sub-pad opening 504 exposes the gate pad 410. The source sub-pad opening 505 exposes the source pad 413.

Referring to FIG. 55, the passivation layer 503 enters into the anchor hole 495 from above the interlayer insulating layer 491 in the outer region 407. The passivation layer 503 is connected to the first main surface 403 (outer main surface 462) of the SiC semiconductor layer 402 inside the anchor hole 495. A recess recessed in conformance to the anchor hole 495 is formed in a region of an outer surface of the passivation layer 503 positioned above the anchor hole 495.

A peripheral edge portion of the passivation layer 503 may be formed flush with the side surfaces 405A to 405D of the SiC semiconductor layer 402. The peripheral edge portion of the passivation layer 503 may be formed in an inner region across intervals from the side surfaces 405A to 405D of the SiC semiconductor layer 402. That is, the peripheral edge portion of the passivation layer 503 may expose the interlayer insulating layer 491.

The peripheral edge portion of the passivation layer 503 may form a portion of dicing street in a process of cutting out the semiconductor device 401 from a single SiC semiconductor wafer. It becomes unnecessary to physically cut the passivation layer 503 by exposing the first main surface 403 of the SiC semiconductor layer 402 from the peripheral edge portion of the passivation layer 503. The semiconductor device 401 can thus be cut out smoothly from a single SiC semiconductor wafer.

The resin layer 416 described above is formed on the passivation layer 503. The resin layer 416 is formed in a film shape along the passivation layer 503. The resin layer 416 selectively covers the active region 406 and the outer region 407 across the passivation layer 503 and the interlayer insulating layer 491.

The resin layer 416 crosses the side wall structure 482 from the active region 406 and is lead out to the outer region 407. The resin layer 416 forms a portion of the upper layer structure covering the side wall structure 482.

The gate pad opening 417 of the resin layer 416 is in communication with the gate sub-pad opening 504 of the passivation layer 503. Inner wall of the gate pad opening 417 of the resin layer 416 is positioned at an outer side of inner wall of the gate sub-pad opening 504 of the passivation layer 503, in this embodiment.

The inner wall of the gate pad opening 417 of the resin layer 416 may be formed flush with the inner wall of the gate sub-pad opening 504 of the passivation layer 503. The inner wall of the gate pad opening 417 of the resin layer 416 may be positioned at an inner side of the inner wall of the gate sub-pad opening 504 of the passivation layer 503. That is, the resin layer 416 may cover the inner wall of the gate sub-pad opening 504.

The source pad opening 418 of the resin layer 416 is in communication with the source sub-pad opening 505 of the passivation layer 503. The inner wall of the gate pad opening 417 of the resin layer 416 is positioned at an outer side of the inner wall of the gate sub-pad opening 504 of the passivation layer 503, in this embodiment.

The inner wall of the source pad opening 418 of the resin layer 416 may be formed flush with the inner wall of the source sub-pad opening 505 of the passivation layer 503. The inner wall of the source pad opening 418 of the resin layer 416 may be positioned at an inner side of the inner wall of the source sub-pad opening 505 of the passivation layer 503. That is, the resin layer 416 may cover the inner wall of the source sub-pad opening 505.

Referring to FIG. 55, the resin layer 416 has an anchor portion entering into the recess of the passivation layer 503 in the outer region 407. An anchor structure arranged to improve a connection strength of the resin layer 416 is thus formed in the outer region 407.

The anchor structure includes an uneven structure formed at the first main surface 403 of the SiC semiconductor layer 402 in the outer region 407. More specifically, the uneven structure (anchor structure) includes unevenness formed using the interlayer insulating layer 491 covering the outer main surface 462. Even more specifically, the uneven structure (anchor structure) includes the anchor hole 495 formed in the interlayer insulating layer 491.

The resin layer 416 is engaged with the anchor hole 495. The resin layer 416 is engaged with the anchor hole 495 via the passivation layer 503, in this embodiment. The connection strength of the resin layer 416 with respect to the first main surface 403 of the SiC semiconductor layer 402 can thereby be improved and therefore peeling of the resin layer 416 can be suppressed.

Other configurations of the gate trenches 431 shall now be described. As shown in FIG. 57A to FIG. 57E, the gate trenches 431 may take on any of various configurations. The configurations shown in FIG. 57A to FIG. 57E are configurations obtained by adjusting treatment conditions in a step of forming the gate trenches 431.

Figure 57A:
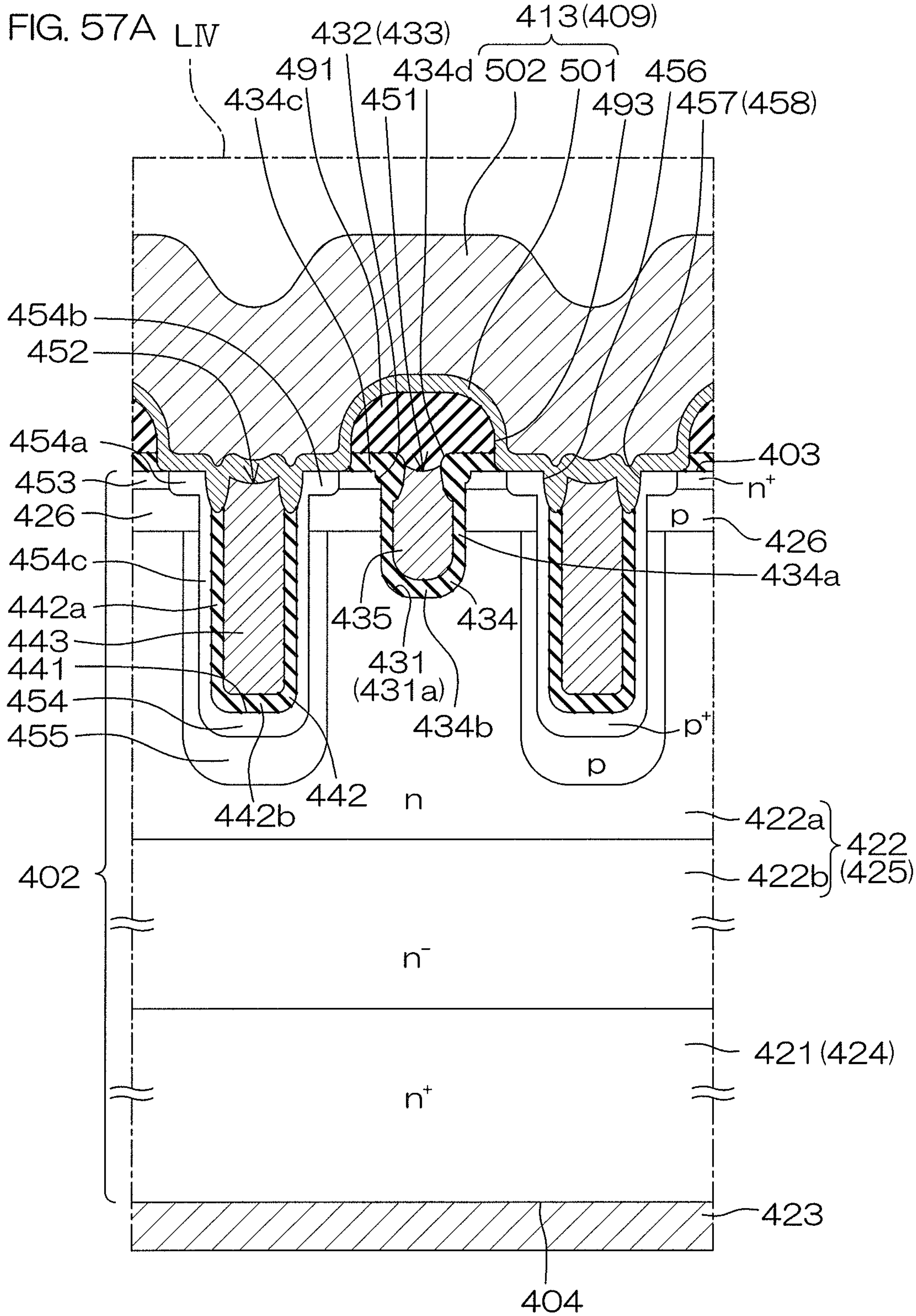
FIG. 57A is a sectional view of a region corresponding to FIG. 54 and is a sectional view of a second configuration example of the gate trench.

FIG. 57A is a sectional view of a region corresponding to FIG. 54 and is a sectional view of a second configuration example of a gate trench 431. In the following, for structures described already, the same symbols shall be provided and description thereof shall be omitted, and just newly appearing structures shall be described.

Referring to FIG. 57A, the bottom wall of the gate trench 431 may be formed in a shape that is convexly curved toward the second main surface 404 side of the SiC semiconductor layer 402.

Figure 57B:
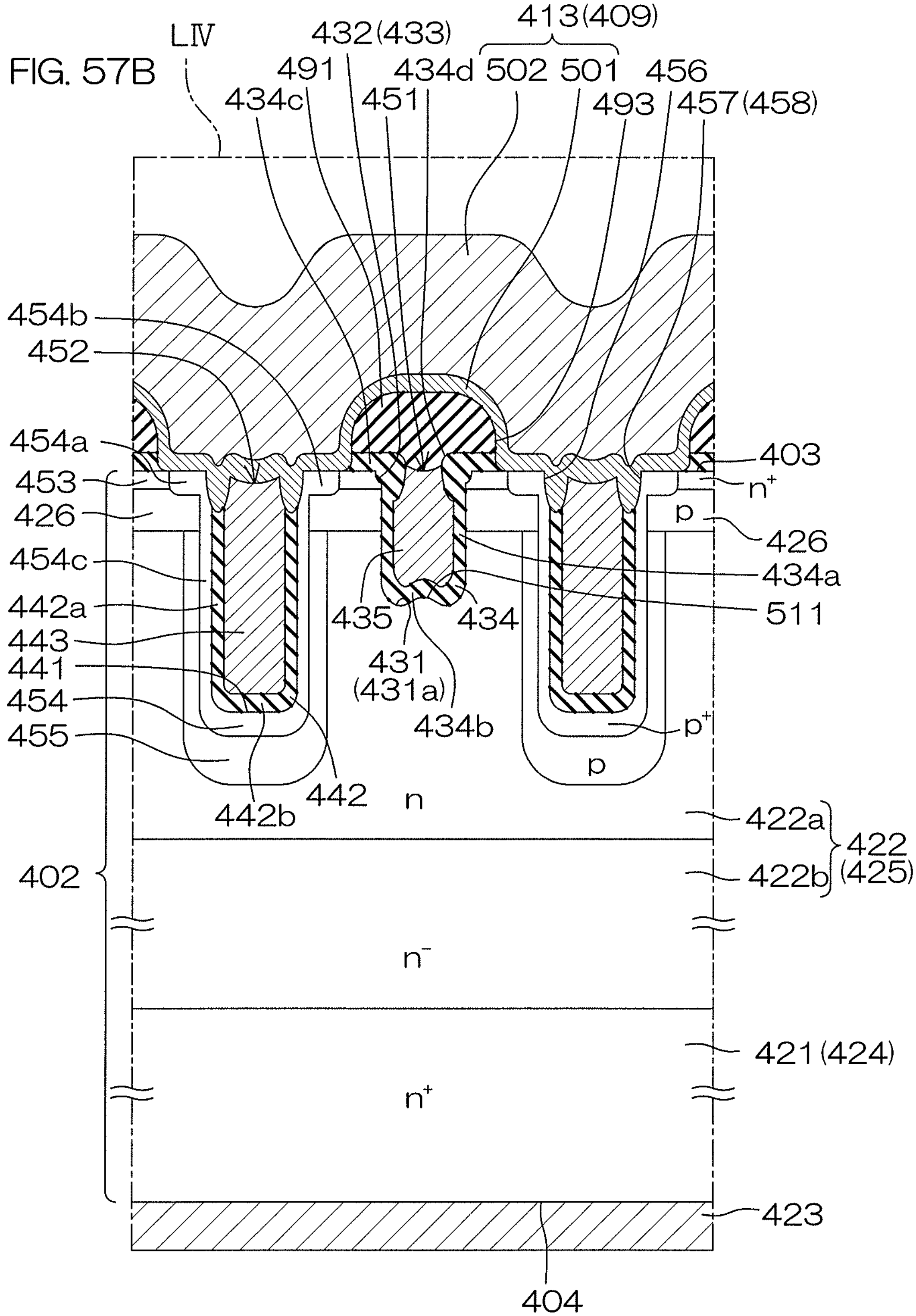
FIG. 57B is a sectional view of a region corresponding to FIG. 54 and is a sectional view of a third configuration example of the gate trench.

FIG. 57B is a sectional view of a region corresponding to FIG. 54 and is a sectional view of a third configuration example of a gate trench 431. In the following, for structures described already, the same symbols shall be provided and description thereof shall be omitted, and just newly appearing structures shall be described.

Referring to FIG. 57B, the gate trench 431 may have a projecting portion 511 projecting toward the opening side at the bottom wall. A portion of the gate insulating layer 434 along the bottom wall of the gate trench 431 (that is, the second region 434*b*) may project toward the opening side along the projecting portion 511 of the gate trench 431.

Figure 57C:
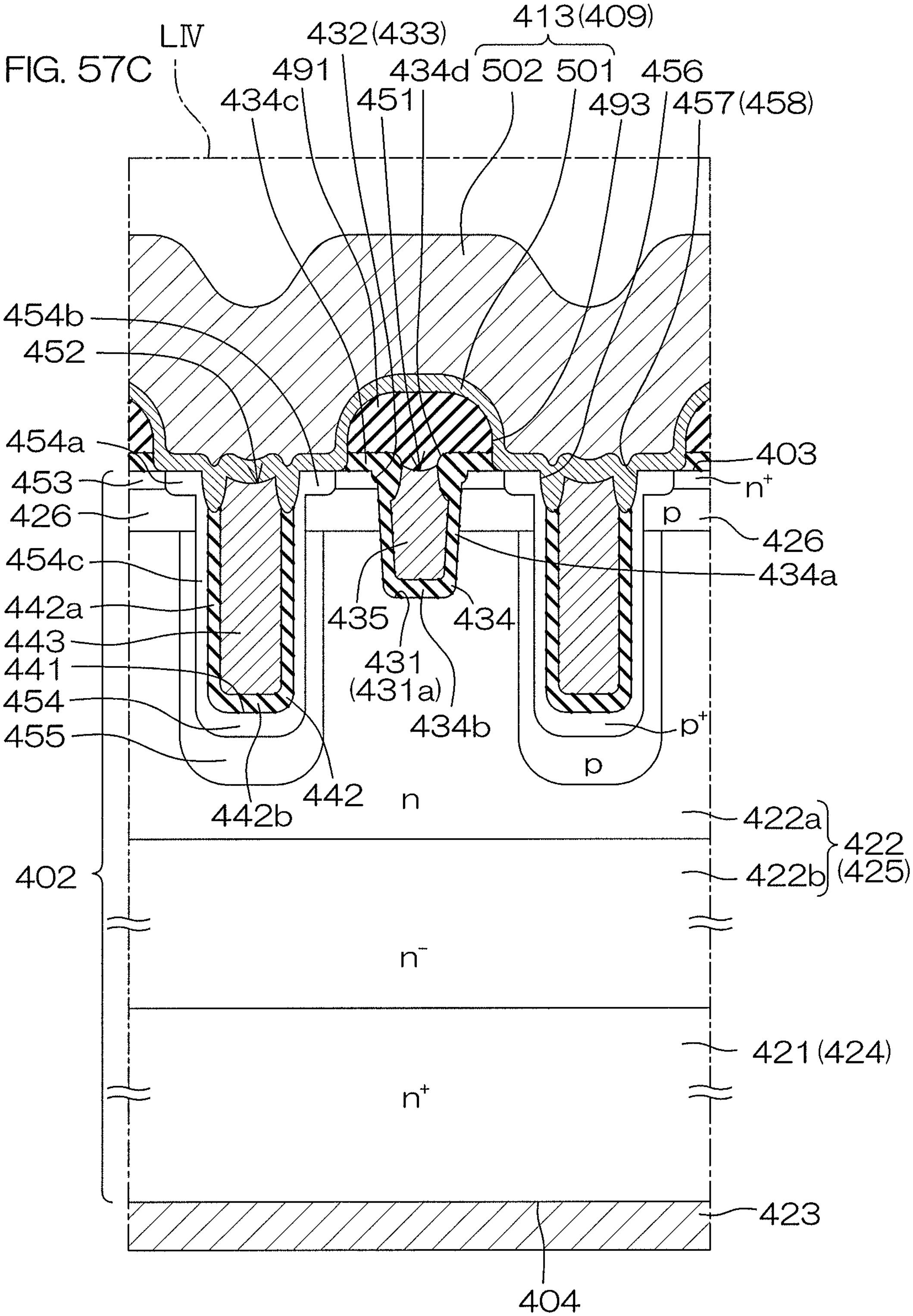
FIG. 57C is a sectional view of a region corresponding to FIG. 54 and is a sectional view of a fourth configuration example of the gate trench.

FIG. 57C is a sectional view of a region corresponding to FIG. 54 and is a sectional view of a fourth configuration example of a gate trench 431. In the following, for structures described already, the same symbols shall be provided and description thereof shall be omitted, and just newly appearing structures shall be described.

Referring to FIG. 57C, the gate trench 431 may be formed in a tapered shape with which a bottom area is smaller than an opening area. The bottom wall of the gate trench 431 may be formed parallel to the first main surface 403 of the SiC semiconductor layer 402.

Figure 57D:
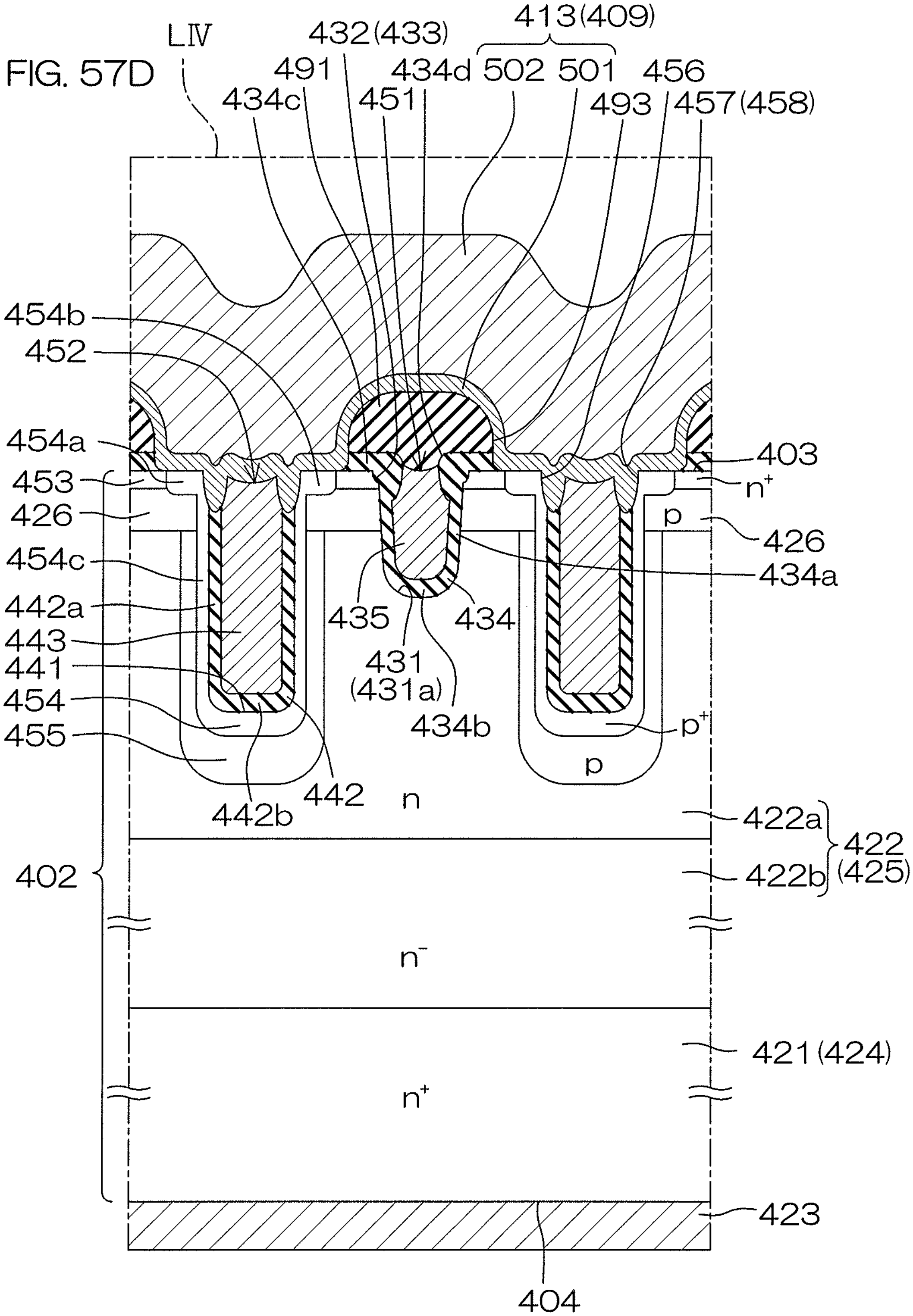
FIG. 57D is a sectional view of a region corresponding to FIG. 54 and is a sectional view of a fifth configuration example of the gate trench.

FIG. 57D is a sectional view of a region corresponding to FIG. 54 and is a sectional view of a fifth configuration example of a gate trench 431. In the following, for structures described already, the same symbols shall be provided and description thereof shall be omitted, and just newly appearing structures shall be described.

Referring to FIG. 57D, the gate trench 431 may be formed in a tapered shape with which the bottom area is smaller than the opening area. The bottom wall of the gate trench 431 may be formed in a shape that is convexly curved toward the second main surface 404 side of the SiC semiconductor layer 402.

Figure 57E:
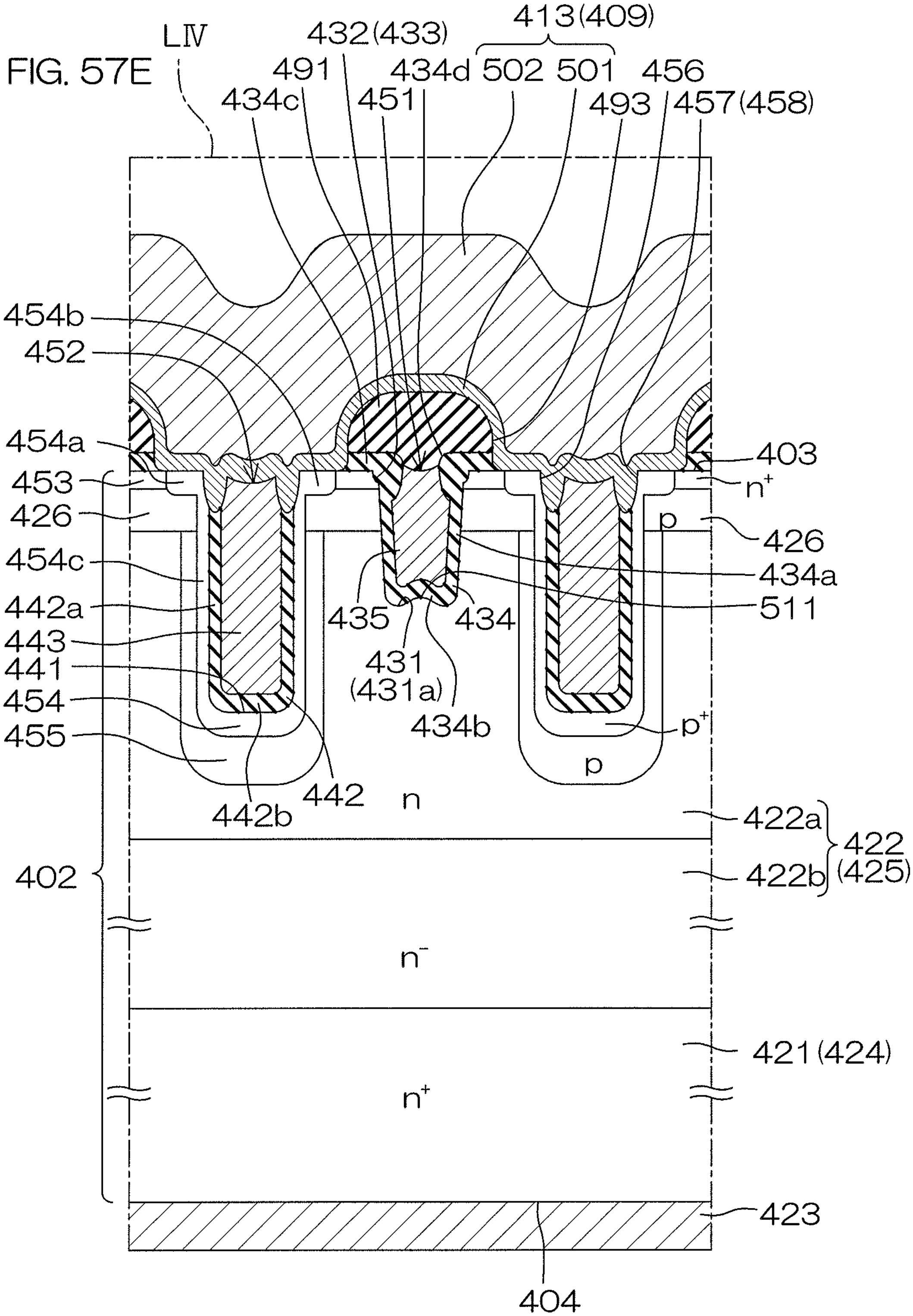
FIG. 57E is a sectional view of a region corresponding to FIG. 54 and is a sectional view of a sixth configuration example of the gate trench.

FIG. 57E is a sectional view of a region corresponding to FIG. 54 and is a sectional view of a sixth configuration example of a gate trench 431. In the following, for structures described already, the same symbols shall be provided and description thereof shall be omitted, and just newly appearing structures shall be described.

Referring to FIG. 57E, the gate trench 431 may be formed in a tapered shape with which a bottom area is smaller than an opening area. The gate trench 431 may have the projecting portion 511 projecting toward the opening side at the bottom wall.

The portion of the gate insulating layer 434 along the bottom wall of the gate trench 431 (that is, the second region 434*b*) may project toward the opening side along the projecting portion 511 of the gate trench 431.

At least two or more of the gate trenches 431 according to the first to sixth configuration examples (FIG. 54 and FIG. 57A to FIG. 57E) may be formed at the same time in the first main surface 403 of the SiC semiconductor layer 402.

Figure 58A:
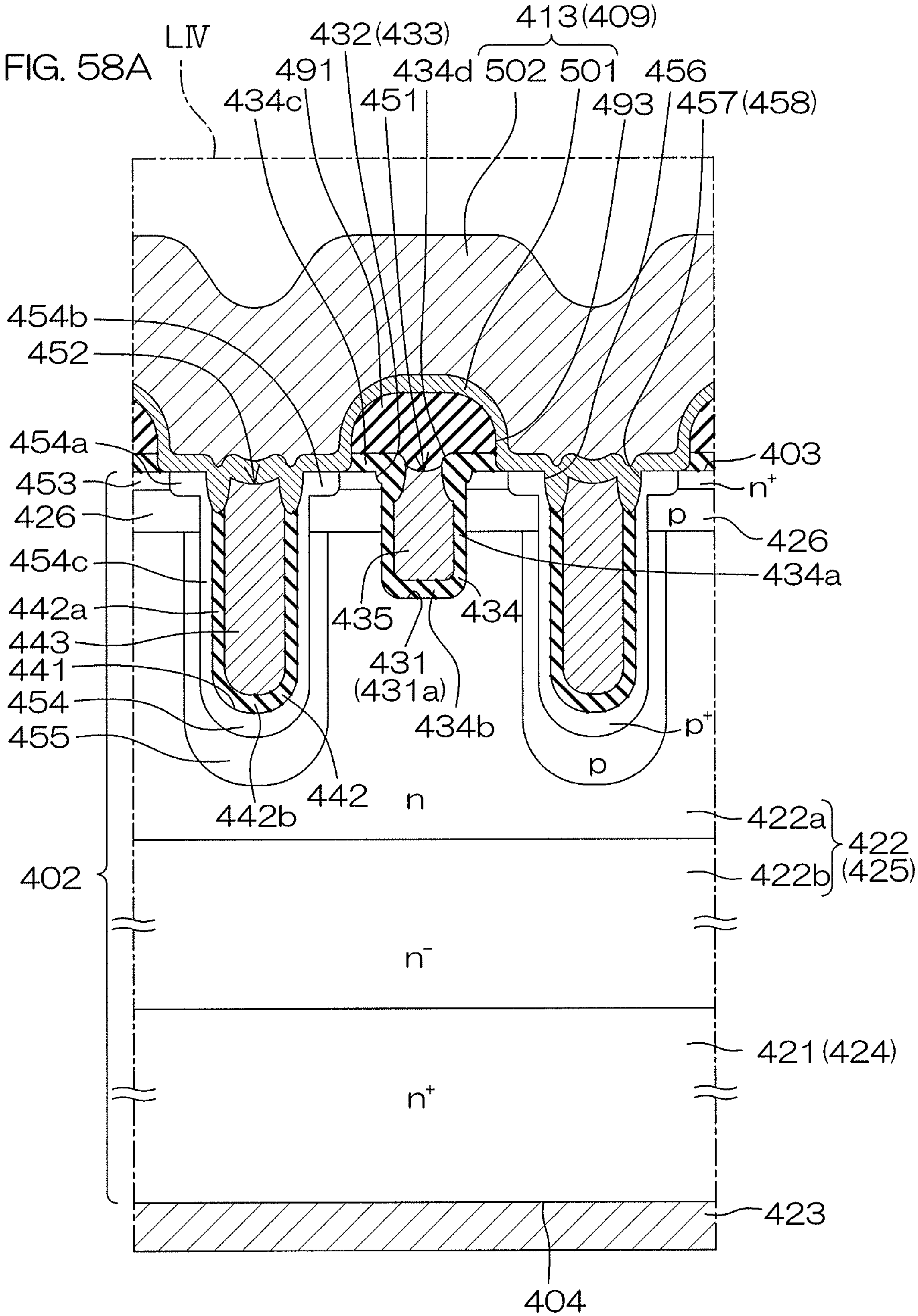
FIG. 58A is a sectional view of a region corresponding to FIG. 54 and is a sectional view of a second configuration example of source trenches.

Other configurations of the source trenches 441 shall now be described. As shown in FIG. 58A to FIG. 58Q, the source trenches 441 may take on any of various configurations. The configurations shown in FIG. 58A to FIG. 58Q are configurations obtained by adjusting treatment conditions in a step of forming the source trenches 441.

FIG. 58A is a sectional view of a region corresponding to FIG. 54 and is a sectional view of a second configuration example of source trenches 441. In the following, for structures described already, the same symbols shall be provided and description thereof shall be omitted, and just newly appearing structures shall be described.

Referring to FIG. 58A, the bottom wall of the source trench 441 may be formed in a shape that is convexly curved toward the second main surface 404 side of the SiC semiconductor layer 402.

The bottom portion of the contact region 454 may be formed in a shape that is convexly curved toward the second main surface 404 side of the SiC semiconductor layer 402. The bottom portion of the deep well region 455 may be formed in a shape that is convexly curved toward the second main surface 404 side of the SiC semiconductor layer 402.

Figure 58B:
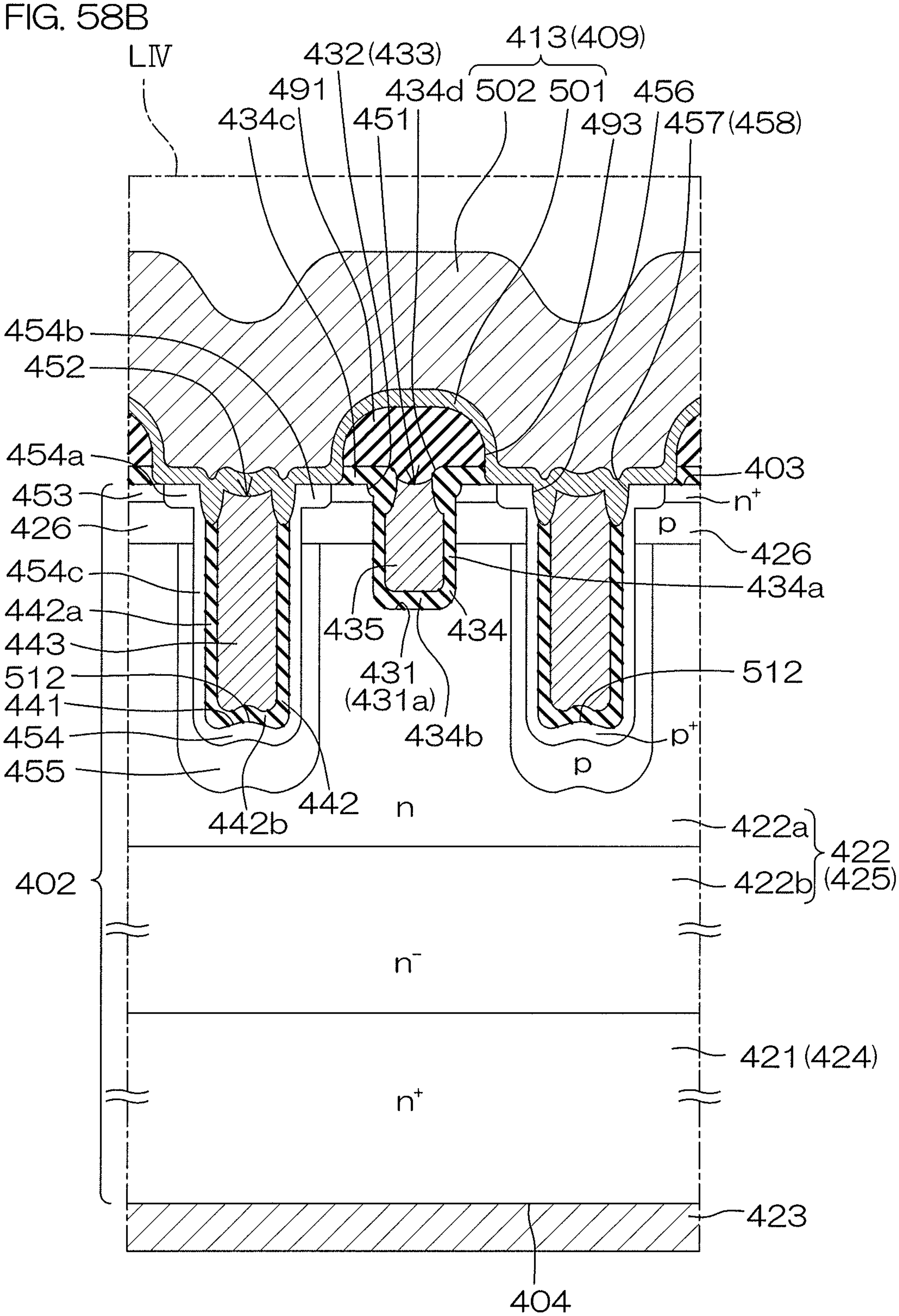
FIG. 58B is a sectional view of a region corresponding to FIG. 54 and is a sectional view of a third configuration example of source trenches.

FIG. 58B is a sectional view of a region corresponding to FIG. 54 and is a sectional view of a third configuration example of source trenches 441. In the following, for structures described already, the same symbols shall be provided and description thereof shall be omitted, and just newly appearing structures shall be described.

Referring to FIG. 58B, the source trench 441 may have a projecting portion 512 projecting toward the opening side at the bottom wall. A portion of the source insulating layer 442 along the bottom wall of the source trench 441 (that is, the second region 442*b*) may project toward the opening side along the projecting portion 512 of the source trench 441.

The bottom portion of the contact region 454 may be formed in a concavely curved shape that is recessed toward the first main surface 403 side of the SiC semiconductor layer 402. The bottom portion of the deep well region 455 may be formed in a concavely curved shape that is recessed toward the first main surface 403 side of the SiC semiconductor layer 402.

Figure 58C:
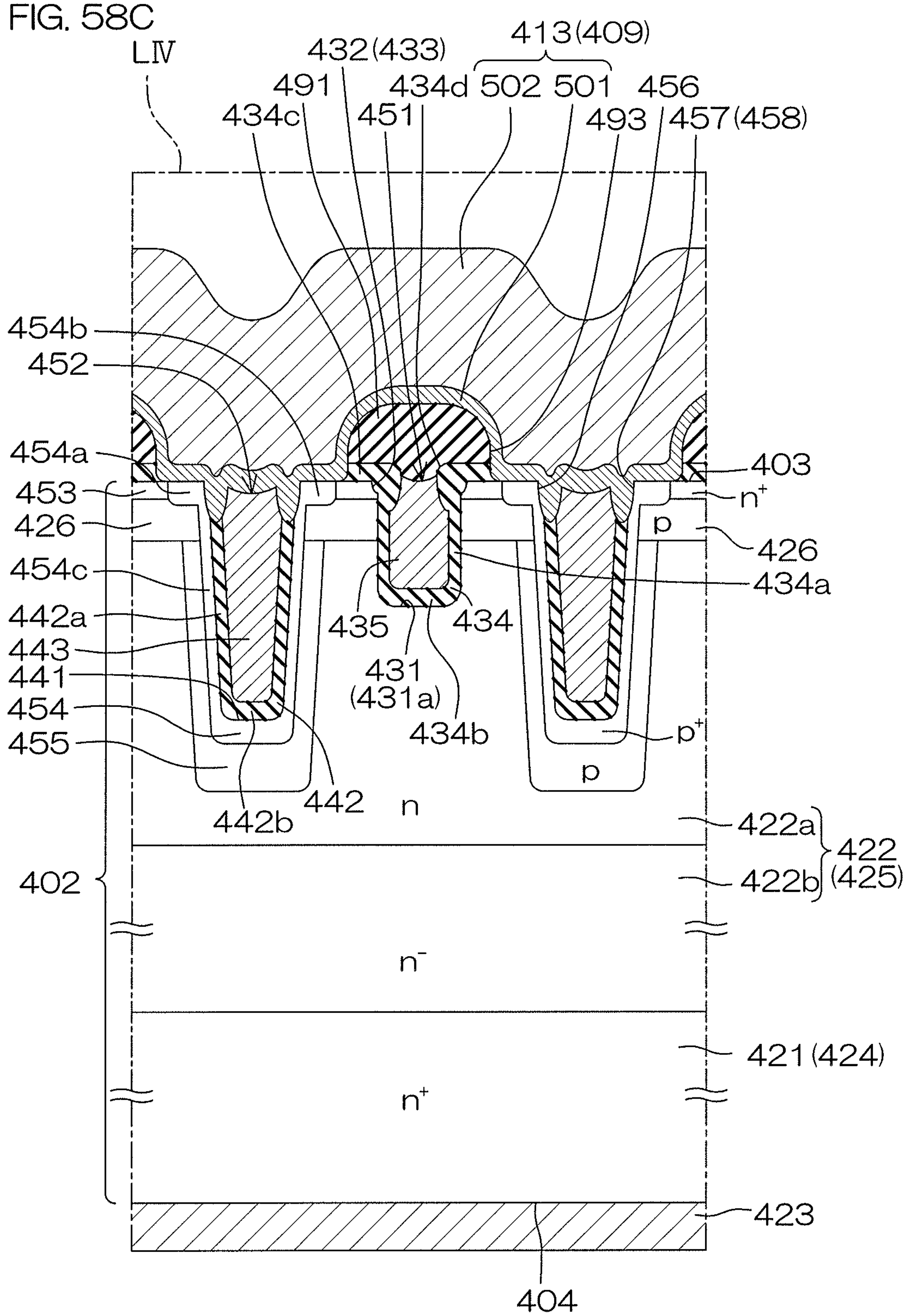
FIG. 58C is a sectional view of a region corresponding to FIG. 54 and is a sectional view of a fourth configuration example of source trenches.

FIG. 58C is a sectional view of a region corresponding to FIG. 54 and is a sectional view of a fourth configuration example of source trenches 441. In the following, for structures described already, the same symbols shall be provided and description thereof shall be omitted, and just newly appearing structures shall be described.

Referring to FIG. 58C, the source trench 441 may be formed in a tapered shape with which a bottom area is smaller than an opening area. The bottom wall of the source trench 441 may be formed parallel to the first main surface 403 of the SiC semiconductor layer 402.

The bottom portion of the contact region 454 may be formed parallel to the bottom wall of the source trench 441. A portion of the contact region 454 along the side wall of the source trench 441 may be inclined with respect to the first main surface 403 of the SiC semiconductor layer 402 in conformance to the side wall of the source trench 441.

The bottom portion of the deep well region 455 may be formed parallel to the bottom wall of the source trench 441. A portion of the deep well region 455 along the side wall of the source trench 441 may be inclined with respect to the first main surface 403 of the SiC semiconductor layer 402 in conformance to the side wall of the source trench 441.

Figure 58D:
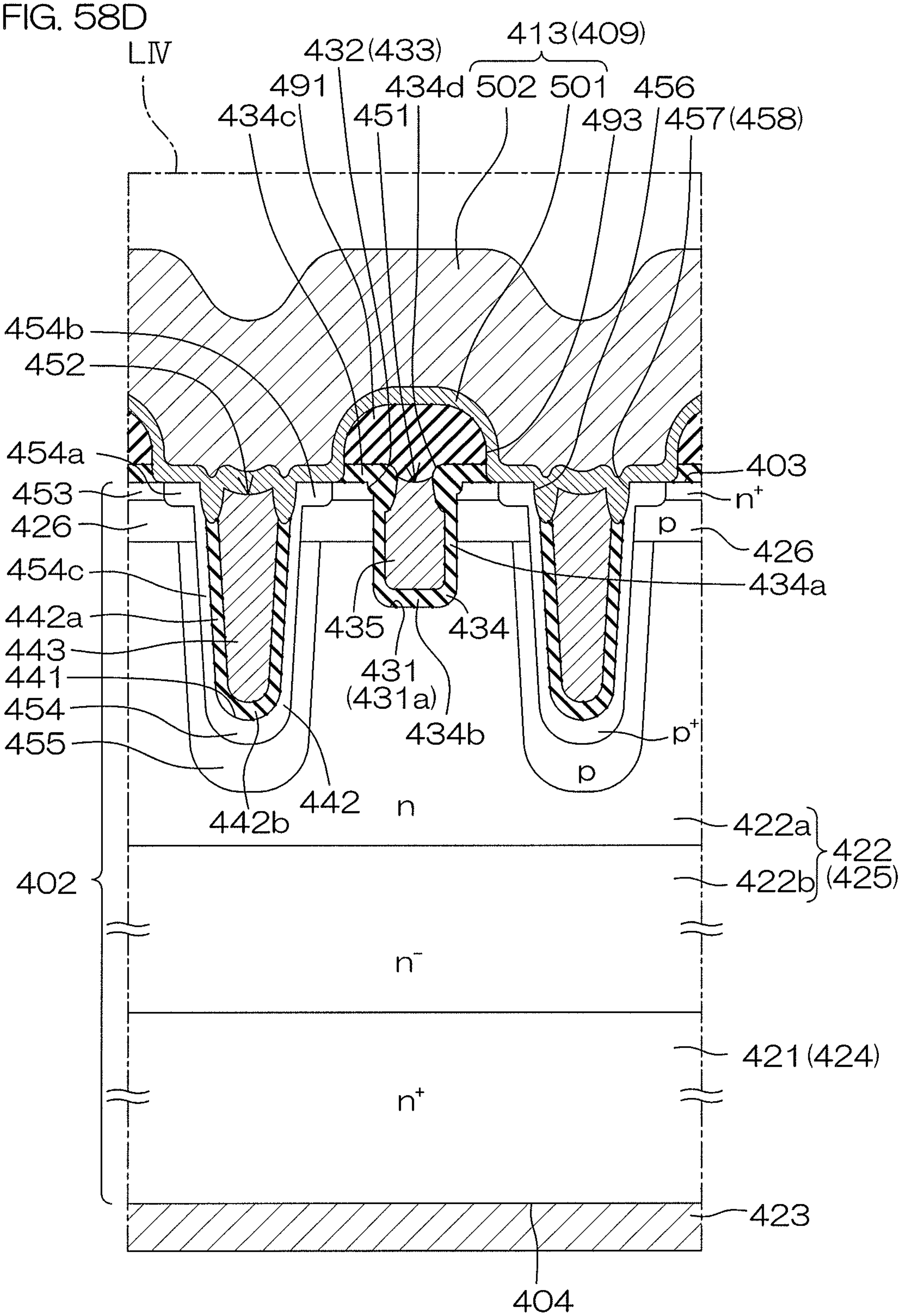
FIG. 58D is a sectional view of a region corresponding to FIG. 54 and is a sectional view of a fifth configuration example of source trenches.

FIG. 58D is a sectional view of a region corresponding to FIG. 54 and is a sectional view of a fifth configuration example of source trenches 441. In the following, for structures described already, the same symbols shall be provided and description thereof shall be omitted, and just newly appearing structures shall be described.

Referring to FIG. 58D, the source trench 441 may be formed in a tapered shape with which the bottom area is smaller than the opening area. The bottom wall of the source trench 441 may be formed in a shape that is convexly curved toward the second main surface 404 side of the SiC semiconductor layer 402.

The bottom portion of the contact region 454 may be formed in a shape that is convexly curved toward the first main surface 403 side of the SiC semiconductor layer 402. The portion of the contact region 454 along the side wall of the source trench 441 may be inclined with respect to the first main surface 403 of the SiC semiconductor layer 402 in conformance to the side wall of the source trench 441.

The bottom portion of the deep well region 455 may be formed in a shape that is convexly curved toward the second main surface 404 side of the SiC semiconductor layer 402. The portion of the deep well region 455 along the side wall of the source trench 441 may be inclined with respect to the first main surface 403 of the SiC semiconductor layer 402 in conformance to the side wall of the source trench 441.

Figure 58E:
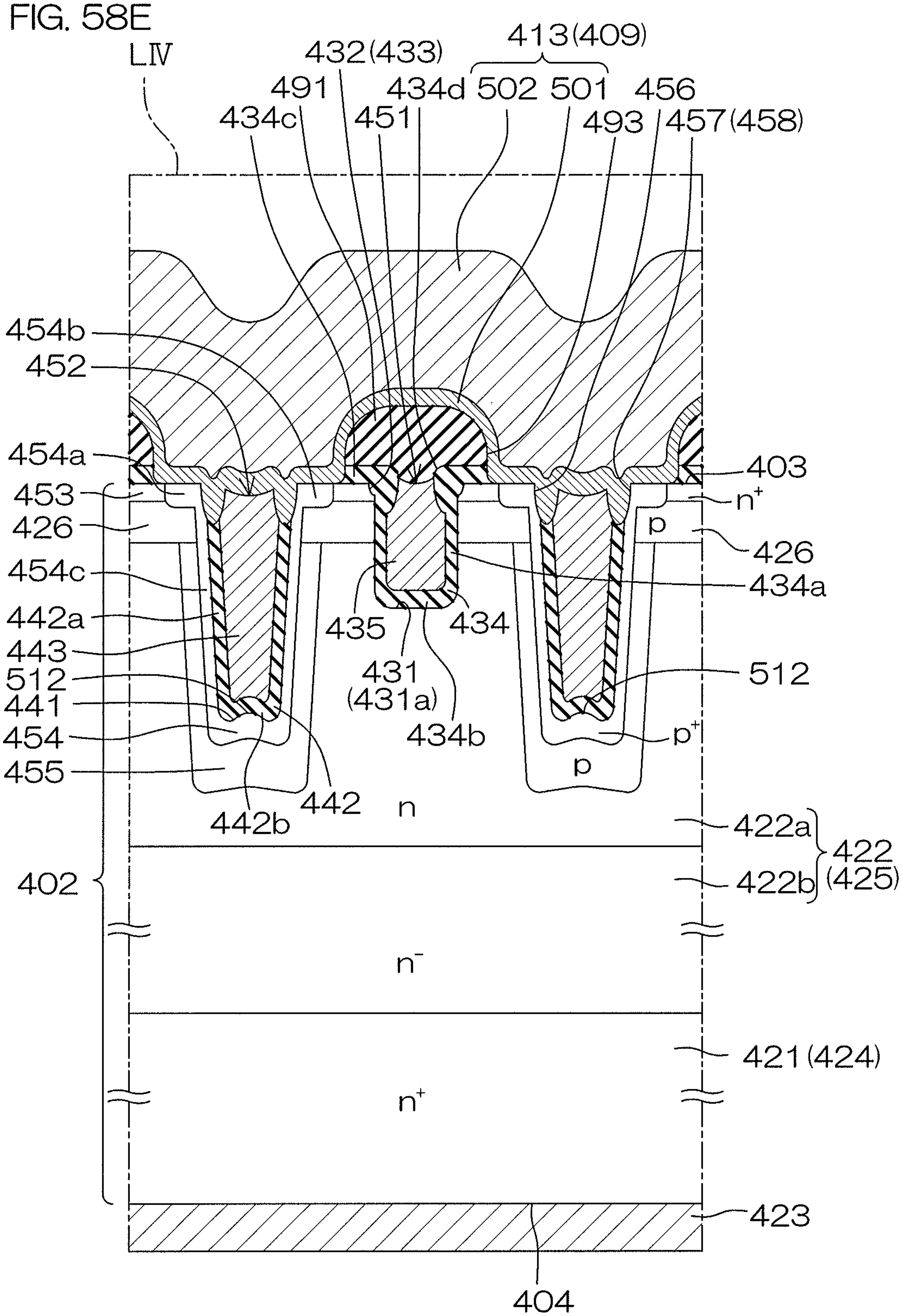
FIG. 58E is a sectional view of a region corresponding to FIG. 54 and is a sectional view of a sixth configuration example of source trenches.

FIG. 58E is a sectional view of a region corresponding to FIG. 54 and is a sectional view of a sixth configuration example of source trenches 441. In the following, for structures described already, the same symbols shall be provided and description thereof shall be omitted, and just newly appearing structures shall be described.

Referring to FIG. 58E, the source trench 441 may be formed in a tapered shape with which the bottom area is smaller than the opening area. The source trench 441 may have the projecting portion 512, projecting toward the opening side, at the bottom wall.

The portion of the source insulating layer 442 along the bottom wall of the source trench 441 (that is, the second region 442*b*) may project toward the opening side along the projecting portion 512 of the source trench 441.

The bottom portion of the contact region 454 may be formed in a concavely curved shape that is recessed toward the first main surface 403 side of the SiC semiconductor layer 402. The portion of the contact region 454 along the side wall of the source trench 441 may be inclined with respect to the first main surface 403 of the SiC semiconductor layer 402 in conformance to the side wall of the source trench 441.

The bottom portion of the deep well region 455 may be formed in a concavely curved shape that is recessed toward the first main surface 403 side of the SiC semiconductor layer 402. The portion of the deep well region 455 along the side wall of the source trench 441 may be inclined with respect to the first main surface 403 of the SiC semiconductor layer 402 in conformance to the side wall of the source trench 441.

Figure 58F:
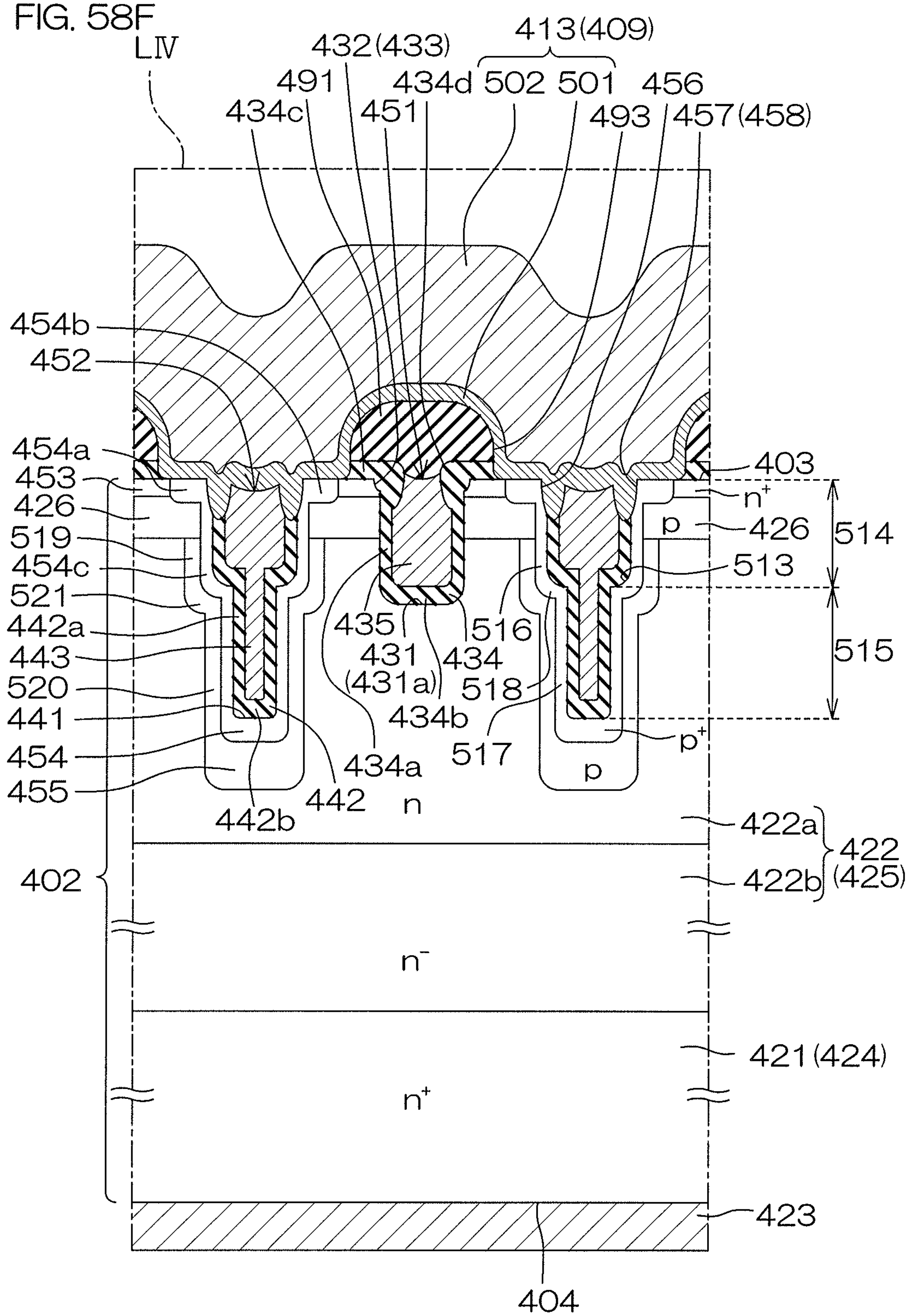
FIG. 58F is a sectional view of a region corresponding to FIG. 54 and is a sectional view of a seventh configuration example of source trenches.

FIG. 58F is a sectional view of a region corresponding to FIG. 54 and is a sectional view of a seventh configuration example of source trenches 441. In the following, for structures described already, the same symbols shall be provided and description thereof shall be omitted, and just newly appearing structures shall be described.

Referring to FIG. 58F, the source trench 441 may have one or a plurality of step portions 513 protruding toward an inner region of the source trench 441 at an intermediate portion in the depth direction. The source trench 441 has one step portion 513, in the present configuration example.

The step portion 513 is positioned on substantially the same plane as the bottom wall of a gate trench 431, in the present configuration example. The step portion 513 may be positioned at the first main surface 403 side of the SiC semiconductor layer 402 with respect to the bottom wall of the gate trench 431. The step portion 513 may be positioned at the second main surface 404 side of the SiC semiconductor layer 402 with respect to the bottom wall of the gate trench 431.

More specifically, the source trench 441 includes a first portion 514 and a second portion 515 mutually differing in opening width with the step portion 513 as a boundary. The first portion 514 is formed in a region of the source trench 441 at the opening side. The first portion 514 forms the opening portion of the source trench 441.

The second portion 515 has an opening width smaller than the opening width of the first portion 514. The second portion 515 is formed in a region of the source trench 441 at the bottom wall side. The second portion 515 forms the bottom wall of the source trench 441. The bottom wall of the source trench 441 may be formed parallel to the first main surface 403 of the SiC semiconductor layer 402.

The bottom portion of the contact region 454 may be formed parallel to the bottom wall of the source trench 441. The portion of the contact region 454 along the side wall of the source trench 441 may have a first region 516, a second region 517, and a step portion region 518 in conformance to the side wall of the source trench 441.

The first region 516 of the contact region 454 covers the first portion 514 of the source trench 441. The second region 517 of the contact region 454 covers the second portion 515 of the source trench 441. The step portion region 518 of the contact region 454 connects the first region 516 and the second region 517 and covers the step portion 513 of the source trench 441.

The bottom portion of the deep well region 455 may be formed parallel to the bottom wall of the source trench 441. The portion of the deep well region 455 along the side wall of the source trench 441 may have a first region 519, a second region 520, and a step portion region 521 in conformance to the side wall of the source trench 441.

The first region 519 of the deep well region 455 covers the first portion 514 of the source trench 441. The second region 520 of the deep well region 455 covers the second portion 515 of the source trench 441. The step portion region 521 of the deep well region 455 connects the first region 519 and the second region 520 and covers the step portion 513 of the source trench 441.

Figure 58G:
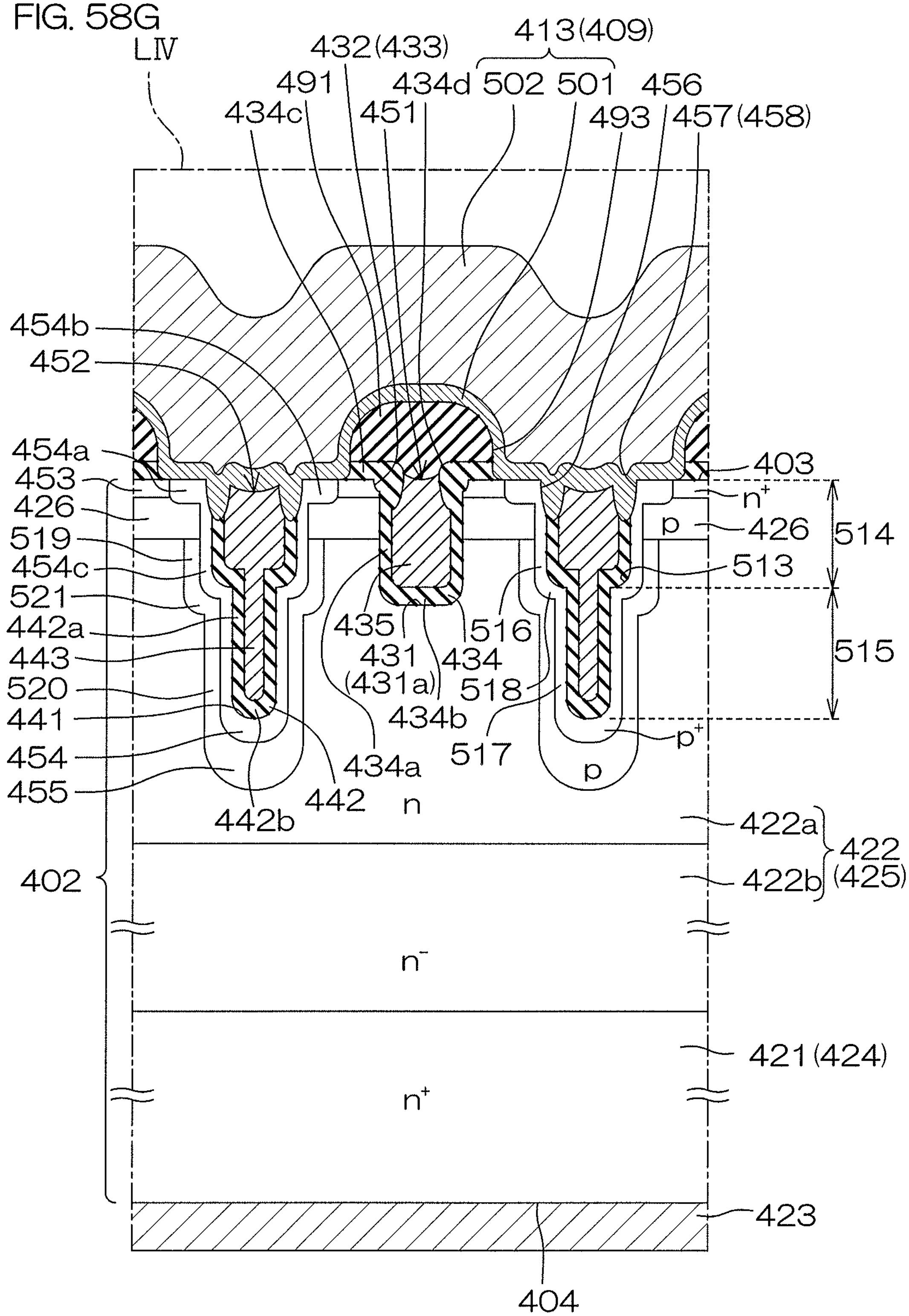
FIG. 58G is a sectional view of a region corresponding to FIG. 54 and is a sectional view of an eighth configuration example of source trenches.

FIG. 58G is a sectional view of a region corresponding to FIG. 54 and is a sectional view of an eighth configuration example of source trenches 441. In the following, for structures described already, the same symbols shall be provided and description thereof shall be omitted, and just newly appearing structures shall be described.

Referring to FIG. 58G, the source trench 441 may have one or a plurality of the step portions 513, protruding toward the inner region of the source trench 441, at the intermediate portion in the depth direction. The source trench 441 has one step portion 513 in the present configuration example.

The step portion 513 is positioned on substantially the same plane as the bottom wall of a gate trench 431 in the present configuration example. The step portion 513 may be positioned at the first main surface 403 side of the SiC semiconductor layer 402 with respect to the bottom wall of the gate trench 431. The step portion 513 may be positioned at the second main surface 404 side of the SiC semiconductor layer 402 with respect to the bottom wall of the gate trench 431.

More specifically, the source trench 441 includes the first portion 514 and the second portion 515 mutually differing in opening width with the step portion 513 as a boundary. The first portion 514 is formed in a region of the source trench 441 at the opening side. The first portion 514 forms the opening portion of the source trench 441.

The second portion 515 has an opening width smaller than the opening width of the first portion 514. The second portion 515 is formed in a region of the source trench 441 at a bottom wall side. The second portion 515 forms the bottom wall of the source trench 441. The bottom wall of the source trench 441 may be formed in a shape that is convexly curved toward the second main surface 404 side of the SiC semiconductor layer 402.

The bottom portion of the contact region 454 may be formed in a shape that is convexly curved toward the first main surface 403 side of the SiC semiconductor layer 402. The portion of the contact region 454 along the side wall of the source trench 441 may have the first region 516, the second region 517, and the step portion region 518 in conformance to the side wall of the source trench 441.

The first region 516 of the contact region 454 covers the first portion 514 of the source trench 441. The second region 517 of the contact region 454 covers the second portion 515 of the source trench 441. The step portion region 518 of the contact region 454 connects the first region 516 and the second region 517 and covers the step portion 513 of the source trench 441.

The bottom portion of the deep well region 455 may be formed in a shape that is convexly curved toward the first main surface 403 side of the SiC semiconductor layer 402. The portion of the deep well region 455 along the side wall of the source trench 441 may have the first region 519, the second region 520, and the step portion region 521 in conformance to the side wall of the source trench 441.

The first region 519 of the deep well region 455 covers the first portion 514 of the source trench 441. The second region 520 of the deep well region 455 covers the second portion 515 of the source trench 441. The step portion region 521 of the deep well region 455 connects the first region 519 and the second region 520 and covers the step portion 513 of the source trench 441.

Figure 58H:
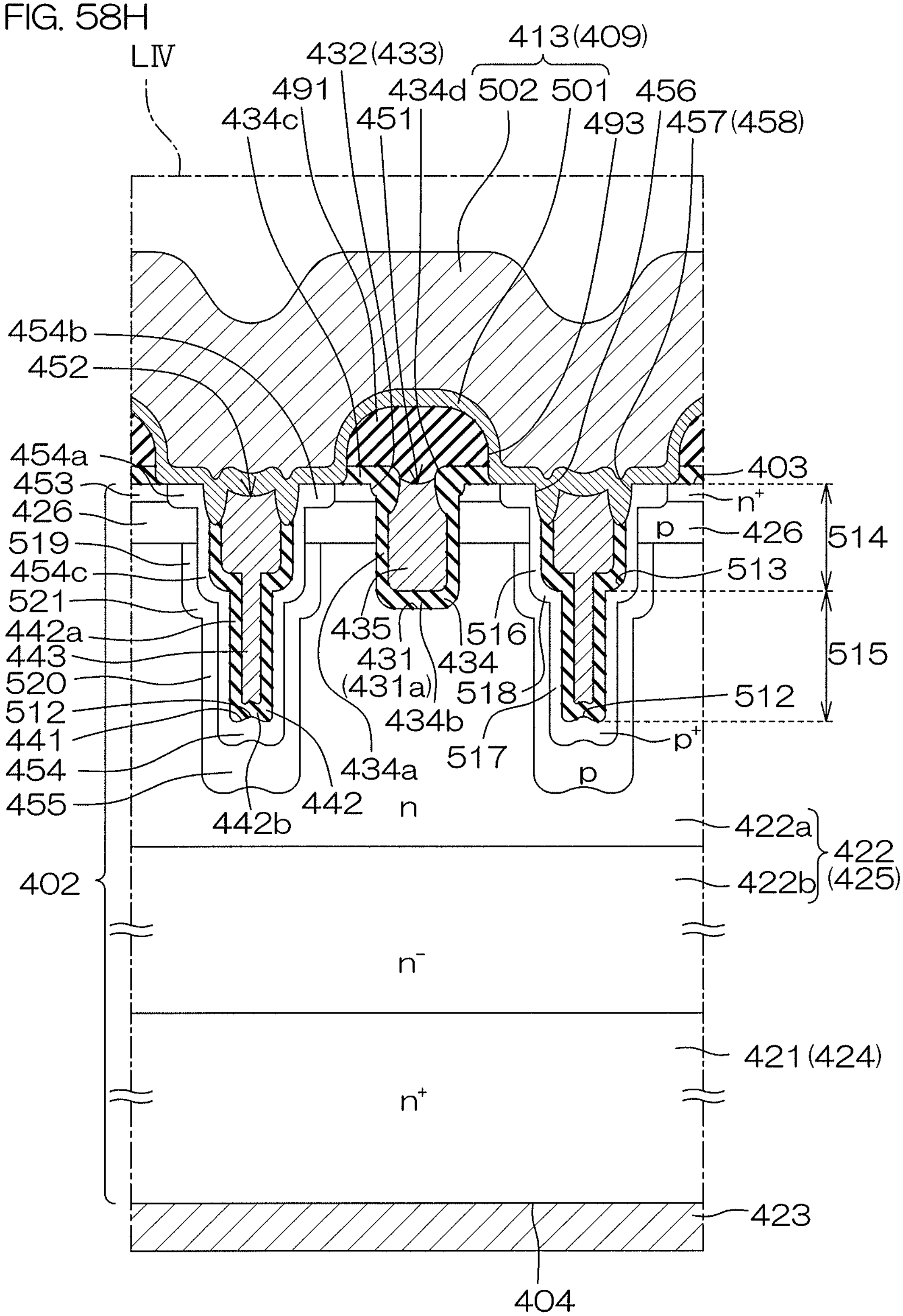
FIG. 58H is a sectional view of a region corresponding to FIG. 54 and is a sectional view of a ninth configuration example of source trenches.
Figure 58:
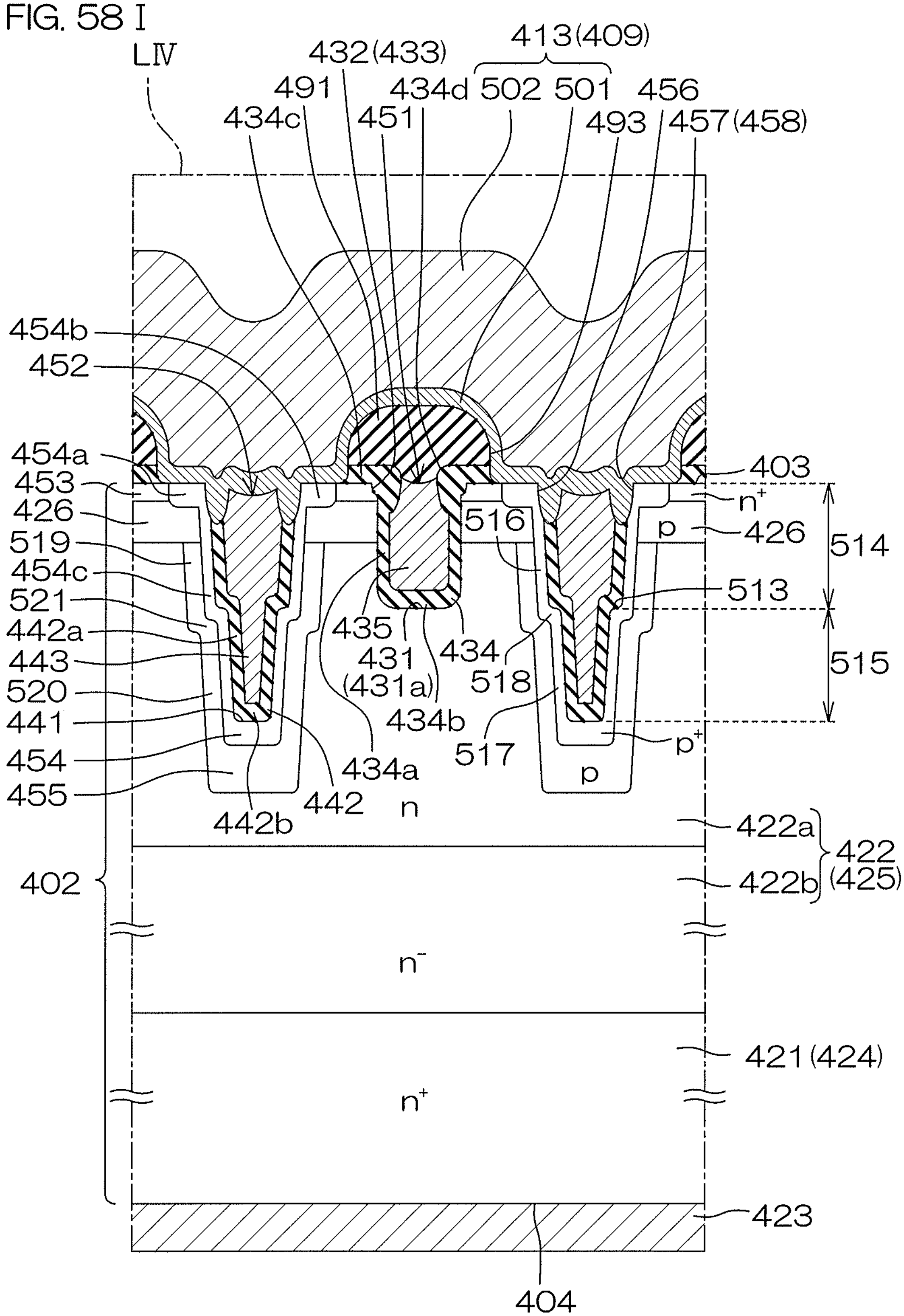
FIG. 58I is a sectional view of a region corresponding to FIG. 54 and is a sectional view of a tenth configuration example of source trenches.
FIG. 58J is a sectional view of a region corresponding to FIG. 54 and is a sectional view of an eleventh configuration example of source trenches.
FIG. 58K is a sectional view of a region corresponding to FIG. 54 and is a sectional view of a twelfth configuration example of source trenches.
FIG. 58L is a sectional view of a region corresponding to FIG. 54 and is a sectional view of a thirteenth configuration example of source trenches.
FIG. 58M is a sectional view of a region corresponding to FIG. 54 and is a sectional view of a fourteenth configuration example of source trenches.
FIG. 58N is a sectional view of a region corresponding to FIG. 54 and is a sectional view of a fifteenth configuration example of source trenches.
FIG. 58O is a sectional view of a region corresponding to FIG. 54 and is a sectional view of a sixteenth configuration example of source trenches.
FIG. 58P is a sectional view of a region corresponding to FIG. 54 and is a sectional view of a seventeenth configuration example of source trenches.
FIG. 58Q is a sectional view of a region corresponding to FIG. 54 and is a sectional view of an eighteenth configuration example of source trenches.

FIG. 58H is a sectional view of a region corresponding to FIG. 54 and is a sectional view of a ninth configuration example of source trenches 441. In the following, for structures described already, the same symbols shall be provided and description thereof shall be omitted, and just newly appearing structures shall be described.

Referring to FIG. 58H, the source trench 441 may have one or a plurality of the step portions 513 protruding toward the inner region of the source trench 441 at the intermediate portion in the depth direction. The source trench 441 has one step portion 513, in the present configuration example.

The step portion 513 is positioned on substantially the same plane as the bottom wall of a gate trench 431, in the present configuration example. The step portion 513 may be positioned at the first main surface 403 side of the SiC semiconductor layer 402 with respect to the bottom wall of the gate trench 431. The step portion 513 may be positioned at the second main surface 404 side of the SiC semiconductor layer 402 with respect to the bottom wall of the gate trench 431.

More specifically, the source trench 441 includes the first portion 514 and the second portion 515, mutually differing in opening width, with the step portion 513 as a boundary. The first portion 514 is formed in a region of the source trench 441 at the opening side. The first portion 514 forms the opening portion of the source trench 441.

The second portion 515 has an opening width smaller than the opening width of the first portion 514. The second portion 515 is formed in a region of the source trench 441 at a bottom wall side. The second portion 515 forms the bottom wall of the source trench 441. The source trench 441 may have the projecting portion 512 projecting toward the opening side at the bottom wall.

The portion of the source insulating layer 442 along the bottom wall of the source trench 441 (that is, the second region 442*b*) may project toward the opening side along the projecting portion 512 of the source trench 441.

The bottom portion of the contact region 454 may be formed in a concavely curved shaped that is recessed toward the first main surface 403 side of the SiC semiconductor layer 402. The portion of the contact region 454 along the side wall of the source trench 441 may have the first region 516, the second region 517, and the step portion region 518 in conformance to the side wall of the source trench 441.

The first region 516 of the contact region 454 covers the first portion 514 of the source trench 441. The second region 517 of the contact region 454 covers the second portion 515 of the source trench 441. The step portion region 518 of the contact region 454 connects the first region 516 and the second region 517 and covers the step portion 513 of the source trench 441.

The bottom portion of the deep well region 455 may be formed in a concavely curved shape that is recessed toward the first main surface 403 side of the SiC semiconductor layer 402. The portion of the deep well region 455 along the side wall of the source trench 441 may have the first region 519, the second region 520, and the step portion region 521 in conformance to the side wall of the source trench 441.

The first region 519 of the deep well region 455 covers the first portion 514 of the source trench 441. The second region 520 of the deep well region 455 covers the second portion 515 of the source trench 441. The step portion region 521 of the deep well region 455 connects the first region 519 and the second region 520 and covers the step portion 513 of the source trench 441.

FIG. 58I is a sectional view of a region corresponding to FIG. 54 and is a sectional view of a tenth configuration example of source trenches 441. In the following, for structures described already, the same symbols shall be provided and description thereof shall be omitted, and just newly appearing structures shall be described.

Referring to FIG. 58I, the source trench 441 may have one or a plurality of the step portions 513 protruding toward the inner region of the source trench 441 at the intermediate portion in the depth direction. The source trench 441 has one step portion 513, in the present configuration example.

The step portion 513 is positioned on substantially the same plane as the bottom wall of a gate trench 431, in the present configuration example. The step portion 513 may be positioned at the first main surface 403 side of the SiC semiconductor layer 402 with respect to the bottom wall of the gate trench 431. The step portion 513 may be positioned at the second main surface 404 side of the SiC semiconductor layer 402 with respect to the bottom wall of the gate trench 431.

More specifically, the source trench 441 includes the first portion 514 and the second portion 515 mutually differing in opening width with the step portion 513 as a boundary. The first portion 514 is formed in a region of the source trench 441 at the opening side.

The first portion 514 forms the opening portion of the source trench 441. The first portion 514 may be formed in a tapered shape that narrows in opening width from the opening side toward the step portion 513 of the source trench 441.

The second portion 515 has an opening width smaller than the opening width of the first portion 514. The second portion 515 is formed in a region of the source trench 441 at a bottom wall side. The second portion 515 forms the bottom wall of the source trench 441.

The second portion 515 may be formed in a tapered shape that narrows in opening width from the step portion 513 toward the bottom wall of the source trench 441. The bottom wall of the source trench 441 may be formed parallel to the first main surface 403 of the SiC semiconductor layer 402.

The bottom portion of the contact region 454 may be formed parallel to the bottom wall of the source trench 441. The portion of the contact region 454 along the side wall of the source trench 441 may have the first region 516, the second region 517, and the step portion region 518 in conformance to the side wall of the source trench 441.

The first region 516 of the contact region 454 covers the first portion 514 of the source trench 441. The first region 516 of the contact region 454 is inclined with respect to the first main surface 403 of the SiC semiconductor layer 402 in conformance to the first portion 514 of the source trench 441.

The second region 517 of the contact region 454 covers the second portion 515 of the source trench 441. The second region 517 of the contact region 454 is inclined with respect to the first main surface 403 of the SiC semiconductor layer 402 in conformance to the second portion 515. The step portion region 518 of the contact region 454 connects the first region 516 and the second region 517 and covers the step portion 513 of the source trench 441.

The bottom portion of the deep well region 455 may be formed parallel to the bottom wall of the source trench 441. The portion of the deep well region 455 along the side wall of the source trench 441 may have the first region 519, the second region 520, and the step portion region 521 in conformance to the side wall of the source trench 441.

The first region 519 of the deep well region 455 covers the first portion 514 of the source trench 441. The first region 519 of the deep well region 455 is inclined with respect to the first main surface 403 of the SiC semiconductor layer 402 in conformance to the first portion 514 of the source trench 441.

The second region 520 of the deep well region 455 covers the second portion 515 of the source trench 441. The second region 520 of the deep well region 455 is inclined with respect to the first main surface 403 of the SiC semiconductor layer 402 in conformance to the second portion 515 of the source trench 441. The step portion region 521 of the deep well region 455 connects the first region 519 and the second region 520 and covers the step portion 513 of the source trench 441.

Figure 58J:
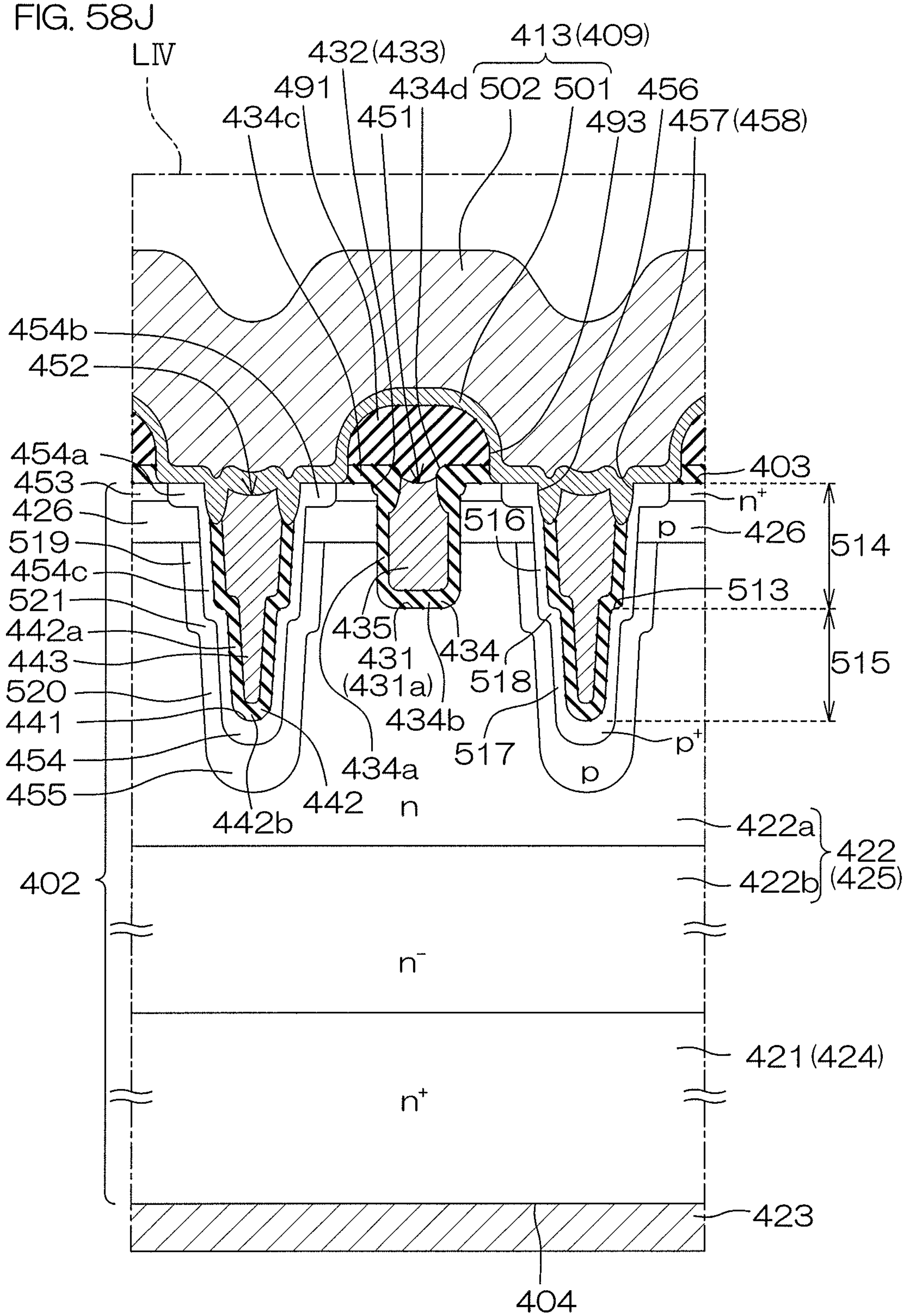

FIG. 58J is a sectional view of a region corresponding to FIG. 54 and is a sectional view of an eleventh configuration example of source trenches 441. In the following, for structures described already, the same symbols shall be provided and description thereof shall be omitted, and just newly appearing structures shall be described.

Referring to FIG. 58J, the source trench 441 may have one or a plurality of the step portions 513 protruding toward the inner region of the source trench 441 at the intermediate portion in the depth direction. The source trench 441 has one step portion 513, in the present configuration example.

The step portion 513 is positioned on substantially the same plane as the bottom wall of a gate trench 431, in the present configuration example. The step portion 513 may be positioned at the first main surface 403 side of the SiC semiconductor layer 402 with respect to the bottom wall of the gate trench 431. The step portion 513 may be positioned at the second main surface 404 side of the SiC semiconductor layer 402 with respect to the bottom wall of the gate trench 431.

More specifically, the source trench 441 includes the first portion 514 and the second portion 515 mutually differing in opening width with the step portion 513 as a boundary. The first portion 514 is formed in a region of the source trench 441 at the opening side.

The first portion 514 forms the opening portion of the source trench 441. The first portion 514 may be formed in a tapered shape that narrows in opening width from the opening side toward the step portion 513 of the source trench 441.

The second portion 515 has an opening width smaller than the opening width of the first portion 514. The second portion 515 is formed in a region of the source trench 441 at a bottom wall side. The second portion 515 forms the bottom wall of the source trench 441.

The second portion 515 may be formed in a tapered shape that narrows in opening width from the step portion 513 toward the bottom wall of the source trench 441. The bottom wall of the source trench 441 may be formed in a shape that is convexly curved toward the second main surface 404 side of the SiC semiconductor layer 402.

The bottom portion of the contact region 454 may be formed in a shape that is convexly curved toward the second main surface 404 side of the SiC semiconductor layer 402. The portion of the contact region 454 along the side wall of the source trench 441 may have the first region 516, the second region 517, and the step portion region 518 in conformance to the side wall of the source trench 441.

The first region 516 of the contact region 454 covers the first portion 514 of the source trench 441. The first region 516 of the contact region 454 is inclined with respect to the first main surface 403 of the SiC semiconductor layer 402 in conformance to the first portion 514 of the source trench 441.

The second region 517 of the contact region 454 covers the second portion 515 of the source trench 441. The second region 517 of the contact region 454 is inclined with respect to the first main surface 403 of the SiC semiconductor layer 402 in conformance to the second portion 515. The step portion region 518 of the contact region 454 connects the first region 516 and the second region 517 and covers the step portion 513 of the source trench 441.

The bottom portion of the deep well region 455 may be formed in a shape that is convexly curved toward the second main surface 404 side of the SiC semiconductor layer 402. The portion of the deep well region 455 along the side wall of the source trench 441 may have the first region 519, the second region 520, and the step portion region 521 in conformance to the side wall of the source trench 441.

The first region 519 of the deep well region 455 covers the first portion 514 of the source trench 441. The first region 519 of the deep well region 455 is inclined with respect to the first main surface 403 of the SiC semiconductor layer 402 in conformance to the first portion 514 of the source trench 441.

The second region 520 of the deep well region 455 covers the second portion 515 of the source trench 441. The second region 520 of the deep well region 455 is inclined with respect to the first main surface 403 of the SiC semiconductor layer 402 in conformance to the second portion 515 of the source trench 441. The step portion region 521 of the deep well region 455 connects the first region 519 and the second region 520 and covers the step portion 513 of the source trench 441.

Figure 58K:
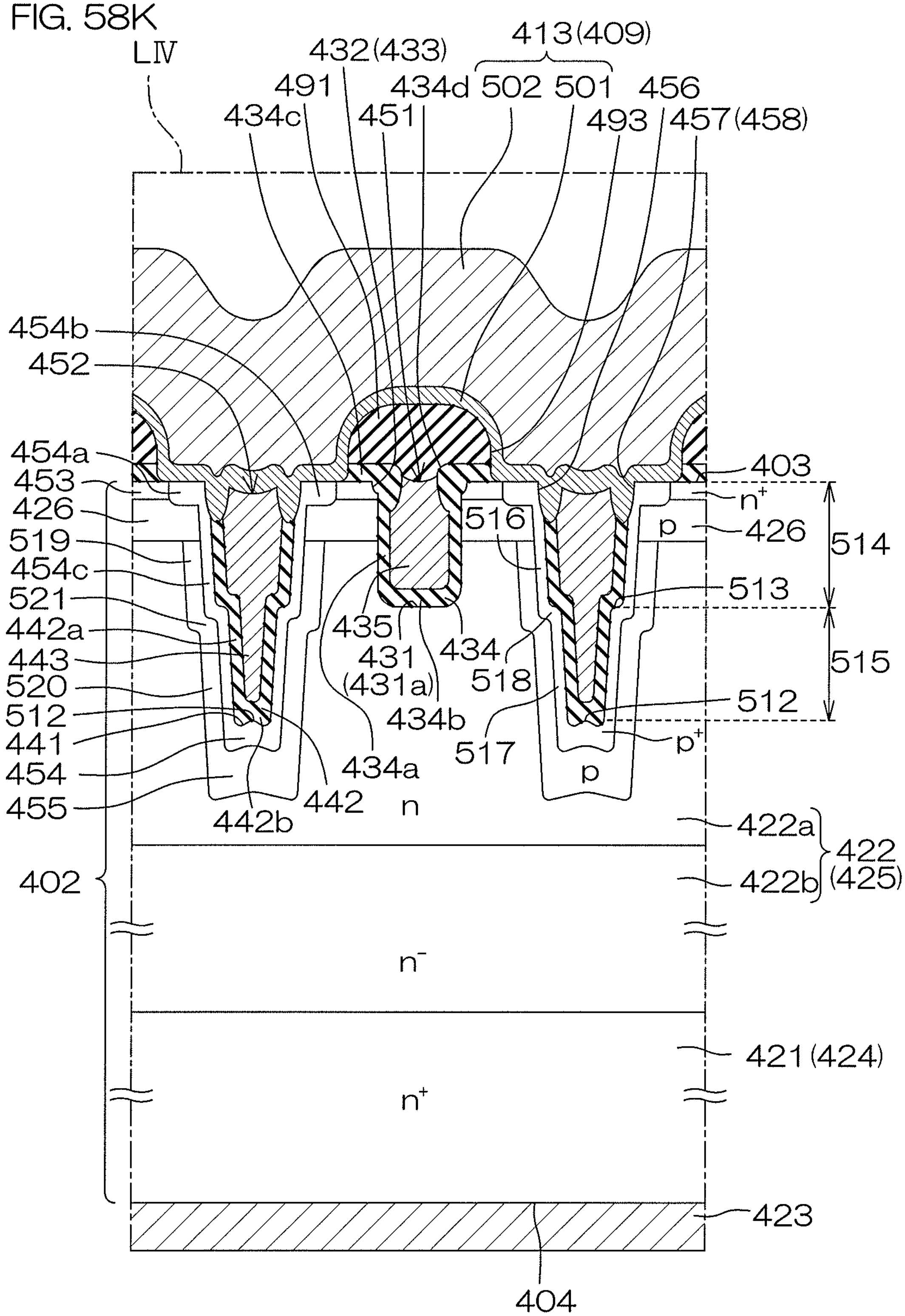

FIG. 58K is a sectional view of a region corresponding to FIG. 54 and is a sectional view of a twelfth configuration example of source trenches 441. In the following, for structures described already, the same symbols shall be provided and description thereof shall be omitted, and just newly appearing structures shall be described.

Referring to FIG. 58K, the source trench 441 may have one or a plurality of the step portions 513 protruding toward the inner region of the source trench 441 at the intermediate portion in the depth direction. The source trench 441 has one step portion 513, in the present configuration example.

The step portion 513 is positioned on substantially the same plane as the bottom wall of a gate trench 431, in the present configuration example. The step portion 513 may be positioned at the first main surface 403 side of the SiC semiconductor layer 402 with respect to the bottom wall of the gate trench 431. The step portion 513 may be positioned at the second main surface 404 side of the SiC semiconductor layer 402 with respect to the bottom wall of the gate trench 431.

More specifically, the source trench 441 includes the first portion 514 and the second portion 515 mutually differing in opening width with the step portion 513 as a boundary. The first portion 514 is formed in a region of the source trench 441 at the opening side.

The first portion 514 forms the opening portion of the source trench 441. The first portion 514 may be formed in a tapered shape that narrows in opening width from the opening side toward the step portion 513 of the source trench 441.

The second portion 515 has an opening width smaller than the opening width of the first portion 514. The second portion 515 is formed in a region of the source trench 441 at a bottom wall side. The second portion 515 forms the bottom wall of the source trench 441.

The second portion 515 may be formed in a tapered shape that narrows in opening width from the step portion 513 toward the bottom wall of the source trench 441. The source trench 441 may have the projecting portion 512 projecting toward the opening side at the bottom wall.

The portion of the source insulating layer 442 along the bottom wall of the source trench 441 (that is, the second region 442*b*) may project toward the opening side along the projecting portion 512 of the source trench 441.

The bottom portion of the contact region 454 may be formed in a concavely curved shape that is recessed toward the first main surface 403 side of the SiC semiconductor layer 402. The portion of the contact region 454 along the side wall of the source trench 441 may have the first region 516, the second region 517, and the step portion region 518 in conformance to the side wall of the source trench 441.

The first region 516 of the contact region 454 covers the first portion 514 of the source trench 441. The first region 516 of the contact region 454 is inclined with respect to the first main surface 403 of the SiC semiconductor layer 402 in conformance to the first portion 514 of the source trench 441.

The second region 517 of the contact region 454 covers the second portion 515 of the source trench 441. The second region 517 of the contact region 454 is inclined with respect to the first main surface 403 of the SiC semiconductor layer 402 in conformance to the second portion 515. The step portion region 518 of the contact region 454 connects the first region 516 and the second region 517 and covers the step portion 513 of the source trench 441.

The bottom portion of the deep well region 455 may be formed in a concavely curved shape that is recessed toward the first main surface 403 side of the SiC semiconductor layer 402. The portion of the deep well region 455 along the side wall of the source trench 441 may have the first region 519, the second region 520, and the step portion region 521 in conformance to the side wall of the source trench 441.

The first region 519 of the deep well region 455 covers the first portion 514 of the source trench 441. The first region 519 of the deep well region 455 is inclined with respect to the first main surface 403 of the SiC semiconductor layer 402 in conformance to the first portion 514 of the source trench 441.

The second region 520 of the deep well region 455 covers the second portion 515 of the source trench 441. The second region 520 of the deep well region 455 is inclined with respect to the first main surface 403 of the SiC semiconductor layer 402 in conformance to the second portion 515 of the source trench 441. The step portion region 521 of the deep well region 455 connects the first region 519 and the second region 520 and covers the step portion 513 of the source trench 441.

Figure 58L:
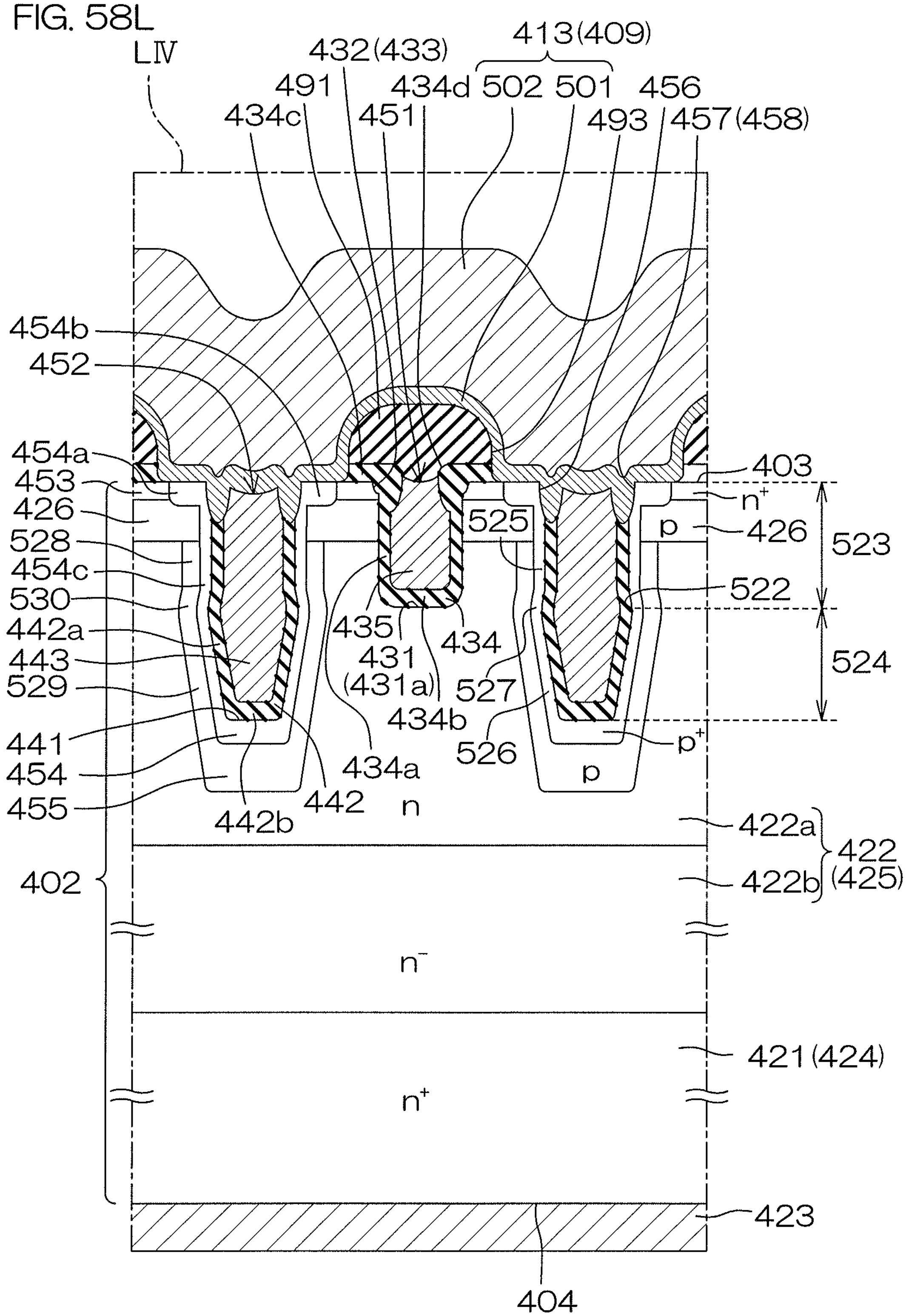

FIG. 58L is a sectional view of a region corresponding to FIG. 54 and is a sectional view of a thirteenth configuration example of source trenches 441. In the following, for structures described already, the same symbols shall be provided and description thereof shall be omitted, and just newly appearing structures shall be described.

Referring to FIG. 58L, the source trench 441 may have one or a plurality of step portions 522 protruding outward of the source trench 441 at the intermediate portion in the depth direction. The source trench 441 has one step portion 522, in the present configuration example.

The step portion 522 is positioned on substantially the same plane as the bottom wall of a gate trench 431, in the present configuration example. The step portion 522 may be positioned at the first main surface 403 side of the SiC semiconductor layer 402 with respect to the bottom wall of the gate trench 431. The step portion 522 may be positioned at the second main surface 404 side of the SiC semiconductor layer 402 with respect to the bottom wall of the gate trench 431.

More specifically, the source trench 441 includes a first portion 523 and a second portion 524 mutually differing in opening width with the step portion 522 as a boundary.

The first portion 523 is formed in a region of the source trench 441 at the opening side. The first portion 523 forms the opening portion of the source trench 441. The side wall of the first portion 523 is formed substantially perpendicular to the first main surface 403 of the SiC semiconductor layer 402, in the present configuration example.

The second portion 524 is formed in a region of the source trench 441 at a bottom wall side. The second portion 524 forms the bottom wall of the source trench 441. The second portion 524 protrudes outward of the source trench 441 with respect to the first portion 523.

The second portion 524 includes a portion having a wider opening width than an opening width of the first portion 523. The second portion 524 is formed in a tapered shape that narrows in opening width from the step portion 522 toward the bottom wall of the source trench 441. The bottom wall of the source trench 441 may be formed parallel to the first main surface 403 of the SiC semiconductor layer 402.

The bottom portion of the contact region 454 may be formed parallel to the bottom wall of the source trench 441. The portion of the contact region 454 along the side wall of the source trench 441 may have a first region 525, a second region 526, and a step portion region 527 in conformance to the side wall of the source trench 441.

The first region 525 of the contact region 454 covers the first portion 523 of the source trench 441. The second region 526 of the contact region 454 covers the second portion 524 of the source trench 441.

The second region 526 of the contact region 454 is inclined with respect to the first main surface 403 of the SiC semiconductor layer 402 in conformance to the second portion 524 of the source trench 441. The step portion region 527 of the contact region 454 connects the first region 525 and the second region 526 and covers the step portion 522 of the source trench 441.

The bottom portion of the deep well region 455 may be formed parallel to the bottom wall of the source trench 441. The portion of the deep well region 455 along the side wall of the source trench 441 may have a first region 528, a second region 529, and a step portion region 530 in conformance to the side wall of the source trench 441.

The first region 528 of the deep well region 455 covers the first portion 523 of the source trench 441. The second region 529 of the deep well region 455 covers the second portion 524 of the source trench 441.

The second region 529 of the deep well region 455 is inclined with respect to the first main surface 403 of the SiC semiconductor layer 402 in conformance to the second portion 524 of the source trench 441. The step portion region 530 of the deep well region 455 connects the first region 528 and the second region 529 and covers the step portion 522 of the source trench 441.

Figure 58M:
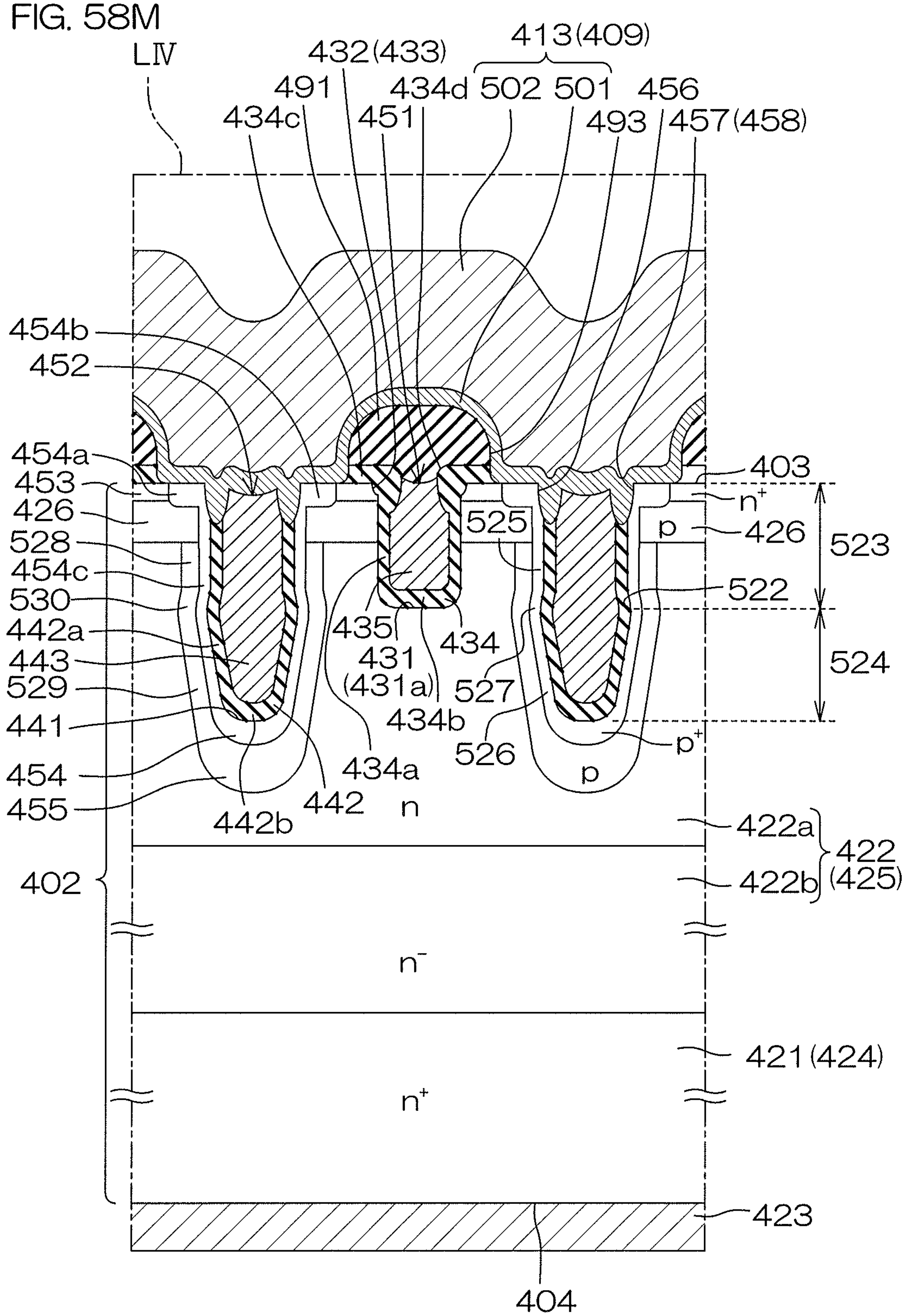

FIG. 58M is a sectional view of a region corresponding to FIG. 54 and is a sectional view of a fourteenth configuration example of source trenches 441. In the following, for structures described already, the same symbols shall be provided and description thereof shall be omitted, and just newly appearing structures shall be described.

Referring to FIG. 58M, the source trench 441 may have one or a plurality of the step portions 522 protruding outward of the source trench 441 at the intermediate portion in the depth direction. The source trench 441 has one step portion 522, in the present configuration example.

The step portion 522 is positioned on substantially the same plane as the bottom wall of a gate trench 431, in the present configuration example. The step portion 522 may be positioned at the first main surface 403 side of the SiC semiconductor layer 402 with respect to the bottom wall of the gate trench 431. The step portion 522 may be positioned at the second main surface 404 side of the SiC semiconductor layer 402 with respect to the bottom wall of the gate trench 431.

More specifically, the source trench 441 includes the first portion 523 and the second portion 524 mutually differing in opening width with the step portion 522 as a boundary.

The first portion 523 is formed in a region of the source trench 441 at the opening side. The first portion 523 forms the opening portion of the source trench 441. The side wall of the first portion 523 is formed substantially perpendicular to the first main surface 403 of the SiC semiconductor layer 402, in the present configuration example.

The second portion 524 is formed in a region of the source trench 441 at a bottom wall side. The second portion 524 forms the bottom wall of the source trench 441. The second portion 524 protrudes outward of the source trench 441 with respect to the first portion 523.

The second portion 524 includes the portion having a wider opening width than the opening width of the first portion 523. The second portion 524 is formed in a tapered shape that narrows in opening width from the step portion 522 toward the bottom wall of the source trench 441. The bottom wall of the source trench 441 may be formed in a shape that is convexly curved toward the second main surface 404 side of the SiC semiconductor layer 402.

The bottom portion of the contact region 454 may be formed in a shape that is convexly curved toward the second main surface 404 side of the SiC semiconductor layer 402. The portion of the contact region 454 along the side wall of the source trench 441 may have the first region 525, the second region 526, and the step portion region 527 in conformance to the side wall of the source trench 441.

The first region 525 of the contact region 454 covers the first portion 523 of the source trench 441. The second region 526 of the contact region 454 covers the second portion 524 of the source trench 441.

The second region 526 of the contact region 454 is inclined with respect to the first main surface 403 of the SiC semiconductor layer 402 in conformance to the second portion 524 of the source trench 441. The step portion region 527 of the contact region 454 connects the first region 525 and the second region 526 and covers the step portion 522 of the source trench 441.

The bottom portion of the deep well region 455 may be formed in a shape that is convexly curved toward the second main surface 404 side of the SiC semiconductor layer 402. The portion of the deep well region 455 along the side wall of the source trench 441 may have the first region 528, the second region 529, and the step portion region 530 in conformance to the side wall of the source trench 441.

The first region 528 of the deep well region 455 covers the first portion 523 of the source trench 441. The second region 529 of the deep well region 455 covers the second portion 524 of the source trench 441.

The second region 529 of the deep well region 455 is inclined with respect to the first main surface 403 of the SiC semiconductor layer 402 in conformance to the second portion 524 of the source trench 441. The step portion region 530 of the deep well region 455 connects the first region 528 and the second region 529 and covers the step portion 522 of the source trench 441.

Figure 58N:
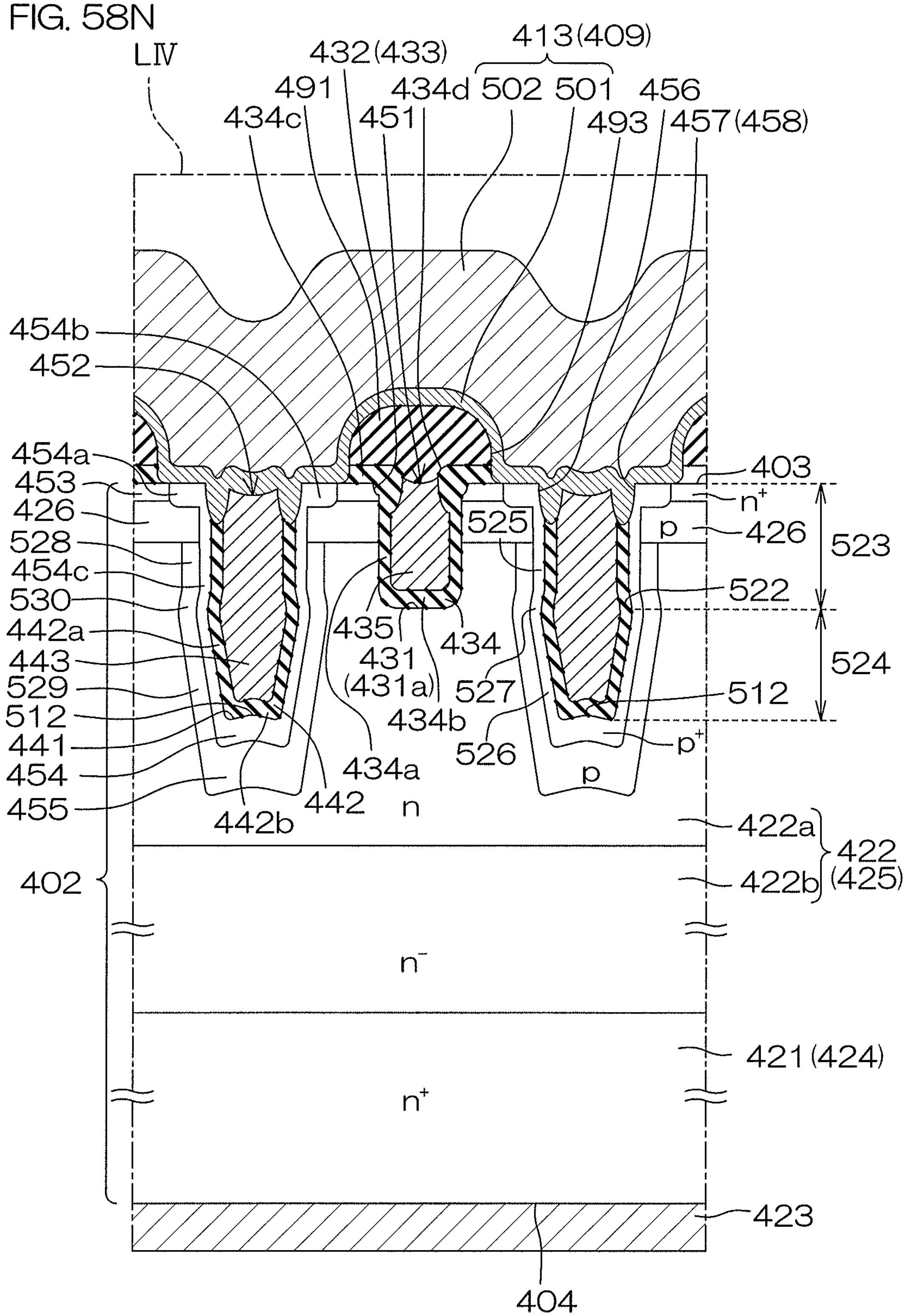
Figure 580:
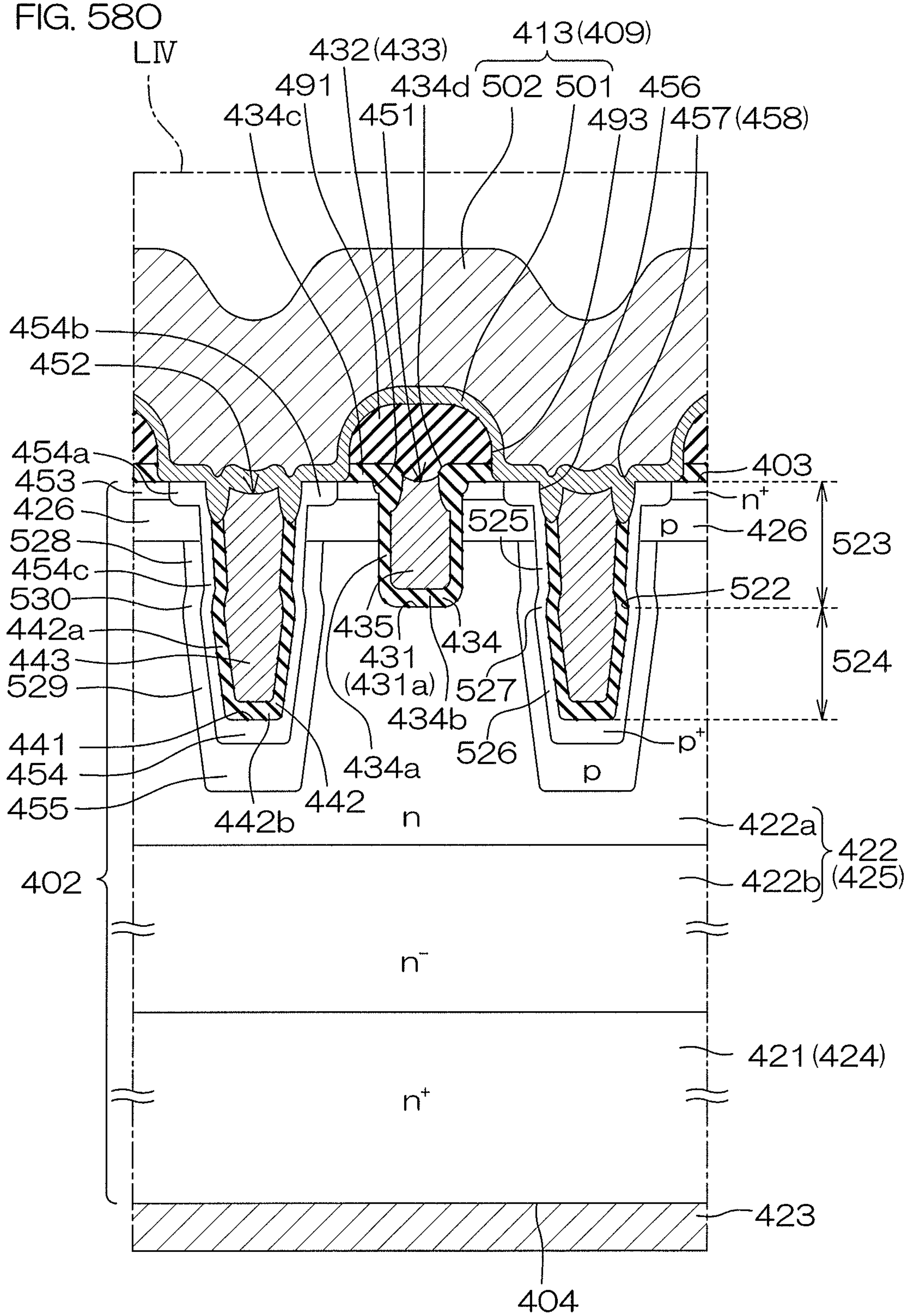

FIG. 58N is a sectional view of a region corresponding to FIG. 54 and is a sectional view of a fifteenth configuration example of source trenches 441. In the following, for structures described already, the same symbols shall be provided and description thereof shall be omitted, and just newly appearing structures shall be described.

Referring to FIG. 58N, the source trench 441 may have one or a plurality of the step portions 522 protruding outward of the source trench 441 at the intermediate portion in the depth direction. The source trench 441 has one step portion 522, in the present configuration example.

The step portion 522 is positioned on substantially the same plane as the bottom wall of a gate trench 431, in the present configuration example. The step portion 522 may be positioned at the first main surface 403 side of the SiC semiconductor layer 402 with respect to the bottom wall of the gate trench 431. The step portion 522 may be positioned at the second main surface 404 side of the SiC semiconductor layer 402 with respect to the bottom wall of the gate trench 431.

More specifically, the source trench 441 includes the first portion 523 and the second portion 524 mutually differing in opening width with the step portion 522 as a boundary.

The first portion 523 is formed in a region of the source trench 441 at the opening side. The first portion 523 forms the opening portion of the source trench 441. The side wall of the first portion 523 is formed substantially perpendicular to the first main surface 403 of the SiC semiconductor layer 402, in the present configuration example.

The second portion 524 is formed in a region of the source trench 441 at a bottom wall side. The second portion 524 forms the bottom wall of the source trench 441. The second portion 524 protrudes outward of the source trench 441 with respect to the first portion 523.

The second portion 524 includes the portion having a wider opening width than the opening width of the first portion 523. The second portion 524 is formed in a tapered shape that narrows in opening width from the step portion 522 toward the bottom wall of the source trench 441.

The source trench 441 may have the projecting portion 512 projecting toward the opening side at the bottom wall. The portion of the source insulating layer 442 along the bottom wall of the source trench 441 (that is, the second region 442*b*) may project toward the opening side along the projecting portion 512 of the source trench 441.

The bottom portion of the contact region 454 may be formed in a concavely curved shape that is recessed toward the first main surface 403 side of the SiC semiconductor layer 402. The portion of the contact region 454 along the side wall of the source trench 441 may have the first region 525, the second region 526, and the step portion region 527 in conformance to the side wall of the source trench 441.

The first region 525 of the contact region 454 covers the first portion 523 of the source trench 441. The second region 526 of the contact region 454 covers the second portion 524 of the source trench 441.

The second region 526 of the contact region 454 is inclined with respect to the first main surface 403 of the SiC semiconductor layer 402 in conformance to the second portion 524 of the source trench 441. The step portion region 527 of the contact region 454 connects the first region 525 and the second region 526 and covers the step portion 522 of the source trench 441.

The bottom portion of the deep well region 455 may be formed in a concavely curved shape that is recessed toward the first main surface 403 side of the SiC semiconductor layer 402. The portion of the deep well region 455 along the side wall of the source trench 441 may have the first region 528, the second region 529, and the step portion region 530 in conformance to the side wall of the source trench 441.

The first region 528 of the deep well region 455 covers the first portion 523 of the source trench 441. The second region 529 of the deep well region 455 covers the second portion 524 of the source trench 441.

The second region 529 of the deep well region 455 is inclined with respect to the first main surface 403 of the SiC semiconductor layer 402 in conformance to the second portion 524 of the source trench 441. The step portion region 530 of the deep well region 455 connects the first region 528 and the second region 529 and covers the step portion 522 of the source trench 441.

FIG. 58O is a sectional view of a region corresponding to FIG. 54 and is a sectional view of a sixteenth configuration example of source trenches 441. In the following, for structures described already, the same symbols shall be provided and description thereof shall be omitted, and just newly appearing structures shall be described.

Referring to FIG. 58O, the source trench 441 may have one or a plurality of the step portions 522 protruding outward of the source trench 441 at the intermediate portion in the depth direction. The source trench 441 has one step portion 522, in the present configuration example.

The step portion 522 is positioned on substantially the same plane as the bottom wall of a gate trench 431, in the present configuration example. The step portion 522 may be positioned at the first main surface 403 side of the SiC semiconductor layer 402 with respect to the bottom wall of the gate trench 431. The step portion 522 may be positioned at the second main surface 404 side of the SiC semiconductor layer 402 with respect to the bottom wall of the gate trench 431.

More specifically, the source trench 441 includes the first portion 523 and the second portion 524 mutually differing in opening width with the step portion 522 as a boundary. The first portion 523 is formed in a region of the source trench 441 at the opening side.

The first portion 523 forms the opening portion of the source trench 441. The first portion 523 is formed in a tapered shape that narrows in opening width from the opening side toward the step portion 522 of the source trench 441, in the present configuration example.

The second portion 524 is formed in a region of the source trench 441 at a bottom wall side. The second portion 524 forms the bottom wall of the source trench 441. The second portion 524 protrudes outward of the source trench 441 with respect to the first portion 523.

The second portion 524 includes the portion having a wider opening width than the opening width of the first portion 523. The second portion 524 is formed in a tapered shape that narrows in opening width from the step portion 522 toward the bottom wall of the source trench 441. The bottom wall of the source trench 441 may be formed parallel to the first main surface 403 of the SiC semiconductor layer 402.

The bottom portion of the contact region 454 may be formed parallel to the bottom wall of the source trench 441. The portion of the contact region 454 along the side wall of the source trench 441 may have the first region 525, the second region 526, and the step portion region 527 in conformance to the side wall of the source trench 441.

The first region 525 of the contact region 454 covers the first portion 523 of the source trench 441. The first region 525 of the contact region 454 is inclined with respect to the first main surface 403 of the SiC semiconductor layer 402 in conformance to the first portion 523 of the source trench 441.

The second region 526 of the contact region 454 covers the second portion 524 of the source trench 441. The second region 526 of the contact region 454 is inclined with respect to the first main surface 403 of the SiC semiconductor layer 402 in conformance to the second portion 524 of the source trench 441. The step portion region 527 of the contact region 454 connects the first region 525 and the second region 526 and covers the step portion 522 of the source trench 441.

The bottom portion of the deep well region 455 may be formed parallel to the bottom wall of the source trench 441. The portion of the deep well region 455 along the side wall of the source trench 441 may have the first region 528, the second region 529, and the step portion region 530 in conformance to the side wall of the source trench 441.

The first region 528 of the deep well region 455 covers the first portion 523 of the source trench 441. The first region 528 of the deep well region 455 is inclined with respect to the first main surface 403 of the SiC semiconductor layer 402 in conformance to the first portion 523 of the source trench 441.

The second region 529 of the deep well region 455 covers the second portion 524 of the source trench 441. The second region 529 of the deep well region 455 is inclined with respect to the first main surface 403 of the SiC semiconductor layer 402 in conformance to the second portion 524 of the source trench 441. The step portion region 530 of the deep well region 455 connects the first region 528 and the second region 529 and covers the step portion 522 of the source trench 441.

Figure 58P:
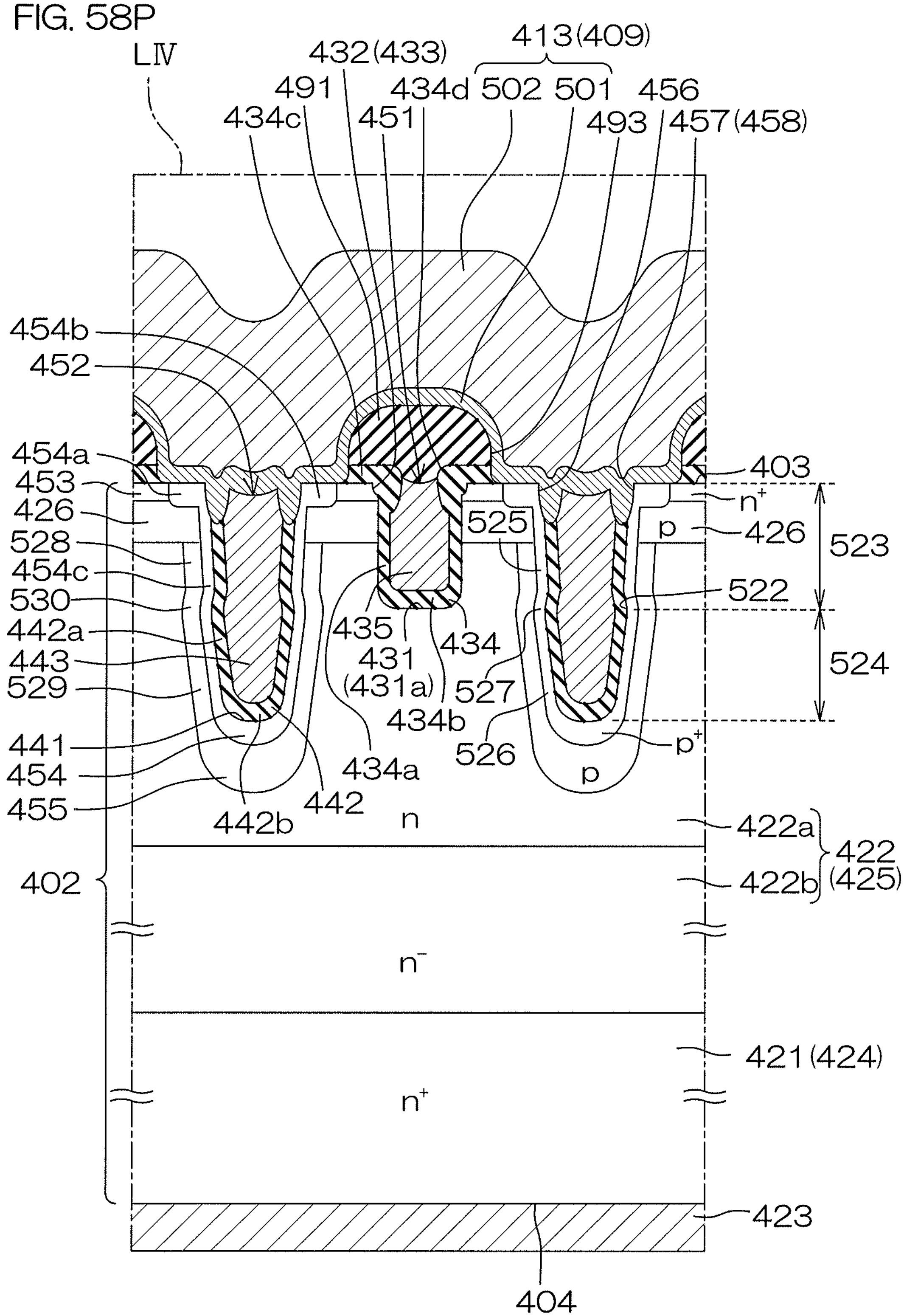
Figure 58Q:
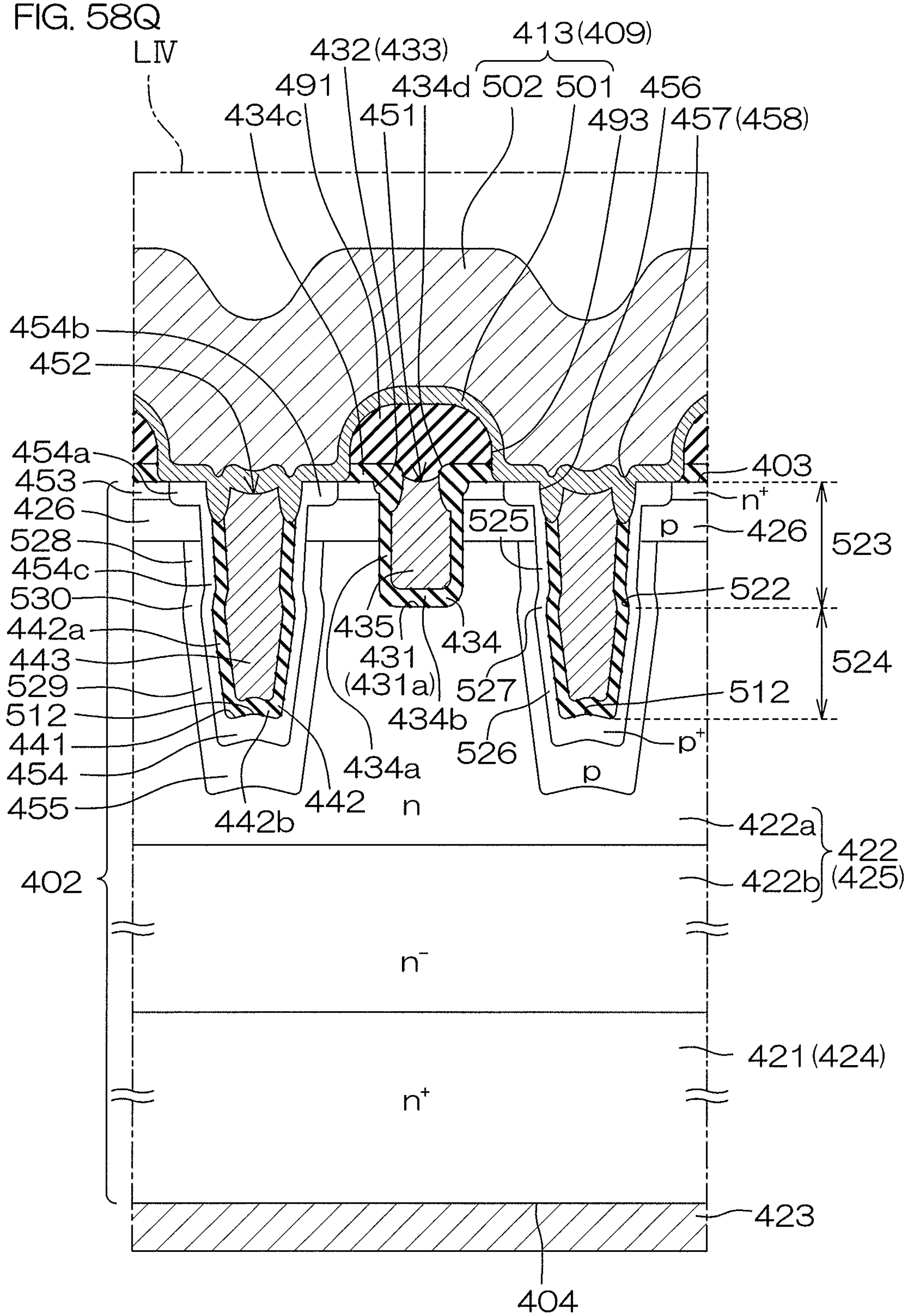

FIG. 58P is a sectional view of a region corresponding to FIG. 54 and is a sectional view of a seventeenth configuration example of source trenches 441. In the following, for structures described already, the same symbols shall be provided and description thereof shall be omitted, and just newly appearing structures shall be described.

Referring to FIG. 58P, the source trench 441 may have one or a plurality of the step portions 522 protruding outward of the source trench 441 at the intermediate portion in the depth direction. The source trench 441 has one step portion 522, in the present configuration example.

The step portion 522 is positioned on substantially the same plane as the bottom wall of a gate trench 431, in the present configuration example. The step portion 522 may be positioned at the first main surface 403 side of the SiC semiconductor layer 402 with respect to the bottom wall of the gate trench 431. The step portion 522 may be positioned at the second main surface 404 side of the SiC semiconductor layer 402 with respect to the bottom wall of the gate trench 431.

More specifically, the source trench 441 includes the first portion 523 and the second portion 524 mutually differing in opening width with the step portion 522 as a boundary. The first portion 523 is formed in a region of the source trench 441 at the opening side.

The first portion 523 forms the opening portion of the source trench 441. The first portion 523 is formed in a tapered shape that narrows in opening width from the opening side toward the step portion 522 of the source trench 441, in the present configuration example.

The second portion 524 is formed in a region of the source trench 441 at a bottom wall side. The second portion 524 forms the bottom wall of the source trench 441. The second portion 524 protrudes outward of the source trench 441 with respect to the first portion 523.

The second portion 524 includes the portion having a wider opening width than the opening width of the first portion 523. The second portion 524 is formed in a tapered shape that narrows in opening width from the step portion 522 toward the bottom wall of the source trench 441. The bottom wall of the source trench 441 may be formed in a shape that is convexly curved toward the second main surface 404 side of the SiC semiconductor layer 402.

The bottom portion of the contact region 454 may be formed in a shape that is convexly curved toward the second main surface 404 side of the SiC semiconductor layer 402. The portion of the contact region 454 along the side wall of the source trench 441 may have the first region 525, the second region 526, and the step portion region 527 in conformance to the side wall of the source trench 441.

The first region 525 of the contact region 454 covers the first portion 523 of the source trench 441. The first region 525 of the contact region 454 is inclined with respect to the first main surface 403 of the SiC semiconductor layer 402 in conformance to the first portion 523 of the source trench 441.

The second region 526 of the contact region 454 covers the second portion 524 of the source trench 441. The second region 526 of the contact region 454 is inclined with respect to the first main surface 403 of the SiC semiconductor layer 402 in conformance to the second portion 524 of the source trench 441. The step portion region 527 of the contact region 454 connects the first region 525 and the second region 526 and covers the step portion 522 of the source trench 441.

The bottom portion of the deep well region 455 may be formed in a shape that is convexly curved toward the second main surface 404 side of the SiC semiconductor layer 402. The portion of the deep well region 455 along the side wall of the source trench 441 may have the first region 528, the second region 529, and the step portion region 530 in conformance to the side wall of the source trench 441.

The first region 528 of the deep well region 455 covers the first portion 523 of the source trench 441. The first region 528 of the deep well region 455 is inclined with respect to the first main surface 403 of the SiC semiconductor layer 402 in conformance to the first portion 523 of the source trench 441.

The second region 529 of the deep well region 455 covers the second portion 524 of the source trench 441. The second region 529 of the deep well region 455 is inclined with respect to the first main surface 403 of the SiC semiconductor layer 402 in conformance to the second portion 524 of the source trench 441. The step portion region 530 of the deep well region 455 connects the first region 528 and the second region 529 and covers the step portion 522 of the source trench 441.

FIG. 58Q is a sectional view of a region corresponding to FIG. 54 and is a sectional view of an eighteenth configuration example of source trenches 441. In the following, for structures described already, the same symbols shall be provided and description thereof shall be omitted, and just newly appearing structures shall be described.

Referring to FIG. 58Q, the source trench 441 may have one or a plurality of the step portions 522 protruding outward of the source trench 441 at the intermediate portion in the depth direction. The source trench 441 has one step portion 522, in the present configuration example.

The step portion 522 is positioned on substantially the same plane as the bottom wall of a gate trench 431, in the present configuration example. The step portion 522 may be positioned at the first main surface 403 side of the SiC semiconductor layer 402 with respect to the bottom wall of the gate trench 431. The step portion 522 may be positioned at the second main surface 404 side of the SiC semiconductor layer 402 with respect to the bottom wall of the gate trench 431.

More specifically, the source trench 441 includes the first portion 523 and the second portion 524 mutually differing in opening width with the step portion 522 as a boundary.

The first portion 523 is formed in a region of the source trench 441 at the opening side. The first portion 523 forms the opening portion of the source trench 441. The first portion 523 is formed in a tapered shape that narrows in opening width from the opening side toward the step portion 522 of the source trench 441, in the present configuration example.

The second portion 524 is formed in a region of the source trench 441 at a bottom wall side. The second portion 524 forms the bottom wall of the source trench 441. The second portion 524 protrudes outward of the source trench 441 with respect to the first portion 523.

The second portion 524 includes the portion having a wider opening width than the opening width of the first portion 523. The second portion 524 is formed in a tapered shape that narrows in opening width from the step portion 522 toward the bottom wall of the source trench 441.

The source trench 441 may have the projecting portion 512 projecting toward the opening side at the bottom wall. The portion of the source insulating layer 442 along the bottom wall of the source trench 441 (that is, the second region 442_b_) may project toward the opening side along the projecting portion 512 of the source trench 441.

The bottom portion of the contact region 454 may be formed in a concavely curved shape that is recessed toward the first main surface 403 side of the SiC semiconductor layer 402. The portion of the contact region 454 along the side wall of the source trench 441 may have the first region 525, the second region 526, and the step portion region 527 in conformance to the side wall of the source trench 441.

The first region 525 of the contact region 454 covers the first portion 523 of the source trench 441. The first region 525 of the contact region 454 is inclined with respect to the first main surface 403 of the SiC semiconductor layer 402 in conformance to the first portion 523 of the source trench 441.

The second region 526 of the contact region 454 covers the second portion 524 of the source trench 441. The second region 526 of the contact region 454 is inclined with respect to the first main surface 403 of the SiC semiconductor layer 402 in conformance to the second portion 524 of the source trench 441. The step portion region 527 of the contact region 454 connects the first region 525 and the second region 526 and covers the step portion 522 of the source trench 441.

The bottom portion of the deep well region 455 may be formed in a concavely curved shape that is recessed toward the first main surface 403 side of the SiC semiconductor layer 402. The portion of the deep well region 455 along the side wall of the source trench 441 may have the first region 528, the second region 529, and the step portion region 530 in conformance to the side wall of the source trench 441.

The first region 528 of the deep well region 455 covers the first portion 523 of the source trench 441. The first region 528 of the deep well region 455 is inclined with respect to the first main surface 403 of the SiC semiconductor layer 402 in conformance to the first portion 523 of the source trench 441.

The second region 529 of the deep well region 455 covers the second portion 524 of the source trench 441. The second region 529 of the deep well region 455 is inclined with respect to the first main surface 403 of the SiC semiconductor layer 402 in conformance to the second portion 524 of the source trench 441. The step portion region 530 of the deep well region 455 connects the first region 528 and the second region 529 and covers the step portion 522 of the source trench 441.

With FIG. 58A to FIG. 58Q, configurations where the source trenches 441 according to the second configuration example to the eighteenth configuration example are combined with the gate trenches 431 according to the first configuration example (see FIG. 54) were described.

However, a configuration where any one or any two or more of the source trenches 441 according to the first configuration example to the eighteenth configuration example (see FIG. 54 and FIG. 58A to FIG. 58Q) are combined with the gate trenches 431 according to the second configuration example (see FIG. 57A) may be adopted.

Also, a configuration where any one or any two or more of the source trenches 441 according to the first configuration example to the eighteenth configuration example (see FIG. 54 and FIG. 58A to FIG. 58Q) are combined with the gate trenches 431 according to the third configuration example (see FIG. 57B) may be adopted.

Also, a configuration where any one or any two or more of the source trenches 441 according to the first configuration example to the eighteenth configuration example (see FIG. 54 and FIG. 58A to FIG. 58Q) are combined with the gate trenches 431 according to the fourth configuration example (see FIG. 57C) may be adopted.

Also, a configuration where any one or any two or more of the source trenches 441 according to the first configuration example to the eighteenth configuration example (see FIG. 54 and FIG. 58A to FIG. 58Q) are combined with the gate trenches 431 according to the fifth configuration example (see FIG. 57D) may be adopted.

Also, a configuration where any one or any two or more of the source trenches 441 according to the first configuration example to the eighteenth configuration example (see FIG. 54 and FIG. 58A to FIG. 58Q) are combined with the gate trenches 431 according to the sixth configuration example (see FIG. 57E) may be adopted.

Also, at least two or more of the source trenches 441 according to the first configuration example to the eighteenth configuration example (see FIG. 54 and FIG. 57A to FIG. 57E) may be formed at the same time in the first main surface 403 of the SiC semiconductor layer 402.

Figure 59A:
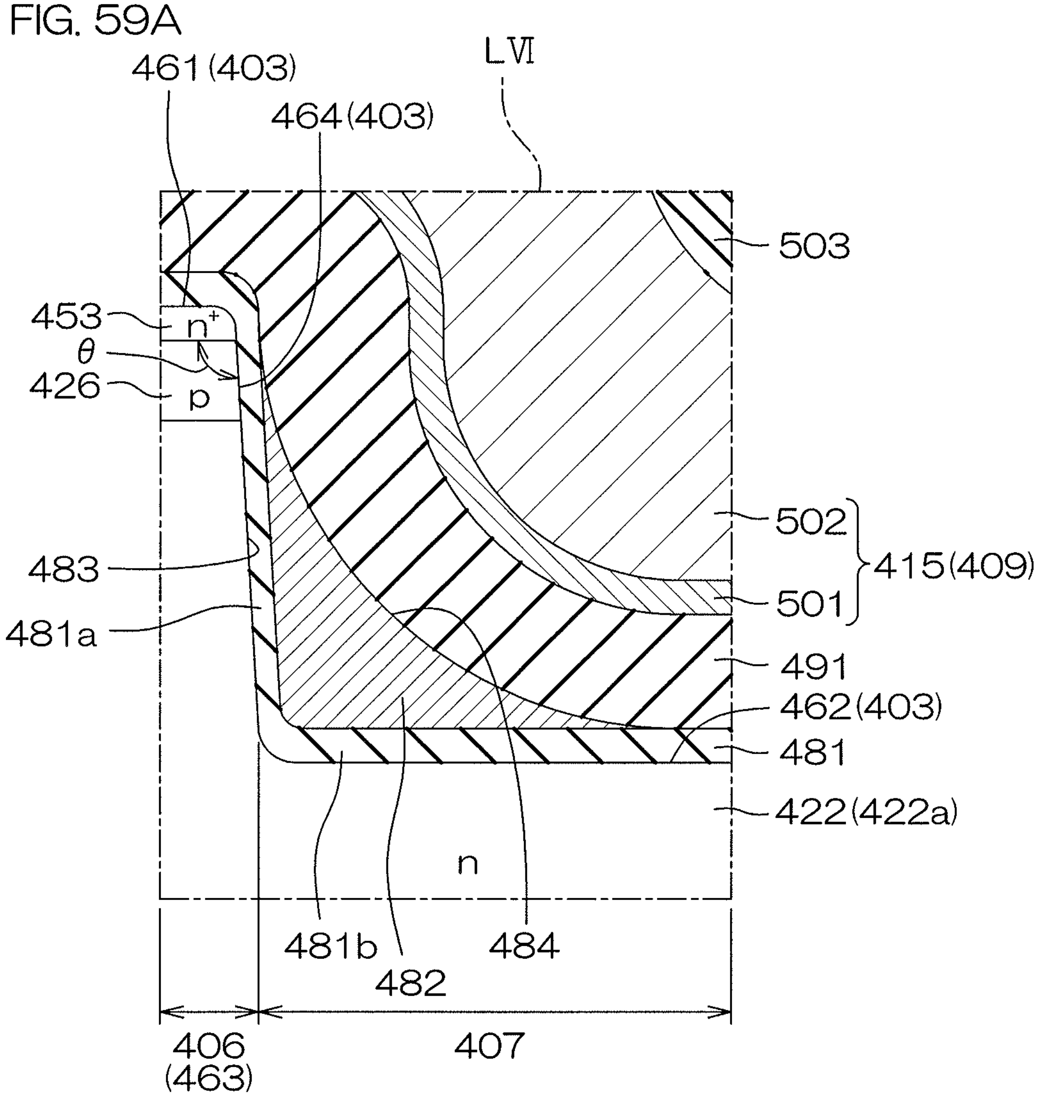
FIG. 59A is an enlarged view of a region corresponding to FIG. 56 and is an enlarged view of a second configuration example of the active side wall.
Figure 59B:
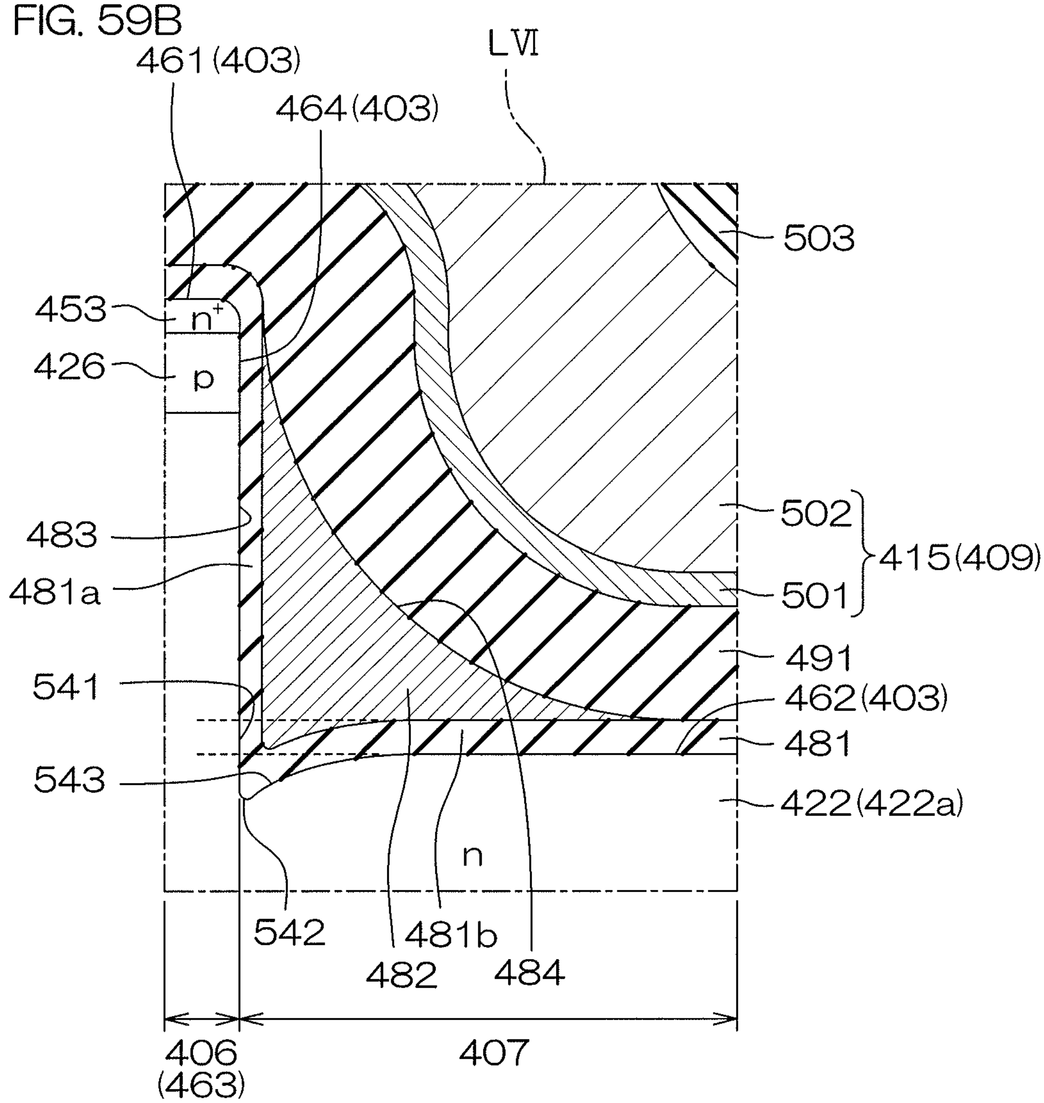
FIG. 59B is an enlarged view of a region corresponding to FIG. 56 and is an enlarged view of a third configuration example of the active side wall.
Figure 59C:
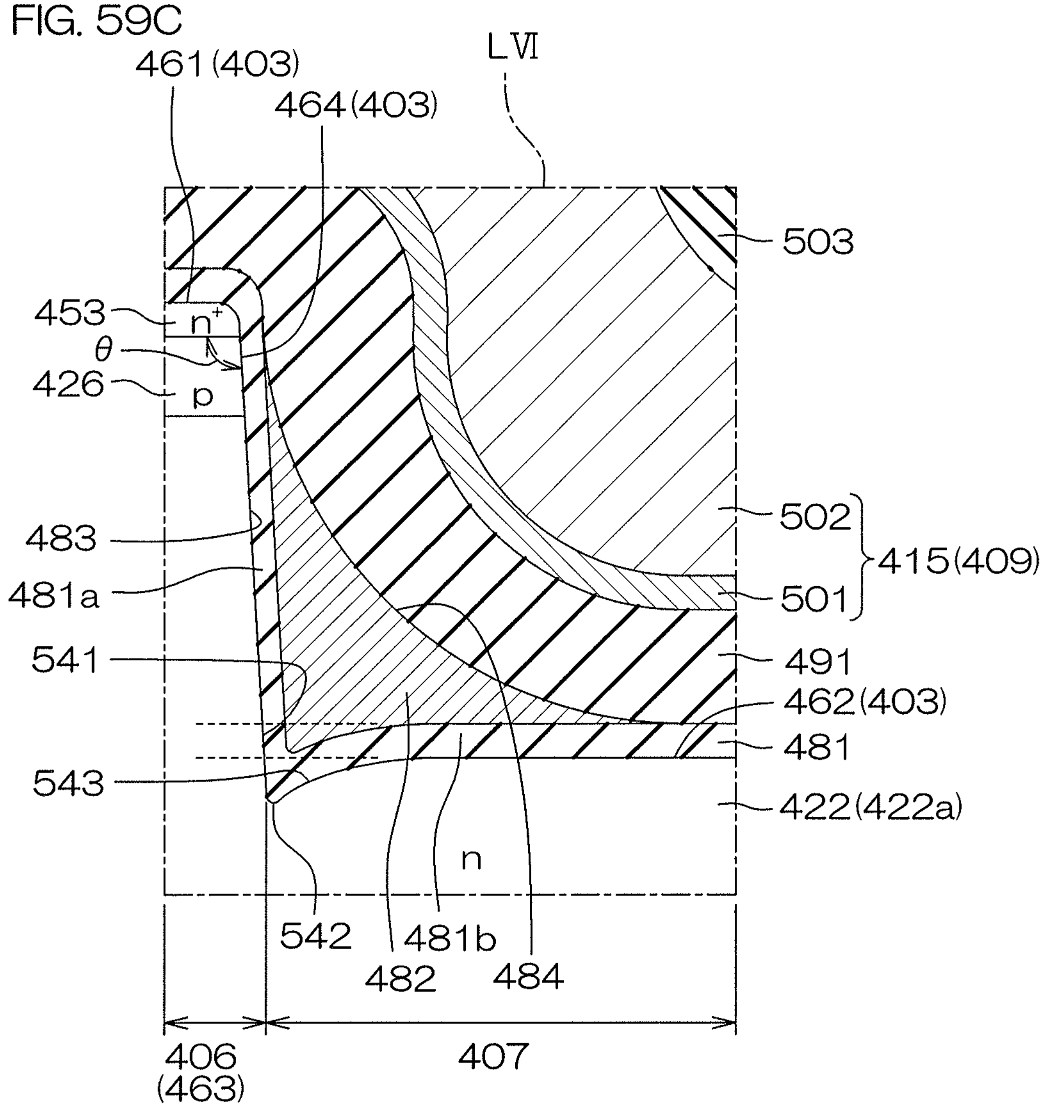
FIG. 59C is an enlarged view of a region corresponding to FIG. 56 and is an enlarged view of a fourth configuration example of the active side wall.

Other configurations of the active side wall 464 shall now be described. As shown in FIG. 59A to FIG. 59C, the active side wall 464 may take on any of various configurations. The configurations shown in FIG. 59A to FIG. 59C are configurations obtained by adjusting treatment conditions in a step of forming the active side wall 464.

FIG. 59A is an enlarged view of a region corresponding to FIG. 56 and is an enlarged view of a second configuration example of an active side wall 464. In the following, for structures described already, the same symbols shall be provided and description thereof shall be omitted, and just newly appearing structures shall be described.

Referring to FIG. 59A, the active side wall 464 may have an inclining surface that inclines downwardly from the active main surface 461 toward the outer main surface 462. In this case, an inclination angle θ of the active side wall 464 may exceed 90° and be not more than 135°. The inclination angle θ is the angle that the active side wall 464 forms with the active main surface 461 inside the SiC semiconductor layer 402.

The inclination angle θ may exceed 90° and be not more than 120°. The inclination angle θ may exceed 90° and be not more than 110°. The inclination angle θ may exceed 90° and be not more than 110°. The inclination angle θ may exceed 90° and be not more than 100°. The inclination angle θ may exceed 90° and be not more than 95°.

FIG. 59B is an enlarged view of a region corresponding to FIG. 56 and is an enlarged view of a third configuration example of an active side wall 464. In the following, for structures described already, the same symbols shall be provided and description thereof shall be omitted, and just newly appearing structures shall be described.

Referring to FIG. 59B, the active side wall 464 may have an extension portion 541 positioned at the second main surface 404 side of the SiC semiconductor layer 402 with respect to the outer main surface 462.

More specifically, a recess portion 543 recessed to the second main surface 404 side of the SiC semiconductor layer 402 with respect to the outer main surface 462 is formed at a corner portion 542 connecting the active side wall 464 and the outer main surface 462. The extension portion 541 of the active side wall 464 is formed by an inner wall of the recess portion 543.

The outer insulating layer 481 enters into the recess portion 543 from above the outer main surface 462. An entirety of the side wall structure 482 may be positioned higher than the outer main surface 462 of the outer region 407. The side wall structure 482 may have a portion positioned at the second main surface 404 side of the SiC semiconductor layer 402 with respect to the outer main surface 462 inside the recess portion 543.

FIG. 59C is an enlarged view of a region corresponding to FIG. 56 and is an enlarged view of a fourth configuration example of an active side wall 464. In the following, for structures described already, the same symbols shall be provided and description thereof shall be omitted, and just newly appearing structures shall be described.

Referring to FIG. 59C, the active side wall 464 may have the inclining surface that inclines downwardly from the active main surface 461 toward the outer main surface 462. In this case, the inclination angle θ of the active side wall 464 may exceed 90° and be not more than 135°. The inclination angle θ is the angle that the active side wall 464 forms with the active main surface 461 inside the SiC semiconductor layer 402.

The inclination angle θ may exceed 90° and be not more than 120°. The inclination angle θ may exceed 90° and be not more than 110°. The inclination angle θ may exceed 90° and be not more than 110°. The inclination angle θ may exceed 90° and be not more than 100°. The inclination angle θ may exceed 90° and be not more than 95°.

Also, the active side wall 464 may have the extension portion 541 positioned at the second main surface 404 side of the SiC semiconductor layer 402 with respect to the outer main surface 462. More specifically, the recess portion 543 recessed to the second main surface 404 side of the SiC semiconductor layer 402 with respect to the outer main surface 462 is formed at the corner portion 542 connecting the active side wall 464 and the outer main surface 462. The extension portion 541 of the active side wall 464 is formed by the inner wall of the recess portion 543.

The outer insulating layer 481 enters into the recess portion 543 from above the outer main surface 462. The entirety of the side wall structure 482 may be positioned higher than the outer main surface 462. The side wall structure 482 may have a portion positioned at the second main surface 404 side of the SiC semiconductor layer 402 with respect to the outer main surface 462 inside the recess portion 543.

Figure 60A:
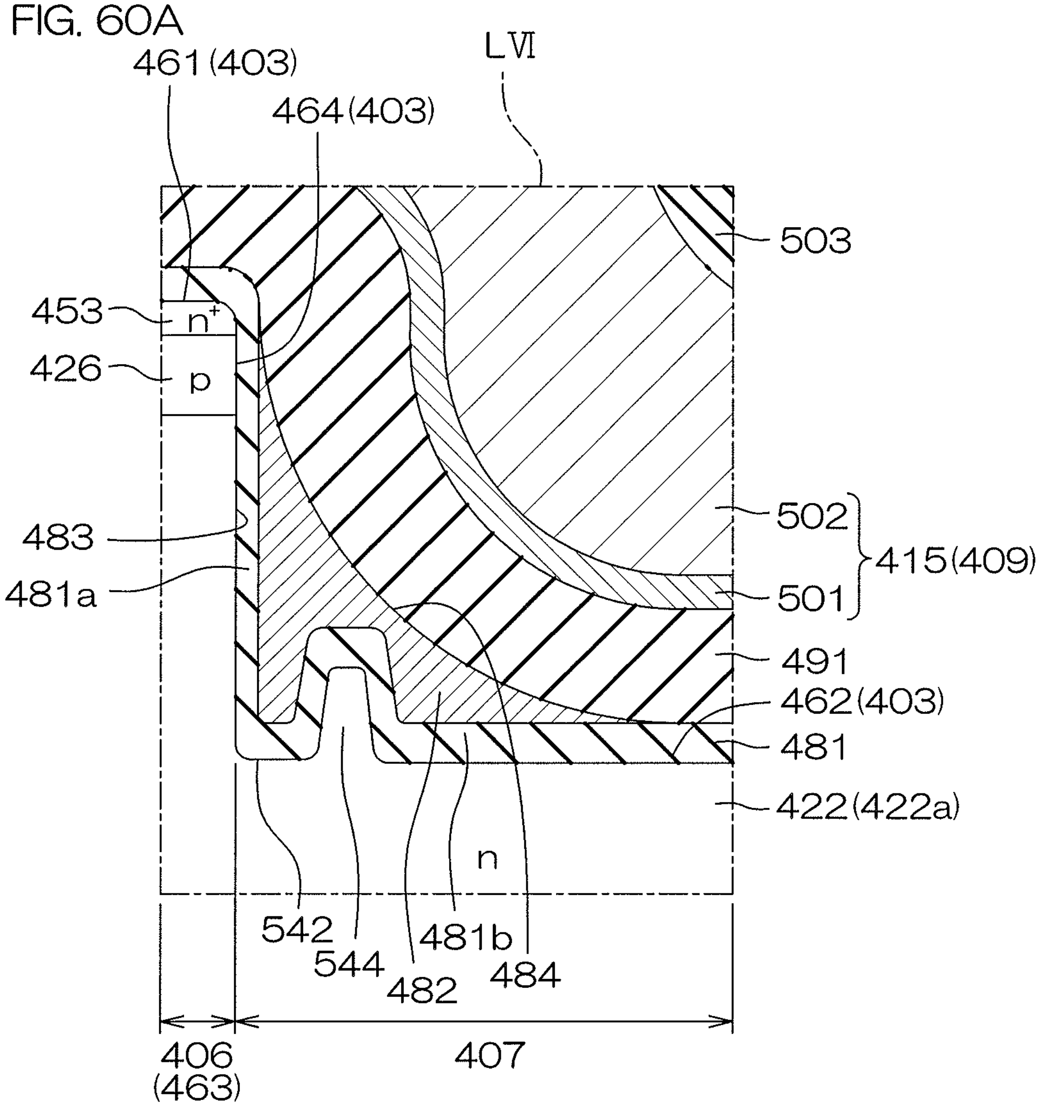
FIG. 60A is an enlarged view of a region corresponding to FIG. 56 and is an enlarged view of a second configuration example of the outer main surface.
Figure 60B:
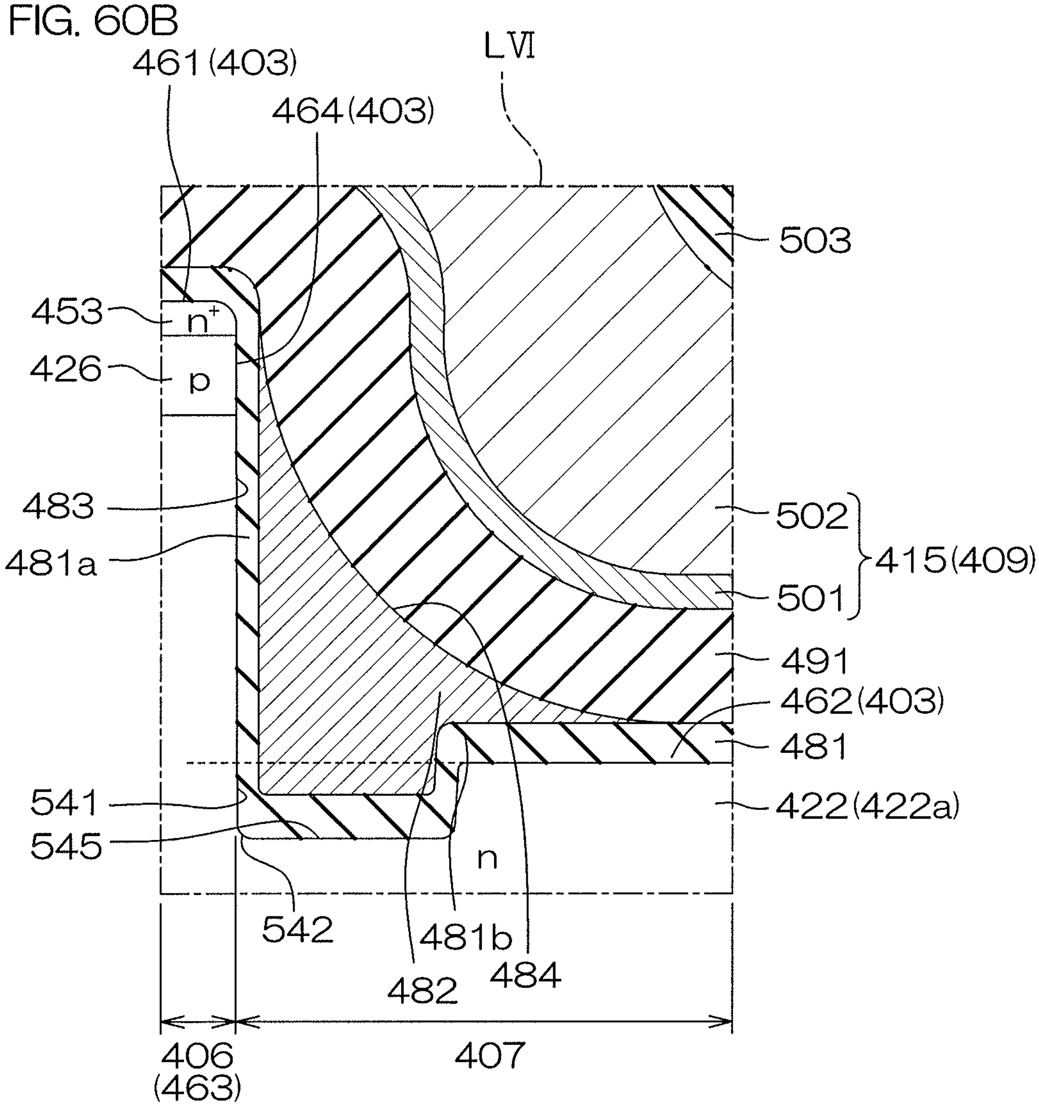
FIG. 60B is an enlarged view of a region corresponding to FIG. 56 and is an enlarged view of a third configuration example of the outer main surface.
Figure 60C:
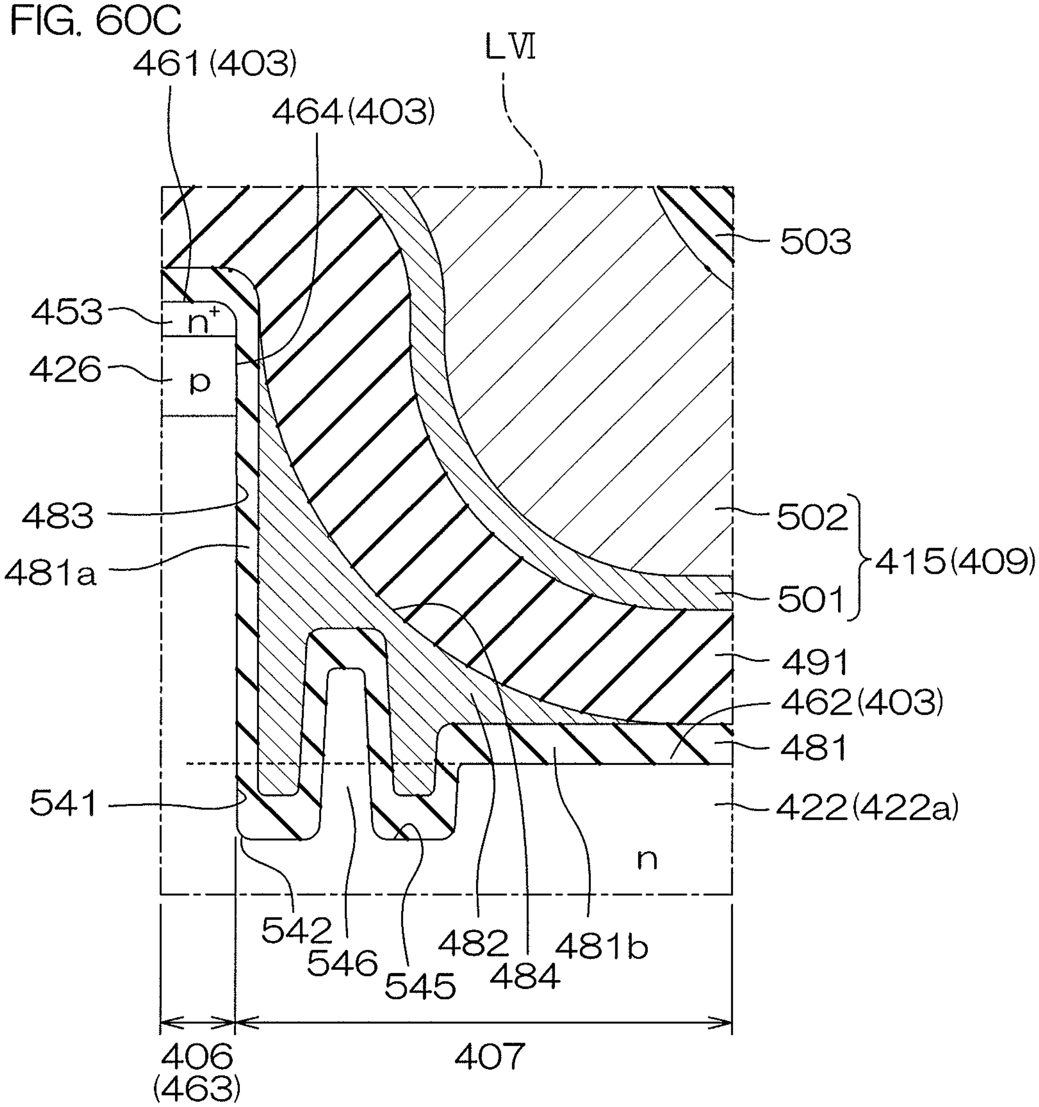
FIG. 60C is an enlarged view of a region corresponding to FIG. 56 and is an enlarged view of a fourth configuration example of the outer main surface.

Other configurations of the outer main surface 462 shall now be described. As shown in FIG. 60A to FIG. 60C, the outer main surface 462 may take on any of various configurations. The configurations shown in FIG. 60A to FIG. 60C are configurations obtained by adjusting treatment conditions in a step of forming the outer region 407.

FIG. 60A is an enlarged view of a region corresponding to FIG. 56 and is an enlarged view of a second configuration example of the outer main surface 462. In the following, for structures described already, the same symbols shall be provided and description thereof shall be omitted, and just newly appearing structures shall be described.

Referring to FIG. 60A, the outer main surface 462 of the outer region 407 includes one or a plurality of protrusions 544 projecting toward the active main surface 461 side at the corner portion 542 connecting the active side wall 464 and the outer main surface 462. An example where one protrusion 544 is formed is shown in FIG. 60A.

The outer insulating layer 481 covers an outer surface of the protrusion 544, in the present configuration example. The side wall structure 482 covers the outer surface of the protrusion 544 across the outer insulating layer 481. Lowering of film forming property due to the protrusion 544 can be suppressed by the side wall structure 482.

FIG. 60B is an enlarged view of a region corresponding to FIG. 56 and is an enlarged view of a third configuration example of the outer main surface 462. In the following, for structures described already, the same symbols shall be provided and description thereof shall be omitted, and just newly appearing structures shall be described.

Referring to FIG. 60B, the outer main surface 462 includes a recess portion 545 recessed toward the second main surface 404 side of the SiC semiconductor layer 402 at the corner portion 542 connecting the active side wall 464 and the outer main surface 462.

The outer insulating layer 481 covers an inner wall of the recess portion 545, in the present configuration example. The side wall structure 482 fills the recess portion 545 across the outer insulating layer 481. Lowering of film forming property due to the recess portion 545 can be suppressed by the side wall structure 482.

FIG. 60C is an enlarged view of a region corresponding to FIG. 56 and is an enlarged view of a fourth configuration example of the outer main surface 462. In the following, for structures described already, the same symbols shall be provided and description thereof shall be omitted, and just newly appearing structures shall be described.

Referring to FIG. 60C, the outer main surface 462 includes the recess portion 545 recessed toward the second main surface 404 side of the SiC semiconductor layer 402 at the corner portion 542 connecting the active side wall 464 and the outer main surface 462.

The outer main surface 462 further includes one or a plurality of protrusions 546 projecting upward from a bottom portion of the recess portion 545. An example where one protrusion 546 is formed is shown in FIG. 60C. The protrusion 546 projects higher than the outer main surface 462, in the present configuration example.

The outer insulating layer 481 covers the inner wall of the recess portion 545 and an outer surface of the protrusion 546, in the present configuration example. The side wall structure 482 covers the outer surface of the protrusion 546 and fills the recess portion 545 across the outer insulating layer 481. Lowering of film forming property due to the recess portion 545 and the protrusion 546 can be suppressed by the side wall structure 482.

The active side wall 464 according to any one of the first configuration example, the second configuration example, the third configuration example, and the fourth configuration example may be applied to the outer main surface 462 according to the first configuration example, the second configuration example, the third configuration example, or the fourth configuration example.

That is, with FIG. 60A, the configuration where the active side wall 464 according to the first configuration example (see FIG. 56) is combined with the outer main surface 462 according to the second configuration example was described. However, a configuration where the active side wall 464 according to any of the second configuration example to the fourth configuration example (see FIG. 59A to FIG. 59C) is combined with the outer main surface 462 according to the second configuration example may be adopted.

Also, with FIG. 60B, the configuration where the active side wall 464 according to the first configuration example (see FIG. 56) is combined with the outer main surface 462 according to the third configuration example was described. However, a configuration where the active side wall 464 according to any of the second configuration example to the fourth configuration example (see FIG. 59A to FIG. 59C) is combined with the outer main surface 462 according to the third configuration example may be adopted.

Also, with FIG. 60C, the configuration where the active side wall 464 according to the first configuration example (see FIG. 56) is combined with the outer main surface 462 according to the fourth configuration example was described. However, a configuration where the active side wall 464 according to any of the second configuration example to the fourth configuration example (see FIG. 59A to FIG. 59C) is combined with the outer main surface 462 according to the fourth configuration example may be adopted.

Other configurations of the side wall structure 482 shall now be described. As shown in FIG. 61A to FIG. 61F, the side wall structure 482 may take on any of various configurations. The configurations shown in FIG. 61A to FIG. 61F are configurations obtained by adjusting treatment conditions in a step of forming the side wall structure 482.

Figure 61A:
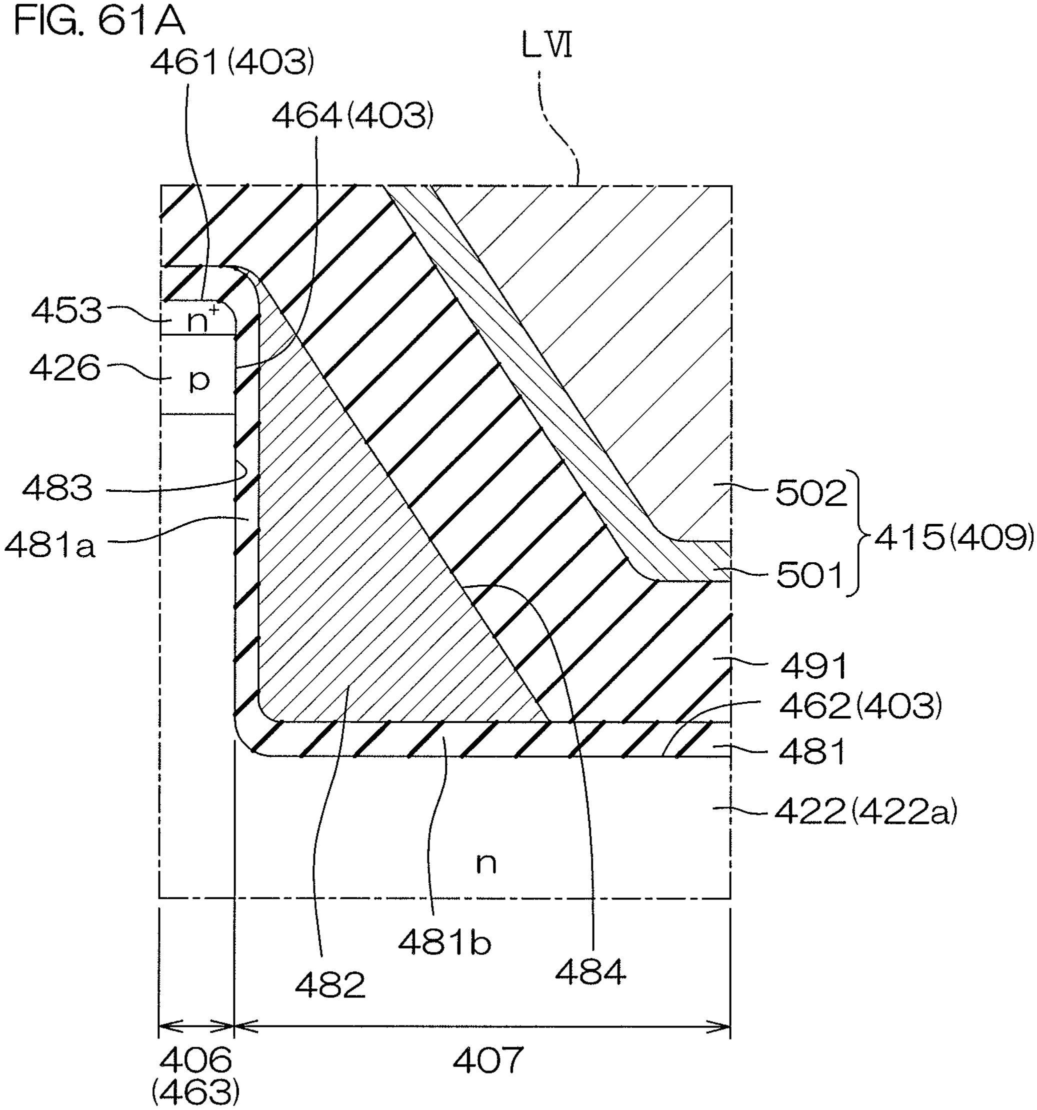
FIG. 61A is an enlarged view of a region corresponding to FIG. 56 and is an enlarged view of a second configuration example of the side wall.

FIG. 61A is an enlarged view of a region corresponding to FIG. 56 and is an enlarged view of a second configuration example of the side wall structure 482. In the following, for structures described already, the same symbols shall be provided and description thereof shall be omitted, and just newly appearing structures shall be described. An example where the side wall structure 482 covers the active side wall 464 according to the first configuration example is shown in FIG. 61A.

Referring to FIG. 61A, the inclining portion 484 of the side wall structure 482 may extend in a plane from the active main surface 461 side to the outer main surface 462 side. That is, the inclining portion 484 of the side wall structure 482 may extend rectilinearly from the active main surface 461 side to the outer main surface 462 side in the sectional view of FIG. 61A.

Figure 61B:
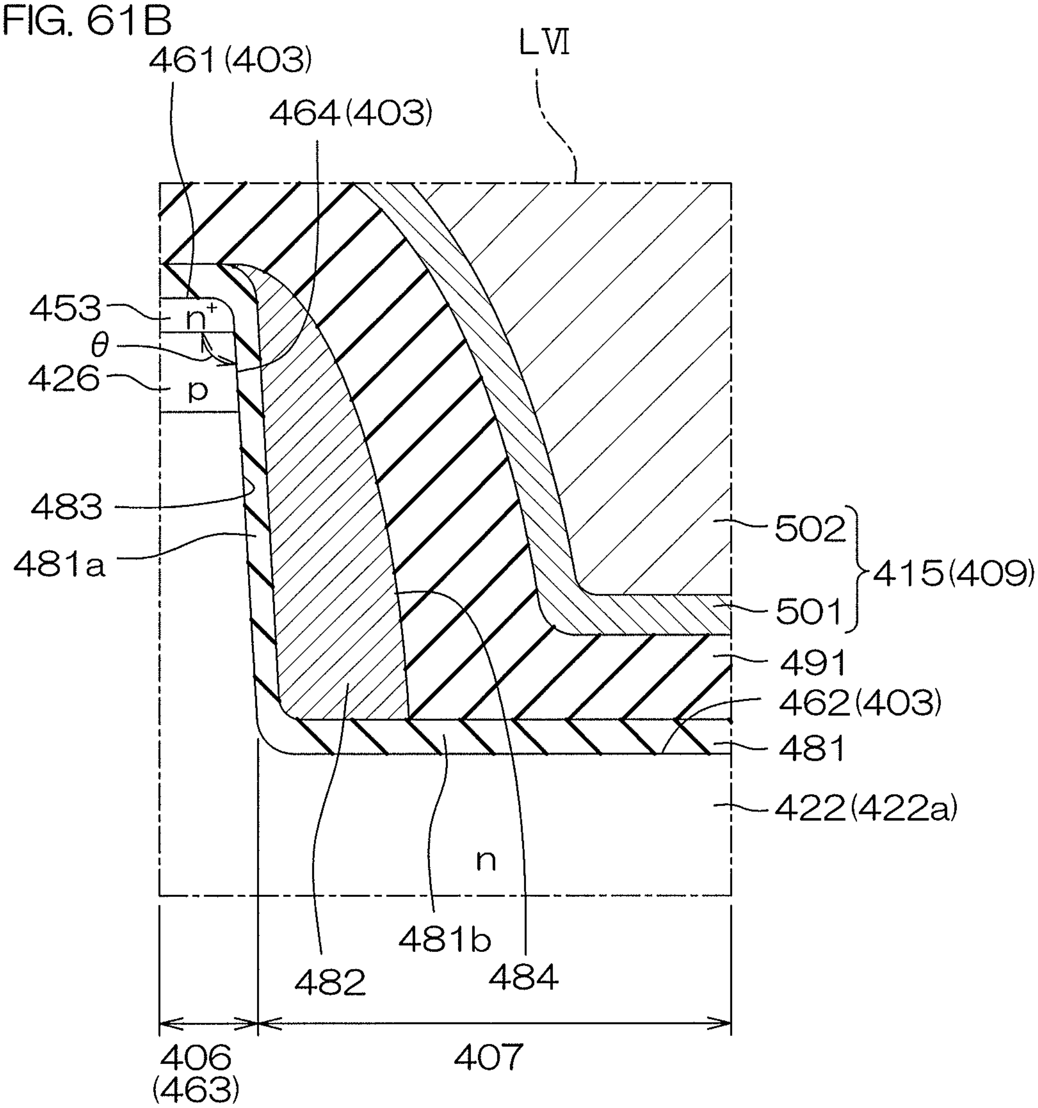
FIG. 61B is an enlarged view of a region corresponding to FIG. 56 and is an enlarged view of a third configuration example of the side wall.

FIG. 61B is an enlarged view of a region corresponding to FIG. 56 and is an enlarged view of a third configuration example of the side wall structure 482. In the following, for structures described already, the same symbols shall be provided and description thereof shall be omitted, and just newly appearing structures shall be described. An example where the side wall structure 482 covers the active side wall 464 according to the second configuration example is shown in FIG. 61B.

Referring to FIG. 61B, the inclining portion 484 of the side wall structure 482 may be formed in a shape that is convexly curved toward an opposite side to the SiC semiconductor layer 402.

Figure 61C:
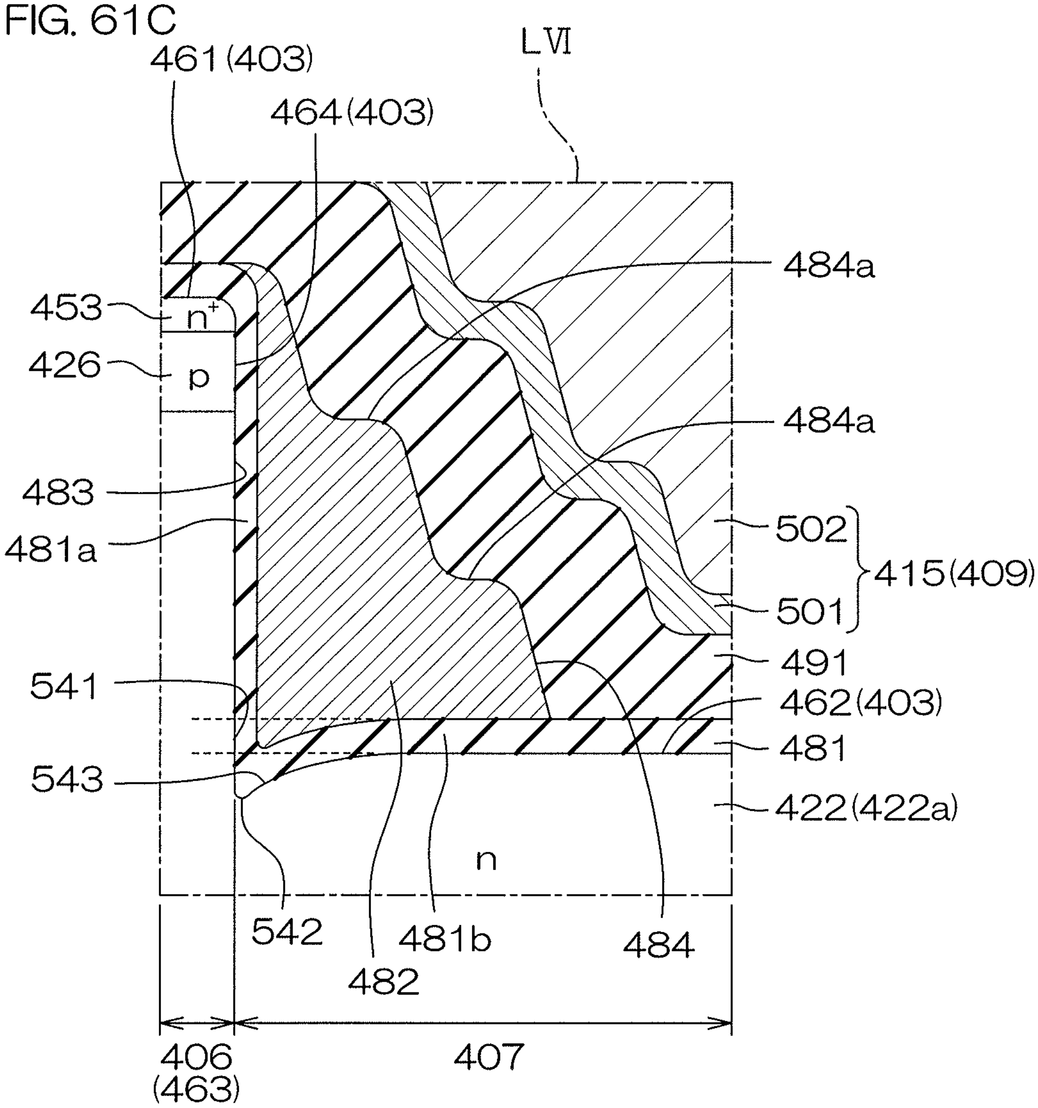
FIG. 61C is an enlarged view of a region corresponding to FIG. 56 and is an enlarged view of a fourth configuration example of the side wall.

FIG. 61C is an enlarged view of a region corresponding to FIG. 56 and is an enlarged view of a fourth configuration example of the side wall structure 482. In the following, for structures described already, the same symbols shall be provided and description thereof shall be omitted, and just newly appearing structures shall be described. An example where the side wall structure 482 covers the active side wall 464 according to the third configuration example is shown in FIG. 61C.

Referring to FIG. 61C, the inclining portion 484 of the side wall structure 482 may have one or a plurality of step portions 484*a* recessed toward the outer main surface 462 side. The inclining portion 484 of the side wall structure 482 may be formed as a set of stairs descending from the active main surface 461 toward the outer main surface 462. A surface area of the inclining portion 484 of the side wall structure 482 is increased by the one or plurality of step portions 484*a*.

A connection area of the upper layer structure with respect to the side wall structure 482 is thereby increased. A connection strength of the upper layer structure with respect to the side wall structure 482 can thereby be increased while improving flatness of the upper layer structure.

Figure 61D:
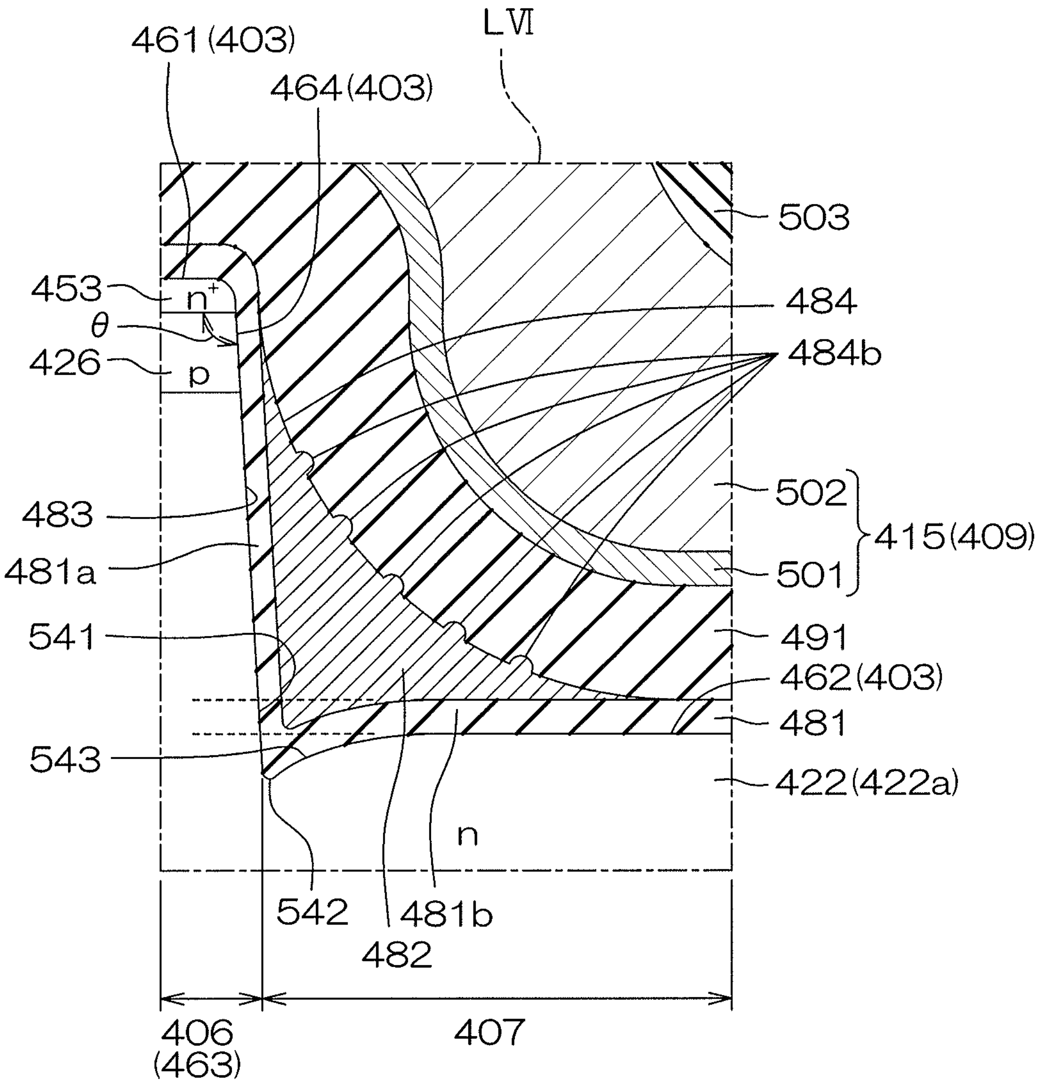
FIG. 61D is an enlarged view of a region corresponding to FIG. 56 and is an enlarged view of a fifth configuration example of the side wall.

FIG. 61D is an enlarged view of a region corresponding to FIG. 56 and is an enlarged view of a fifth configuration example of the side wall structure 482. In the following, for structures described already, the same symbols shall be provided and description thereof shall be omitted, and just newly appearing structures shall be described. An example where the side wall structure 482 covers the active side wall 464 according to the fourth configuration example is shown in FIG. 61D.

Referring to FIG. 61D, the inclining portion 484 of the side wall structure 482 includes a plurality of raised portions 484*b* raised toward an outer side of the side wall structure 482. The surface area of the inclining portion 484 of the side wall structure 482 is increased by the plurality of raised portions 484*b*.

The connection area of the upper layer structure with respect to the side wall structure 482 is thereby increased. The connection strength of the upper layer structure with respect to the side wall structure 482 can thereby be increased while improving flatness of the upper layer structure.

Figure 61E:
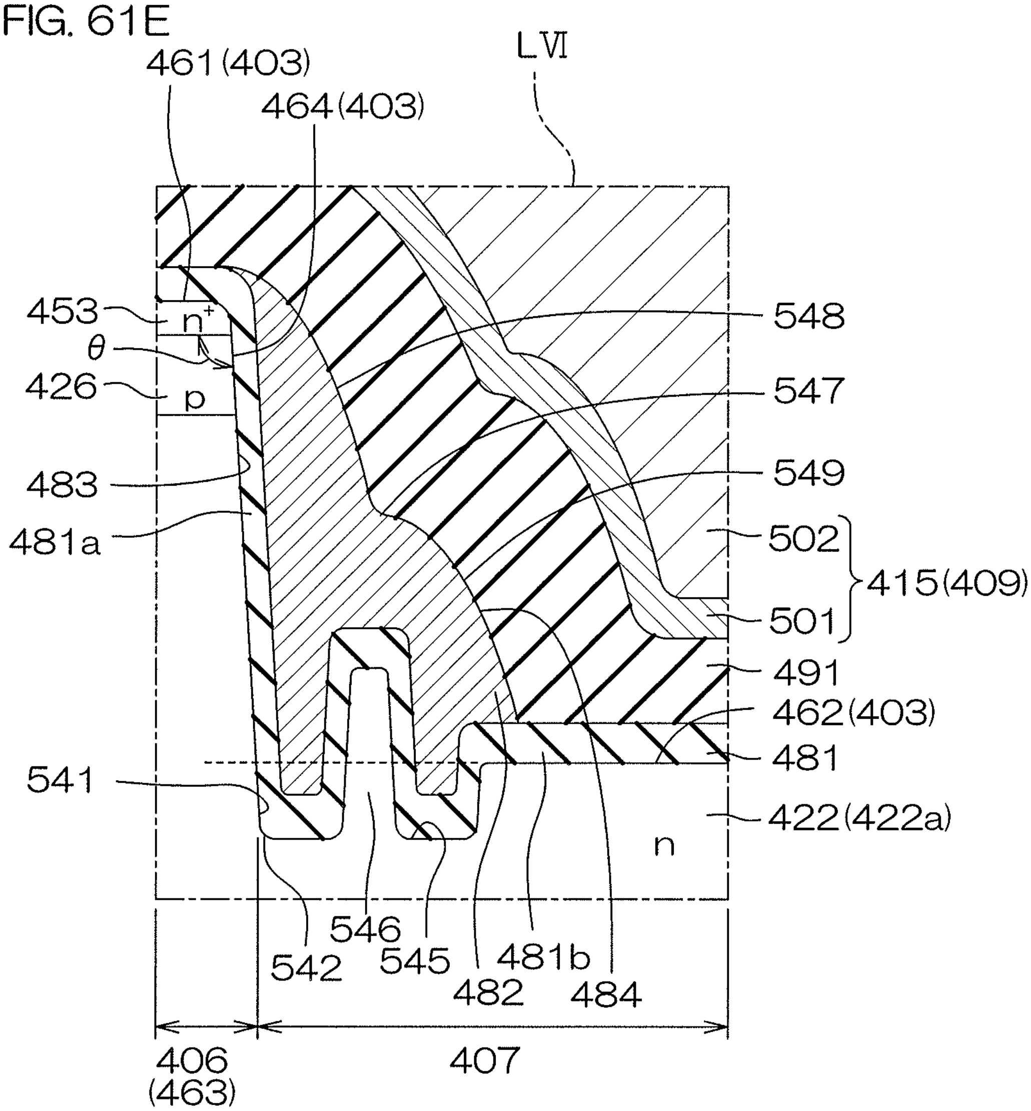
FIG. 61E is an enlarged view of a region corresponding to FIG. 56 and is an enlarged view of a sixth configuration example of the side wall.

FIG. 61E is an enlarged view of a region corresponding to FIG. 56 and is an enlarged view of a sixth configuration example of the side wall structure 482. In the following, for structures described already, the same symbols shall be provided and description thereof shall be omitted, and just newly appearing structures shall be described.

An example where the side wall structure 482 covers the outer main surface 462 according to the fourth configuration example is shown in FIG. 61E. Referring to FIG. 61E, the inclining portion 484 of the side wall structure 482 may be formed in a shape that is convexly curved toward the opposite side to the SiC semiconductor layer 402.

A step portion 547 may be formed at a portion of the inclining portion 484 of the side wall structure 482 positioned above a protrusion 546. More specifically, the side wall structure 482 includes a first portion 548 covering the active side wall 464, and a second portion 549 covering the protrusion 546. The step portion 547 of the side wall structure 482 connects the first portion 548 and the second portion 549.

Figure 61F:
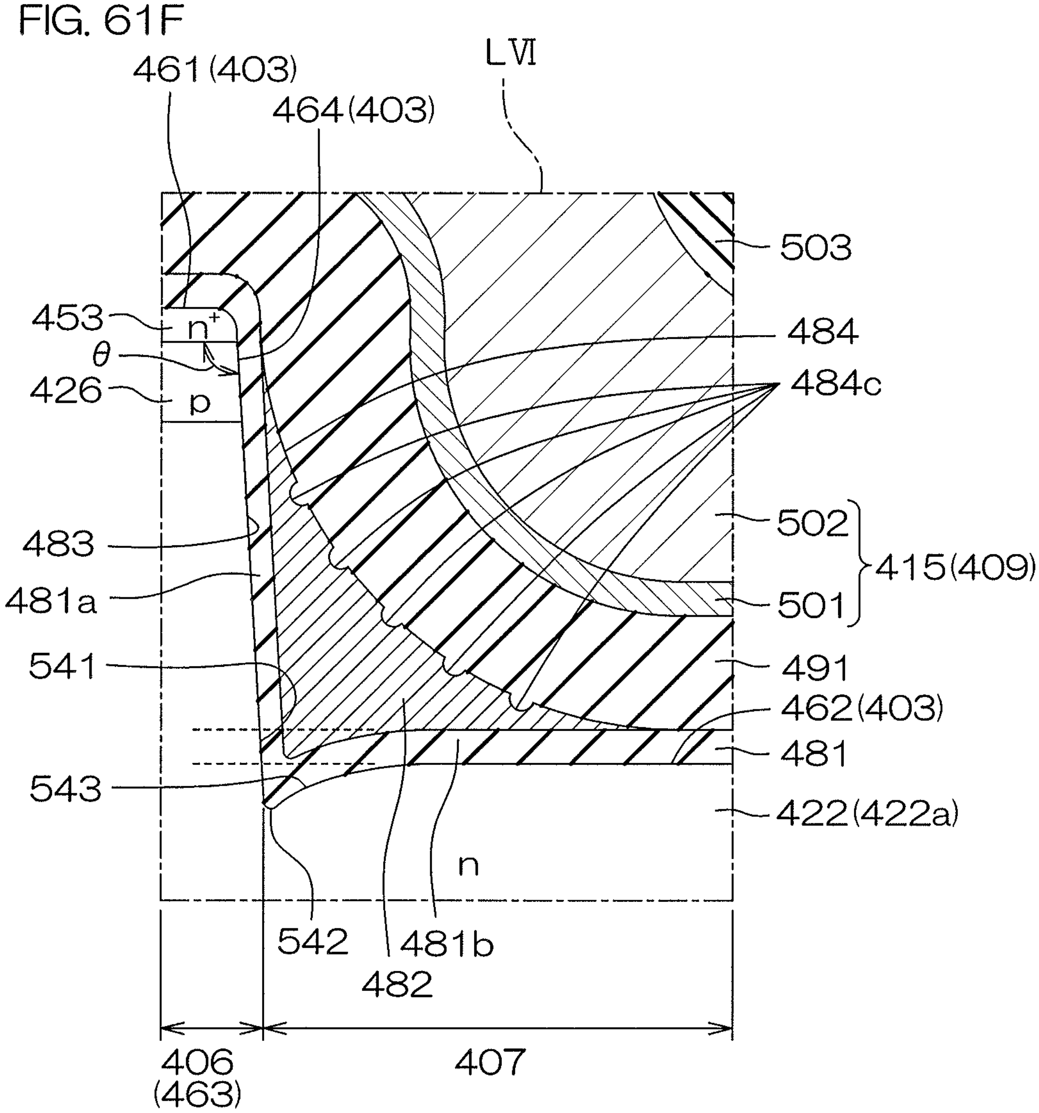
FIG. 61F is an enlarged view of a region corresponding to FIG. 56 and is an enlarged view of a seventh configuration example of the side wall.

FIG. 61F is an enlarged view of a region corresponding to FIG. 56 and is an enlarged view of a seventh configuration example of the side wall structure 482. In the following, for structures described already, the same symbols shall be provided and description thereof shall be omitted, and just newly appearing structures shall be described. An example where the side wall structure 482 covers the active side wall 464 according to the fourth configuration example is shown in FIG. 61F.

Referring to FIG. 61F, the inclining portion 484 of the side wall structure 482 includes a plurality of recesses 484*c* recessed toward the outer side of the side wall structure 482. The surface area of the inclining portion 484 of the side wall structure 482 is increased by the plurality of recesses 484*c*.

The connection area of the upper layer structure with respect to the side wall structure 482 is thereby increased. The connection strength of the upper layer structure with respect to the side wall structure 482 can thereby be increased while improving flatness of the upper layer structure.

Obviously, the side wall structure 482 according to any one of the first configuration example, the second configuration example, the third configuration example, the fourth configuration example, the fifth configuration example, the sixth configuration example, and the seventh configuration example may be applied to the outer main surface 462 according to the first configuration example, the second configuration example, the third configuration example, or the fourth configuration example.

Also, the side wall structure 482 according to any one of the first configuration example, the second configuration example, the third configuration example, the fourth configuration example, the fifth configuration example, the sixth configuration example, and the seventh configuration example may be applied to the active side wall 464 according to the first configuration example, the second configuration example, the third configuration example, or the fourth configuration example.

Also, the side wall structure 482 according to any one of the first configuration example to the seventh configuration example may be applied to a configuration combining the active side wall 464 according to any one of the first configuration example to the fourth example with the outer main surface 462 according to the first configuration example to the fourth configuration example.

Figure 62A:
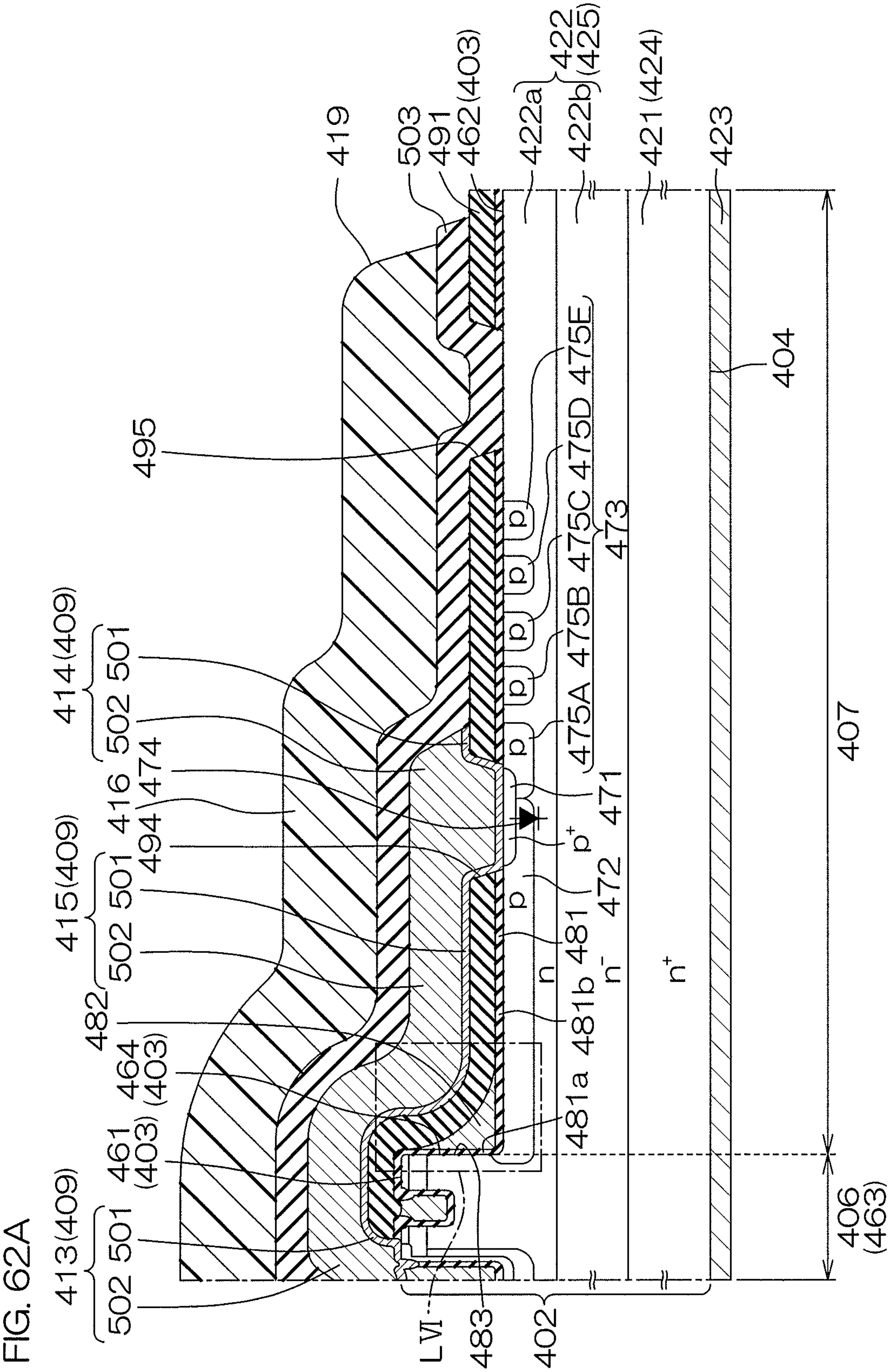
FIG. 62A is a sectional view of a region corresponding to FIG. 55 and is an enlarged view of a second configuration example of the outer deep well region.
Figure 62B:
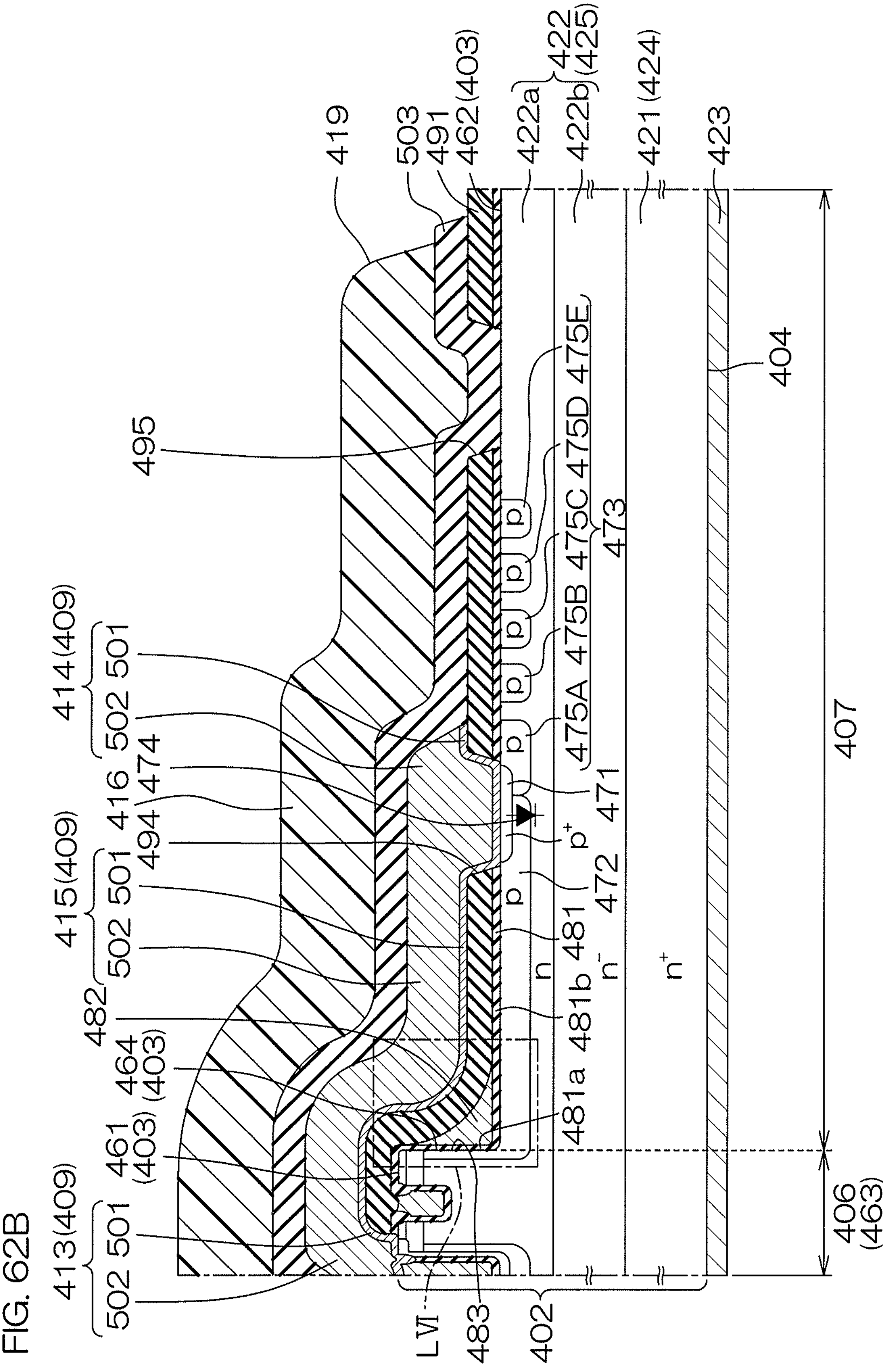
FIG. 62B is a sectional view of a region corresponding to FIG. 55 and is an enlarged view of a third configuration example of the outer deep well region.
Figure 62C:
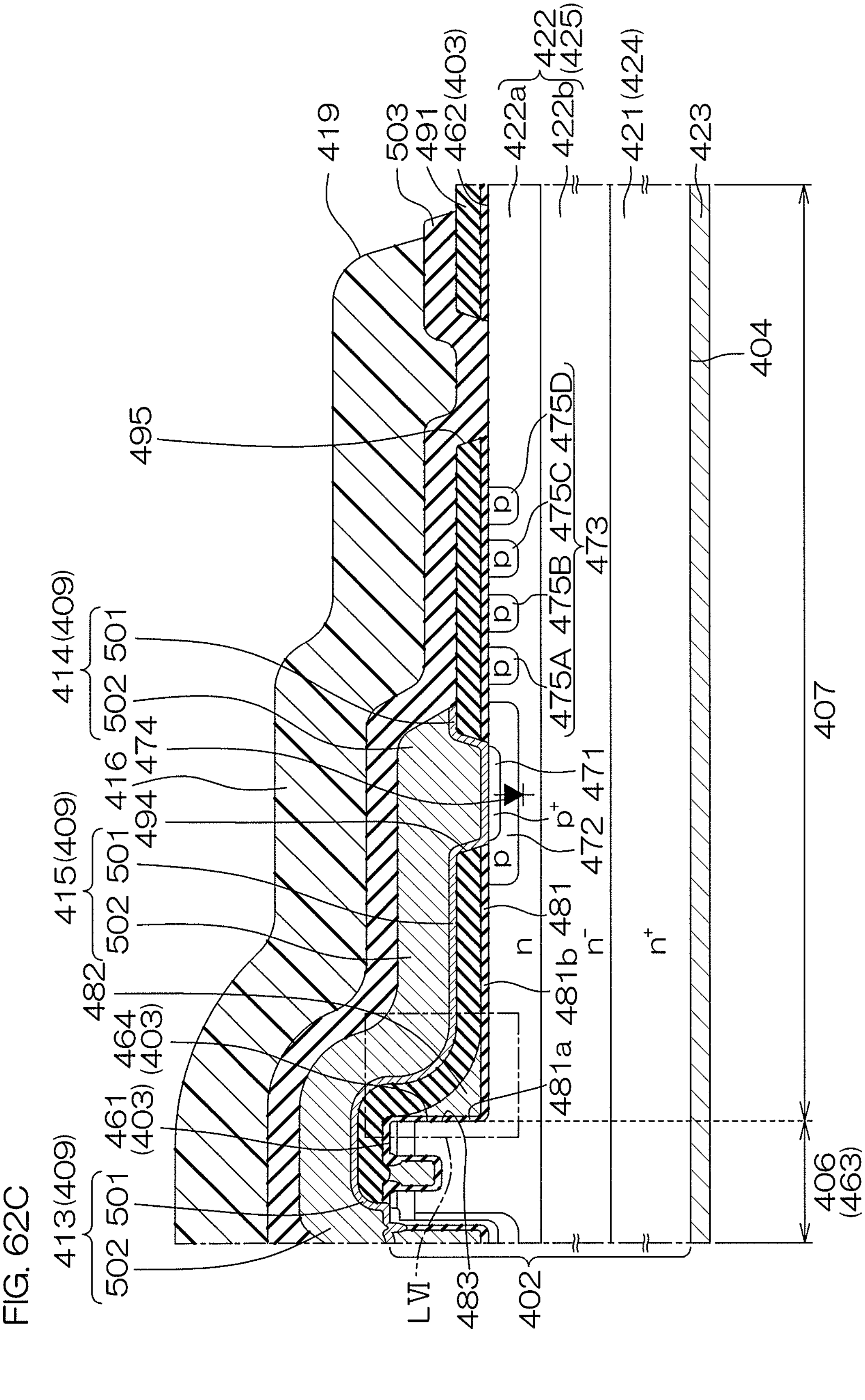
FIG. 62C is a sectional view of a region corresponding to FIG. 55 and is an enlarged view of a fourth configuration example of the outer deep well region.

Other configurations of the outer deep well region 472 shall now be described. As shown in FIG. 62A to FIG. 62C, the outer deep well region 472 may take on any of various configurations. The configurations shown in FIG. 62A to FIG. 62C are configurations obtained by adjusting treatment conditions in a step of forming the outer deep well region 472.

FIG. 62A is a sectional view of a region corresponding to FIG. 55 and is an enlarged view of a second configuration example of the outer deep well region 472. In the following, for structures described already, the same symbols shall be provided and description thereof shall be omitted, and just newly appearing structures shall be described.

Referring to FIG. 62A, the inner peripheral edge of the outer deep well region 472 may extend to a vicinity of the boundary region between the active region 406 and the outer region 407. The outer deep well region 472 may cross the boundary region between the active region 406 and the outer region 407. The inner peripheral edge of the outer deep well region 472 may cover the corner portion 542 connecting the active side wall 464 and the outer main surface 462.

FIG. 62B is a sectional view of a region corresponding to FIG. 55 and is an enlarged view of a third configuration example of the outer deep well region 472. In the following, for structures described already, the same symbols shall be provided and description thereof shall be omitted, and just newly appearing structures shall be described.

Referring to FIG. 62B, the inner peripheral edge of the outer deep well region 472 may extend to the vicinity of the boundary region between the active region 406 and the outer region 407. The outer deep well region 472 may cross the boundary region between the active region 406 and the outer region 407.

The inner peripheral edge of the outer deep well region 472 may cover the corner portion 542 connecting the active side wall 464 and the outer main surface 462. The inner peripheral edge of the outer deep well region 472 may further extend along the active side wall 464 from the corner portion 542 and be connected to the body region 426.

FIG. 62C is a sectional view of a region corresponding to FIG. 55 and is an enlarged view of a fourth configuration example of the outer deep well region. In the following, for structures described already, the same symbols shall be provided and description thereof shall be omitted, and just newly appearing structures shall be described.

Referring to FIG. 62C, the outer deep well region 472 may cover an entire area of the diode region 471. The outer peripheral edge of the outer deep well region 472 may be formed as a portion of the field limit structure 473.

Other configurations of the field limit structure 473 shall now be described. As shown in FIG. 63A to FIG. 63D, the field limit structure 473 may take on any of various configurations. The configurations shown in FIG. 63A to FIG.

63D are configurations obtained by adjusting treatment conditions in a step of forming the field limit structure 473.

Figure 63A:
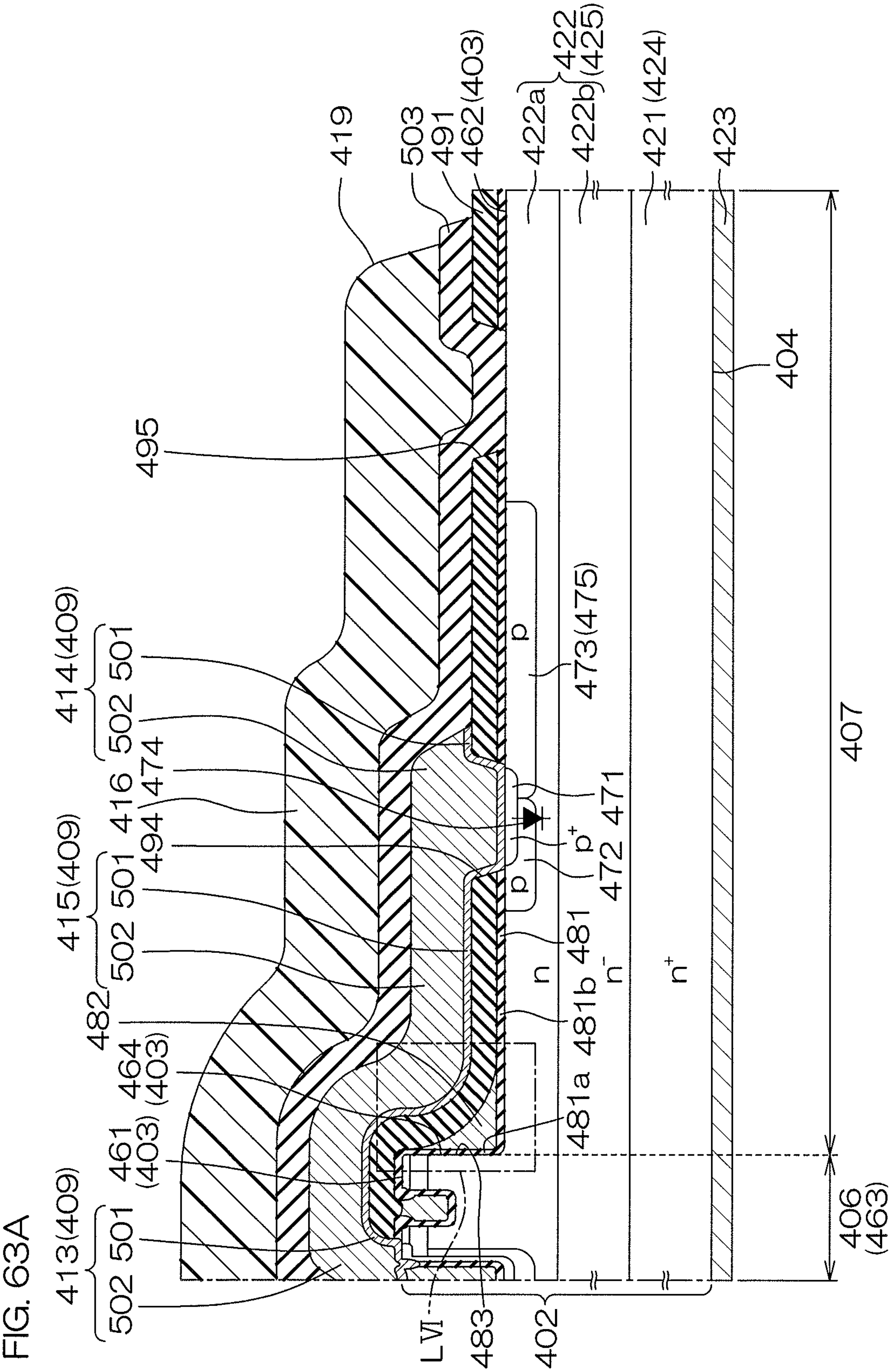
FIG. 63A is a sectional view of a region corresponding to FIG. 55 and is an enlarged view of a second configuration example of the field limit structure.

FIG. 63A is a sectional view of a region corresponding to FIG. 55 and is an enlarged view of a second configuration example of the field limit structure 473. In the following, for structures described already, the same symbols shall be provided and description thereof shall be omitted, and just newly appearing structures shall be described.

Referring to FIG. 63A, the field limit structure 473 may be formed by a single field limit region 475. The single field limit region 475 may cover the diode region 471. The single field limit region 475 may overlap with the source routing wiring 414 in plan view.

An outer peripheral edge of the single field limit region 475 may be positioned at the side surface 405A to 405D sides of the SiC semiconductor layer 402 with respect to the source routing wiring 414 in plan view. The single field limit region 475 may be exposed from the anchor hole 495. Obviously, the single field limit region 475 may be overlapped with the source routing wiring 414 in plan view.

Figure 63B:
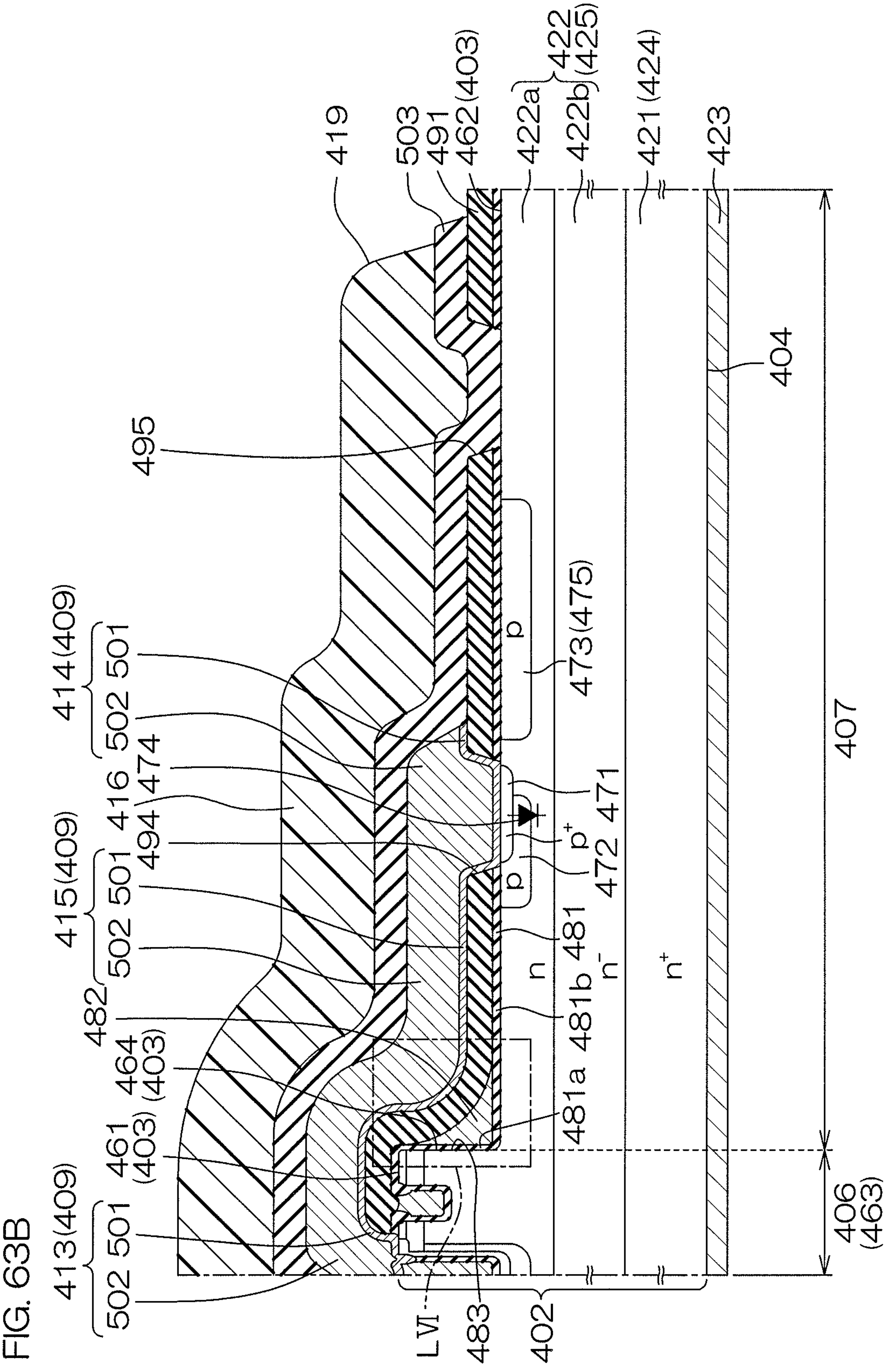

FIG. 63B is a sectional view of a region corresponding to FIG. 55 and is an enlarged view of a third configuration example of the field limit structure 473. In the following, for structures described already, the same symbols shall be provided and description thereof shall be omitted, and just newly appearing structures shall be described.

Referring to FIG. 63B, the field limit structure 473 may be formed by a single field limit region 475. The single field limit region 475 may be formed across an interval from the diode region 471.

The single field limit region 475 may overlap with the source routing wiring 414 in plan view. An inner peripheral edge of the single field limit region 475 may be positioned at the side surface 405A to 405D sides of the SiC semiconductor layer 402 with respect to the source routing wiring 414 in plan view.

The outer peripheral edge of the single field limit region 475 may be positioned at the side surface 405A to 405D sides of the SiC semiconductor layer 402 with respect to the source routing wiring 414 in plan view. The single field limit region 475 may be exposed from the anchor hole 495. Obviously, the single field limit region 475 may be overlapped with the source routing wiring 414 in plan view.

Figure 63C:
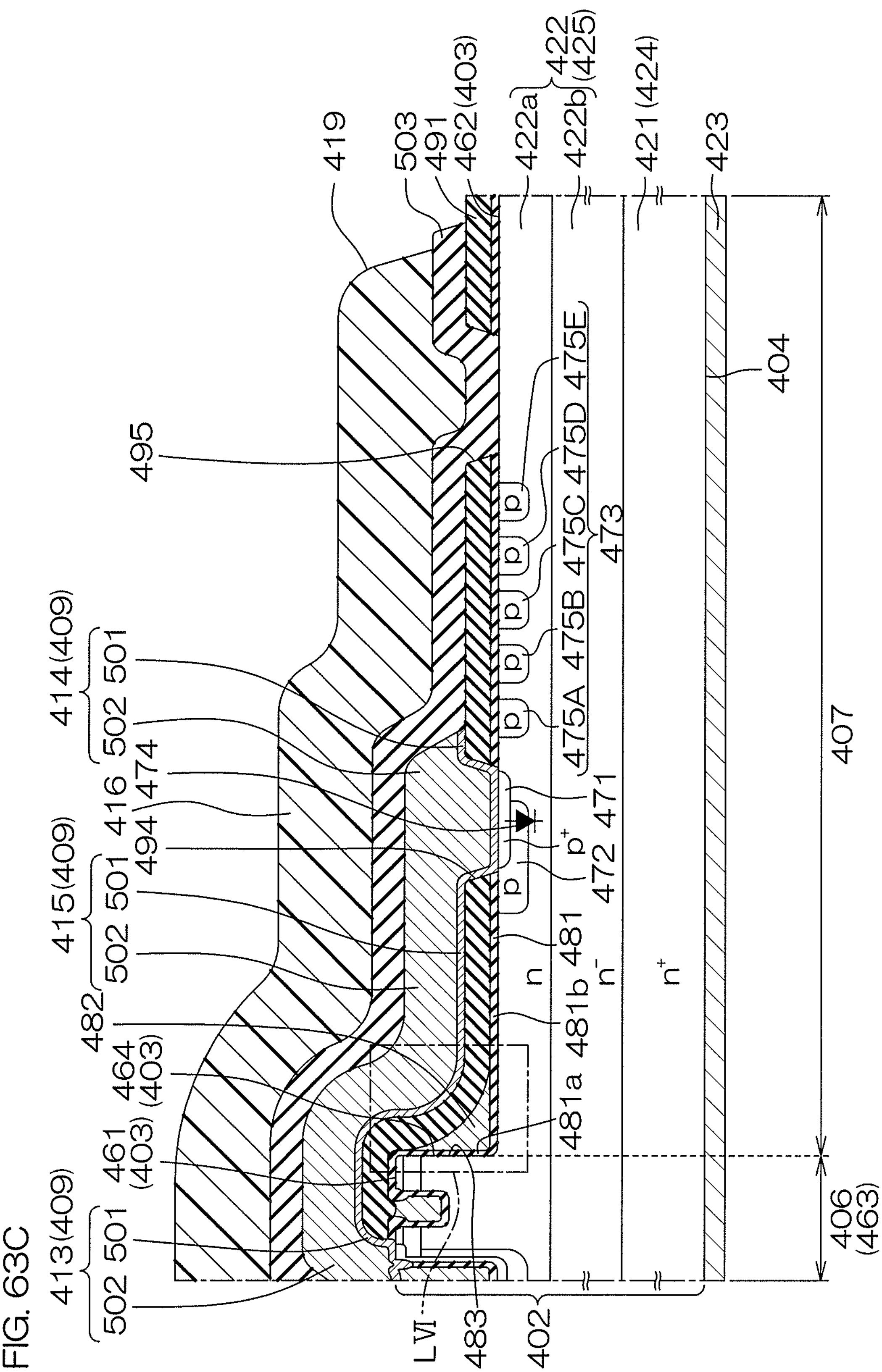

FIG. 63C is a sectional view of a region corresponding to FIG. 55 and is an enlarged view of a fourth configuration example of the field limit structure 473. In the following, for structures described already, the same symbols shall be provided and description thereof shall be omitted, and just newly appearing structures shall be described.

Referring to FIG. 63C, the field limit structure 473 includes a plurality (for example, not less than two and not more than twenty) of the field limit regions. The field limit structure 473 includes the field limit region group having the plurality of (five) field limit regions 475A, 475B, 475C, 475D, and 475E, in the present configuration example.

The field limit region 475A at the innermost side among the field limit regions 475A to 475E is formed across an interval from the diode region 471, in the present configuration example.

Figure 63D:
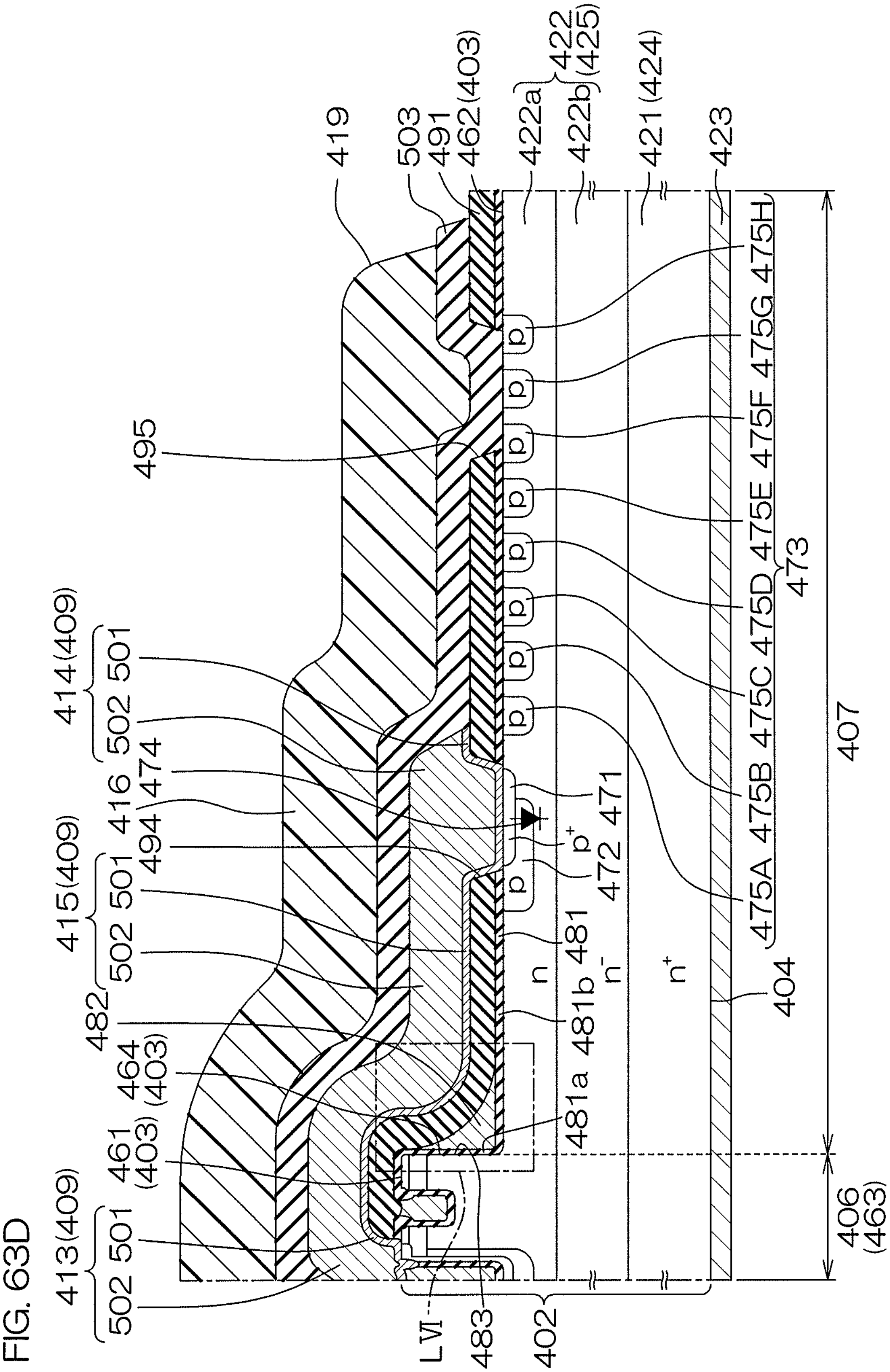

FIG. 63D is a sectional view of a region corresponding to FIG. 55 and is an enlarged view of a fifth configuration example of the field limit structure 473. In the following, for structures described already, the same symbols shall be provided and description thereof shall be omitted, and just newly appearing structures shall be described.

Referring to FIG. 63D, the field limit structure 473 includes a plurality (for example, not less than two and not more than twenty) of the field limit regions. Some of the plurality of field limit regions may be exposed from the anchor hole 495.

The field limit structure 473 includes a field limit region group having a plurality of (eight) field limit regions 475A, 475B, 475C, 475D, 475E, 475F, 475G, and 475H, in the present configuration example. The field limit regions 475F, 475G, and 475H among the field limit regions 475A to 475H are exposed from the anchor hole 495, in the present configuration example.

The field limit region 475A at the innermost side among the field limit regions 475A to 475H is formed across an interval from the diode region 471, in the present configuration example. The field limit region 475A at the innermost side may be connected to the diode region 471.

Other configurations of the anchor hole 495 shall now be described. As shown in FIG. 64A to FIG. 64D, the anchor hole 495 may take on any of various configurations. The configurations shown in FIG. 64A to FIG. 64D are configurations obtained by adjusting treatment conditions in a step of forming the anchor hole 495.

Figure 64A:
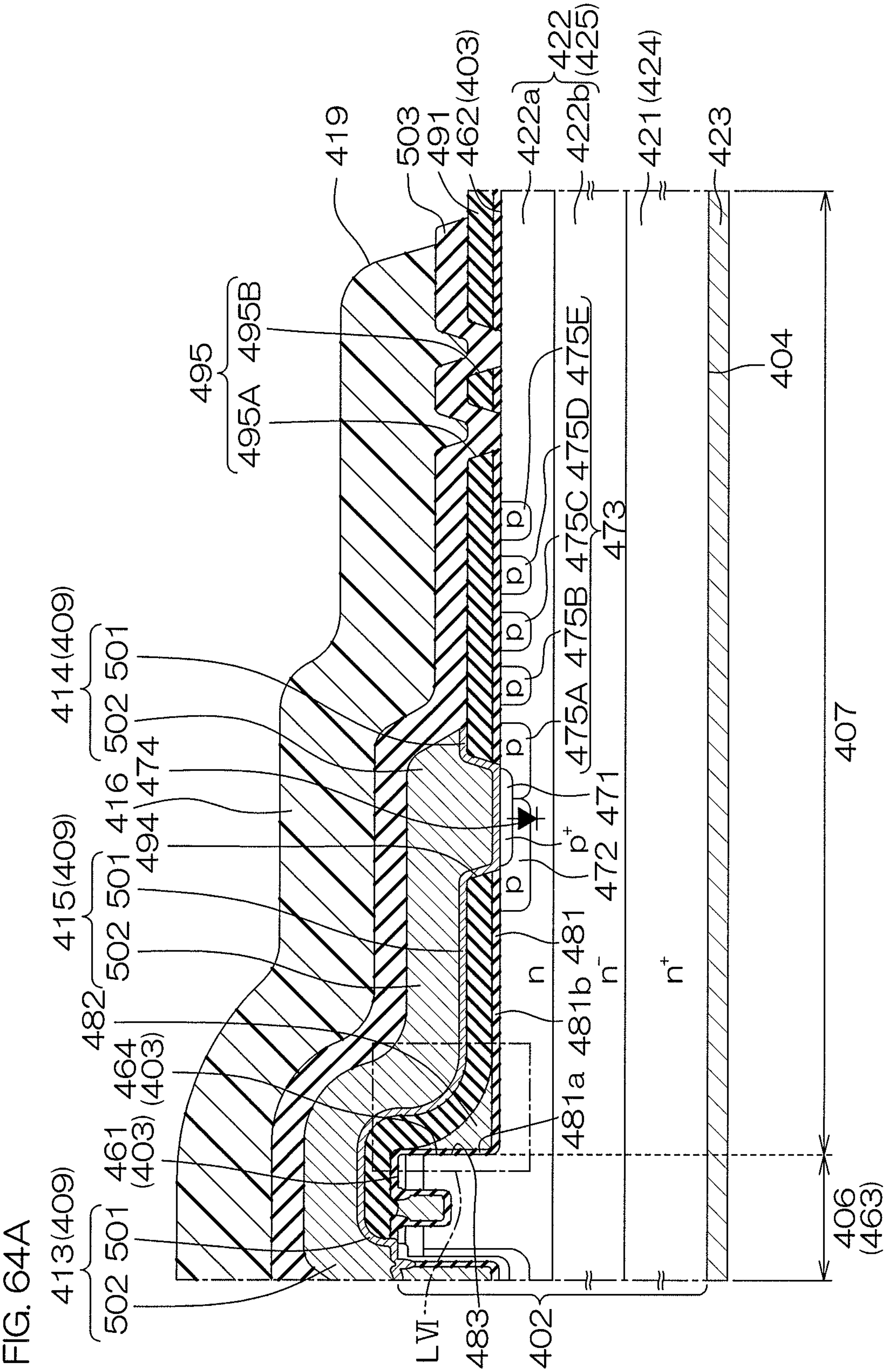

FIG. 64A is a sectional view of a region corresponding to FIG. 55 and is an enlarged view of a second configuration example of the anchor hole 495. In the following, for structures described already, the same symbols shall be provided and description thereof shall be omitted, and just newly appearing structures shall be described.

Referring to FIG. 64A, the anchor hole 495 may include a plurality (two or more) of anchor holes 495. The anchor holes 495 include a first anchor hole 495A and a second anchor hole 495B, in the present configuration example. The first anchor hole 495A and the second anchor hole 495B are formed across an interval in a direction away from the active region 406.

The first anchor hole 495A exposes the first main surface 403 (outer main surface 462) of the SiC semiconductor layer 402. The first anchor hole 495A extends as a band shape along the active region 406 in plan view. The first anchor hole 495A is formed in an endless shape (quadrilateral annular shape) surrounding the active region 406 in plan view, in the present configuration example.

The second anchor hole 495B is formed in a region at the side surface 405A to 405D sides of the SiC semiconductor layer 402 with respect to the first anchor hole 495A. The second anchor hole 495B exposes the first main surface 403 (outer main surface 462) of the SiC semiconductor layer 402.

The second anchor hole 495B extends as a band shape along the active region 406 in plan view. The second anchor hole 495B is formed in an endless shape (quadrilateral annular shape) surrounding the first anchor hole 495A in plan view, in the present configuration example.

The passivation layer 503 enters into the first anchor hole 495A and the second anchor hole 495B from above the interlayer insulating layer 491. The passivation layer 503 is connected to the first main surface 403 (outer main surface 462) of the SiC semiconductor layer 402 inside the first anchor hole 495A and the second anchor hole 495B.

A plurality of recesses recessed in conformance to the first anchor hole 495A and the second anchor hole 495B is formed in a region of the outer surface of the passivation layer 503 positioned above the first anchor hole 495A and the second anchor hole 495B.

The resin layer 416 has a plurality of anchor portions entering into the plurality of recesses of the passivation layer 503 in the outer region 407. The connection strength of the resin layer 416 with respect to the passivation layer 503 is improved by the plurality of anchor portions of the resin layer 416. Peeling of the resin layer 416 is thereby suppressed.

Figure 64B:
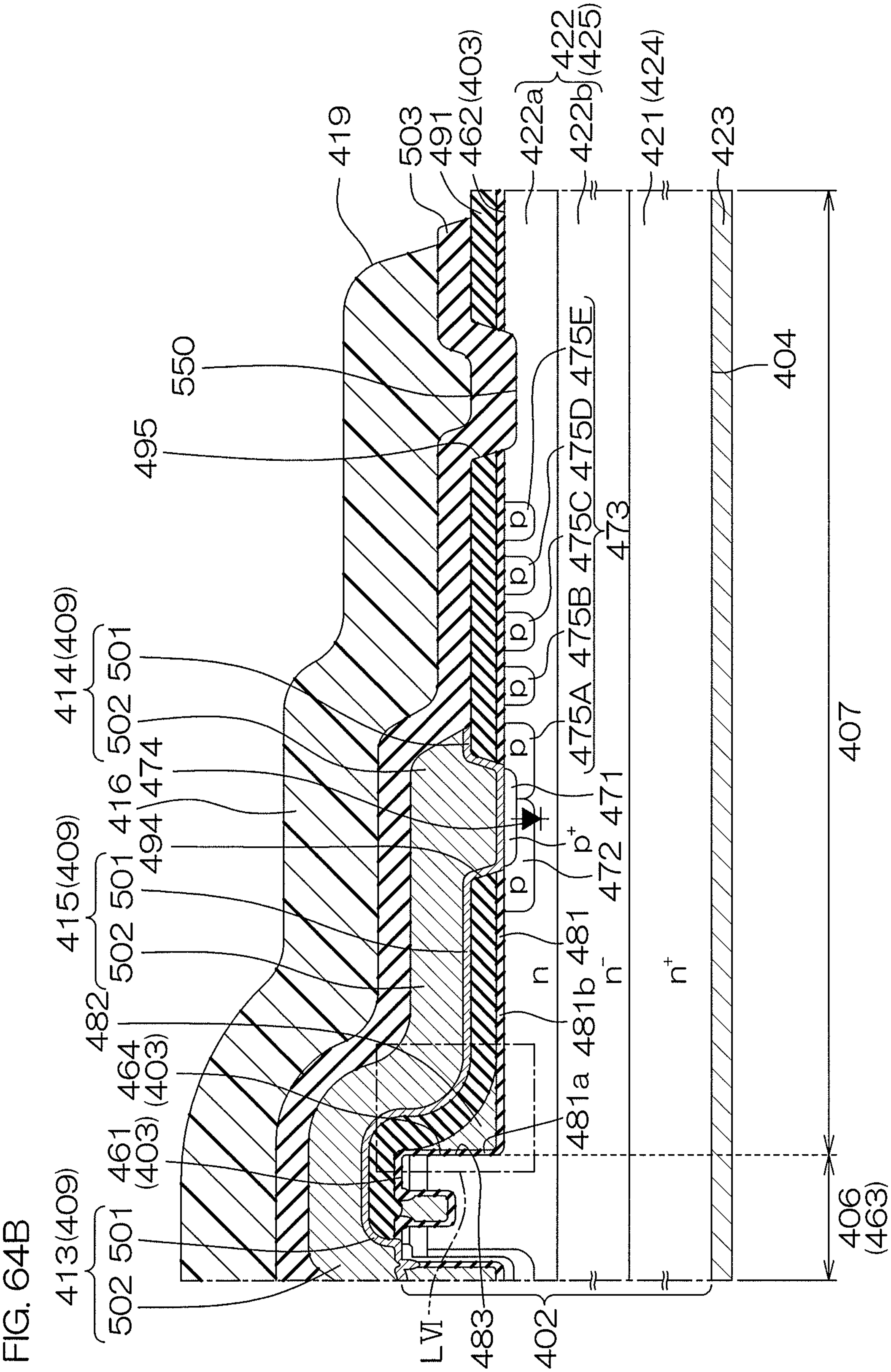

FIG. 64B is a sectional view of a region corresponding to FIG. 55 and is an enlarged view of a third configuration example of the anchor hole 495. In the following, for structures described already, the same symbols shall be provided and description thereof shall be omitted, and just newly appearing structures shall be described.

Referring to FIG. 64B, the anchor hole 495 includes an anchor recess portion 550 recessed toward the second main surface 404 side of the SiC semiconductor layer 402, in the first main surface 403 (outer main surface 462) of the SiC semiconductor layer 402. That is, the anchor hole 495 is formed by digging into the interlayer insulating layer 491, the outer insulating layer 481, and a surface layer portion of the first main surface 403 of the SiC semiconductor layer 402.

The passivation layer 503 enters into the anchor hole 495 from above the interlayer insulating layer 491. The passivation layer 503 contacts the SiC semiconductor layer 402 inside the anchor recess portion 550. The recess recessed in conformance to the anchor hole 495 is formed in the region of the outer surface of the passivation layer 503 positioned above the anchor hole 495.

The resin layer 416 has the anchor portion entering into the recess of the passivation layer 503 in the outer region 407. The connection strength of the resin layer 416 with respect to the passivation layer 503 is improved by the anchor portion of the resin layer 416. Peeling of the resin layer 416 is thereby suppressed.

Figure 64C:
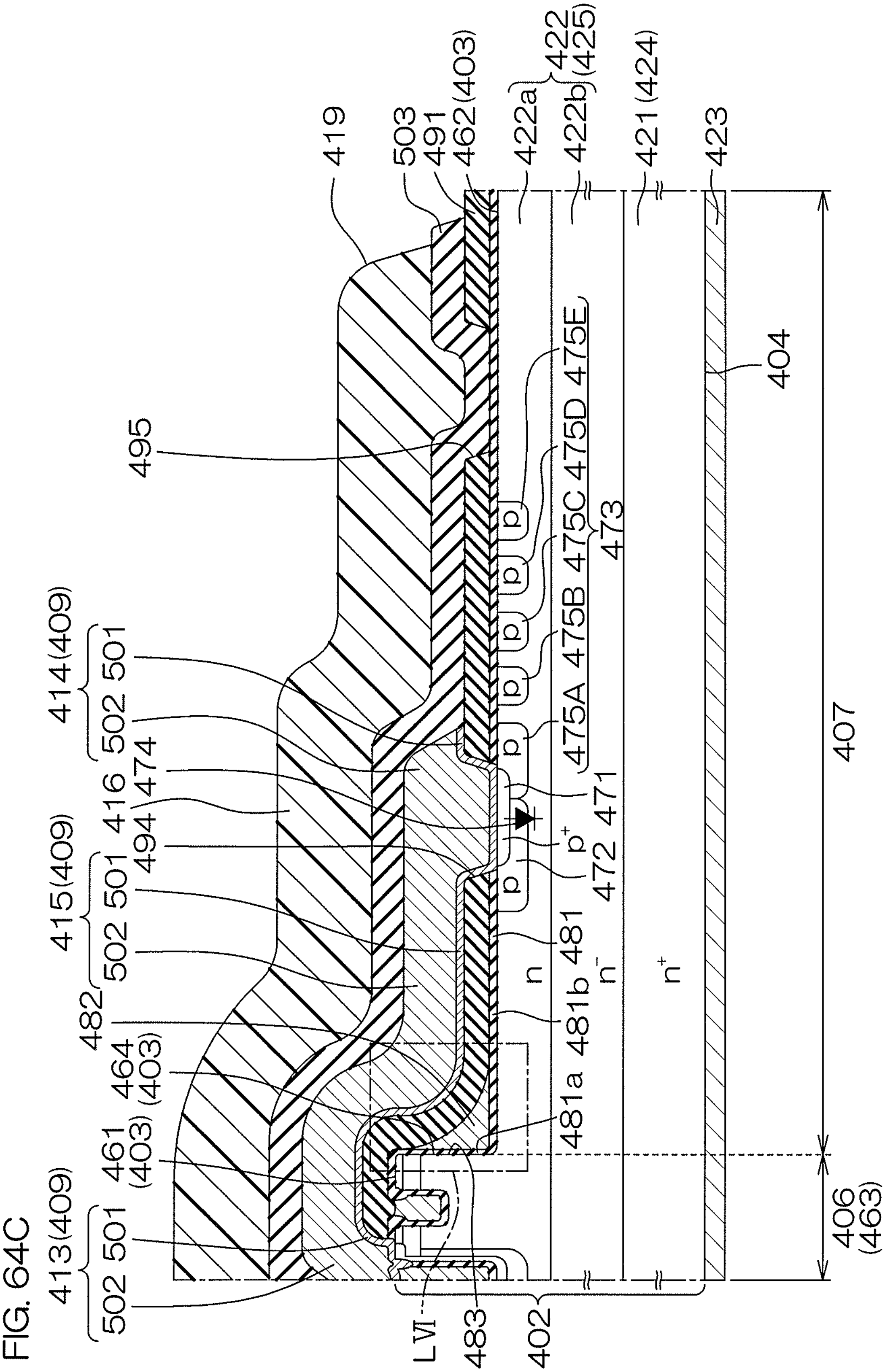

FIG. 64C is a sectional view of a region corresponding to FIG. 55 and is an enlarged view of a fourth configuration example of the anchor hole 495. In the following, for structures described already, the same symbols shall be provided and description thereof shall be omitted, and just newly appearing structures shall be described.

Referring to FIG. 64C, the anchor hole 495 exposes the outer insulating layer 481, in the present configuration example.

The passivation layer 503 enters into the anchor hole 495 from above the interlayer insulating layer 491. Inside the anchor hole 495, the passivation layer 503 is connected to the outer insulating layer 481. The recess, recessed in conformance to the anchor hole 495, is formed in the region of the outer surface of the passivation layer 503 positioned above the anchor hole 495.

The resin layer 416 has, in the outer region 407, the anchor portion entering into the recess of the passivation layer 503. The connection strength of the resin layer 416 with respect to the passivation layer 503 is improved by the anchor portion of the resin layer 416. Peeling of the resin layer 416 is thereby suppressed.

Figure 64D:
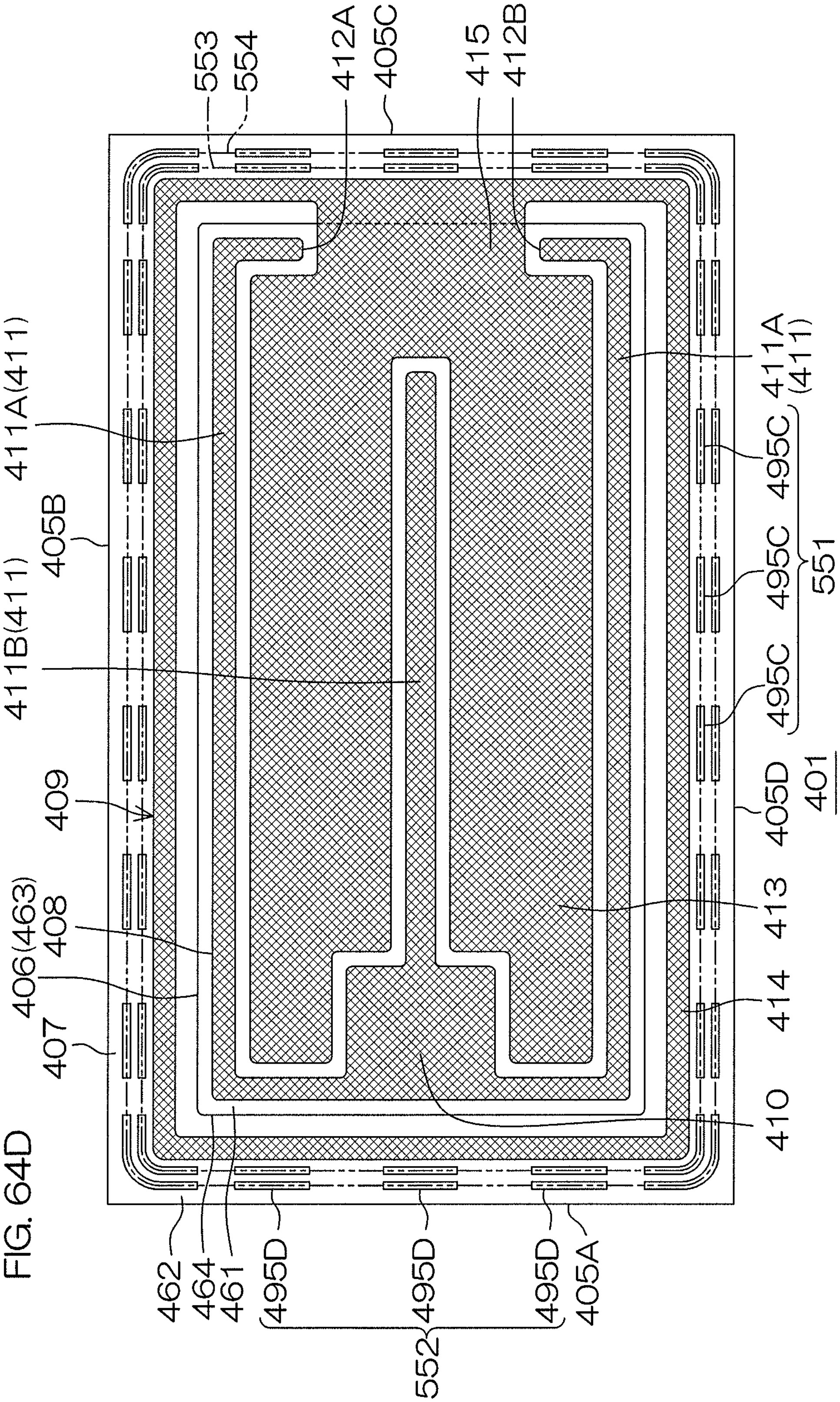

FIG. 64D is a plan view of a region corresponding to FIG. 50 and is a plan view of a fifth configuration example of the anchor hole 495. In the following, for structures described already, the same symbols shall be provided and description thereof shall be omitted, and just newly appearing structures shall be described.

Referring to FIG. 64D, the anchor hole 495 includes a first anchor hole group 551 and a second anchor hole group 552.

The first anchor hole group 551 includes a plurality of first anchor holes 495C. The first anchor holes 495C are formed at intervals along a first line 553 set in the outer region 407.

The first line 553 is set to an endless shape (quadrilateral annular shape) surrounding the active region 406. The first anchor holes 495C are thus formed at intervals such as to surround the active region 406.

The first anchor holes 495C may be formed at intervals as a dot pattern or as a band pattern. The first anchor holes 495C expose the first main surface 403 (outer main surface 462) of the SiC semiconductor layer 402.

The second anchor hole group 552 includes a plurality of second anchor holes 495D. The second anchor holes 495D are formed at intervals along a second line 554 set in a region of the outer region 407 differing from the first line 553.

The second line 554 is set in a region at the side surface 405A to 405D sides of the SiC semiconductor layer 402 with respect to the first line 553. The second line 554 is set to an endless shape (quadrilateral annular shape) surrounding the first line 553. The second anchor holes 495D are thus formed at intervals such as to surround the active region 406.

The plurality of second anchor holes 495D may be formed at intervals as a dot pattern or as a band pattern. The second anchor holes 495D exposes the first main surface 403 (outer main surface 462) of the SiC semiconductor layer 402.

The passivation layer 503 enters into the first anchor hole group 551 and the second anchor hole group 552 from above the interlayer insulating layer 491. The passivation layer 503 is connected to the first main surface 403 (outer main surface 462) of the SiC semiconductor layer 402 inside the first anchor hole group 551 and the second anchor hole group 552.

A plurality of recesses recessed in conformance to the first anchor hole group 551 and the second anchor hole group 552 are formed in a region of the outer surface of the passivation layer 503 positioned above the first anchor hole group 551 and the second anchor hole group 552.

The resin layer 416 has a plurality of anchor portions entering into the plurality of recesses of the passivation layer 503, in the outer region 407. The connection strength of the resin layer 416 with respect to the passivation layer 503 is improved by the plurality of anchor portions of the resin layer 416. Peeling of the resin layer 416 is thereby suppressed.

The anchor holes 495 according to the first configuration example to the fifth configuration example may be combined with each other in any mode. The anchor hole 495 that includes at least two features among the features of the anchor holes 495 according to the first configuration example to the fifth configuration example may be formed.

In FIG. 49 to FIG. 64D, various configuration examples were illustrated for various structures and the configuration examples illustrated in FIG. 49 to FIG. 64D may be combined with each other as appropriate. That is, a configuration in which the features illustrated in FIG. 49 to FIG. 64D are combined in any mode or any configuration may be adopted.

FIG. 65A to FIG. 65Z are enlarged views of a region corresponding to FIG. 54 and are enlarged views of an example of a method for manufacturing the semiconductor device 401 shown in FIG. 49. FIG. 66A to FIG. 66Z are sectional views of a region corresponding to FIG. 55 and are sectional views of the example of the method for manufacturing the semiconductor device 401 shown in FIG. 49.

First, referring to FIG. 65A and FIG. 66A, an $n^+$-type SiC semiconductor wafer 601 to be a base of the $n^+$-type SiC semiconductor substrate 421 is prepared. The SiC semiconductor wafer 601 has a first wafer main surface 602 at one side and a second wafer main surface 603 at another side.

Next, referring to FIG. 65B and FIG. 66B, the SiC epitaxial layer 422 is formed on the first wafer main surface 602 of the SiC semiconductor wafer 601. The SiC epitaxial layer 422 is formed by growing SiC from above the first wafer main surface 602 of the SiC semiconductor wafer 601 by an epitaxial growth method.

In the present step, the SiC epitaxial layer 422 having the high concentration region 422*a* and the low concentration region 422*b* is formed by adjusting an introduction amount of the n-type impurity. The SiC semiconductor layer 402 including the SiC semiconductor wafer 601 and the SiC epitaxial layer 422 is thereby formed. The SiC semiconductor layer 402 includes the first main surface 403 and the second main surface 404. In the following, a description using the SiC semiconductor layer 402, the first main surface 403, and the second main surface 404 shall be provided.

Next, referring to FIG. 65C and FIG. 66C, the p-type body region 426 is formed in the surface layer portion of the first main surface 403 of the SiC semiconductor layer 402. In the present step, the body region 426 is formed across an entire area of the surface layer portion of the first main surface 403 of the SiC semiconductor layer 402. The body region 426 is formed by introducing the p-type impurity into the first main surface 403 of the SiC semiconductor layer 402.

Next, referring to FIG. 65D and FIG. 66D, the n-type source regions 453 are formed in the surface layer portion of the body region 426. The source regions 453 are formed by introducing the n-type impurity into the surface layer portion of the body region 426. In the present step, the source region 453 is formed across the entire area of the surface layer portion of the first main surface 403 of the SiC semiconductor layer 402.

Next, referring to FIG. 65E and FIG. 66E, a hard mask 604 is formed on the first main surface 403 of the SiC semiconductor layer 402. The hard mask 604 may include silicon oxide.

The hard mask 604 may be formed by a CVD (chemical vapor deposition) method or a thermal oxidation treatment method. In the present step, the hard mask 604 is formed by the thermal oxidation treatment method.

Next, referring to FIG. 65F and FIG. 66F, a resist mask 605 having a predetermined pattern is formed on the hard mask 604. The resist mask 605 selectively has a plurality of openings 606 exposing regions at which the gate trenches 431, the source trenches 441, and the outer region 407 are to be formed.

Next, unnecessary portions of the SiC semiconductor layer 402 are removed by an etching method (for example, a dry etching method) via the resist mask 605. In the present step, unnecessary portions of the SiC epitaxial layer 422 are removed.

The gate trenches 431 and the source trenches 441 are thereby formed. Also, the outer region 407 which is recessed to the second main surface 404 side of the SiC semiconductor layer 402 with respect to the active region 406 is thereby formed. Also, the active mesa 463 is thereby formed.

Next, referring to FIG. 65G and FIG. 66G, the resist mask 605 is removed.

Next, referring to FIG. 65H and FIG. 66H, a mask 607 is formed. The mask 607 fills the gate trenches 431, the source trenches 441, and the outer region 407 and covers the first main surface 403 of the SiC semiconductor layer 402. The mask 607 has a laminated structure including a polysilicon layer 608 and an insulating layer 609. The insulating layer 609 contains silicon oxide.

The polysilicon layer 608 may be formed by a CVD method. The insulating layer 609 may be formed by a CVD method or a thermal oxidation treatment method. In the present step, the insulating layer 609 is formed by performing the thermal oxidation treatment method on the polysilicon layer 608.

Next, referring to FIG. 65I and FIG. 66I, a resist mask 610 having a predetermined pattern is formed on the mask 607. The resist mask 610 selectively has a plurality of openings 611 exposing portions of the mask 607 covering the source trenches 441 and portions of the mask 607 covering the outer region 407.

Next, unnecessary portions of the mask 607 are removed by an etching method (for example, a dry etching method) via the resist mask 610. The source trenches 441 and the outer region 407 are thereby exposed from the resist mask 610 and the mask 607.

Next, referring to FIG. 65J and FIG. 66J, the resist mask 610 is removed. Next, unnecessary portions of the SiC semiconductor layer 402 are removed by an etching method (for example, a dry etching method) via the mask 607. The source trenches 441 and the outer region 407 are thereby dug in further.

In the present step, the source trenches 441 and the outer region 407 are dug in further using the mask 607. However, the source trenches 441 and the outer region 407 may be dug in further using just the resist mask 610 and without using the mask 607.

Next, referring to FIG. 65K and FIG. 66K, a resist mask 612 having a predetermined pattern is formed on the first main surface 403 of the SiC semiconductor layer 402. The resist mask 612 has an opening 613 which selective exposes the active region 406, and an opening 614 which selectively exposes the outer region 407.

More specifically, the opening 613 exposes a region of the active region 406 in which the deep well regions 455 and the peripheral edge deep well region 459 are to be formed. More specifically, the opening 614 exposes a region of the outer region 407 in which the outer deep well region 472 is to be formed.

Next, the deep well regions 455, the peripheral edge deep well region 459, and the outer deep well region 472 are formed in the surface layer portion of the first main surface 403 of the SiC semiconductor layer 402. The deep well regions 455, the peripheral edge deep well region 459, and the outer deep well region 472 are formed by introducing the p-type impurity into the first main surface 403 of the SiC semiconductor layer 402. The p-type impurity is introduced into the first main surface 403 of the SiC semiconductor layer 402 via the mask 607 and the resist mask 612.

Next, referring to FIG. 65L and FIG. 66L, the mask 607 and the resist mask 612 are removed.

Next, referring to FIG. 65M and FIG. 66M, a resist mask 615 having a predetermined pattern is formed on the first main surface 403 of the SiC semiconductor layer 402. The resist mask 615 selectively has a plurality of openings 616 exposing a region in which the field limit structure 473 is to be formed.

Next, the field limit structure 473 is formed in the surface layer portion of the first main surface 403 of the SiC semiconductor layer 402. The field limit structure 473 is formed by introducing the p-type impurity into the first main surface 403 of the SiC semiconductor layer 402. The p-type impurity is introduced into the first main surface 403 of the SiC semiconductor layer 402 via the resist mask 615. Next, the resist mask 615 is removed.

Next, referring to FIG. 65N and FIG. 66N, a resist mask 617 having a predetermined pattern is formed on the first main surface 403 of the SiC semiconductor layer 402. The resist mask 617 selectively has a plurality of openings 618 exposing regions in which the contact regions 454 and the diode region 471 are to be formed.

Next, the contact regions 454 and the diode region 471 are formed in the surface layer portion of the first main surface 403 of the SiC semiconductor layer 402. The contact regions 454 and the diode region 471 are formed by introducing the p-type impurity into the first main surface 403 of the SiC semiconductor layer 402. The p-type impurity is introduced into the first main surface 403 of the SiC semiconductor layer 402 via the resist mask 617. Next, the resist mask 617 is removed.

Next, referring to FIG. 65O and FIG. 66O, a base insulating layer 619 to be a base of the gate insulating layer 434, the source insulating layers 442, and the outer insulating layer 481 is formed on the first main surface 403 of the SiC semiconductor layer 402. The base insulating layer 619 may include silicon oxide.

The base insulating layer 619 may be formed by a CVD method or a thermal oxidation treatment method. In the present step, portions of the base insulating layer 619 covering the side wall of the gate trenches 431 and portions of the base insulating layer 619 covering the side wall of the source trenches 441 are formed thinner than other portions.

Also, in the present step, portions of the base insulating layer 619 covering the opening edge portions 432 of the gate trenches 431 and portions of the base insulating layer 619 covering the opening edge portions 457 of the source trenches 441 are formed thicker than other portions.

The base insulating layer 619 of such configuration is formed by adjusting conditions of a CVD method or a thermal oxidation treatment method. For example, predetermined conditions such as a gas flow rate, gas type, gas ratio, gas supplying time, ambient temperature, etc., should be adjusted in the CVD method or the thermal oxidation treatment method.

Next, referring to FIG. 65P and FIG. 66P, a base conductor layer 620 to be a base of the gate electrode layers 435, the gate wiring layer 436, and the source electrode layers 443 is formed on the first main surface 403 of the SiC semiconductor layer 402. The base conductor layer 620 fills the gate trenches 431, the source trenches 441, and the outer region 407 and covers the first main surface 403 of the SiC semiconductor layer 402.

The base conductor layer 620 may include a polysilicon. The base conductor layer 620 may be formed by a CVD method. The CVD method may be an LP-CVD (low pressure-CVD) method.

Next, referring to FIG. 65Q and FIG. 66Q, unnecessary portions of the base conductor layer 620 are removed. The unnecessary portions of the base conductor layer 620 are removed until the base insulating layer 619 is exposed. The unnecessary portions of the base conductor layer 620 may be removed by an etch back method using the base insulating layer 619 as an etching stopping layer.

The unnecessary portions of the base conductor layer 620 may be removed by an etching method (for example, a wet etching method) via a mask (not shown) having a predetermined pattern. The gate electrode layers 435, the gate wiring layer 436, and the source electrode layers 443 are thereby formed.

Further, in the present step, a portion of the base conductor layer 620 remains in a state of being attached to the active side wall 464 connecting the active main surface 461 of the active region 406 and the outer main surface 462 of the outer region 407.

The side wall structure 482 is formed by the remaining portion of the base conductor layer 620. The side wall structure 482 is formed self-alignigly with respect to the active main surface 461 of the active region 406.

Next, referring to FIG. 65R and FIG. 66R, the interlayer insulating layer 491 is formed on the first main surface 403 of the SiC semiconductor layer 402. The interlayer insulating layer 491 covers the active region 406 and the outer region 407 altogether. The interlayer insulating layer 491 may include silicon oxide or silicon nitride. The interlayer insulating layer 491 may be formed by a CVD method.

Next, referring to FIG. 65S and FIG. 66S, a resist mask 621 having a predetermined pattern is formed on the interlayer insulating layer 491. The resist mask 621 selectively has a plurality of openings 622 exposing regions in which the gate contact hole 492, the source contact holes 493, the diode contact hole 494, and the anchor hole 495 are to be formed.

Next, the unnecessary portions of the interlayer insulating layer 491 are removed. The unnecessary portions of the interlayer insulating layer 491 may be removed by an etching method (for example, a dry etching method) via the resist mask 621.

Next, referring to FIG. 65T and FIG. 66T, unnecessary portions of the base insulating layer 619 exposed from the interlayer insulating layer 491 are removed. The unnecessary portions of the base insulating layer 619 may be removed by an etching method (for example, a dry etching method).

The base insulating layer 619 is thereby divided into the gate insulating layer 434, the source insulating layers 442, and the outer insulating layer 481. Also, the gate contact hole 492, the source contact holes 493, the diode contact hole 494, and the anchor hole 495 are formed in the interlayer insulating layer 491.

Further, in the present step, the source sub-trenches 456 communicating with the source trenches 441 are formed in regions of the first main surface 403 of the SiC semiconductor layer 402 along the upper end portions of the source electrode layers 443.

More specifically, the source sub-trenches 456 are formed by digging into the upper end portions of the source insulating layers 442 and the upper end portions of the source electrode layers 443 from the first main surface 403 of the SiC semiconductor layer 402.

Thereafter, the opening edge portions of the gate contact hole 492, the source contact holes 493, the diode contact hole 494, and the anchor hole 495 may be rounded to convexly curved shapes by a heat treatment method.

Next, referring to FIG. 65U and FIG. 66U, a base electrode layer 623 to be a base of the main surface gate electrode 408 and the main surface source electrode 409 is formed on the interlayer insulating layer 491. In the present step, the base electrode layer 623 having a laminated structure including the barrier electrode layer 501 and the main electrode layer 502 is formed.

In the present step, first, the barrier electrode layer 501 is formed on the interlayer insulating layer 491. The barrier electrode layer 501 includes a step of forming the titanium layer and the titanium nitride layer in that order from above the interlayer insulating layer 491. The titanium layer and the titanium nitride layer may be formed by a sputtering method. A barrier electrode layer 501 having a single layer structure constituted of the titanium layer or the titanium nitride layer may be formed.

Next, the main electrode layer 502 is formed on the barrier electrode layer 501. The main electrode layer 502 may include an aluminum-silicon-copper alloy. The main electrode layer 502 may be formed by a sputtering method.

Next, referring to FIG. 65V and FIG. 66V, a resist mask 624 having a predetermined pattern is formed on the interlayer insulating layer 491. The resist mask 624 selectively covers regions of the base electrode layer 623 in which main surface gate electrode 408 and the main surface source electrode 409 are to be formed.

Next, unnecessary portions of the base electrode layer 623 are removed. The unnecessary portions of the base electrode layer 623 may be removed by an etching method (for example, a wet etching method) via the resist mask 624. The base electrode layer 623 is thereby divided into the main surface gate electrode 408 and the main surface source electrode 409. Next, the resist mask 624 is removed.

Next, referring to FIG. 65W and FIG. 66W, the passivation layer 503 is formed on the interlayer insulating layer 491. The passivation layer 503 covers the active region 406 and the outer region 407 altogether. The passivation layer 503 may include silicon oxide or silicon nitride. The passivation layer 503 may be formed by a CVD method.

Next, unnecessary portions of the passivation layer 503 are removed by an etching method via a resist mask (not shown) having a predetermined pattern. The gate sub-pad opening 504 and the source sub-pad opening 505 are thereby opened in the passivation layer 503.

Next, referring to FIG. 65X and FIG. 66X, the resin layer 416 is coated on the passivation layer 503. The resin layer 416 covers the active region 406 and the outer region 407 altogether. The resin layer 416 may include the polybenzoxazole as the example of the positive type photosensitive resin.

Next, the resin layer 416 is exposed selectively and thereafter developed. The gate pad opening 417 and the source pad opening 418 are thereby formed in the resin layer 416. Also, the dicing streets along the dicing lines are partitioned in the resin layer 416.

Next, referring to FIG. 65Y and FIG. 66Y, the second main surface 404 of the SiC semiconductor layer 402 (second wafer main surface 603 of the SiC semiconductor wafer 601) is ground. The SiC semiconductor layer 402 (SiC semiconductor wafer 601) is thereby thinned.

Next, referring to FIG. 65Z and FIG. 66Z, the drain pad 423 is formed on the second main surface 404 of the SiC semiconductor layer 402. In this step, a step of forming at least one layer among a Ti layer, an Ni layer, an Au layer, and an Ag layer as the drain pad 423 may be included. The Ti layer, the Ni layer, the Au layer, or the Ag layer may be formed by a sputtering method.

The step of forming the drain pad 423 may include a step of forming the Ti layer, the Ni layer, the Au layer, and the Ag layer in that order from the second main surface 404 of the SiC semiconductor layer 402. The Ti layer, the Ni layer, the Au layer, and the Ag layer may be formed by a sputtering method.

Thereafter, the SiC semiconductor layer 402 (SiC semiconductor wafer 601) is cut selectively along the dicing lines (dicing streets). A plurality of the semiconductor devices 401 is thereby cut out from a single SiC semiconductor wafer 601. The semiconductor devices 401 are formed through the steps including the above.

With the semiconductor device 401 described above, depletion layer can be spread from the boundary region (pn junction portion) between the SiC semiconductor layer 402 and the deep well region 455 toward the region to the second main surface 404 side of the SiC semiconductor layer 402 with respect to the bottom wall of the gate trench 431.

Consequently, the current path of a short-circuit current flowing between the source pad 413 and the drain pad 423 can be narrowed. Also, a feedback capacitance can be reduced inverse-proportionately by the depletion layer spreading from the boundary region between the SiC semiconductor layer 402 and the deep well region 455. The semiconductor device can thus be provided with which the short circuit withstand capability can be improved and the feedback capacitance can be reduced.

The depletion layer spreading from the boundary region (pn junction portions) between the SiC semiconductor layer 402 and the deep well region 455 may overlap with the bottom wall of the gate trench 431. In this case, the depletion layer spreading from the bottom portion of the deep well region 455 may overlap with the bottom wall of the gate trench 431.

Also, with the semiconductor device 401, the region of the SiC semiconductor layer 402 occupied by the depletion layer can be increased and therefore the feedback capacitance Crss can be reduced in inverse proportion. The feedback capacitance Crss is a static capacitance across the gate electrode layer 435 and the drain pad 423.

Also, with the semiconductor device 401, the distances between the bottom portions of the respective deep well regions 455 and the second main surface 404 of the SiC semiconductor layer 402 are substantially fixed. Occurrence of variation among the distances between the bottom portions of the respective deep well regions 455 and the second main surface 404 of the SiC semiconductor layer 402 can thereby be suppressed.

The withstand voltage (for example, electrostatic breakdown strength) of the SiC semiconductor layer 402 can thus be suppressed from being restricted by the configuration of the deep well regions 455 and therefore improvement of the withstand voltage can be achieved appropriately.

Also, with the semiconductor device 401, the diode region 471 is formed in the outer region 407. The diode region 471 is electrically connected to the main surface source electrode 409. An avalanche current generated in the outer region 407 can thereby be made to flow into the main surface source electrode 409 via the diode region 471.

That is, the avalanche current generated in the outer region 407 can be absorbed by the diode region 471 and the main surface source electrode 409. Consequently, stability of operation of the MISFET can be improved.

Also, with the semiconductor device 401, the outer deep well region 472 is formed in the outer region 407. The withstand voltage of the SiC semiconductor layer 402 can thereby be adjusted in the outer region 407.

Especially, with the semiconductor device 401, the outer deep well region 472 is formed at substantially the same depth position as the deep well regions 455. More specifically, the bottom portion of the outer deep well region 472 is positioned on substantially the same plane as the bottom portions of the deep well regions 455.

That is, the distance between the bottom portion of the outer deep well region 472 and the second main surface 404 of the SiC semiconductor layer 402 is substantially equal to the distance between the bottom portion of the deep well region 455 and the second main surface 404 of the SiC semiconductor layer 402.

Variation can thereby be suppressed from occurring between the distance between the bottom portion of the outer deep well region 472 and the second main surface 404 of the SiC semiconductor layer 402 and the distance between the bottom portion of the deep well region 455 and the second main surface 404 of the SiC semiconductor layer 402.

The withstand voltage (for example, electrostatic breakdown strength) of the SiC semiconductor layer 402 can thus be suppressed from being restricted by the configuration of the outer deep well region 472 and the configuration of the deep well region 455. Consequently, improvement of the withstand voltage can be achieved appropriately.

Especially, with the semiconductor device 401, the outer region 407 is formed in a region at the second main surface 404 side of the SiC semiconductor layer 402 with respect to the active region 406. The position of the bottom portion of the outer deep well region 472 can thereby be made to approach the position of the bottom portion of the deep well region 455 appropriately.

That is, a need to introduce the p-type impurity to a comparatively deep position of the surface layer portion of the first main surface 403 of the SiC semiconductor layer 402 during the forming of the outer deep well region 472 is eliminated. The position of the bottom portion of the outer deep well region 472 can thus be suppressed appropriately from deviating greatly with respect to the position of the bottom portion of the deep well region 455.

Moreover, with the semiconductor device 401, the outer main surface 462 of the outer region 407 is positioned on substantially the same plane as the bottom wall of the source trench 441. Thereby, when the p-type impurity is introduced into the bottom wall of the source trench 441 and the outer main surface 462 of the outer region 407 at an equal energy, the deep well region 455 and the outer deep well region 472 can be formed at substantially equal depth positions.

Consequently, the position of the bottom portion of the outer deep well region 472 can be suppressed even more appropriately from deviating greatly with respect to the position of the bottom portion of the deep well region 455.

Also, with the semiconductor device 401, the field limit structure 473 is formed in the outer region 407. An electric field relaxation effect by the field limit structure 473 can thereby be obtained in the outer region 407. The electrostatic breakdown strength of the SiC semiconductor layer 402 can thus be improved appropriately.

Also, with the semiconductor device 401, the active region 406 is formed as the active mesa 463 of mesa shape. The active mesa 463 includes the active side wall 464 connecting the active main surface 461 of the active region 406 and the outer main surface 462 of the outer region 407.

The level difference moderating structure that moderates the level difference 483 between the active main surface 461 and the outer main surface 462 is formed in the region between the active main surface 461 and the outer main surface 462. The level difference moderating structure includes the side wall structure 482.

The level difference 483 between the active main surface 461 and the outer main surface 462 can thereby be moderated appropriately. The flatness of the upper layer structure formed on the side wall structure 482 can thus be improved appropriately. With the semiconductor device 401, the interlayer insulating layer 491, the main surface source electrode 409, the passivation layer 503, and the resin layer 416 are formed as an example of the upper layer structure.

Also, with the semiconductor device 401, the anchor structure arranged to improve the connection strength of the resin layer 416 is formed in the outer region 407. The anchor structure includes the uneven structure formed at the first main surface 403 of the SiC semiconductor layer 402 in the outer region 407.

More specifically, the uneven structure (anchor structure) includes the unevenness formed using the interlayer insulating layer 491 formed on the first main surface 403 of the SiC semiconductor layer 402 in the outer region 407. Even more specifically, the uneven structure (anchor structure) includes the anchor hole 495 formed in the interlayer insulating layer 491.

The resin layer 416 is engaged with the anchor hole 495. The resin layer 416 is engaged with the anchor hole 495 via the passivation layer 503, in this embodiment. The connection strength of the resin layer 416 with respect to the first main surface 403 of the SiC semiconductor layer 402 can thereby be improved and therefore, peeling of the resin layer 416 can be suppressed.

The configuration of the semiconductor device 401 is not restricted to the present preferred embodiment. The configuration of the semiconductor device 401 may be applied to all preferred embodiments disclosed herein.

FIG. 67 is an enlarged view of a region corresponding to FIG. 51 and is an enlarged view of a semiconductor device 631 according to a twenty-seventh preferred embodiment of the present invention. FIG. 68 is a sectional view taken along line LXVIII-LXVIII shown in FIG. 67. FIG. 69 is a sectional view taken along line LXIX-LXIX shown in FIG. 67. FIG. 70 is an enlarged view of a region LXX-LXX shown in FIG. 68.

In the following, structures corresponding to structures described with the semiconductor device 401 shall be provided with the same reference symbols and description thereof shall be omitted.

Referring to FIG. 67 to FIG. 70, the semiconductor device 631 has a configuration where the technical ideas of the semiconductor device 101 according to the seventh preferred embodiment (see also FIG. 11 to FIG. 17L) are incorporated in the semiconductor device 401. More specifically, the semiconductor device 631 includes a low resistance electrode layer 632 formed on the gate electrode layer 435.

The gate electrode layer 435 contains a p-type polysilicon doped with a p-type impurity. The p-type impurity of the gate electrode layer 435 may include at least one of material among boron (B), aluminum (Al), indium (In), or gallium (Ga).

A p-type impurity concentration of the gate electrode layer 435 is not less than the p-type impurity concentration of the body region 426. More specifically, the p-type impurity concentration of the gate electrode layer 435 is greater than the p-type impurity concentration of the body region 426.

The p-type impurity concentration of the gate electrode layer 435 may be not less than $1\times10^{18}$ $cm^{-3}$ and not more than $1\times10^{22}$ $cm^{-3}$. A sheet resistance of the gate electrode layer 435 may be not less than 10Ω/□ and not more than 500Ω/□ (approximately 200Ω/□ in this embodiment).

The low resistance electrode layer 632 covers an upper end portion of the gate electrode layer 435 inside the gate trench 431. The low resistance electrode layer 632 includes a conductive material having a sheet resistance less than the sheet resistance of the gate electrode layer 435. The sheet resistance of the low resistance electrode layer 632 may be not less than 0.01Ω/□ and not more than 10 Ω/□.

A current supplied into the gate trenches 431 flows through the low resistance electrode layer 632 having the comparatively low sheet resistance and is transmitted to entirety of the gate electrode layer 435. The entirety of the gate electrode layer 435 (entire area of the active region 406) can thereby be made to transition rapidly from an off state to an on state and therefore delay of switching response can be suppressed.

In particular, although time is required for transmission of current in a case in which the gate trench 431 has the length of the millimeter order, the delay of the switching response can be suppressed appropriately by the low resistance electrode layer 632. That is, the low resistance electrode layer 632 is formed as a current diffusing electrode layer that diffuses the current into the gate trench 431.

Also, as refinement of cell structure progresses, the width, depth, cross-sectional area, etc., of the gate electrode layer 435 decreases and there is thus concern for the delay of the switching response due to increase of electrical resistance inside the gate trench 431.

However, the entirety of the gate electrode layer 132 can be made to transition rapidly from the off state to the on state by the low resistance electrode layer 632 and therefore the delay of the switching response due to refinement can be suppressed appropriately.

The low resistance electrode layer 632 is formed in a film shape. The low resistance electrode layer 632 has a connection portion 632*a* in contact with the upper end portion of the gate electrode layer 435 and a non-connection portion 632*b* opposite thereof. The connection portion 632*a* and the non-connection portion 632*b* of the low resistance electrode layer 632 may be formed in curved shapes conforming to the upper end portion of the gate electrode layer 435. The connection portion 632*a* and the non-connection portion 632*b* of the low resistance electrode layer 632 may take on any of various configurations.

An entirety of the connection portion 632*a* of the low resistance electrode layer 632 may be positioned higher than the first main surface 403 of the SiC semiconductor layer 402. The entirety of the connection portion 632*a* of the low resistance electrode layer 632 may be positioned lower than the first main surface 403 of the SiC semiconductor layer 402.

The connection portion 632*a* of the low resistance electrode layer 632 may include a portion positioned higher than the first main surface 403 of the SiC semiconductor layer 402. The connection portion 632*a* of the low resistance electrode layer 632 may include a portion positioned lower than the first main surface 403 of the SiC semiconductor layer 402.

For example, a central portion of the connection portion 632*a* of the low resistance electrode layer 632 may be positioned lower than the first main surface 403 of the SiC semiconductor layer 402 and a peripheral edge portion of the connection portion 632*a* of the low resistance electrode layer 632 may be positioned higher than the first main surface 403 of the SiC semiconductor layer 402.

An entirety of the non-connection portion 632*b* of the low resistance electrode layer 632 may be positioned higher than the first main surface 403 of the SiC semiconductor layer 402. The entirety of the non-connection portion 632*b* of the low resistance electrode layer 632 may be positioned lower than the first main surface 403 of the SiC semiconductor layer 402.

The non-connection portion 632*b* of the low resistance electrode layer 632 may include a portion positioned higher than the first main surface 403 of the SiC semiconductor layer 402. The non-connection portion 632*b* of the low resistance electrode layer 632 may include a portion positioned lower than the first main surface 403 of the SiC semiconductor layer 402.

For example, a central portion of the non-connection portion 632*b* of the low resistance electrode layer 632 may be positioned lower than the first main surface 403 of the SiC semiconductor layer 402 and a peripheral edge portion of the non-connection portion 632*b* of the low resistance electrode layer 632 may be positioned higher than the first main surface 403 of the SiC semiconductor layer 402.

The low resistance electrode layer 632 has an edge portion 632*c* contacting the gate insulating layer 434. The edge portion 632*c* of the low resistance electrode layer 632 contacts a corner portion (the bulging portion 434*d* in this embodiment) connecting the first region 434*a* and the second region 434*b* in the gate insulating layer 434.

The edge portion 632*c* of the low resistance electrode layer 632 is formed in a region at the first main surface 403 side of the SiC semiconductor layer 402 with respect to bottom portions of the source regions 453. That is, the edge portion 632*c* of the low resistance electrode layer 632 is formed in a region further to the first main surface 403 side of the SiC semiconductor layer 402 than boundary regions between the body region 426 and the source regions 453.

The edge portion 632*c* of the low resistance electrode layer 632 thus faces the source regions 453 across the gate insulating layer 434. The edge portion 632*c* of the low resistance electrode layer 632 does not face the body region 426 across the gate insulating layer 434.

Formation of a leak current path in a region of the gate insulating layer 434 between the low resistance electrode layer 632 and the body region 426 can thereby be suppressed. The leak current path may be formed by undesired diffusion of an electrode material of the low resistance electrode layer 632 into the gate insulating layer 434.

In particular, a design of connecting the edge portion 632*c* of the low resistance electrode layer 632 to the comparatively thick third region 434*c* of the gate insulating layer 434 (bulging portion 434*d* of the gate insulating layer 434) is effective in terms of reducing a risk of formation of the leak current path.

In regard to the direction normal to the first main surface 403 of the SiC semiconductor layer 402, a thickness TR of the low resistance electrode layer 632 is not more than a thickness TG of the gate electrode layer 435 ($TR \leq TG$). The thickness TR of the low resistance electrode layer 632 is preferably less than the thickness TG of the gate electrode layer 435 ($TR < TG$). More specifically, the thickness TR of the low resistance electrode layer 632 is preferably not more than half the thickness TG of the gate electrode layer 435 ($TR \leq TG/2$).

A ratio TR/TG of the thickness TR of the low resistance electrode layer 632 with respect to the thickness TG of the gate electrode layer 435 is not less than 0.01 and not more than 1. The thickness TG of the gate electrode layer 435 may be not less than 0.5 μm and not more than 3 μm. The thickness TR of the low resistance electrode layer 632 may be not less than 0.01 μm and not more than 3 μm.

The low resistance electrode layer 632 also covers the upper end portion of the gate wiring layer 436, in this embodiment. A portion of the low resistance electrode layer 632 that covers the upper end portion of the gate wiring layer 436 is formed integral to the portion of the low resistance electrode layer 632 covering the upper end portion of the gate electrode layer 435. The low resistance electrode layer 632 thereby covers entire area of the gate electrode layer 435 and an entire area of the gate wiring layer 436.

A current supplied from the gate pad 410 and the gate finger 411 to the gate wiring layer 436 thus flows through the low resistance electrode layer 632 of comparatively low sheet resistance and is transmitted to the entirety of the gate electrode layer 435 and the gate wiring layer 436.

The entirety of the gate electrode layer 435 (the entire area of the active region 406) can thereby be made to transition rapidly from the on state to the off state via the gate wiring layer 436 and therefore the delay of the switching response can be suppressed.

In particular, in the case in which the gate trench 431 has the length of the millimeter order, the delay of the switching response can be suppressed appropriately by the low resistance electrode layer 632 covering the upper end portion of the gate wiring layer 436.

The low resistance electrode layer 632 includes a polycide layer. The polycide layer is formed by a portion of the p-type polysilicon forming a surface layer portion of the gate electrode layer 435 silicided by a metal material.

The siliciding of the p-type polysilicon is performed by a heat treatment. The heat treatment may be an RTA (rapid thermal annealing) method. More specifically, the polycide layer is made of a p-type polycide layer that contains the p-type impurity doped in the gate electrode layer 435 (p-type polysilicon).

The polycide layer has a specific resistance of not less than 10 μΩ·cm and not more than 110 μΩ·cm, in this embodiment. More specifically, the polycide layer includes at least one of material among TiSi, $TiSi_2$, NiSi, CoSi, $CoSi_2$, $MoSi_2$, or $WSi_2$.

Among the above types of materials, NiSi, $CoSi_2$, and $TiSi_2$ are especially suitable as the polycide layer forming the low resistance electrode layer 632 due to being comparatively low in the value of specific resistance and temperature dependence.

A sheet resistance inside the gate trench 431 when the low resistance electrode layer 632 is formed on the p-type polysilicon is not more than a sheet resistance of the gate electrode layer 132 (p-type polysilicon) alone. The sheet resistance inside the gate trench 431 is preferably not more than a sheet resistance of an n-type polysilicon doped with an n-type impurity.

The sheet resistance inside the gate trench 431 is approximated by the sheet resistance of the low resistance electrode layer 632. That is, the sheet resistance inside the gate trench 431 may be not less than 0.01Ω/□ and not more than 10Ω/□. The sheet resistance inside the gate trench 431 is preferably less than 10 Ω/□.

The trench gate structure 451 includes the gate trench 431, the gate insulating layer 434, the gate electrode layer 435, and the low resistance electrode layer 632, in this embodiment.

The gate finger 411 is electrically connected to the low resistance electrode layer 632 in the gate contact hole 492, in this embodiment. An electrical signal from the gate pad 410 is thereby transmitted to the gate electrode layer 435 via the low resistance electrode layer 632 having the comparatively low resistance value.

The source electrode layer 443 preferably includes a p-type polysilicon doped with a p-type impurity. In this case, the source electrode layers 443 can be formed at the same time as the gate electrode layers 435.

A p-type impurity concentration of the source electrode layer 443 is not less than the p-type impurity concentration of the body region 426. More specifically, the p-type impurity concentration of the source electrode layer 443 is greater than the p-type impurity concentration of the body region 426. The p-type impurity of the source electrode layer 443 may include at least one of material among boron (B), aluminum (Al), indium (In), or gallium (Ga).

The p-type impurity concentration of the source electrode layer 443 may be not less than $1\times10^{18}$ $cm^{-3}$ and not more than $1\times10^{22}$ $cm^{-3}$. A sheet resistance of the source electrode layer 443 may be not less than 10Ω/□ and not more than 500Ω/□ (approximately 200Ω/□ in this embodiment).

The p-type impurity concentration of the source electrode layer 443 may be substantially equal to the p-type impurity concentration of the gate electrode layer 435. The sheet resistance of the source electrode layer 443 may be substantially equal to the sheet resistance of the gate electrode layer 435.

The source electrode layer 443 may include an n-type polysilicon instead of the p-type polysilicon. The source electrode layer 443 may include at least one of material among tungsten, aluminum, copper, an aluminum alloy, or a copper alloy instead of the p-type polysilicon.

The side wall structure 482 (see also FIG. 55 and FIG. 56) preferably includes a p-type polysilicon doped with a p-type impurity. In this case, the side wall structure 482 can be formed at the same time as the gate electrode layers 435 and the source electrode layer 443.

A p-type impurity concentration of the side wall structure 482 is not less than the p-type impurity concentration of the body region 426. More specifically, the p-type impurity concentration of the side wall structure 482 is greater than the p-type impurity concentration of the body region 426. The p-type impurity of the side wall structure 482 may include at least one of material among boron (B), aluminum (Al), indium (In), or gallium (Ga).

The p-type impurity concentration of the side wall structure 482 may be not less than $1\times10^{18}$ $cm^{-3}$ and not more than $1\times10^{22}$ $cm^{-3}$. A sheet resistance of the side wall structure 482 may be not less than 10Ω/□ and not more than 500Ω/□ (approximately 200Ω/□ in this embodiment).

The p-type impurity concentration of the side wall structure 482 may be substantially equal to the p-type impurity concentration of the gate electrode layer 435. The sheet resistance of the side wall structure 482 may be substantially equal to the sheet resistance of the gate electrode layer 435.

The side wall structure 482 may include an n-type polysilicon instead of the p-type polysilicon. The side wall structure 482 may include at least one of material among tungsten, aluminum, copper, an aluminum alloy, or a copper alloy instead of the p-type polysilicon.

FIG. 71 is a graph of leak current characteristics for a case where NiSi is adopted as the low resistance electrode layer 632. In FIG. 71, the ordinate indicates a current density [$A/cm^2$] and the abscissa indicates an electric field [MV/cm].

Referring to the graph of FIG. 71, in the case of NiSi, the leak current is suppressed to a comparatively low value regardless of treatment temperature in the RTA method in a low electric field region of not less than 0 MV/cm to not more than 7 MV/cm. NiSi is thus appropriate as the polycide layer forming the low resistance electrode layer 632.

FIG. 72 is a graph of leak current characteristics for a case where $CoSi_2$ is adopted as the low resistance electrode layer 632. In FIG. 72, the ordinate indicates a current density [$A/cm^2$] and the abscissa indicates an electric field [MV/cm].

Referring to the graph of FIG. 72, in the case of $CoSi_2$, the leak current in the low electric field region of not less than 0 MV/cm to not more than 7 MV/cm increases as the treatment temperature in the RTA method increases. However, the leak current is still suppressed to comparatively low values in the low electric field region. $CoSi_2$ is thus appropriate as the polycide layer forming the low resistance electrode layer 632.

FIG. 73 is a graph of leak current characteristics for a case where TiSi and/or $TiSi_2$ is adopted as the low resistance electrode layer 632. In FIG. 73, the ordinate indicates a current density [A/$cm^2$] and the abscissa indicates an electric field [MV/cm].

Referring to the graph of FIG. 73, in the case of TiSi and/or $TiSi_2$, the leak current in the low electric field region of not less than 0 MV/cm to not more than 7 MV/cm increases as the treatment temperature in the RTA method increases.

TiSi and/or $TiSi_2$ is therefore inferior to NiSi and $CoSi_2$ as the polycide layer forming the low resistance electrode layer 632. This may be because Ti constituting TiSi and/or $TiSi_2$ exists in the gate insulating layer 434.

In a step of forming the low resistance electrode layer 632 that includes TiSi and/or $TiSi_2$, first, a Ti layer covering the gate electrode layer 435 and the gate insulating layer 434 is formed. A heat treatment step for siliciding is then performed.

In the heat treatment step, Si constituting the gate insulating layer 434 (silicon oxide) diffuses into the Ti layer at the same that the low resistance electrode layer 632 is formed. Although the Ti layer is removed thereafter, a region of the Ti layer into which the Si diffused remains as a portion of the gate insulating layer 434.

Leak current paths due to Ti are thus formed in regions between the gate electrode layer 435 and the source electrode layer 443. In particular, it is considered that the leak current path is formed due to the Ti remaining in the third region 434*c* of the gate insulating layer 434.

That is, when TiSi and/or $TiSi_2$ is adopted as the low resistance electrode layer 632, the gate insulating layer 434 (especially the third region 434*c* of the gate insulating layer 434) may include Ti.

On the other hand, an Ni layer and a Co layer used in the siliciding of a polysilicon has different properties from the Ti layer. More specifically, the Ni layer has a property that Si constituting the gate insulating layer 434 (silicon oxide) is unlikely to diffuse into the Ni layer.

Similarly, the Co layer has a property that Si constituting the gate insulating layer 434 (silicon oxide) is unlikely to diffuse into the Co layer. Therefore, when the Ni layer and the Co layer are used in place of the Ti layer, a problem such as that of the Ti layer is unlikely to be manifested.

Therefore, in a case in which the low resistance electrode layer 632 includes Ti (TiSi and/or $TiSi_2$), diffusion of Si constituting the gate insulating layer 434 (silicon oxide) into the Ti layer should be suppressed. Forming of the leak current path can thereby be suppressed. A method for this shall be described with the following preferred embodiment.

FIG. 74A to FIG. 74G are enlarged views of a region corresponding to FIG. 70 and are enlarged views for describing an example of a method for manufacturing the semiconductor device shown in FIG. 67. Manufacturing steps differing from the manufacturing steps for the semiconductor device 401 shall be described below.

Referring to FIG. 74A, first, the SiC semiconductor layer 402 having the gate electrode layers 435, the gate wiring layer 436, and the source electrode layers 443 formed thereon is prepared through the steps of FIG. 65A to FIG. 65Q (FIG. 66A to FIG. 66Q). The of the gate electrode layers 435, the gate wiring layer 436, and the source electrode layers 443 includes a p-type polysilicon.

Next, referring to FIG. 74B, a metal material layer 641 is formed on the gate electrode layers 435. The metal material layer 641 is formed on the first main surface 403 of the SiC semiconductor layer 402 such as to cover the gate electrode layer 435, the gate wiring layer 436, and the source electrode layer 443 altogether, in this embodiment.

The metal material layer 641 includes a metal material that can be polycided with the p-type polysilicon. The metal material layer 641 may include at least one of material among Mo, W, Ni, Co, or Ti.

Next, referring to FIG. 74C, the p-type polycide layer is formed in the surface layer portion of the gate electrode layer 435 and a surface layer portion of the gate wiring layer 436. The p-type polycide layer is also formed in a surface layer portion of the source electrode layer 443, in this embodiment.

The p-type polycide layer is formed by polyciding the surface layer portion of the gate electrode layer 435, the surface layer portion of the gate wiring layer 436, and the surface layer portion of the source electrode layer 443 by a heat treatment to the metal material layer 641. The heat treatment to the metal material layer 641 may be an RTA method.

The p-type polycide including at least one of material among TiSi, $TiSi_2$, NiSi, CoSi, $CoSi_2$, $MoSi_2$, or $WSi_2$ is thereby formed in accordance with the metal type of the metal material layer 641. The low resistance electrode layer 632 is formed by the p-type polycide layer.

Next, referring to FIG. 74D, unreacted portions of the metal material layer 641 that did not bind with the p-type polysilicon are removed. The unreacted portions of the metal material layer 641 may be removed by an etching method (for example, a wet etching method).

If the low resistance electrode layer 632 (p-type polycide) includes at least one of material among TiSi or CoSi, a heat treatment may be applied as necessary to the low resistance electrode layer 632 after the unreacted portions of the metal material layer 641 have been removed.

The heat treatment of the low resistance electrode layer 632 may be an RTA method. Thereby, TiSi is modified to $TiSi_2$, and CoSi is modified to $CoSi_2$, and lowering of resistance can thus be achieved.

Next, referring to FIG. 74E, the interlayer insulating layer 491 is formed on the first main surface 403 of the SiC semiconductor layer 402. The interlayer insulating layer 491 covers the active region 406 and the outer region 407 altogether. The interlayer insulating layer 491 may include silicon oxide or silicon nitride. The interlayer insulating layer 491 may be formed by a CVD method.

Next, referring to FIG. 74F, the resist mask 621 having the predetermined pattern is formed on the interlayer insulating layer 491. The resist mask 621 selectively has openings 622 exposing regions at which the gate contact hole 492, the source contact holes 493, the diode contact hole 494, and the anchor hole 495 are to be formed.

Next, the unnecessary portions of the interlayer insulating layer 491 are removed. The unnecessary portions of the interlayer insulating layer 491 may be removed by the etching method (for example, a dry etching method) via the resist mask 621.

Next, referring to FIG. 74G, unnecessary portions of the base insulating layer 619 exposed from the interlayer insulating layer 491 are removed. The unnecessary portions of the base insulating layer 619 may be removed by an etching method (for example, a dry etching method).

The base insulating layer 619 is thereby divided into the gate insulating layer 434, the source insulating layers 442, and the outer insulating layer 481. Also, the gate contact hole 492, the source contact holes 493, the diode contact hole 494, and the anchor hole 495 are thereby formed in the interlayer insulating layer 491.

Further, in the present step, the source sub-trench 456 communicating with the source trench 441 is formed in the region of the first main surface 403 of the SiC semiconductor layer 402 along the upper end portion of the source electrode layer 443.

More specifically, the source sub-trench 456 is formed by digging into the upper end portion of the source insulating layer 442 and the upper end portion of the source electrode layer 443 from the first main surface 403 of the SiC semiconductor layer 402. Also, in the present step, the low resistance electrode layer 632 (p-type polycide layer) formed in the surface layer portion of the source electrode layer 443 is removed as well.

Thereafter, the opening edge portion of the gate contact hole 492, the source contact hole 493, the diode contact hole 494, and the anchor hole 495 may be rounded to convexly curved shapes by a heat treatment method.

Thereafter, the steps of FIG. 65U to FIG. 65Z (steps of FIG. 66U to FIG. 66Z) are executed successively and the semiconductor device 631 is manufactured.

With the semiconductor device 631 described above, the same effects as the effects described for the semiconductor device 401 can be exhibited.

Also, with the semiconductor device 631, the trench gate structure 451 in which the gate electrode layer 435 is embedded across the gate insulating layer 434 in the gate trench 431 are formed. With the trench gate structure 451, the gate electrode layer 435 is covered by the low resistance electrode layer 632 in a limited space of the gate trench 431.

The gate electrode layer 435 includes the p-type polysilicon. The gate threshold voltage Vth can thereby be increased (increased, for example, by approximately 1 V). Also, the low resistance electrode layer 632 includes the conductive material having the sheet resistance less than the sheet resistance of the p-type polysilicon.

Reduction of the gate resistance can thereby be achieved. Consequently, the current can be diffused efficiently along the trench gate structure 451 and reduction of switching delay can thus be achieved.

Especially, with the structure where the gate electrode layer 435 is covered by the low resistance electrode layer 632, the p-type impurity concentration of the body region 426 does not have to be increased. The gate threshold voltage Vth can thus be increased while preventing the increase of channel resistance.

Also, with the semiconductor device 631, the gate wiring layer 436 is covered by the low resistance electrode layer 632 in the outer region 407. Reduction of a gate resistance of the gate wiring layer 436 can also be achieved thereby.

Especially, with the structure where the gate electrode layers 435 and the gate wiring layer 436 are covered with the low resistance electrode layer 632, the current can be diffused efficiently along the trench gate structure 451. The reduction of switching delay can thus be achieved appropriately.

With this embodiment, an example where the low resistance electrode layer 632 (p-type polycide layer) formed in the surface layer portion of the source electrode layer 443 is removed was described. However, the low resistance electrode layer 632 (p-type polycide layer) formed in the surface layer portion of the source electrode layer 443 may remain. The semiconductor device 631 may include the low resistance electrode layer 632 covering the source electrode layer 443 inside the source trench 441.

The configuration of the semiconductor device 631 (that is, the configuration in which the low resistance electrode layer 632 is formed) is not restricted to the present preferred embodiment. The configuration of the semiconductor device 631 may be applied to all preferred embodiments disclosed herein.

FIG. 75 is an enlarged view of a region corresponding to FIG. 70 and is an enlarged view of a semiconductor device 651 according to a twenty-eighth preferred embodiment of the present invention. In the following, structures corresponding to structures described with the semiconductor device 631 shall be provided with the same reference symbols and description thereof shall be omitted.

The gate insulating layer 434 includes a silicon oxide layer 652, and the low resistance electrode layer 632 includes Ti (more specifically, TiSi and/or $TiSi_2$), in this embodiment. Referring to FIG. 75, the semiconductor device 651 includes a barrier insulating layer 653 interposed in a region between the gate insulating layer 434 and the low resistance electrode layer 632.

The barrier insulating layer 653 is formed as a portion of the gate insulating layer 434. That is, the gate insulating layer 434 has a laminated structure including the silicon oxide layer 652 and the barrier insulating layer 653 laminated in that order from the SiC semiconductor layer 402 side.

The barrier insulating layer 653 suppresses Si in the gate insulating layer 434 (silicon oxide layer 652) from diffusing into the low resistance electrode layer 632. More specifically, the barrier insulating layer 653 is a silicon-free insulating layer free from Si.

The barrier insulating layer 653 may include at least one among aluminum oxide ($Al_2O_3$), hafnium oxide ($HfO_2$), lanthanum oxide ($La_2O_3$), or cerium oxide ($CeO_2$).

The barrier insulating layer 653 is formed in a film shape along an outer surface of the silicon oxide layer 652 such that a recessed space is defined inside the gate trench 431. The barrier insulating layer 653 covers the first region 434*a*, the second region 434*b*, and the third region 434*c* of the gate insulating layer 434 (silicon oxide layer 652).

The low resistance electrode layer 632 is formed on the gate electrode layer 435 and the gate wiring layer 436 such as to contact the barrier insulating layer 653. The Si in the gate insulating layer 434 (silicon oxide layer 652) is thereby suppressed from diffusing into the low resistance electrode layer 632.

The barrier insulating layer 653 is also interposed in regions between the source insulating layer 442 and the source electrode layer 443, in this embodiment. Although unillustrated, an outer surface of the outer insulating layer 481 is covered by the barrier insulating layer 653 in the same mode as the covering of the third region 434*c* of the gate insulating layer 434 by the barrier insulating layer 653, in this embodiment.

FIG. 76A to FIG. 76G are enlarged views of a region corresponding to FIG. 75 and are enlarged views for describing an example of a method for manufacturing the semiconductor device 651 shown in FIG. 75.

Referring to FIG. 76A, first, the SiC semiconductor layer 402 having the structure where the contact regions 454 are formed in the surface layer portion of the first main surface 403 is prepared through the steps of FIG. 65A to FIG. 65N (FIG. 66A to FIG. 66N).

Next, referring to FIG. 76B, the base insulating layer 619 to be the base of the gate insulating layer 434, the source insulating layer 442, and the outer insulating layer 481 is formed. The base insulating layer 619 includes the silicon oxide layer 652. The base insulating layer 619 may be formed by a CVD method or a thermal oxidation treatment method.

Next, the barrier insulating layer 653 is formed on the base insulating layer 619. The barrier insulating layer 653 is a silicon-free insulating layer free from Si. The barrier insulating layer 653 may include at least one among aluminum oxide ($Al_2O_3$), hafnium oxide ($HfO_2$), lanthanum oxide ($La_2O_3$), or cerium oxide ($CeO_2$). The barrier insulating layer 653 may be formed by a CVD method.

Next, referring to FIG. 76C, the base conductor layer 620 to be the base of the gate electrode layer 435, the gate wiring layer 436, and the source electrode layers 443 is formed on the first main surface 403 of the SiC semiconductor layer 402. The base conductor layer 620 fills the gate trench 431, the source trench 441, and the outer region 407 and covers the barrier insulating layer 653.

The base conductor layer 620 includes a p-type polysilicon. The base conductor layer 620 may be formed by a CVD method. The CVD method may be an LP-CVD (low pressure-CVD) method.

Next, referring to FIG. 76D, unnecessary portions of the base conductor layer 620 are removed. The unnecessary portions of the base conductor layer 620 are removed until the base insulating layer 619 is exposed. The unnecessary portions of the base conductor layer 620 may be removed by an etch back method using the base insulating layer 619 as an etching stopping layer.

The unnecessary portions of the base conductor layer 620 may be removed by an etching method (for example, a wet etching method) via a mask (not shown) having a predetermined pattern. The gate electrode layer 435, the gate wiring layer 436, and the source electrode layer 443 are thereby formed.

Further, in the present step, a portion of the base conductor layer 620 (including the p-type polysilicon) remains in a state of being attached to the active side wall 464 connecting the active main surface 461 of the active region 406 and the outer main surface 462 of the outer region 407.

The side wall structure 482 is formed by the remaining portion (p-type polysilicon) of the base conductor layer 620. The side wall structure 482 is formed self-alignedly with respect to the active main surface 461 of the active region 406.

Next, referring to FIG. 76E, a Ti layer is formed as the metal material layer 641 on the gate electrode layer 435. The metal material layer 641 is formed on the barrier insulating layer 653 such as to cover the gate electrode layer 435, the gate wiring layer 436, and the source electrode layer 443 altogether, in this embodiment.

Next, referring to FIG. 76F, the p-type polycide layer is formed in the surface layer portions of the gate electrode layers 435 and the surface layer portion of the gate wiring layer 436. The p-type polycide layer is also formed in the surface layer portion of the source electrode layer 443, in this embodiment.

The p-type polycide layer is formed by polyciding the surface layer portion of the gate electrode layer 435, the surface layer portion of the gate wiring layer 436, and the surface layer portion of the source electrode layer 443 by a heat treatment to the metal material layer 641. The heat treatment to the metal material layer 641 may be an RTA method.

The p-type polycide containing TiSi and/or $TiSi_2$ is thereby formed. The low resistance electrode layer 632 is formed by the p-type polycide layer. In the present step, the Si in the base insulating layer 619 (silicon oxide layer 652) can be suppressed from diffusing into the low resistance electrode layer 632 by the barrier insulating layer 653.

Next, referring to FIG. 76G, unreacted portions of the metal material layer 641 that did not bind with the p-type polysilicon are removed. The unreacted portions of the metal material layer 641 may be removed by an etching method (for example, a wet etching method).

If the low resistance electrode layer 632 (p-type polycide) includes TiSi, a heat treatment may be applied as necessary to the low resistance electrode layer 632 after the unreacted portions of the metal material layer 641 have been removed.

The heat treatment of the low resistance electrode layer 632 may be an RTA method. Thereby, TiSi is modified to $TiSi_2$, and lowering of resistance can thus be achieved. The Si in the base insulating layer 619 (silicon oxide layer 652) can be suppressed from diffusing into the low resistance electrode layer 632 by the barrier insulating layer 653 in the present step as well.

Thereafter, the steps of FIG. 65R to FIG. 65Z (steps of FIG. 66R to FIG. 66Z) are executed successively and the semiconductor device 651 is manufactured.

With the semiconductor device 651 described above, the gate insulating layer 434 includes the silicon oxide layer 652 and the low resistance electrode layer 632 contains Ti (more specifically, TiSi and/or $TiSi_2$). The semiconductor device 651 includes the barrier insulating layer 653 interposed in the region between the gate insulating layer 434 and the low resistance electrode layer 632.

The barrier insulating layer 653 suppresses the Si in the gate insulating layer 434 (silicon oxide layer 652) from diffusing into the low resistance electrode layer 632. More specifically, the barrier insulating layer 653 is a silicon-free insulating layer free from Si.

Formation of the leak current path in the region between the gate electrode layer 435 and the source electrode layer 443 can thereby be suppressed in a configuration where the low resistance electrode layer 632 includes Ti (more specifically, TiSi and/or $TiSi_2$). Consequently, resistance lowering of the gate resistance by the low resistance electrode layer 632 can be achieved appropriately while achieving suppression of leak currents in a low electric field region (see also the graph of FIG. 73).

Also, with the semiconductor device 651, the third region 434*c* of the gate insulating layer 434 in proximity to the source electrode layer 443 is covered by the barrier insulating layer 653. Suppression of the leak current can thereby be achieved appropriately.

The configuration of the semiconductor device 651 may be applied not only to the various configuration examples described above but also to the twenty-sixth to twenty-seventh preferred embodiments. The configuration of the semiconductor device 651 is not restricted to the present preferred embodiment. The configuration of the semiconductor device 651 may be applied to all preferred embodiments disclosed herein.

FIG. 77 is an enlarged view of a region corresponding to FIG. 70 and is an enlarged view of a semiconductor device 661 according to a twenty-ninth preferred embodiment of the present invention. In the following, structures corresponding to structures described with the semiconductor device 631 shall be provided with the same reference symbols and description thereof shall be omitted.

The gate insulating layer 434 includes a silicon oxide layer 662, and the low resistance electrode layer 632 includes Ti (more specifically, TiSi and/or $TiSi_2$), in this embodiment. Referring to FIG. 77, the semiconductor device 661 includes a barrier insulating layer 663 covering the gate insulating layer 434. More specifically, the barrier insulating layer 663 covers the third region 434*c* of the gate insulating layer 434.

The barrier insulating layer 663 suppresses the Si in the gate insulating layer 434 (silicon oxide layer 662) from diffusing into the low resistance electrode layer 632. More specifically, the barrier insulating layer 663 is a silicon-free insulating layer free from Si.

The barrier insulating layer 663 may include at least one among aluminum oxide ($Al_2O_3$), hafnium oxide ($HfO_2$), lanthanum oxide ($La_2O_3$), or cerium oxide ($CeO_2$).

Although unillustrated, the outer surface of the outer insulating layer 481 may be covered by the barrier insulating layer 663 in the same mode as the covering of the third region 434*c* of the gate insulating layer 434 by the barrier insulating layer 663.

FIG. 78A to FIG. 78F are enlarged views of a region corresponding to FIG. 77 and are enlarged views for describing an example of a method for manufacturing the semiconductor device 661 shown in FIG. 77.

Referring to FIG. 78A, first, the SiC semiconductor layer 402 having the gate electrode layer 435, the gate wiring layer 436, and the source electrode layer 443 formed thereon is prepared through the steps of FIG. 65A to FIG. 65Q (FIG. 66A to FIG. 66Q). Each of the gate electrode layer 435, the gate wiring layer 436, and the source electrode layer 443 includes the p-type polysilicon.

Next, referring to FIG. 78B, the barrier insulating layer 663 is formed on the base insulating layer 619. The barrier insulating layer 663 is a silicon-free insulating layer free from Si. The barrier insulating layer 663 may include at least one among aluminum oxide ($Al_2O_3$), hafnium oxide ($HfO_2$), lanthanum oxide ($La_2O_3$), or cerium oxide ($CeO_2$). The barrier insulating layer 663 may be formed by a CVD method.

Next, referring to FIG. 78C, a resist mask 664 having a predetermined pattern is formed on the barrier insulating layer 663. In the present step, the resist mask 664 selectively has openings 665 exposing the gate electrode layer 435, the gate wiring layer 436, and the source electrode layer 443.

Next, unnecessary portions of the barrier insulating layer 663 are removed. The unnecessary portions of the barrier insulating layer 663 may be removed by an etching method (for example, a dry etching method) via the resist mask 664. The gate electrode layer 435, the gate wiring layer 436, and the source electrode layer 443 thereby become exposed from the barrier insulating layer 663. Next, the resist mask 664 is removed.

Next, referring to FIG. 78D, a Ti layer is formed as the metal material layer 641 on the gate electrode layers 435. The metal material layer 641 is formed on the barrier insulating layer 663 such as to cover the gate electrode layer 435, the gate wiring layer 436, and the source electrode layer 443 altogether, in this embodiment.

Next, referring to FIG. 74E, the p-type polycide layer is formed in the surface layer portions of the gate electrode layers 435 and the surface layer portion of the gate wiring layer 436. The p-type polycide layer is also formed in the surface layer portion of the source electrode layer 443, in this embodiment.

The p-type polycide layer is formed by polyciding the surface layer portion of the gate electrode layer 435, the surface layer portion of the gate wiring layer 436, and the surface layer portion of the source electrode layer 443 by a heat treatment of the metal material layer 641. The heat treatment of the metal material layer 641 may be an RTA method.

The p-type polycide including TiSi and/or $TiSi_2$ is thereby formed. The low resistance electrode layer 632 is formed by the p-type polycide layer. In the present step, the Si in the base insulating layer 619 (silicon oxide layer 662) can be suppressed from diffusing into the low resistance electrode layer 632 by the barrier insulating layer 663.

Next, referring to FIG. 78F, unreacted portions of the metal material layer 641 that did not bind with the p-type polysilicon are removed. The unreacted portions of the metal material layer 641 may be removed by an etching method (for example, a wet etching method).

If the low resistance electrode layer 632 (p-type polycide) contains TiSi, a heat treatment may be applied as necessary to the low resistance electrode layer 632 after the unreacted portions of the metal material layer 641 have been removed. The heat treatment of the low resistance electrode layer 632 may be an RTA method. TiSi is thereby modified to $TiSi_2$ and lowering of resistance can thus be achieved.

Thereafter, the steps of FIG. 65R to FIG. 65Z (steps of FIG. 66R to FIG. 66Z) are executed successively and the semiconductor device 661 is manufactured.

With the semiconductor device 661 described above, the gate insulating layer 434 includes the silicon oxide layer 662, and the low resistance electrode layer 632 includes Ti (more specifically, TiSi and/or $TiSi_2$). The semiconductor device 661 includes the barrier insulating layer 663 covering the third region 434*c* of the gate insulating layer 434.

The barrier insulating layer 663 suppresses the Si in the gate insulating layer 434 (silicon oxide layer 662) from diffusing into the low resistance electrode layer 632 in the manufacturing process. More specifically, the barrier insulating layer 663 is a silicon-free insulating layer free from Si.

Formation of the leak current path in the region between the gate electrode layer 435 and the source electrode layer 443 can thereby be suppressed in a configuration where the low resistance electrode layer 632 includes Ti (more specifically, TiSi and/or $TiSi_2$). Consequently, resistance lowering of the gate resistance by the low resistance electrode layer 632 can be achieved appropriately while achieving suppression of the leak current in the low electric field region (see also the graph of FIG. 73).

Also, with the semiconductor device 661, the third region 434*c* of the gate insulating layer 434 in proximity to the source electrode layers 443 is covered by the barrier insulating layer 663. Suppression of the leak current can thereby be achieved appropriately.

With this embodiment, an example where the barrier insulating layer 663 that covers the third region 434*c* of the gate insulating layer 434 is formed was described. However, the barrier insulating layer 663 may be removed after the step of removing the unreacted portions of the metal material layer 641 (see FIG. 78F). In this case, the semiconductor device 661 which does not include the barrier insulating layer 663 but is capable of achieving suppression of leak currents and resistance lowering of the gate resistance can be provided.

The configuration of the semiconductor device 661 may be applied not only to the various configuration examples described above but also to the twenty-sixth to twenty-eighth preferred embodiments. The configuration of the semiconductor device 661 is not restricted to the present preferred embodiment. The configuration of the semiconductor device 651 may be applied to all preferred embodiments disclosed herein.

FIG. 79 is an enlarged view of a region corresponding to FIG. 70 and is an enlarged view of a semiconductor device 671 according to a thirtieth preferred embodiment of the present invention. FIG. 80 is a sectional view of a region corresponding to FIG. 69 and is a sectional view of the semiconductor device 671 shown in FIG. 79. FIG. 81 is a sectional view of a region corresponding to FIG. 55 and is a sectional view of the semiconductor device 671 shown in FIG. 79.

In the following, structures corresponding to structures described with the semiconductor device 631 shall be provided with the same reference symbols and description thereof shall be omitted.

Referring to FIG. 79, the semiconductor device 671 includes the low resistance electrode layer 632. The interlayer insulating layer 491 includes the gate contact hole 492, the source contact hole 493, the diode contact hole 494, and the anchor hole 495 having shapes different from those of the respective preferred embodiments described above, in this embodiment.

The interlayer insulating layer 491 may have a single layer structure that includes a PSG (phosphor silicate glass) layer or a BPSG (boron phosphor silicate glass) layer. The interlayer insulating layer 491 may have a laminated structure including the PSG layer and the BPSG layer that are laminated in that order from the first main surface 403 side of the SiC semiconductor layer 402. The interlayer insulating layer 491 may have a laminated structure including the BPSG layer and the PSG layer that are laminated in that order from the first main surface 403 side of the SiC semiconductor layer 402.

Referring to FIG. 80, the gate contact hole 492 includes a wide portion 672 which is comparatively wide in opening width, and a narrow portion 673 having an opening width that is narrower than the opening width of the wide portion 672.

The wide portion 672 is formed in a region of the gate contact hole 492 at the opening side. The narrow portion 673 is formed in a region of the gate contact hole 492 at the first main surface 403 side of the SiC semiconductor layer 402. The wide portion 672 and the narrow portion 673 moderate a level difference inside the gate contact hole 492.

Referring to FIG. 79, the source contact hole 493 includes a wide portion 674 which is comparatively wide in opening width, and a narrow portion 675 having an opening width that is narrower than the opening width of the wide portion 674.

The wide portion 674 is formed in a region of the source contact hole 493 at the opening side. The narrow portion 675 is formed in a region of the source contact hole 493 at the first main surface 403 side of the SiC semiconductor layer 402. The wide portion 674 and the narrow portion 675 moderate a level difference inside the source contact hole 493.

Referring to FIG. 81, the diode contact hole 494 includes a wide portion 676 which is comparatively wide in opening width, and a narrow portion 677 having an opening width that is narrower than the opening width of the wide portion 676.

The wide portion 676 is formed in a region of the diode contact hole 494 at the opening side. The narrow portion 677 is formed in a region of the diode contact hole 494 at the first main surface 403 side of the SiC semiconductor layer 402. The wide portion 676 and the narrow portion 677 moderate a level difference inside the diode contact hole 494.

Referring to FIG. 81, the anchor hole 495 includes a wide portion 678 which is comparatively wide in opening width, and a narrow portion 679 having an opening width that is narrower than the opening width of the wide portion 678.

The wide portion 678 is formed in a region of the anchor hole 495 at the opening side. The narrow portion 679 is formed in a region of the anchor hole 495 at the first main surface 403 side of the SiC semiconductor layer 402. The wide portion 678 and the narrow portion 679 moderate a level difference inside the anchor hole 495.

The main surface gate electrode 408 enters into the gate contact hole 492 from above the interlayer insulating layer 491. The main surface gate electrode 408 is formed in conformance to the wide portion 672 and the narrow portion 673 in the gate contact hole 492. A film forming property of the main surface gate electrode 408 that enters into the gate contact hole 492 is thereby improved.

The main surface source electrode 409 enters into the source contact holes 493 and the diode contact hole 494 from above the interlayer insulating layer 491. The main surface source electrode 409 is formed in conformance to the wide portion 674 and the narrow portion 675 in the source contact hole 493.

The main surface source electrode 409 is formed in conformance to the wide portion 676 and the narrow portion 677 in the diode contact hole 494. A film forming property of the main surface source electrode 409 that enters into the source contact holes 493 and the diode contact hole 494 is thereby improved.

The passivation layer 503 enters into the anchor hole 495 from above the interlayer insulating layer 491. The passivation layer 503 is formed in conformance to the wide portion 678 and the narrow portion 679 in the anchor hole 495. A film forming property of the passivation layer 503 that enters into the anchor hole 495 is thereby improved.

FIG. 82A to FIG. 82C are enlarged views of a region corresponding to FIG. 79 and are enlarged views for describing an example of a method for manufacturing the semiconductor device 671 shown in FIG. 79.

Referring to FIG. 82A, first, the SiC semiconductor layer 402 of the structure having the interlayer insulating layer 491 formed on the first main surface 403 is prepared through the steps of FIG. 65A to FIG. 65R (FIG. 66A to FIG. 66R).

Next, referring to FIG. 82B, a resist mask 681 having a predetermined pattern is formed on the interlayer insulating layer 491. The resist mask 681 selectively has openings 682 exposing the regions at which the gate contact hole 492, the source contact hole 493, the diode contact hole 494, and the anchor hole 495 are to be formed.

Next, unnecessary portions of the interlayer insulating layer 491 are removed by an isotropic etching method (for example, an isotropic dry etching method or an isotropic wet etching method) via the resist mask 681.

The wide portion 672 of the gate contact hole 492, the wide portion 674 of the source contact hole 493, the wide portion 676 of the diode contact hole 494, and the wide portion 678 of the anchor hole 495 are thereby formed respectively.

Next, referring to FIG. 82C, unnecessary portions of the interlayer insulating layer 491 are removed by an anisotropic etching method (for example, an anisotropic dry etching method or an anisotropic wet etching method) via the resist mask 681.

The narrow portion 673 of the gate contact hole 492, the narrow portion 675 of the source contact hole 493, the narrow portion 677 of the diode contact hole 494, and the narrow portion 679 of the anchor hole 495 are thereby formed respectively.

Thereafter, thereafter, the steps of FIG. 65U to FIG. 65Z (steps of FIG. 66U to FIG. 66Z) are executed successively and the semiconductor device 671 is manufactured.

With the semiconductor device 671 described above, the gate contact hole 492 includes the wide portion 672 and the narrow portion 673. The wide portion 672 and the narrow portion 673 moderate the level difference inside the gate contact hole 492. The film forming property of the main surface gate electrode 408 that enters into the gate contact hole 492 can thereby be improved.

Also, with the semiconductor device 671, the source contact hole 493 includes the wide portion 674 and the narrow portion 675. The wide portion 674 and the narrow portion 675 moderate the level difference inside the source contact hole 493. The film forming property of the main surface source electrode 409 that enters into the source contact holes 493 can thereby be improved.

Also, with the semiconductor device 671, the diode contact hole 494 includes the wide portion 676 and the narrow portion 677. The wide portion 676 and the narrow portion 677 moderate the level difference inside the diode contact hole 494. The film forming property of the main surface source electrode 409 that enters into the diode contact hole 494 can thereby be improved.

Also, with the semiconductor device 671, the anchor hole 495 includes the wide portion 678 and the narrow portion 679. The wide portion 678 and the narrow portion 679 moderate the level difference inside the anchor hole 495. The film forming property of the passivation layer 503 that enters into the anchor hole 495 can thereby be improved.

Moreover, with the semiconductor device 671, the shapes of the gate contact hole 492, the source contact hole 493, the diode contact hole 494, and the anchor hole 495 are arranged by etching methods.

That is, with the semiconductor device 671, a heat treatment is not performed to arrange the shapes of the gate contact hole 492, the source contact hole 493, the diode contact hole 494, and the anchor hole 495.

Heating of the low resistance electrode layer 632 (p-type polysilicon layer) after the forming of the low resistance electrode layer 632 (p-type polysilicon layer) can thereby be suppressed. Undesired increase of the gate resistance and undesired increase of leak current can thereby be suppressed appropriately.

The configuration of the semiconductor device 671 may be applied not only to the various configuration examples described above but also to the twenty-sixth to twenty-ninth preferred embodiments. The configuration of the semiconductor device 671 is not restricted to the present preferred embodiment. The configuration of the semiconductor device 671 may be applied to all preferred embodiments disclosed herein.

FIG. 83 is a bottom view of a semiconductor device 691 according to a thirty-first preferred embodiment of the present invention and is a bottom view of a first configuration example of raised portion groups 693. In the following, structures corresponding to structures described with the semiconductor device 401 shall be provided with the same reference symbols and description thereof shall be given.

Referring to FIG. 83, the semiconductor device 691 has a configuration where the technical ideas of the semiconductor device 311 according to the twenty-second preferred embodiment (see also FIG. 34 to FIG. 43I) are incorporated in the semiconductor device 401.

More specifically, the semiconductor device 691 has raised portion groups 693 each including a plurality of raised portions 692 formed on the second main surface 404 of the SiC semiconductor layer 402. The raised portions 692 are portions of the second main surface 404 of the SiC semiconductor layer 402 that are raised along the direction normal to the second main surface 404 of the SiC semiconductor layer 402.

The raised portions 692 are formed at intervals from each other along an arbitrary first direction X and a second direction Y intersecting the first direction X. The first direction X is one of planar directions of the first main surface 403 of the SiC semiconductor layer 402.

The first direction X is set to a direction parallel to the side surfaces 405B and 405D of the SiC semiconductor layer 402, in this embodiment. The second direction Y is, more specifically, a direction orthogonal to the first direction X. That is, the second direction Y is set to a direction parallel to the side surfaces 405A and 405C of the SiC semiconductor layer 402, in this embodiment.

The raised portion group 693 has a first portion 694 in which some raised portions 692 among the raised portions 692 overlap in the first direction X in a first direction view viewed from the first direction X.

Also, the raised portion group 693 has a second portion 695 in which some raised portions 692 among the raised portions 692 are formed separated from the first portion 694 and overlap in the first direction X in the first direction view.

The raised portions 692 are formed successively along the first direction X. More specifically, the raised portions 692 have a dotted pattern of being interspersed at intervals along the first direction X and the second direction Y.

The raised portions 692 are formed successively along the first direction X while maintaining the dotted pattern. The raised portions 692 are formed across from a peripheral edge at the side surface 405A side at one side to a peripheral edge at the side surface 405C side at the other side of the SiC semiconductor layer 402 in plan view, in this embodiment.

Distances between the raised portions 692 that are formed at intervals in the first direction X in the raised portion group 693 may differ from each other. Distances between the raised portions 692 that are formed at intervals in the second direction Y in the raised portion group 693 may differ from each other.

The raised portions 692 may be formed in a non-uniform shape, size, and thickness. The thickness of the raised portion 692 is a distance from a base portion to a top portion (tip portion) of the raised portion 692 in regard to the direction normal to the second main surface 404 of the SiC semiconductor layer 402.

The raised portions 692 may each have a size exceeding 0 μm and not more than 10 μm. Each raised portion 692 may have a thickness of not more than 500 nm (for example, not less than 1 nm and 250 nm).

The raised portion group 693 is formed in a range of the second main surface 404 of the SiC semiconductor layer 402 that is narrower than widths of the side surfaces 405A to 405D (side surfaces 405A and 405C in this embodiment) of the SiC semiconductor layer 402.

The raised portion group 693 is, for example, formed in a range that is not less than 1/1000th and not more than 1/5th the widths of the side surfaces 405A to 405D (side surfaces 405A and 405C in this embodiment) of the SiC semiconductor layer 402.

The raised portion group 693 may be formed in a range that is not less than 1/200th and not more than 1/10th the widths of the side surfaces 405A to 405D (side surfaces 405A and 405C in this embodiment) of the SiC semiconductor layer 402.

The raised portion group 693 may be formed in a range of not less than 10 μm and not more than 200 μm in regard to the second direction Y. The raised portion group 693 may be formed in a range of not less than 50 μm and not more than 150 μm in regard to the second direction Y. The raised portion group 693 may be formed in a range of not less than 80 μm and not more than 120 μm in regard to the second direction Y.

The raised portion group 693 has a layout in which the raised portions 692 overlap in the first direction X in the first direction view viewed from the first direction X. The raised portion group 693 thereby forms a raised portion group region 696 extending as a band shape along the first direction X by a collective pattern of the raised portions 692 interspersed successively along the first direction X.

In other words, the raised portion group region 696 includes the raised portions 692 (the raised portion group 693) formed in a band-shaped region of the second main surface 404 of the SiC semiconductor layer 402 extending along the first direction X.

The raised portion groups 693 (raised portion group regions 696) of such configuration are formed on the second main surface 404 of the SiC semiconductor layer 402 at intervals along the second direction Y.

That is, the dotted pattern of the raised portions 692 is formed intermittently in a second direction view viewed from the second direction Y. Distances between the plurality of raised portion groups 693 may have a value of not less than 1% and not more than 25% of the range in which the raised portion group 693 is formed.

A distance between the mutually adjacent raised portion groups 693 in regard to the second direction Y may be not more than 100 μm. The distance between the raised portion groups 693 may be not less than 5 μm and not more than 50 μm. The distance between the raised portion groups 693 may be not more than 20 μm.

The first direction X may be set to the [11-20] direction and the second direction Y may be set to the [1-100] direction. That is, the raised portion groups 693 may each form the band-shaped raised portion group region 696 extending substantially in parallel or in parallel to the [11-20] direction and be formed in plurality at intervals along the [1-100] direction.

The first direction X may be set to the [1-100] direction and the second direction Y may be set to the [11-20] direction. That is, the raised portion groups 693 may each form the band-shaped raised portion group region 696 extending substantially in parallel or in parallel to the [1-100] direction and be formed in plurality at intervals along the [11-20] direction.

Spaces 697 free from the dotted pattern constituted of the raised portions 692 are defined in regions of the second main surface 404 of the SiC semiconductor layer 402 between the raised portion groups 693 that are mutually adjacent in the second direction Y.

The space 697 is defined as a band shape extending in parallel to the first direction X by mutually adjacent raised portion groups 693 (raised portion group regions 696). A stripe pattern in which the raised portion groups 693 and the spaces 697 are formed alternately along the second direction Y is thereby formed on the second main surface 404 of the SiC semiconductor layer 402.

A plurality of grooves 698 is formed in the second main surface 404 of the SiC semiconductor layer 402. In FIG. 83 and the enlarged view in FIG. 83, the grooves 698 are indicated by lines. The grooves 698 are formed in the raised portion groups 693 and the spaces 697.

The plurality of grooves 698 includes grinding marks formed due to grinding of the second wafer main surface 603 of the SiC semiconductor wafer 601 (see also FIG. 41A to FIG. 41B, FIG. 65A to FIG. 65Z, and FIG. 66A to FIG. 66Z). A direction in which the grooves 698 extend thus differs according to a position at which the SiC semiconductor layer 402 is cut out from the SiC semiconductor wafer 601.

The grooves 698 may extend substantially parallel or parallel to the respective raised portion groups 693. The grooves 698 may include portions intersecting the raised portion groups 693. The grooves 698 may extend in a direction intersecting or orthogonal to the respective raised portion groups 693. The grooves 698 may extend rectilinearly or may extend in arcs.

Some of the raised portions 692 included in each raised portion group 693 are formed at intervals along the groove 698. That is, each raised portion group 693 includes a third portion 699, with which some raised portions 692 of the raised portions 692 are formed at intervals along a groove 698 in plan view.

Each raised portion group 693 is formed, for example, by an annealing treatment method. The raised portions 692 may be laser processing marks formed by a laser annealing treatment method.

The raised portions 692 along the grooves 698 (the third portions 699 of the raised portion groups 693) may be formed by an annealing treatment method performed on unevenness of the second main surface 404 of the SiC semiconductor layer 402 (second wafer main surface 603 of the SiC semiconductor wafer 601) defined by the grooves 698.

Each raised portion group 693 may take on any of various configurations by adjustment of annealing treatment conditions (laser annealing treatment conditions in the present case) as shown in FIG. 84A to FIG. 84D.

FIG. 84A is a diagram of a second configuration example of the respective raised portion groups 693.

As shown in FIG. 84A, the raised portion group 693 may include the raised portions 692 convexly curved shape extending along the first direction X and projecting along the second direction Y (to the side surface 405B side in FIG. 84A) in plan view. The raised portion 692 may be formed by a plurality of mutually overlapping raised portions 692.

A distance between the most separated two points in the raised portion 692 may be not less than 1 μm and not more than 200 μm (approximately 50 μm in the present configuration example). A distance between a plurality of mutually adjacent raised portions 692 in regard to the first direction X is set to a value not less than 10% of the size of the raised portion 692. The raised portions 692 are formed by shifting mutually adjacent laser irradiation positions in the first direction X.

FIG. 84B is a diagram of a third configuration example of the raised portion groups 693.

As shown in FIG. 84B, the raised portion group 693 may include the raised portions 692 concavely curved shape extending along the second direction Y and recessed along the first direction X in plan view. The raised portion 692 may be formed by a plurality of mutually overlapping raised portions 692.

The distance between the most separated two points in each raised portion 692 may be not less than 1 μm and not more than 200 μm (approximately 50 μm in the present configuration example). The raised portions 692 are formed by making mutually adjacent laser irradiation positions overlap in a range of not less than 50% and not more than 70%.

FIG. 84C is a diagram of a fourth configuration example of the raised portion groups 693.

As shown in FIG. 84C, the raised portion group 693 may include the raised portions 692 of line shapes extending along the second direction Y and recessed along the first direction X in plan view. The raised portion 692 may have a projecting portion projecting along the first direction X. The raised portion 692 may be formed by a plurality of mutually overlapping raised portions 692.

The distance between the most separated two points in the raised portion 692 may be not less than 1 μm and not more than 200 μm (approximately 50 μm in the present configuration example). The raised portions 692 are formed by making mutually adjacent laser irradiation positions overlap in a range of not less than 70% and not more than 90%.

FIG. 84D is a diagram of a fifth configuration example of the raised portion groups 693.

As shown in FIG. 84D, the raised portion group 693 may have a layout where raised portion columns including the raised portions 692 aligned at intervals along the second direction Y, are formed at intervals along the first direction X.

The distance between the most separated two points in the raised portion 692 may be not less than 1 μm and not more than 200 μm (approximately 5 μm in the present configuration example). The raised portions 692 are formed by making mutually adjacent laser irradiation positions overlap in a range of not less than 90% and less than 100%.

FIG. 85 is a sectional view of a region corresponding to FIG. 68 and is a sectional view of the semiconductor device 691 shown in FIG. 83. FIG. 86 is a sectional view of a region corresponding to FIG. 69 and is a sectional view of the semiconductor device 691 shown in FIG. 83.

FIG. 87 is an enlarged view of a region LXXXVII shown in FIG. 86. FIG. 88 is a sectional view of a region corresponding to FIG. 55 and is a sectional view of the semiconductor device 691 shown in FIG. 83. In FIG. 85 to FIG. 88, a configuration example where the low resistance electrode layer 632 is formed is shown.

Referring to FIG. 85 to FIG. 88, the raised portion groups 693 (raised portions 692) and the grooves 698 are formed on the SiC semiconductor substrate 421. A modified layer 700 with which a portion of the SiC of the SiC semiconductor layer 402 (SiC semiconductor substrate 421) is modified to have different properties is formed in a surface layer portion of the second main surface 404 of the SiC semiconductor layer 402. The modified layer 700 is formed by the annealing treatment method being performed on the second main surface 404 of the SiC semiconductor layer 402.

The modified layer 700 contains Si atoms and C atoms. More specifically, the modified layer 700 has a carbon density lower than a carbon density of a region of the SiC semiconductor layer 402 (SiC semiconductor substrate 421) outside the modified layer 700.

Also, the modified layer 700 has a silicon density that is higher than the carbon density. That is, the modified layer 700 includes an Si modified layer with which the SiC of the SiC semiconductor layer 402 (SiC semiconductor substrate 421) is modified to Si. The Si modified layer may be an Si amorphous layer.

The modified layer 700 may include a lattice defect due to the modification of SiC. That is, the modified layer 700 may include a lattice defect region having a defect level introduced due to the modification of SiC.

The modified layer 700 is formed in regions of the surface layer portion of the second main surface 404 of the SiC semiconductor layer 402 along the raised portion groups 693, in this embodiment. The raised portions 692 are thereby formed by the modified layer 700 in each raised portion group 693.

Further, the modified layer 700 extends from the raised portion groups 693 to the spaces 697, in this embodiment. That is, the annealing treatment method performed on the second main surface 404 of the SiC semiconductor layer 402 extends to the spaces 697 as well.

A thickness of a portion of the modified layer 700 along the raised portion groups 693 is made not less than a thickness of portions of the modified layer 700 along the spaces 697 by the presence of the raised portions 692. More specifically, the thickness of the portion of the modified layer 700 along the raised portion groups 693 is greater than the thickness of the portion of the modified layer 700 along the spaces 697.

The thickness of the modified layer 700 may be not less than 1 nm and not more than 1000 nm. A thickness Ta of a region of the modified layer 700 forming the raised portion 692 may be not less than 50 nm and not more than 1000 nm. A thickness Tb of a region of the modified layer 700 outside the raised portion 692 may be not less than 1 nm and not more than 300 nm.

The thickness Ta may be not less than 50 nm and not more than 100 nm. The thickness Ta may be not less than 100 nm and not more than 150 nm. The thickness Ta may be not less than 150 nm and not more than 200 nm. The thickness Ta may be not less than 200 nm and not more than 250 nm.

The thickness Ta may be not less than 250 nm and not more than 300 nm. The thickness Ta may be not less than 300 nm and not more than 350 nm. The thickness Ta may be not less than 350 nm and not more than 400 nm. The thickness Ta may be not less than 400 nm and not more than 450 nm. The thickness Ta may be not less than 450 nm and not more than 500 nm.

The thickness Ta may be not less than 500 nm and not more than 600 nm. The thickness Ta may be not less than 600 nm and not more than 700 nm. The thickness Ta may be not less than 700 nm and not more than 800 nm. The thickness Ta may be not less than 800 nm and not more than 900 nm. The thickness Ta may be not less than 900 nm and not more than 1000 nm.

The thickness Tb may be not less than 1 nm and not more than 10 nm. The thickness Tb may be not less than 10 nm and not more than 50 nm. The thickness Tb may be not less than 50 nm and not more than 100 nm.

The thickness Tb may be not less than 100 nm and not more than 150 nm. The thickness Tb may be not less than 150 nm and not more than 200 nm. The thickness Tb may be not less than 200 nm and not more than 250 nm. The thickness Tb may be not less than 250 nm and not more than 300 nm.

The thickness Tb may be not more than 1/2, not more than 1/3, not more than 1/4, not more than 1/5, not more than 1/6, not more than 1/7, not more than 1/8, not more than 1/9, not more than 1/10, not more than 1/11, not more than 1/12, not more than 1/13, not more than 1/14, not more than 1/15, not more than 1/16, not more than 1/17, not more than 1/18, not more than 1/19, or not more than 1/20 the thickness Ta.

A resistance value of the second main surface 404 when the raised portion groups 693 are not present on the second main surface 404 of the SiC semiconductor layer 402 is greater than a resistance value of the second main surface 404 when the raised portion groups 693 are present on the second main surface 404 of the SiC semiconductor layer 402.

That is, the raised portion groups 693 each have a resistance value not more than a resistance value of an SiC monocrystal alone as an electrical characteristic. More specifically, the raised portion groups 693 each have a resistance value less than the resistance value of the SiC monocrystal alone.

The raised portion groups 693 each have a resistance value not more than a resistance value of the spaces 697. More specifically, the raised portion groups 693 each have a resistance value less than the resistance value of the spaces 697.

The resistance value of the raised portion groups 693 is reduced by the modified layer 700. That is, the resistance value of the raised portion groups 693 is made not more than the resistance value of the SiC monocrystal due to the modified layer 700 with which the properties of SiC are modified. The resistance value of the spaces 697 is also reduced by the modified layer 700.

The drain pad 423 is connected directly to the second main surface 404 of the SiC semiconductor layer 402, in this embodiment. The drain pad 423 covers the raised portion groups 693 on the second main surface 404 of the SiC semiconductor layer 402. The drain pad 423 covers the raised portion groups 693 altogether.

The drain pad 423 is formed in a film shape conforming to outer surfaces of the raised portion groups 693 (outer surfaces of the raised portions 692) and inner surfaces of the grooves 698. A plurality of raised portions 423*a* raised in a direction away from the second main surface 404 is thereby formed at portions of an outer surface of the drain pad 423 covering the raised portion groups 693 (raised portions 692). A plurality of recesses 423*b* recessed toward the second main surface 404 is also formed at portions of the outer surface of the drain pad 423 covering the grooves 698.

The drain pad 423 forms an ohmic contact with the second main surface 404 of the SiC semiconductor layer 402. More specifically, the drain pad 423 forms ohmic contacts with the raised portion groups 693.

Even more specifically, the drain pad 423 forms ohmic contacts with the raised portion groups 693. The drain pad 423 forms ohmic contacts with the spaces 697 as well, in this embodiment.

The drain pad 423 has a laminated structure that includes a plurality of electrode layers laminated on the second main surface 404 of the SiC semiconductor layer 402. The drain pad 423 has a four-layer structure that includes a Ti layer 701, an Ni layer 702, an Au layer 703, and an Ag layer 704 that are laminated in that order from the second main surface 404 of the SiC semiconductor layer 402, in this embodiment.

The Ti layer 701, the Ni layer 702, the Au layer 703, and the Ag layer 704 are respectively formed in film shapes conforming to the outer surfaces of the raised portion groups 693 (outer surfaces of the raised portions 692) and the inner surfaces of the grooves 698. The raised portions 423*a* and the recesses 423*b* of the drain pad 423 are formed at an outer surface of the Ag layer 704.

The Ti layer 701 is directly connected to the second main surface 404 of the SiC semiconductor layer 402. The Ti layer 701 covers the raised portion groups 693 altogether and forms an ohmic contact with the second main surface 404 of the SiC semiconductor layer 402. The Ti layer 701 also forms ohmic contacts with the spaces 697, in this embodiment.

The Ni layer 702 covers substantially an entire area or the entire area of the Ti layer 701. The Au layer 703 covers substantially an entire area or the entire area of the Ni layer 702. The Ag layer 704 covers substantially an entire area or the entire area of the Au layer 703.

A thickness of the Ti layer 701 may be not less than 0.01 μm and not more than 5 μm (for example, approximately 0.07 μm). A thickness of the Ni layer 702 may be not less than 0.1 μm and not more than 40 μm (for example, approximately 1.2 μm).

A thickness of the Au layer 703 may be not less than 0.1 μm and not more than 40 μm (for example, approximately 0.07 μm). A thickness of the Ag layer 704 may be not less than 0.1 μm and not more than 40 μm (for example, approximately 0.3 μm). Obviously, the drain pad 423 may have a single layer structure constituted of the Ti layer 701, the Ni layer 702, the Au layer 703, or the Ag layer 704.

The drain pad 423 forms the ohmic contact with the second main surface 404 of the SiC semiconductor layer 402 without interposition of a silicide layer that includes a silicide as a main constituent. The drain pad 423 forms the ohmic contact with each raised portion group 693 without interposition of a silicide layer that includes a silicide as a main constituent.

The drain pad 423 forms the ohmic contact with the second main surface 404 of the SiC semiconductor layer 402 without interposition of a carbon layer that includes carbon as a main constituent. The drain pad 423 forms the ohmic contact with each raised portion group 693 without interposition of a carbon layer that includes carbon as a main constituent.

The drain pad 423 is free from a region in which a material including a silicide as a main constituent is formed as a layer. The drain pad 423 is also free from a region in which a material including carbon as a main constituent is formed as a layer.

The semiconductor device 691 is manufactured by adding the steps of FIG. 42 described above (FIG. 43A to FIG. 43I) to the steps of FIG. 65A to FIG. 65Z (steps of FIG. 66A to FIG. 66Z).

With the semiconductor device 691 described above, the same effects as the effects described for the semiconductor device 401 can be exhibited. Also, with the semiconductor device 691, a connection area of the drain pad 423 with respect to the second main surface 404 of the SiC semiconductor layer 402 can be increased by the raised portion groups 693. Electrical characteristics can thereby be improved.

More specifically, the drain pad 423 forms the ohmic contacts with the raised portion groups 693. Satisfactory ohmic characteristics can thereby be obtained between the SiC semiconductor layer 402 and the drain pad 423 and the electrical characteristics can thus be improved.

Also, with the semiconductor device 691, the drain pad 423 is directly connected to the second main surface 404 of the SiC semiconductor layer 402. More specifically, the drain pad 423 forms the ohmic contacts with the raised portion groups 693 without interposition of a carbon layer. Also, the drain pad 423 forms the ohmic contacts with the raised portion groups 693 without interposition of a silicide layer.

A carbon layer or a silicide layer tends to become a peeling starting point. Therefore, connection failure and increased resistance value due to connection failure can be suppressed appropriately by the structure where the drain pad 423 is directly connected to the second main surface 404 of the SiC semiconductor layer 402.

The configuration of the semiconductor device 691 may be applied not only to the various configuration examples described above but also to the twenty-sixth to thirtieth preferred embodiments. The configuration of the semiconductor device 691 is not restricted to the present preferred embodiment. The configuration of the semiconductor device 691 may be applied to all preferred embodiments disclosed herein.

FIG. 89 is a bottom view corresponding to FIG. and is a bottom view of a semiconductor device 705 according to a twenty-third preferred embodiment of the present invention. In the following, structures corresponding to structures described with the semiconductor device 691 shall be provided with the same reference symbols and description thereof shall be omitted.

Referring to FIG. 89, the semiconductor device 705 has a plurality of raised portion groups 693 including first raised portion groups 693A and second raised portion groups 693B.

The first raised portion group 693A includes a plurality of first raised portions 692A formed on the second main surface 404 of the SiC semiconductor layer 402. The first raised portions 692A are portions of the second main surface 404 of the SiC semiconductor layer 402 that are raised along the direction normal to the second main surface 404 of the SiC semiconductor layer 402.

The first raised portions 692A are formed at intervals from each other along the first direction X and the second direction Y intersecting the first direction X. The first raised portions 692A have a first portion 694A in which some first raised portions 692A among the first raised portions 692A overlap in the first direction X in the first direction view viewed from the first direction X.

The first raised portions 692A also have a second portion 695A in which some first raised portions 692A among the first raised portions 692A are formed separated from the first portion 694A and overlap in the first direction X in the first direction view.

The first raised portions 692A are formed successively along the first direction X. More specifically, the first raised portions 692A have a dotted pattern interspersed at intervals along the first direction X and the second direction Y.

The first raised portions 692A are formed successively along the first direction X while maintaining the dotted pattern. The dotted pattern of the first raised portions 692A is formed across from the peripheral edge at the side surface 405A side at one side to the peripheral edge at the side surface 405C side at the other side of the SiC semiconductor layer 402 in plan view, in this embodiment.

The first raised portion group 693A has a layout in which the raised portions 692 overlap in the first direction X when viewed from the first direction X. The first raised portion group 693A thereby forms a first raised portion group region 696A extending as a band shape along the first direction X by a collective pattern of the raised portions 692 dotted successively along the first direction X.

In other words, the first raised portion group region 696A includes the first raised portions 692A (the first raised portion group 693A) formed in a band-shaped region of the second main surface 404 of the SiC semiconductor layer 402 extending along the first direction X.

The second raised portion group 693B includes a plurality of second raised portions 692B formed on the second main surface 404 of the SiC semiconductor layer 402. The second raised portions 692B are portions of the second main surface 404 of the SiC semiconductor layer 402 that are raised along the direction normal to the second main surface 404 of the SiC semiconductor layer 402.

The second raised portions 692B are formed at intervals from each other along the first direction X and the second direction Y intersecting the first direction X. The second raised portion group 693B has a first portion 694B in which some second raised portions 692B among the second raised portions 692B overlap in the second direction Y in the second direction view viewed from the second direction Y.

The second raised portion group 693B also has a second portion 695B in which some second raised portions 692B among the second raised portions 692B are formed separated from the first portion 694B and overlap in the second direction Y in the second direction view.

The second raised portions 692B are formed successively along the second direction Y. More specifically, the second raised portions 692B have a dotted pattern interspersed at intervals along the first direction X and the second direction Y.

The second raised portions 692B are formed successively along the second direction Y while maintaining the dotted pattern. The dotted pattern of the second raised portions 692B is formed across from a peripheral edge at the side surface 405B side at one side to a peripheral edge at the side surface 405D side at the other side of the SiC semiconductor layer 402 in plan view, in this embodiment.

The second raised portion group 693B has a layout in which the second raised portions 692B overlap in the second direction Y when viewed from the second direction Y. The second raised portion group 693B thereby forms a second raised portion group region 696B extending as a band shape along the second direction Y by a collective pattern of the second raised portions 692B dotted successively along the second direction Y.

In other words, the second raised portion group region 696B includes the second raised portions 692B (the second raised portion group 693B) formed in a band-shaped region of the second main surface 404 of the SiC semiconductor layer 402 extending along the first direction X.

The second raised portion groups 693B (second raised portion group regions 696B) cross the first raised portion groups 693A (first raised portion group regions 696A). Intersection regions 706 in which a first raised portion group 693A (first raised portion group region 696A) and a second raised portion group 693B (second raised portion group region 696B) intersect mutually are thereby formed on the second main surface 404 of the SiC semiconductor layer 402.

The first raised portion groups 693A are formed on the second main surface 404 of the SiC semiconductor layer 402 at intervals along the second direction Y, in this embodiment. That is, the dotted pattern of the first raised portions 692A is formed intermittently in regard to the second direction Y.

The second raised portion groups 693B are also formed on the second main surface 404 of the SiC semiconductor layer 402 at intervals along the first direction X, in this embodiment. That is, the dotted pattern of the second raised portions 692B is formed intermittently in regard to the first direction X.

The intersection regions 706 are therefore formed in a matrix array at intervals from each other in the first direction X and the second direction Y, in this embodiment. Spaces 697 are also defined by the first raised portion groups 693A and the second raised portion groups 693B. The spaces 697 are formed in a matrix array at intervals from each other in the first direction X and the second direction Y.

The first raised portions 692A and the second raised portions 692B may be mutually overlapped in each intersection region 706. Thicknesses of the first raised portions 692A and the second raised portions 692B formed in the intersection region 706 may be greater than thicknesses of the first raised portions 692A and the second raised portions 692B formed in the region outside the intersection region 706.

Numbers of the first raised portions 692A and the second raised portions 692B formed in the intersection region 706 may be greater than numbers of first raised portions 692A and second raised portions 692B formed in the region outside the intersection region 706.

The first direction X may be set to the [11-20] direction and the second direction Y may be set to the [1-100] direction. That is, the first raised portion groups 693A (first raised portion group regions 696A) may be formed substantially parallel or parallel to the [11-20] direction and the second raised portion groups 693B (second raised portion group regions 696B) may be formed substantially parallel or parallel to the [1-100] direction.

The first direction X may be set to the [1-100] direction and the second direction Y may be set to the [11-20] direction. That is, the first raised portion groups 693A (first raised portion group regions 696A) may be formed substantially parallel or parallel to the [1-100] direction and the second raised portion groups 693B (second raised portion group regions 696B) may be formed substantially parallel or parallel to the [11-20] direction.

The first raised portions 692A and the first raised portion groups 693A correspond to the raised portions 692 and the raised portion groups 693 according to the thirty-first preferred embodiment. It shall be deemed that the descriptions of the raised portions 692 and the raised portion groups 693 according to the thirty-first preferred embodiment apply to descriptions of the first raised portions 692A and the first raised portion groups 693A and other specific descriptions concerning the first raised portions 692A and the first raised portion groups 693A shall be omitted.

The second raised portions 692B and the second raised portion groups 693B correspond to the raised portions 692 and the raised portion groups 693 according to the thirty-first preferred embodiment. It shall be deemed that the descriptions of the raised portions 692 and the raised portion groups 693 according to the thirty-first preferred embodiment apply to descriptions of the second raised portions 692B and the second raised portion groups 693B and other specific descriptions concerning the second raised portions 692B and the second raised portion groups 693B shall be omitted.

The drain pad 423 covers the first raised portion groups 693A and the second raised portion groups 693B on the second main surface 404 of the SiC semiconductor layer 402, in this embodiment. The drain pad 423 covers the first raised portion groups 693A and the second raised portion groups 693B altogether, in this embodiment.

The drain pad 423 is formed in a film shape conforming to outer surfaces of the first raised portion groups 693A (outer surfaces of the first raised portions 692A), outer surfaces of the second raised portion groups 693B (outer surfaces of the second raised portions 692B), and the inner surface of the grooves 698.

Although not illustrated, raised portions 423*a* are thereby formed at portions of the outer surface of the drain pad 423 covering the first raised portion groups 693A (first raised portions 692A) and the second raised portion groups 693B (second raised portions 692B). The recesses 423*b* are also formed at the portions of the outer surface of the drain pad 423 covering the grooves 698.

The drain pad 423 forms an ohmic contact with the second main surface 404 of the SiC semiconductor layer 402. More specifically, the drain pad 423 forms an ohmic contact with the first raised portion group 693A and with the second raised portion group 693B.

Even more specifically, the drain pad 423 forms ohmic contacts with the first raised portion groups 693A and with the second raised portion groups 693B. The drain pad 423 forms ohmic contacts with the spaces 697 as well, in this embodiment.

The portions of the drain pad 423 covering the first raised portion groups 693A and the second raised portion groups 693B are engaged with uneven portions defined by the first raised portion groups 693A, the second raised portion groups 693B, and the grooves 698.

That is, a contact region of the drain pad 423 with respect to the second main surface 404 of the SiC semiconductor layer 402 is increased by the first raised portion groups 693A, the second raised portion groups 693B, and the grooves 698. An adhesion force of the drain pad 423 with respect to the second main surface 404 of the SiC semiconductor layer 402 is thereby increased.

The semiconductor devices 705 of such structure are manufactured by performing the following steps in the laser annealing step (step S3 of FIG. 42) described above.

First, the first raised portion groups 693A are formed along a direction substantially parallel or parallel to the orientation flat 335 by the laser annealing treatment method. Next, the second raised portion groups 693B are formed along a direction intersecting (orthogonal to) the orientation flat 335 by the laser annealing treatment method.

In the present step, the first raised portion groups 693A may be formed in a direction intersecting (orthogonal to) the orientation flat 335 and the second raised portion groups 693B may be formed substantially parallel or parallel along the orientation flat 335. Thereafter, the semiconductor devices 705 are manufactured through the step S4 to step S9 of FIG. 42.

The first raised portion groups 693A and the second raised portion groups 693B may be formed in any order. Therefore, the first raised portion groups 693A may be formed after the second raised portion groups 693B are formed. Also, the first raised portion groups 693A and the second raised portion groups 693B may be formed alternately.

Even with the semiconductor device 705 described above, the same effects as the effects described for the semiconductor device 691 can be exhibited.

FIG. 90 is a sectional view corresponding to FIG. 86 and is a sectional view of a semiconductor device 711 according to a thirty-third preferred embodiment of the present invention. FIG. 91 is an enlarged view of a region XCI shown in FIG. 90. In the following, structures corresponding to structures described with the semiconductor device 691 shall be provided with the same reference symbols and description thereof shall be omitted.

With the semiconductor device 711, the drain pad 423 has a three-layer structure that includes the Ni layer 702, the Au layer 703, and the Ag layer 704 that are laminated in that order from the second main surface 404 of the SiC semiconductor layer 402. That is, the drain pad 423 is formed by omitting the step of forming the Ti layer 701 in step S9 of FIG. 42.

The Ni layer 702 is directly connected to the second main surface 404 of the SiC semiconductor layer 402. The Ni layer 702 covers the raised portion groups 693 altogether.

The Ni layer 702 forms ohmic contacts with the raised portion groups 693 and with the spaces 697. The Au layer 703 covers substantially an entire area or the entire area of the Ni layer 702. The Ag layer 704 covers substantially an entire area or the entire area of the Au layer 703.

Even with the semiconductor device 711 described above, the same effects as the effects described for the semiconductor device 691 can be exhibited. In the semiconductor device 711, the drain pad 423 may have a single layer structure constituted of the Ni layer 702.

The configuration of the semiconductor device 711 may be applied not only to the various configuration examples described above but also to the twenty-sixth to thirty-first preferred embodiments. The configuration of the semiconductor device 711 is not restricted to the present preferred embodiment. The configuration of the semiconductor device 711 may be applied to all preferred embodiments disclosed herein.

FIG. 92 is a sectional view corresponding to FIG. 86 and is a sectional view of a semiconductor device 721 according to a thirty-fourth preferred embodiment of the present invention. FIG. 93 is an enlarged view of a region XCIII shown in FIG. 92. In the following, structures corresponding to structures described with the semiconductor device 691 shall be provided with the same reference symbols and description thereof shall be omitted.

With the semiconductor device 721, the drain pad 423 includes the metal layer 341, the Au layer 703, and the Ag layer 704. The metal layer 341 has the laminated structure that includes the carbon layer 342, the NiSi layer 343, and the Ni layer 344 laminated in that order from the second main surface 404 side of the SiC semiconductor layer 402, in this embodiment.

The metal layer 341 is connected to the second main surface 404 of the SiC semiconductor layer 402. The metal layer 341 covers the raised portion groups 693 altogether.

The metal layer 341 forms ohmic contacts with the raised portion groups 693 and with the spaces 697. The Au layer 703 covers substantially an entire area or the entire area of the metal layer 341. The Ag layer 704 covers substantially an entire area or the entire area of the Au layer 703.

The semiconductor device 721 is formed by omitting the steps S4 to S8 shown in FIG. 42 of removing the metal layer 341. With the semiconductor device 721, the Au layer 703 and the Ag layer 704 are formed on the metal layer 341 in step S9 of FIG. 42 described above.

With the semiconductor device 721 described above, the drain pad 423 includes the carbon layer 342 and the NiSi layer 343. With the semiconductor device 721, although a connection strength of the drain pad 423 cannot be made as high as in the semiconductor device 691, substantially the same effects as the effects described for the semiconductor device 691 can be exhibited. In the semiconductor device 721, the drain pad 423 may be constituted of just the metal layer 341.

The configuration of the semiconductor device 721 may be applied not only to the various configuration examples described above but also to the twenty-sixth to thirty-third preferred embodiments. The configuration of the semiconductor device 721 is not restricted to the present preferred embodiment. The configuration of the semiconductor device 721 may be applied to all preferred embodiments disclosed herein.

FIG. 94 is a sectional view of a region corresponding to FIG. 55 and is a sectional view of a semiconductor device 731 according to a thirty-fifth preferred embodiment of the present invention. In the following, structures corresponding to structures described with the semiconductor device 401 shall be provided with the same reference symbols and description thereof shall be omitted.

Referring to FIG. 94, in the outer region 407, a groove 732 oriented along the active region 406 is formed in the first main surface 403 of the SiC semiconductor layer 402, in this embodiment. The groove 732 is formed by digging into the first main surface 403 of the SiC semiconductor layer 402 toward the second main surface 404 side.

The groove 732 is formed in a band extending along the active region 406 in plan view. The groove 732 is formed in an endless shape (quadrilateral annular shape) surrounding the active region 406 in plan view, in this embodiment.

The groove 732 includes an inner wall 733, an outer wall 734, and a bottom wall 735. The inner wall 733 of the groove 732 is positioned at the active region 406 side. The outer wall 734 of the groove 732 is positioned at the side surface 405A to 405D sides of the SiC semiconductor layer 402. Connects the inner wall 733 and the outer wall 734. The inner wall 733 of the groove 732 forms the active side wall 464.

The bottom wall 735 of the groove 732 corresponds to the outer main surface 462. The bottom wall 735 of the groove 732 may be positioned at the second main surface 404 side of the SiC semiconductor layer 402 with respect to the bottom wall of the gate trench 431. The groove 732 may be formed at a depth position substantially equal to the source trench 441. That is, the bottom wall 735 of the groove 732 may be positioned on substantially the same plane as the bottom wall of the source trench 441.

A distance between the bottom wall 735 of the groove 732 and the second main surface 404 of the SiC semiconductor layer 402 may be substantially equal to the distance between the bottom wall of the source trench 441 and the second main surface 404 of the SiC semiconductor layer 402.

The bottom wall 735 of the groove 732 may be positioned at the second main surface 404 side of the SiC semiconductor layer 402 with respect to the bottom wall of the source trench 441. The bottom wall 735 of the groove 732 may be positioned in a range of not less than 0 μm and not more than 1 μm to the second main surface 404 side of the SiC semiconductor layer 402 with respect to the bottom wall of the source trench 441.

The SiC epitaxial layer 422 is exposed from the bottom wall 735 of the groove 732. More specifically, the high concentration region 422*a* of the SiC epitaxial layer 422 is exposed from the bottom wall 735 of the groove 732. That is, the bottom wall 735 of the groove 732 faces the low concentration region 422*b* of the SiC epitaxial layer 422 across the high concentration region 422*a* of the SiC epitaxial layer 422.

The groove 732 thus defines the active mesa 463 from the outer region 407. An outer mesa 736 projecting higher than the bottom wall 735 of the groove 732 is defined in a peripheral edge portion of the outer region 407.

The outer mesa 736 is defined by the groove 732 and the side surface 405A to 405D sides of the SiC semiconductor layer 402. The outer mesa 736 is formed in an endless shape (quadrilateral annular shape) surrounding the groove 732 in plan view in a configuration where the groove 732 is formed in an endless shape (quadrilateral annular shape).

The outer mesa 736 includes a mesa main surface 737. The mesa main surface 737 is positioned on substantially the same plane as the active main surface 461 of the active region 406. The mesa main surface 737 extends parallel to the bottom wall 735 of the groove 732.

A p-type impurity region 738 is formed in a surface layer portion of the mesa main surface 737 of the outer mesa 736, in this embodiment. The p-type impurity region 738 is in an electrically floating state. The p-type impurity region 738 may have a p-type impurity concentration substantially equal to the p-type impurity concentration of the body region 426.

An n-type impurity region 739 is formed in a surface layer portion of the p-type impurity region 738 in the outer mesa 736, in this embodiment. The n-type impurity region 739 is in an electrically floating state. The n-type impurity region 739 may have an n-type impurity concentration substantially equal to the n-type impurity concentration of the source regions 453.

With the exception of the point of respectively being formed along the bottom wall 735 of the groove 732, the diode region 471, the outer deep well region 472, and the field limit structure 473 described above are substantially the same as in the structure of the semiconductor device 401.

The outer insulating layer 481 is formed in a film shape along the inner wall of the groove 732 and the mesa main surface 737 of the outer mesa 736. An outer wall side wall structure 740 is formed in addition to the side wall structure 482 in the groove 732.

With the exception of the point of covering the outer wall 734 of the groove 732, the outer wall side wall structure 740 has substantially the same structure as the side wall structure 482. The description and configuration examples of the active side wall 464 and the description and configuration examples of the side wall structure 482 apply to the outer wall 734 of the groove 732 and the outer wall side wall structure 740.

An anchor structure arranged to improve the connection strength of the resin layer 416 is formed in the mesa main surface 737 of the outer mesa 736, in this embodiment. The anchor structure includes an uneven structure formed in a portion of the interlayer insulating layer 491 covering the mesa main surface 737 of the outer mesa 736. The uneven structure has the anchor hole 495 formed in the interlayer insulating layer 491.

The resin layer 416 is engaged with the anchor hole 495. The resin layer 416 is engaged with the anchor hole 495 via the passivation layer 503, in this embodiment. The connection strength of the resin layer 416 with respect to the first main surface 403 of the SiC semiconductor layer 402 can thereby be improved and therefore, peeling of the resin layer 416 can be suppressed appropriately.

The passivation layer 503 contacts the mesa main surface 737 of the outer mesa 736 in the anchor hole 495. Obviously, an anchor structure for the resin layer 416 may be formed in the bottom wall 735 of the groove 732.

Even with the semiconductor device 731 described above, the same effects as the effects described for the semiconductor device 401 can be exhibited.

The configuration of the semiconductor device 731 may be applied not only to the various configuration examples described above but also to the twenty-sixth to thirty-fourth preferred embodiments. Also, the configuration of the semiconductor device 731 is not restricted to the present preferred embodiment. The configuration of the semiconductor device 731 may be applied to all preferred embodiments disclosed herein.

FIG. 95 is a sectional view of a region corresponding to FIG. 55 and is a sectional view of a semiconductor device 751 according to a thirty-sixth preferred embodiment of the present invention. In the following, structures corresponding to structures described with the semiconductor device 401 shall be provided with the same reference symbols and description thereof shall be omitted.

Referring to FIG. 95, the active main surface 461 of the active region 406 and the outer main surface 462 of the outer region 407 are formed flush, in this embodiment. The active region 406 is defined by the body region 426, in this embodiment.

That is, the body region 426 is formed by introducing a p-type impurity into just the active region 406. The p-type impurity of the body region 426 may be introduced into the first main surface 403 of the SiC semiconductor layer 402 via an ion implantation mask having an opening that selectively exposes the active region 406.

A distance between the outer main surface 462 and the bottom portion of the diode region 471 is substantially equal to a distance between the bottom wall of the source trench 441 and the bottom portions of the contact regions 454, in this embodiment.

A distance between the outer main surface 462 and the bottom portion of the outer deep well region 472 is substantially equal to a distance between the bottom wall of the source trench 441 and the bottom portions of the deep well regions 455, in this embodiment.

A distance between the outer main surface 462 and a bottom portion of the field limit structure 473 is substantially equal to the distance between the outer main surface 462 and the bottom portion of the outer deep well region 472, in this embodiment.

Even with the semiconductor device 751 described above, the same effects as the effects described for the semiconductor device 401 can be exhibited.

The configuration of the semiconductor device 751 may be applied not only to the various configuration examples described above but also to the twenty-sixth to thirty-fifth preferred embodiments. Also, the configuration of the semiconductor device 751 is not restricted to the present preferred embodiment. The configuration of the semiconductor device 751 may be applied to all preferred embodiments disclosed herein.

FIG. 96 is a sectional view of a region corresponding to FIG. 55 and is a sectional view of a semiconductor device 752 according to a thirty-seventh preferred embodiment of the present invention. In the following, structures corresponding to structures described with the semiconductor device 401 shall be provided with the same reference symbols and description thereof shall be omitted.

Referring to FIG. 96, the active main surface 461 of the active region 406 and the outer main surface 462 of the outer region 407 are formed flush, in this embodiment. The active region 406 is defined by the body region 426, in this embodiment.

That is, the body region 426 is formed by introducing the p-type impurity into just the active region 406. The p-type impurity of the body region 426 may be introduced into the first main surface 403 of the SiC semiconductor layer 402 via an ion implantation mask having an opening that selectively exposes the active region 406.

The distance between the outer main surface 462 and the bottom portion of the diode region 471 is substantially equal to the distance between the bottom wall of the source trench 441 and the bottom portions of the contact regions 454, in this embodiment.

The distance between the outer main surface 462 and the bottom portion of the outer deep well region 472 is substantially equal to the distance between the bottom wall of the source trench 441 and the bottom portions of the deep well regions 455, in this embodiment.

The outer deep well region 472 extends from the outer region 407 toward the active region 406 and is connected to the body region 426, in this embodiment. The bottom portion of the outer deep well region 472 is formed in a region at the second main surface 404 side of the SiC semiconductor layer 402 with respect to the body region 426, in this embodiment.

The bottom portion of the outer deep well region 472 may be positioned at the same depth position as a bottom portion of the body region 426. In this case, the outer deep well region 472 may be formed integral to the body region 426. The outer deep well region 472 may be formed using a portion of the body region 426.

In this case in which the gate trench 431 is positioned at an outermost periphery, a boundary between the active region 406 and the outer region 407 is a region between the outermost peripheral gate trench 431 and the diode region 471.

Also, in this case in which the source trench 441 is positioned at an outermost periphery, a boundary between the active region 406 and the outer region 407 is a region between the outermost peripheral source trench 441 and the diode region 471.

The distance between the outer main surface 462 and the bottom portion of the field limit structure 473 is substantially equal to the distance between the outer main surface 462 and the bottom portion of the outer deep well region 472, in this embodiment.

Even with the semiconductor device 752 described above, the same effects as the effects described for the semiconductor device 401 can be exhibited.

The configuration of the semiconductor device 752 may be applied not only to the various configuration examples described above but also to the twenty-sixth to thirty-sixth preferred embodiments. Also, the configuration of the semiconductor device 752 is not restricted to the present preferred embodiment. The configuration of the semiconductor device 752 may be applied to all preferred embodiments disclosed herein.

FIG. 97 is a sectional view of a region corresponding to FIG. 55 and is a sectional view of a semiconductor device 761 according to a thirty-eighth preferred embodiment of the present invention. In the following, structures corresponding to structures described with the semiconductor device 401 shall be provided with the same reference symbols and description thereof shall be omitted.

Referring to FIG. 97, the active main surface 461 of the active region 406 and the outer main surface 462 of the outer region 407 are formed flush, in this embodiment. The active region 406 is defined by the body region 426, in this embodiment.

That is, the body region 426 is formed by introducing the p-type impurity into just the active region 406. The p-type impurity of the body region 426 may be introduced into the first main surface 403 of the SiC semiconductor layer 402 via an ion implantation mask having an opening that selectively exposes the active region 406.

The bottom portion of the diode region 471 may be formed at substantially the same depth position as the bottom portions of the contact regions 454. That is, the bottom portion of the diode region 471 may be positioned on the same plane as the bottom portions of the contact regions 454.

The bottom portion of the outer deep well region 472 may be formed at substantially the same depth position as the bottom portions of the deep well regions 455. That is, the bottom portion of the outer deep well region 472 may be positioned on the same plane as the bottom portions of the deep well regions 455.

The bottom portion of the field limit structure 473 may be formed at substantially the same depth position as the bottom portion of the outer deep well region 472. That is, the bottom portion of the field limit structure 473 may be positioned on the same plane as the bottom portion of the outer deep well region 472.

Even with the semiconductor device 761 described above, the same effects as the effects described for the semiconductor device 401 can be exhibited.

The configuration of the semiconductor device 761 may be applied not only to the various configuration examples described above but also to the twenty-sixth to thirty-seventh preferred embodiments. Also, the configuration of the semiconductor device 761 is not restricted to the present preferred embodiment. The configuration of the semiconductor device 761 may be applied to all preferred embodiments disclosed herein.

FIG. 98 is a sectional view of a region corresponding to FIG. 55 and is a sectional view of a semiconductor device 762 according to a thirty-ninth preferred embodiment of the present invention. In the following, structures corresponding to structures described with the semiconductor device 401 shall be provided with the same reference symbols and description thereof shall be omitted.

Referring to FIG. 98, the active main surface 461 of the active region 406 and the outer main surface 462 of the outer region 407 are formed flush, in this embodiment. The active region 406 is defined by the body region 426, in this embodiment.

That is, the body region 426 is formed by introducing the p-type impurity into just the active region 406. The p-type impurity of the body region 426 may be introduced into the first main surface 403 of the SiC semiconductor layer 402 via an ion implantation mask having an opening that selectively exposes the active region 406.

The bottom portion of the diode region 471 may be formed at substantially the same depth position as the bottom portions of the contact regions 454. That is, the bottom portion of the diode region 471 may be positioned on the same plane as the bottom portions of the contact regions 454.

The outer deep well region 472 is connected to the body region 426, in this embodiment. More specifically, the outer deep well region 472 is formed to penetrate through the body region 426.

The bottom portion of the outer deep well region 472 is formed in a region at the second main surface 404 side of the SiC semiconductor layer 402 with respect to the bottom portion of the body region 426. A boundary between the active region 406 and the outer region 407 is set to a boundary between the outer deep well region 472 and the body region 426, in this embodiment.

The bottom portion of the outer deep well region 472 may be formed at substantially the same depth position as the bottom portions of the deep well regions 455. That is, the bottom portion of the outer deep well region 472 may be positioned on the same plane as the bottom portions of the deep well regions 455.

The bottom portion of the field limit structure 473 may be formed at substantially the same depth position as the bottom portion of the outer deep well region 472. That is, the bottom portion of the field limit structure 473 may be positioned on the same plane as the bottom portion of the outer deep well region 472.

Even with the semiconductor device 762 described above, the same effects as the effects described for the semiconductor device 401 can be exhibited.

The configuration of the semiconductor device 762 may be applied not only to the various configuration examples described above but also to the twenty-sixth to thirty-eighth preferred embodiments. Also, the configuration of the semiconductor device 762 is not restricted to the present preferred embodiment. The configuration of the semiconductor device 762 may be applied to all preferred embodiments disclosed herein.

FIG. 99 is a sectional view of a region corresponding to FIG. 55 and is a sectional view of a semiconductor device 771 according to a fortieth preferred embodiment of the present invention. In the following, structures corresponding to structures described with the semiconductor device 401 shall be provided with the same reference symbols and description thereof shall be omitted.

Referring to FIG. 99, the active main surface 461 of the active region 406 and the outer main surface 462 of the outer region 407 are formed flush, in this embodiment. The active region 406 is defined by the body region 426, in this embodiment.

That is, the body region 426 is formed by introducing the p-type impurity into just the active region 406. The p-type impurity of the body region 426 may be introduced into the first main surface 403 of the SiC semiconductor layer 402 via an ion implantation mask having an opening that selectively exposes the active region 406.

A trench diode structure 772 is formed in the outer region 407. The trench diode structure 772 includes a diode trench 773, a diode insulating layer 774, and a diode electrode layer 775.

The diode trench 773 is formed in a region of the outer region 407 between the active side wall 464 and the side surfaces 405A to 405D of the SiC semiconductor layer 402. The diode trench 773 is formed across intervals from the active side wall 464 and the side surfaces 405A to 405D.

The diode trench 773 extends as a band shape along the active region 406 in plan view. The diode trench 773 is formed in an endless shape (quadrilateral annular shape) surrounding the active region 406 in plan view, in this embodiment.

A bottom wall of the diode trench 773 is positioned inside the SiC epitaxial layer 422. More specifically, the bottom wall of the diode trench 773 is positioned in the high concentration region 422*a*.

The diode trench 773 is formed to substantially the same depth position as the source trench 441. More specifically, the bottom wall of the diode trench 773 is positioned on substantially the same plane as the bottom wall of the source trench 441.

The diode insulating layer 774 and the diode electrode layer 775 are respectively formed in the diode trench 773 with the same material types and the same modes as the gate insulating layer 434 and the gate electrode layer 435. The diode insulating layer 774 is continuous to the outer insulating layer 481 outside the diode trench 773 (on the outer main surface 462).

The diode region 471 and the outer deep well region 472 are formed in a region of the surface layer portion of the first main surface 403 of the SiC semiconductor layer 402 along inner wall of the diode trench 773.

The diode region 471 extends as a band shape along the diode trench 773 in plan view. The diode trench 773 is formed in an endless shape (quadrilateral annular shape) surrounding the active region 406 in plan view, in this embodiment. The diode region 471 is formed along the diode trench 773 in the same mode as the contact region 454, in this embodiment.

The outer deep well region 472 extends as a band shape along the diode trench 773. The diode trench 773 is formed in an endless shape (quadrilateral annular shape) surrounding the active region 406 in plan view, in this embodiment. The outer deep well region 472 is formed along the diode trench 773 in the same mode as the deep well regions 455, in this embodiment.

The trench diode structure 772, the diode region 471, and the outer deep well region 472 are formed through steps in common to the trench source structure 452, the contact region 454, and the deep well region 455.

A trench field limit structure 776 is formed in place of the field limit structure 473 in the outer region 407. The trench field limit structure 776 is formed in a region at an opposite side to the active region 406 with respect to the trench diode structure 772. That is, the trench field limit structure 776 is formed in a region at the side surface 405A to 405D sides of the SiC semiconductor layer 402 with respect to the trench diode structure 772.

The trench field limit structure 776 includes one or a plurality (four in this embodiment) of field limit trenches 777 formed in the outer main surface 462. The field limit trenches 777 are formed at intervals along a direction away from the active region 406.

The field limit trenches 777 extends as band shapes along the peripheral edge of the active region 406 in plan view. More specifically, the field limit trenches 777 are formed in endless shape (quadrilateral annular shapes) surrounding the active region 406 in plan view.

Each field limit trench 777 may be formed at a depth position substantially equal to the source trenches 441. That is, a bottom wall of each field limit trench 777 may be positioned on substantially the same plane as the bottom wall of the source trench 441.

A field limit insulating layer 778 and a field limit conductor layer 779 are embedded inside each field limit trench 777. The field limit insulating layer 778 and the field limit conductor layer 779 are formed in the field limit trench 777 with the same material types and the same modes as the gate insulating layer 434 and the gate electrode layer 435. The field limit insulating layer 778 is continuous to the outer insulating layer 481 outside the field limit trench 777 (on the outer main surface 462).

The trench field limit structure 776 includes a plurality of field limit regions 780A, 780B, 780C, and 780D formed in the surface layer portion of the outer main surface 462. The field limit regions 780A to 780D are formed in one-to-one correspondence with the field limit trenches 777.

The field limit regions 780A to 780D are formed along the side wall and the bottom wall of the corresponding field limit trench 777. The field limit regions 780A to 780D may be formed at a depth position substantially equal to the outer deep well region 472. That is, bottom portions of the field limit regions 780A to 780D may be positioned on the same plane as the bottom portion of the outer deep well region 472.

A p-type impurity region 782 is formed in each region of the surface layer portion of the first main surface 403 of the SiC semiconductor layer 402 between mutually adjacent field limit regions 780A to 780D. The field limit regions 780A to 780D are electrically connected via the impurity regions 782.

Bottom portions of the impurity regions 782 are formed in regions at the second main surface 404 side of the SiC semiconductor layer 402 with respect to the bottom portions of the field limit regions 780A to 780D. The bottom portions of the impurity regions 782 may be positioned at the same depth as the bottom portion of the body region 426. The impurity regions 782 may have a p-type impurity concentration equal to the p-type impurity concentration of the body region 426.

A diode sub-trench 781 communicating with the diode trench 773 is formed in a region of the first main surface 403 of the SiC semiconductor layer 402 along an upper end portion of the diode electrode layer 775. The diode sub-trench 781 forms a portion of the side wall of the diode trench 773.

The diode sub-trench 781 is formed in an endless shape surrounding an upper end portion of the diode electrode layer 775 in plan view, in this embodiment. That is, the diode sub-trench 781 borders the upper end portion of the diode electrode layer 775.

The diode sub-trench 781 is formed by digging into a portion of the diode insulating layer 774. More specifically, the diode sub-trench 781 is formed by digging into an upper end portion of the diode insulating layer 774 and the upper end portion of the diode electrode layer 775 from the first main surface 403 of the SiC semiconductor layer 402.

The upper end portion of the diode electrode layer 775 has a shape that is constricted with respect to a lower end portion of the diode electrode layer 775. The lower end portion of the diode electrode layer 775 is a portion of the diode electrode layer 775 that is positioned at the bottom wall side of the diode trench 773. A first direction width of the upper end portion of the diode electrode layer 775 may be less than a first direction width of the lower end portion of the diode electrode layer 775.

The diode sub-trench 781 is formed in a tapered shape having a bottom area being smaller than an opening area in sectional view. A bottom wall of the diode sub-trench 781 may be formed in a shape that is convexly curved toward the second main surface 404 of the SiC semiconductor layer 402.

The diode region 471, the diode electrode layer 775, and the diode region 471 are exposed from inner wall of the diode sub-trench 781. At least the diode insulating layer 774 is exposed from the bottom wall of the diode sub-trench 781. The upper end portion of the diode insulating layer 774 is positioned lower than the first main surface 403 of the SiC semiconductor layer 402.

An opening edge portion of each diode sub-trench 781 includes an inclining portion that inclines downwardly from the first main surface 403 of the SiC semiconductor layer 402 toward an inner side of the diode sub-trench 781. The opening edge portion of the diode sub-trench 781 is a corner portion connecting the first main surface 403 of the SiC semiconductor layer 402 and the side wall of the diode sub-trench 781. The inclining portion of the diode sub-trench 781 is formed by the diode sub-trench 781.

The inclining portion of the diode sub-trench 781 is formed in a shape that is concavely curved toward the inner side of the SiC semiconductor layer 402, in this embodiment. The inclining portion of the diode sub-trench 781 may be formed in a shape that is convexly curved toward the inner side of the diode sub-trench 781.

The diode contact hole 494 may be formed in a band shape (more specifically, an endless shape) extending along the trench diode structure 772. The diode contact hole 494 exposes the diode electrode layer 775, the diode region 471, and the diode sub-trench 781. The opening edge portion of the diode contact hole 494 is formed in a shape that is convexly curved toward the interior of the diode contact hole 494.

The source routing wiring 414 included in the main surface source electrode 409 enters into the diode contact hole 494 from above the interlayer insulating layer 491. The source routing wiring 414 is electrically connected to the diode electrode layer 775 and the diode region 471 inside the diode contact hole 494 and the diode sub-trench 781.

Even with the semiconductor device 771 described above, the same effects as the effects described for the semiconductor device 401 can be exhibited.

The configuration of the semiconductor device 771 may be applied not only to the various configuration examples described above but also to the twenty-sixth to thirty-ninth preferred embodiments. Also, the configuration of the semiconductor device 771 is not restricted to the present preferred embodiment. The configuration of the semiconductor device 771 may be applied to all preferred embodiments disclosed herein.

FIG. 100 is a sectional view of a region corresponding to FIG. 55 and is a sectional view of a semiconductor device 783 according to a forty-first preferred embodiment of the present invention. In the following, structures corresponding to structures described with the semiconductor device 401 shall be provided with the same reference symbols and description thereof shall be omitted.

Referring to FIG. 100, the active main surface 461 of the active region 406 and the outer main surface 462 of the outer region 407 are formed flush, in this embodiment. The active region 406 is defined by the body region 426, in this embodiment.

That is, the body region 426 is formed by introducing the p-type impurity into just the active region 406. The p-type impurity of the body region 426 may be introduced into the first main surface 403 of the SiC semiconductor layer 402 via an ion implantation mask having an opening that selectively exposes the active region 406.

The trench diode structure 772 is formed in the outer region 407. The trench diode structure 772 includes the diode trench 773, the diode insulating layer 774, and the diode electrode layer 775.

The diode trench 773 is formed in the region of the outer region 407 between the active side wall 464 and the side surfaces 405A to 405D of the SiC semiconductor layer 402. The diode trench 773 is formed across intervals from the active side wall 464 and the side surfaces 405A to 405D.

The diode trench 773 extends as a band shape along the active region 406 in plan view. The diode trench 773 is formed in an endless shape (quadrilateral annular shape) surrounding the active region 406 in plan view, in this embodiment.

The bottom wall of the diode trench 773 is positioned inside the SiC epitaxial layer 422. More specifically, the bottom wall of the diode trench 773 is positioned in the high concentration region 422*a*.

The diode trench 773 is formed to substantially the same depth position as the source trenches 441. More specifically, the bottom wall of the diode trench 773 is positioned on substantially the same plane as the bottom wall of the source trench 441.

Inside the diode trench 773, The diode insulating layer 774 and the diode electrode layer 775 are respectively formed in the diode trench 773 with the same material types and the same modes as the gate insulating layer 434 and the gate electrode layer 435. The diode insulating layer 774 is continuous to the outer insulating layer 481 outside the diode trench 773 (on the outer main surface 462).

The diode region 471 and the outer deep well region 472 are formed in the region of the surface layer portion of the first main surface 403 of the SiC semiconductor layer 402 along the inner wall of the diode trench 773.

The diode region 471 extends as a band shape along the diode trench 773 in plan view. The diode trench 773 is formed in an endless shape (quadrilateral annular shape) surrounding the active region 406 in plan view, in this embodiment. The diode region 471 is formed along the diode trench 773 in the same mode as the contact region 454, in this embodiment.

The outer deep well region 472 extends as a band shape along the diode trench 773. The diode trench 773 is formed in an endless shape (quadrilateral annular shape) surrounding the active region 406 in plan view, in this embodiment. The outer deep well region 472 is formed along the diode trench 773 in the same mode as the deep well regions 455, in this embodiment.

The trench diode structure 772, the diode region 471, and the outer deep well region 472 are formed through steps in common to the trench source structure 452, the contact region 454, and the deep well region 455.

A trench field limit structure 784 is formed in place of the field limit structure 473 in the outer region 407. The trench field limit structure 784 is formed in a region at the active region 406 side with respect to the trench diode structure 772, in this embodiment. More specifically, the trench field limit structure 784 is formed in a region between the body region 426 and the trench diode structure 772.

The trench field limit structure 784 includes one or a plurality (four in this embodiment) of field limit trenches 785 formed in the outer main surface 462.

The plurality of field limit trenches 785 is formed at intervals along the direction away from the active region 406. The field limit trenches 785 extend as a band shape along the peripheral edge of the active region 406 in plan view. More specifically, the field limit trenches 785 is formed in an endless shape (quadrilateral annular shape) surrounding the active region 406 in plan view.

Each field limit trench 785 may be formed at a depth position substantially equal to the source trench 441. That is, a bottom wall of each field limit trench 785 may be positioned on substantially the same plane as the bottom wall of the source trench 441.

A field limit insulating layer 786 and a field limit conductor layer 787 are embedded inside each field limit trench 785. The field limit insulating layer 786 and the field limit conductor layer 787 are formed in the field limit trench 785 with the same material types and the same modes as the gate insulating layer 434 and the gate electrode layer 435. The field limit insulating layer 786 is continuous to the outer insulating layer 481 outside the field limit trench 785 (on the outer main surface 462).

The trench field limit structure 784 includes a plurality of field limit regions 788A, 788B, 788C, and 788D formed in the surface layer portion of the outer main surface 462. The field limit regions 788A to 788D are formed in one-to-one correspondence with the field limit trenches 785.

The field limit regions 788A to 788D are formed along the side wall and the bottom wall of the corresponding field limit trench 785. The field limit regions 788A to 788D may be formed at a depth position substantially equal to the outer deep well region 472. That is, bottom portions of the field limit regions 788A to 788D may be positioned on the same plane as the bottom portion of the outer deep well region 472.

A p-type impurity region 789 is formed in each region of the surface layer portion of the first main surface 403 of the SiC semiconductor layer 402 between mutually adjacent field limit regions 788A to 788D. The field limit regions 788A to 788D are electrically connected via the impurity regions 789.

Bottom portions of the impurity regions 789 are formed in regions at the second main surface 404 side of the SiC semiconductor layer 402 with respect to the bottom portions of the field limit regions 788A to 788D. The bottom portions of the impurity regions 789 may be positioned at the same depth as the bottom portion of the body region 426. The impurity regions 789 may have a p-type impurity concentration equal to the p-type impurity concentration of the body region 426.

The diode sub-trench 781 communicating with the diode trench 773 is formed in the region of the first main surface 403 of the SiC semiconductor layer 402 along the upper end portion of the diode electrode layer 775. The diode sub-trench 781 forms a portion of the side wall of the diode trench 773.

The diode sub-trench 781 is formed in an endless shape surrounding the upper end portion of the diode electrode layer 775 in plan view, in this embodiment. That is, the diode sub-trench 781 borders the upper end portion of the diode electrode layer 775.

The diode sub-trench 781 is formed by digging into a portion of the diode insulating layer 774. More specifically, the diode sub-trench 781 is formed by digging into the upper end portion of the diode insulating layer 774 and the upper end portion of the diode electrode layer 775 from the first main surface 403 of the SiC semiconductor layer 402.

The upper end portion of the diode electrode layer 775 has a shape that is constricted with respect to the lower end portion of the diode electrode layer 775. The lower end portion of the diode electrode layer 775 is the portion of the diode electrode layer 775 that is positioned at the bottom wall side of the diode trench 773. The first direction width of the upper end portion of the diode electrode layer 775 may be less than the first direction width of the lower end portion of the diode electrode layer 775.

The diode sub-trench 781 is formed in a tapered shape having the bottom area being smaller than the opening area in sectional view. The bottom wall of the diode sub-trench 781 may be formed in a shape that is convexly curved toward the second main surface 404 of the SiC semiconductor layer 402.

The diode region 471, the diode electrode layer 775, and the diode region 471 are exposed from the inner wall of the diode sub-trench 781. At least the diode insulating layer 774 is exposed from the bottom wall of the diode sub-trench 781. The upper end portion the diode insulating layer 774 is positioned lower than the first main surface 403 of the SiC semiconductor layer 402.

The opening edge portion of each diode sub-trench 781 includes the inclining portion that inclines downwardly from the first main surface 403 of the SiC semiconductor layer 402 toward the inner side of the diode sub-trench 781. The opening edge portion of the diode sub-trench 781 is the corner portion connecting the first main surface 403 of the SiC semiconductor layer 402 and the side wall of the diode sub-trench 781. The inclining portion of the diode sub-trench 781 is formed by the diode sub-trench 781.

The inclining portion of the diode sub-trench 781 is formed in a shape that is concavely curved toward the inner side of the SiC semiconductor layer 402, in this embodiment. The inclining portion of the diode sub-trench 781 may instead be formed in a shape that is convexly curved toward the inner side of the diode sub-trench 781.

The diode contact hole 494 may be formed in a band shape (more specifically, an endless shape) extending along the trench diode structure 772. The diode contact hole 494 exposes the diode electrode layer 775, the diode region 471, and the diode sub-trench 781. The opening edge portion of the diode contact hole 494 is formed in a shape that is convexly curved toward the interior of the diode contact hole 494.

The source routing wiring 414 included in the main surface source electrode 409 enters into the diode contact hole 494 from above the interlayer insulating layer 491. The source routing wiring 414 is electrically connected to the diode electrode layer 775 and the diode region 471 inside the diode contact hole 494 and the diode sub-trench 781.

Even with the semiconductor device 783 described above, the same effects as the effects described for the semiconductor device 401 can be exhibited.

The configuration of the semiconductor device 783 may be applied not only to the various configuration examples described above but also to the twenty-sixth to fortieth preferred embodiments. Also, the configuration of the semiconductor device 783 is not restricted to the present preferred embodiment. The configuration of the semiconductor device 783 may be applied to all preferred embodiments disclosed herein.

FIG. 101 is a sectional view of a region corresponding to FIG. 55 and is a sectional view of a semiconductor device 790 according to a forty-second preferred embodiment of the present invention. In the following, structures corresponding to structures described with the semiconductor device 401 shall be provided with the same reference symbols and description thereof shall be omitted.

Referring to FIG. 101, the active main surface 461 of the active region 406 and the outer main surface 462 of the outer region 407 are formed flush, in this embodiment. The active region 406 is defined by the body region 426, in this embodiment.

That is, the body region 426 is formed by introducing the p-type impurity into just the active region 406. The p-type impurity of the body region 426 may be introduced into the first main surface 403 of the SiC semiconductor layer 402 via an ion implantation mask having an opening that selectively exposes the active region 406.

The trench diode structure 772 is formed in the outer region 407. The trench diode structure 772 includes the diode trench 773, the diode insulating layer 774, and the diode electrode layer 775.

The diode trench 773 is formed in the region of the outer region 407 between the active side wall 464 and the side surfaces 405A to 405D of the SiC semiconductor layer 402. The diode trench 773 is formed across intervals from the active side wall 464 and the side surfaces 405A to 405D.

The diode trench 773 extends as a band shape along the active region 406 in plan view. The diode trench 773 is formed in an endless shape (quadrilateral annular shape) surrounding the active region 406 in plan view, in this embodiment.

The bottom wall of the diode trench 773 is positioned inside the SiC epitaxial layer 422. More specifically, the bottom wall of the diode trench 773 is positioned in the high concentration region 422*a*.

The diode trench 773 is formed to substantially the same depth position as the source trench 441. More specifically, the bottom wall of the diode trench 773 is positioned on substantially the same plane as the bottom wall of the source trench 441.

The diode insulating layer 774 and the diode electrode layer 775 are respectively formed in the diode trench 773 with the same material types and the same modes as the gate insulating layer 434 and the gate electrode layer 435. The diode insulating layer 774 is continuous to the outer insulating layer 481 outside the diode trench 773 (on the outer main surface 462).

The diode region 471 and the outer deep well region 472 are formed in the region of the surface layer portion of the first main surface 403 of the SiC semiconductor layer 402 along the inner wall of the diode trench 773.

The diode region 471 extends as a band shape along the diode trench 773 in plan view. The diode trench 773 is formed in an endless shape (quadrilateral annular shape) surrounding the active region 406 in plan view, in this embodiment. The diode region 471 is formed along the diode trench 773 in the same mode as the contact region 454, in this embodiment.

The outer deep well region 472 extends as a band shape along the diode trench 773. The diode trench 773 is formed in an endless shape (quadrilateral annular shape) surrounding the active region 406 in plan view, in this embodiment. The outer deep well region 472 is formed along the diode trench 773 in the same mode as the deep well regions 455, in this embodiment.

The trench diode structure 772, the diode region 471, and the outer deep well region 472 are formed through steps in common to the trench source structure 452, the contact region 454, and the deep well region 455.

The trench field limit structure 776 and the trench field limit structure 784 is formed in place of the field limit structure 473 in the outer region 407.

The trench field limit structure 776 is formed in the region at the opposite side to the active region 406 with respect to the trench diode structure 77. That is, the trench field limit structure 776 is formed in the region at the side surface 405A to 405D sides of the SiC semiconductor layer 402 with respect to the trench diode structure 772.

The trench field limit structure 776 includes one or a plurality (four in this embodiment) of the field limit trenches 777 formed in the outer main surface 462. The field limit trenches 777 are formed at intervals along the direction away from the active region 406.

The field limit trenches 777 extend as band shapes along the peripheral edge of the active region 406 in plan view. More specifically, the field limit trenches 777 are formed in an endless shape (quadrilateral annular shape) surrounding the active region 406 in plan view.

Each field limit trench 777 may be formed at a depth position substantially equal to the source trench 441. That is, the bottom wall of each field limit trench 777 may be positioned on substantially the same plane as the bottom wall of the source trench 441.

The field limit insulating layer 778 and the field limit conductor layer 779 are embedded inside each field limit trench 777. The field limit insulating layer 778 and the field limit conductor layer 779 are formed in the field limit trench 777 with the same material types and the same modes as the gate insulating layer 434 and the gate electrode layer 435. The field limit insulating layer 778 is continuous to the outer insulating layer 481 outside the field limit trench 777 (on the outer main surface 462).

The trench field limit structure 776 includes the plurality of field limit regions 780A, 780B, 780C, and 780D formed in the surface layer portion of the outer main surface 462. The field limit regions 780A to 780D are formed in one-to-one correspondence with the field limit trenches 777.

The field limit regions 780A to 780D are formed along the side wall and the bottom wall of the corresponding field limit trench 777. The field limit regions 780A to 780D may be formed at a depth position substantially equal to the outer deep well region 472. That is, the bottom portions of the field limit regions 780A to 780D may be positioned on the same plane as the bottom portion of the outer deep well region 472.

A p-type impurity region 782 is formed in each region of the surface layer portion of the first main surface 403 of the SiC semiconductor layer 402 between mutually adjacent field limit regions 780A to 780D. The field limit regions 780A to 780D are electrically connected via the impurity regions 782.

The bottom portions of the impurity regions 782 are formed in the regions at the second main surface 404 side of the SiC semiconductor layer 402 with respect to the bottom portions of the field limit regions 780A to 780D. The bottom portions of the impurity regions 782 may be positioned at the same depth as the bottom portion of the body region 426. The impurity regions 782 may have a p-type impurity concentration equal to the p-type impurity concentration of the body region 426.

The trench field limit structure 784 is formed in the region at the active region 406 side with respect to the trench diode structure 772. More specifically, the trench field limit structure 784 is formed in the region between the body region 426 and the trench diode structure 772.

The trench field limit structure 784 includes one or a plurality (four in this embodiment) of the field limit trenches 785 formed in the outer main surface 462.

The field limit trenches 785 are formed at intervals along the direction away from the active region 406. The field limit trenches 785 extend as band shapes along the peripheral edge of the active region 406 in plan view. More specifically, the field limit trenches 785 are formed in endless shapes (quadrilateral annular shape) surrounding the active region 406 in plan view.

Each field limit trench 785 may be formed at a depth position substantially equal to the source trench 441. That is, the bottom wall of each field limit trench 785 may be positioned on substantially the same plane as the bottom wall of the source trench 441.

Each field limit insulating layer 786 and the field limit conductor layer 787 are embedded inside the field limit trench 785. The field limit insulating layer 786 and the field limit conductor layer 787 are formed in the field limit trench 785 with the same material types and the same modes as the gate insulating layer 434 and the gate electrode layer 435. The field limit insulating layer 786 is continuous to the outer insulating layer 481 outside the field limit trench 785 (on the outer main surface 462).

The trench field limit structure 784 includes the plurality of field limit regions 788A, 788B, 788C, and 788D formed in the surface layer portion of the outer main surface 462. The field limit regions 788A to 788D are formed in one-to-one correspondence with the field limit trenches 785.

The field limit regions 788A to 788D are formed along the side wall and the bottom wall of the corresponding field limit trench 785. The field limit regions 788A to 788D may be formed at a depth position substantially equal to the outer deep well region 472. That is, the bottom portions of the field limit regions 788A to 788D may be positioned on the same plane as the bottom portion of the outer deep well region 472.

A p-type impurity region 789 is formed in each region of the surface layer portion of the first main surface 403 of the SiC semiconductor layer 402 between mutually adjacent field limit regions 788A to 788D. The field limit regions 788A to 788D are electrically connected via the impurity regions 789.

The bottom portions of the impurity regions 789 are formed in the regions at the second main surface 404 side of the SiC semiconductor layer 402 with respect to the bottom portions of the field limit regions 788A to 788D. The bottom portions of the impurity regions 789 may be positioned at the same depth as the bottom portion of the body region 426. The impurity regions 789 may have a p-type impurity concentration equal to the p-type impurity concentration of the body region 426.

The diode sub-trench 781 communicating with the diode trench 773 is formed in the region of the first main surface 403 of the SiC semiconductor layer 402 along the upper end portion of the diode electrode layer 775. The diode sub-trench 781 forms a portion of the side wall of the diode trench 773.

The diode sub-trench 781 is formed in an endless shape surrounding the upper end portion of the diode electrode layer 775 in plan view, in this embodiment. That is, the diode sub-trench 781 borders the upper end portion of the diode electrode layer 775.

The diode sub-trench 781 is formed by digging into a portion of the diode insulating layer 774. More specifically, the diode sub-trench 781 is formed by digging into the upper end portion of the diode insulating layer 774 and the upper end portion of the diode electrode layer 775 from the first main surface 403 of the SiC semiconductor layer 402.

The upper end portion of the diode electrode layer 775 has a shape that is constricted with respect to the lower end portion of the diode electrode layer 775. The lower end portion of the diode electrode layer 775 is the portion of the diode electrode layer 775 that is positioned at the bottom wall side of the diode trench 773. The first direction width of the upper end portion of the diode electrode layer 775 may be less than the first direction width of the lower end portion of the diode electrode layer 775.

The diode sub-trench 781 is formed, in sectional view, to a tapered shape with the bottom area being smaller than the opening area. The bottom wall of the diode sub-trench 781 may be formed in a shape that is convexly curved toward the second main surface 404 of the SiC semiconductor layer 402.

The diode region 471, the diode electrode layer 775, and the diode region 471 are exposed from the inner wall of the diode sub-trench 781. At least the diode insulating layer 774 is exposed from the bottom wall of the diode sub-trench 781. The upper end portion the diode insulating layer 774 is positioned lower than the first main surface 403 of the SiC semiconductor layer 402.

The opening edge portion of each diode sub-trench 781 includes the inclining portion that inclines downwardly from the first main surface 403 of the SiC semiconductor layer 402 toward the inner side of the diode sub-trench 781. The opening edge portion of the diode sub-trench 781 is the corner portion connecting the first main surface 403 of the SiC semiconductor layer 402 and the side wall of the diode sub-trench 781. The inclining portion of the diode sub-trench 781 is formed by the diode sub-trench 781.

The inclining portion of the diode sub-trench 781 is formed in a shape that is concavely curved toward the inner side of the SiC semiconductor layer 402, in this embodiment. The inclining portion of the diode sub-trench 781 may instead be formed in a shape that is convexly curved toward the inner side of the diode sub-trench 781.

The diode contact hole 494 may be formed in a band shape (more specifically, an endless shape) extending along the trench diode structure 772. The diode contact hole 494 exposes the diode electrode layer 775, the diode region 471, and the diode sub-trench 781. The opening edge portion of the diode contact hole 494 is formed in a shape that is convexly curved toward the interior of the diode contact hole 494.

The source routing wiring 414 included in the main surface source electrode 409 enters into the diode contact hole 494 from above the interlayer insulating layer 491. The source routing wiring 414 is electrically connected to the diode electrode layer 775 and the diode region 471 inside the diode contact hole 494 and the diode sub-trench 781.

Even with the semiconductor device 790 described above, the same effects as the effects described for the semiconductor device 401 can be exhibited.

The configuration of the semiconductor device 790 may be applied not only to the various configuration examples described above but also to the twenty-sixth to forty-first preferred embodiments. Also, the configuration of the semiconductor device 790 is not restricted to the present preferred embodiment. The configuration of the semiconductor device 790 may be applied to all preferred embodiments disclosed herein.

FIG. 102 is an enlarged view of a region corresponding to FIG. 51 and is an enlarged view of a semiconductor device 791 according to a forty-third preferred embodiment of the present invention. FIG. 103 is a sectional view taken along line CIII-CIII shown in FIG. 102. In the following, structures corresponding to structures described with the semiconductor device 401 shall be provided with the same reference symbols and description thereof shall be omitted.

Referring to FIG. 102 and FIG. 103, the semiconductor device 791 includes an outer gate trench 792 formed in the first main surface 403 of the SiC semiconductor layer 402 in the active region 406. The outer gate trench 792 extends as a band shape along the peripheral edge portions of the active region 406 (active side wall 464). The outer gate trench 792 is formed in a region of the first main surface 403 of the SiC semiconductor layer 402 directly below the gate finger 411 (outer gate finger 411A). The outer gate trench 792 extends along the gate finger 411 (outer gate finger 411A).

More specifically, the outer gate trench 792 is formed along the three side surfaces 405A, 405B, and 405D of the SiC semiconductor layer 402 such as to define the inner region of the active region 406 from three directions. The outer gate trench 792 may be formed in an endless shape (for example, a quadrilateral annular shape) that surrounds the inner region of the active region 406.

The outer gate trench 792 is in communication with the contact trench portion 431*b* of each gate trench 431. The outer gate trench 792 and the gate trenches 431 are thereby formed by a single trench.

The gate wiring layer 436 is embedded in the outer gate trench 792. The gate wiring layer 436 is connected to the gate electrode layers 435 at communication portions of the gate trenches 431 and the outer gate trench 792.

The low resistance electrode layer 632 covering the upper end portion of the gate wiring layer 436 (see also FIG. 68, etc.) may be formed in the outer gate trench 792. In this case, the low resistance electrode layer 632 covering the gate electrode layers 435 and the low resistance electrode layer 632 covering the gate wiring layer 436 are both positioned inside a single trench.

Even with the semiconductor device 791 described above, the same effects as the effects described for the semiconductor device 401 can be exhibited. Also, with the semiconductor device 791, the gate wiring layer 436 is not required to be lead out to above the first main surface 403 of the SiC semiconductor layer 402.

The gate wiring layer 436 can thereby be suppressed from facing the SiC semiconductor layer 402 across the gate insulating layer 434 at the opening edge portions of the gate trenches 431 and the outer gate trench 792. Consequently, the concentration of electric field at the opening edge portions of the gate trenches 431 can be suppressed.

The configuration of the semiconductor device 791 may be applied not only to the various configuration examples described above but also to the twenty-sixth to forty-second preferred embodiments. Also, the configuration of the semiconductor device 791 is not restricted to the present preferred embodiment. The configuration of the semiconductor device 791 may be applied to all preferred embodiments disclosed herein.

FIG. 104 is an enlarged view of a region corresponding to FIG. 53 and is an enlarged view of a semiconductor device 801 according to a forty-fourth preferred embodiment of the present invention. In the following, structures corresponding to structures described with the semiconductor device 401 shall be provided with the same reference symbols and description thereof shall be omitted.

Referring to FIG. 104, the gate trenches 431 are formed in a lattice shape that integrally includes a plurality of gate trenches 431 extending along the first direction X and a plurality of gate trenches 431 extending along the second direction Y in plan view, in this embodiment.

A plurality of cell regions 802 are defined in a matrix by the gate trenches 431 in the first main surface 403 of the SiC semiconductor layer 402. Each cell region 802 is formed in a quadrilateral shape in plan view. The source trenches 441 are formed respectively in the cell regions 802. The source trench 441 may be formed in a quadrilateral shape in plan view.

A sectional view taken along line LII-LII of FIG. 104 corresponds to the sectional view of FIG. 52. A sectional view taken along line LIII-LIII of FIG. 104 corresponds to the sectional view of FIG. 53.

Even with the semiconductor device 801 described above, the same effects as the effects described for the semiconductor device 401 can be exhibited.

The configuration of the semiconductor device 801 may be applied not only to the various configuration examples described above but also to the twenty-sixth to forty-third preferred embodiments. Also, the configuration of the semiconductor device 801 is not restricted to the present preferred embodiment. The configuration of the semiconductor device 801 may be applied to all preferred embodiments disclosed herein.

FIG. 105 is an enlarged view of a region corresponding to FIG. 54 and is an enlarged view of a semiconductor device 811 according to a forty-fifth preferred embodiment of the present invention. In the following, structures corresponding to structures described with the semiconductor device 401 shall be provided with the same reference symbols and description thereof shall be omitted.

Referring to FIG. 105, the SiC epitaxial layer 422 includes the high concentration region 422*a*, the low concentration region 422*b*, and a concentration gradient region 422*c* interposed between the high concentration region 422*a* and the low concentration region 422*b*, in this embodiment.

In the SiC epitaxial layer 422, the concentration gradient region 422*c* is formed in the outer region 407 as well as in the active region 406. The concentration gradient region 422*c* is formed in an entire area of the SiC epitaxial layer 422.

The concentration gradient region 422*c* has a concentration gradient with which the n-type impurity concentration decreases gradually from the high concentration region 422*a* toward the low concentration region 422*b*. In other words, the concentration gradient region 422*c* has a concentration gradient with which the n-type impurity concentration increases gradually from the low concentration region 422*b* toward the high concentration region 422*a*. The concentration gradient region 422*c* suppresses sudden change of the n-type impurity concentration in a region between the high concentration region 422*a* and the low concentration region 422*b*.

When the SiC epitaxial layer 422 includes the concentration gradient region 422*c*, the n-type impurity concentration of the high concentration region 422*a* is preferably not less than 1.5 times and not more than 5 times the n-type impurity concentration of the low concentration region 422*b*. The n-type impurity concentration of the high concentration region 422*a* may be not less than 3 times and not more than 5 times the n-type impurity concentration of the low concentration region 422*b*.

A thickness of the concentration gradient region 422*c* may be not less than 0.5 μm and not more than 2.0 μm. The thickness of the concentration gradient region 422*c* may be not less than 0.5 μm and not more than 1.0 μm. The thickness of the concentration gradient region 422*c* may be not less than 1.0 μm and not more than 1.5 μm. The thickness of the concentration gradient region 422*c* may be not less than 1.5 μm and not more than 2.0 μm.

Although a specific description shall be omitted, the gate trenches 431, the source trench 441, the deep well region 455, the outer deep well region 472, etc., described above are formed in the high concentration region 422*a*.

That is, the gate trench 431, the source trench 441, the deep well region 455, the outer deep well region 472, etc., described above are formed region of the SiC semiconductor layer 402 at the first main surface 403 side of a boundary region between the high concentration region 422*a* and the concentration gradient region 422*c*.

Even with the semiconductor device 811 described above, the same effects as the effects described for the semiconductor device 401 can be exhibited.

The configuration of the semiconductor device 811 may be applied not only to the various configuration examples described above but also to the twenty-sixth to forty-fourth preferred embodiments. Also, the configuration of the semiconductor device 811 is not restricted to the present preferred embodiment. The configuration of the semiconductor device 811 may be applied to all preferred embodiments disclosed herein.

For example, when the concentration gradient region 422*c* of the semiconductor device 811 is incorporated in any of the seventh to twenty-fifth preferred embodiments described above, the SiC epitaxial layer 112 (SiC semiconductor layer 102) is formed that includes a concentration gradient region (422*c*), interposed between the high concentration region 112*a* and the low concentration region 112*b* (see also FIG. 11 to FIG. 48).

FIG. 106 is a perspective view, as seen through a sealing body 1007, of a semiconductor package 1001 capable of incorporating any one of the semiconductor devices according to the first to forty-fifth preferred embodiments described above.

The semiconductor package 1001 includes a semiconductor chip 1002, a pad portion 1003, a heat spreader 1004, a plurality (three in this embodiment) of terminals 1005, a plurality (three in this embodiment) of lead wires 1006, and the sealing body 1007. Any one of the semiconductor devices according to the first to forty-fifth preferred embodiments described above is applied as the semiconductor chip 1002.

The pad portion 1003 includes a metal plate. The pad portion 1003 may include aluminum, copper, etc. The pad portion 1003 is formed in a quadrilateral shape in plan view. The pad portion 1003 has a planar area not less than a planar area of the semiconductor chip 1002. The drain pad 113 of the semiconductor chip 1002 is electrically connected by die bonding to the pad portion 1003.

The heat spreader 1004 is connected to one side of the pad portion 1003. The pad portion 1003 and the heat spreader 1004 are formed by a single metal plate, in this embodiment. A penetrating hole 1004*a* is formed in the heat spreader 1004. The penetrating hole 1004*a* is formed in a circular shape.

The plurality of terminals 1005 are aligned along a side at an opposite side to the heat spreader 1004 with respect to the pad portion 1003. The terminals 1005 includes a metal plate extending as a band. The terminal 1005 may include aluminum or copper, etc. The plurality of terminals 1005 includes a first terminal 1005A, a second terminal 1005B, and a third terminal 1005C.

The first terminal 1005A, the second terminal 1005B, and the third terminal 1005C are aligned at intervals at the side at the opposite side to the heat spreader 1004 with respect to the pad portion 1003.

The first terminal 1005A, the second terminal 1005B, and the third terminal 1005C extend as bands along a direction orthogonal to an alignment direction thereof. The second terminal 1005B and the third terminal 1005C sandwich the first terminal 1005A from both sides.

The plurality of lead wires 1006 may be bonding wires, etc. The plurality of lead wires 1006 includes a lead wire 1006A, a lead wire 1006B, and a lead wire 1006C, in this embodiment.

The lead wire 1006A is electrically connected to the gate pad 108 and the first terminal 1005A of the semiconductor chip 1002. The lead wire 1006B is electrically connected to the source pad 110 and the second terminal 1005B of the semiconductor chip 1002. The lead wire 1006C is electrically connected to the pad portion 1003 and the third terminal 1005C.

The sealing body 1007 seals the semiconductor chip 1002, the pad portion 1003, and the plurality of lead wires 1006 such as to expose portions of the heat spreader 1004 and the plurality of terminals 1005. The sealing body 1007 contains a sealing resin. The sealing body 1007 is formed in a rectangular parallelepiped shape.

The configuration of the semiconductor package 1001 is not restricted to the configuration shown in FIG. 104. A SOP (small outline package), a QFN (quad for non-lead package), a DFP (dual flat package), a DIP (dual inline package), a QFP (quad flat package), a SIP (single inline package), a SOJ (small outline J-leaded package), or any of various similar semiconductor packages may be applied as the semiconductor package 1001.

Although the twenty-sixth to forty-fifth preferred embodiments of the present invention have been described, the twenty-sixth to forty-first preferred embodiments of the present invention may be implemented in yet other configurations.

With each of the twenty-seventh to thirtieth preferred embodiments described above, an example where the gate electrode layers 435 and the gate wiring layer 436 that contain the p-type polysilicon doped with the p-type impurity are formed was described.

However, if increase of the gate threshold voltage Vth is not emphasized, the gate electrode layers 435 and the gate wiring layer 436 may include an n-type polysilicon doped with an n-type impurity instead of the p-type polysilicon.

The low resistance electrode layer 632 may be formed by siliciding portions forming surface layer portions of the gate electrode layers 435 (n-type polysilicon) by a metal material. That is, the low resistance electrode layer 632 may include an n-type polycide. With such a structure, reduction of gate resistance can be achieved.

With each of the twenty-sixth to forty-fifth preferred embodiments described above, an example where the source insulating layers 442 (polysilicon) are embedded in the source trench 441 across the source insulating layers 442 was described. However, the source insulating layers 442 (polysilicon) may be embedded directly in the source trench 441 without interposition of the source insulating layers 442.

With each of the twenty-sixth to forty-fifth preferred embodiments described above, an example where the SiC semiconductor layer 402 has the laminated structure that includes the SiC semiconductor substrate 421 and the SiC epitaxial layer 422 was described. However, the SiC semiconductor layer 402 may instead have a single layer structure constituted of the SiC semiconductor substrate 421. The SiC semiconductor layer 402 may instead have a single layer structure constituted of the SiC epitaxial layer 422.

With each of the twenty-sixth to forty-fifth preferred embodiments described above, an SiC semiconductor layer (402) made of a 2H—SiC monocrystal or made of a 6H—SiC monocrystal or made of a 3C—SiC monocrystal may be adopted in place of the SiC semiconductor layer 402 made of the 4H—SiC monocrystal.

With each of the twenty-sixth to forty-fifth preferred embodiments described above, an Si semiconductor layer (402) made of Si (silicon) may be adopted in place of the SiC semiconductor layer 402 made of the 4H—SiC monocrystal. The Si semiconductor layer (402) may have a laminated structure that includes a Si semiconductor substrate (421) made of Si and an Si epitaxial layer (422) made of Si.

With each of the twenty-sixth to forty-fifth preferred embodiments described above, an example where the SiC epitaxial layer 422, having the high concentration region 422*a* and the low concentration region 422*b*, is formed by the epitaxial growth method was described. However, the SiC epitaxial layer 422 may instead be formed by steps such as the following.

First, the SiC epitaxial layer 422, having a comparatively low n-type impurity concentration, is formed by an epitaxial growth method. Next, the n-type impurity is introduced into a surface layer portion of the SiC epitaxial layer 422 by an ion implantation method. The SiC epitaxial layer 112, having the high concentration region 422*a* and the low concentration region 422*b*, is thereby formed.

With each of the twenty-sixth to forty-fifth preferred embodiments described above, a structure with which the conductivity types of the respective semiconductor portions are inverted may be adopted. That is, a p-type portion may be formed to be of an n-type and an n-type portion may be formed to be of a p-type.

With each of the twenty-sixth to forty-fifth preferred embodiments, a $p^+$-type SiC semiconductor substrate (421) may be adopted in place of the $n^+$-type SiC semiconductor substrate 421. With this structure, an IGBT (insulated gate bipolar transistor) can be provided in place of a MISFET.

In this case, the "source" of the MISFET is replaced by an "emitter" of the IGBT. Also, the "drain" of the MISFET is replaced by a "collector" of the IGBT. Even when an IGBT is adopted in place of a MISFET, the same effects as the effects described above for the twenty-sixth to forty-first preferred embodiments can be exhibited.

With each of the twenty-sixth to forty-fifth preferred embodiments described above, an example where the drain pad 423 includes the Ti layer (696), the Ni layer (697), the Au layer (698), and/or the Ag layer (699) was described. However, the drain pad 423 may include an Al layer in place of or in addition to the Ti layer (696), the Ni layer (697), the Au layer (698), and/or the Ag layer (699).

Also, the drain pad 423 may have a laminated structure, in which at least two layers among the Ti layer (696), the Ni layer (697), the Au layer (698), the Ag layer (699), and the Al layer are laminated in any mode. Also, the drain pad 423 may have a single layer structure that includes the Al layer.

With each of the first to forty-fifth preferred embodiments described above, a semiconductor device having SiC as the main material was described. However, the first to forty-fifth preferred embodiments described above may also be applied to a semiconductor device using a semiconductor material differing from SiC.

For example, the first to forty-fifth preferred embodiments described above may also be applied to a compound semiconductor device that includes a vertical MISFET adopting a compound semiconductor material in place of SiC. As examples of the compound semiconductor material that may be adopted in the compound semiconductor device, one of either or both of gallium nitride (GaN) and gallium oxide ($Ga_2O_3$) can be cited.

In the compound semiconductor device, a GaN semiconductor layer may be applied in place of the SiC semiconductor layer 2, 102, or 402. Also, in this case, the gate insulating layer 13, 131, or 434 that contains silicon oxide may be adopted.

As the insulating material of the gate insulating layer 13, 131, or 434, at least one of material among aluminum oxide ($Al_2O_3$), zirconium oxide ($ZrO_2$), or tantalum oxide ($Ta_2O_3$) may be adopted in place of or in addition to silicon oxide.

Also, with the compound semiconductor MISFET, magnesium may be adopted as the p-type impurity (acceptor). Also, as the n-type impurity (donor), germanium (Ge), oxygen (O), or silicon (Si) may be adopted. Other arrangements are the same as the arrangements described with the first to forty-fifth preferred embodiments.

The present description does not restrict any combined configuration of features illustrated with the first to forty-fifth preferred embodiments. The first to forty-fifth preferred embodiments may be combined among each other in any mode or any configuration.

That is, a configuration combining features illustrated with the first to forty-fifth preferred embodiments in any mode or any configuration may be adopted. Also, a configuration combining features illustrated in FIG. 1 to FIG. 106 in any mode or any configuration may be adopted.

A supplementary description of the 4H—SiC monocrystal applied to the first to forty-fifth preferred embodiments and of crystal planes and crystal directions of the 4H—SiC monocrystal shall now be provided referring to FIG. 107 and FIG. 108. FIG. 107 is a diagram of a unit cell of the 4H—SiC monocrystal applied to the first to forty-fifth preferred embodiments. FIG. 108 is a plan view of a silicon plane of the unit cell of the 4H—SiC monocrystal shown in FIG. 107 (hereinafter referred to simply as the "unit cell").

Referring to FIG. 107 and FIG. 108, the unit cell includes tetrahedral structures, in each of which four C atoms are bonded to a single Si atom in a tetrahedral arrangement (regular tetrahedral arrangement) relationship. The unit cell has an atomic arrangement in which the tetrahedral structures are layered in a four-layer cycle. The unit cell has a hexagonal prism structure having a regular hexagonal silicon plane, a regular hexagonal carbon plane, and six side planes connecting the silicon plane and the carbon plane.

The silicon plane is an end plane terminated by Si atoms. At the silicon plane, a single Si atom is positioned at each of the six vertices of a regular hexagon and a single Si atom is positioned at a center of the regular hexagon.

The carbon plane is an end plane terminated by C atoms. At the silicon plane, a single C atom is positioned at each of the six vertices of a regular hexagon and a single C atom is positioned at a center of the regular hexagon.

The crystal planes of the unit cell are defined by four coordinate axes (a1, a2, a3, and c) including an a1 axis, an a2 axis, an a3 axis, and a c axis. Of the four coordinate axes, a value of a3 takes on a value of −(a1+a2). The crystal planes of the 4H—SiC monocrystal shall be described below based on the silicon plane as an example of an end plane of a hexagonal crystal.

In a plan view of viewing the silicon plane from the c axis, the a1 axis, the a2 axis, and the a3 axis are respectively set along directions of alignment of the nearest neighboring Si atoms (hereinafter referred to simply as "nearest neighbor directions") based on the Si atom positioned at the center. The a1 axis, the a2 axis, and the a3 axis are set to be shifted by 120° each in conformance to the alignment of the Si atoms.

The c axis is set in a direction normal to the silicon plane based on the Si atom positioned at the center. The silicon plane is the (0001) plane. The carbon plane is the (000-1) plane.

The side planes of the hexagonal prism include six crystal planes oriented along the nearest neighbor directions in the plan view of viewing the silicon plane from the c axis. More specifically, the side planes of the hexagonal prism include the six crystal planes formed by the nearest neighboring Si atoms.

In the plan view of viewing the silicon plane from the c axis, the side planes of the hexagonal prism include a (10-10) plane, a (01-10) plane, a (−1100) plane, a (−1010) plane, a (0-110) plane, and a (1-100) plane in clockwise order from a tip of the a1 axis.

Diagonals of the hexagonal prism include six crystal planes oriented along intersecting directions intersecting the nearest neighbor directions in the plan view of viewing the silicon plane from the c axis (hereinafter referred to simply as "nearest neighbor direction intersecting directions"). More specifically, the diagonals of the hexagonal prism include the six crystal planes formed by Si atoms that are not nearest neighbors. When viewed on a basis of the Si atom at the center, the nearest neighbor direction intersecting directions are orthogonal directions orthogonal to the nearest neighbor directions.

In the plan view of viewing the silicon plane from the c axis, the diagonals of the hexagonal prism include a (11-20) plane, a (−2110) plane, a (1-2-10) plane, a (−1-120) plane, a (2-1-10) plane, and a (−12-10) plane.

The crystal directions of the unit cell are defined by directions normal to the crystal planes. A direction normal to the (10-10) plane is a [10-10] direction. A direction normal to the (01-10) plane is a [01-10] direction. A direction normal to the (−1100) plane is a [−1100] direction. A direction normal to the (−1010) plane is a [−1010] direction. A direction normal to the (0-110) plane is a [0-110] direction. A direction normal to the (1-100) plane is a [1-100] direction.

A direction normal to the (11-20) plane is a [11-20] direction. A direction normal to the (−2110) plane is a [−2110] direction. A direction normal to the (1-2-10) plane is a [1-2-10] direction. A direction normal to the (−1-120) plane is a [−1-120] direction. A direction normal to the (2-1-10) plane is a [2-1-10] direction. A direction normal to the (−12-10) plane is a [−12-10] direction.

The hexagonal prism is six-fold symmetrical and equivalent crystal planes and equivalent crystal directions are present every 60°. For example, the (10-10) plane, the (01-10) plane, the (−1100) plane, the (−1010) plane, the (0-110) plane, and the (1-100) plane form equivalent crystal planes.

Also, the [01-10] direction, the [−1100] direction, the [−1010] direction, the [0-110] direction, the [1-100] direction, and the [10-10] direction form equivalent crystal directions. Also, the [11-20] direction, the [−12-10] direction, the [−2110] direction, the [−1-120] direction, the [1-210] direction, and the [2-1-10] direction form equivalent crystal directions.

The c axis is a [0001] direction ([000-1] direction). The a1 axis is the [2-1-10] direction ([−2110] direction). The a2 axis is the [−12-10] direction ([1-210] direction). The a3 axis is the [−1-120] direction ([11-20] direction).

The [0001] direction and the [000-1] direction are referred to at times simply as the c axis. The (0001) plane and the (000-1) plane are referred to at times simply as c planes. The [11-20] direction and the [−1-120] direction are referred to at times simply as the a axis. The [1-100] direction and the [−1100] direction are referred to at times simply as the m axis. The (1-100) plane and the (−1100) plane are referred to at times simply as m planes.

Examples of features extracted from the present description and drawings are indicated below.

[A1] A semiconductor device including an SiC semiconductor layer having a first main surface and a second main surface at an opposite side to the first main surface, a semiconductor element formed in the first main surface of the SiC semiconductor layer, a raised portion group including a plurality of raised portions formed at intervals from each other on the second main surface of the SiC semiconductor layer and having a first portion in which some raised portions among the plurality of raised portions overlap mutually in a first direction view viewed from a first direction that is one of planar directions of the second main surface of the SiC semiconductor layer, and an electrode formed on the second main surface of the SiC semiconductor layer and connected to the raised portion group.

With the present semiconductor device, a connection area of the electrode with respect to the second main surface can be increased by the raised portion group. Electrical characteristics can thereby be improved.

[A2] The semiconductor device according to A1, wherein the raised portion group has a second portion in which some raised portions among the plurality of raised portions are formed separated from the first portion in the first direction view and overlap mutually in the first direction view.

[A3] The semiconductor device according to A1 or A2, wherein the raised portion groups are formed at intervals along a second direction that is one of planar directions of the first main surface of the SiC semiconductor layer and intersects the first direction.

[A4] The semiconductor device according to A3, wherein a distance between the raised portion groups that are mutually adjacent is not more than 100 μm.

[A5] The semiconductor device according to A4, wherein the distance is not more than 50 μm.

[A6] The semiconductor device according to A4 or A5, wherein the distance is not more than 20 μm.

[A7] The semiconductor device according to any one of A1 to A6, wherein the raised portion group is formed in a range of the second main surface of the SiC semiconductor layer of not less than 10 μm and not more than 200 μm in regard to a direction orthogonal to the first direction.

[A8] The semiconductor device according to A7, wherein the range is not less than 50 μm and not more than 150 μm.

[A9] The semiconductor device according to A7 or A8, wherein the range is not less than 80 μm and not more than 120 μm.

[A10] The semiconductor device according to any one of A1 to A9, wherein the SiC semiconductor layer includes 4H—SiC and the first direction is a [11-20] direction of the 4H—SiC.

[A11] The semiconductor device according to any one of A1 to A9, wherein the SiC semiconductor layer includes 4H—SiC and the first direction is a [1-100] direction of the 4H—SiC.

[A12] The semiconductor device according to A10 or A11, wherein the SiC semiconductor layer has an off angle inclined at an angle of within 10° in the [11-20] direction from a (0001) plane of the 4H—SiC.

[A13] The semiconductor device according to A12, wherein the off angle is not less than 0° and not more than 4°.

[A14] The semiconductor device according to A12 or A13, wherein the off angle exceeds 0° and is less than 4°.

[A15] The semiconductor device according to any one of A1 to A14, wherein the electrode includes at least one type of material among Ti, Ni, Au, or Ag.

[A16] The semiconductor device according to any one of A1 to A15, wherein the electrode includes a Ti layer in contact with the raised portion group.

[A17] The semiconductor device according to any one of A1 to A15, wherein the electrode includes an Ni layer in contact with the raised portion group.

[A18] The semiconductor device according to any one of A1 to A17, further including a groove formed in the second main surface of the SiC semiconductor layer.

[A19] The semiconductor device according to A18, wherein the groove includes a portion intersecting the raised portion group.

[A20] The semiconductor device according to A18 or A19, wherein the raised portion group includes a portion, in which some raised portions among the plurality of raised portions are formed at intervals along the groove in a plan view viewed in a direction normal to the second main surface of the SiC semiconductor layer.

[A21] The semiconductor device according to any one of A1 to A20, wherein the semiconductor element includes a field effect transistor.

[B1] A semiconductor device including an SiC semiconductor layer having a first main surface and a second main surface at an opposite side to the first main surface, a semiconductor element formed in the first main surface of the SiC semiconductor layer, a raised portion group including a plurality of raised portions formed at intervals from each other on the second main surface of the SiC semiconductor layer, and an electrode directly connected to the raised portion group at the second main surface of the SiC semiconductor layer.

With the present semiconductor device, a connection area of the electrode with respect to the second main surface can be increased by the raised portion group. Electrical characteristics can thereby be improved. Also, with the present semiconductor device, increase of resistance value due to connection failure can be suppressed because the electrode is directly connected to the raised portion group.

[B2] The semiconductor device according to B1, wherein the electrode is connected to the raised portion group without interposition of a silicide layer.

[B3] The semiconductor device according to B1 or B2, wherein the electrode is connected to the raised portion group without interposition of a carbon layer.

[B4] The semiconductor device according to any one of B1 to B3, wherein the electrode includes at least one type of material among Ti, Ni, Au, or Ag.

[B5] The semiconductor device according to any one of B1 to B4, wherein the electrode includes a Ti layer in contact with the raised portion group.

[B6] The semiconductor device according to any one of B1 to B4, wherein the electrode includes an Ni layer in contact with the raised portion group.

[B7] The semiconductor device according to any one of B1 to B6, wherein the raised portion group has a first portion in which some raised portions among the plurality of raised portions overlap mutually in a first direction view viewed from a first direction that is one of planar directions of the second main surface of the SiC semiconductor layer.

[B8] The semiconductor device according to B7, wherein the raised portion group has a second portion in which some raised portions among the plurality of raised portions are formed separated from the first portion in the first direction view and overlap mutually in the first direction view.

[B9] The semiconductor device according to B7 or B8, wherein the raised portion groups are formed at intervals along a second direction that is one of planar directions of the first main surface of the SiC semiconductor layer and intersects the first direction.

[B10] The semiconductor device according to B9, wherein a distance between the raised portion groups that are mutually adjacent is not more than 100 μm.

[B11] The semiconductor device according to B10, wherein the distance is not more than 50 μm.

[B12] The semiconductor device according to B10 or B11, wherein the distance is not more than 20 μm.

[B13] The semiconductor device according to any one of B7 to B12, wherein the SiC semiconductor layer includes 4H—SiC and the first direction is a [11-20] direction of 4H—SiC.

[B14] The semiconductor device according to any one of B7 to B12, wherein the SiC semiconductor layer includes 4H—SiC and the first direction is a [1-100] direction of 4H—SiC.

[B15] The semiconductor device according to B13 or B14, wherein the SiC semiconductor layer has an off angle inclined at an angle of within 10° in the [11-20] direction from a (0001) plane of 4H—SiC.

[B16] The semiconductor device according to B15, wherein the off angle is not less than 0° and not more than 4°.

[B17] The semiconductor device according to B15 or B16, wherein the off angle exceeds 0° and is less than 4°.

[B18] The semiconductor device according to any one of B7 to B17, wherein the raised portion group is formed in a range of the second main surface of the SiC semiconductor layer of not less than 10 μm and not more than 200 μm in regard to a direction orthogonal to the first direction.

[B19] The semiconductor device according to B18, wherein the range is not less than 50 μm and not more than 150 μm.

[B20] The semiconductor device according to B18 or B14, wherein the range is not less than 80 μm and not more than 120 μm.

[B21] The semiconductor device according to any one of B1 to B20, further including a groove formed in the second main surface of the SiC semiconductor layer.

[B22] The semiconductor device according to B21, wherein the groove includes a portion intersecting the raised portion group.

[B23] The semiconductor device according to B21 or B22, wherein the raised portion group includes a portion in which some raised portions among the plurality of raised portions are formed at intervals along the groove in a plan view viewed in a direction normal to the second main surface of the SiC semiconductor layer.

[B24] The semiconductor device according to any one of B1 to B23, wherein the semiconductor element includes a Field Effect Transistor.

[C1] An SiC semiconductor device including an SiC semiconductor layer having a main surface in which a gate trench is formed, a gate insulating layer formed along an inner wall of the gate trench, a gate electrode layer including a p-type polysilicon doped with a p-type impurity and embedded in the gate trench across the gate insulating layer, and a low resistance electrode layer including a conductive material having a sheet resistance less than a sheet resistance of the gate electrode layer and covering the gate electrode layer.

In an SiC semiconductor device that includes SiC (silicon carbide), intentionally increasing a gate threshold voltage may be considered as a technique for suppressing malfunction during low voltage application. In an Si semiconductor device that includes Si (silicon), the gate threshold voltage can be increased, for example, by increasing a p-type impurity concentration of a p-type body region formed in a semiconductor layer.

However, the SiC semiconductor device has a property of being low in channel mobility (also referred to as carrier mobility) in comparison to an Si semiconductor device. Therefore, in a SiC semiconductor device, channel resistance increases significantly in a case in which the p-type impurity concentration of the p-type body region is increased.

On the other hand, in the SiC semiconductor device, a tradeoff that the gate threshold voltage decreases in a case in which the p-type impurity concentration of the p-type body region is decreased occurs. The technique capable of adopting to the Si semiconductor device thus cannot be applied to the SiC semiconductor device.

In the SiC semiconductor device that includes a trench gate electrode structure, it may be considered to change a material of the gate electrode layer from an n-type polysilicon doped of an n-type impurity to a p-type polysilicon doped of a p-type impurity. The p-type polysilicon has a work function differing from the n-type polysilicon, and the gate threshold voltage can be increased just by embedding the p-type polysilicon in the gate trench.

However, the p-type polysilicon has a sheet resistance of several tens of times higher than a sheet resistance of the n-type polysilicon. Therefore, if the p-type polysilicon is adopted as the material of the gate electrode layer, energy loss during switching increases significantly in accompaniment with increase of a parasitic resistance inside the gate trench (referred to hereinafter simply as "gate resistance").

In particular, with the trench gate electrode structure, the gate electrode layer must be embedded in the gate trench and therefore a manufacturing difficulty differing from a planar gate structure is demanded and choices of the electrode material of the gate electrode layer are also restricted. Therefore, there is no leeway for adopting the p-type polysilicon as the electrode material of the gate electrode layer and the n-type polysilicon must be selected inevitably within a limited design scope of the trench gate electrode structure.

Due to there being such a problem, the actual circumstances are such that research attempting to achieve increase of gate threshold voltage and reduction of gate resistance at the same time in a configuration that includes the trench gate electrode structure including the p-type polysilicon has not been carried out sufficiently.

With the present SiC semiconductor device, the trench gate structure in which the gate electrode layer is embedded in the gate trench across the gate insulating layer is formed. With the present trench gate electrode structure the gate electrode layer is covered by the low resistance electrode layer.

The gate electrode layer includes the p-type polysilicon. The gate threshold voltage can thereby be increased. Also, the low resistance electrode layer includes the conductive material having the sheet resistance less than the sheet resistance of the p-type polysilicon. Reduction of the gate resistance can thereby be achieved.

[C2] The SiC semiconductor device according to C1, wherein the low resistance electrode layer includes a polycide layer in which the p-type polysilicon is silicided by a metal material.

[C3] The SiC semiconductor device according to C2, wherein the polycide layer includes at least one type of material among TiSi, $TiSi_2$, NiSi, CoSi, $CoSi_2$, $MoSi_2$, or $WSi_2$.

[C4] The SiC semiconductor device according to any one of C1 to C3, wherein the low resistance electrode layer is formed in a film shape.

[C5] The SiC semiconductor device according to any one of C1 to C4, wherein a thickness of the low resistance electrode layer is not more than a thickness of the gate electrode layer.

[C6] The SiC semiconductor device according to any one of C1 to C5, wherein the gate insulating layer includes a first region formed along a side wall of the gate trench and a second region formed along a bottom wall of the gate trench, and a thickness of the second region of the gate insulating layer is not less than a thickness of the first region of the gate insulating layer.

[C7] The SiC semiconductor device according to C6, wherein the gate insulating layer has a third region covering the main surface of the SiC semiconductor layer, and a thickness of the third region of the gate insulating layer is not less than a thickness of the first region of the gate insulating layer.

[C8] The SiC semiconductor device according to any one of C1 to C7, wherein the gate trench has a curved portion curving toward an inner side of the gate trench at an opening edge portion connecting the main surface of the SiC semiconductor layer and the side wall of the gate trench.

[C9] The SiC semiconductor device according to any one of C1 to C7, wherein the gate trench has an inclining portion inclining downwardly from the main surface of the SiC semiconductor layer toward the side wall of the gate trench at an opening edge portion connecting the main surface of the SiC semiconductor layer and the side wall of the gate trench.

[C10] The SiC semiconductor device according to any one of C1 to C9, wherein the gate insulating layer includes a bulging portion bulging toward an interior of the gate trench at an opening edge portion of the gate trench, and the low resistance electrode layer contacts the bulging portion of the gate insulating layer.

[C11] The SiC semiconductor device according to C10, wherein the bulging portion of the gate insulating layer bulges curvingly toward an inner side of the gate trench.

[C12] The SiC semiconductor device according to any one of C1 to C11, further including a source region, a body region and a drain region formed in that order from the main surface of the SiC semiconductor layer toward a thickness direction such as to be along the side wall of the gate trench, and the low resistance electrode layer faces the source region across the gate insulating layer.

[C13] The SiC semiconductor device according to any one of C1 to C12, further including an emitter region, a body region and a collector region formed in that order toward a thickness direction from the main surface of the SiC semiconductor layer such as to be along the side wall of the gate trench, and the low resistance electrode layer faces the emitter region across the gate insulating layer.

[C14] A method for manufacturing an SiC semiconductor device including a step of forming a gate trench in a main surface of an SiC semiconductor layer, a step of forming a gate insulating layer along an inner wall of the gate trench, a step of forming a gate electrode layer by embedding a p-type polysilicon doped with a p-type impurity in the gate trench across the gate insulating layer, and a step of forming a low resistance electrode layer by covering the gate electrode layer with a conductive material having a sheet resistance lower than a sheet resistance of the gate electrode layer.

[C15] The method for manufacturing the SiC semiconductor device according to C14, wherein the step of forming the low resistance electrode layer includes a step of forming a polycide layer covering the gate electrode layer by siliciding a surface layer portion of the gate electrode layer by a metal material.

[C16] The method for manufacturing the SiC semiconductor device according to C15, wherein the metal material includes at least one type of material among Ti, Ni, Co, Mo, or W.

[C17] The method for manufacturing the SiC semiconductor device according to any one of C14 to C16, wherein the step of forming the low resistance electrode layer includes a step of forming the low resistance electrode layer having a thickness not more than a thickness of the gate electrode layer.

[D1] A semiconductor device including a semiconductor layer having a main surface in which a gate trench is formed, a gate insulating layer formed along an inner wall of the gate trench, a gate electrode layer constituted of a polysilicon and embedded in the gate trench across the gate insulating layer, and a low resistance electrode layer including a conductive material having a sheet resistance less than a sheet resistance of the gate electrode layer and covering the gate electrode layer.

With the present semiconductor device, a sheet resistance inside the gate trench can be reduced by the low resistance electrode layer. That is, a current supplied into the gate trench flows through the low resistance electrode layer having the comparatively low sheet resistance and is transmitted to an entirety of the gate electrode layer. The entirety of the gate electrode layer can thereby be made to transition rapidly from an off state to an on state and therefore delay of switching response can be suppressed.

As refinement of cell structure progresses, a width, a depth, a cross-sectional area, etc., of the gate electrode layer decreases and there is thus concern for the delay of the switching response due to increase of electrical resistance inside the gate trench. However, the increase of the electrical resistance inside the gate trench can be suppressed appropriately and therefore the delay of the switching response due to refinement can be suppressed by the low resistance electrode layer.

[D2] The semiconductor device according to D1, wherein the low resistance electrode layer covers the gate electrode layer inside the gate trench.

[D3] The semiconductor device according to D1 or D2, wherein a length of the gate trench is not less than 1 mm and not more than 10 mm.

Time is required for transmission of current in a case of a gate trench having a length of the millimeter order. However, with the present semiconductor device, the low resistance electrode layer is formed. The entirety of the gate electrode layer can be made to transition rapidly from the off state to the on state and therefore the delay of the switching response can be suppressed by the low resistance electrode layer.

[D4] The semiconductor device according to any one of D1 to D3, wherein a total extension of the gate trench per unit area is not less than 0.5 $\mu m/\mu m^2$ and not more than 0.75 $\mu m/\mu m^2$ in plan view.

[D5] The semiconductor device according to any one of D1 to D4, including a plurality of the gate trenches formed at intervals in one direction wherein in plan view, a total extension of one or the plurality of gate trenches per unit area is not less than 0.5 $\mu m/\mu m^2$ and not more than 0.75 $\mu m/\mu m^2$.

[D6] The semiconductor device according to any one of D1 to D5, wherein a cross-sectional area of the gate electrode layer is not less than 0.05 $\mu m^2$ and not more than 0.5 $\mu m^2$ in a sectional view when sectioned in a direction orthogonal to a direction of extension of the gate trench.

[D7] The semiconductor device according to any one of D1 to D6, wherein a thickness of the low resistance electrode layer is not more than a thickness of the gate electrode layer.

[D8] The semiconductor device according to any one of D1 to D7, wherein a thickness of the low resistance electrode layer is less than the thickness of the gate electrode layer.

[D9] The semiconductor device according to any one of D1 to D8, wherein a ratio of a thickness of the low resistance electrode layer with respect to a thickness of the gate electrode layer is not less than 0.01 and not more than 1.

[D10] The semiconductor device according to any one of D1 to D9, wherein a thickness of the gate electrode layer is not less than 0.5 μm and not more than 3 μm.

[D11] The semiconductor device according to any one of D1 to D10, wherein a thickness of the gate electrode layer is not less than 0.01 μm and not more than 3 μm.

[D12] The semiconductor device according to any one of D1 to D11, wherein the gate electrode layer is constituted of an n-type polysilicon doped with an n-type impurity or a p-type polysilicon doped with a p-type impurity.

[D13] The semiconductor device according to any one of D1 to D12, wherein the gate electrode layer is constituted of a p-type polysilicon doped with a p-type impurity.

[D14] The semiconductor device according to any one of D1 to D13, wherein the semiconductor layer includes SiC.

[E1] A semiconductor device including a semiconductor layer including a first main surface at one side and a second main surface at another side and having a gate trench and a source trench formed across an interval in the first main surface, a body region of a first conductivity type formed at a side of the gate trench in a surface layer portion of the first main surface of the semiconductor layer a source region of a second conductivity type formed at a side of the gate trench in a surface layer portion of the body region, a drift region of the second conductivity type formed in a region of the semiconductor layer at a second main surface side with respect to the body region and exposed from an inner wall of the source trench, a gate electrode facing the body region, the source region and the drift region across a gate insulating layer inside the gate trench, and a source electrode embedded in the source trench and forming a Schottky junction with the drift region.

With the present semiconductor device, a Schottky barrier diode is formed between the drift region and the source electrode. With the present semiconductor device, when a reverse bias voltage is applied, current can be made to flow preferentially into the Schottky barrier diode. Expansion of a crystal defect due to the reverse bias voltage can thereby be suppressed in the semiconductor layer.

[E2] The semiconductor device according to E1, wherein the drift region is exposed from a side wall of the source trench and the source electrode forms the Schottky junction with the drift region exposed from the side wall of the source trench.

[E3] The semiconductor device according to E1 or E2, further including a well region of the first conductivity type formed in a region of the semiconductor layer along a bottom wall of the source trench, wherein the source electrode forms the Schottky junction with the drift region at a depth position between the body region and the well region in regard to a direction normal to the first main surface of the semiconductor layer.

[E4] The semiconductor device according to E3, wherein the well region covers the bottom wall of the source trench.

[E5] The semiconductor device according to E3 or E4, wherein the well region is lead out in a lateral direction parallel to the first main surface of the semiconductor layer from the bottom wall of the source trench.

[E6] The semiconductor device according to any one of E3 to E5, wherein the well region faces the body region across a partial region of the drift region in regard to the direction normal to the first main surface of the semiconductor layer.

[E7] The semiconductor device according to E6, wherein the source electrode forms the Schottky junction with the drift region in a region of the semiconductor layer sandwiched by the body region and the well region in regard to the direction normal to the first main surface of the semiconductor layer.

[E8] The semiconductor device according to any one of E1 to E7, further including a source insulating layer, partially covering a side wall of the source trench such as to expose the drift region from the side wall of the source trench, wherein the source electrode forms the Schottky junction with the drift region exposed from the source insulating layer.

[E9] The semiconductor device according to E8, wherein the body region is exposed from the side wall of the source trench and the source insulating layer covers the body region exposed from the side wall of the source trench.

[E10] The semiconductor device according to E8 or E9, wherein the source region is exposed from the side wall of the source trench and the source insulating layer covers the source region exposed from the side wall of the source trench.

[E11] The semiconductor device according to any one of E8 to E10, wherein the source insulating layer covers a bottom wall of the source trench.

[E12] The semiconductor device according to any one of E8 to E11, wherein the source insulating layer covers a corner portion connecting the side wall and a bottom wall of the source trench.

[E13] The semiconductor device according to any one of E1 to E12, wherein the semiconductor layer includes the gate trenches formed at intervals from each other, and the source trench is formed in a region between the gate trenches that are mutually adjacent.

[E14] The semiconductor device according to any one of E1 to E13, wherein the gate trench is formed in a tapered shape narrowing in opening width toward the second main surface side of the semiconductor layer, and the source trench is formed in a tapered shape narrowing in opening width toward the second main surface side of the semiconductor layer.

[E15] The semiconductor device according to any one of E1 to E14, wherein the gate electrode includes a conductive polysilicon, and the source electrode includes at least one type of material among a conductive polysilicon, titanium, nickel, copper, aluminum, silver, gold, titanium nitride, or tungsten.

[E16] The semiconductor device according to any one of E1 to E15, further including a main surface source electrode formed on the first main surface of the semiconductor layer and electrically connected to the source region and the source electrode.

[E17] The semiconductor device according to E16, wherein the main surface source electrode includes the same conductive material as the source electrode and is formed integral to the source electrode.

[E18] The semiconductor device according to any one of E1 to E17, wherein the drift region includes a high concentration region formed in a region of the semiconductor layer at the first main surface side and a low concentration region formed in a region of the semiconductor layer at the second main surface side with respect to the high concentration region, and the source electrode forms the Schottky junction with the high concentration region of the drift region.

[E19] The semiconductor device according to any one of E1 to E17, wherein the drift region includes a high concentration region formed in a region of the semiconductor layer at the first main surface side and a low concentration region formed in a region of the semiconductor layer at the second main surface side with respect to the high concentration region, and the source trench is formed in the high concentration region of the drift region.

[E20] The semiconductor device according to E19, wherein the gate trench is formed in the high concentration region of the drift region.

[E21] The semiconductor device according to any one of E1 to E17, wherein the drift region includes a high concentration region formed in a region of the semiconductor layer at the first main surface side and a low concentration region formed in a region of the semiconductor layer at the second main surface side with respect to the high concentration region, and the well region is formed in the high concentration region of the drift region.

[E22] The semiconductor device according to E21, wherein the source trench is formed in the high concentration region of the drift region.

[E23] The semiconductor device according to E21 or E22, wherein the gate trench is formed in the high concentration region of the drift region.

[E24] The semiconductor device according to any one of E1 to E23, wherein the semiconductor layer includes SiC.

[F1] A semiconductor device including a semiconductor layer including a first main surface at one side and a second main surface at another side, an FET (Field Effect Transistor) structure including a body region of a first conductivity type formed in the first main surface of the semiconductor layer, a source region of a second conductivity type formed in a surface layer portion of the body region, a drift region of the second conductivity type formed in a region of the semiconductor layer at a second main surface side with respect to the body region, and a gate electrode facing the body region, the source region and the drift region across a gate insulating layer, and a trench source structure including a source trench formed in the first main surface of the semiconductor layer at a side of the FET structure and across an interval from the FET structure, and a source electrode embedded in the source trench and forming a Schottky junction with the drift region.

With the present semiconductor device, a Schottky barrier diode is formed between the drift region and the source electrode. With the present semiconductor device, when a reverse bias voltage is applied, current can be made to flow preferentially into the Schottky barrier diode. Expansion of a crystal defect due to the reverse bias voltage can thereby be suppressed in the semiconductor layer.

[F2] The semiconductor device according to F1, further including a well region of the first conductivity type formed in a region of the semiconductor layer along a bottom wall of the source trench, wherein the source electrode forms the Schottky junction with the drift region at a depth position between the body region and the well region in regard to a direction normal to the first main surface of the semiconductor layer.

[F3] The semiconductor device according to F2, wherein the well region covers the bottom wall of the source trench.

[F4] The semiconductor device according to F2 or F3, wherein the well region is lead out in a lateral direction parallel to the first main surface of the semiconductor layer from the bottom wall of the source trench.

[F5] The semiconductor device according to any one of F2 to F4, wherein the well region faces the body region across a partial region of the drift region in regard to the direction normal to the first main surface of the semiconductor layer.

[F6] The semiconductor device according to F5, wherein the source electrode forms the Schottky junction with the drift region in a region of the semiconductor layer sandwiched by the body region and the well region in regard to the direction normal to the first main surface of the semiconductor layer.

[F7] The semiconductor device according to any one of F1 to F6, wherein the trench source structure includes a source insulating layer partially covering a side wall of the source trench such as to expose the semiconductor layer from the side wall of the source trench, and the source electrode forms the Schottky junction with the drift region exposed from the source insulating layer.

[F8] The semiconductor device according to F7, wherein the body region is exposed from the side wall of the source trench, and the source insulating layer covers the body region exposed from the side wall of the source trench.

[F9] The semiconductor device according to F7 or F8, wherein the source region is exposed from the side wall of the source trench and the source insulating layer covers the source region exposed from the side wall of the source trench.

[F10] The semiconductor device according to any one of F7 to F9, wherein the source insulating layer covers a bottom wall of the source trench.

[F11] The semiconductor device according to any one of F7 to F10, wherein the source insulating layer covers a corner portion connecting the side wall and a bottom wall of the source trench.

[F12] The semiconductor device according to any one of F1 to F11, wherein the FET structure includes a gate trench formed in the first main surface of the semiconductor layer, the body region, the source region and the drift region are exposed from an inner wall of the gate trench, and the gate electrode faces the body region, the source region and the drift region across the gate insulating layer inside the gate trench.

[F13] The semiconductor device according to F12, including the FET structures that are formed at intervals from each other and the trench source structure is formed in a region between the FET structures that are mutually adjacent.

[F14] The semiconductor device according to F12 or F13, wherein the gate trench is formed in a tapered shape narrowing in opening width toward the second main surface side of the semiconductor layer, and the source trench is formed in a tapered shape narrowing in opening width toward the second main surface side of the semiconductor layer.

[F15] The semiconductor device according to any one of F1 to F14, wherein the gate electrode includes a conductive polysilicon, and the source electrode includes at least one type of material among a conductive polysilicon, titanium, nickel, copper, aluminum, silver, gold, titanium nitride, or tungsten.

[F16] The semiconductor device according to any one of F1 to F15, further including a main surface source electrode formed on the first main surface of the semiconductor layer and electrically connected to the source region and the source electrode.

[F17] The semiconductor device according to F16, wherein the main surface source electrode includes the same conductive material as the source electrode and is formed integral to the source electrode.

[F18] The semiconductor device according to any one of F1 to F17, wherein the drift region includes a high concentration region formed in a region of the semiconductor layer at the first main surface side and a low concentration region formed in a region of the semiconductor layer at the second main surface side with respect to the high concentration region, the source trench is formed in the high concentration region of the drift region, and the source electrode forms the Schottky junction with the high concentration region of the drift region.

[F19] The semiconductor device according to any one of F2 to F6, wherein the drift region includes a high concentration region formed in a region of the semiconductor layer at the first main surface side and a low concentration region formed in a region of the semiconductor layer at the second main surface side with respect to the high concentration region, the source trench is formed in the high concentration region of the drift region, and the well region is formed in the high concentration region of the drift region.

[F20] The semiconductor device according to any one of F1 to F19, wherein the semiconductor layer includes SiC.

[G1] A semiconductor device including a semiconductor layer including a first main surface at one side and a second main surface at another side and having a source trench formed in the first main surface, a body region of a first conductivity type formed at a side of the source trench in a surface layer portion of the first main surface of the semiconductor layer, a source region of a second conductivity type formed at a side of the source trench in a surface layer portion of the body region, a drift region of the second conductivity type formed in a region of the semiconductor layer at a second main surface side with respect to the body region and exposed from an inner wall of the source trench, and a source electrode embedded in the source trench and forming a Schottky junction with the drift region.

With the present semiconductor device, a Schottky barrier diode is formed between the drift region and the source electrode. With the present semiconductor device, when a reverse bias voltage is applied, current can be made to flow preferentially into the Schottky barrier diode. Expansion of a crystal defect due to the reverse bias voltage can thereby be suppressed in the semiconductor layer.

[G2] The semiconductor device according to G1, wherein the drift region is exposed from a side wall of the source trench and the source electrode forms the Schottky junction with the drift region exposed from the side wall of the source trench.

[G3] The semiconductor device according to G1 or G2, further including a well region of the first conductivity type formed in a region of the semiconductor layer along a bottom wall of the source trench, wherein the source electrode forms the Schottky junction with the drift region at a depth position between the body region and the well region in regard to a direction normal to the first main surface of the semiconductor layer.

[G4] The semiconductor device according to G3, wherein the well region covers the bottom wall of the source trench.

[G5] The semiconductor device according to G3 or G4, wherein the well region is lead out in a lateral direction parallel to the first main surface of the semiconductor layer from the bottom wall of the source trench.

[G6] The semiconductor device according to any one of G3 to G5, wherein the well region faces the body region across a partial region of the drift region in regard to the direction normal to the first main surface of the semiconductor layer.

[G7] The semiconductor device according to G6, wherein the source electrode forms the Schottky junction with the drift region in a region of the semiconductor layer sandwiched by the body region and the well region in regard to the direction normal to the first main surface of the semiconductor layer.

[G8] The semiconductor device according to any one of G1 to G7, further including a source insulating layer partially covering a side wall of the source trench such as to expose the drift region from the side wall of the source trench, wherein the source electrode forms the Schottky junction with the drift region exposed from the source insulating layer.

[G9] The semiconductor device according to G8, wherein the body region is exposed from the side wall of the source trench, and the source insulating layer covers the body region exposed from the side wall of the source trench.

[G10] The semiconductor device according to G8 or G9, wherein the source region is exposed from the side wall of the source trench, and the source insulating layer covers the source region exposed from the side wall of the source trench.

[G11] The semiconductor device according to any one of G8 to G10, wherein the source insulating layer covers a bottom wall of the source trench.

[G12] The semiconductor device according to any one of G8 to G11, wherein the source insulating layer covers a corner portion connecting the side wall and a bottom wall of the source trench.

[G13] The semiconductor device according to any one of G1 to G12, wherein the semiconductor layer includes a gate trench formed in the first main surface across an interval from the source trench, and a gate electrode facing the body region and the source region across a gate insulating layer is embedded inside the gate trench.

[G14] The semiconductor device according to G13, wherein the gate trench is formed in a tapered shape narrowing in opening width toward the second main surface side of the semiconductor layer, and the source trench is formed in a tapered shape narrowing in opening width toward the second main surface side of the semiconductor layer.

[G15] The semiconductor device according to G13 or G14, wherein the gate electrode includes a conductive polysilicon, and the source electrode includes at least one type of material among a conductive polysilicon, titanium, nickel, copper, aluminum, silver, gold, titanium nitride, or tungsten.

[G16] The semiconductor device according to any one of G1 to G15, further including a main surface source electrode, formed on the first main surface of the semiconductor layer and electrically connected to the source region and the source electrode.

[G17] The semiconductor device according to G16, wherein the main surface source electrode includes the same conductive material as the source electrode and is formed integral to the source electrode.

[G18] The semiconductor device according to any one of G1 to G17, wherein the drift region includes a high concentration region formed in a region of the semiconductor layer at the first main surface side, and a low concentration region formed in a region of the semiconductor layer at the second main surface side with respect to the high concentration region, the source trench is formed in the high concentration region of the drift region, and the source electrode forms the Schottky junction with the high concentration region of the drift region.

[G19] The semiconductor device according to any one of G3 to G7, wherein the drift region includes a high concentration region formed in a region of the semiconductor layer at the first main surface side and a low concentration region formed in a region of the semiconductor layer at the second main surface side with respect to the high concentration region, the source trench is formed in the high concentration region of the drift region, and the well region is formed in the high concentration region of the drift region.

[G20] The semiconductor device according to any one of G1 to G19, wherein the semiconductor layer includes SiC.

[H1] A semiconductor device including a semiconductor layer including a first main surface at one side and a second main surface at another side and having a source trench formed in the first main surface, a body region of a first conductivity type formed at a side of the source trench in a surface layer portion of the first main surface of the semiconductor layer, a source region of a second conductivity type formed at a side of the source trench in a surface layer portion of the body region, a drift region of the second conductivity type formed in a region of the semiconductor layer at a second main surface side with respect to the body region and exposed from a side wall of the source trench, a source insulating layer covering the side wall and a bottom wall of the source trench such as to partially expose the side wall of the source trench, and a source electrode embedded in the source trench and forming a Schottky junction with the drift region exposed from the source insulating layer.

With the present semiconductor device, a Schottky barrier diode is formed between the drift region and the source electrode. With the present semiconductor device, when a reverse bias voltage is applied, current can be made to flow preferentially into the Schottky barrier diode. Expansion of a crystal defect due to the reverse bias voltage can thereby be suppressed in the semiconductor layer.

[H2] The semiconductor device according to H1, wherein the source insulating layer exposes a region of the semiconductor layer positioned at the second main surface side of the semiconductor layer with respect to the body region in regard to a direction normal to the first main surface of the semiconductor layer.

[H3] The semiconductor device according to H1 or H2, wherein the source insulating layer covers a corner portion connecting the side wall and the bottom wall of the source trench.

[H4] The semiconductor device according to any one of H1 to H3, wherein the body region is exposed from the side wall of the source trench and the source insulating layer covers the body region exposed from the side wall of the source trench.

[H5] The semiconductor device according to any one of H1 to H4, wherein the source region is exposed from the side wall of the source trench and the source insulating layer covers the source region exposed from the side wall of the source trench.

[H6] The semiconductor device according to any one of H1 to H5, further including a well region of the first conductivity type formed in a region of the semiconductor layer along the bottom wall of the source trench, wherein the source electrode forms the Schottky junction with the drift region at a depth position between the body region and the well region in regard to a direction normal to the first main surface of the semiconductor layer.

[H7] The semiconductor device according to H6, wherein the well region covers the bottom wall of the source trench.

[H8] The semiconductor device according to H6 or H7, wherein the well region is lead out in a lateral direction parallel to the first main surface of the semiconductor layer from the bottom wall of the source trench.

[H9] The semiconductor device according to any one of H6 to H8, wherein the well region faces the body region across a partial region of the drift region in regard to the direction normal to the first main surface of the semiconductor layer.

[H10] The semiconductor device according to H9, wherein the source electrode forms the Schottky junction with the drift region in a region of the semiconductor layer sandwiched by the body region and the well region in regard to the direction normal to the first main surface of the semiconductor layer.

[H11] The semiconductor device according to any one of H1 to H10, wherein the semiconductor layer includes a gate trench, formed in the first main surface across an interval from the source trench, and a gate electrode, facing the body region and the source region across a gate insulating layer, is embedded inside the gate trench.

[H12] The semiconductor device according to H11, wherein the gate trench is formed in a tapered shape narrowing in opening width toward the second main surface side of the semiconductor layer, and the source trench is formed in a tapered shape narrowing in opening width toward the second main surface side of the semiconductor layer.

[H13] The semiconductor device according to H11 or H12, wherein the gate electrode includes a conductive polysilicon, and the source electrode includes at least one type of material among a conductive polysilicon, titanium, nickel, copper, aluminum, silver, gold, titanium nitride, or tungsten.

[H14] The semiconductor device according to any one of H1 to H13, further including a main surface source electrode formed on the first main surface of the semiconductor layer and electrically connected to the source region and the source electrode.

[H15] The semiconductor device according to H14, wherein the main surface source electrode includes the same conductive material as the source electrode and is formed integral to the source electrode.

[H16] The semiconductor device according to any one of H1 to H15, wherein the drift region includes a high concentration region formed in a region of the semiconductor layer at the first main surface side and a low concentration region formed in a region of the semiconductor layer at the second main surface side with respect to the high concentration region, the source trench is formed in the high concentration region of the drift region, and the source electrode forms the Schottky junction with the high concentration region of the drift region.

[H17] The semiconductor device according to any one of H6 to H10, wherein the drift region includes a high concentration region formed in a region of the semiconductor layer at the first main surface side and a low concentration region formed in a region of the semiconductor layer at the second main surface side with respect to the high concentration region, the source trench is formed in the high concentration region of the drift region, and the well region is formed in the high concentration region of the drift region.

[H18] The semiconductor device according to any one of H1 to H17, wherein the semiconductor layer includes SiC.

[I1] A semiconductor device including a semiconductor layer having a first main surface at one side and a second main surface at another side and having an active mesa of a mesa shape having an active main surface and an active side wall defined in the first main surface, a level difference moderating structure moderating a level difference formed in the first main surface of the semiconductor layer by the active mesa, and a covering layer covering the level difference moderating structure and extending from above the active main surface toward a region outside the active mesa.

[I2] A semiconductor device including a semiconductor layer having a first main surface at one side and a second main surface at another side and having, at the first main surface, an active mesa of a mesa shape having an active main surface and an active side wall, and an outer region formed in a region at the second main surface side with respect to the active main surface such as to define the active mesa, a level difference moderating structure formed in the outer region and moderating a level difference formed between the active mesa and the outer region, and a covering layer covering the level difference moderating structure and extending from the active mesa toward the outer region.

[I3] The semiconductor device according to I1 or I2, wherein the level difference moderating structure has an inclining portion inclining downwardly from the active main surface toward the second main surface side of the semiconductor layer.

[I4] The semiconductor device according to any one of I1 to I3, wherein the level difference moderating structure is constituted of a side wall structure covering the active side wall.

[I5] The semiconductor device according to any one of I1 to I4, wherein a semiconductor element is formed in the active main surface of the active mesa.

[I6] The semiconductor device according to I5, wherein the semiconductor element is a MISFET (Metal Insulator Semiconductor Field Effect Transistor).

[I7] An SiC semiconductor device including an SiC semiconductor layer having a first main surface at one side and a second main surface at another side and having an active mesa of a mesa shape having an active main surface and an active side wall defined in the first main surface, a level difference moderating structure moderating a level difference formed in the first main surface of the semiconductor layer by the active mesa, and a covering layer covering the level difference moderating structure and extending from above the active main surface toward a region outside the active mesa.

[I8] An SiC semiconductor device including an SiC semiconductor layer having a first main surface at one side and a second main surface at another side and having, at the first main surface, an active mesa of a mesa shape having an active main surface and an active side wall, and an outer region formed in a region at the second main surface side with respect to the active main surface such as to define the active mesa, a level difference moderating structure formed in the outer region and moderating a level difference formed between the active mesa and the outer region, and a covering layer covering the level difference moderating structure and extending from the active mesa toward the outer region.

[I9] The SiC semiconductor device according to I7 or I8, wherein the level difference moderating structure has an inclining portion inclining downwardly from the active main surface toward the second main surface side of the semiconductor layer.

[I10] The SiC semiconductor device according to any one of I7 to I9, wherein the level difference moderating structure is constituted of a side wall structure covering the active side wall.

[I11] The SiC semiconductor device according to any one of I7 to I10, wherein a semiconductor element is formed in the active main surface of the active mesa.

[I12] The SiC semiconductor device according to I11, wherein the semiconductor element is a MISFET (Metal Insulator Semiconductor Field Effect Transistor).

[A1] to [A21] described above, [B1] to [B24] described above, [C1] to [C17] described above, [D1] to [D14] described above, [E1] to [E24] described above, [F1] to [F20] described above, [G1] to [G20] described above, [H1] to [H18] described above, and [I1] to [I12] described above may be combined in any mode among each other.

The present application corresponds to Japanese Patent Application No. 2017-098423 filed on May 17, 2017 in the Japan Patent Office, Japanese Patent Application No. 2018-042133 filed on Mar. 8, 2018 in the Japan Patent Office, Japanese Patent Application No. 2018-094956 filed on May 16, 2018 in the Japan Patent Office, and Japanese Patent Application No. 2018-094957 filed on May 16, 2018 in the Japan Patent Office, and the entire disclosures of these applications are incorporated herein by reference.

While preferred embodiments of the present invention have been described in detail, these are merely specific examples used to clarify the technical contents of the present invention and the present invention should not be interpreted as being limited to these specific examples and the scope of the present invention is to be limited only by the appended claims.

REFERENCE SIGNS LIST

1 . . . semiconductor device
2 . . . SiC semiconductor layer
3 . . . first main surface of SiC semiconductor layer
4 . . . second main surface of SiC semiconductor layer
7 . . . drain electrode
10 . . . trench gate structure
11 . . . trench source structure
12 . . . gate trench
13 . . . gate insulating layer
14 . . . gate electrode layer
15 . . . first side wall of gate trench
16 . . . first bottom wall of gate trench
18 . . . source trench
19 . . . barrier forming layer
20 . . . source electrode layer
21 . . . deep well region
22 . . . second side wall of source trench
23 . . . second bottom wall of source trench
24 . . . first wall portion of second side wall
25 . . . second wall portion of second side wall
26 . . . corner portion of source trench
27 . . . first region of deep well region
28 . . . second region of deep well region
30 . . . body region
31 . . . source region
32 . . . contact region
46 . . . depletion layer
51 . . . semiconductor device
61 . . . semiconductor device
71 . . . semiconductor device
81 . . . semiconductor device
91 . . . semiconductor device
101 . . . semiconductor device
171 . . . semiconductor device
181 . . . semiconductor device
191 . . . semiconductor device
201 . . . semiconductor device
211 . . . semiconductor device
221 . . . semiconductor device
231 . . . semiconductor device
241 . . . semiconductor device
251 . . . semiconductor device
261 . . . semiconductor device
271 . . . semiconductor device
281 . . . semiconductor device
291 . . . semiconductor device
301 . . . semiconductor device
311 . . . semiconductor device
351 . . . semiconductor device
361 . . . semiconductor device
371 . . . semiconductor device
401 . . . semiconductor device
631 . . . semiconductor device
651 . . . semiconductor device
661 . . . semiconductor device

671 . . . semiconductor device
691 . . . semiconductor device
705 . . . semiconductor device
711 . . . semiconductor device
721 . . . semiconductor device
731 . . . semiconductor device
751 . . . semiconductor device
752 . . . semiconductor device
761 . . . semiconductor device
762 . . . semiconductor device
771 . . . semiconductor device
783 . . . semiconductor device
790 . . . semiconductor device
791 . . . semiconductor device
801 . . . semiconductor device
811 . . . semiconductor device

The invention claimed is:

1. A semiconductor device comprising:

a semiconductor layer of a first conductivity type having a first main surface at one side and a second main surface at another side;

a trench gate structure including a gate trench formed in the first main surface of the semiconductor layer, and a gate electrode embedded in the gate trench via a gate insulating layer;

a trench source structure including a source trench formed deeper than the gate trench and formed across an interval from the gate trench in the first main surface of the semiconductor layer, a source electrode embedded in the source trench, and a well region of a second conductivity type formed in a region of the semiconductor layer along the source trench;

a body region of the second conductivity type formed in a region of a surface layer portion of the first main surface of the semiconductor layer between the gate trench and the source trench;

a source region of the first conductivity type formed in a surface layer portion of the body region; and a drain electrode connected to the second main surface of the semiconductor layer; and wherein an aspect ratio of the trench source structure is greater than an aspect ratio of the trench gate structure.

2. The semiconductor device according to claim 1, wherein the aspect ratio of the trench source structure is not less than 0.5 and not more than 18.0.

3. The semiconductor device according to claim 1, wherein a depletion layer spreads further from a boundary region between the semiconductor layer and the well region toward a region of a second main surface side than from a bottom wall of the gate trench in the semiconductor layer toward a region of the second main surface side.

4. The semiconductor device according to claim 3, wherein the depletion layer overlaps to the bottom wall of the gate trench.

5. The semiconductor device according to claim 1, wherein the well region is formed in a region of the semiconductor layer along a side wall of the source trench.

6. The semiconductor device according to claim 1, wherein the well region is formed in a region of the semiconductor layer along a bottom wall of the source trench.

7. The semiconductor device according to claim 1, wherein the well region is formed continuously in a region of the semiconductor layer along a side wall, a bottom wall, and a corner portion connecting the side wall and the bottom wall of the source trench.

8. The semiconductor device according to claim 1, wherein the well region is connected to the body region.

9. The semiconductor device according to claim 1, wherein the trench source structure includes a barrier forming layer interposed in a region between the source trench and the source electrode and having a higher potential barrier than a potential barrier between the well region and the source electrode.

10. The semiconductor device according to claim 9, wherein the barrier forming layer includes an insulating barrier forming layer made of an insulating material.

11. The semiconductor device according to claim 9, wherein the barrier forming layer includes a conductive barrier forming layer made of a conductive material differing from a conductive material of the source electrode.

12. The semiconductor device according to claim 9, wherein the barrier forming layer includes an insulating barrier forming layer made of an insulating material, and a conductive barrier forming layer made of a conductive material differing from a conductive material of the source electrode.

13. The semiconductor device according to claim 9, wherein the barrier forming layer is formed along a side wall, a bottom wall, and a corner portion connecting the side wall and the bottom wall of the source trench.

14. The semiconductor device according to claim 1, further comprising: a contact region of the second conductivity type formed in a region of the semiconductor layer along a side wall of the source trench and having a second conductivity type impurity concentration higher than a second conductivity type impurity concentration of the body region.

15. The semiconductor device according to claim 1, further comprising: a contact region of the second conductivity type formed in a region of the semiconductor layer along a bottom wall of the source trench and having a second conductivity type impurity concentration higher than a second conductivity type impurity concentration of the body region.

16. A semiconductor device comprising:

a semiconductor layer of a first conductivity type having a first main surface at one side and a second main surface at another side;

a trench gate structure including a gate trench formed in the first main surface of the semiconductor layer, and a gate electrode embedded in the gate trench via a gate insulating layer;

a trench source structure including a source trench formed deeper than the gate trench and formed across an interval from the gate trench in the first main surface of the semiconductor layer, a source electrode embedded in the source trench, and a well region of a second conductivity type formed in a region of the semiconductor layer along the source trench;

a body region of the second conductivity type formed in a region of a surface layer portion of the first main surface of the semiconductor layer between the gate trench and the source trench;

a source region of the first conductivity type formed in a surface layer portion of the body region; and a drain electrode connected to the second main surface of the semiconductor layer; and wherein the trench source structure includes a barrier forming layer interposed in a region between the source trench and the source electrode and having a higher potential barrier than a potential barrier between the well region and the source electrode, and the barrier forming layer includes an insulating barrier forming layer made of an insulating material, and a conductive barrier forming layer made of a conductive material differing from a conductive material of the source electrode.

* * * * *